US012459962B2

(12) United States Patent
Joo et al.

(10) Patent No.: US 12,459,962 B2
(45) Date of Patent: Nov. 4, 2025

(54) POLYCYCLIC COMPOUND AND ORGANIC LIGHT EMITTING DEVICE USING THE SAME

(71) Applicant: SFC CO., LTD, Cheongju-si (KR)

(72) Inventors: Sung-hoon Joo, Cheongju-si (KR); Bong-ki Shin, Cheongju-si (KR); Ji-hwan Kim, Cheongju-si (KR); Kyung-hwa Park, Cheongju-si (KR); Hyeon-jun Jo, Cheongju-si (KR); Seong-eun Woo, Cheongju-si (KR); Sung-eun Choi, Cheongju-si (KR); Soo-kyung Kang, Cheongju-si (KR)

(73) Assignee: SFC CO., LTD, Cheongju-si (KR)

( * ) Notice: Subject to any disclaimer, the term of this patent is extended or adjusted under 35 U.S.C. 154(b) by 785 days.

(21) Appl. No.: 17/862,717

(22) Filed: Jul. 12, 2022

(65) Prior Publication Data

US 2023/0068684 A1 Mar. 2, 2023

(30) Foreign Application Priority Data

Jul. 12, 2021 (KR) ........................ 10-2021-0090964
Dec. 27, 2021 (KR) ........................ 10-2021-0188284
Dec. 27, 2021 (KR) ........................ 10-2021-0188285

(51) Int. Cl.
*C07F 7/08* (2006.01)
*C09K 11/06* (2006.01)
*H10K 50/11* (2023.01)
*H10K 85/40* (2023.01)
*H10K 85/60* (2023.01)

(52) U.S. Cl.
CPC .......... *C07F 7/0814* (2013.01); *C07F 7/0812* (2013.01); *C09K 11/06* (2013.01); *H10K 85/40* (2023.02); *H10K 85/615* (2023.02); *H10K 85/6574* (2023.02); *H10K 85/658* (2023.02); *C09K 2211/1014* (2013.01); *H10K 50/11* (2023.02)

(58) Field of Classification Search
CPC .... H10K 85/636; H10K 85/631; H10K 85/40; H10K 85/658; C07F 7/0814
See application file for complete search history.

(56) References Cited

U.S. PATENT DOCUMENTS

2021/0184121 A1 6/2021 Suh et al.
2022/0089617 A1* 3/2022 Kim ...................... C07F 7/0812

FOREIGN PATENT DOCUMENTS

CN 110225917 A 9/2019
CN 111433216 A 7/2020
CN 112851700 A * 5/2021 ................ C07F 7/30
CN 113045595 A 6/2021
JP 2020-512303 A 4/2020
KR 10-2018-0122298 A 11/2018
KR 10-2021-0052376 A 5/2021
KR 10-2021-0067843 A 6/2021
KR 10-2021-0067845 A 6/2021
KR 10-2021-0067848 A 6/2021
KR 10-2021-0067943 A 6/2021
KR 10-2021-0067972 A 6/2021
WO WO 2021/010770 A1 1/2021
WO WO 2021/107680 A1 6/2021
WO WO 2021/150026 A1 7/2021

OTHER PUBLICATIONS

Japanese Office Action issued on Jun. 27, 2023, in counterpart Japanese Patent Application No. 2022-111809 (4 pages in Japanese).
Korean Office Action issued on Apr. 24, 2023, in counterpart Korean Patent Application No. 10-2021-0188284 (3 pages in Korean).
Chinese Office Action Issued on May 25, 2024, in Counterpart Chinese Patent Application No. 202210815063.7 (9 Pages in Chinese).
Korean Office Action issued on Aug. 24, 2022, in counterpart Korean Patent Application No. 10-2021-0188284 (7 pages in Korean).
Extended European search report issued on Nov. 25, 2022, in counterpart European Patent Application No. 22184432.7 (5 pages in English).

* cited by examiner

*Primary Examiner* — Sean M DeGuire
(74) *Attorney, Agent, or Firm* — NSIP Law

(57) ABSTRACT

Disclosed is a polycyclic compound that can be employed in various organic layers of an organic electroluminescent device. Also disclosed is an organic electroluminescent device including the polycyclic compound. The organic electroluminescent device includes a light emitting layer employing the polycyclic compound as a dopant and an anthracene derivative having a characteristic structure and characteristic substituents as a host. The use of the polycyclic compound significantly improves the color purity, luminous efficiency, and life characteristics of the organic electroluminescent device and makes the organic electroluminescent device highly efficient and long lasting.

14 Claims, No Drawings

POLYCYCLIC COMPOUND AND ORGANIC LIGHT EMITTING DEVICE USING THE SAME

CROSS REFERENCE TO RELATED APPLICATIONS

This application claims the benefit under 35 U.S.C. § 119(a) of Korean Patent Application No. 10-2021-0090964 filed on Jul. 12, 2021, Korean Patent Application No. 10-2021-0188284 filed on Dec. 27, 2021, and Korean Patent Application No. 10-2021-0188285 filed on Dec. 27, 2021, in the Korean Intellectual Property Office, the entire disclosures of which are incorporated herein by reference for all purposes.

BACKGROUND OF THE INVENTION

1. Field of the Invention

The present invention relates to a polycyclic compound and an organic electroluminescent device with improved luminous efficiency and life characteristics fabricated using the polycyclic compound. More specifically, the present invention relates to a polycyclic compound and a highly efficient and long-lasting organic electroluminescent device that employs the polycyclic compound as a dopant and an anthracene derivative as a host, particularly an anthracene derivative including one or more deuterium atoms in the anthracene skeleton, achieving significantly improved life characteristics and luminous efficiency and high color purity.

2. Description of the Related Art

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

Particularly, for maximum efficiency in a light emitting layer, an appropriate combination of energy band gaps of a host and a dopant is required such that holes and electrons migrate to the dopant through stable electrochemical paths to form excitons.

As such, there is a continued need to develop structures of organic electroluminescent devices optimized to improve their luminescent properties and new materials capable of supporting the optimized structures of organic electroluminescent devices.

The full width at half maximum (FWHM) of the emission spectrum of a material is an important factor in improving the efficiency and color purity of a device using the material as well as achieving stable PL quantum efficiency of the device. Displays for mobile devices and TVs use resonance structures to achieve high color gamut. When the path of light is designed such that resonance occurs at a specific wavelength ("resonant filter"), the line width becomes narrow, resulting in high color purity (R. H. Jordan et al, Appl. Phys. Lett. 1996, v6, 1997, Huajun Peng et al, Appl. Phys. Lett. 2005, v87, 173505). The full width at half maximum of the emission spectrum of an organic material is typically 30 to 100 nm (B. M. Krasovitskii et al. Organic luminescent materials, VCH publishers). Thus, the use of a light emitting material having a smaller full width at half maximum can be expected to further increase the efficiency of a resonant device using the light emitting material.

Fluorescent molecules such as perylene, coumarin, anthracene, and pyrene account for most of the currently used materials as blue dopants. However, the large full widths at half maximum of the emission spectra of these dopants make it impossible for devices using the dopants to utilize pure blue light. This disadvantage is the main reason why the efficiency of blue light in the resonance structures of the devices is reduced and the deep blue region is difficult to utilize.

Blue light with a short wavelength of less than 455 nm tends to destroy retinal cells and, in severe cases, causes diseases such as cataracts and macular degeneration. To avoid the harmfulness of blue light to humans, a new technology called "Bio Blue" is also being developed in which the central wavelength of a blue OLED device is shifted from a short wavelength to a long wavelength to express accurate colors while reducing blue light, a harmful wavelength of light, as much as possible. A reduction in the proportion of the harmful wavelength by 6% or more is interpreted that blue light has virtually no effect on the retina. Under such circumstances, research and development has continued aimed at protecting the eyesight of users who use displays for computers, mobile phones, augmented reality (AR) devices, virtual reality (VR) devices, and other devices for a long time.

SUMMARY OF THE INVENTION

Accordingly, the present invention intends to provide a compound which can be employed in an organic layer of a device to achieve high efficiency and long lifetime of the device and whose emission spectrum has a smaller full width at half maximum to achieve further enhanced efficiency and improved color purity of the device, and an organic electroluminescent device that employs the compound as a dopant and a host compound having a specific structure.

One aspect of the present invention provides a polycyclic compound represented by Formula 1 or 2:

(1)

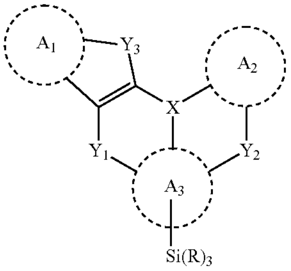

-continued (2)

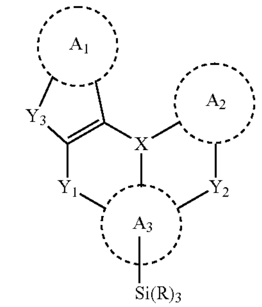

A further aspect of the present invention provides an organic electroluminescent device including a first electrode, a second electrode opposite to the first electrode, and one or more organic layers interposed between the first and second electrodes wherein one of the organic layers is a light emitting layer including a host and a dopant, the dopant includes a compound represented by Formula 1:

(1)

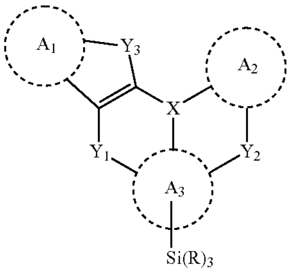

and/or a compound represented by Formula 2:

(2)

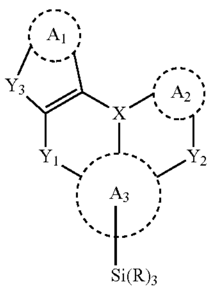

and the host is an anthracene compound represented by Formula 3:

(3)

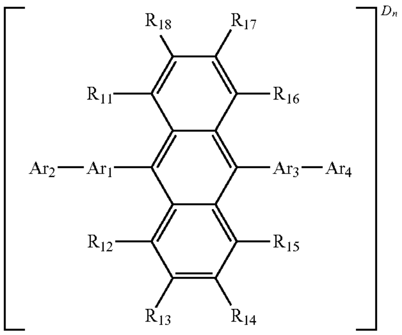

The compound represented by Formula 3 has a deuterated structure. Specifically, at least one of $R_{11}$ to $R_{18}$ is a deuterium atom and at least one of the hydrogen atoms in $Ar_1$ to $Ar_4$ is optionally replaced with a deuterium atom.

Specific structures of Formulae 1, 2, and 3, definitions of the substituents in Formulae 1, 2, and 3, and specific compounds that can be represented by Formulae 1, 2, and 3 are described below.

The polycyclic compound of the present invention is a boron-containing one substituted with a silyl group and can be employed in an organic layer of an organic electroluminescent to achieve improved color purity, high luminous efficiency, and long lifetime of the device.

In addition, the organic electroluminescent device of the present invention includes a light emitting layer employing the boron-containing polycyclic compound substituted with a silyl group as a dopant and an anthracene derivative as a host, particularly an anthracene derivative including one or more deuterium atoms in the anthracene skeleton, achieving long lifetime and high efficiency. Therefore, the organic electroluminescent device of the present invention can find application in lighting systems as well as various displays such as flat panel displays, flexible displays, and wearable displays.

DETAILED DESCRIPTION OF THE INVENTION

The present invention will now be described in more detail.

The present invention is directed to a polycyclic compound represented by Formula 1 or 2:

(1)

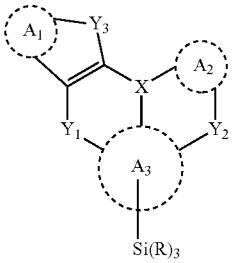

-continued (2)

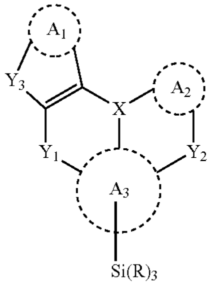

wherein X is B, P=O, P=S or Al, $Y_1$ and $Y_2$ are each independently $NR_1$, O, S, $CR_2R_3$ or $SiR_4R_5$, $Y_3$ is O or S, $A_1$ to $A_3$ are each independently selected from substituted or unsubstituted $C_5$-$C_{50}$ aromatic hydrocarbon rings, substituted or unsubstituted $C_2$-$C_{50}$ aromatic heterocyclic rings, substituted or unsubstituted $C_3$-$C_{30}$ aliphatic rings, and substituted or unsubstituted $C_3$-$C_{30}$ mixed aliphatic-aromatic rings, and R and $R_1$ to $R_5$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_0$-$C_{30}$ amine, substituted or unsubstituted $C_0$-$C_{30}$ silyl, substituted or unsubstituted $C_3$-$C_{30}$ mixed aliphatic-aromatic cyclic groups, nitro, cyano, and halogen, with the proviso that the groups R are other than substituted or unsubstituted $C_1$-$C_{30}$ alkyl, each of $R_1$ to $R_5$ optionally forms an alicyclic or aromatic monocyclic or polycyclic ring with one or more of the rings $A_1$ to $A_3$, the groups R are optionally linked to each other to form an alicyclic or aromatic monocyclic or polycyclic ring, $R_2$ and $R_3$ together optionally form an alicyclic or aromatic monocyclic or polycyclic ring, and $R_4$ and $R_5$ together optionally form an alicyclic or aromatic monocyclic or polycyclic ring.

According to one embodiment of the present invention, X may be boron (B). According to one embodiment of the present invention, the ring $A_2$ may have a substituted or unsubstituted $C_0$-$C_{30}$ amine group as a substituent.

According to one embodiment of the present invention, the amine group may be a diarylamine group, at least one of the aryl groups of the diarylamine group may be a substituted or unsubstituted phenyl group, and the substituent of the phenyl group may be a $C_6$-$C_{20}$ aryl group in the ortho position.

According to one embodiment of the present invention, at least one of the groups R may be a substituted or unsubstituted $C_6$-$C_{30}$ aryl group.

According to one embodiment of the present invention, at least one of the hydrogen atoms in the compound represented by Formula 1 or 2 may be replaced with a deuterium atom.

According to one embodiment of the present invention, the polycyclic compound of Formula 1 may be represented by Formula 1-1:

(1-1)

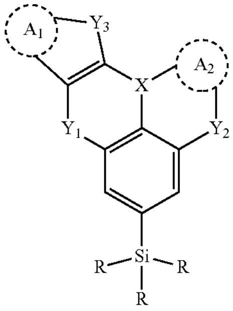

wherein $A_1$, $A_2$, X, $Y_1$ to $Y_3$, and R are as defined in Formula 1, with the proviso that at least one of the groups R is a substituted or unsubstituted $C_6$-$C_{30}$ aryl group, and the polycyclic compound of Formula 2 may be represented by Formula 2-1:

(2-1)

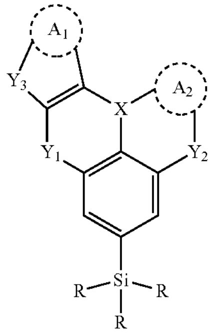

wherein $A_1$, $A_2$, X, $Y_1$ to $Y_3$, and R are as defined in Formula 2, with the proviso that at least one of the groups R is a substituted or unsubstituted $C_6$-$C_{30}$ aryl group.

The polycyclic compound of the present invention can be used to fabricate a highly efficient and long-lasting organic electroluminescent device with improved color purity.

The present invention is also directed to an organic electroluminescent device including a first electrode, a second electrode opposite to the first electrode, and one or more organic layers interposed between the first and second electrodes wherein one of the organic layers is a light emitting layer including a host and a dopant, the dopant includes at least one of the compounds represented by Formulae 1 and 2, and the host is an anthracene compound represented by Formula 3:

(3)

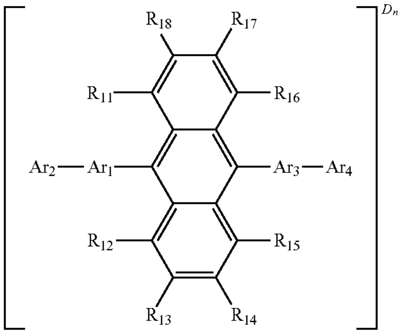

wherein $R_{11}$ to $R_{18}$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_0$-$C_{30}$ amine, substituted or unsubstituted $C_0$-$C_{30}$ silyl, substituted or unsubstituted $C_3$-$C_{30}$ mixed aliphatic-aromatic cyclic groups, nitro, cyano, and halogen, with the proviso that at least one of $R_{11}$ to $R_{18}$ is a deuterium atom, $Ar_1$ and $Ar_3$ are identical to or different from each other and are each independently substituted or unsubstituted $C_6$-$C_{30}$ arylene or substituted or unsubstituted $C_5$-$C_{30}$ heteroarylene, $Ar_3$ and $Ar_4$ are identical to or different from each other and are each independently selected from hydrogen, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, and substituted or unsubstituted $C_3$-$C_{30}$ mixed aliphatic-aromatic cyclic group, $D_n$ represents the number of deuterium atoms replacing hydrogen atoms in $Ar_1$ to $Ar_4$, and n is an integer from 0 to 50.

The compound represented by Formula 3 is an anthracene compound in which at least one deuterium atom is introduced. The compound represented by Formula 3 may optionally further include one or more deuterium atoms.

According to one embodiment of the present invention, at least four of $R_{11}$ to $R_{18}$ may be deuterium atoms.

As used herein, the term "substituted" and "further substituted with substituents" in Formulae 1, 2, and 3 indicates substitution with one or more substituents selected from deuterium, cyano, halogen, hydroxyl, nitro, amino, alkyl, cycloalkyl, haloalkyl, alkenyl, alkynyl, heteroalkyl, heterocycloalkyl, aryl, arylalkyl, heteroaryl, heteroarylalkyl, alkoxy, alkylamine, arylamine, heteroarylamine, alkylsilyl, arylsilyl, and aryloxy, or a combination thereof. As used herein, the term "unsubstituted" indicates having no substituent.

In the "substituted or unsubstituted $C_1$-$C_{30}$ alkyl", "substituted or unsubstituted $C_6$-$C_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The alkyl groups may be straight or branched and specific examples thereof include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The aromatic hydrocarbon rings or aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The aromatic heterocyclic rings or heteroaryl groups refer to aromatic groups interrupted by one or more heteroatoms. Examples of the aromatic heterocyclic rings or heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The aliphatic hydrocarbon rings refer to non-aromatic rings consisting only of carbon and hydrogen atoms. The aliphatic hydrocarbon ring is intended to include monocyclic and polycyclic ones and may be optionally substituted with one or more other substituents. As used herein, the term "polycyclic" means that the aliphatic hydrocarbon ring may be directly attached or fused to one or more other cyclic groups. The other cyclic groups may be aliphatic hydrocarbon rings and other examples thereof include aliphatic heterocyclic, aryl, and heteroaryl groups. Specific examples of the aliphatic hydrocarbon rings include, but are not limited to, cycloalkyl groups such as cyclopropyl, cyclobutyl, cyclopentyl, adamantyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, and cyclooctyl, cycloalkanes such as cyclohexane and cyclopentane, and cycloalkenes such as cyclohexene and cyclopentene.

The aliphatic heterocyclic rings refer to aliphatic rings interrupted by one or more heteroatoms such as O, S, Se, N, and Si. The aliphatic heterocyclic ring is intended to include monocyclic or polycyclic ones and may be optionally substituted with one or more other substituents. As used herein, the term "polycyclic" means that the aliphatic heterocyclic ring such as heterocycloalkyl, heterocycloalkane or heterocycloalkene may be directly attached or fused to one or more other cyclic groups. The other cyclic groups may be aliphatic heterocyclic rings and other examples thereof include aliphatic hydrocarbon rings, aryl groups, and heteroaryl groups.

The mixed aliphatic-aromatic rings or the mixed aliphatic-aromatic cyclic groups refer to structures in which two or more rings are fused together and which are overall non-aromatic. The mixed aliphatic-aromatic polycyclic rings may contain one or more heteroatoms selected from N, O, P, and S other than carbon atoms (C). Examples of the mixed aliphatic-aromatic polycyclic rings include, but are not limited to, tetralin, 1,1,4,4-tetramethyl-1,2,3,4-tetrahydronaphthalene, 1,2,3,4,4a,9b-hexahydrodibenzofuran, 2,3,4,4a,9,9a-hexahydro-4a,9a-dimethyl-1H-carbazole, and 5,6,7,8-tetrahydroquinoline.

The alkoxy group may be specifically a methoxy, ethoxy, propoxy, isobutyloxy, sec-butyloxy, pentyloxy, iso-amyloxy or hexyloxy group but is not limited thereto. The silyl group is intended to include —$SiH_3$, alkylsilyl, arylsilyl, alkylarylsilyl, arylheteroarylsilyl, and heteroarylsilyl. The arylsilyl refers to a silyl group obtained by substituting one, two or three of the hydrogen atoms in —$SiH_3$ with aryl groups. The alkylsilyl refers to a silyl group obtained by substituting one, two or three of the hydrogen atoms in —$SiH_3$ with alkyl groups. The alkylarylsilyl refers to a silyl group obtained by substituting one of the hydrogen atoms in —$SiH_3$ with an alkyl group and the other two hydrogen atoms with aryl groups or substituting two of the hydrogen atoms in —$SiH_3$ with alkyl groups and the remaining hydrogen atom with an aryl group. The arylheteroarylsilyl refers to a silyl group obtained by substituting one of the hydrogen atoms in —$SiH_3$ with an aryl group and the other two hydrogen atoms with heteroaryl groups or substituting two of the hydrogen atoms in —$SiH_3$ with aryl groups and the remaining hydrogen atom with a heteroaryl group. The heteroarylsilyl refers to a silyl group obtained by substituting one, two or three of the hydrogen atoms in —$SiH_3$ with heteroaryl groups. The arylsilyl group may be, for example, substituted or unsubstituted monoarylsilyl, substituted or unsubstituted diarylsilyl, or substituted or unsubstituted triarylsilyl. The same applies to the alkylsilyl and heteroarylsilyl groups.

Each of the aryl groups in the arylsilyl, heteroarylsilyl, and arylheteroarylsilyl groups may be a monocyclic or polycyclic one. Each of the heteroaryl groups in the arylsilyl, heteroarylsilyl, and arylheteroarylsilyl groups may be a monocyclic or polycyclic one.

Specific examples of the silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl. One or more of the hydrogen atoms in each of the silyl groups may be substituted with the substituents mentioned in the aryl groups.

The amine group is intended to include —$NH_2$, alkylamine, arylamine, arylheteroarylamine, and heteroarylamine. The arylamine refers to an amine group obtained by substituting one or two of the hydrogen atoms in —$NH_2$ with aryl groups. The alkylamine refers to an amine group obtained by substituting one or two of the hydrogen atoms in —$NH_2$ with alkyl groups. The alkylarylamine refers to an amine group obtained by substituting one of the hydrogen atoms in —$NH_2$ with an alkyl group and the other hydrogen atom with an aryl group. The arylheteroarylamine refers to an amine group obtained by substituting one of the hydrogen atoms in —$NH_2$ with an aryl group and the other hydrogen atom with a heteroaryl group. The heteroarylamine refers to an amine group obtained by substituting one or two of the hydrogen atoms in —$NH_2$ with heteroaryl groups. The arylamine may be, for example, substituted or unsubstituted monoarylamine, substituted or unsubstituted diarylamine, or substituted or unsubstituted triarylamine. The same applies to the alkylamine and heteroarylamine groups.

Each of the aryl groups in the arylamine, heteroarylamine, and arylheteroarylamine groups may be a monocyclic or polycyclic one. Each of the heteroaryl groups in the arylamine, heteroarylamine, and arylheteroarylamine groups may be a monocyclic or polycyclic one.

The aryl groups in the aryloxy and arylthioxy groups are the same as those exemplified above. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. Specific examples of the arylthioxy groups include, but are not limited to, phenylthioxy, 2-methylphenylthioxy, and 4-tert-butylphenylthioxy groups.

The halogen group may be, for example, fluorine, chlorine, bromine or iodine.

More specifically, the polycyclic compound represented by Formula 1 or 2 according to the present invention may be selected from, but not limited to, the following compounds 1 to 102:

1
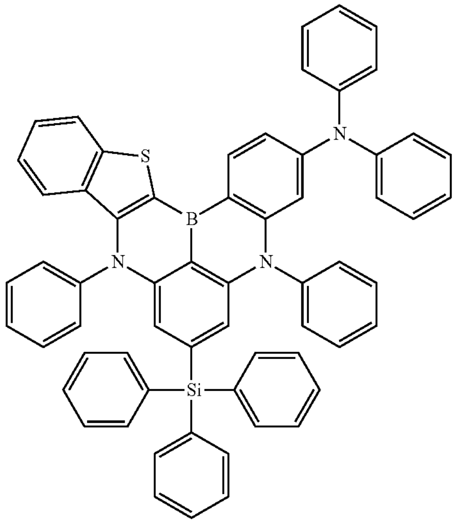
2
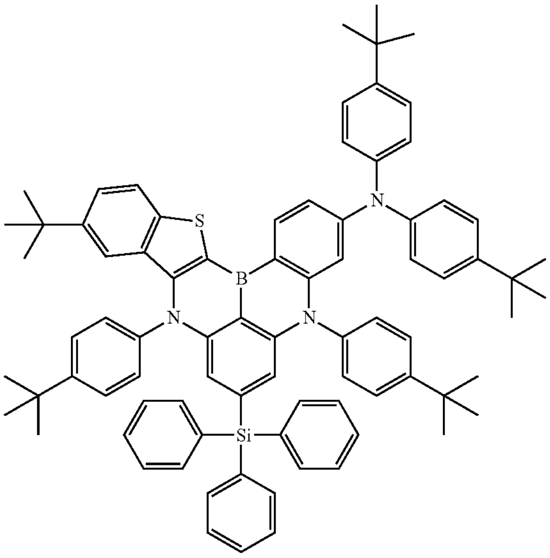
3
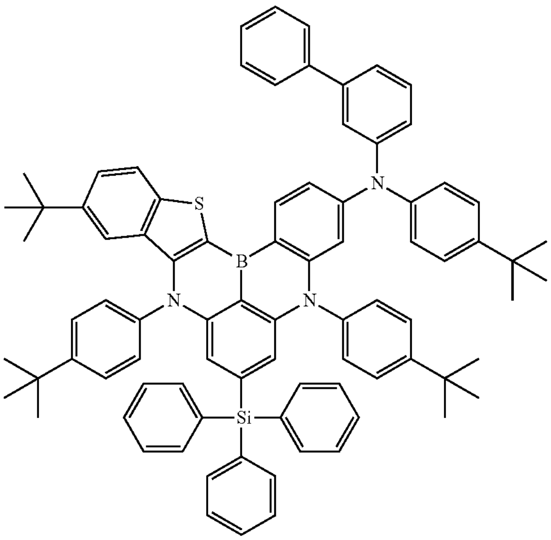
-continued
4
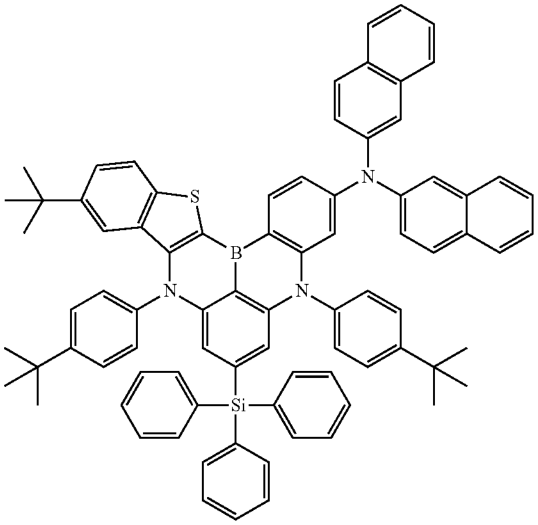
5
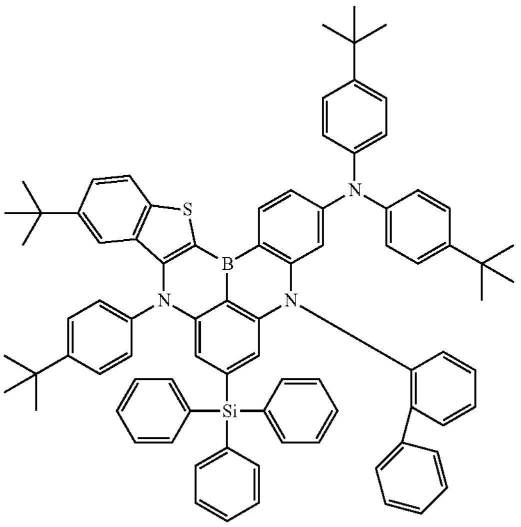
6
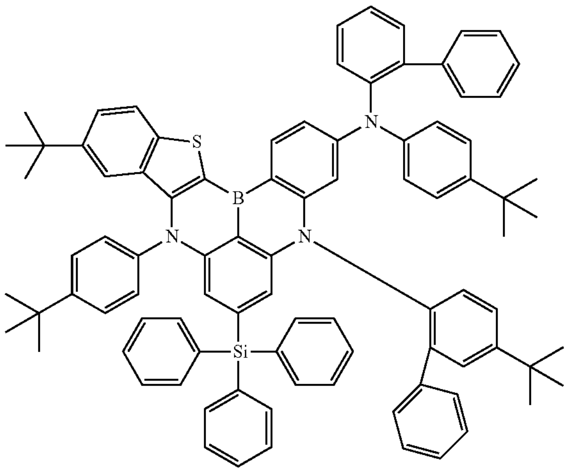

-continued
7
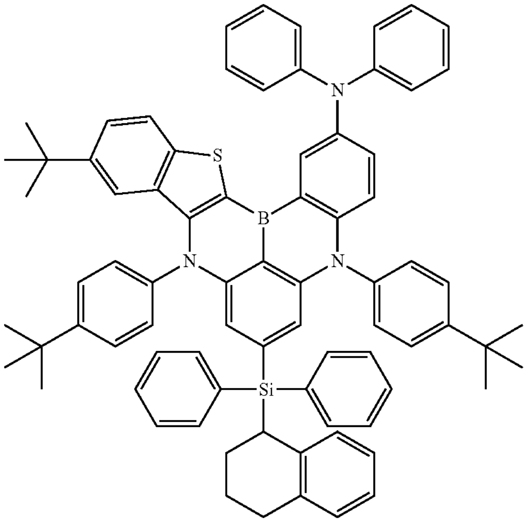
8
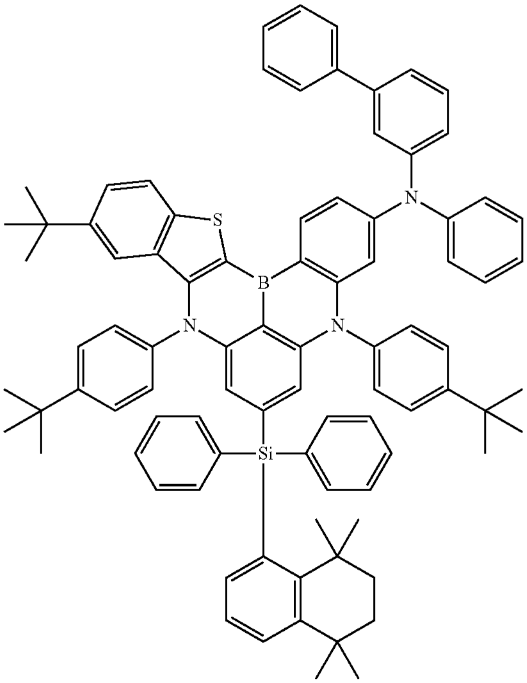
-continued
9
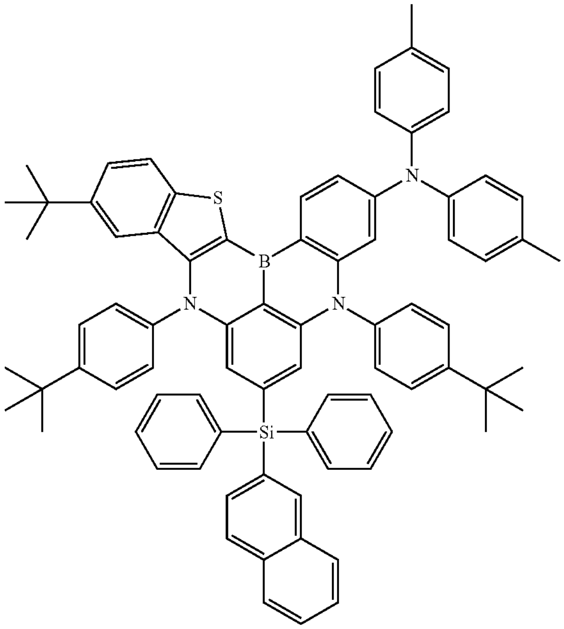
10
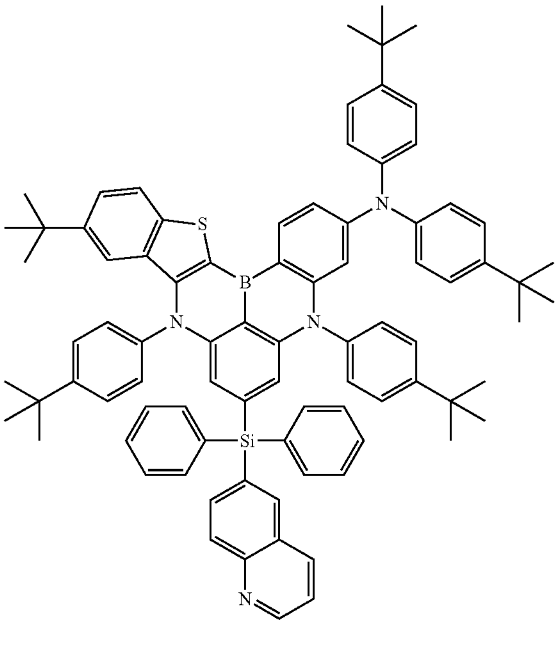

-continued
11
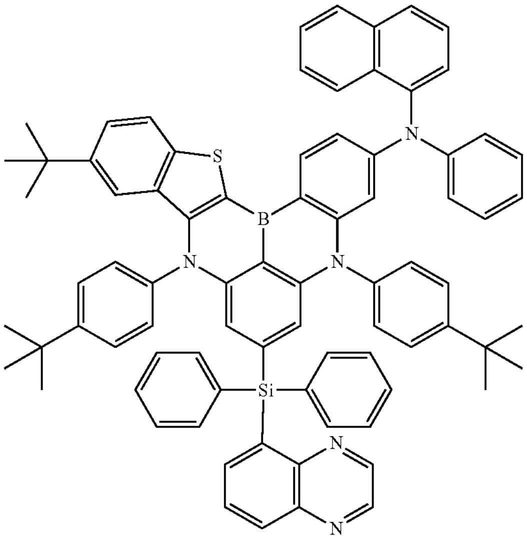
12
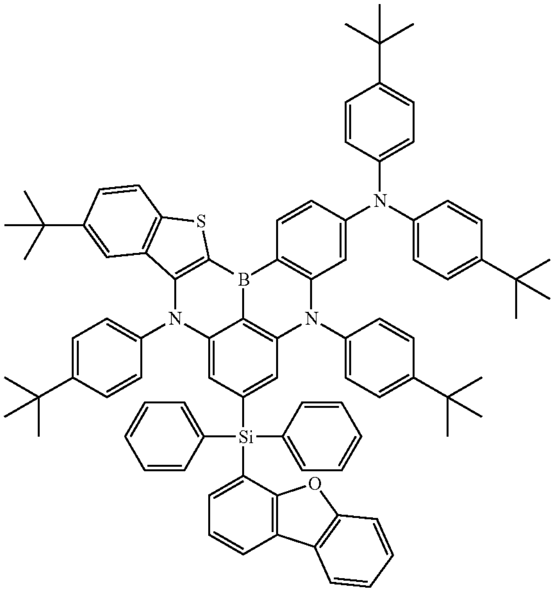
-continued
13
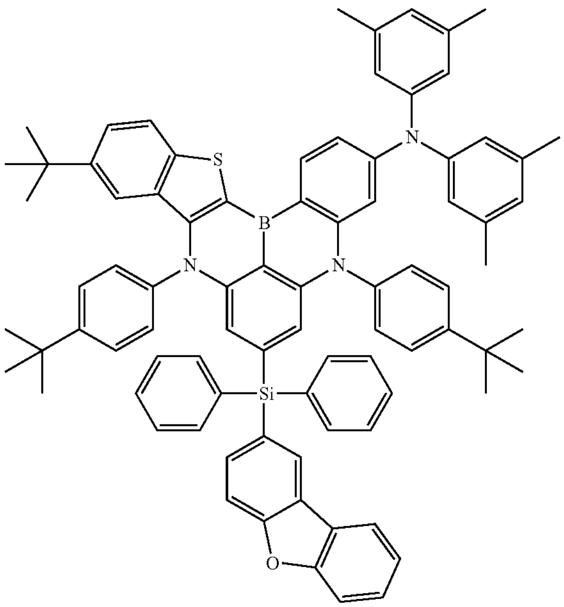
14
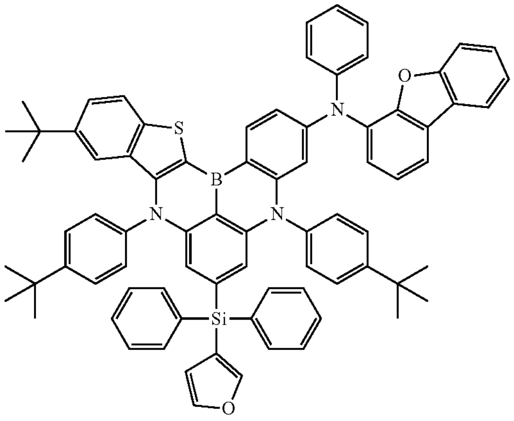
15
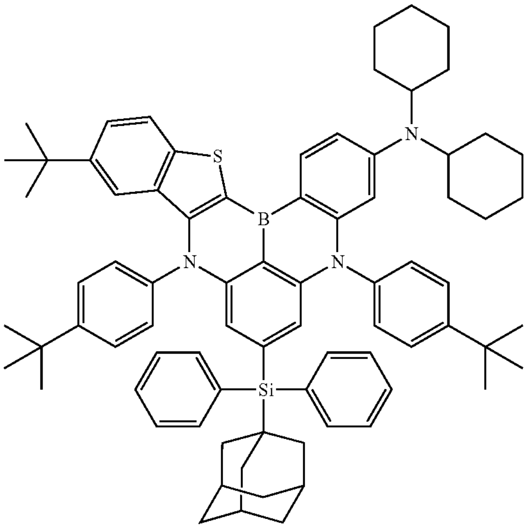

-continued
16
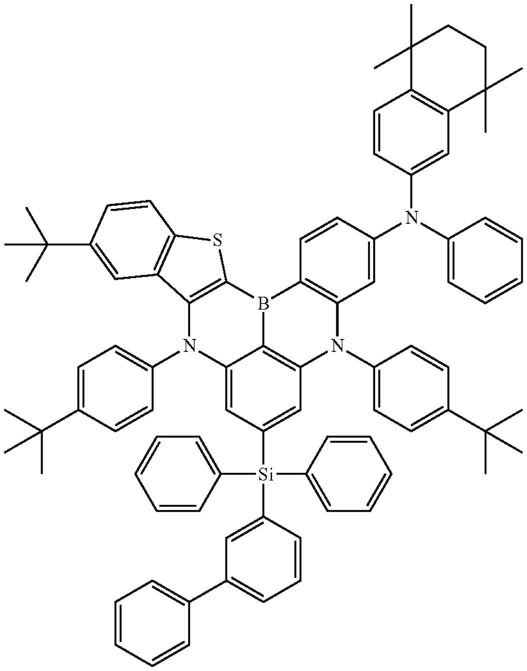
17
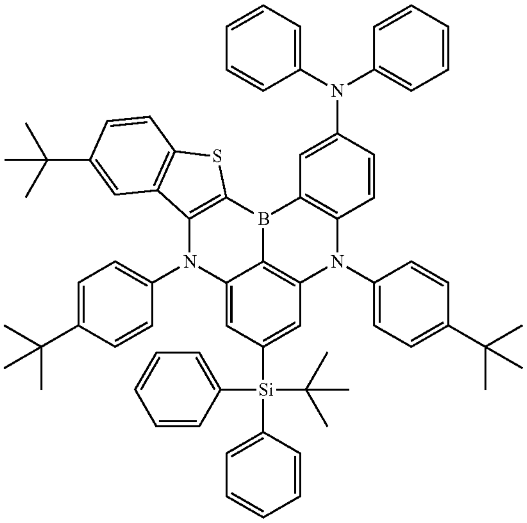
-continued
18
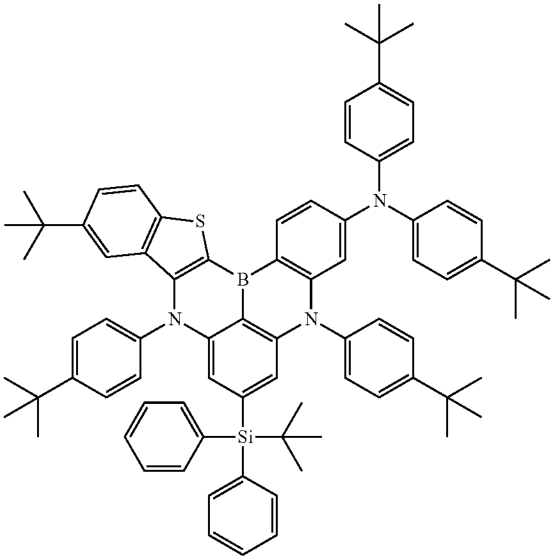
19
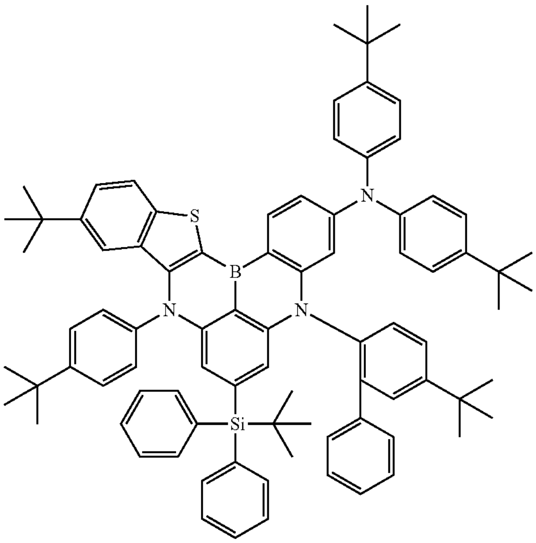

-continued
20
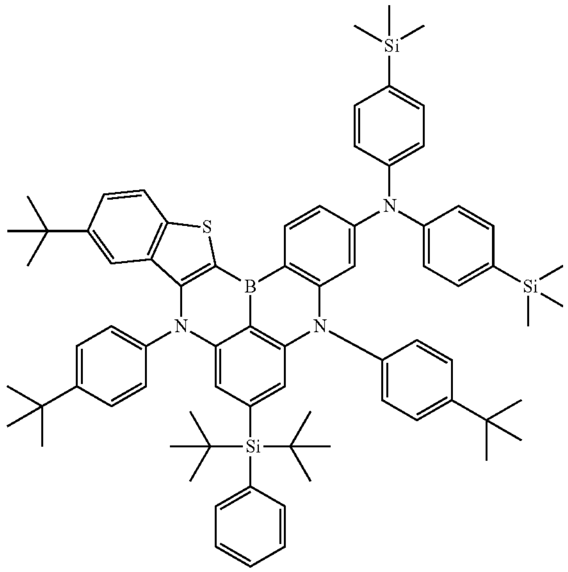
21
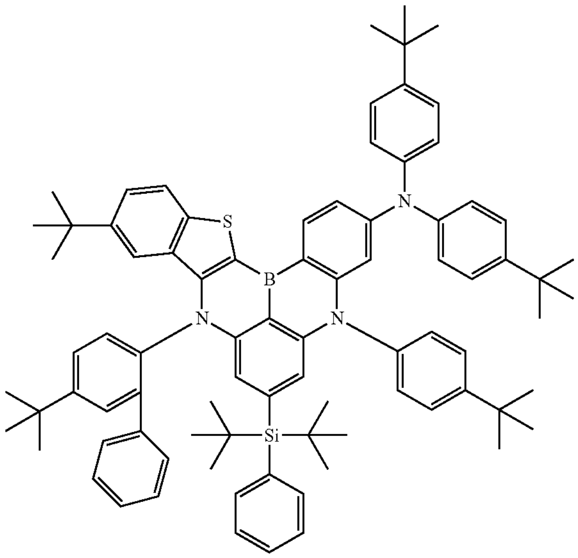
22
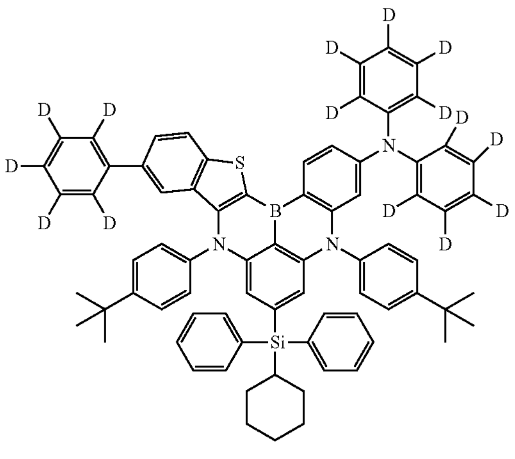
-continued
23
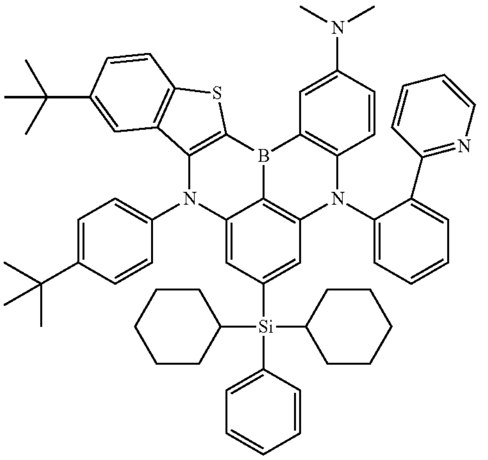
24
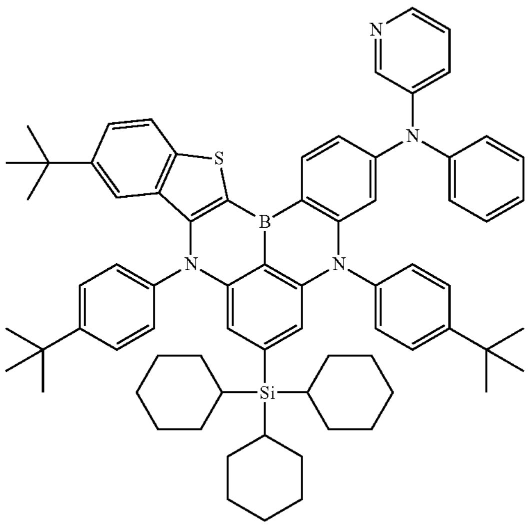
25
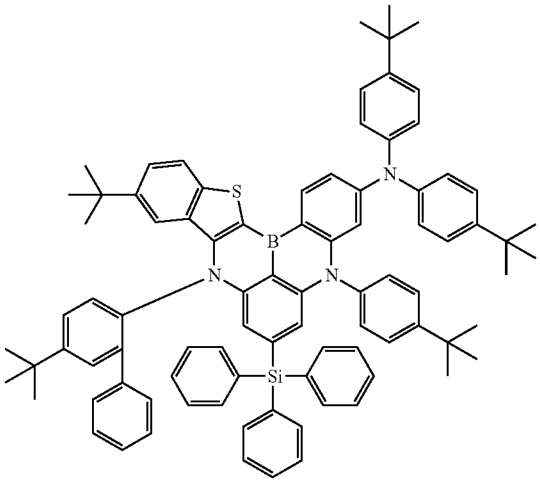

-continued
26
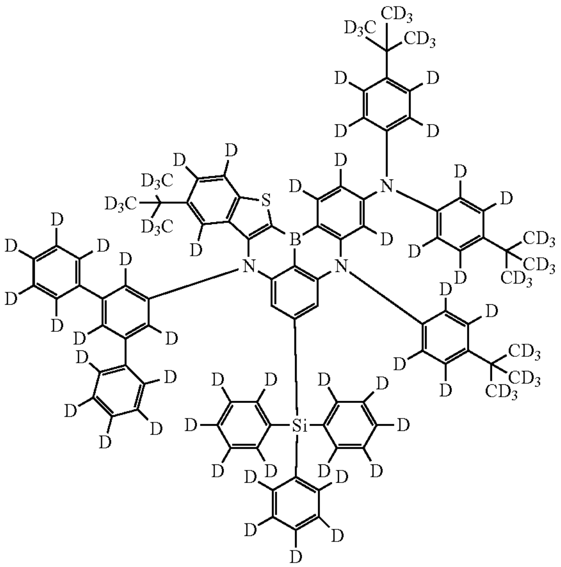
27
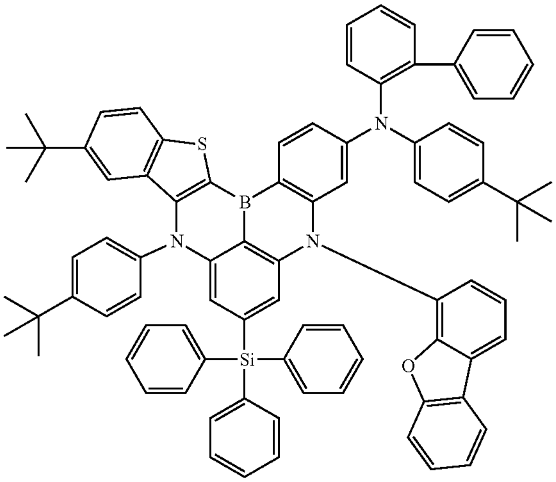
28
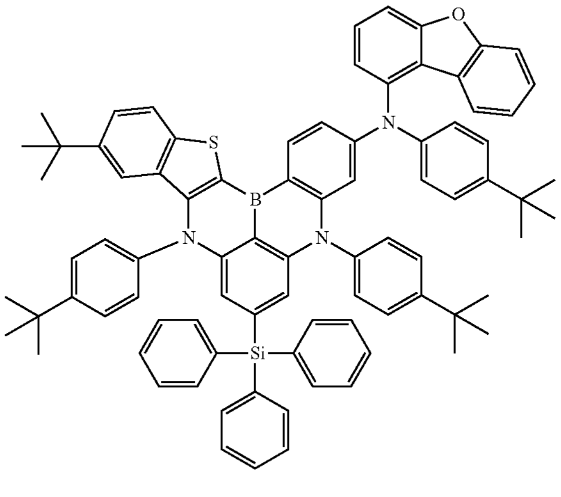
-continued
29
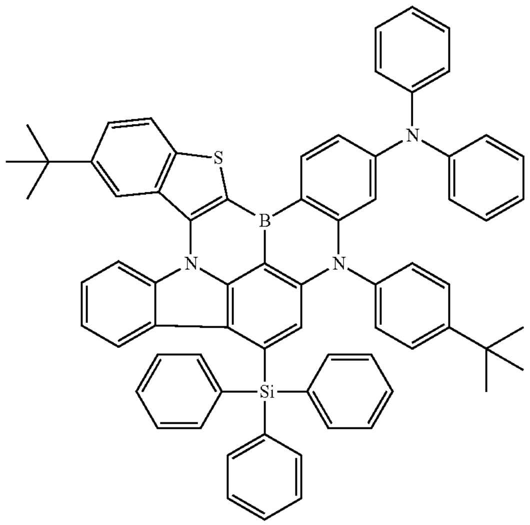
30
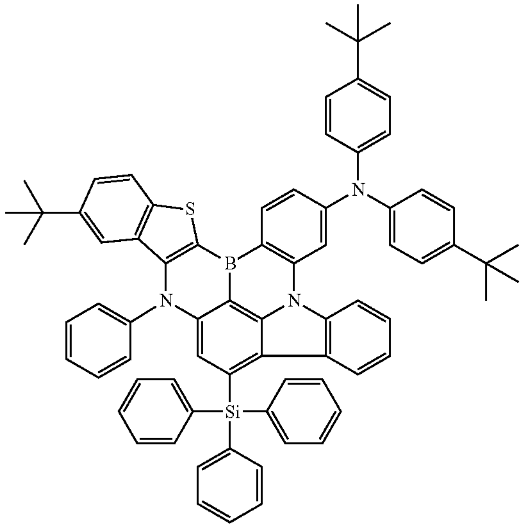
31
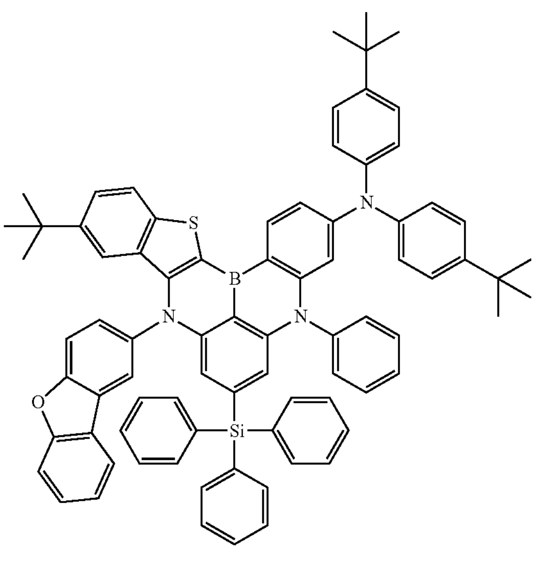

-continued
32
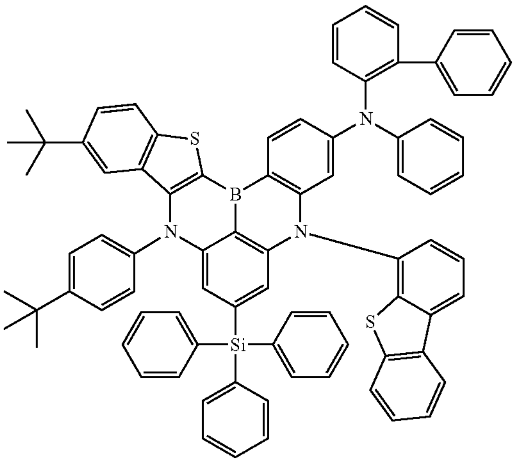
33
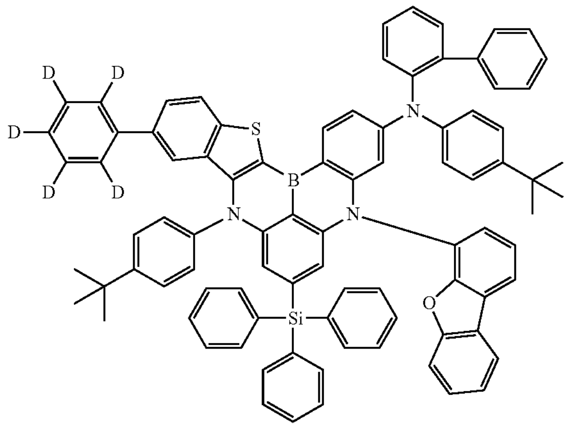
34
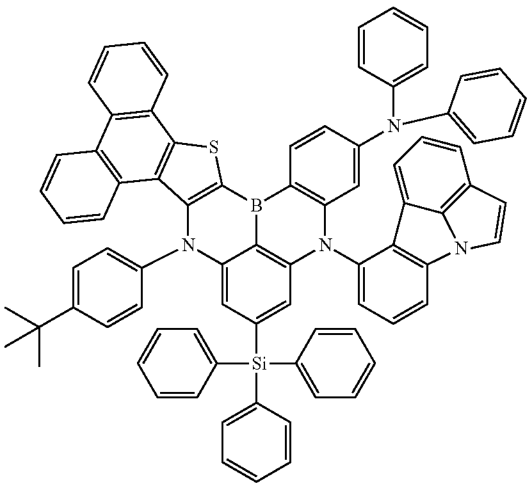
-continued
35
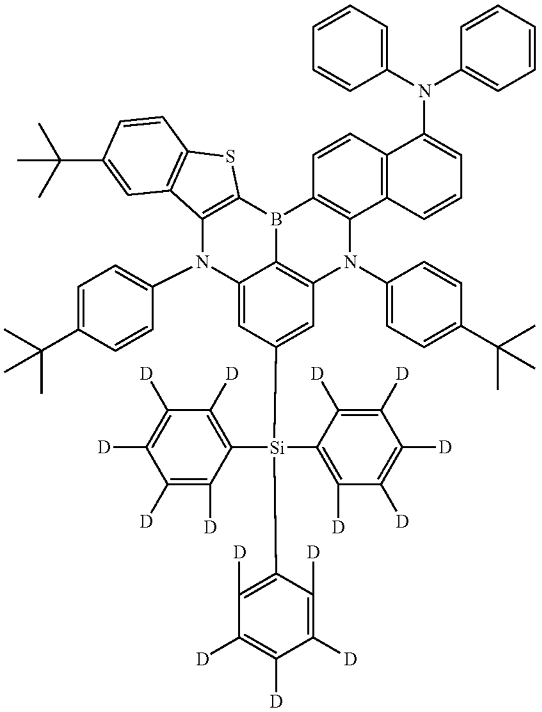
36
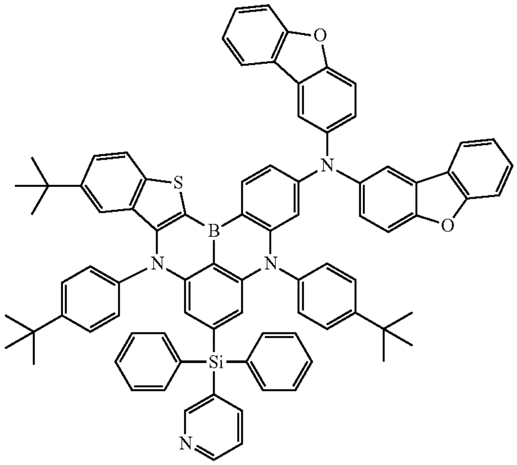

-continued
37
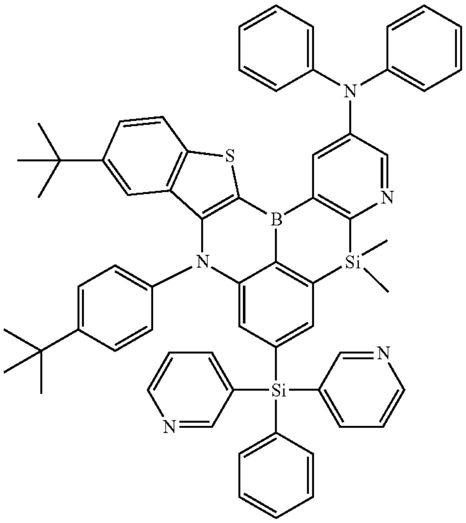
38
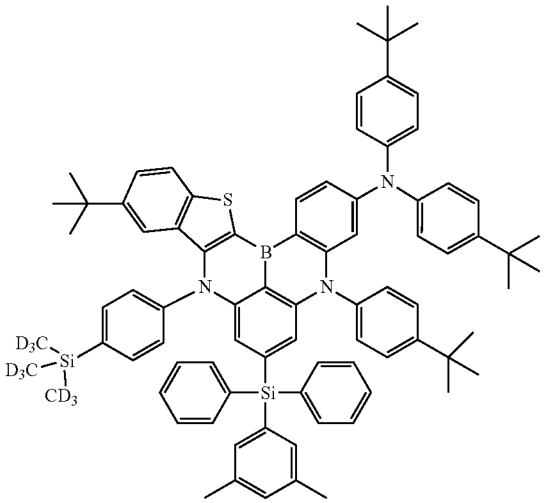
39
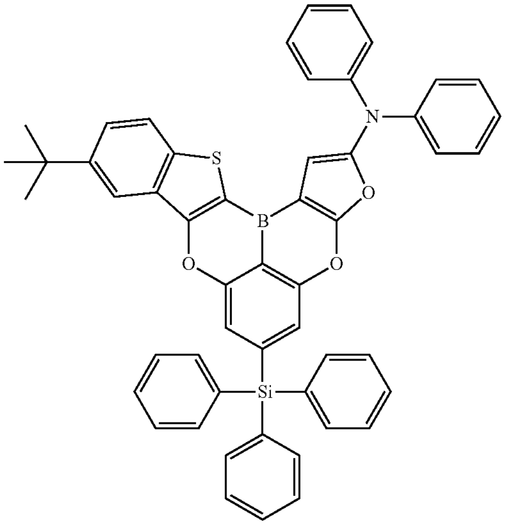
-continued
40
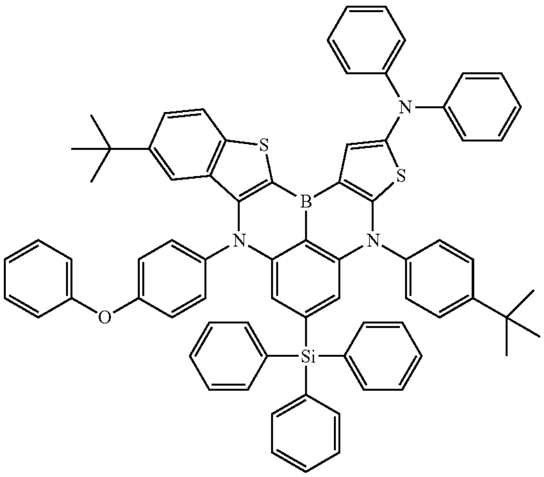
41
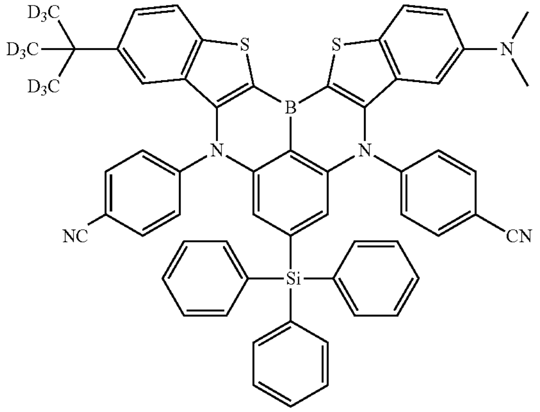
42
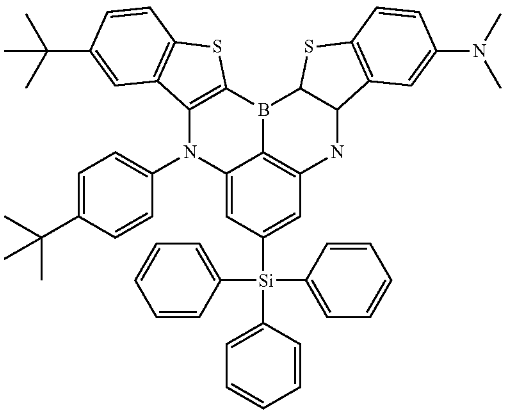

-continued
43
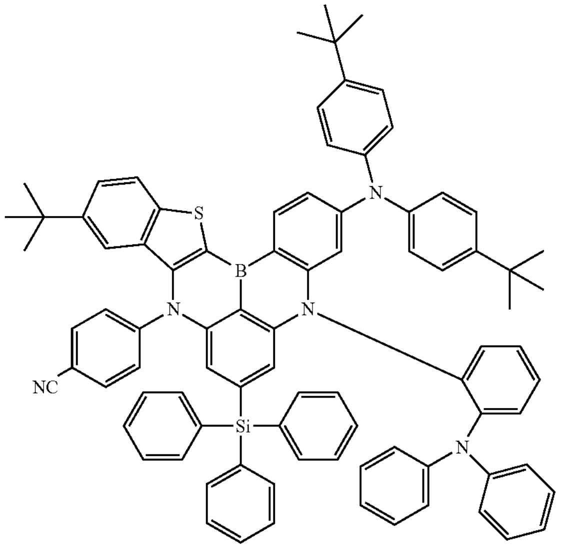
44
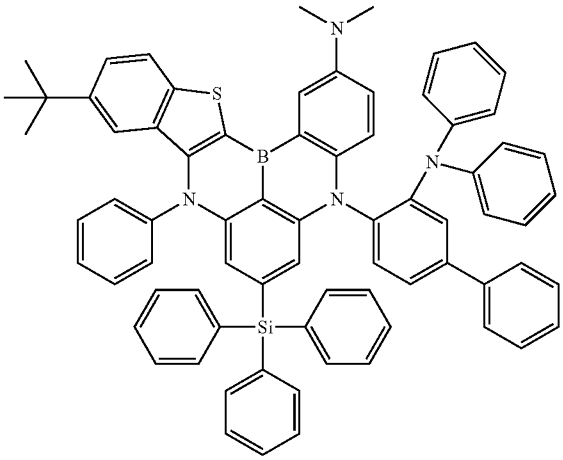
45
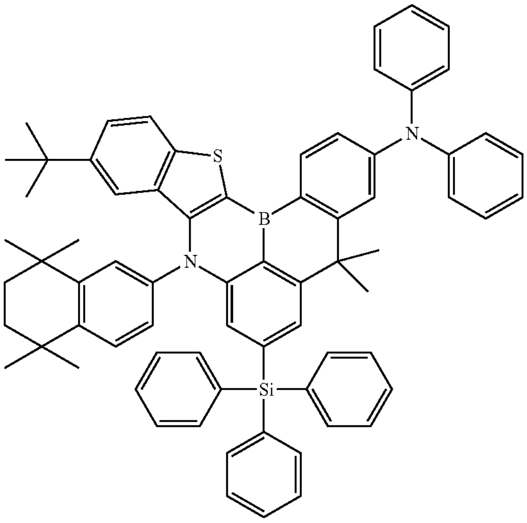
-continued
46
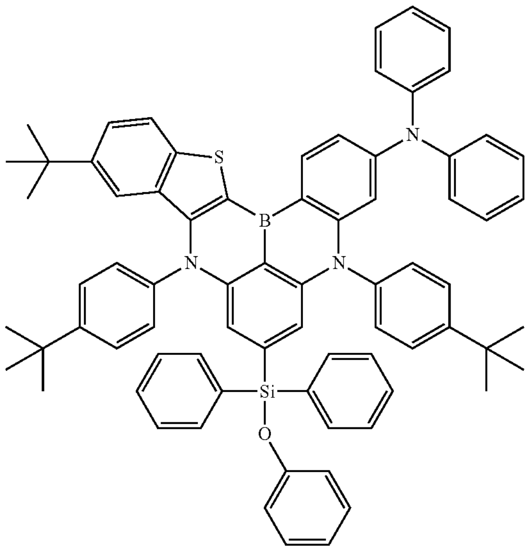
47
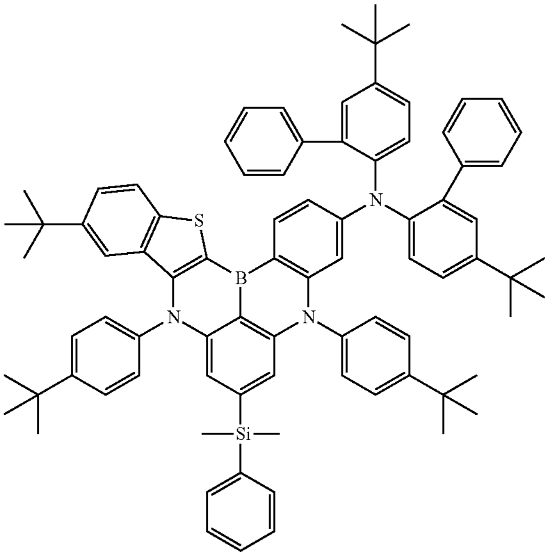

-continued
48
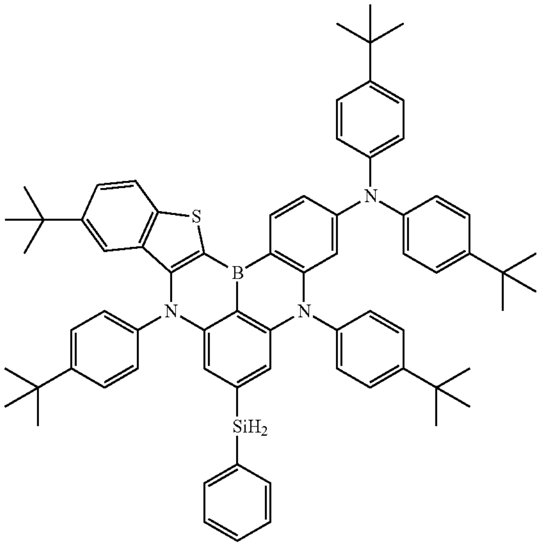
49
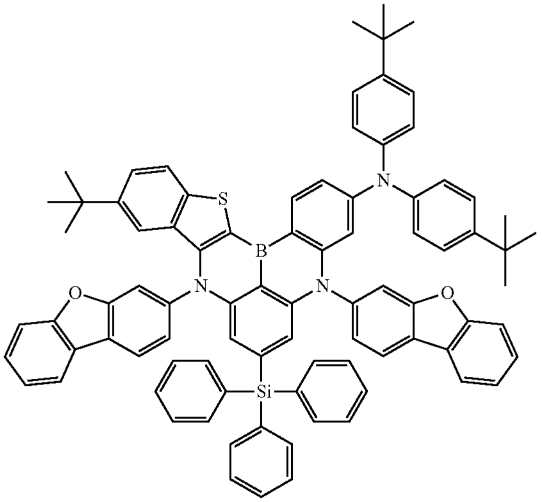
50
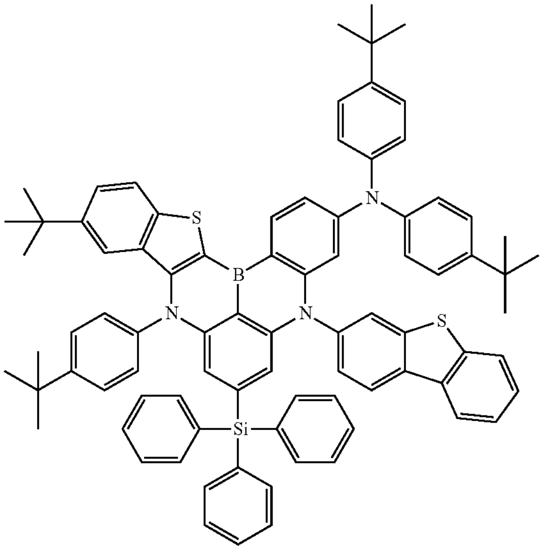
-continued
51
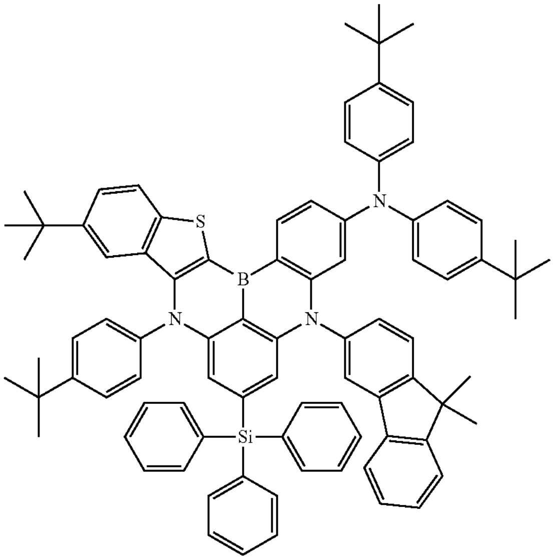
52
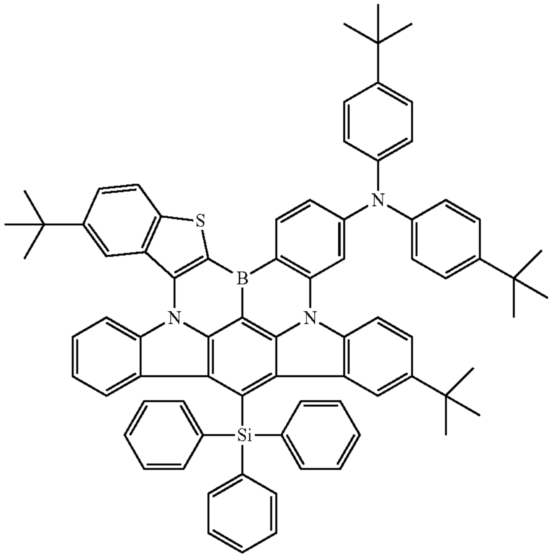

-continued
53
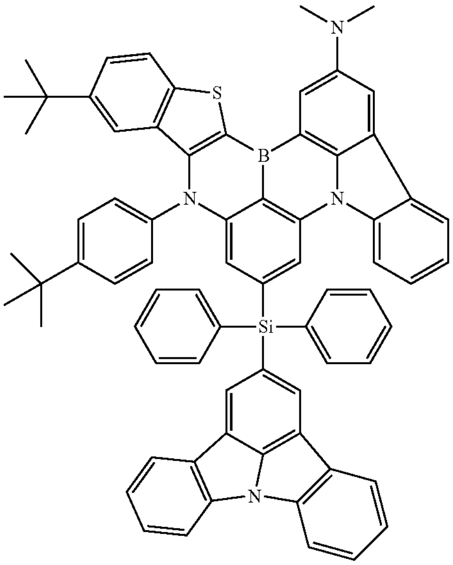
54
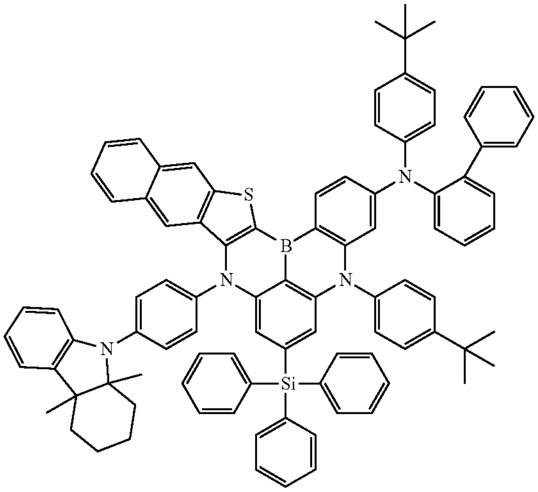
55
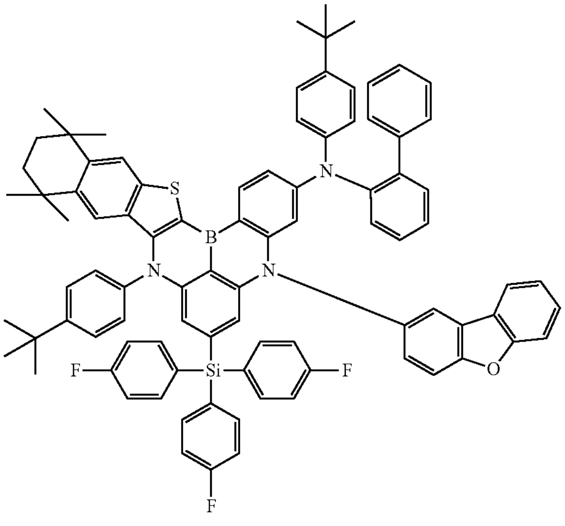
-continued
56
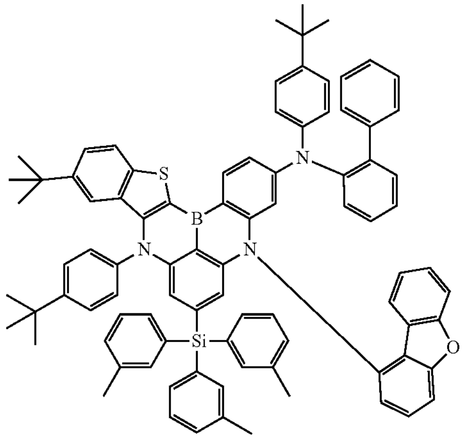
57
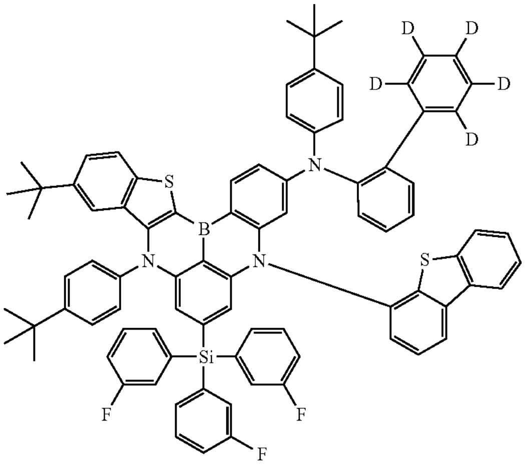
58
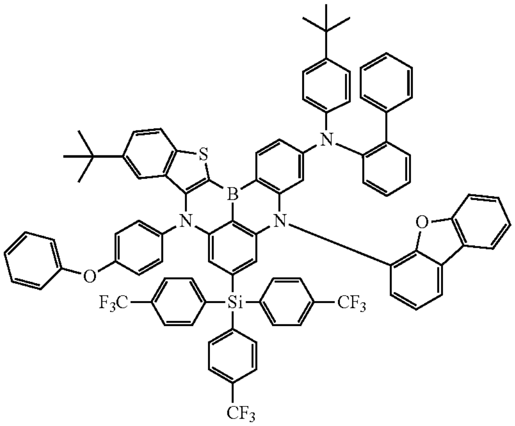

-continued
59
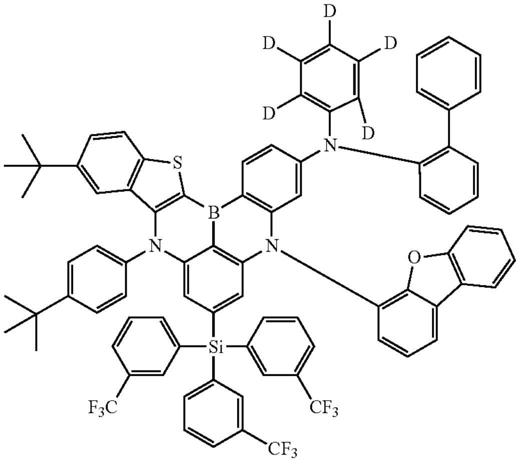
60
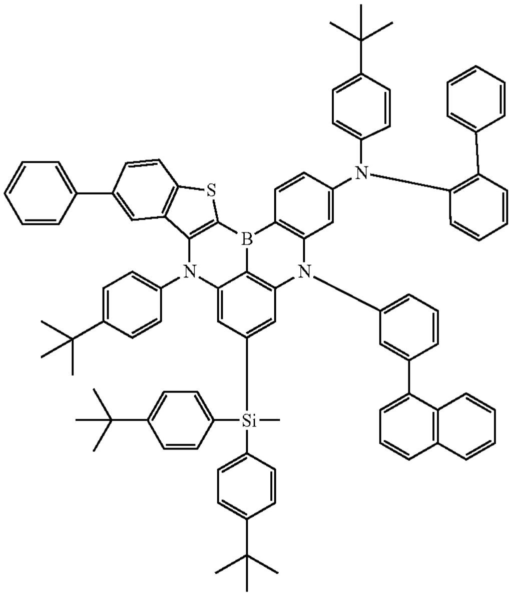
61
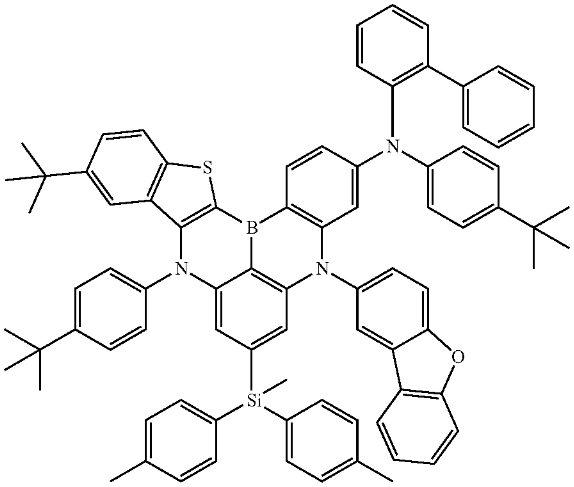
-continued
62
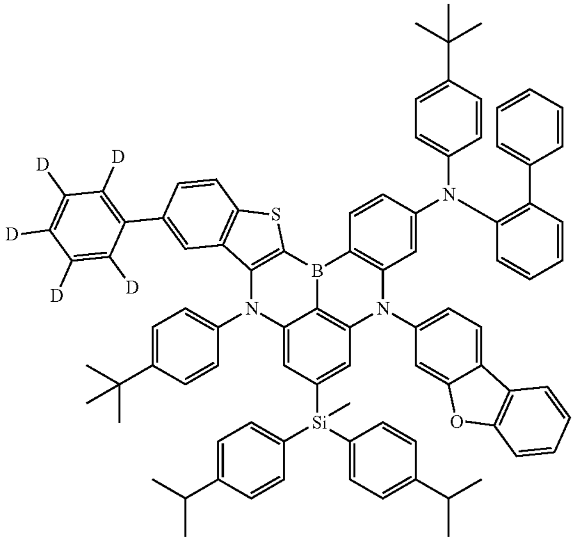
63
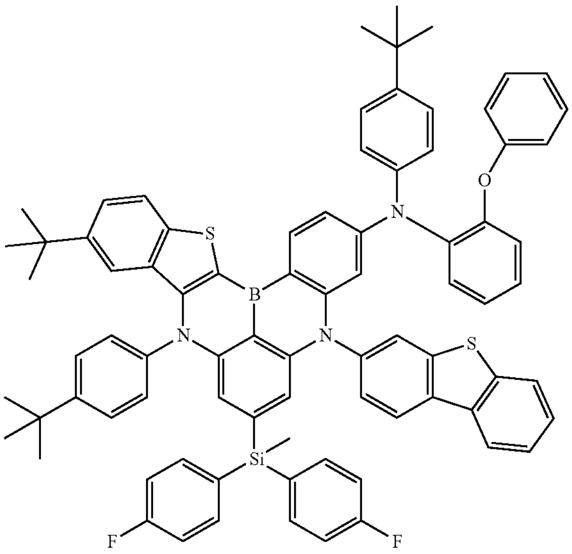

-continued
64
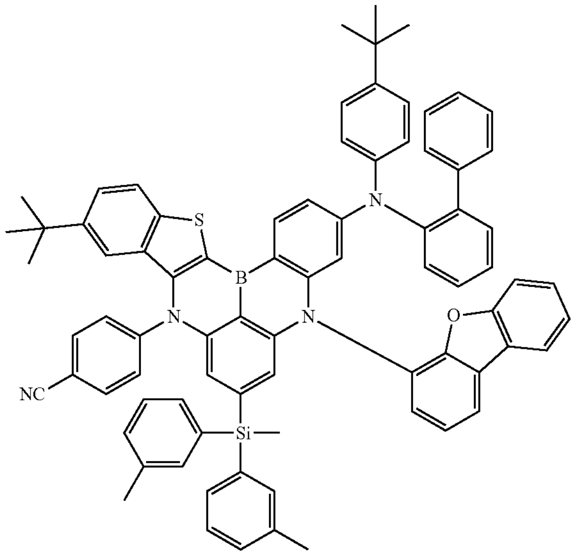
65
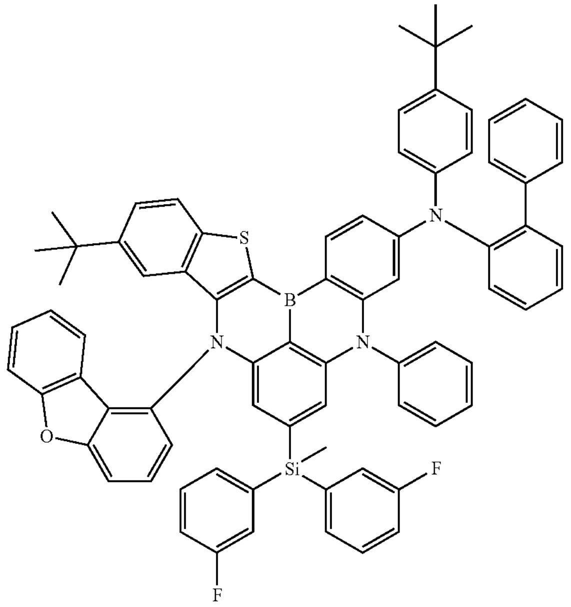
-continued
66
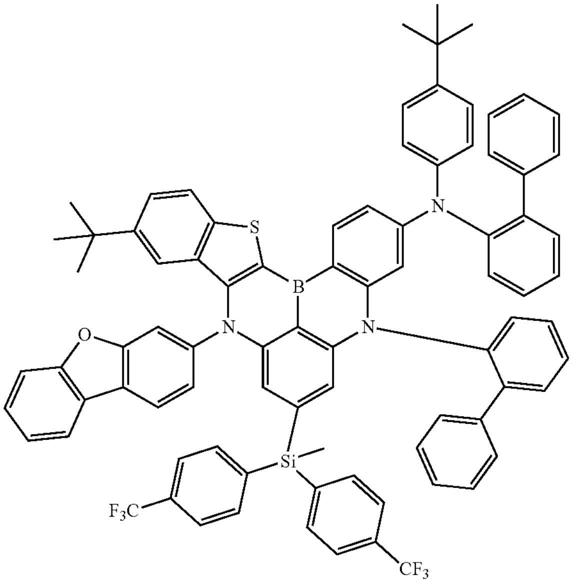
67
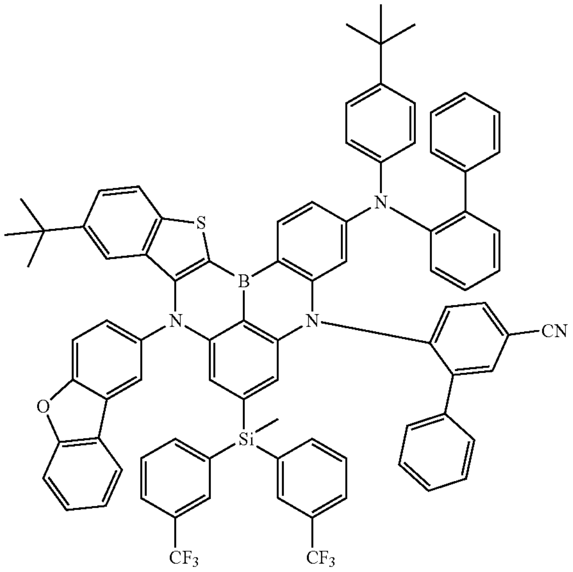

-continued
68
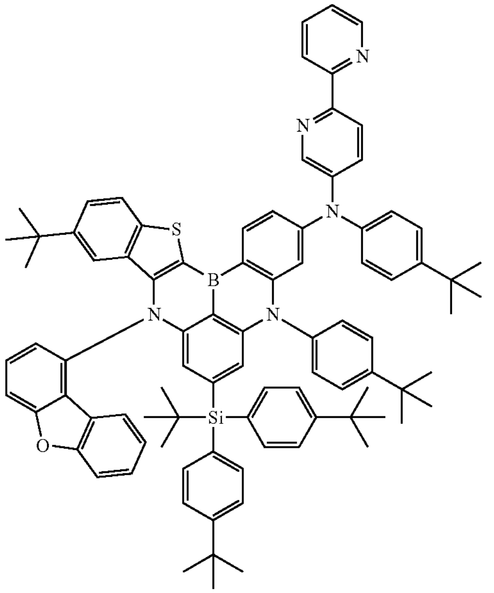
69
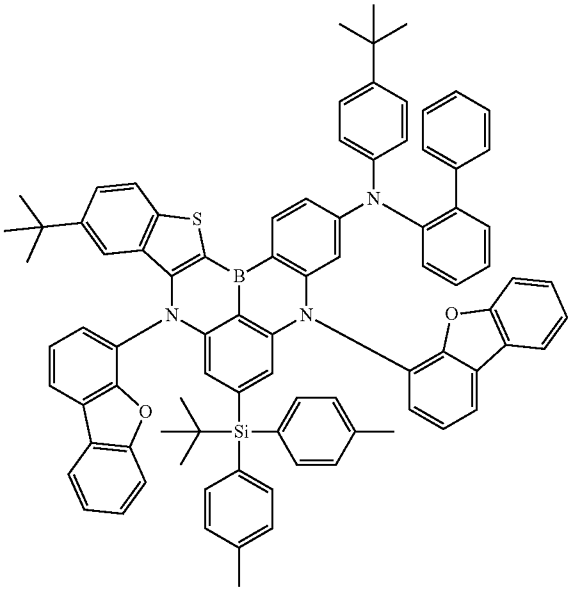
-continued
70
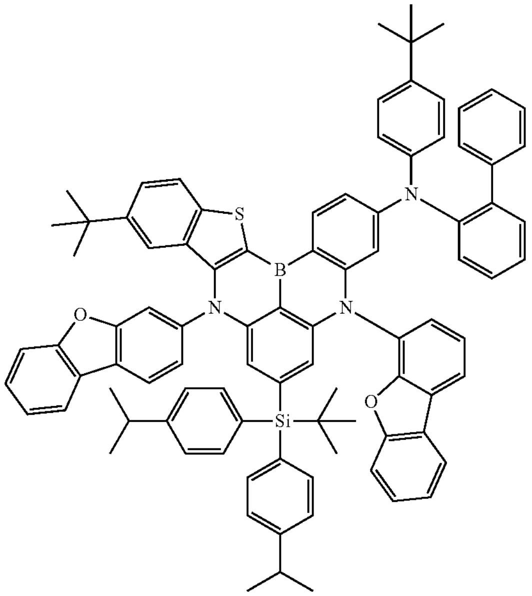
71
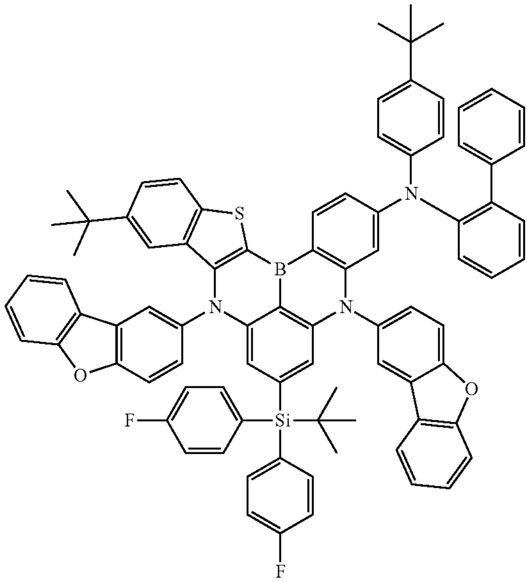

-continued
72
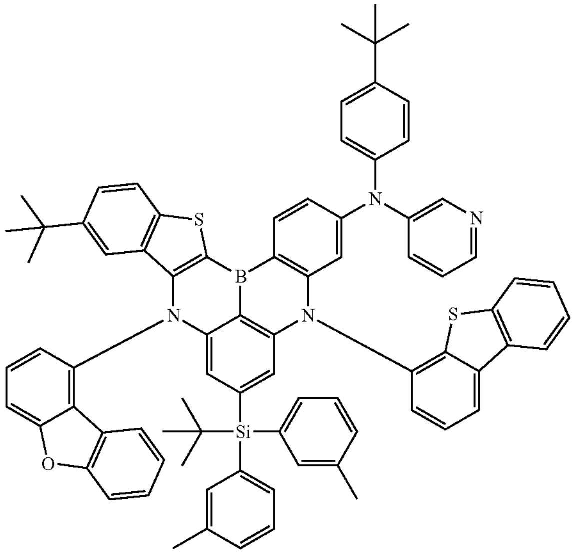
73
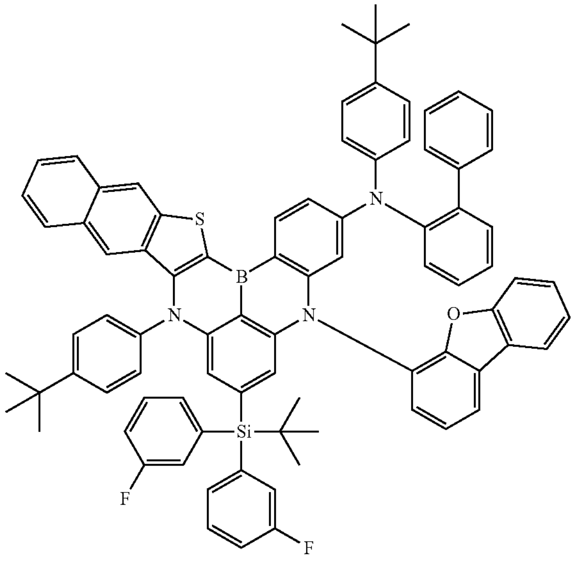
-continued
74
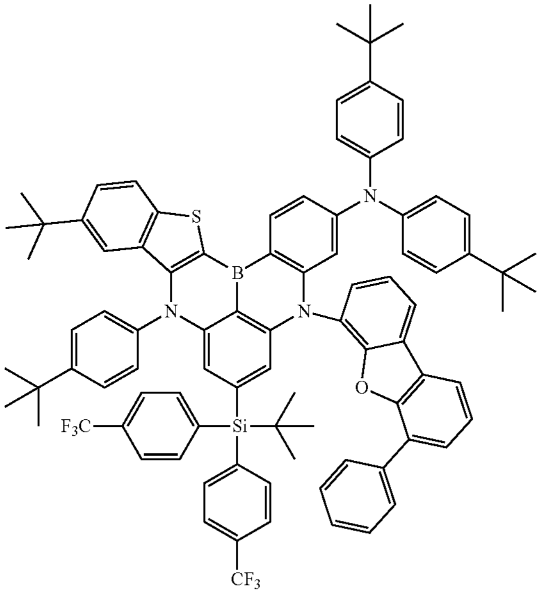
75
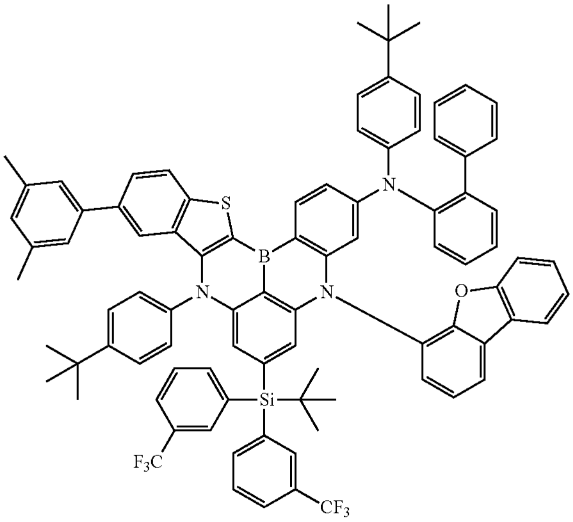

-continued
76
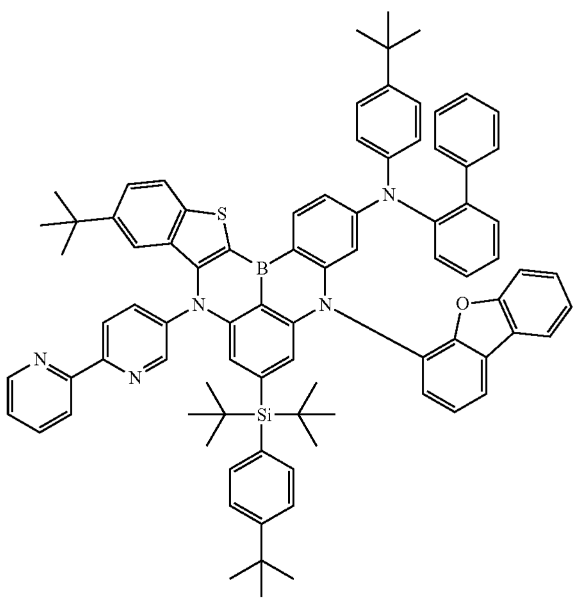
77
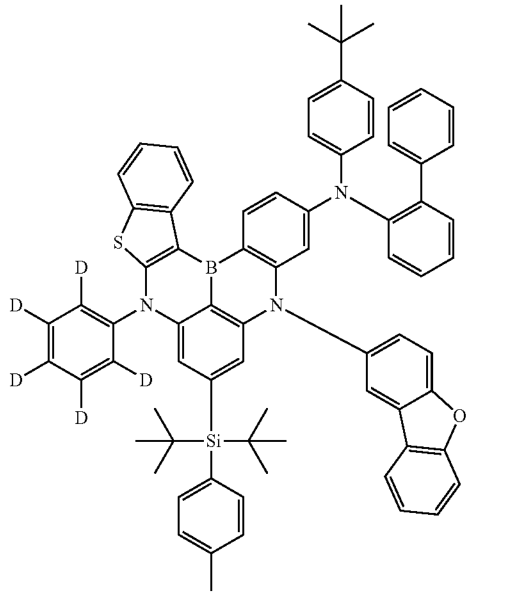
-continued
78
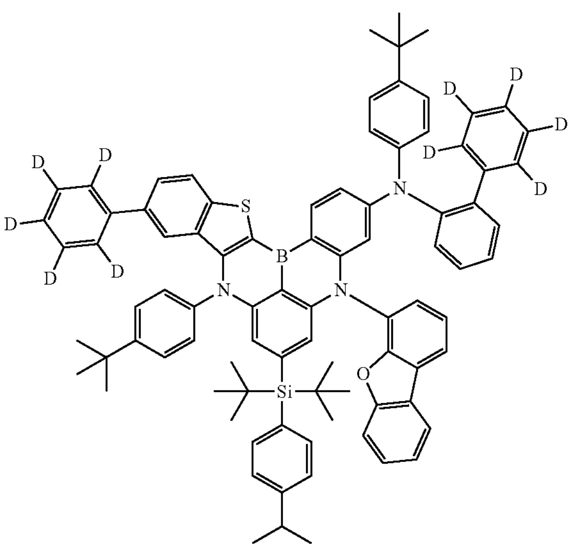
79
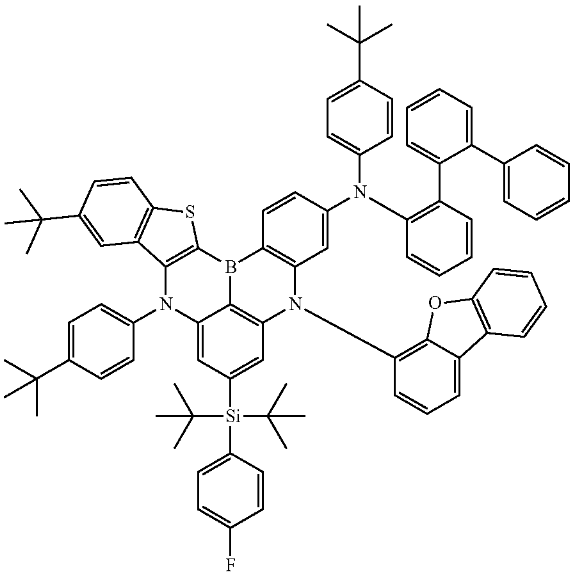

-continued
80
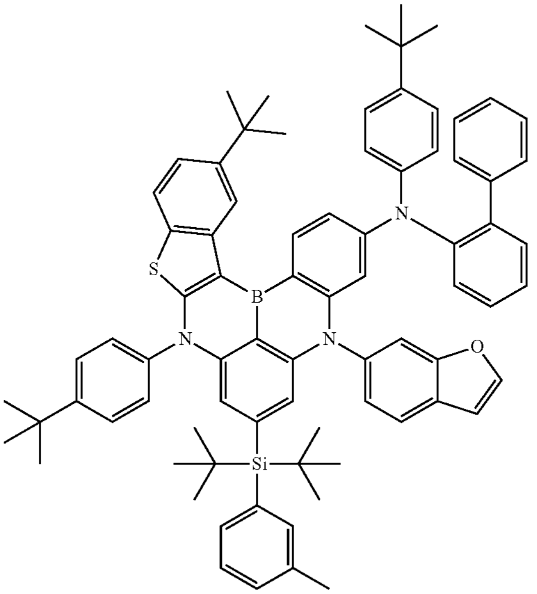
81
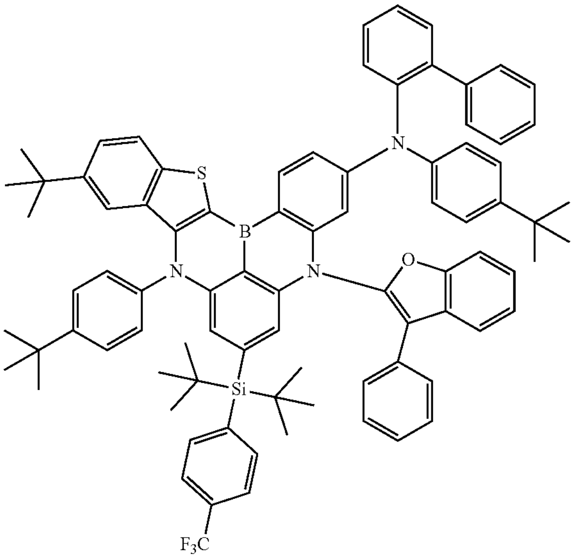
-continued
82
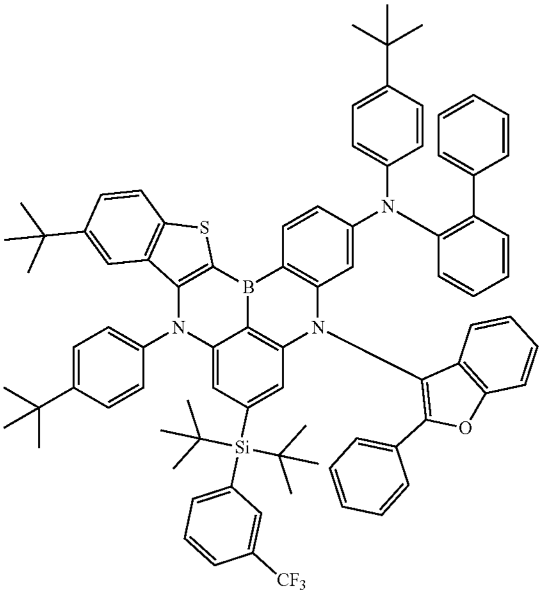
83
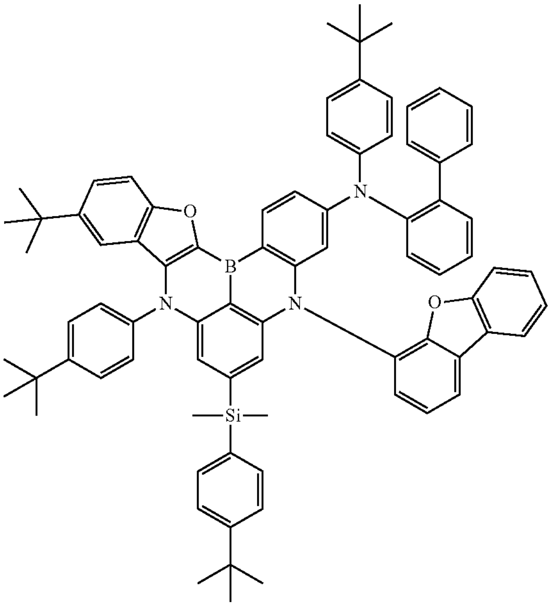

-continued
84
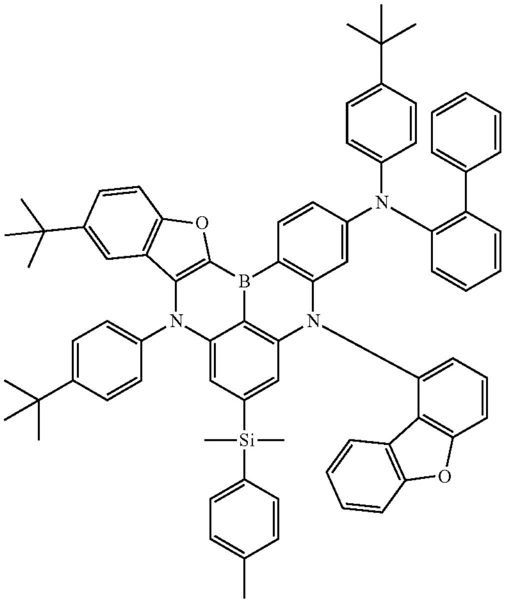
85
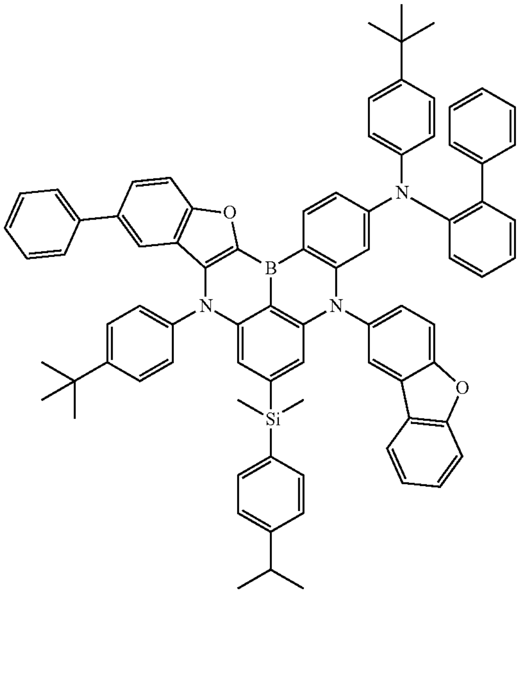
-continued
86
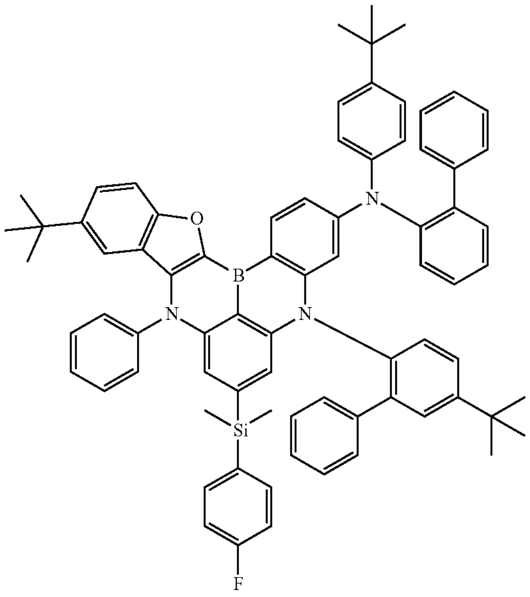
87
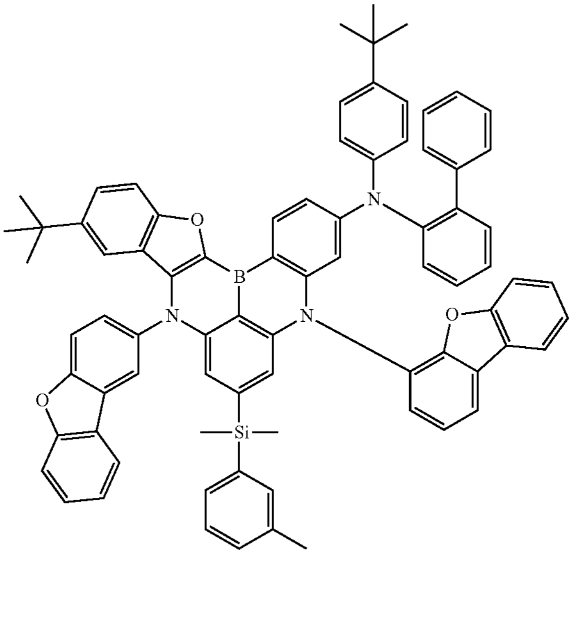

-continued
88
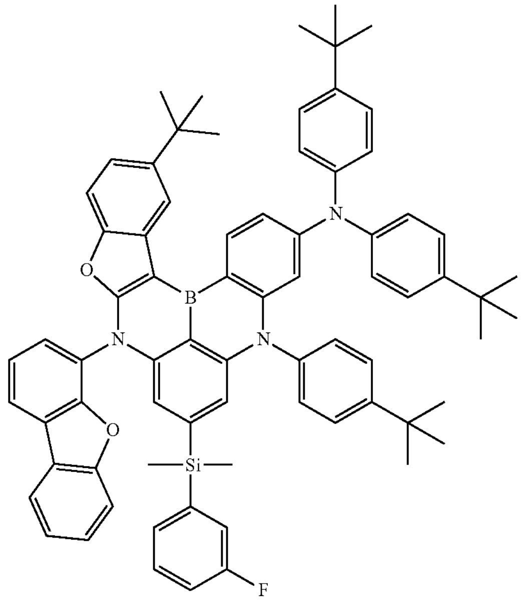
89
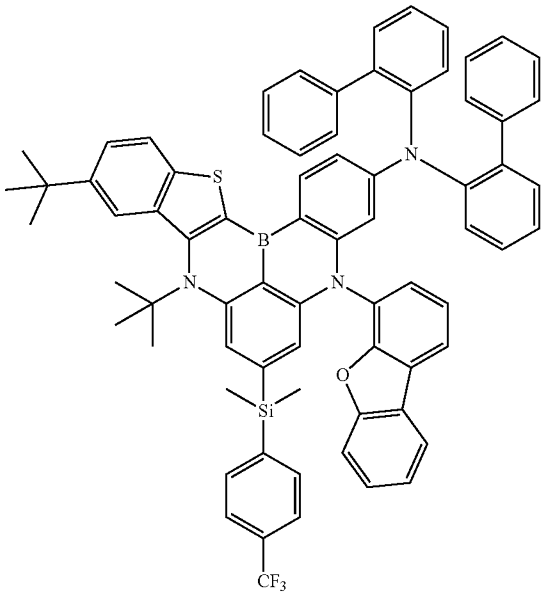
-continued
90
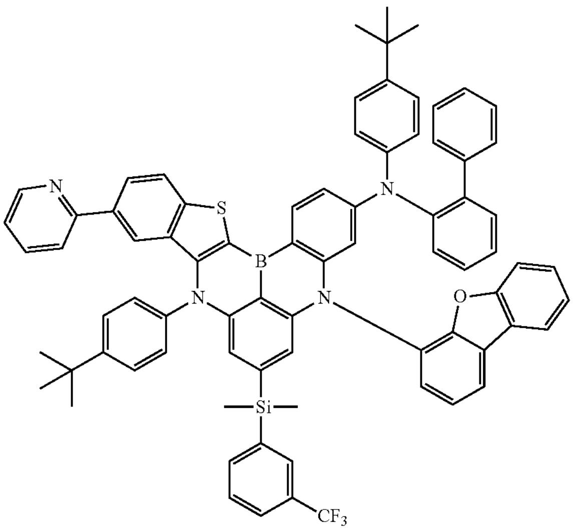
91
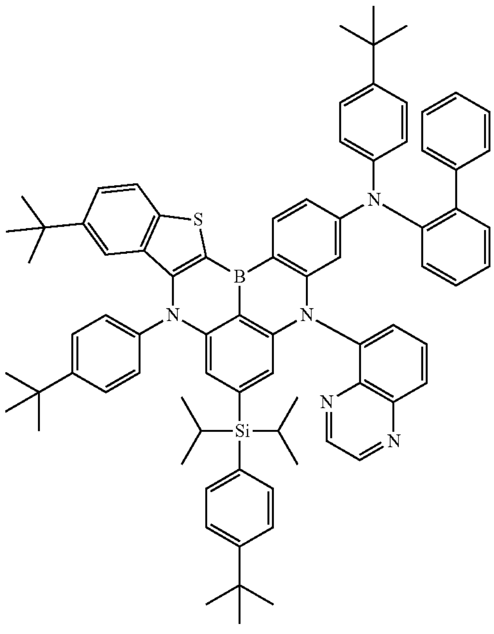

92
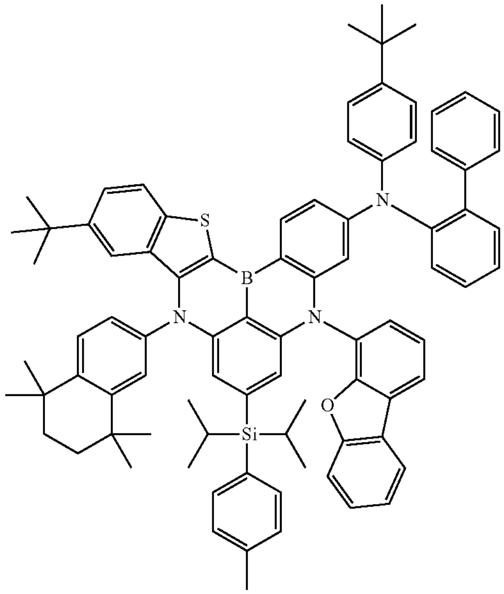
93
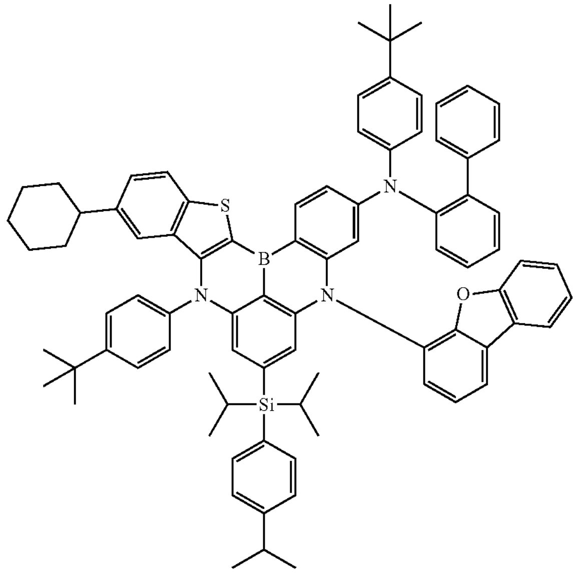
94
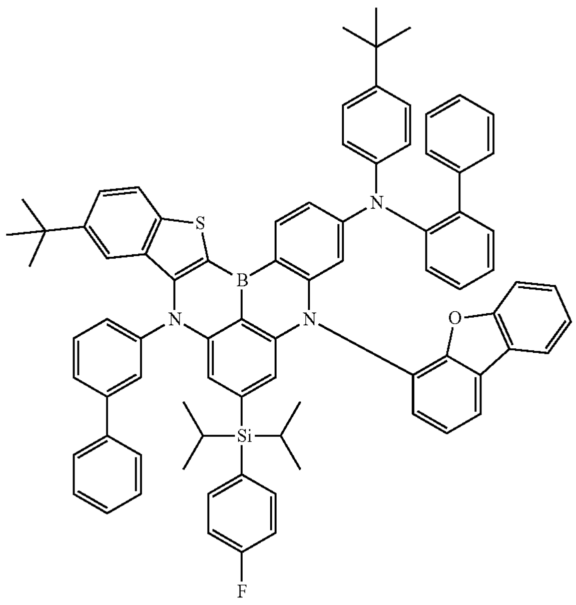
95
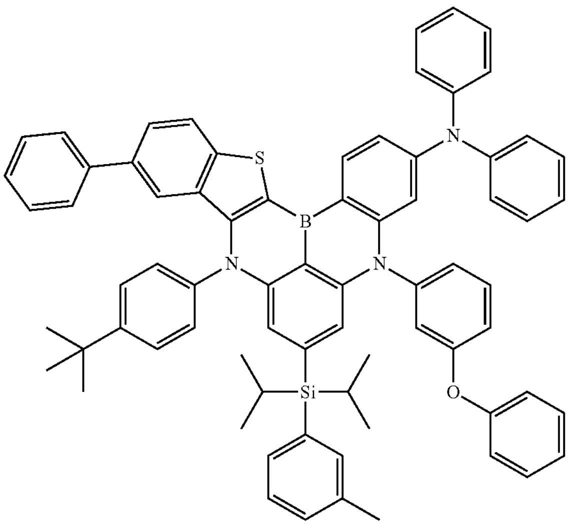

-continued
96
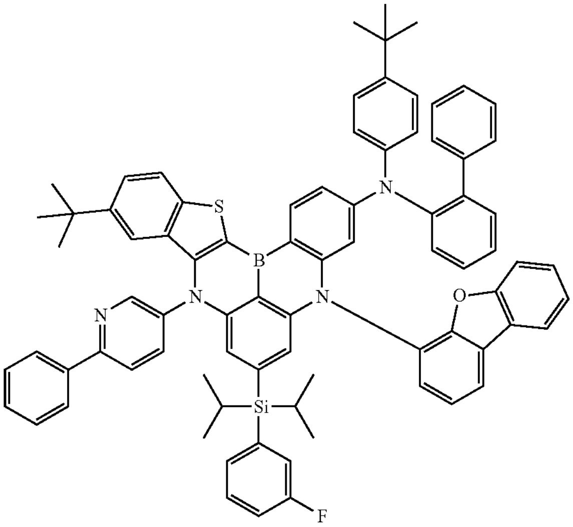
97
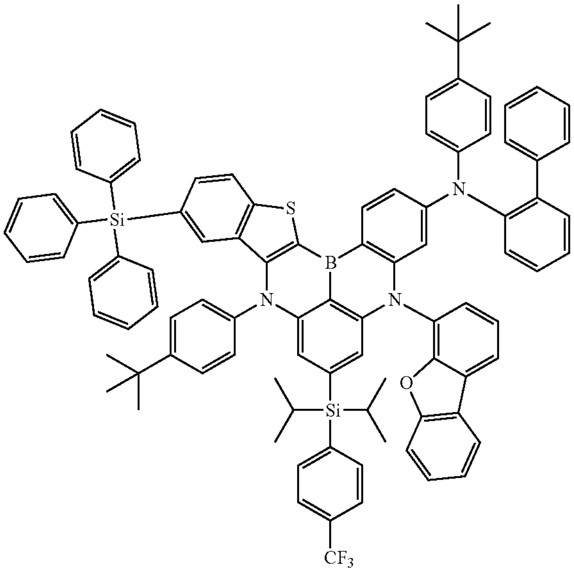
-continued
98
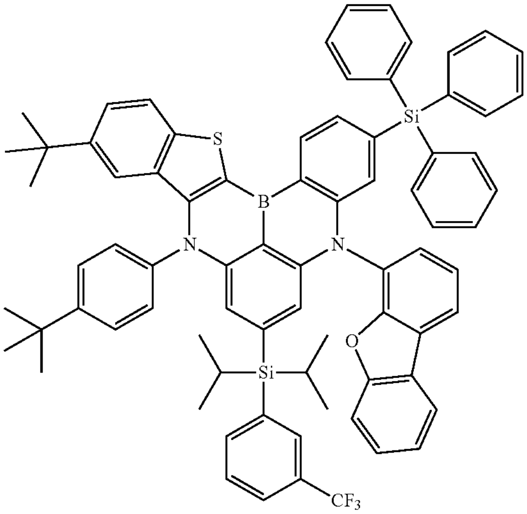
99
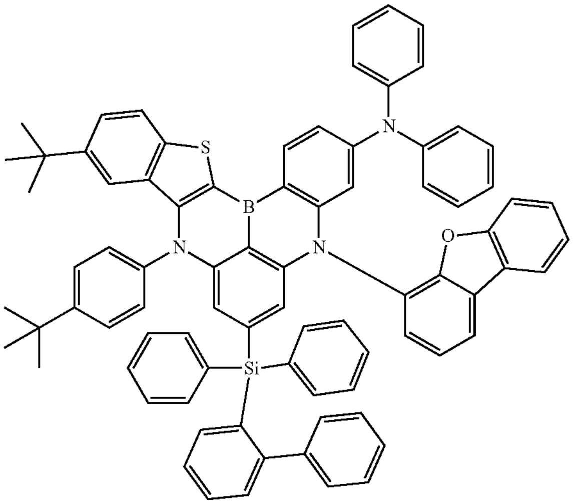
100
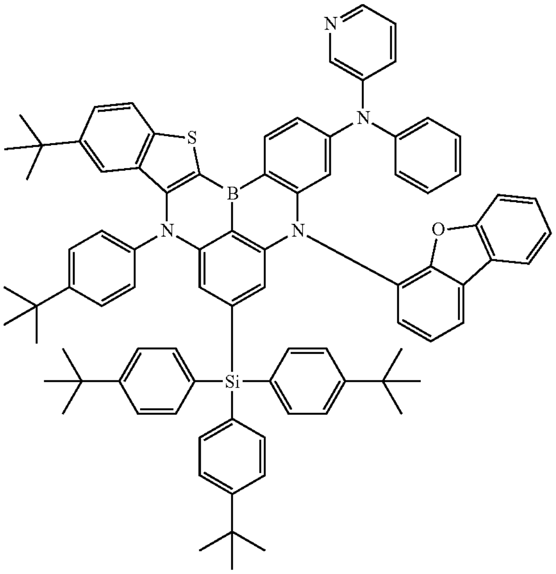

-continued

101

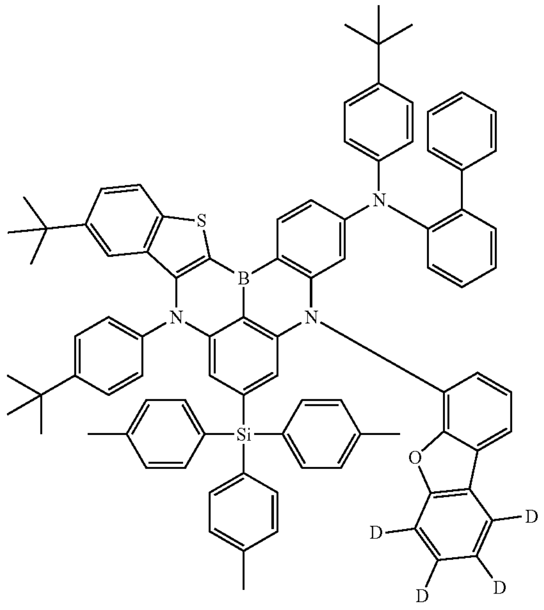

102

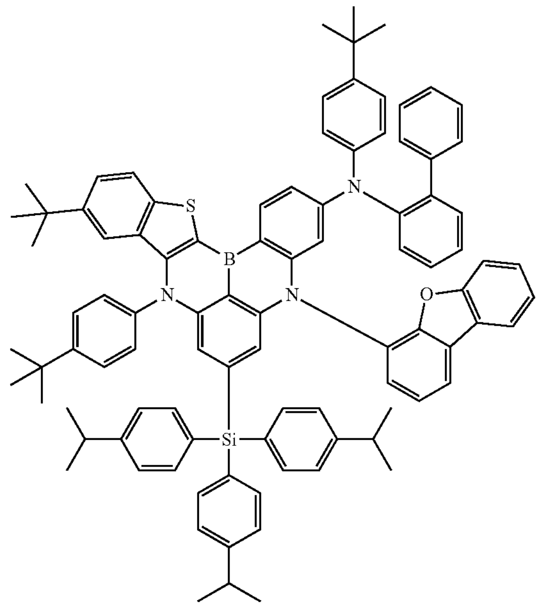

Specific substituents in Formulae 1 and 2 can be clearly seen from the structures of the compounds 1-102.

The boron (B)-containing substituted polycyclic structures can be used as organic light emitting materials having inherent characteristics of the substituents. For example, the substituents may be those used in materials for organic layers of organic electroluminescent devices. This substitution allows the use of the polycyclic compounds as materials that meet the requirements of organic layers, preferably materials for light emitting layers, enabling the fabrication of highly efficient and long-lasting organic electroluminescent devices.

The EL emission spectrum of the compound according to the present invention has a full width at half maximum (FWHM) of 20 nm or less, preferably 15 nm to 20 nm. Due to this feature, the use of the compound according to the present invention as a dopant compound in the light emitting layer of the device can lead to an increase in the efficiency of the device. In addition, the reduced full width at half maximum can lead to an improvement in the color purity of the device.

The host of the organic electroluminescent device according to the present invention may be selected from, but not limited to, the following anthracene derivatives:

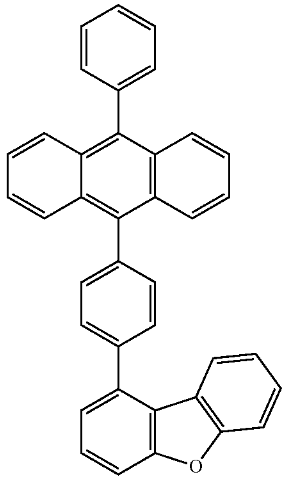

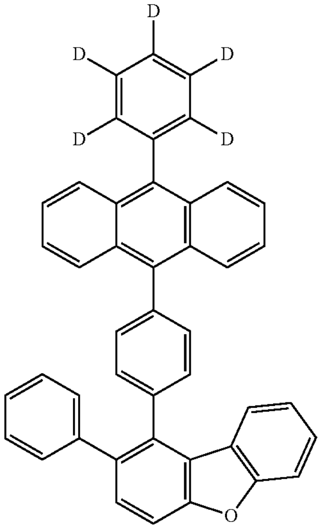

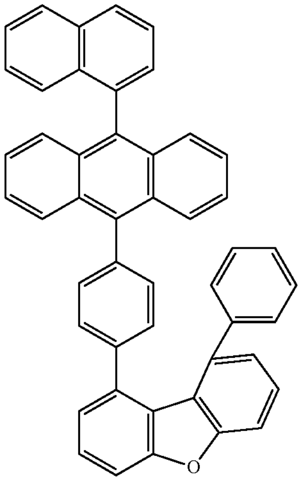

-continued
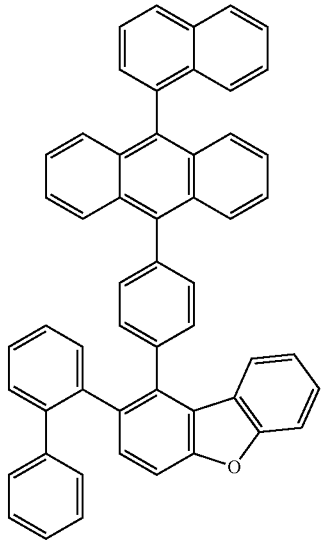
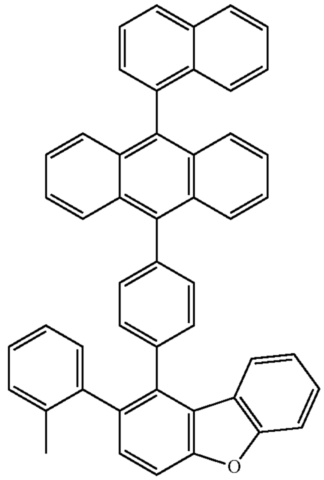
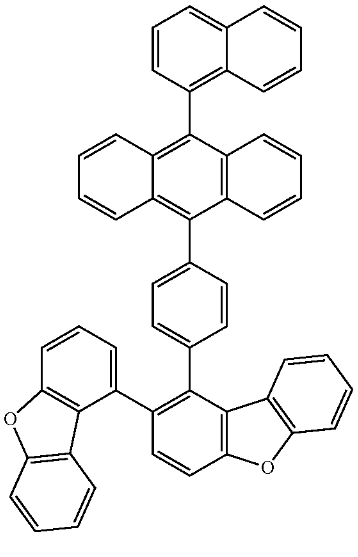
-continued
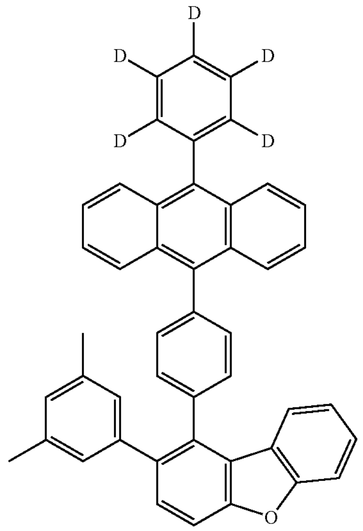
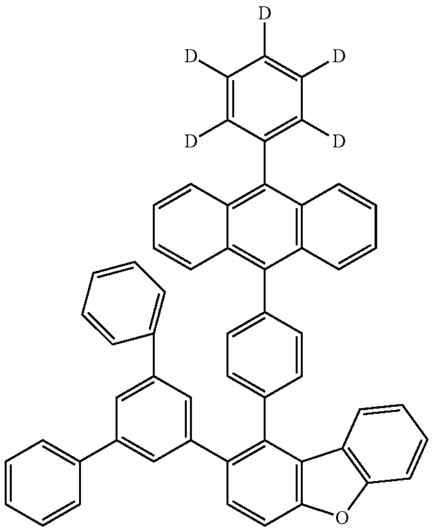
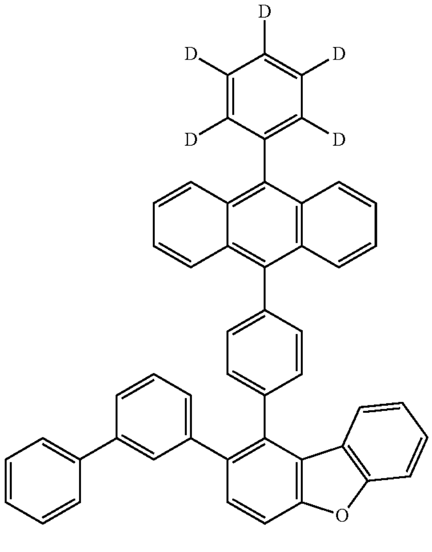

-continued
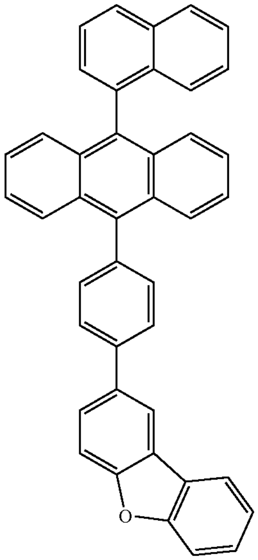
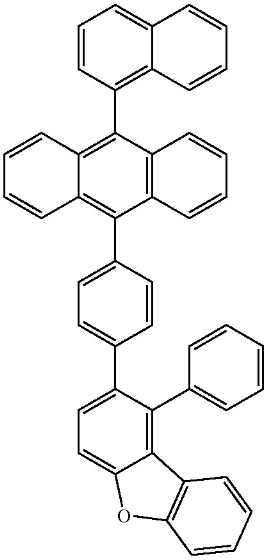
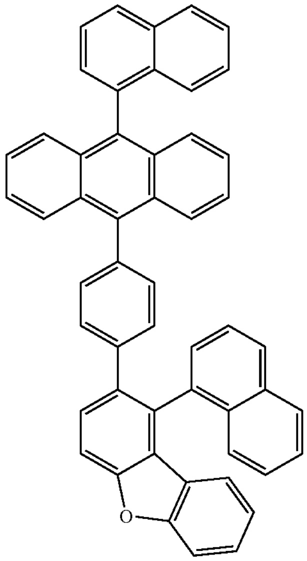
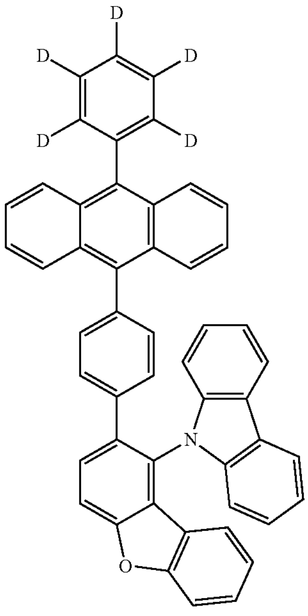
-continued
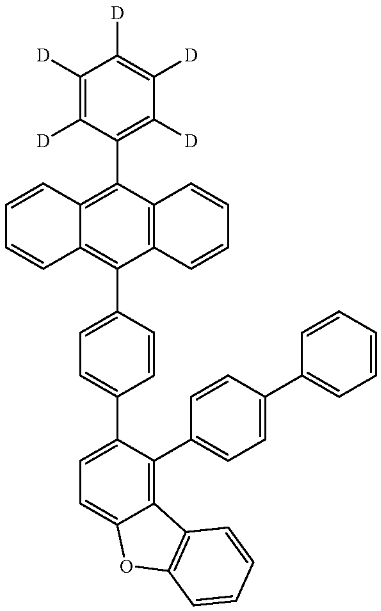
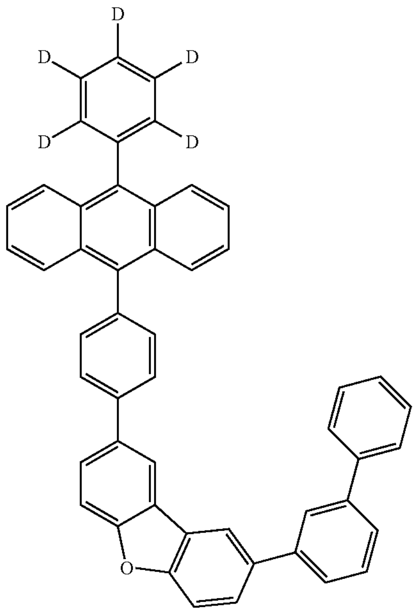

-continued
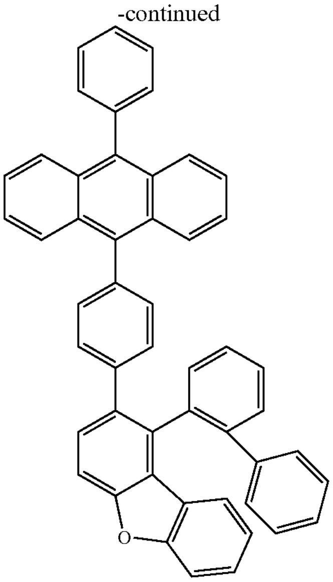
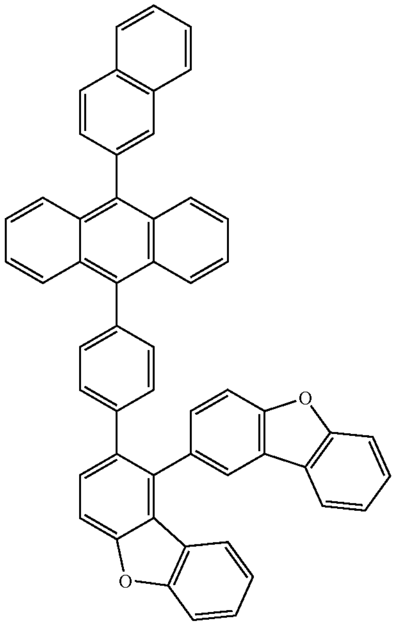
-continued
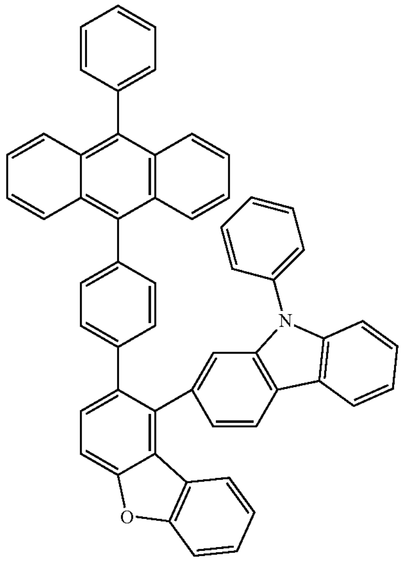
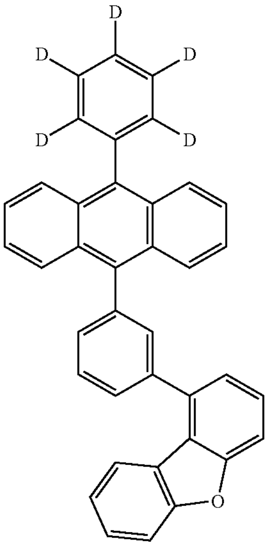
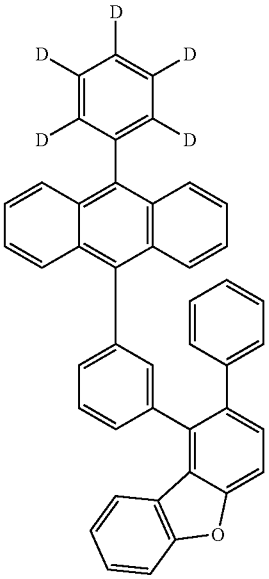
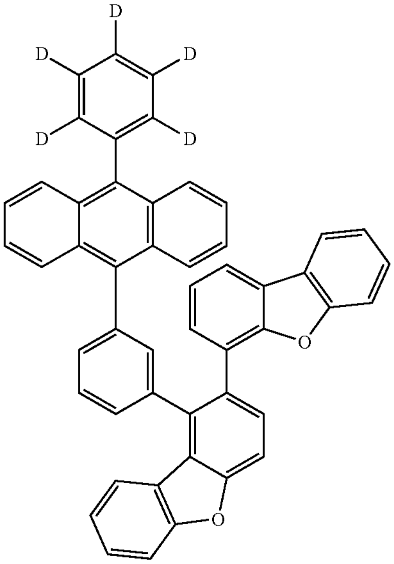

-continued
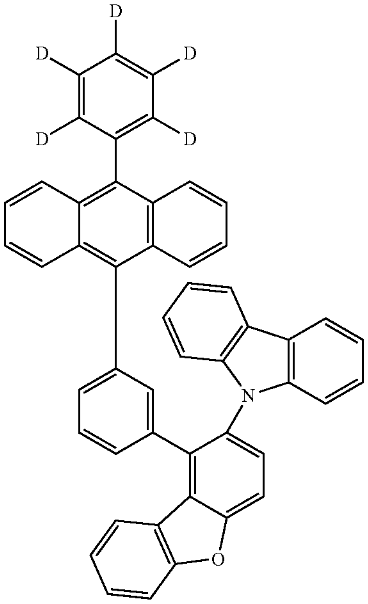
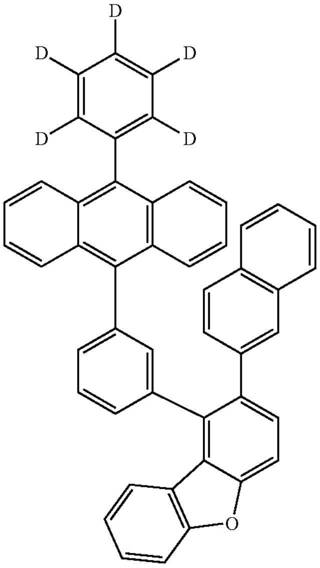
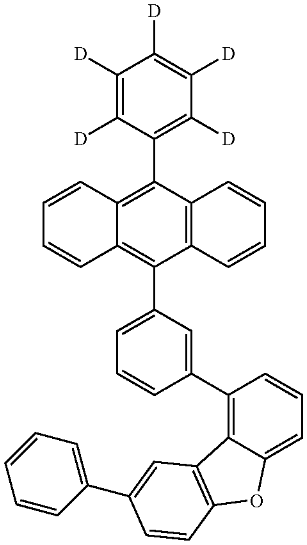
-continued
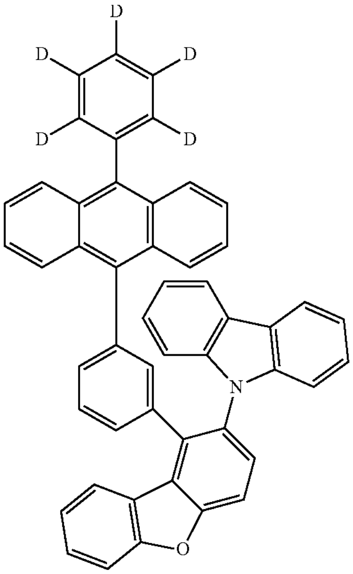
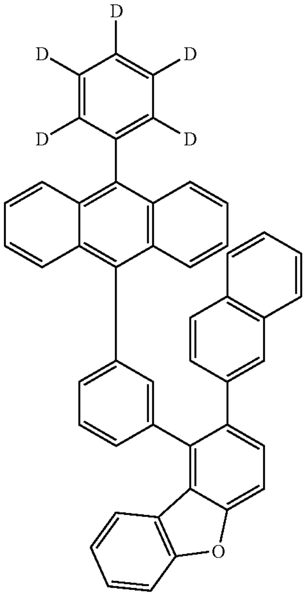
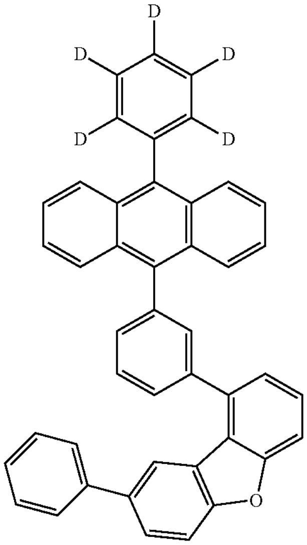

-continued
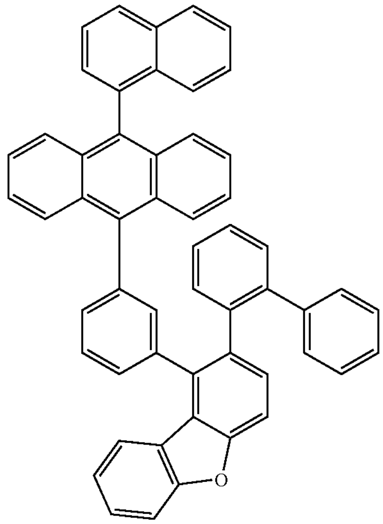
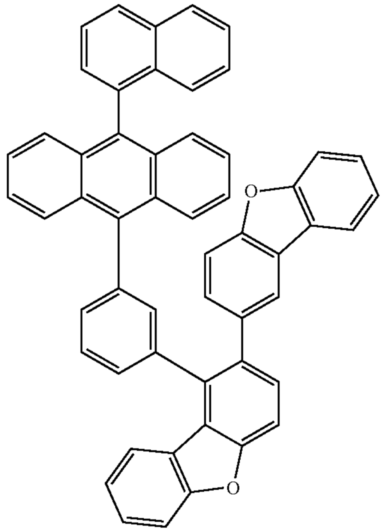
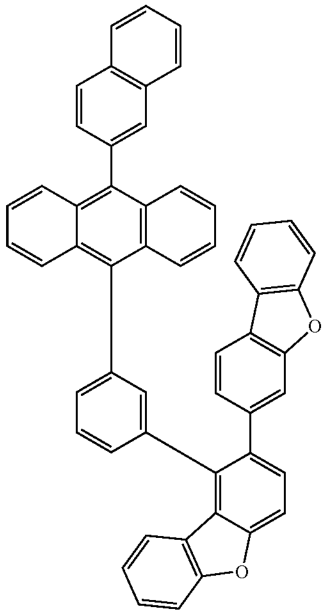
-continued
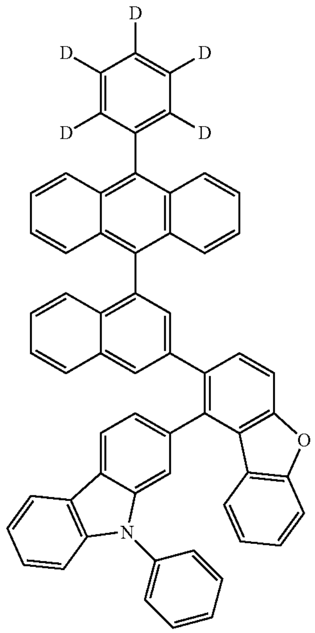
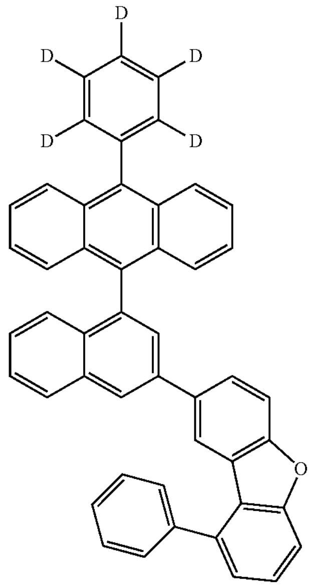 [SMILES: [2H]c1c([2H])c([2H])c(-c2c3ccccc3c(-c3cc(-c4ccc5oc6cccc(-c7ccccc7)c6c5c4)cc4ccccc34)c3ccccc23)c([2H])c1[2H]]

-continued
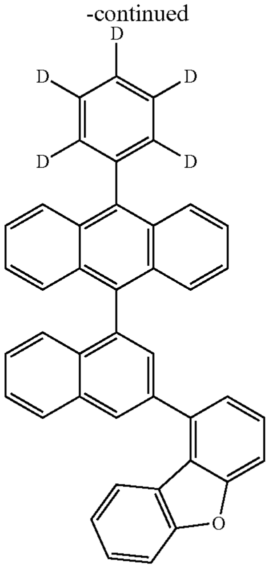
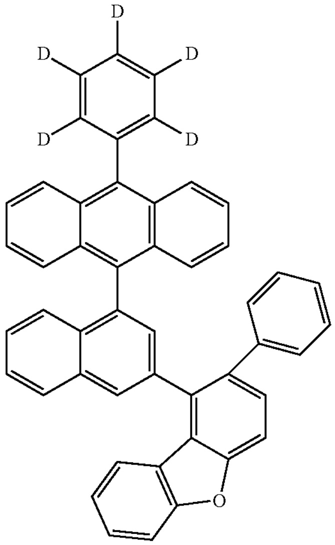
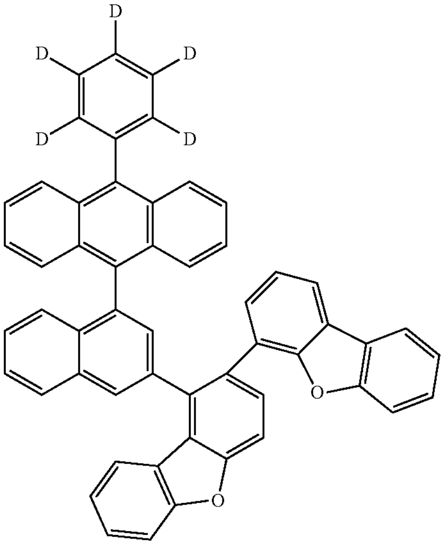
-continued
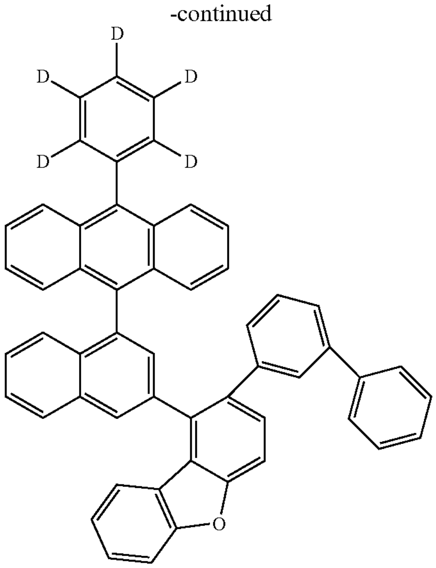
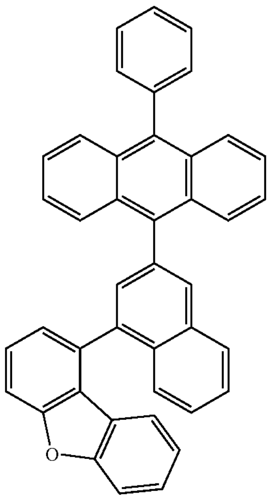
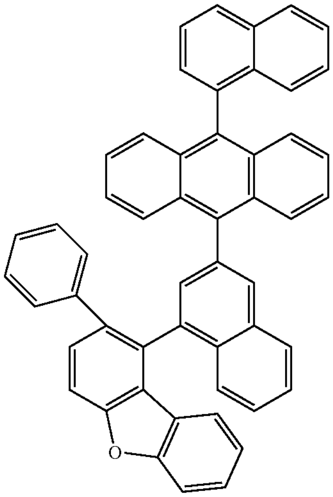

-continued
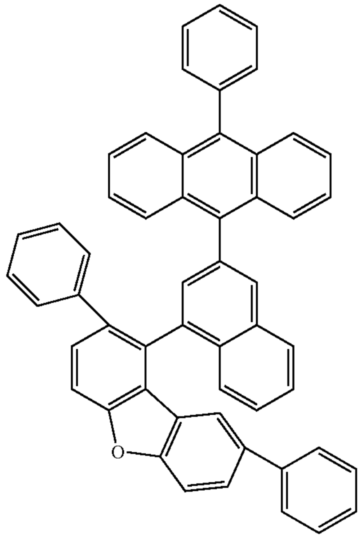
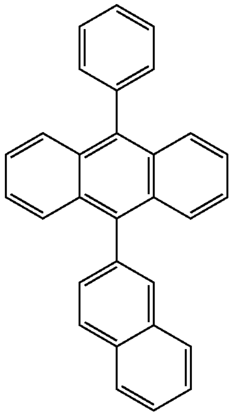
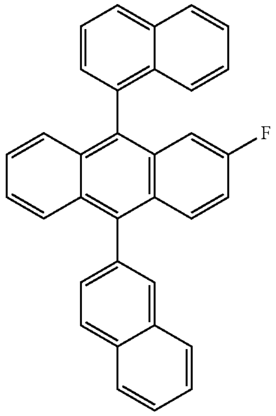
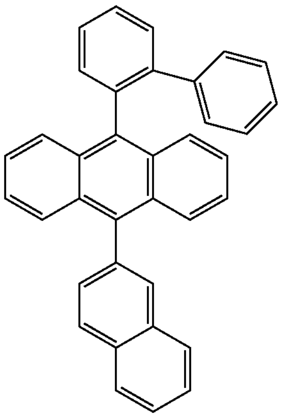
-continued
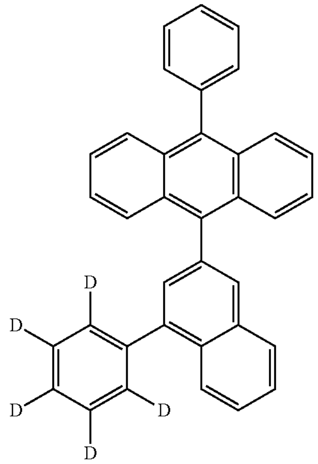
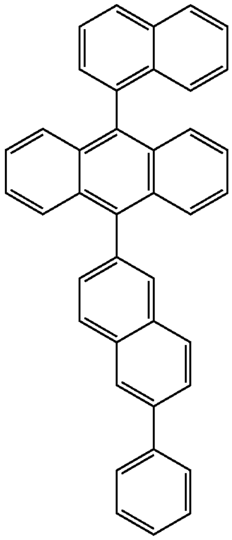
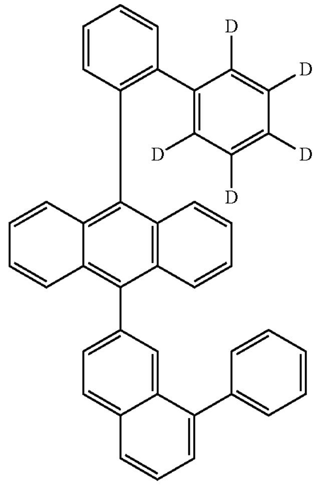
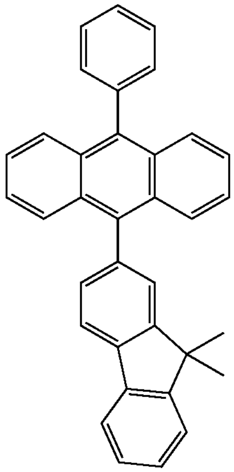
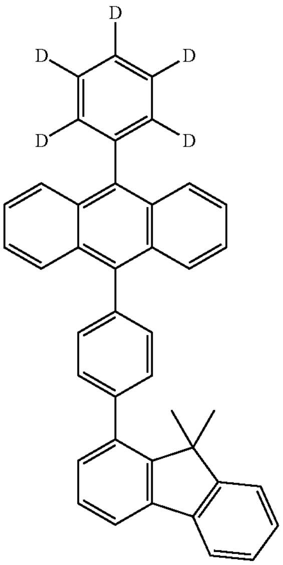

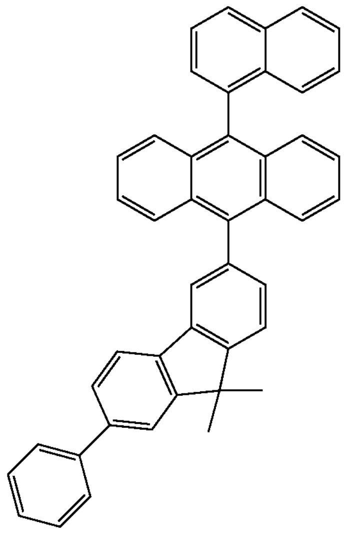
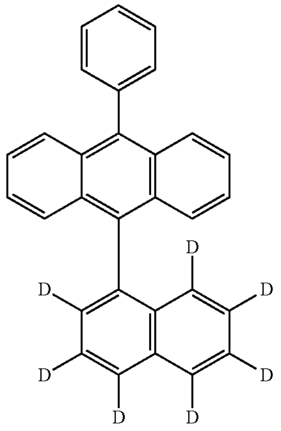
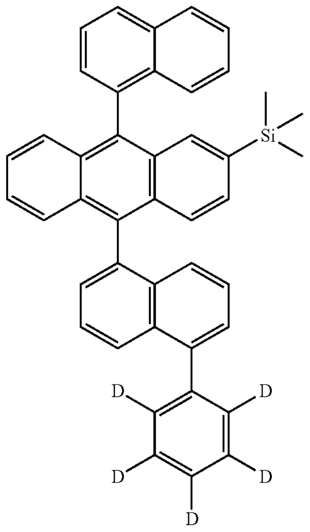
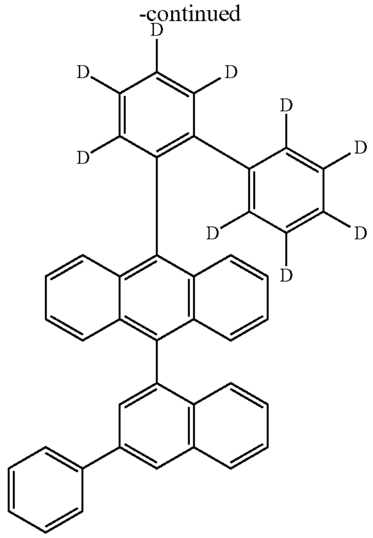
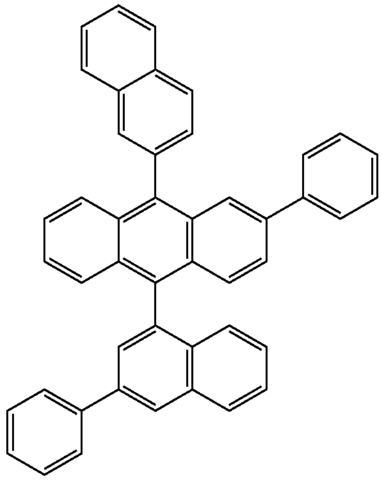
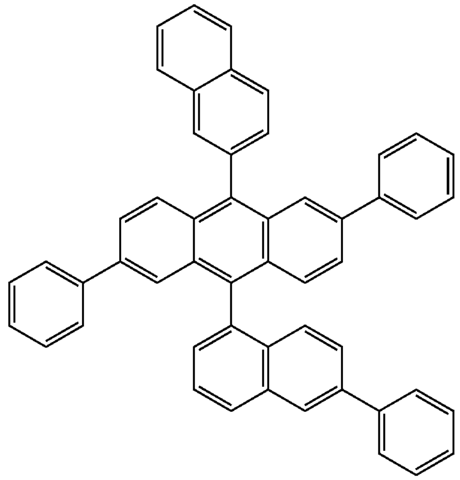

-continued
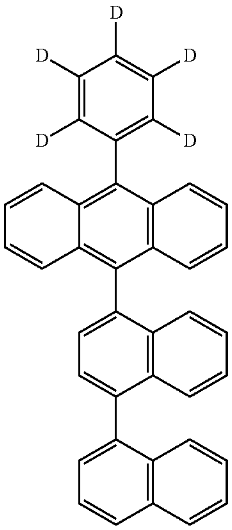
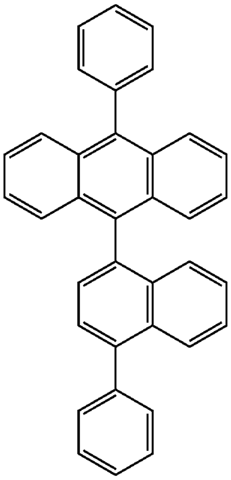
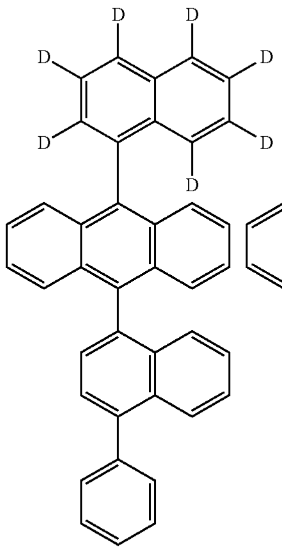
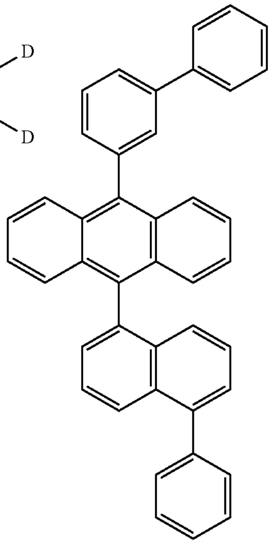
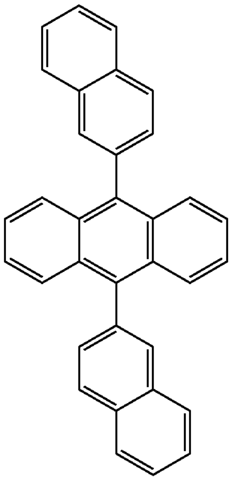
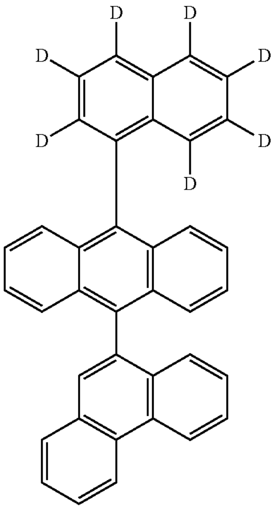
-continued
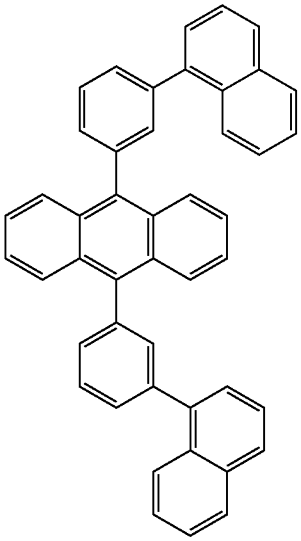
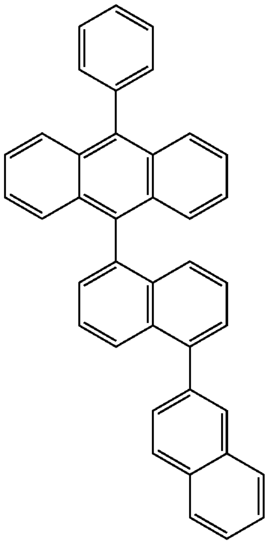
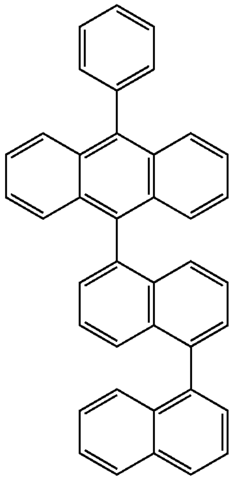
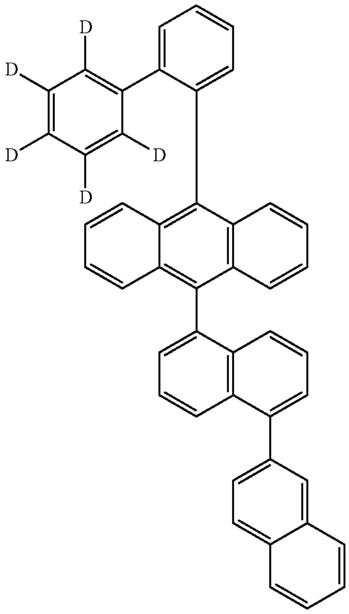

-continued
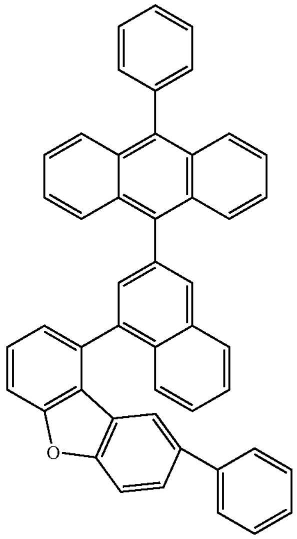
-continued
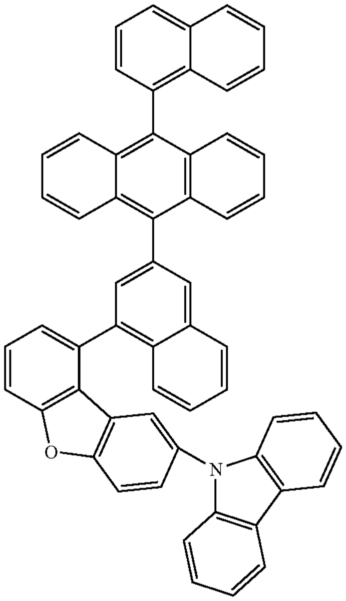
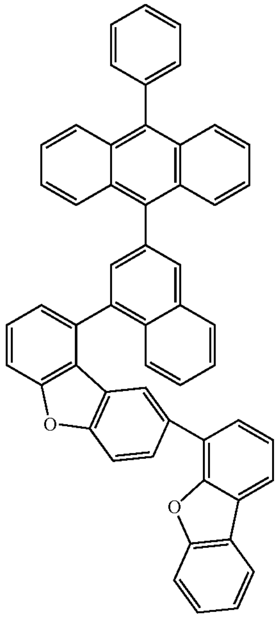
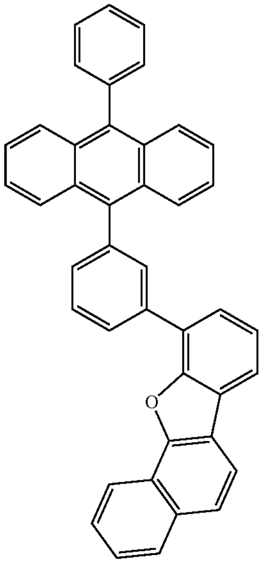

-continued
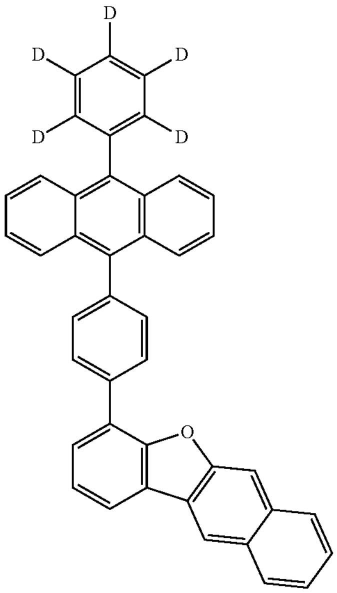
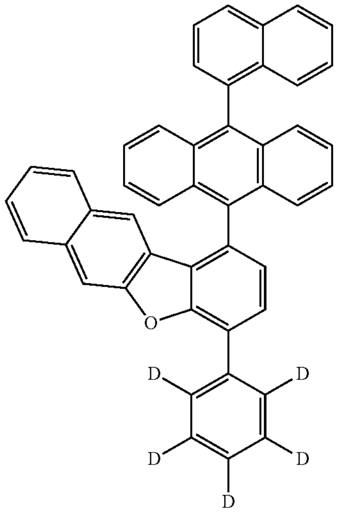
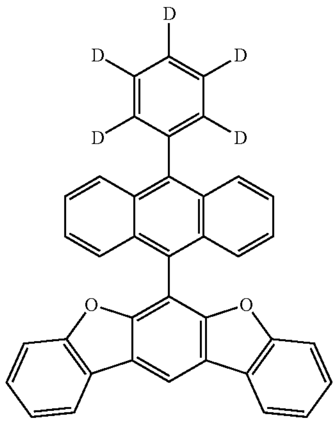
-continued
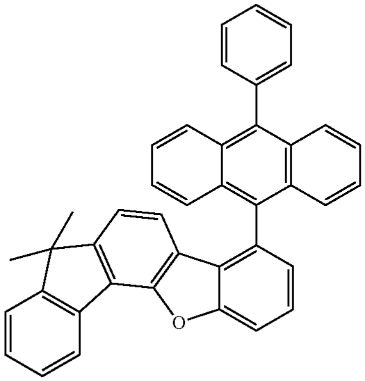
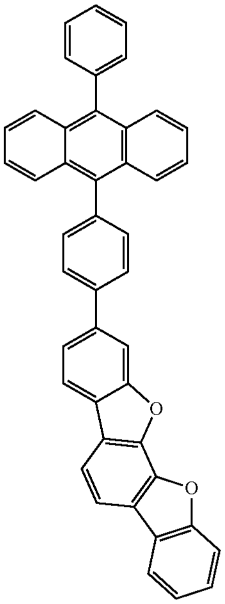
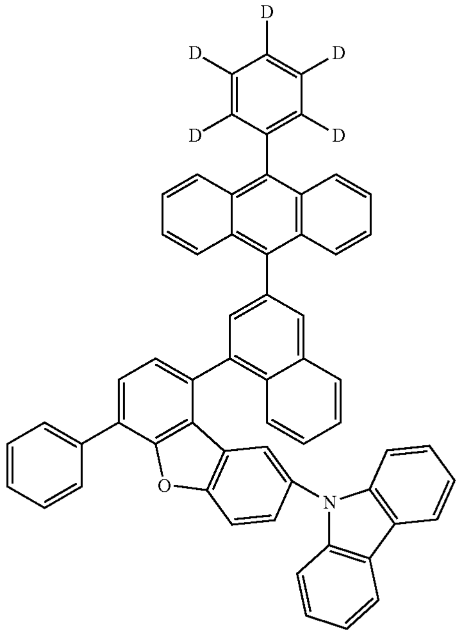

-continued
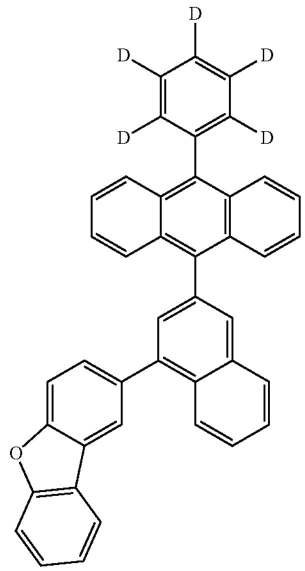
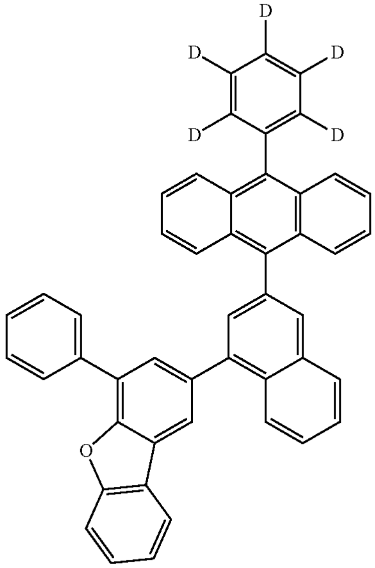
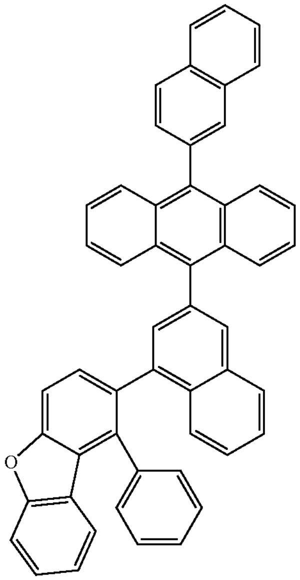
-continued
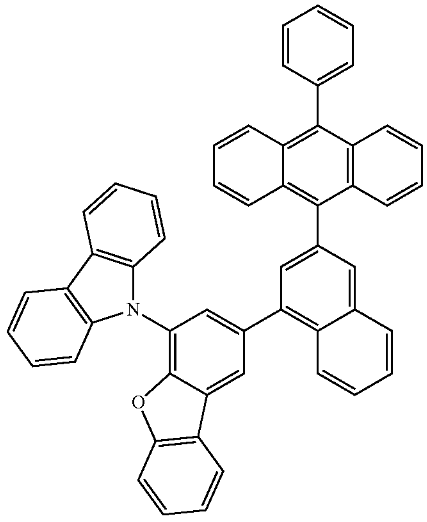
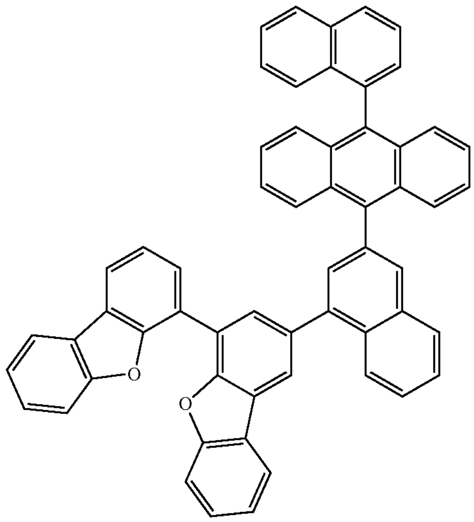
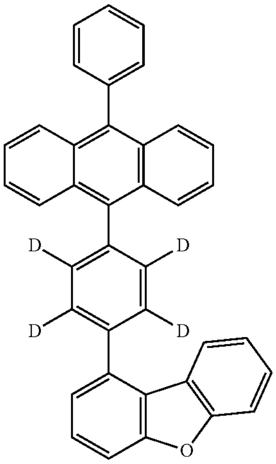

-continued
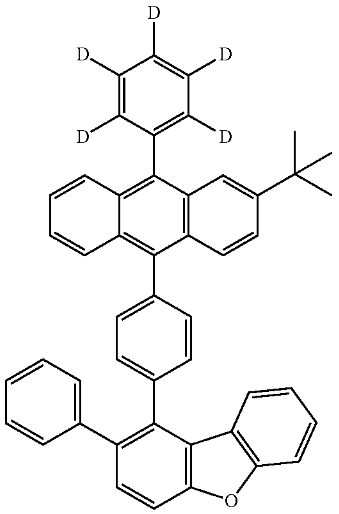
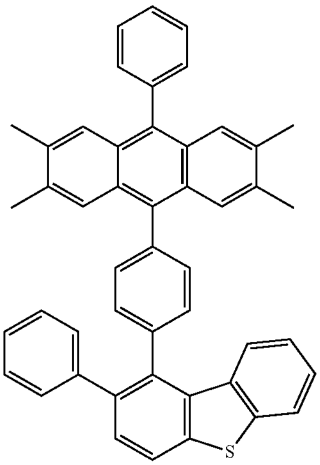
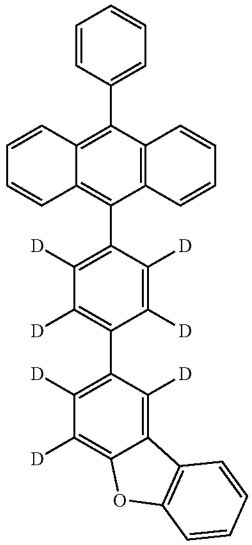
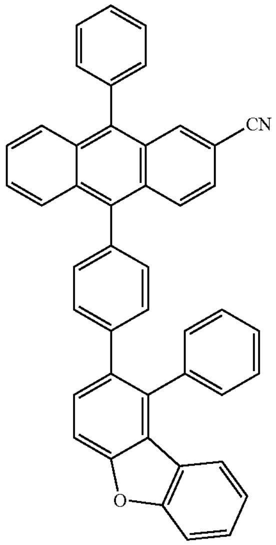
-continued
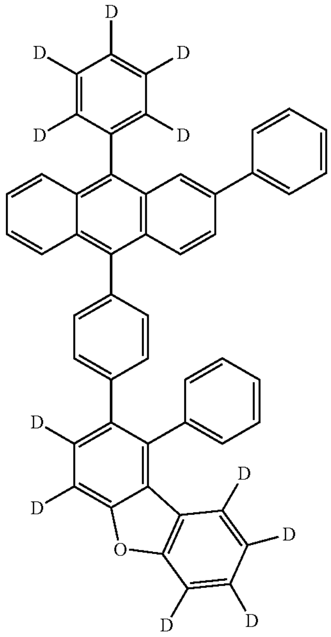
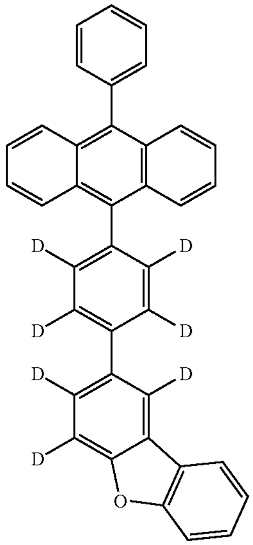
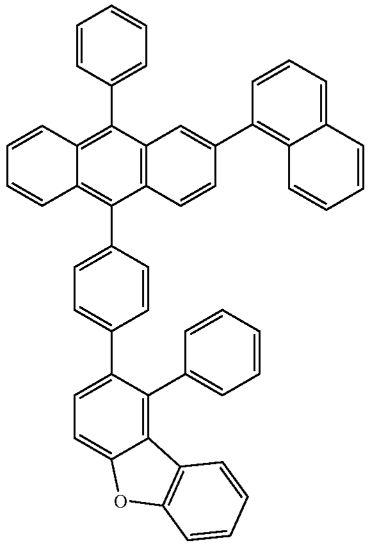

-continued
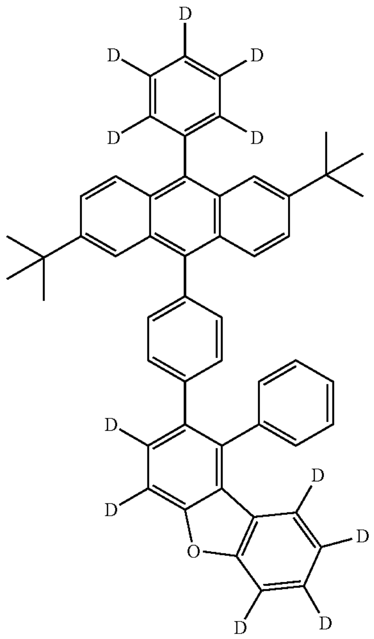
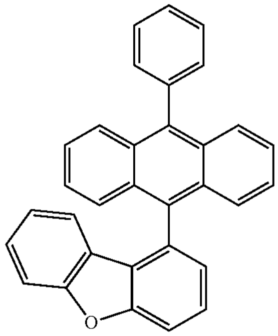
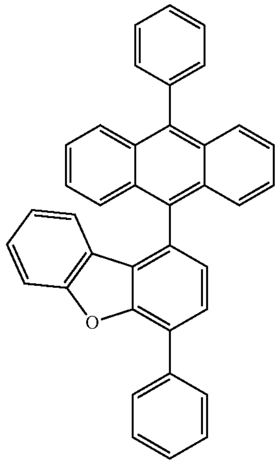
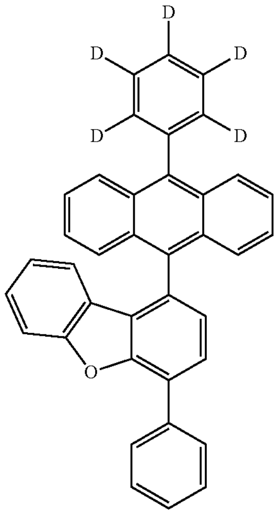
-continued
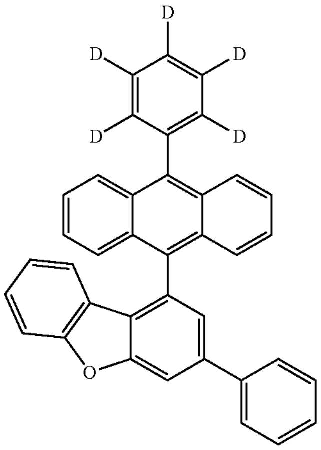
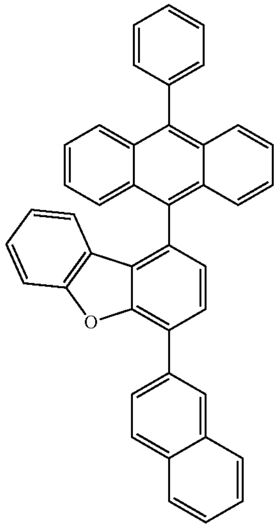
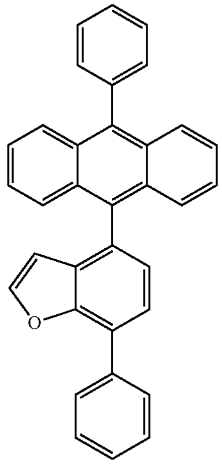
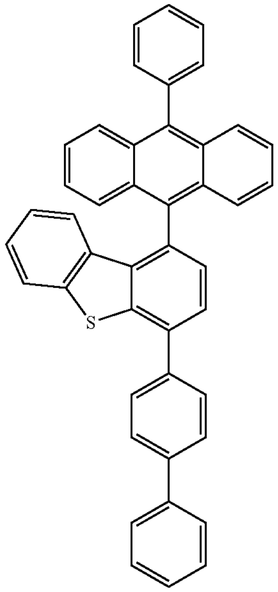
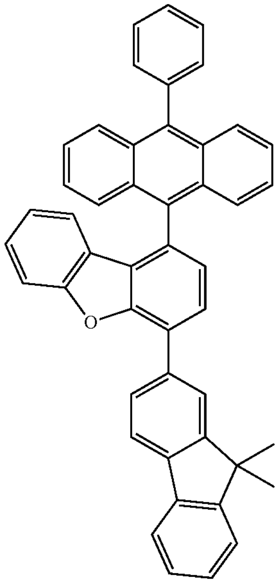

-continued
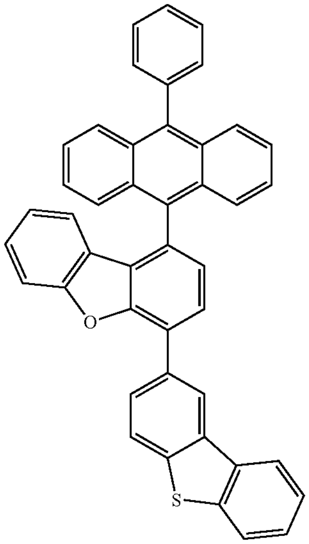
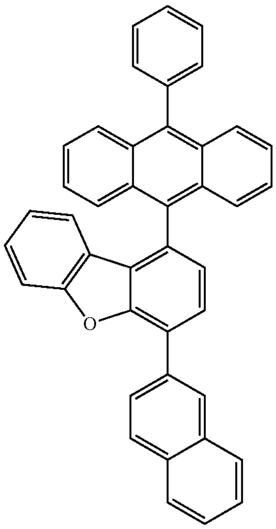
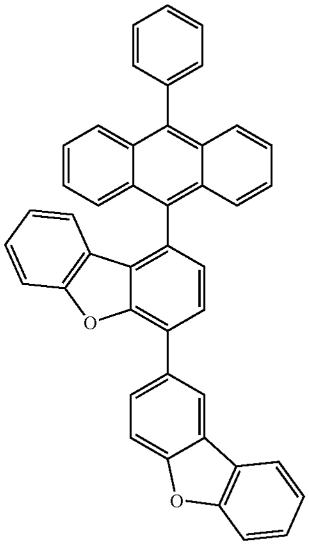
-continued
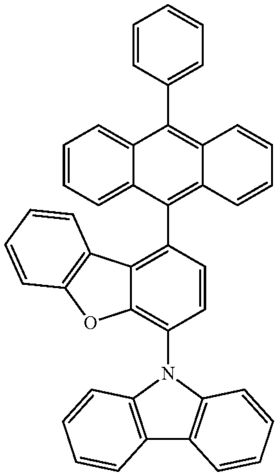
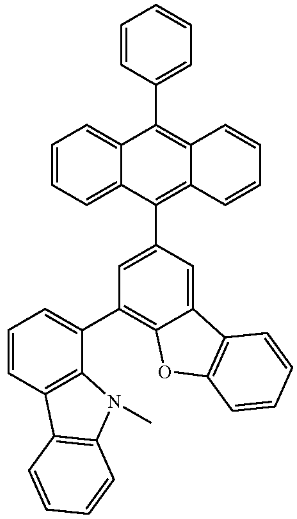
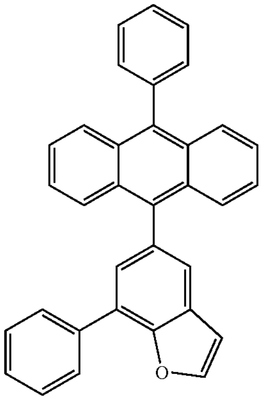
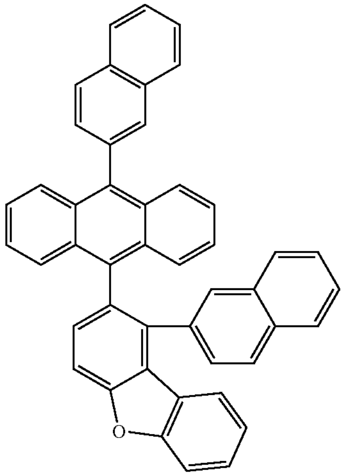

-continued
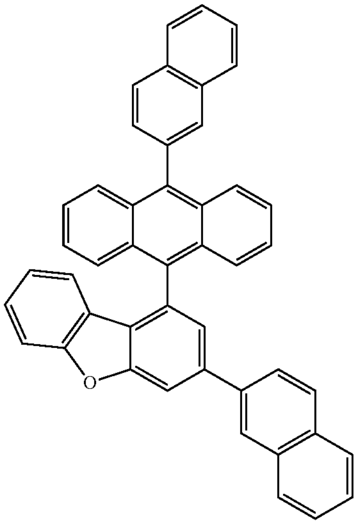
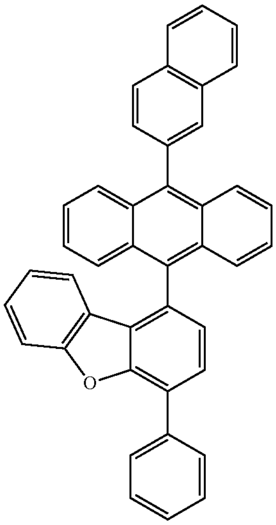
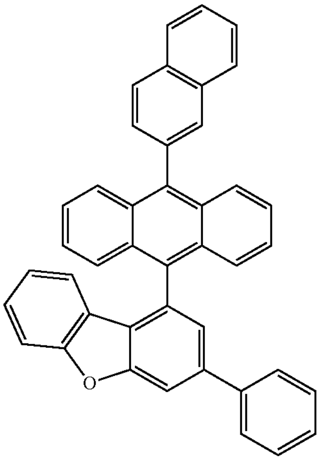
-continued
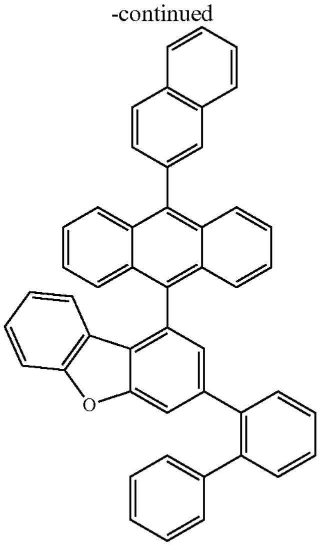
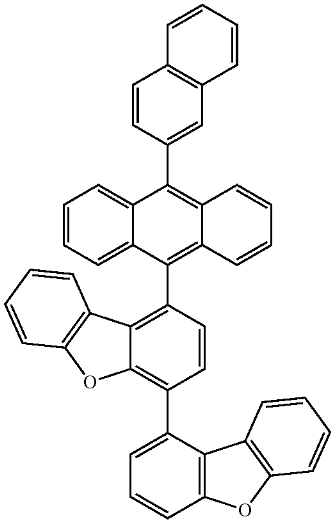
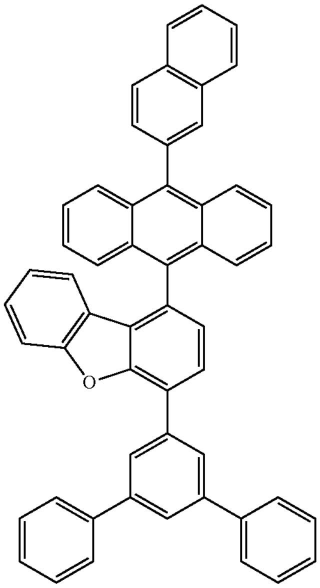

-continued
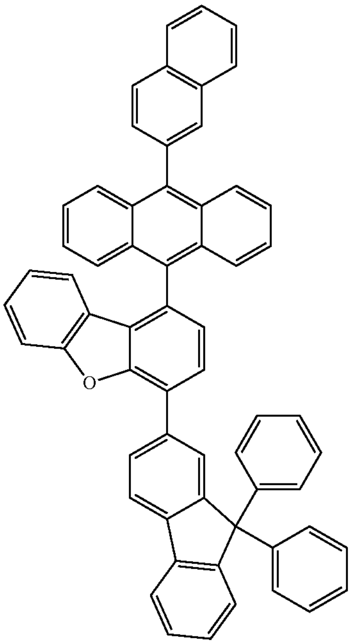
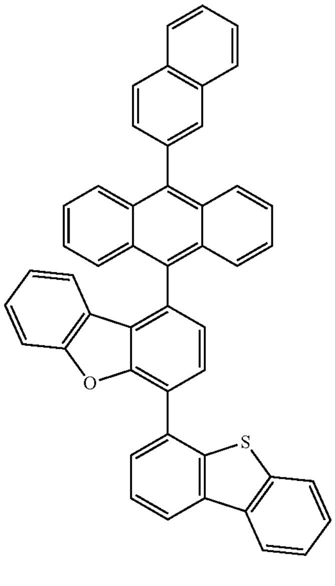
-continued
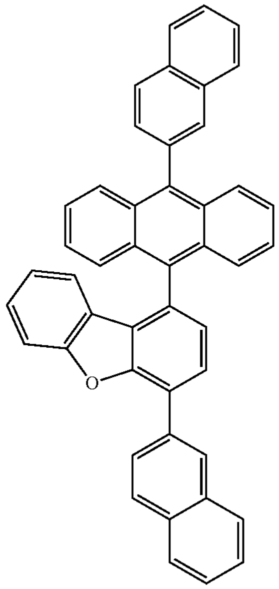
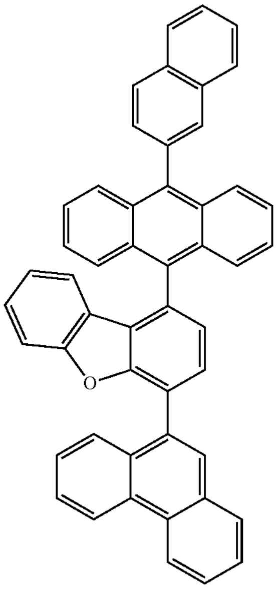
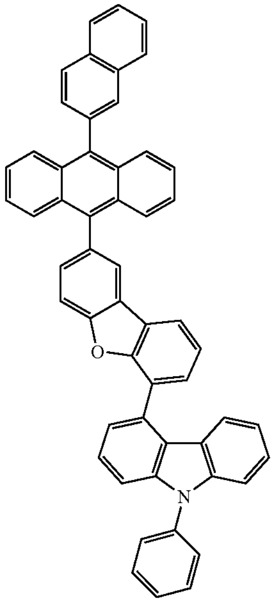
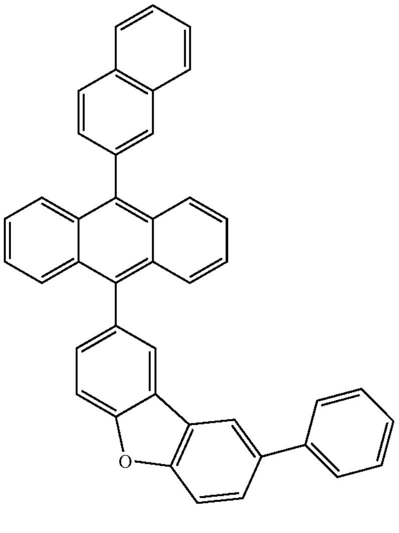

-continued
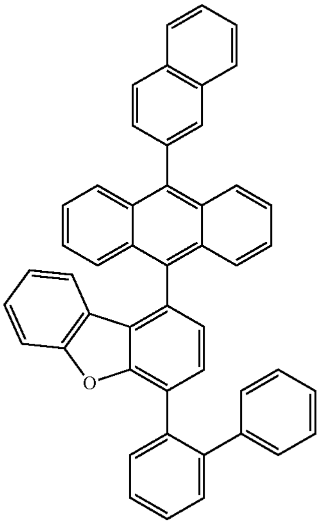
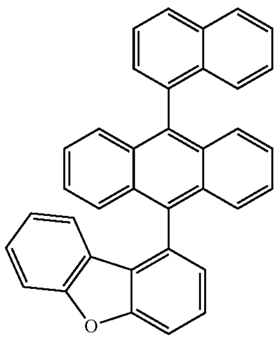
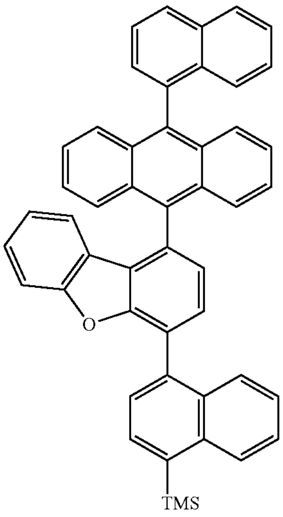
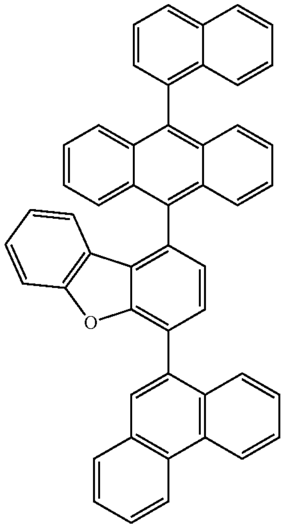
-continued
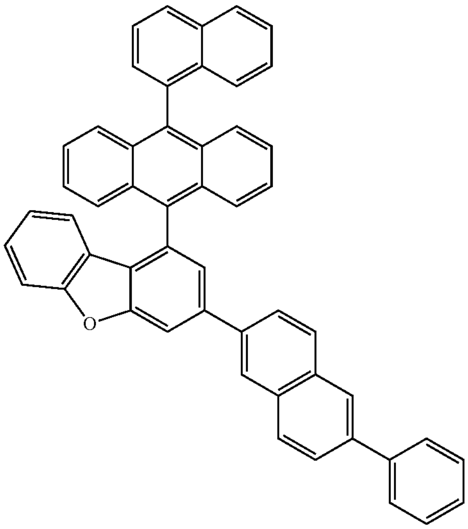
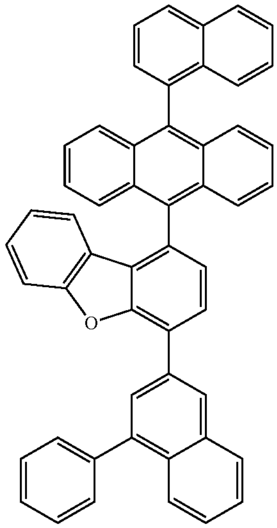
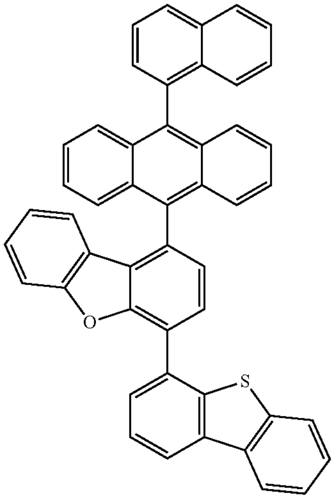

-continued
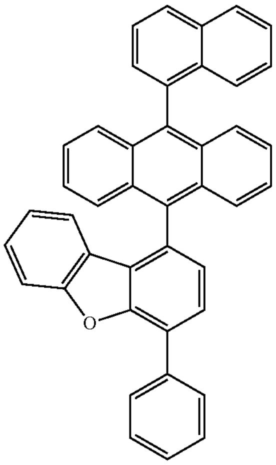
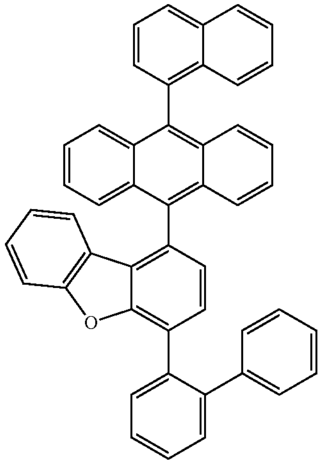
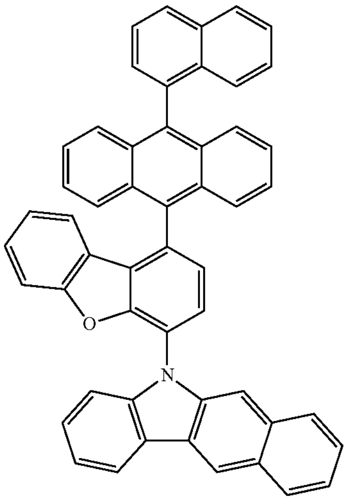
-continued
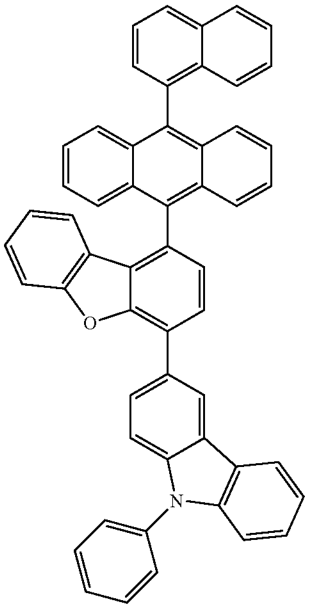
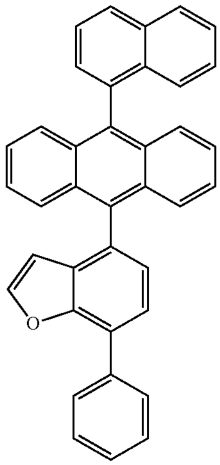
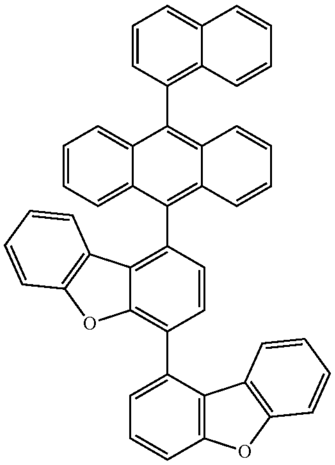
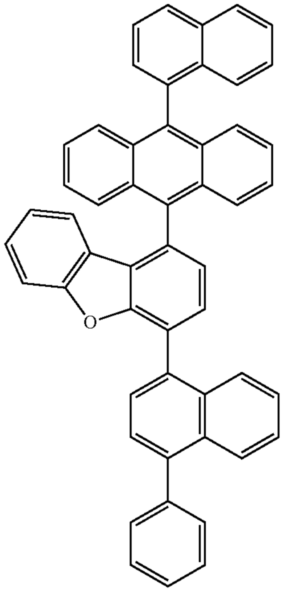
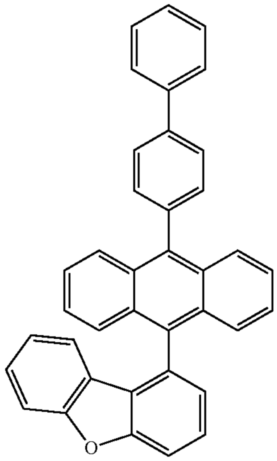

-continued
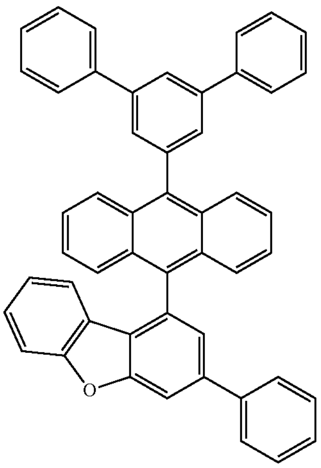
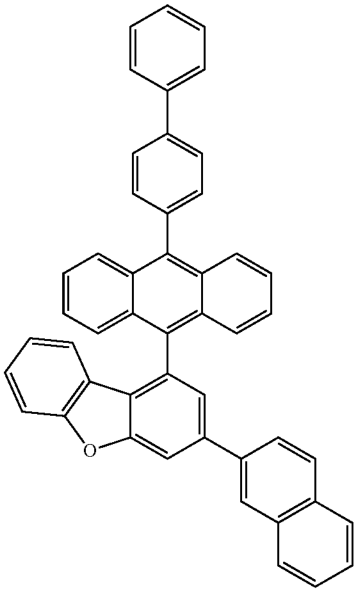
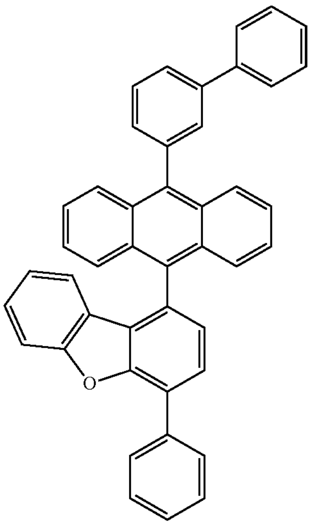
-continued
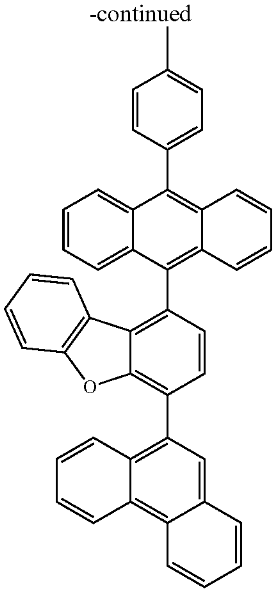
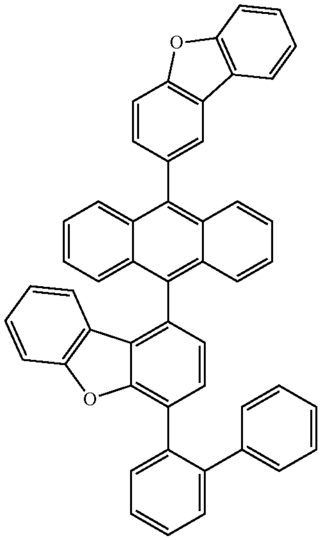
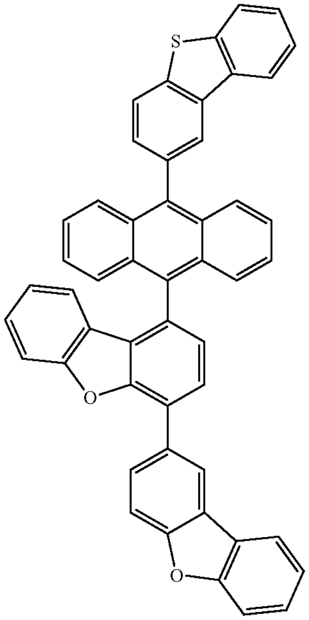

-continued
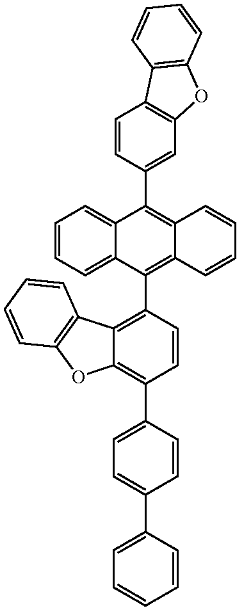
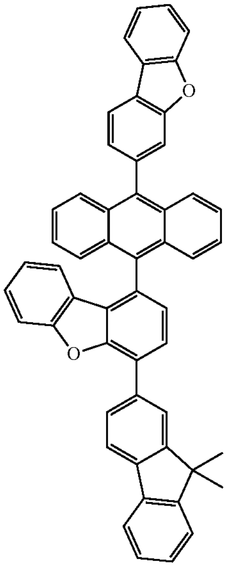
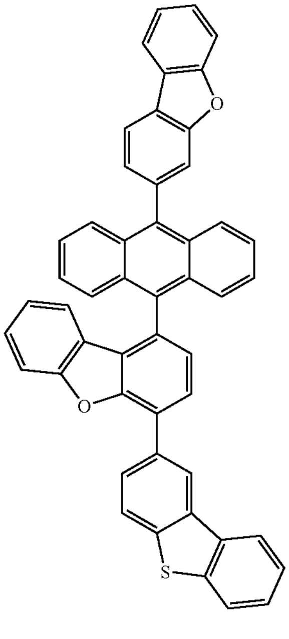
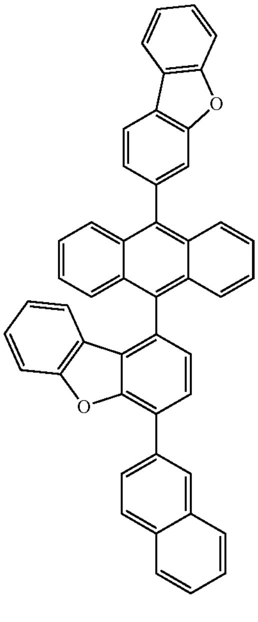
-continued
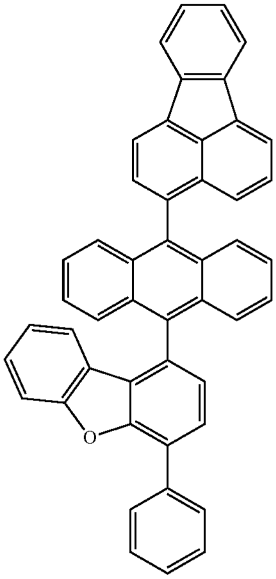
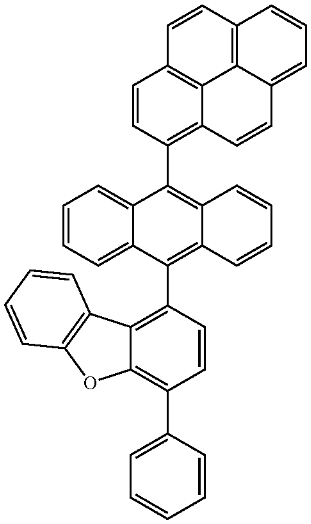
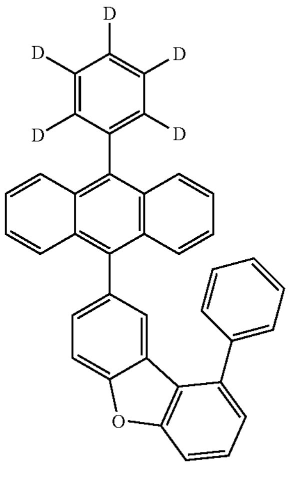

-continued
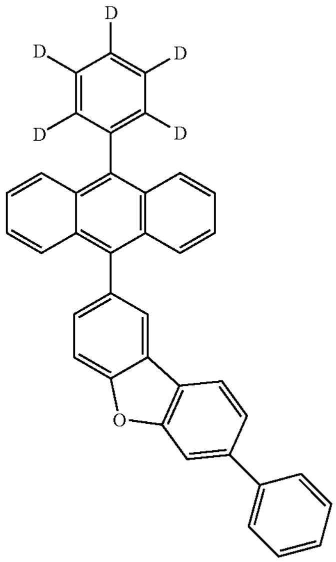
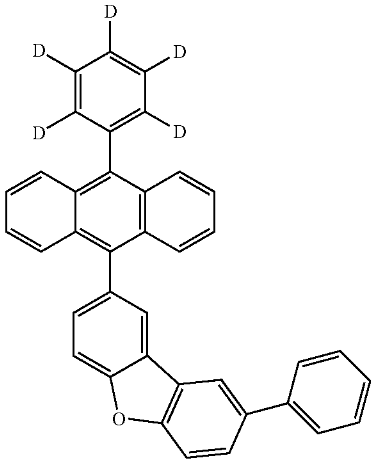
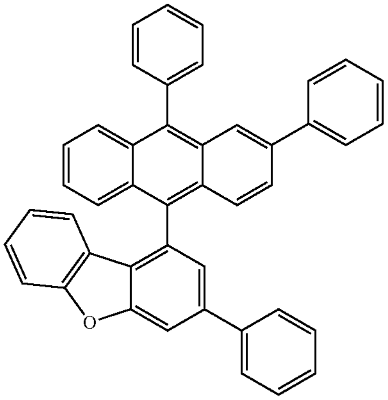
-continued
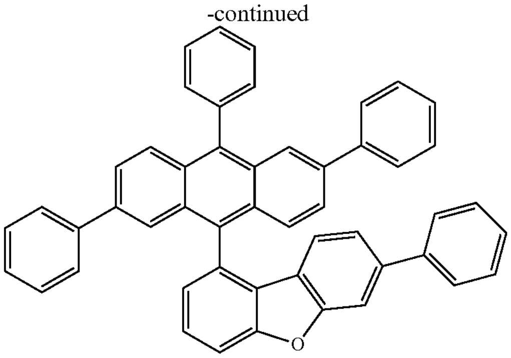
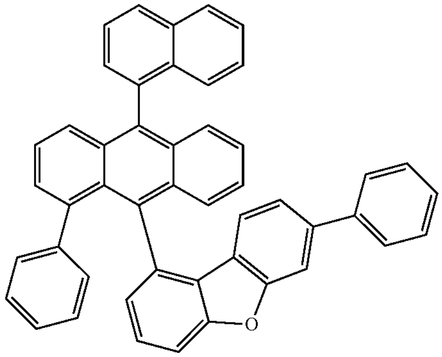
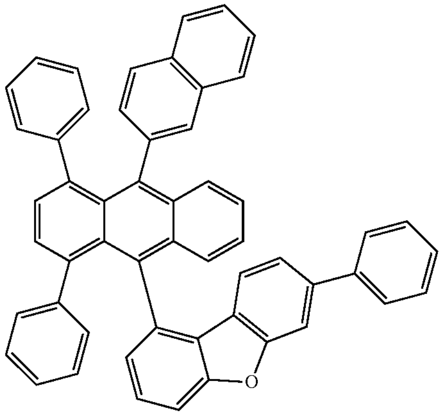 [SMILES: c1ccc(-c2ccc3c(c2)oc2cccc(-c4c5ccccc5c(-c5ccc6ccccc6c5)c5c(-c6ccccc6)ccc(-c6ccccc6)c45)c23)cc1]
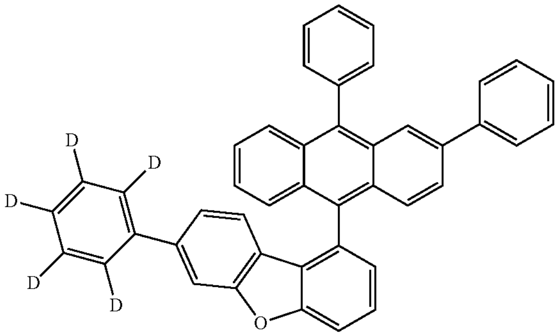

-continued
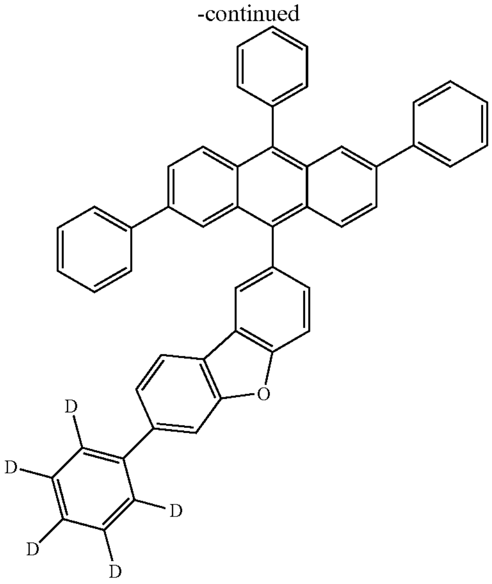
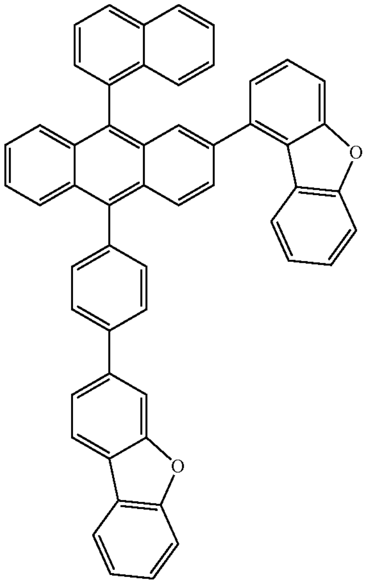
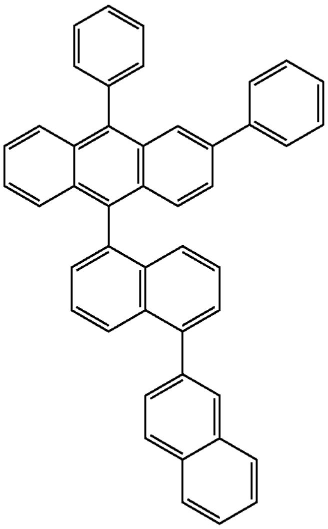
-continued
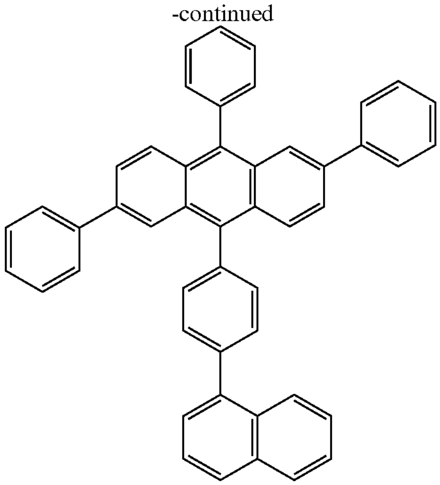
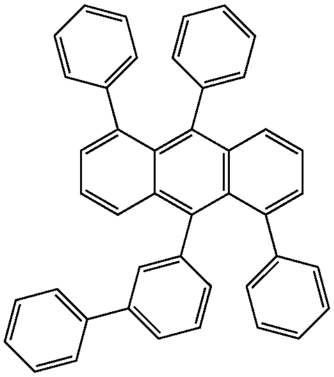
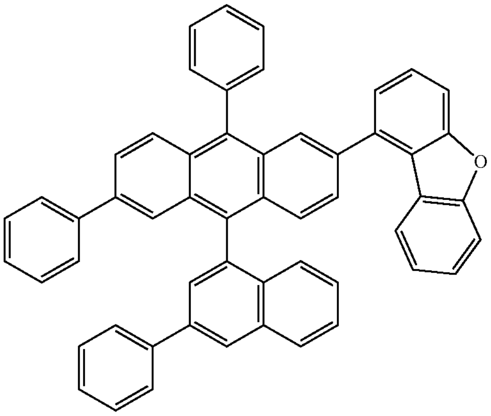
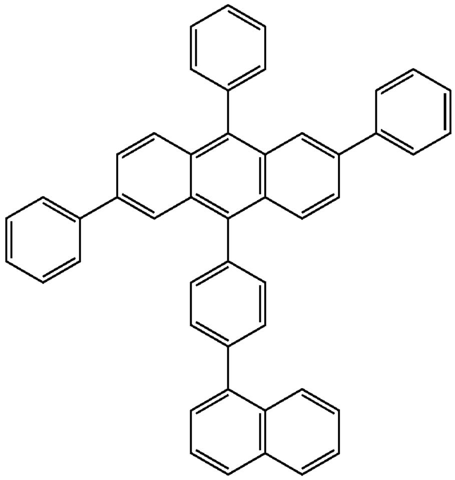

-continued
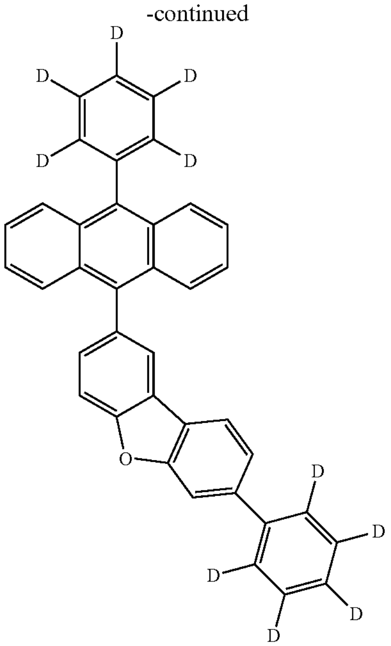
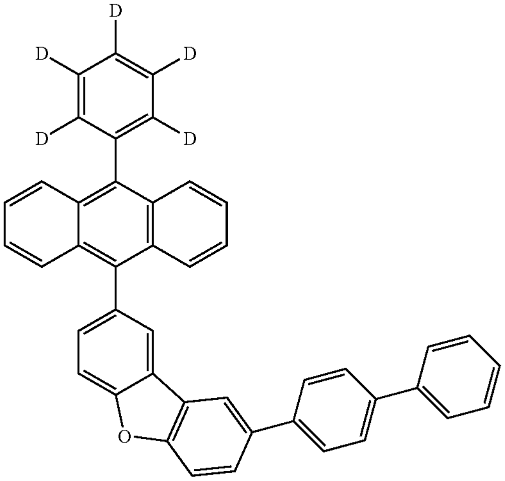
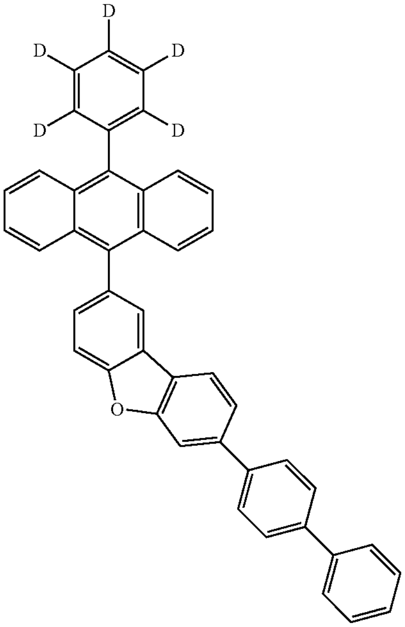
-continued
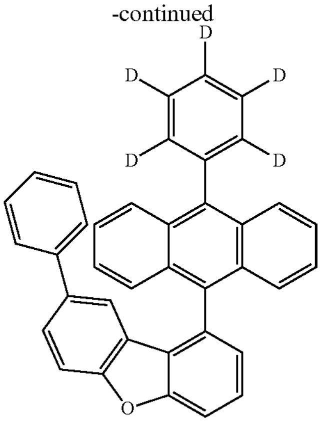
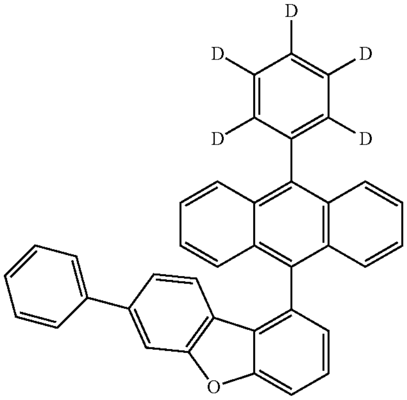
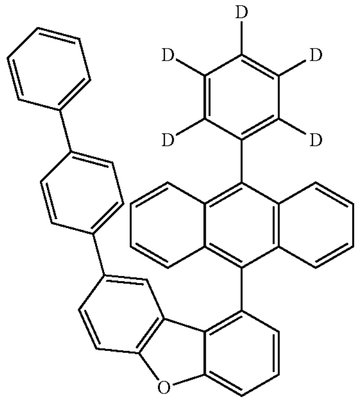
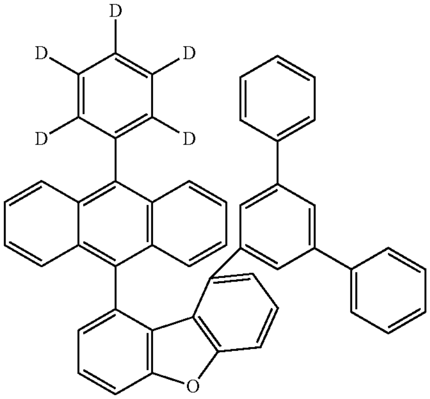

-continued
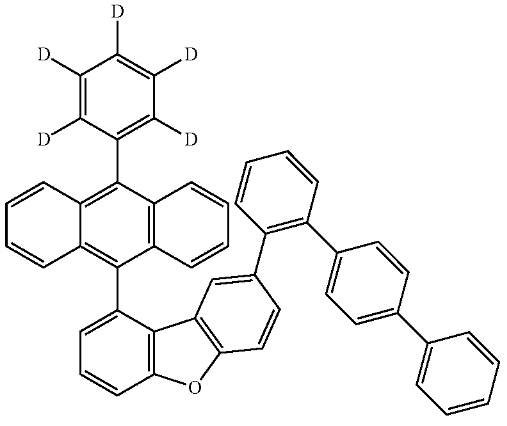
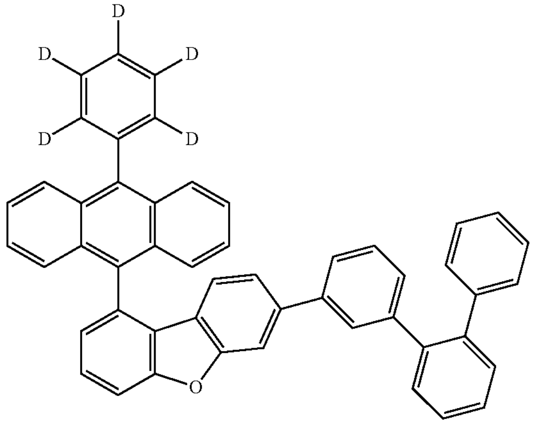
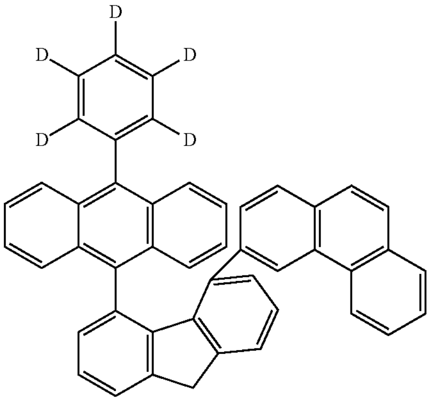
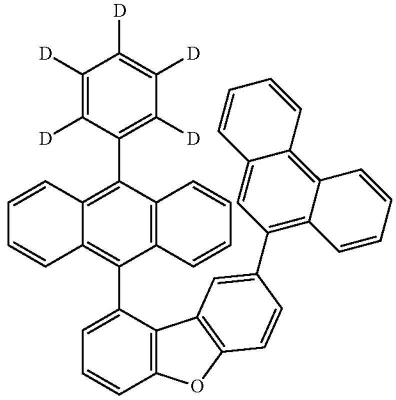
-continued
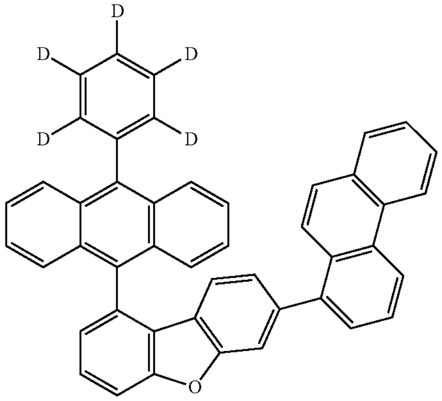
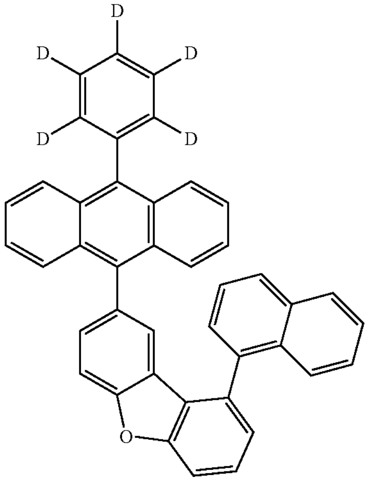
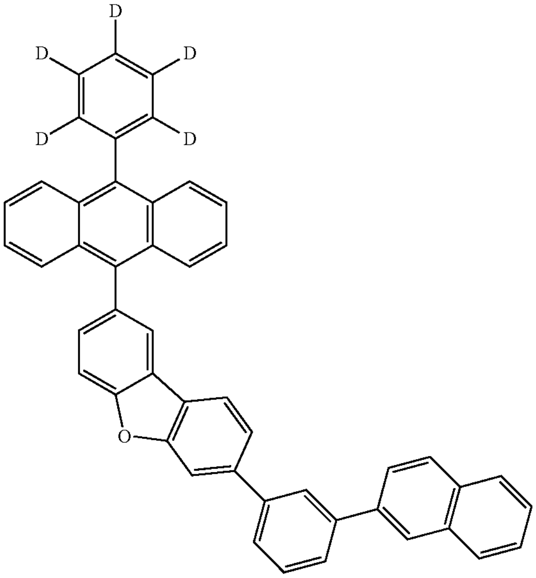

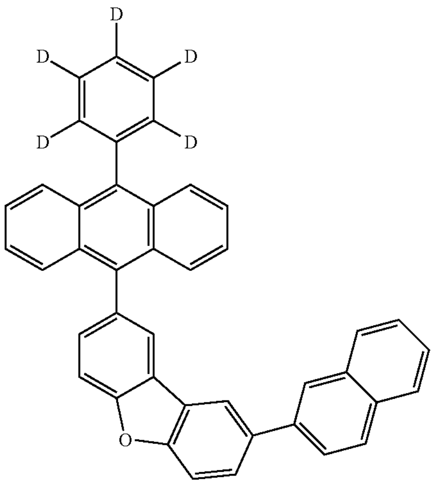
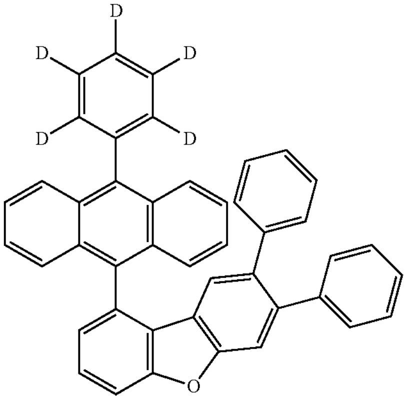
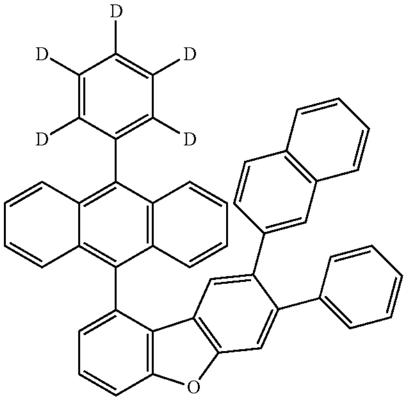
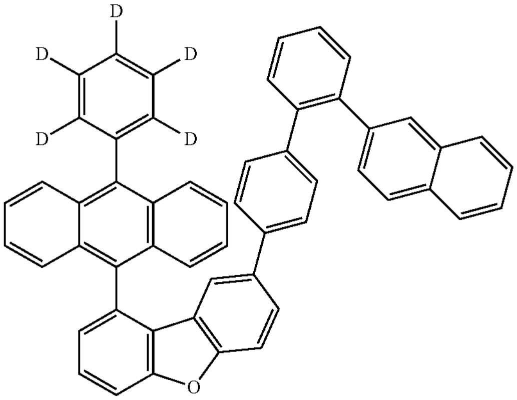
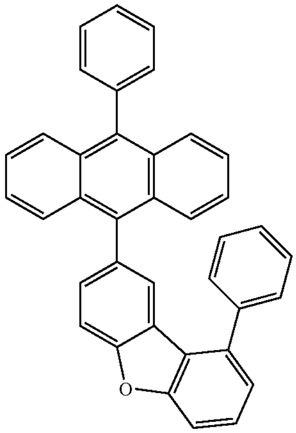
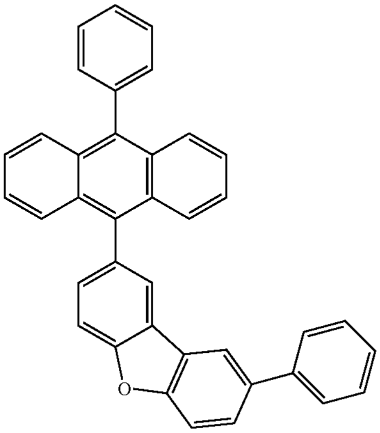
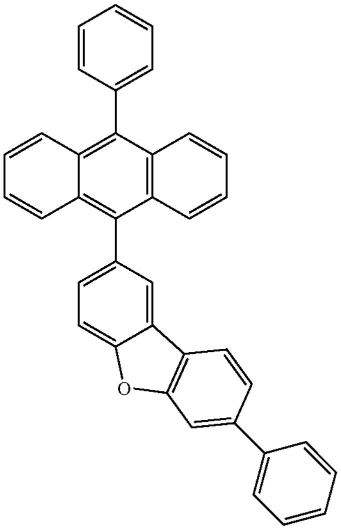

-continued
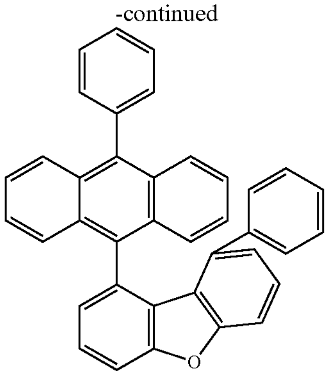
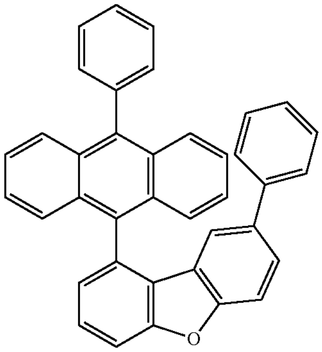
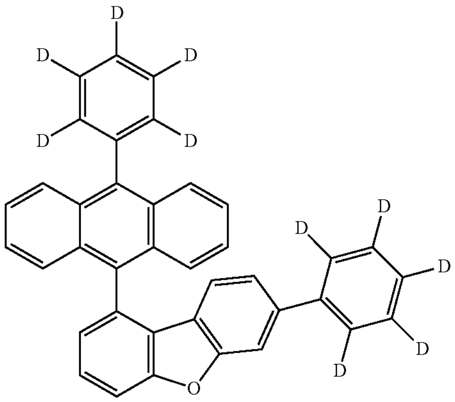
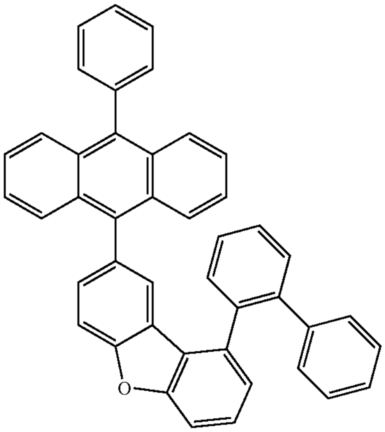
-continued
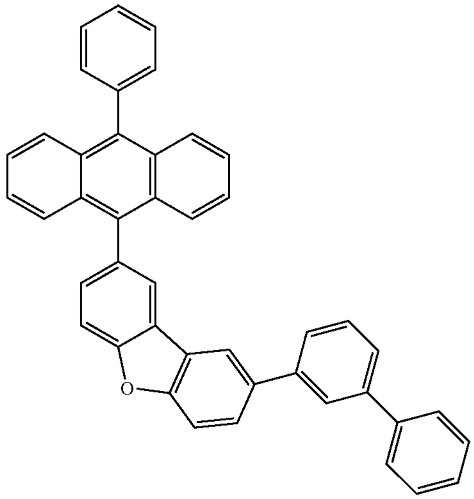
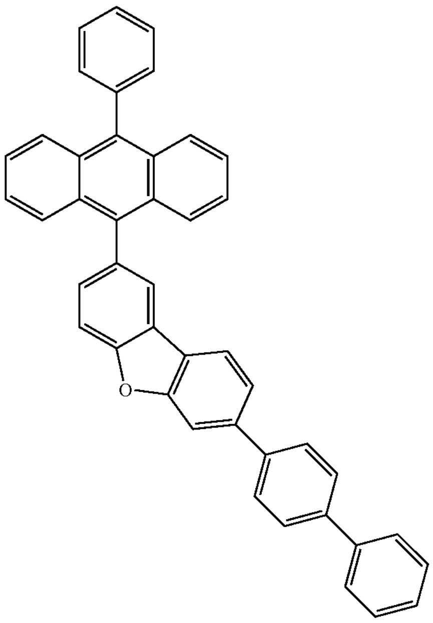
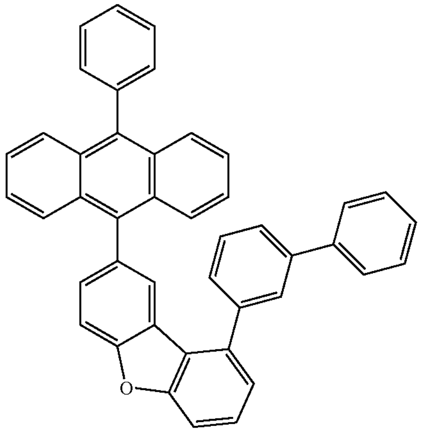

-continued
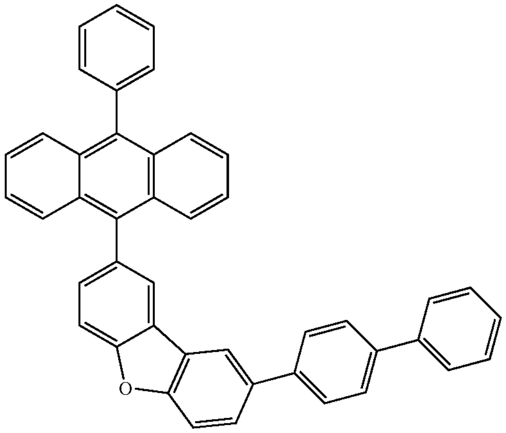
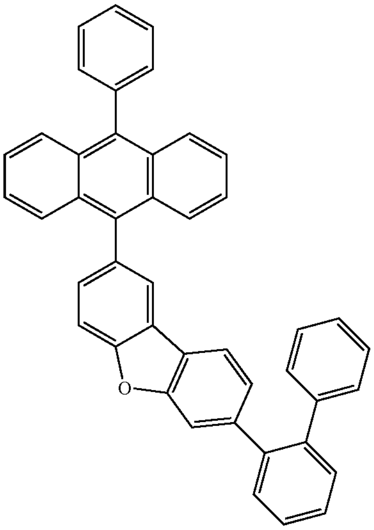
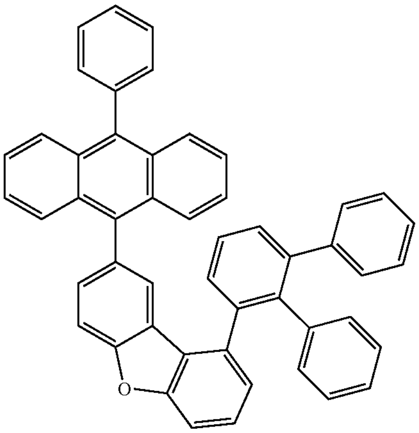
-continued
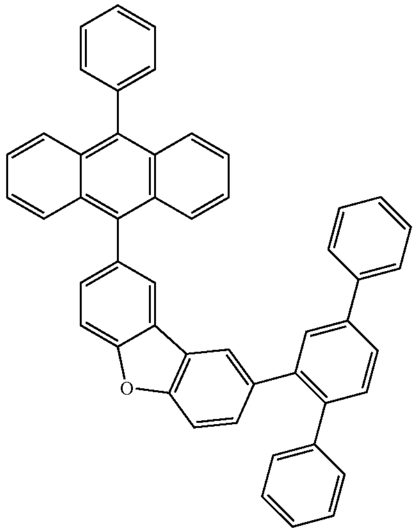
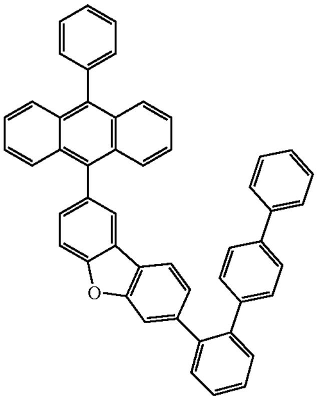
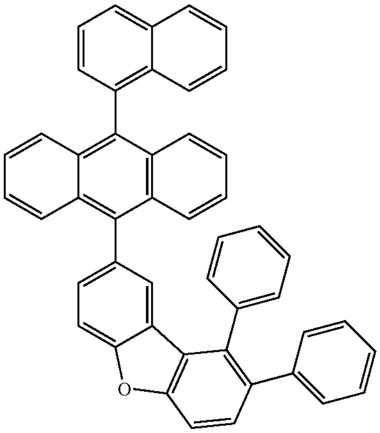

-continued
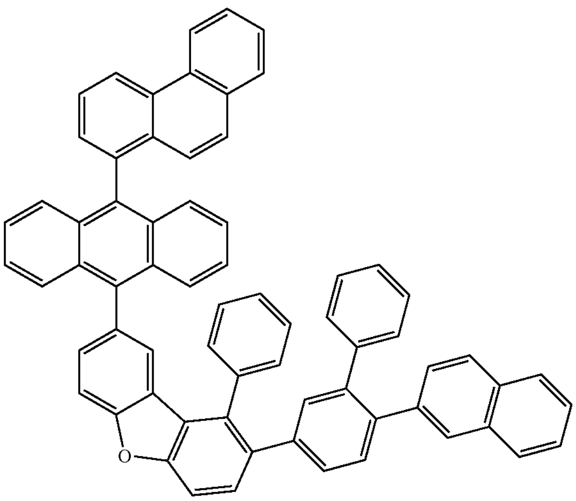
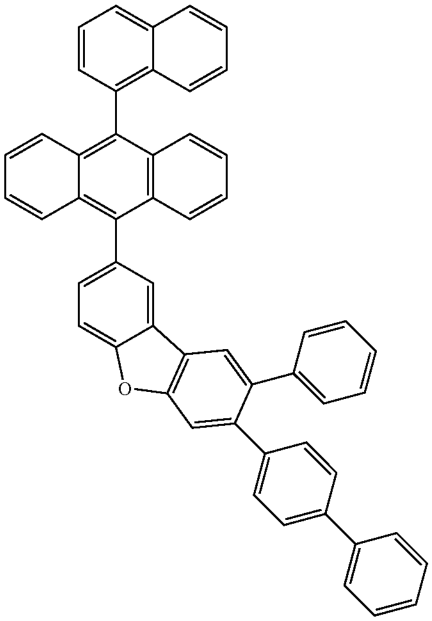
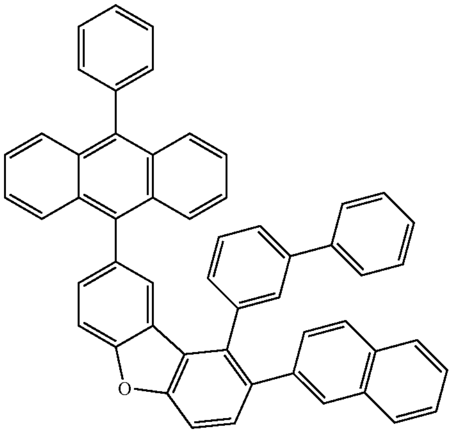
-continued
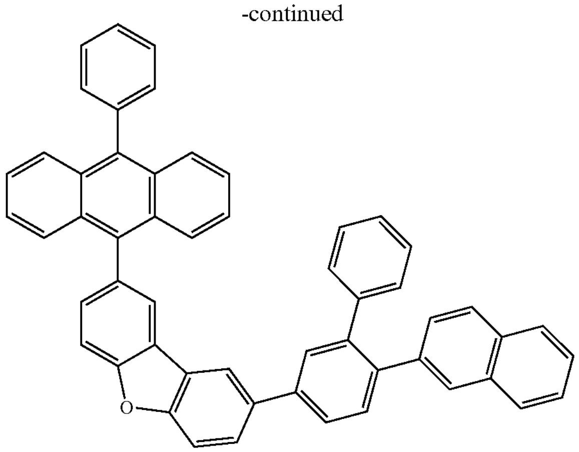
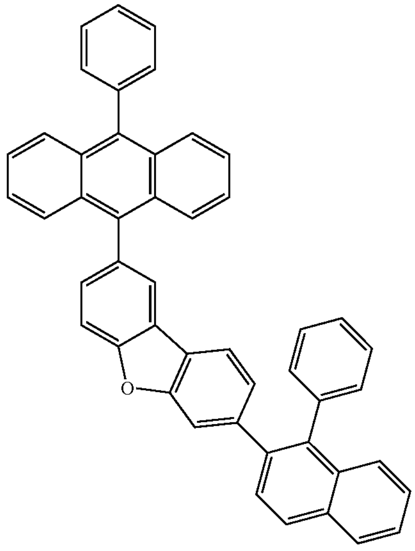
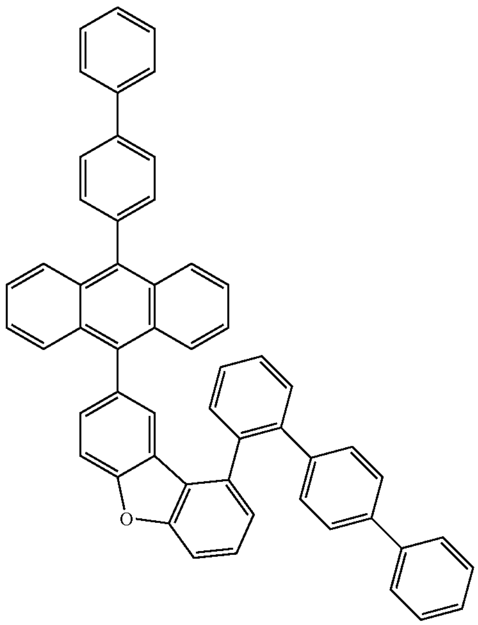

-continued
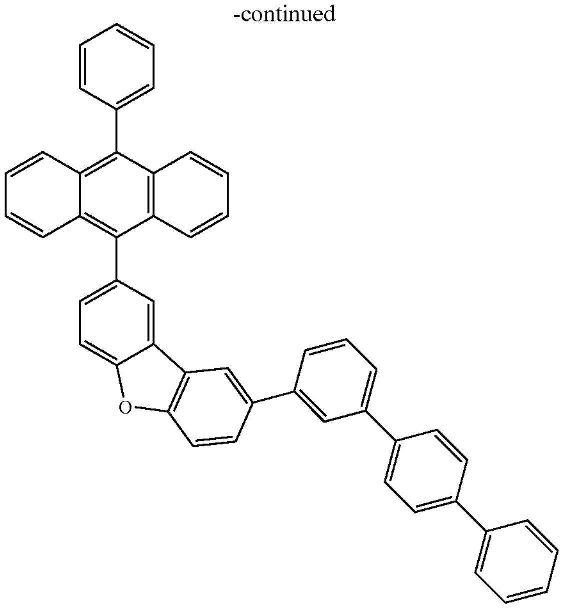
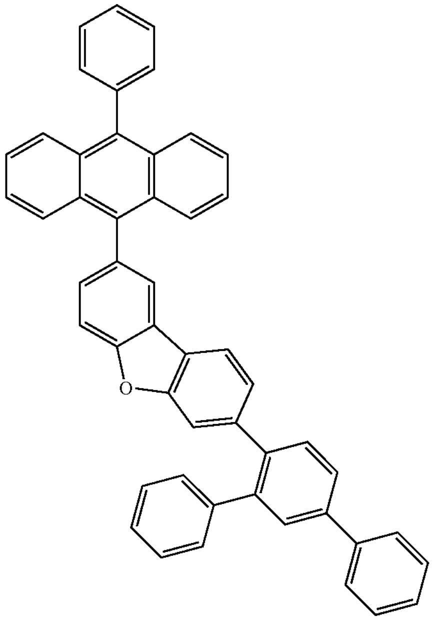
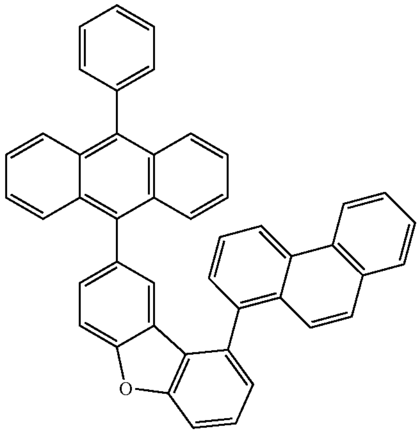
-continued
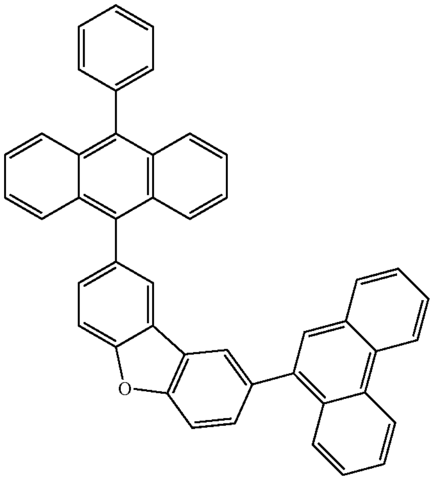
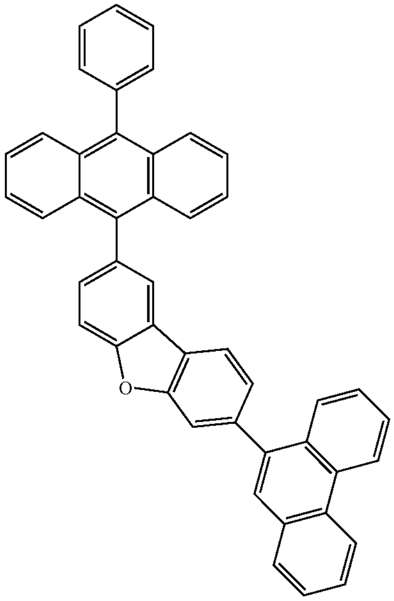
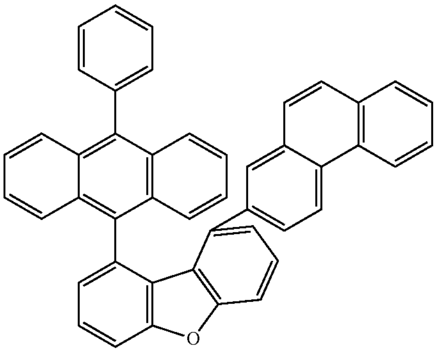

-continued
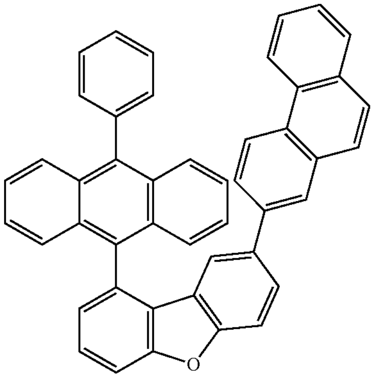
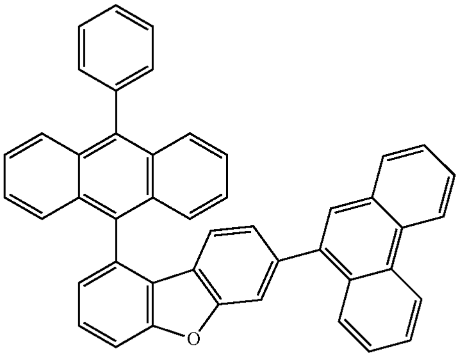
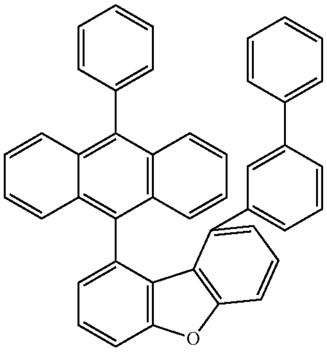
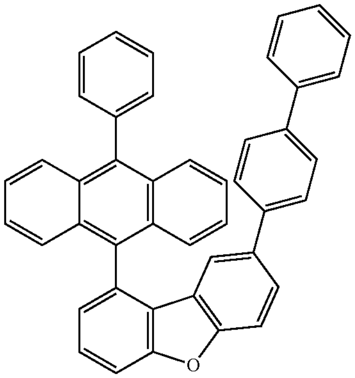
-continued
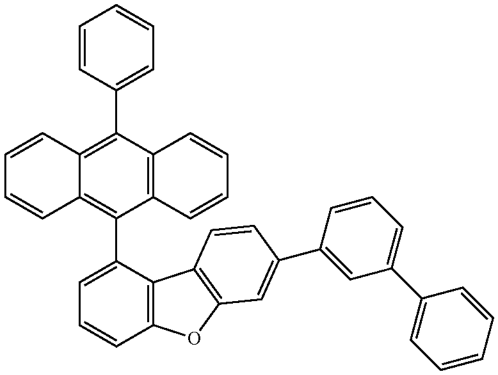
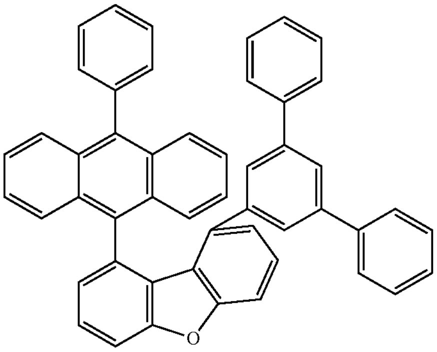
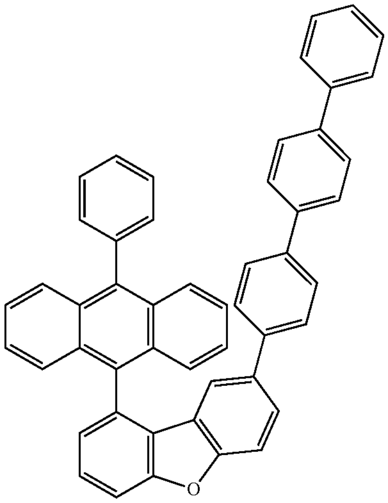
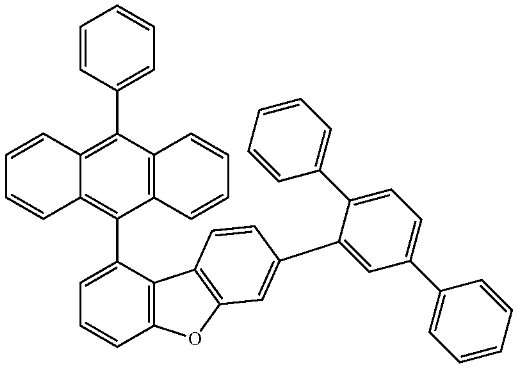

-continued
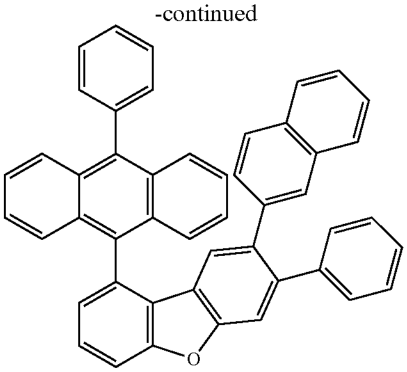
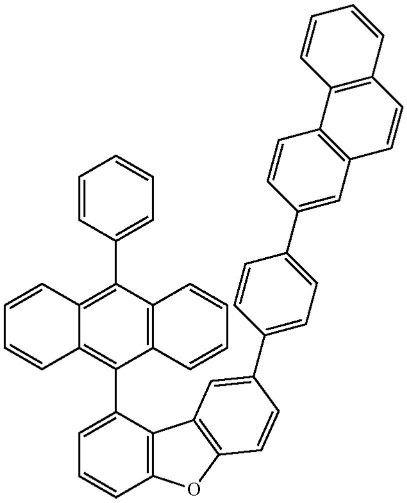
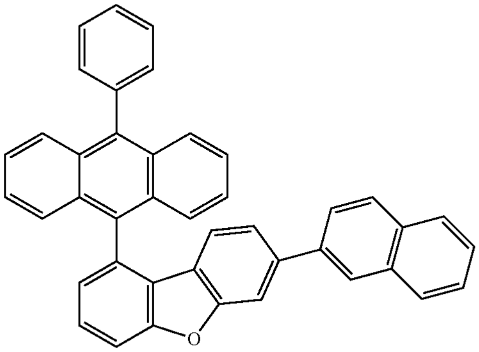
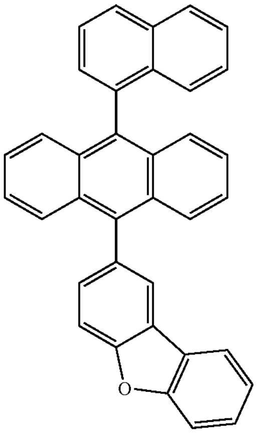
-continued
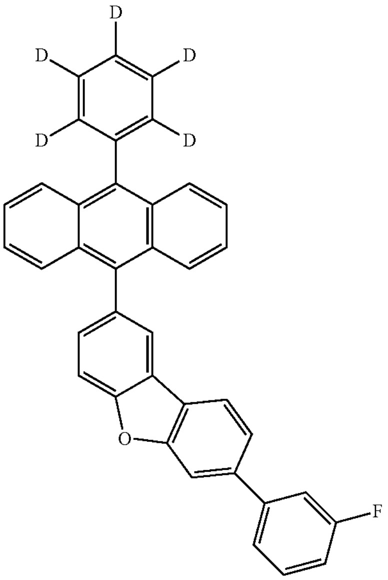
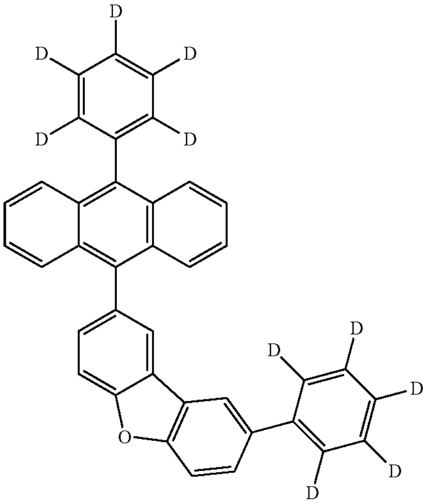 [SMILES: [2H]c1c([2H])c([2H])c(-c2ccc3oc4ccc(-c5c6ccccc6c(-c6c([2H])c([2H])c([2H])c([2H])c6[2H])c6ccccc56)cc4c3c2)c([2H])c1[2H]]
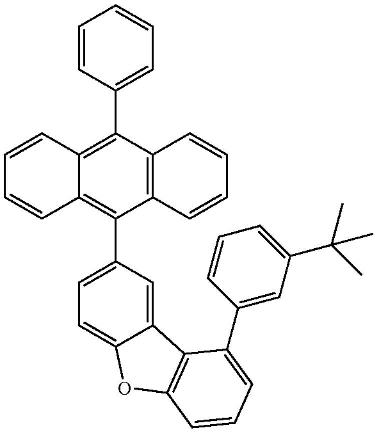

-continued
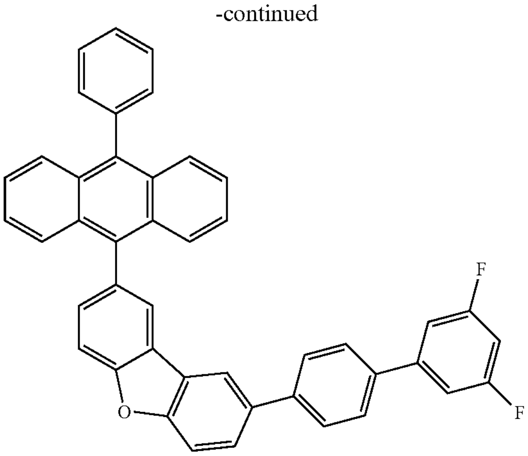
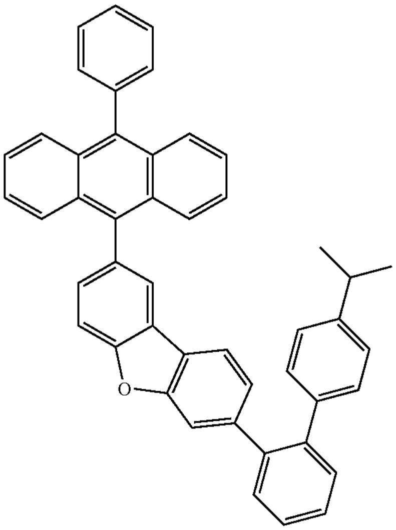
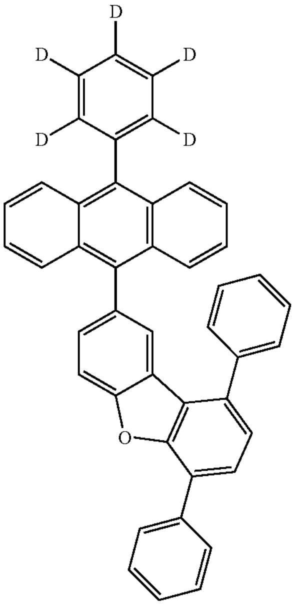
-continued
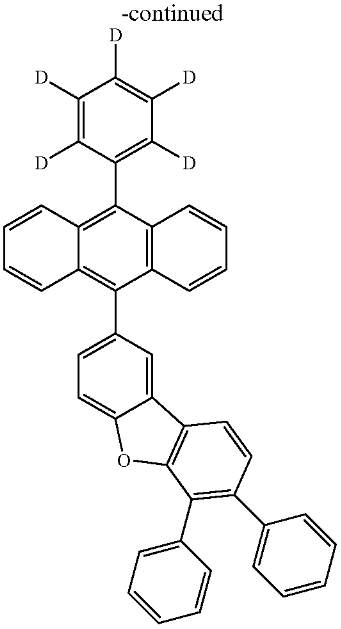
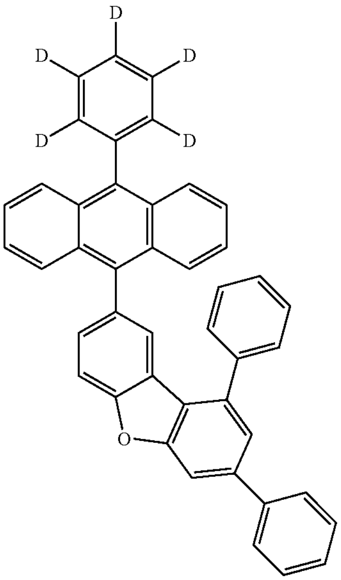

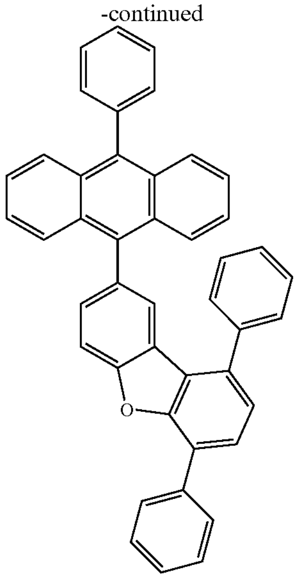
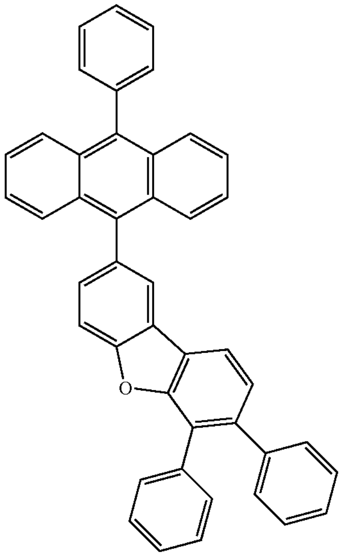
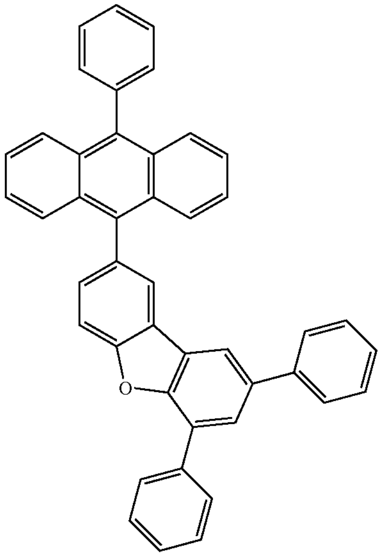
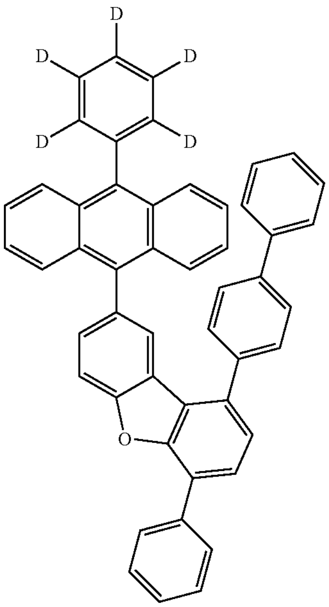
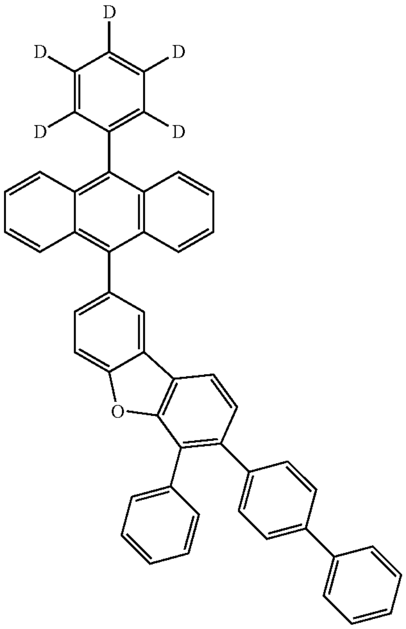

-continued
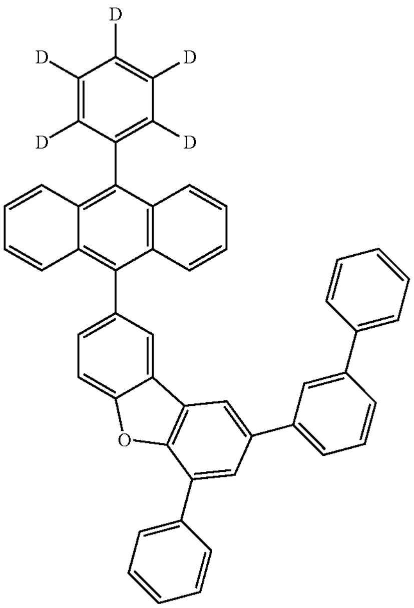
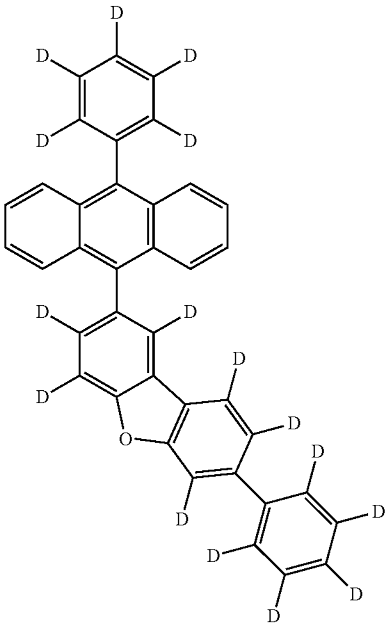
-continued
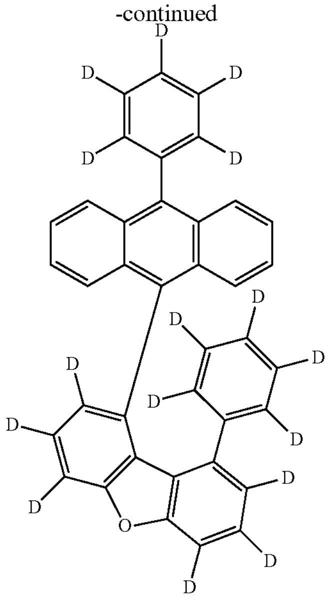
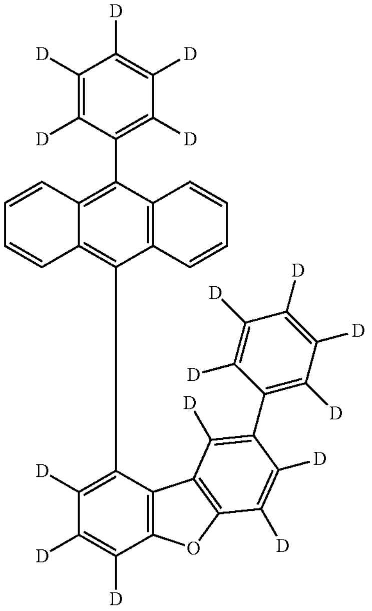
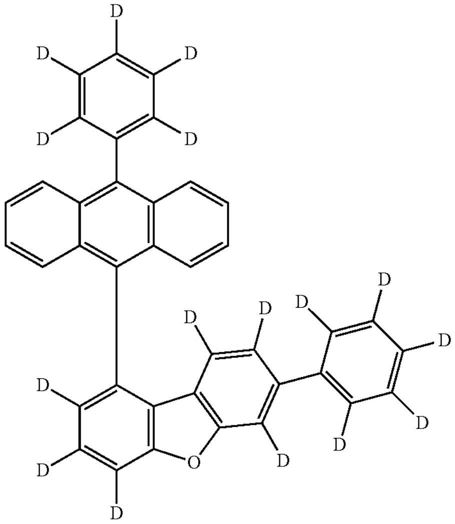

-continued
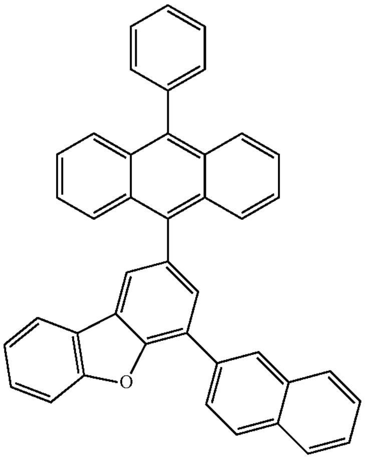
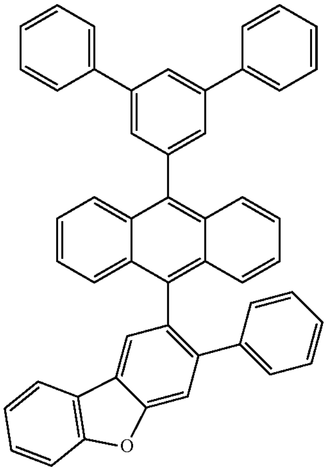
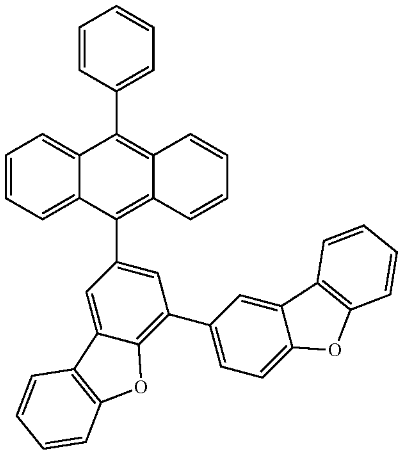
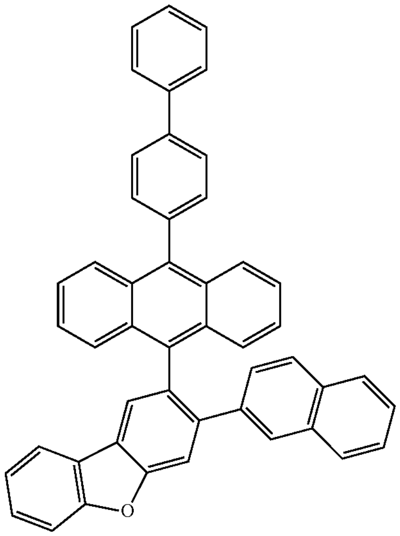
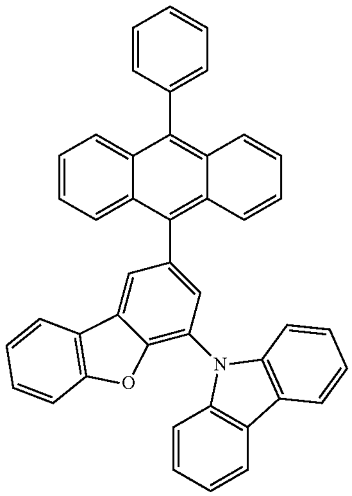
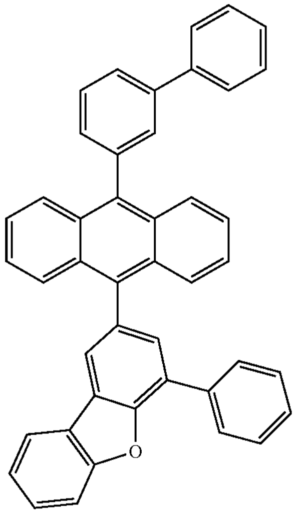
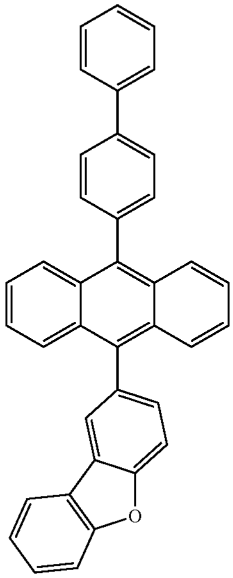

-continued
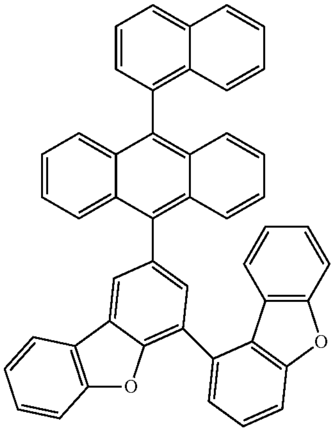
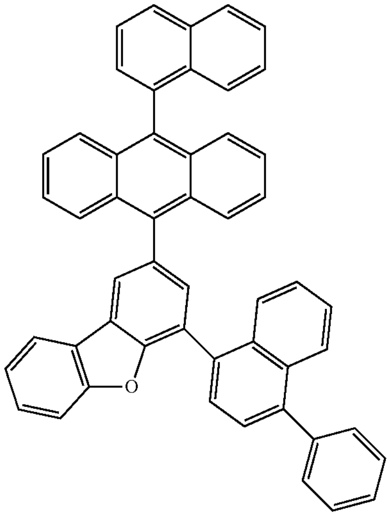
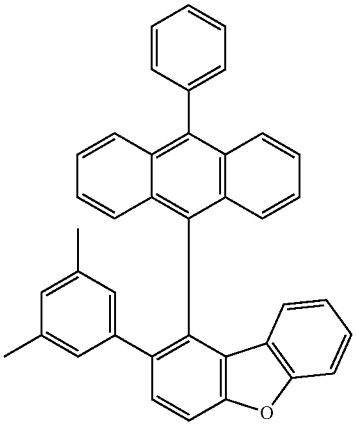
-continued
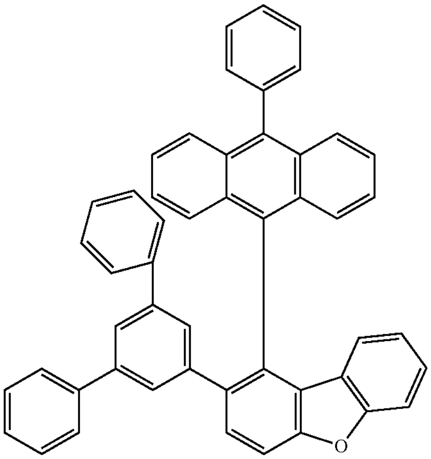
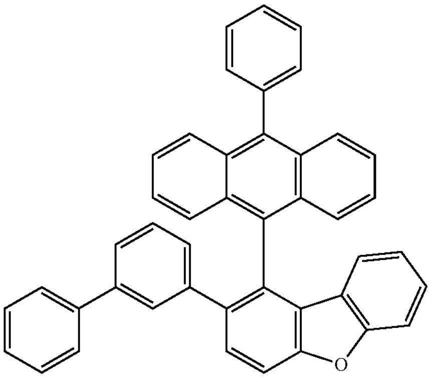
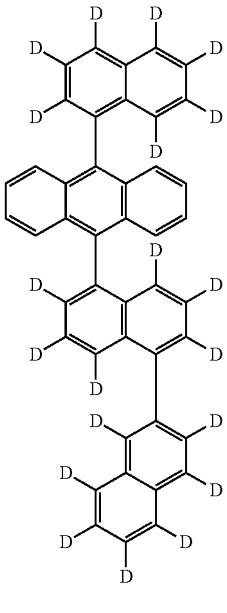
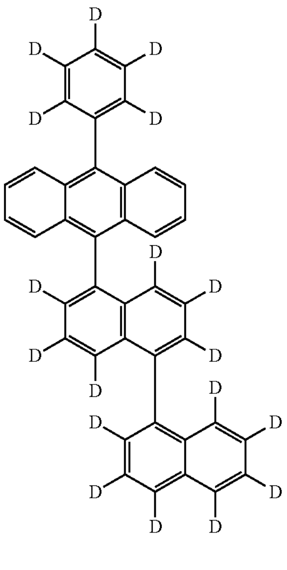

-continued
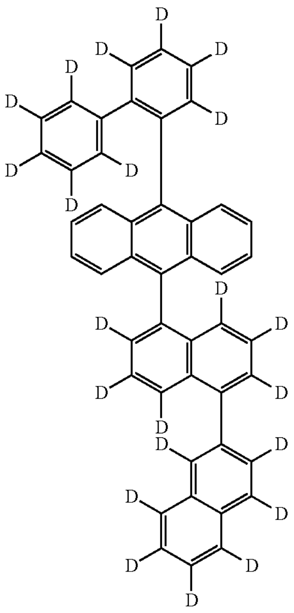
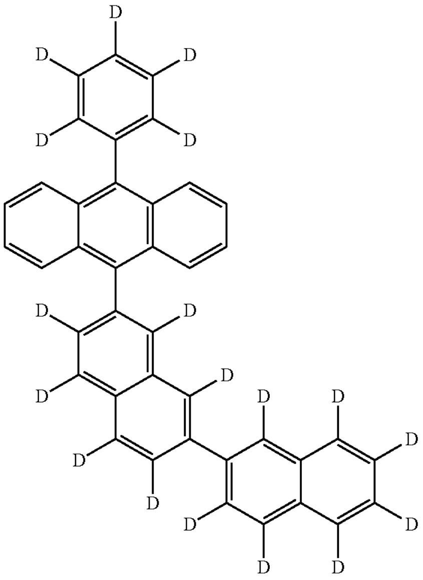
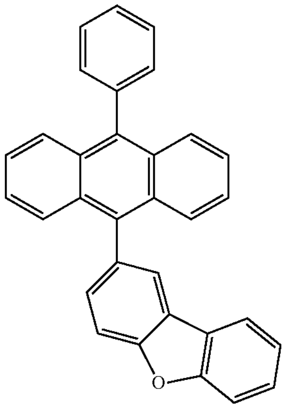
-continued
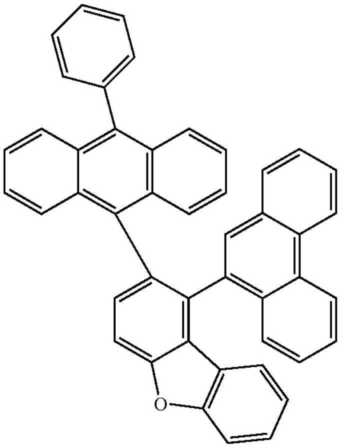
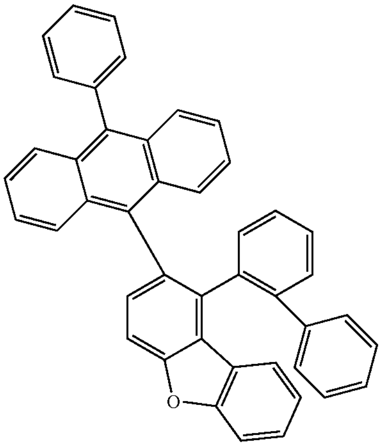
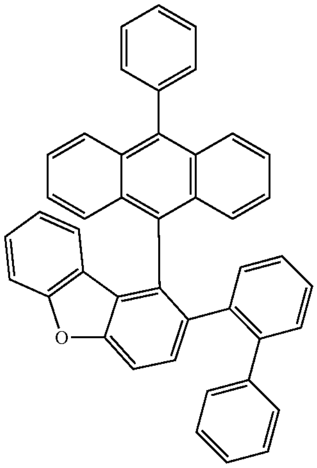

-continued
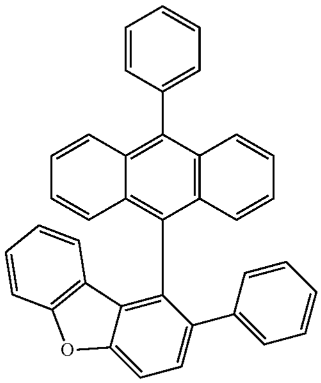
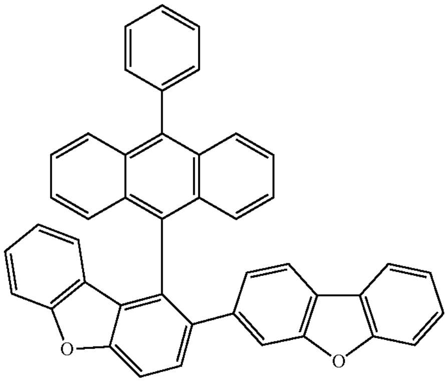
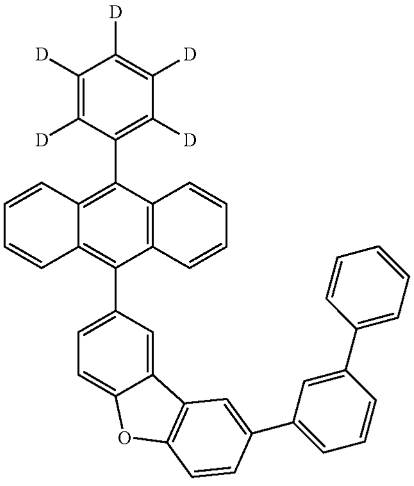
-continued
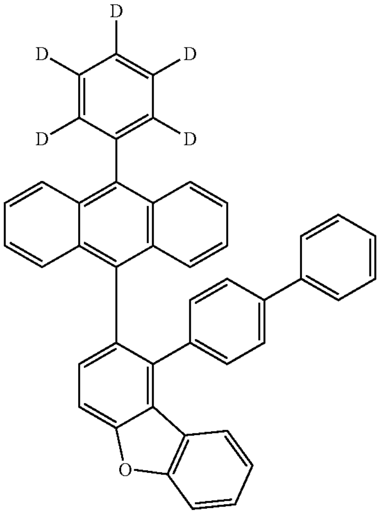
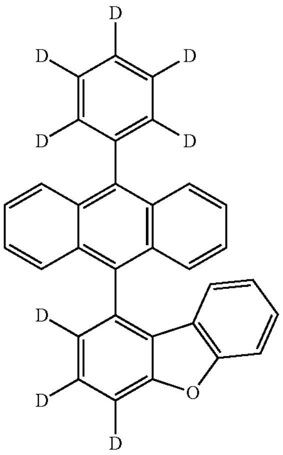
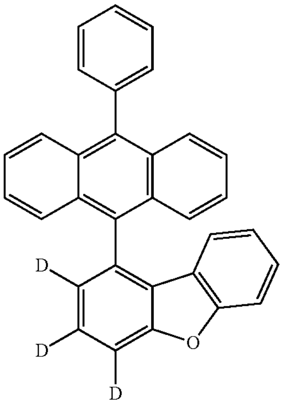
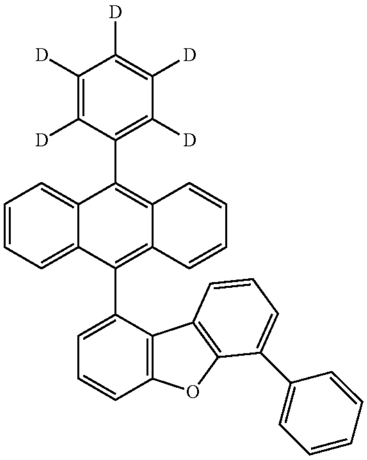

-continued
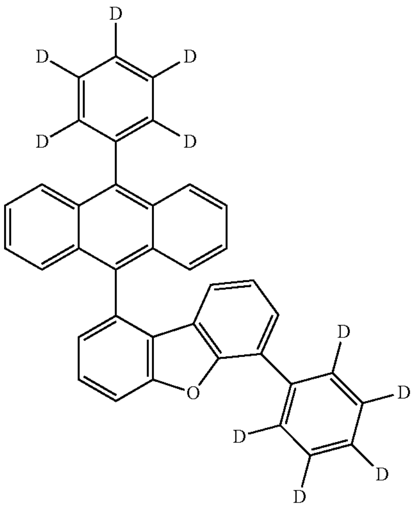
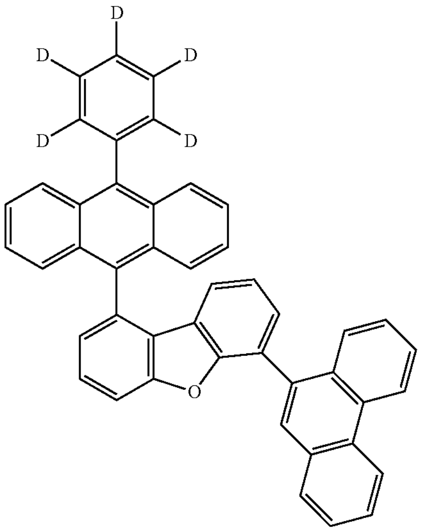
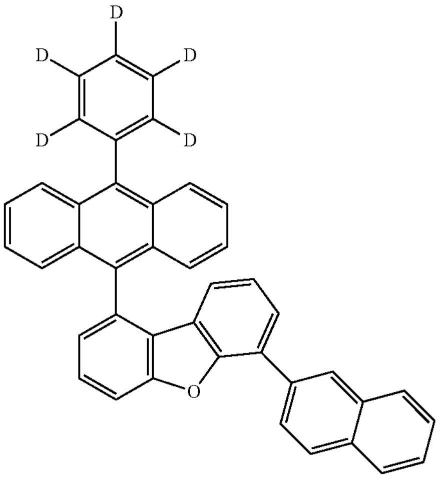
-continued
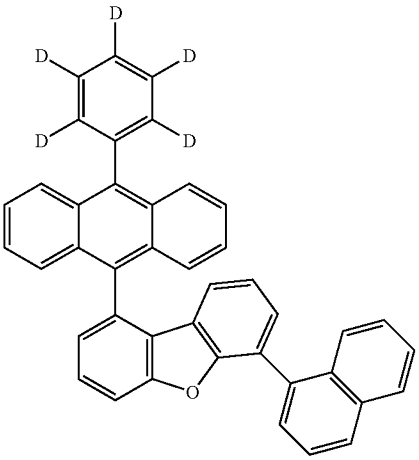
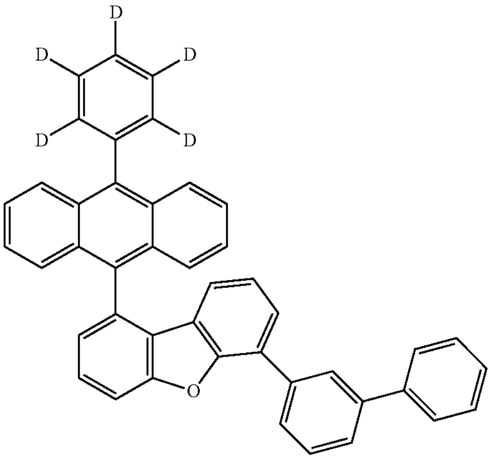
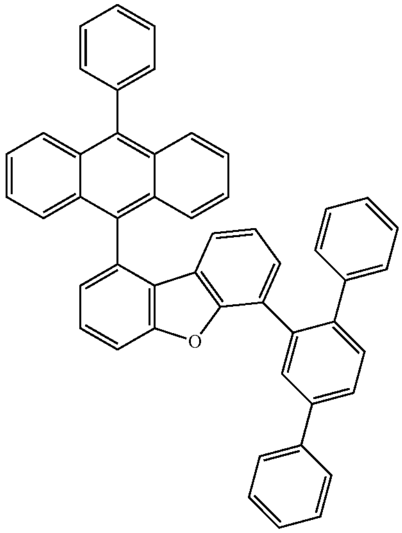

-continued
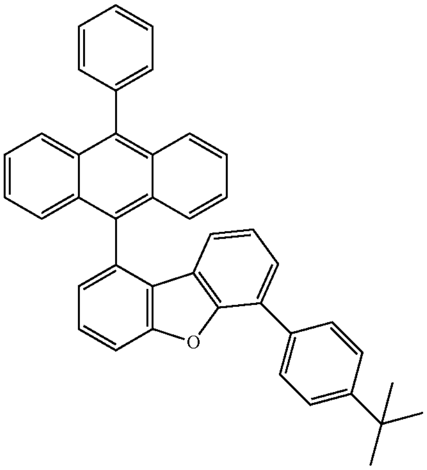
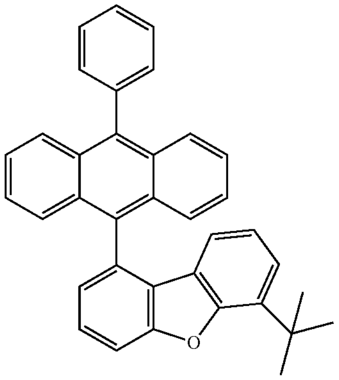
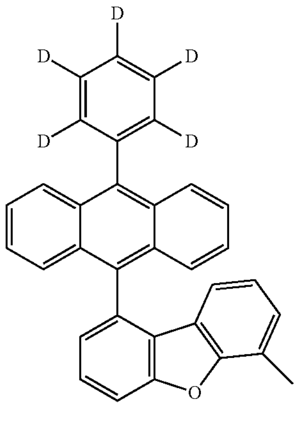
-continued
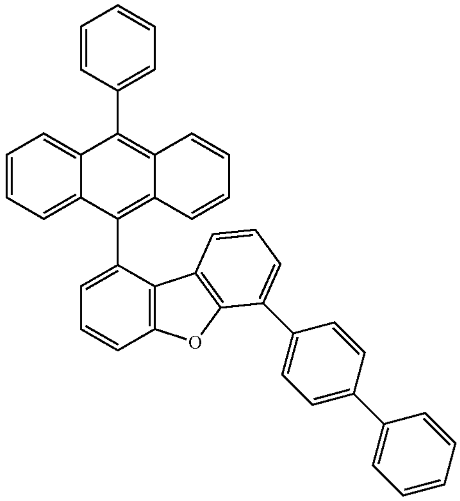
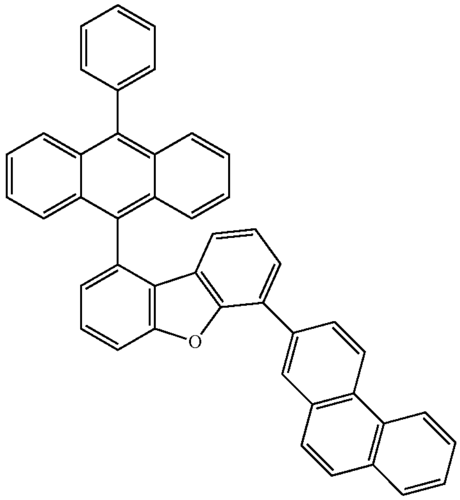
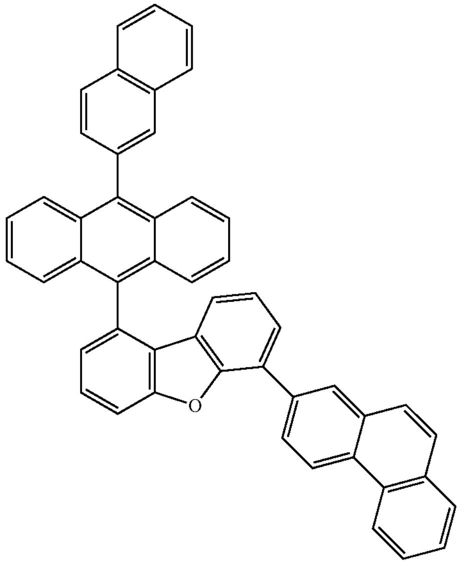

-continued
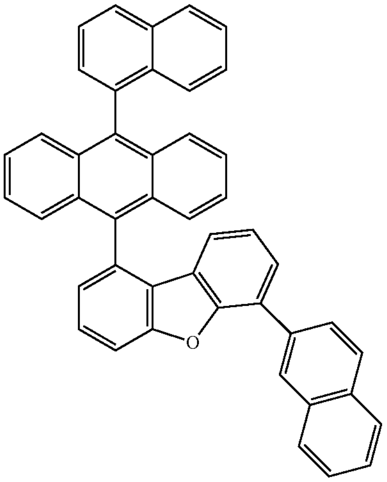
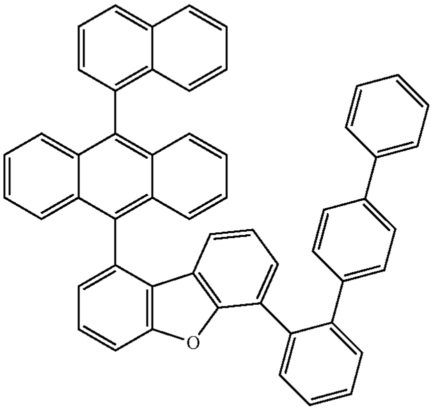
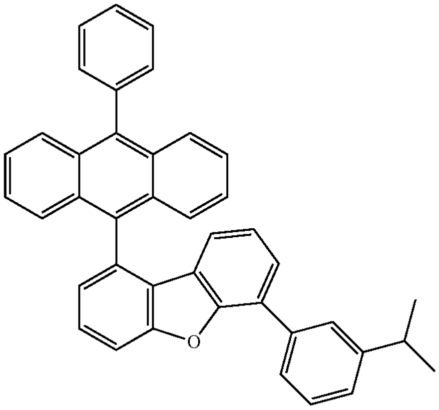
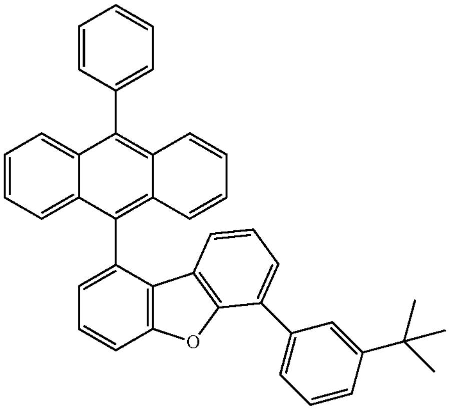
-continued
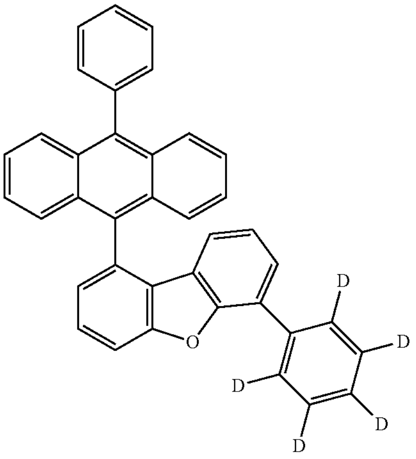
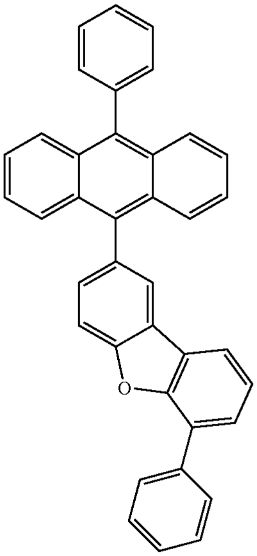
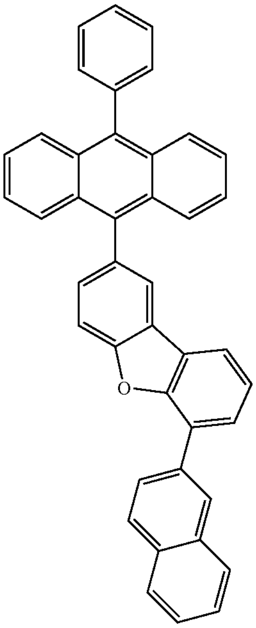

-continued
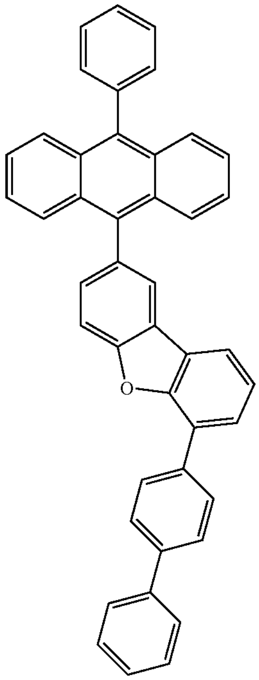
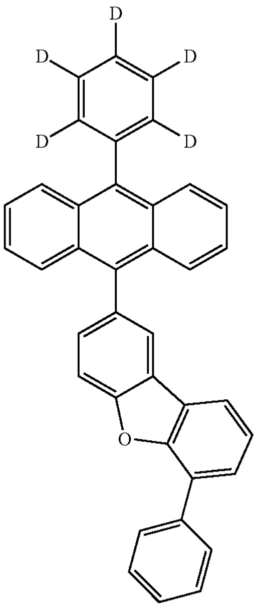
-continued
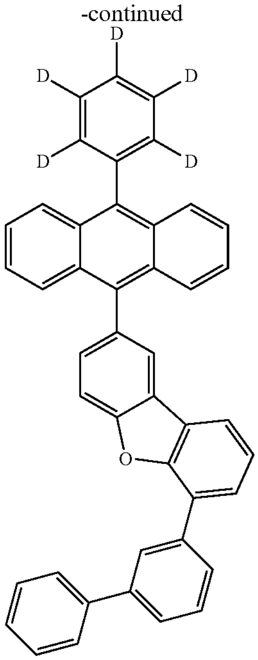
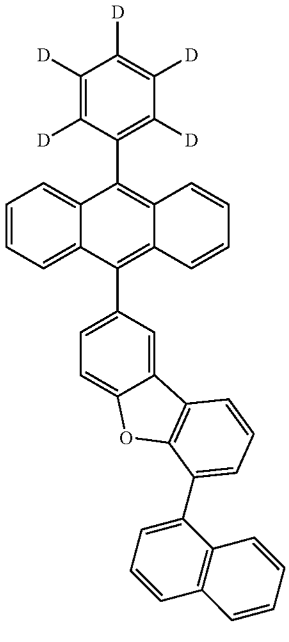
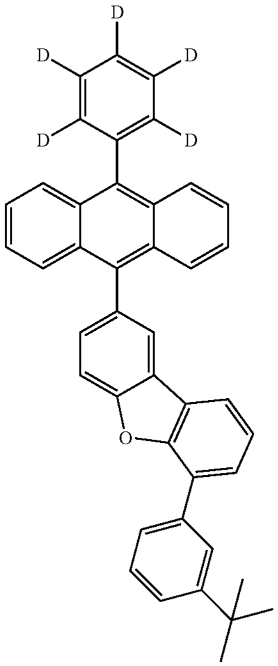
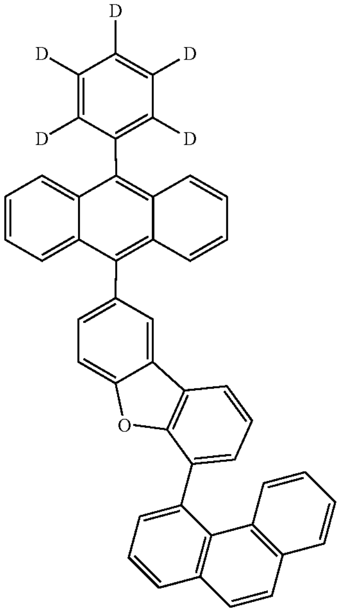

-continued
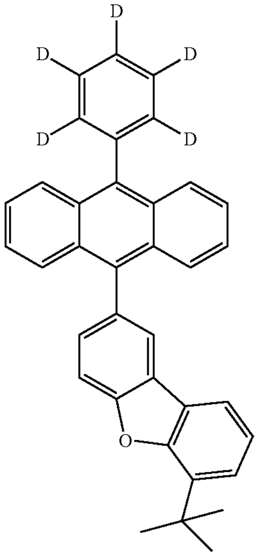
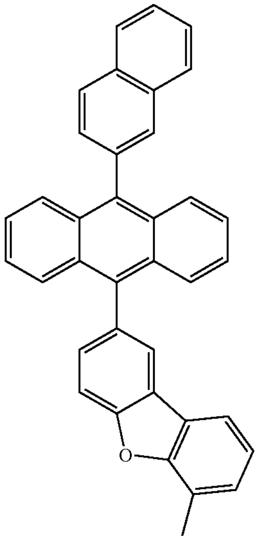
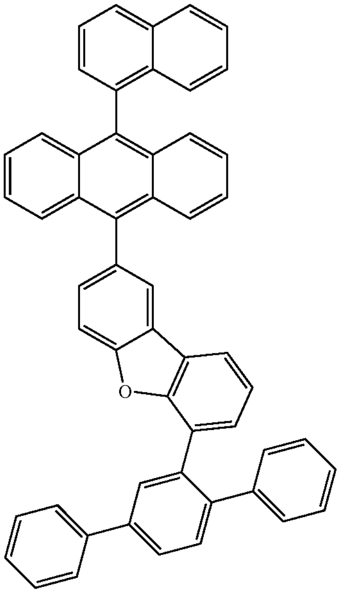
-continued
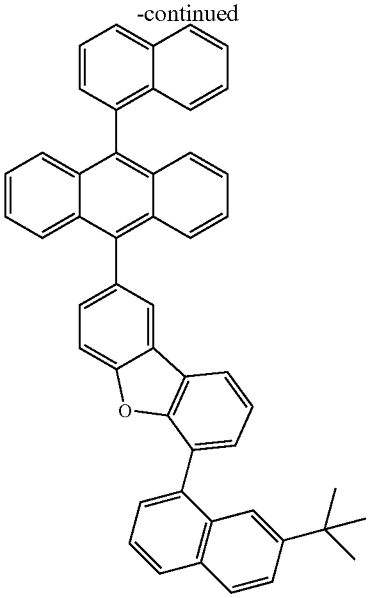
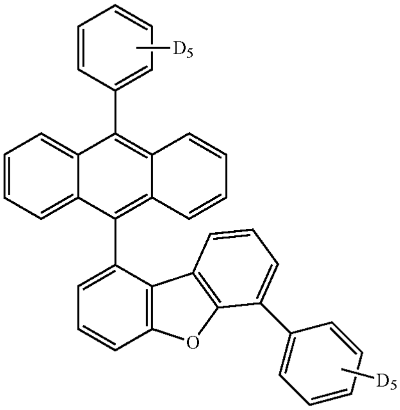
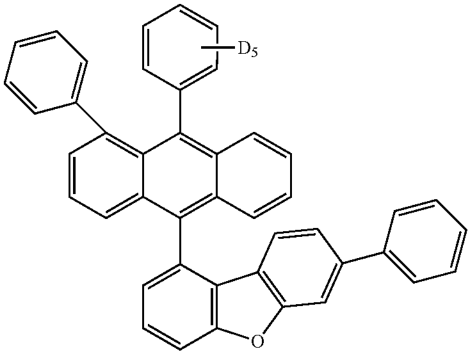

-continued
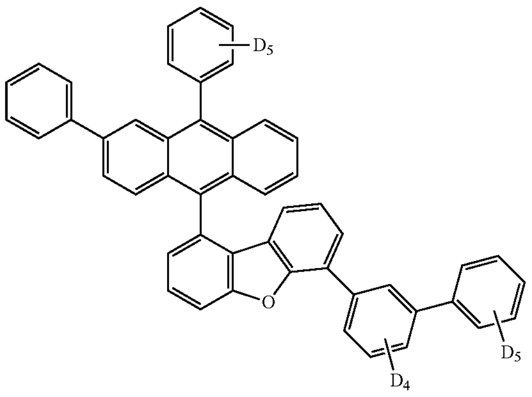
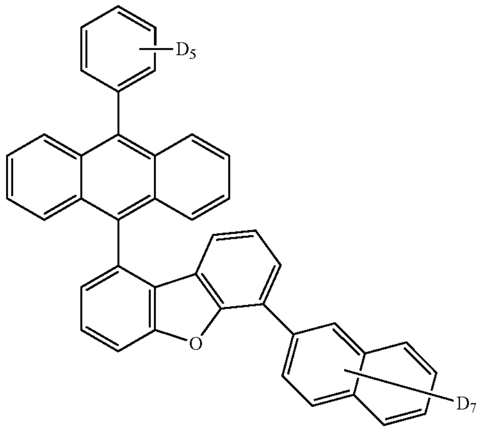
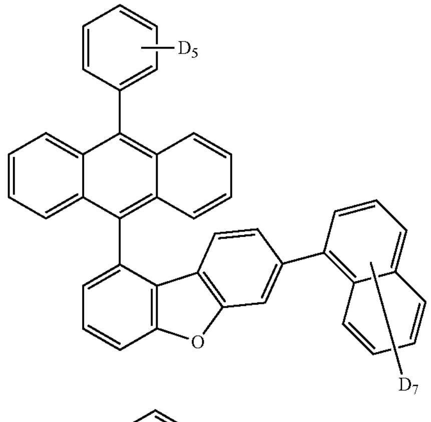
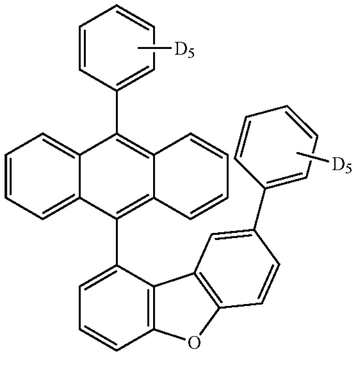
-continued
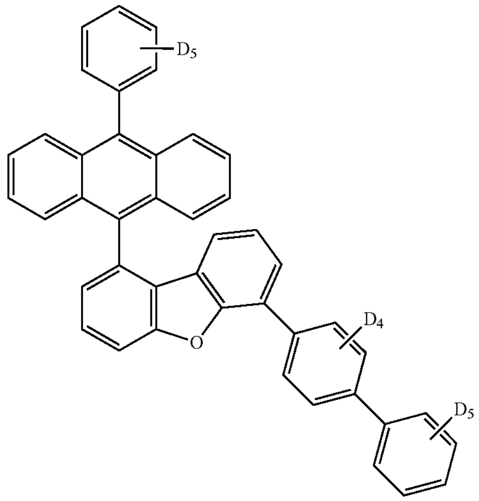
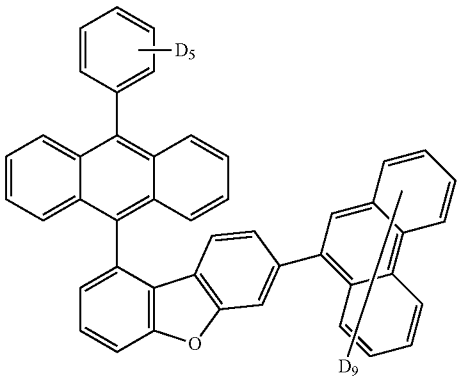
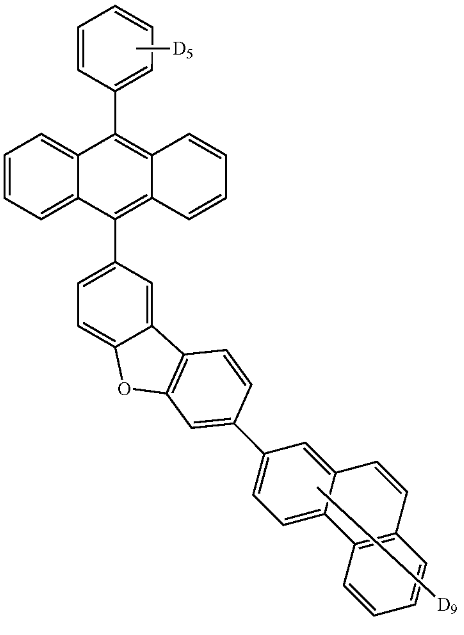

-continued
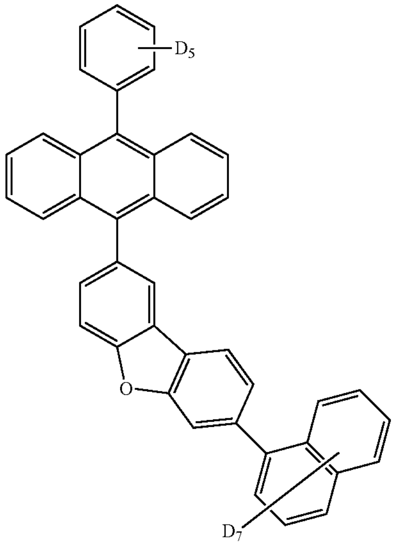
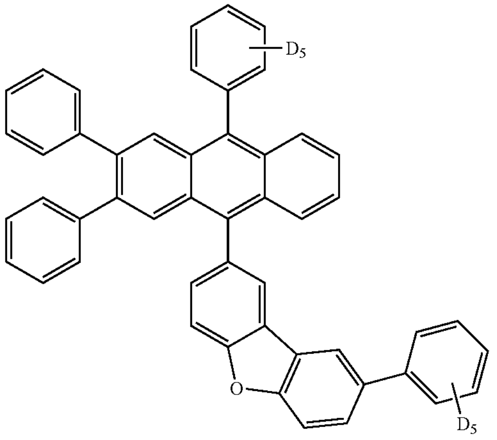
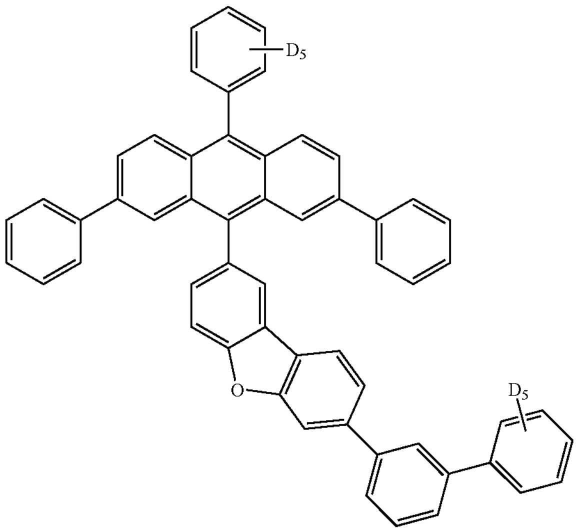
-continued
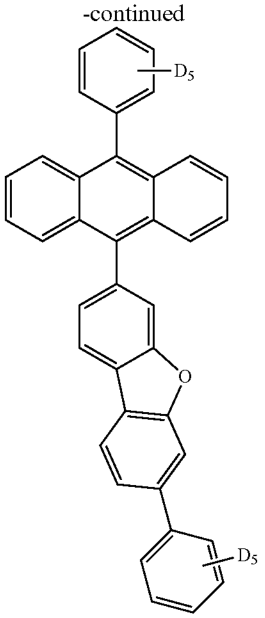
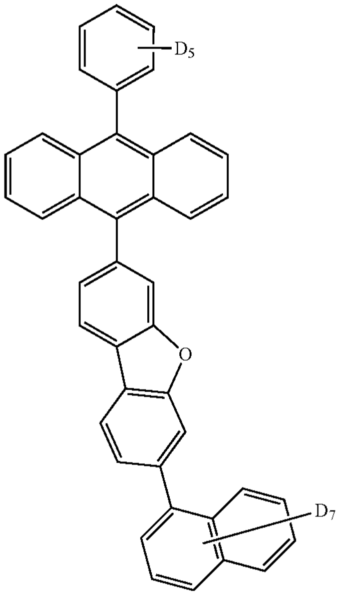

-continued
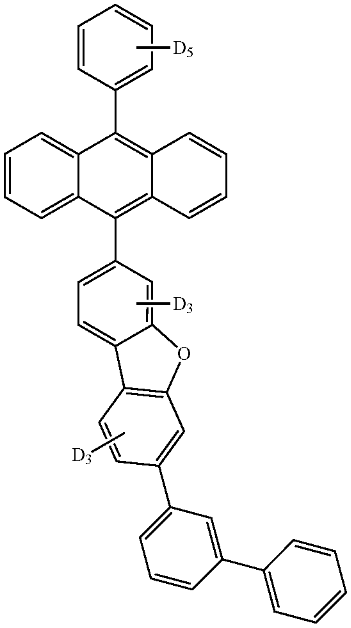
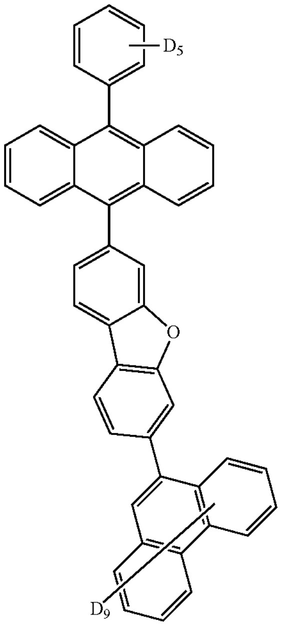
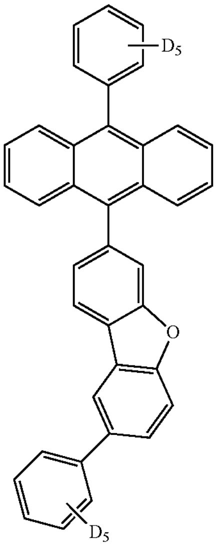
-continued
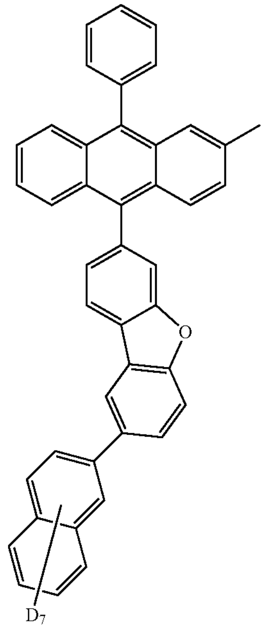
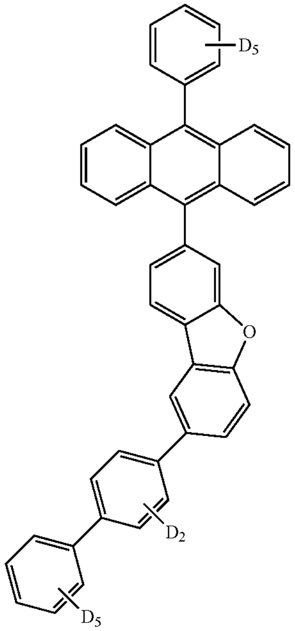
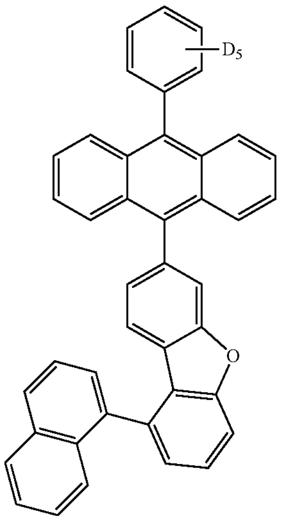
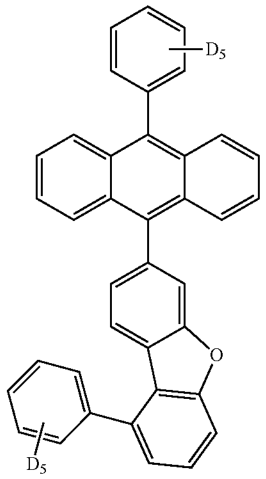
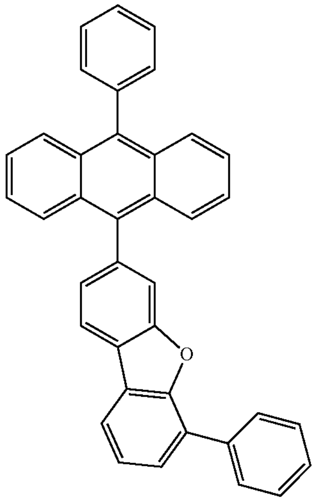

-continued
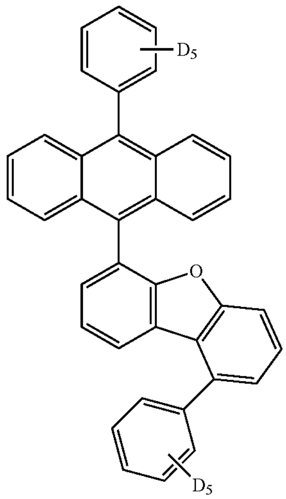
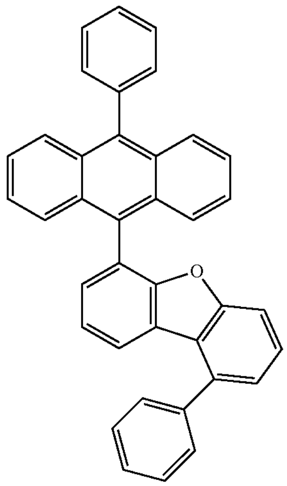
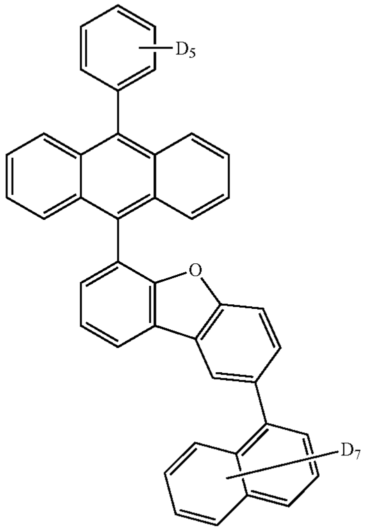
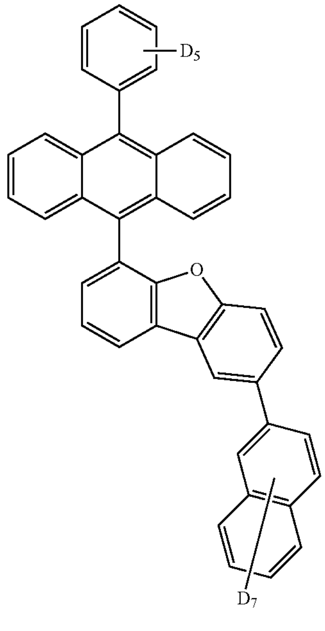
-continued
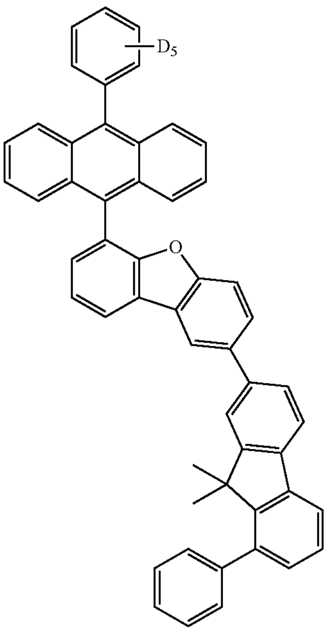
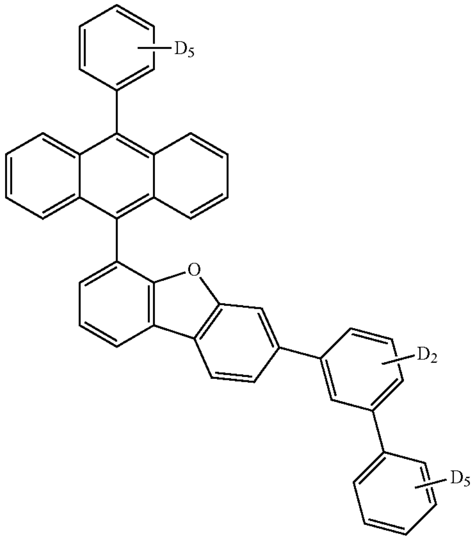
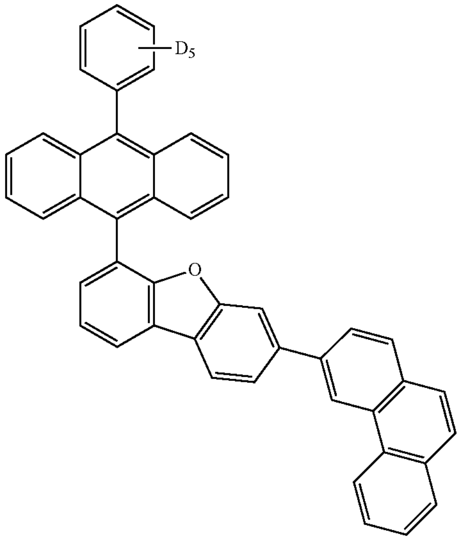

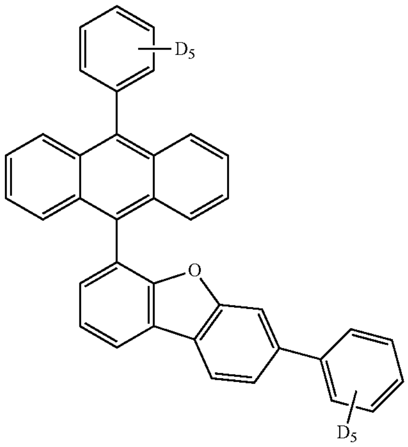
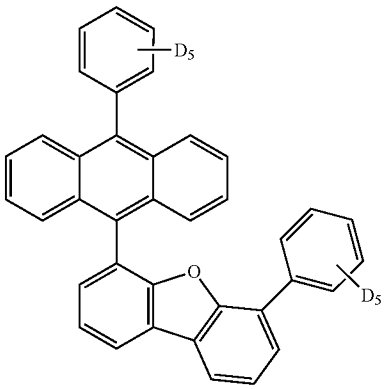
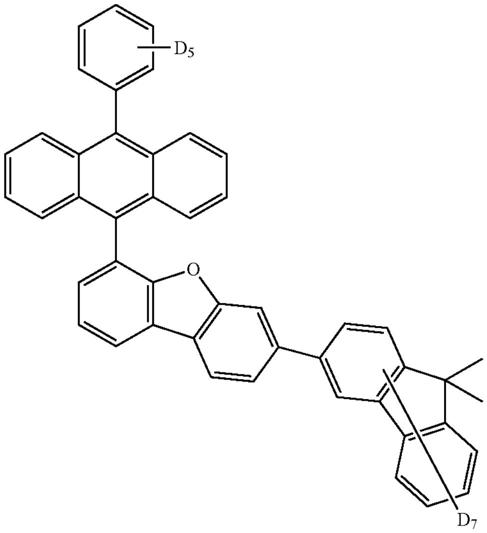
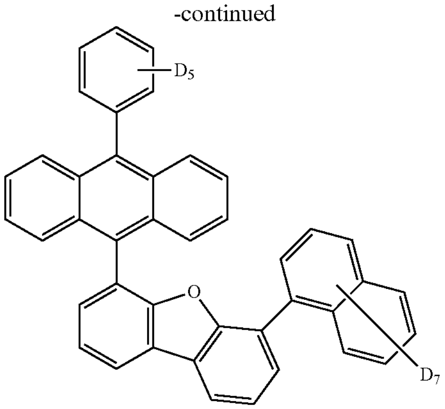
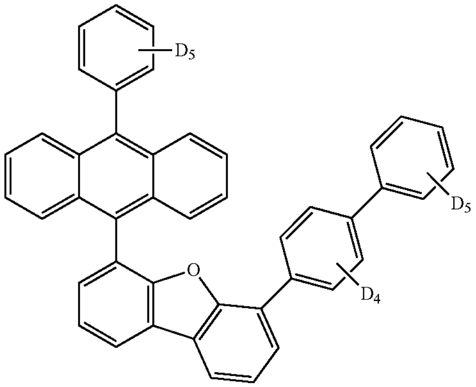
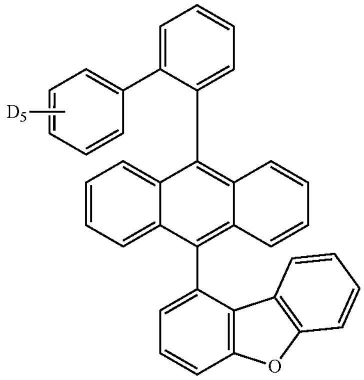
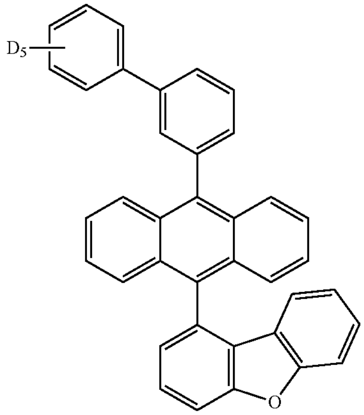

-continued
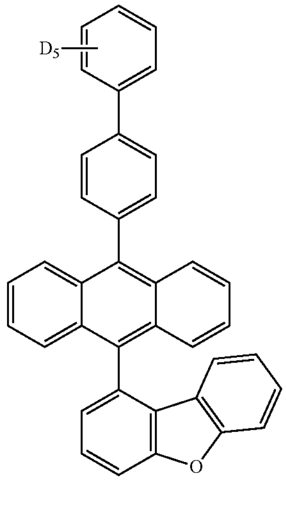
-continued
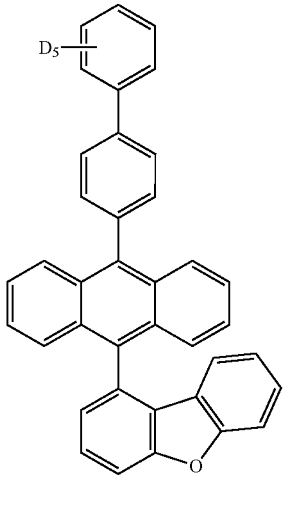
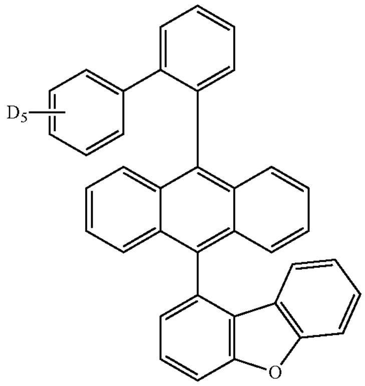
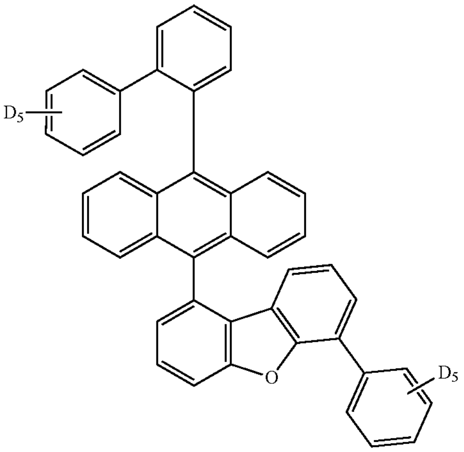
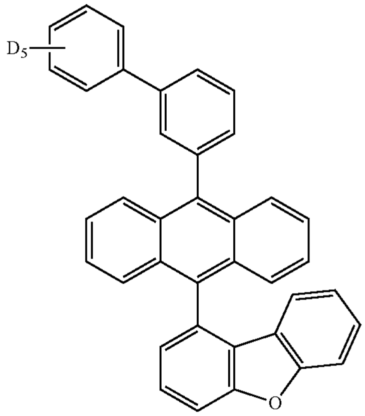
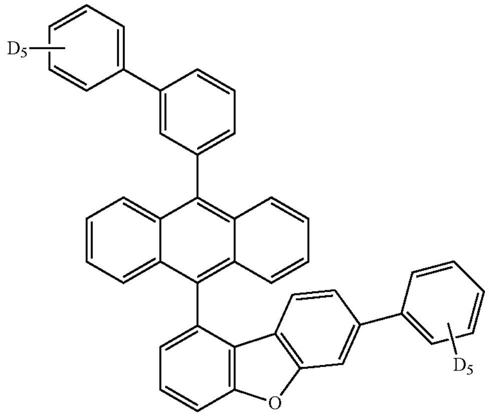

-continued
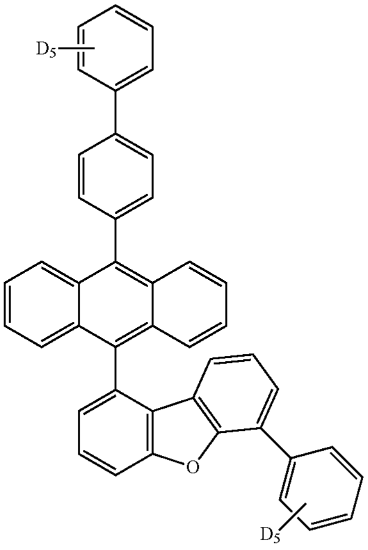
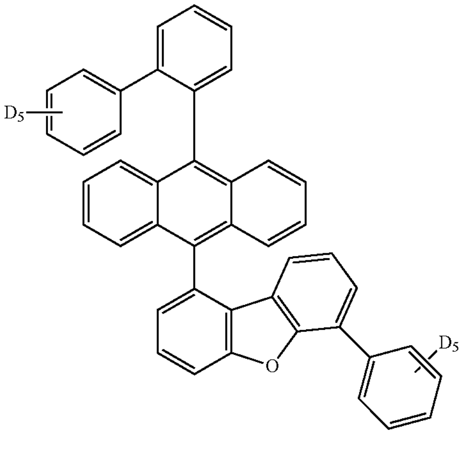
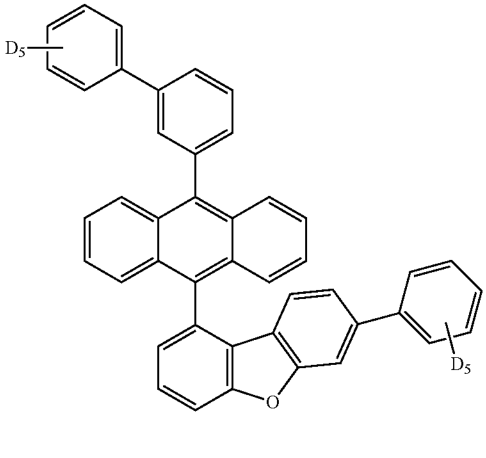
-continued
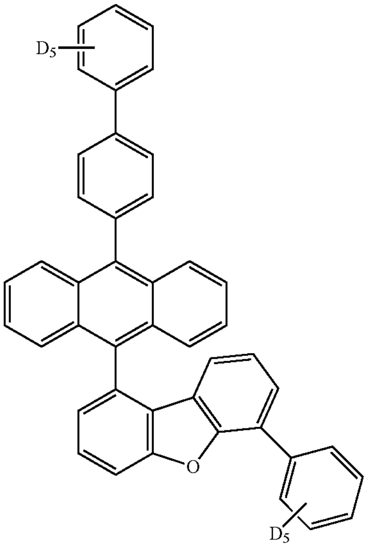
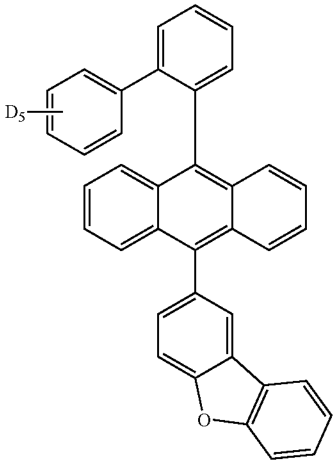
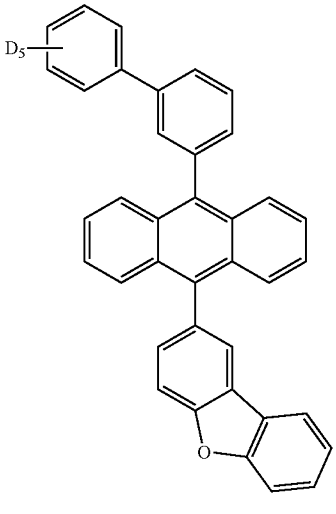

-continued
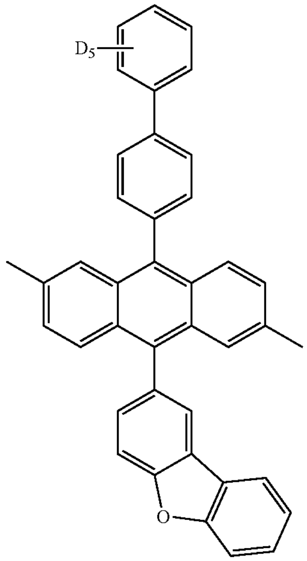
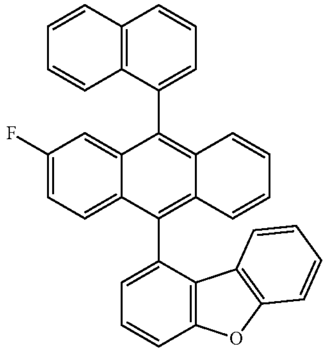
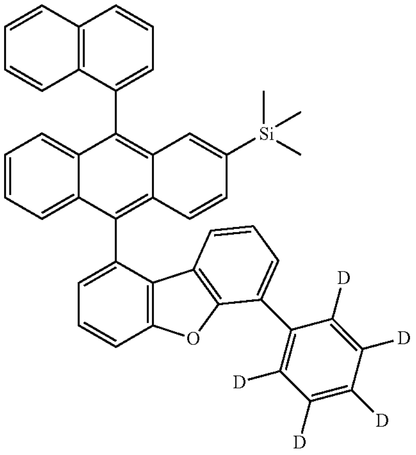
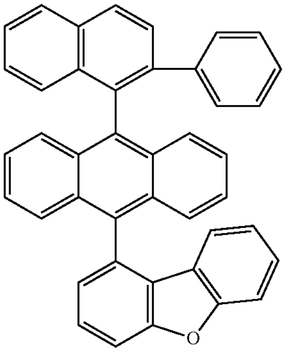
-continued
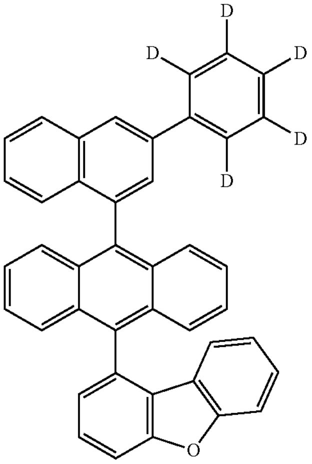
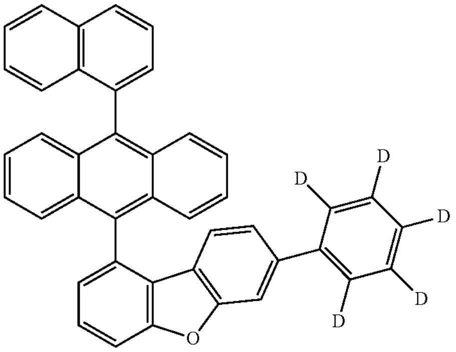
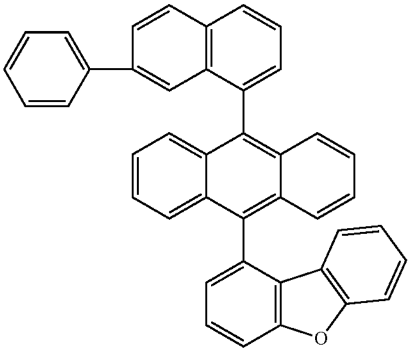
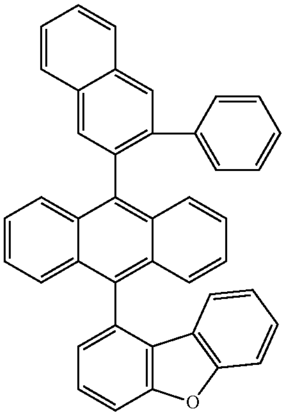

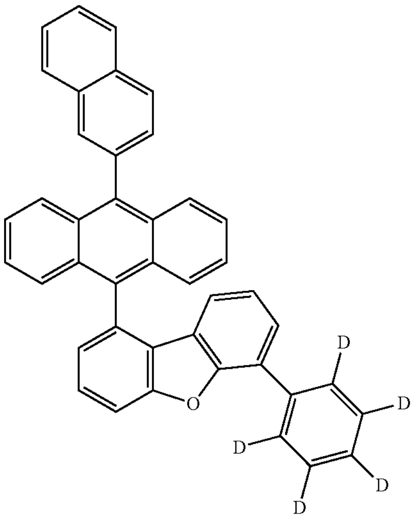
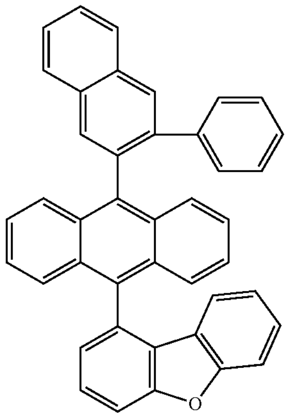
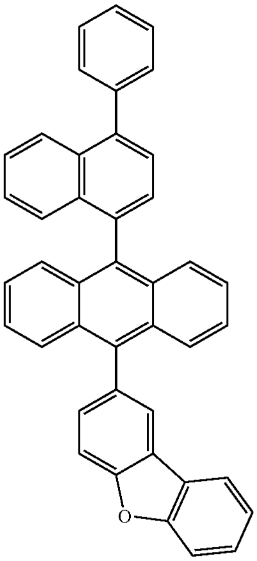
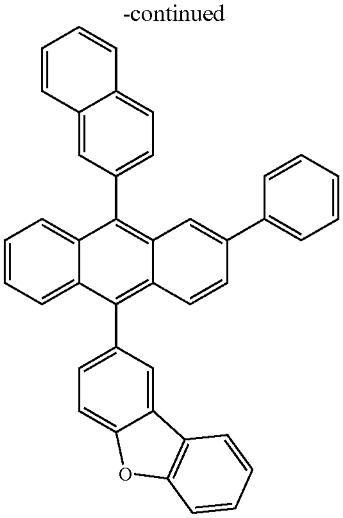
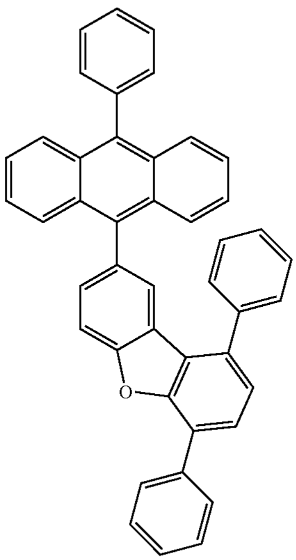
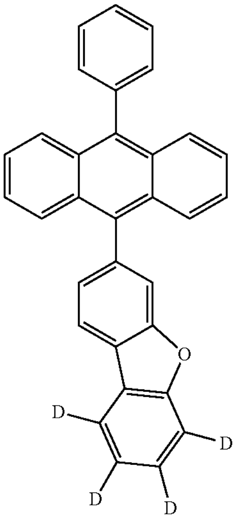
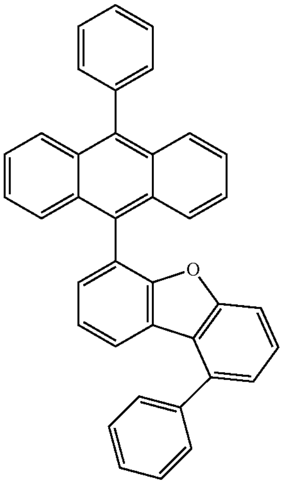
According to one embodiment of the present invention, the organic electroluminescent device includes a light emitting layer including a host and a dopant, the dopant includes at least one of the polycyclic compounds represented by Formulae 1 and 2, and the host is the anthracene compound represented by Formula 3.
According to one embodiment of the present invention, the host compound represented by Formula 3 may be selected from, but not limited to, the following anthracene derivatives:
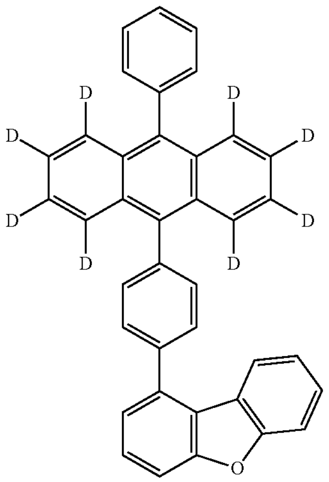
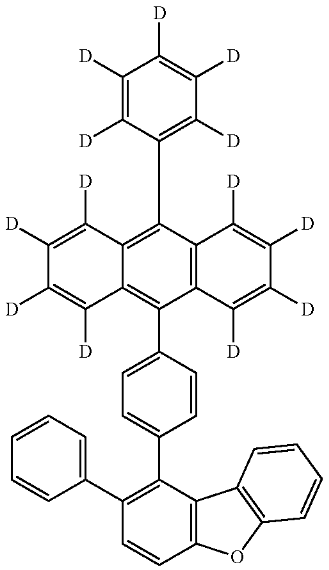
-continued
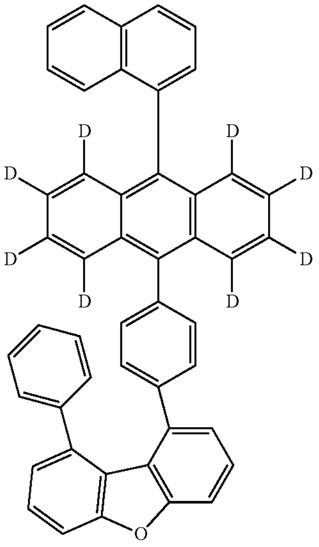
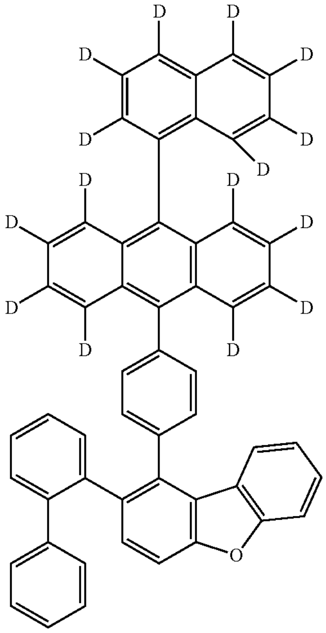
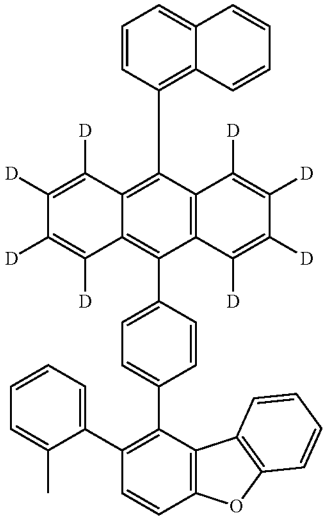

-continued
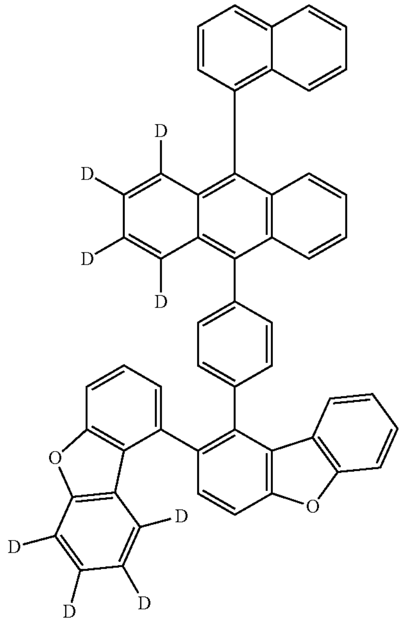
-continued
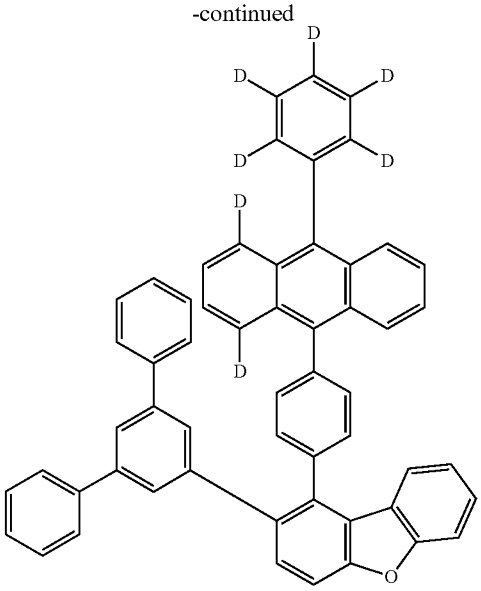
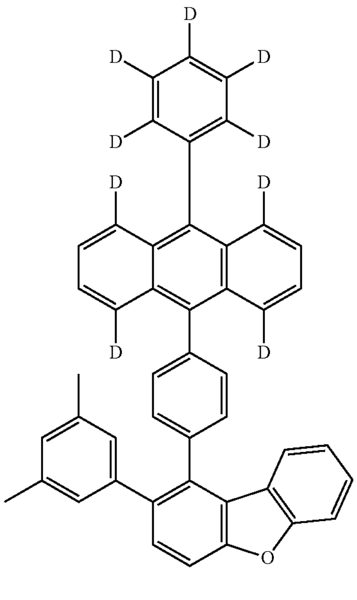
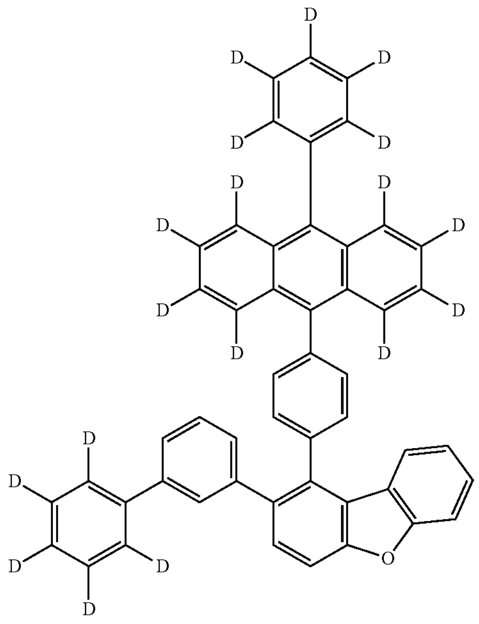

-continued
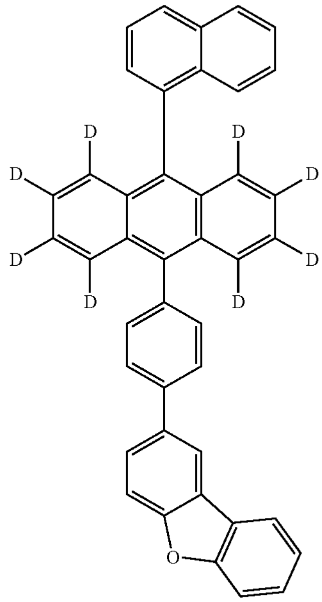
-continued
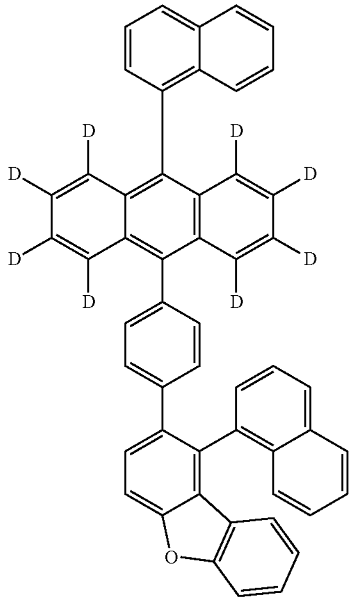
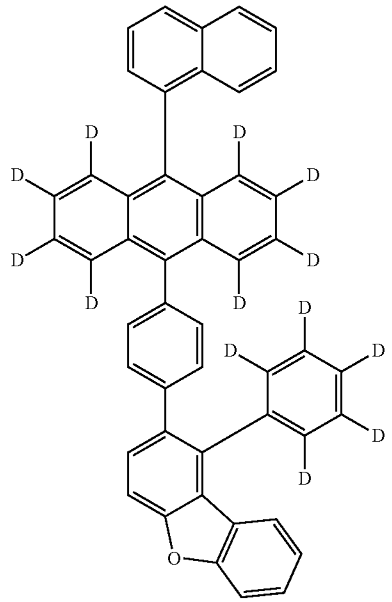
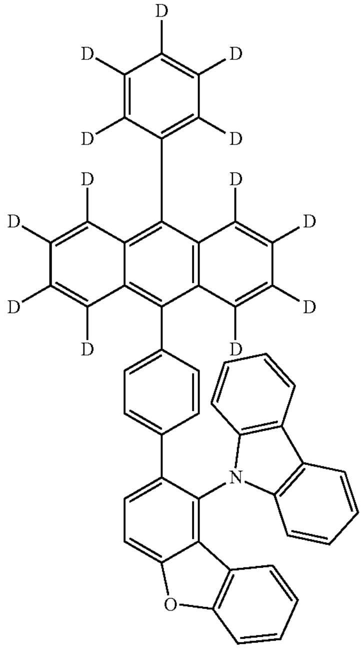

-continued
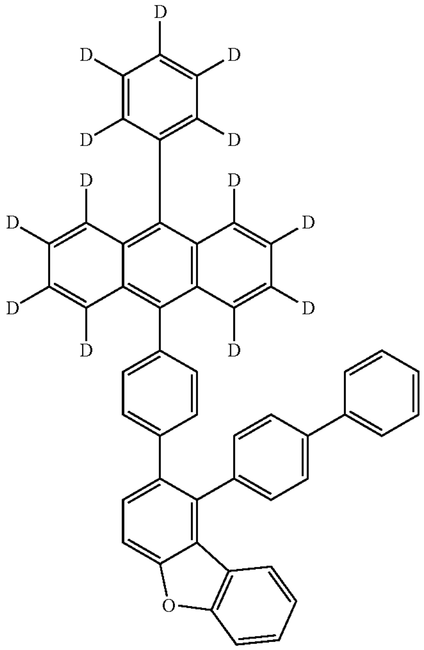
-continued
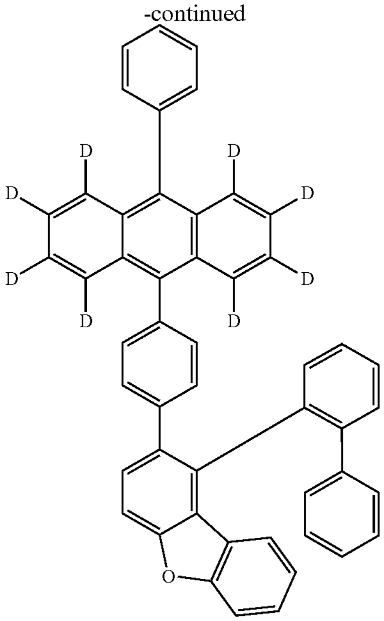
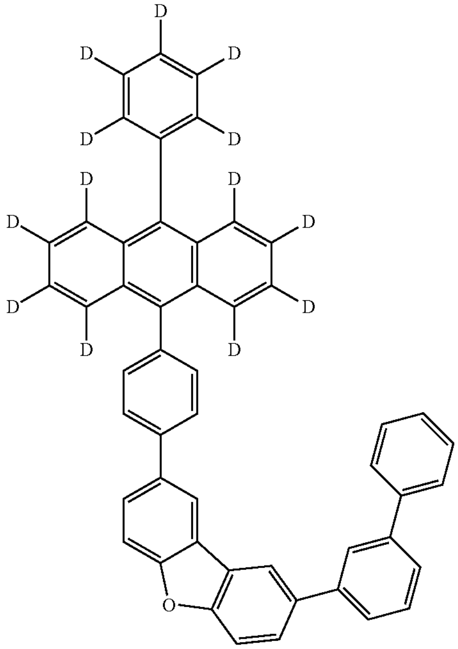
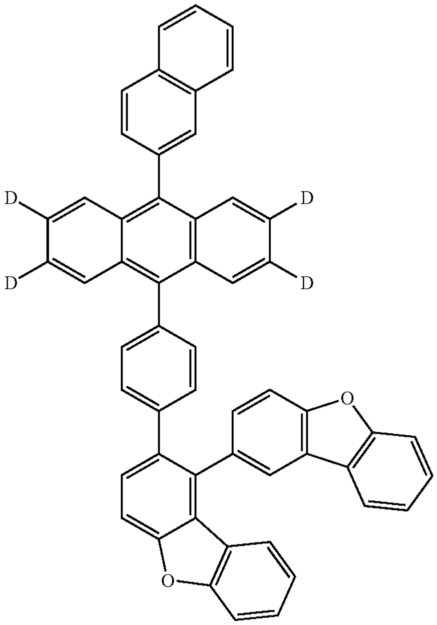

-continued
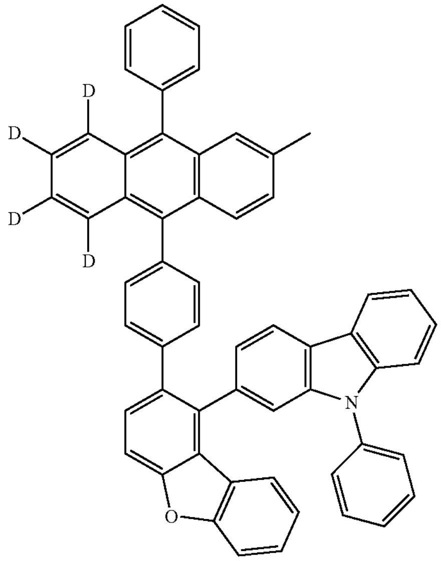
-continued
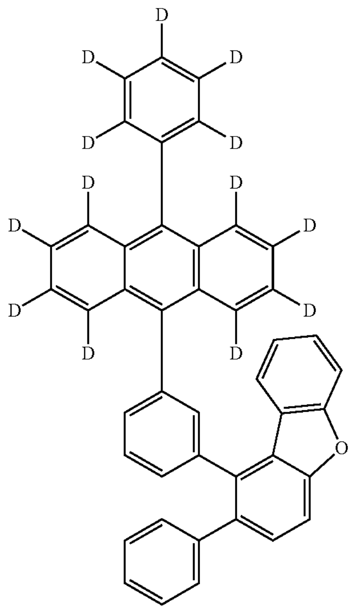
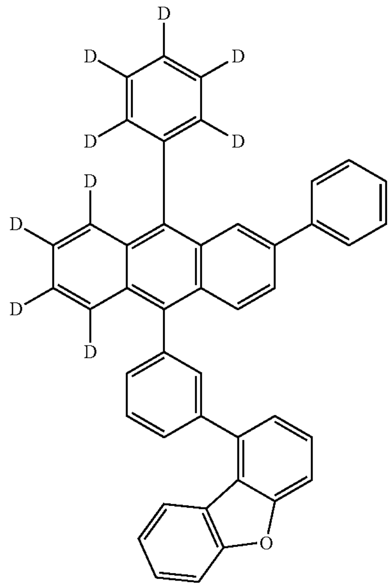
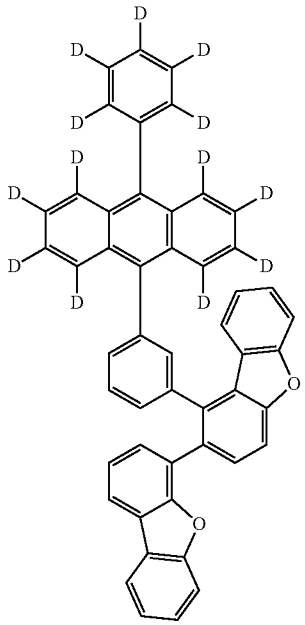

-continued
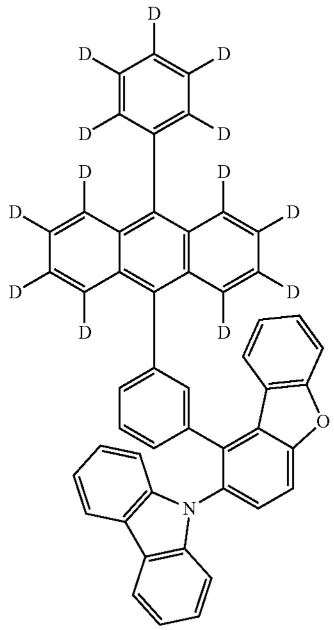
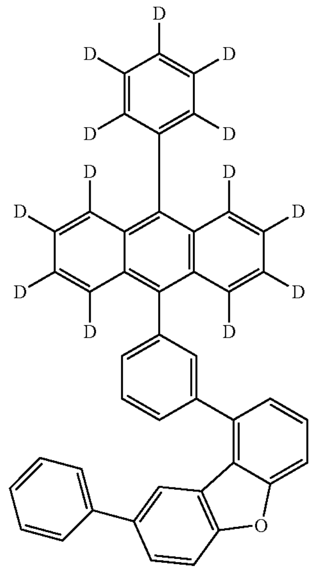
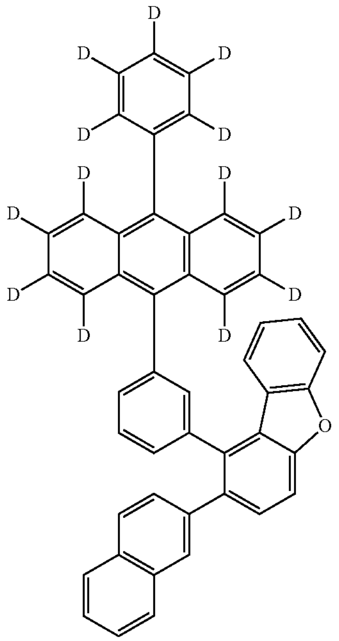
-continued
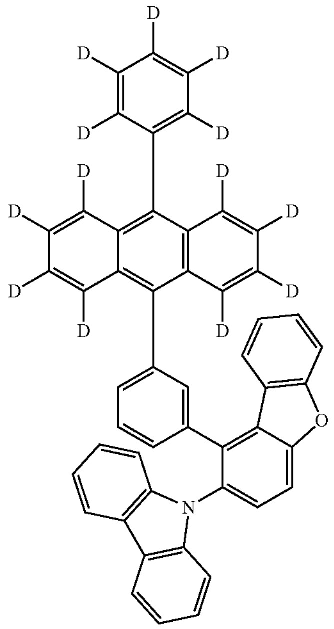

-continued
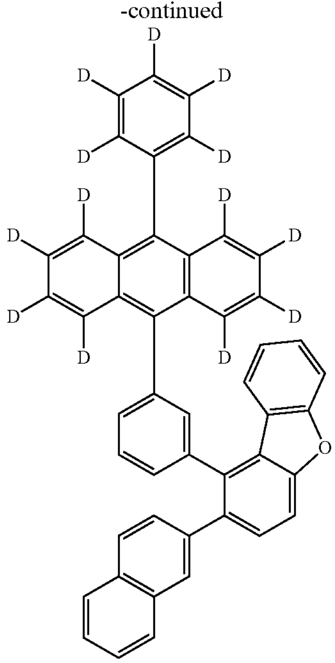
-continued
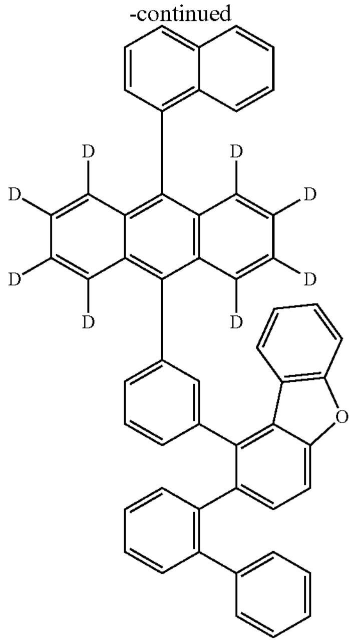
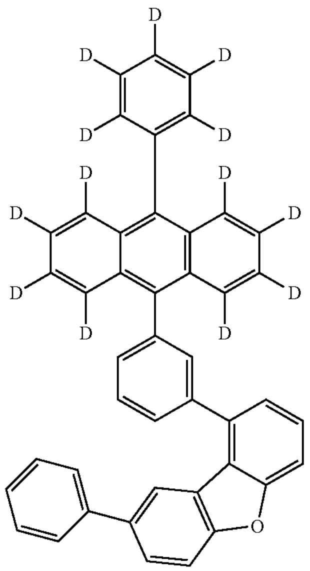
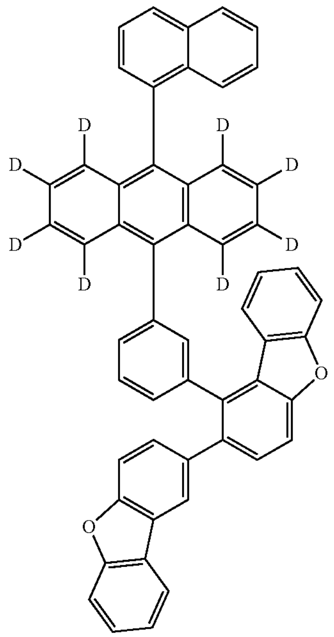

-continued
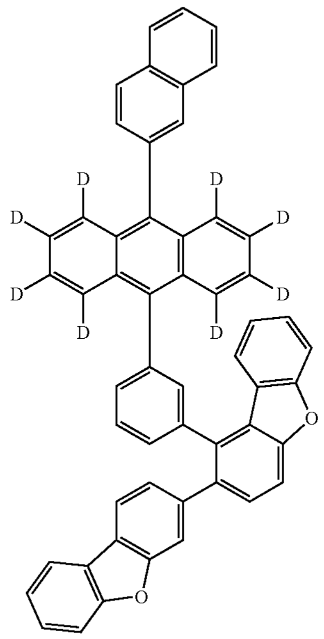
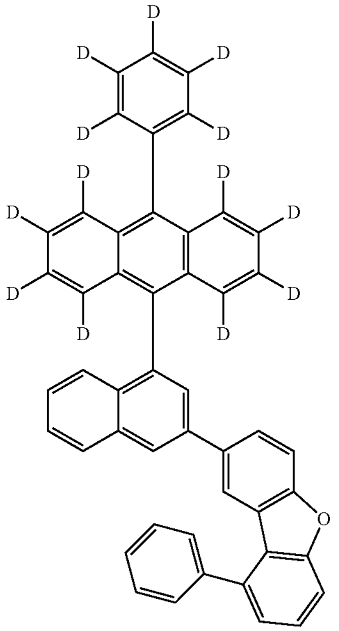
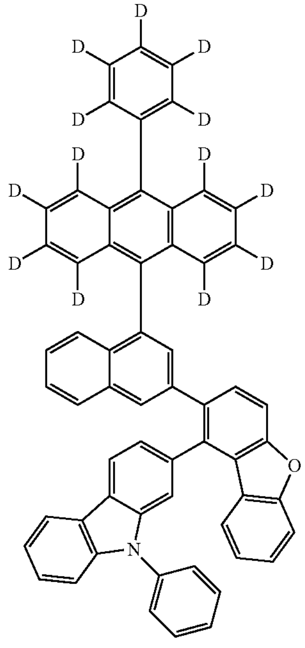
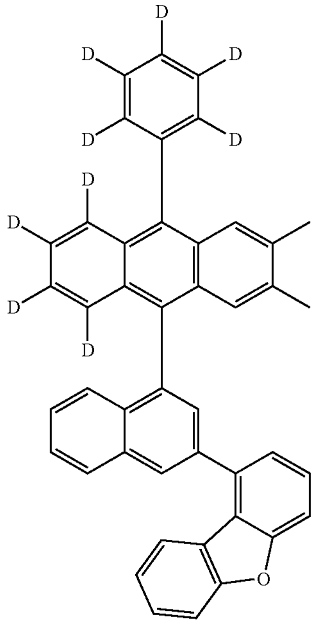

-continued
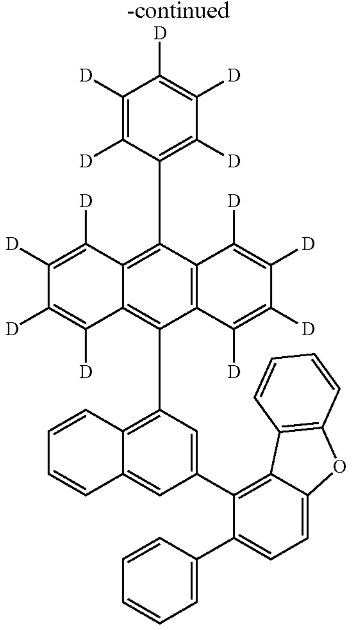
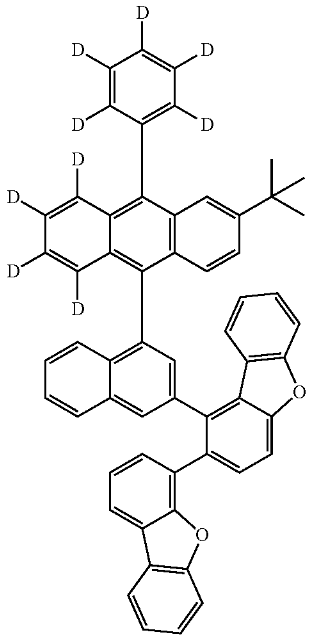
-continued
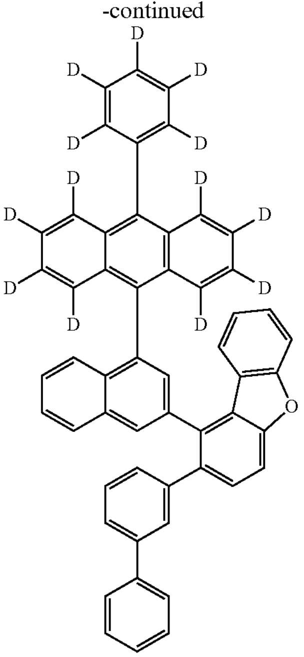
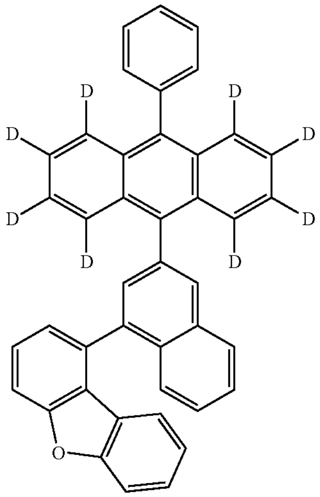
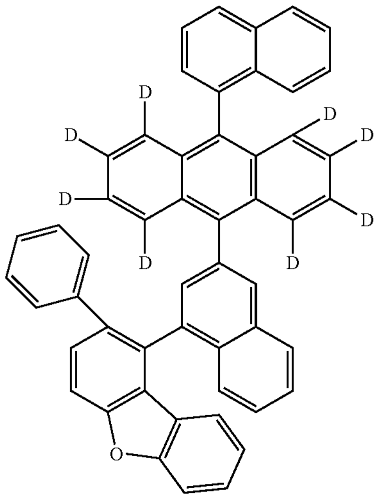

-continued
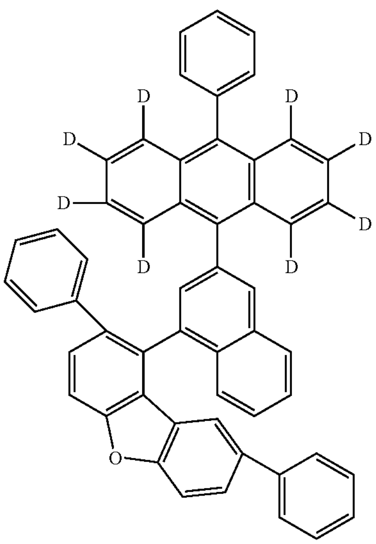
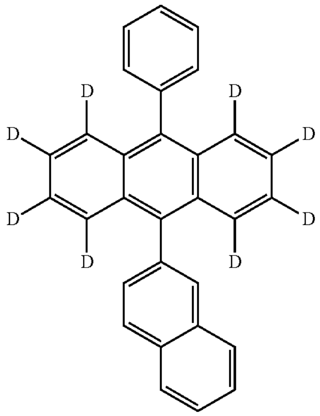
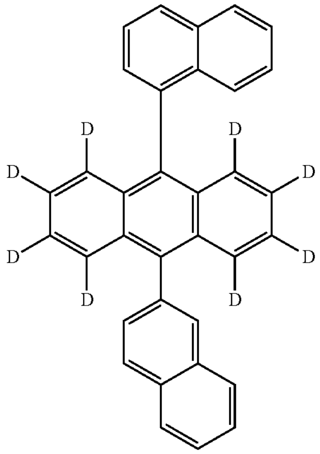
-continued
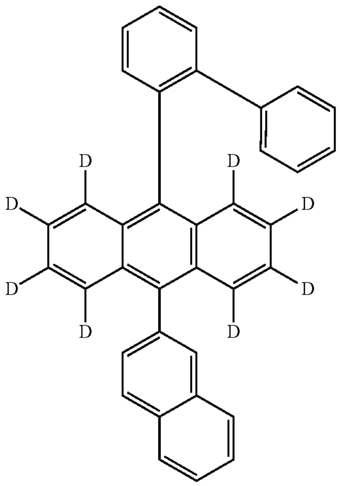
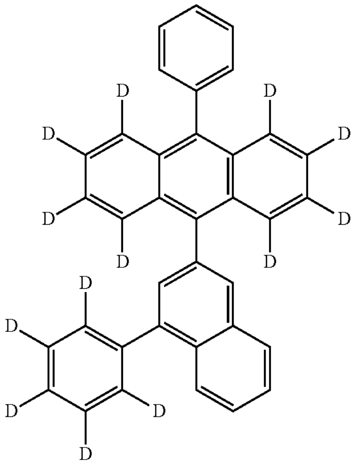
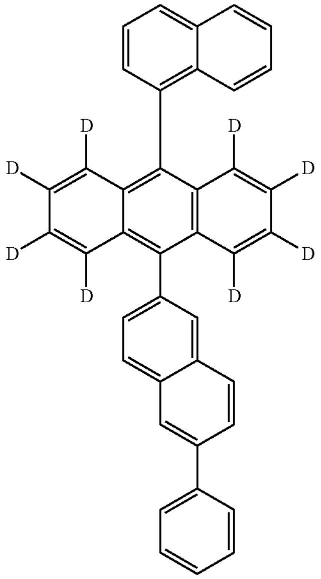

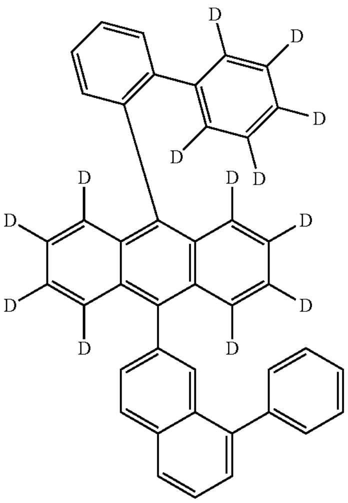
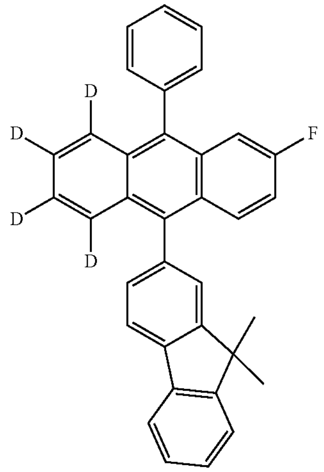
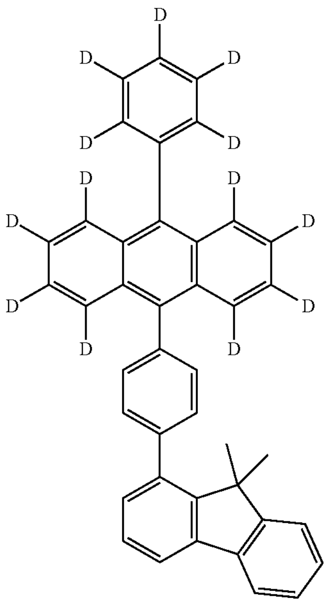
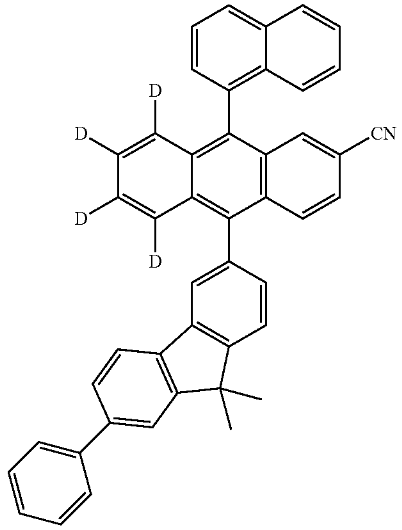
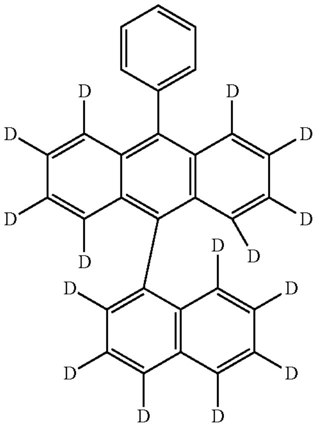
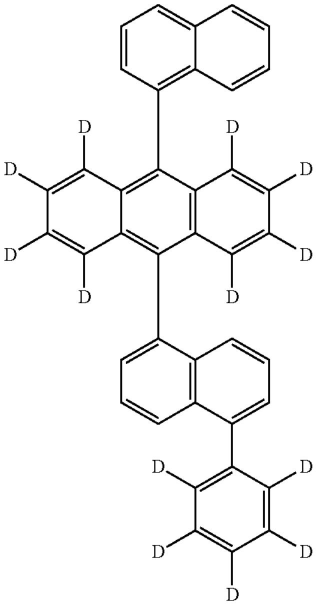

-continued
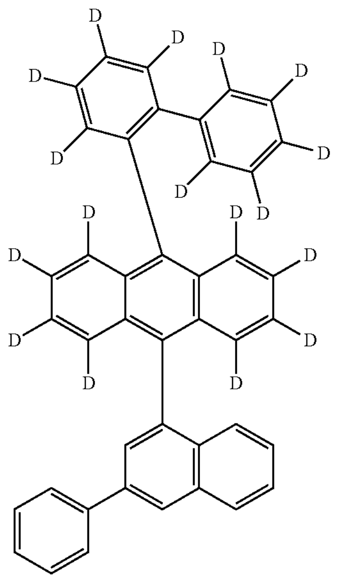
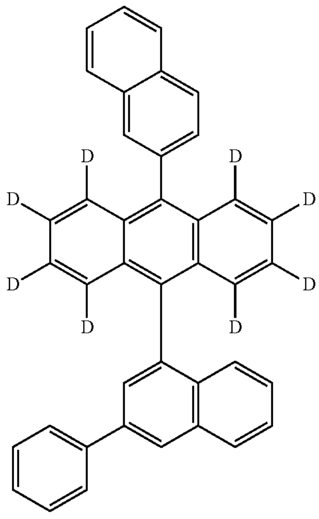
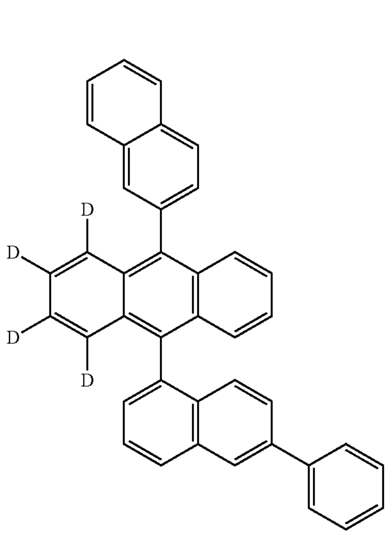
-continued
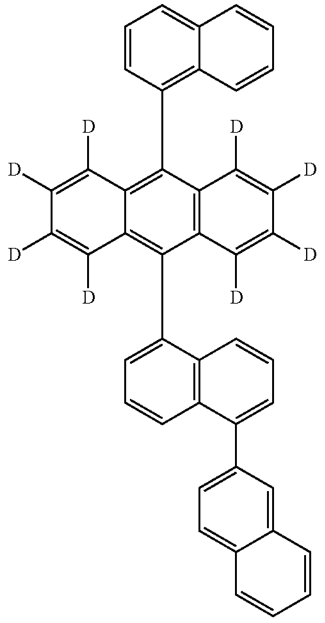
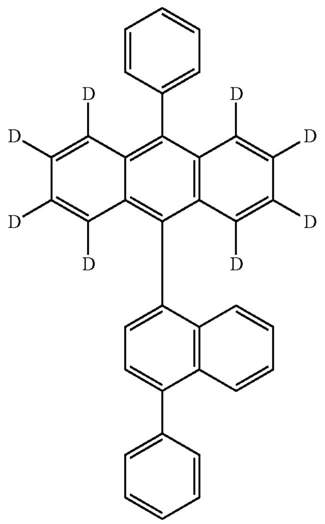

-continued
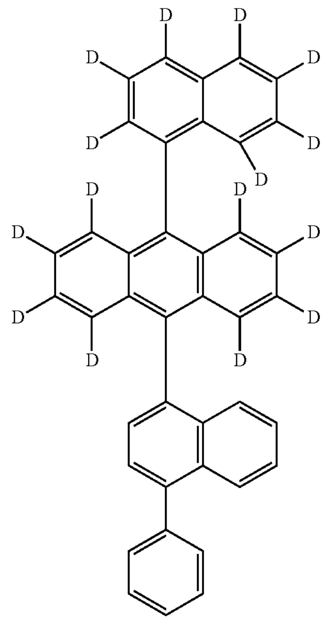
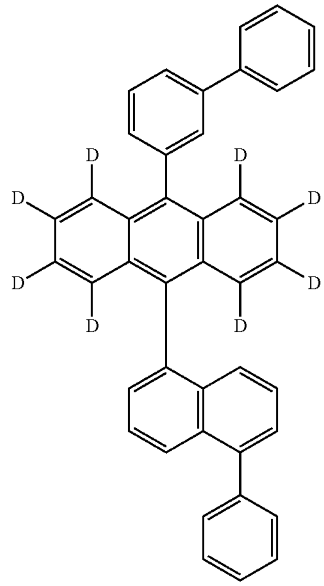
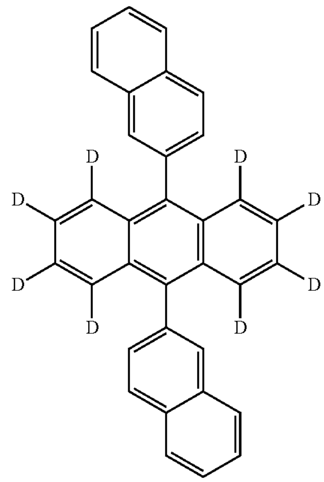
-continued
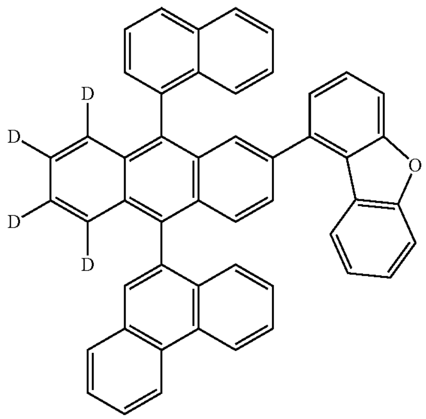
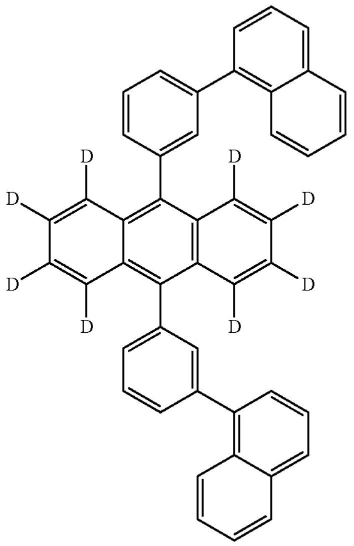
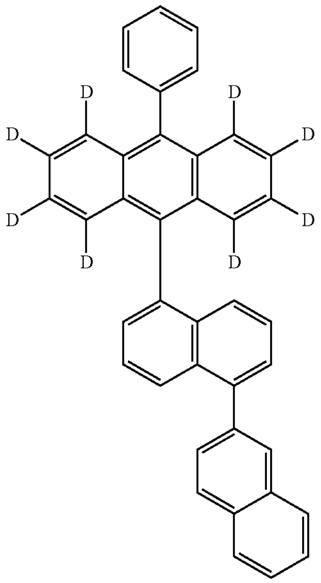

-continued
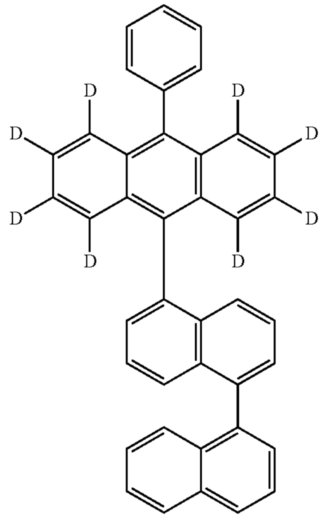
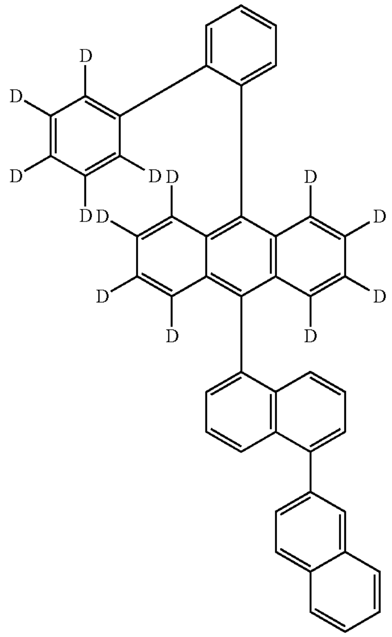
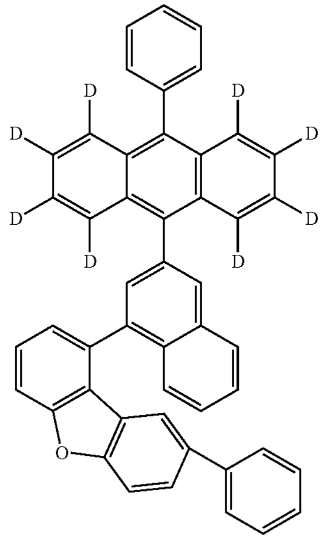
-continued
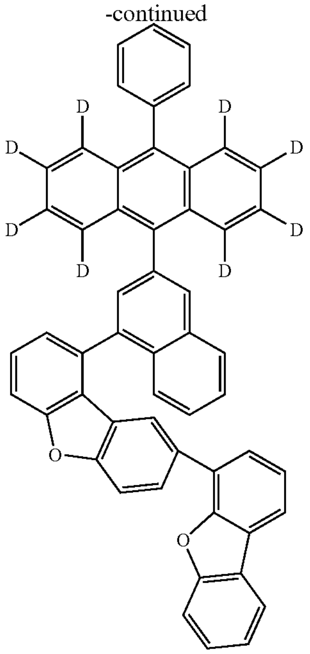
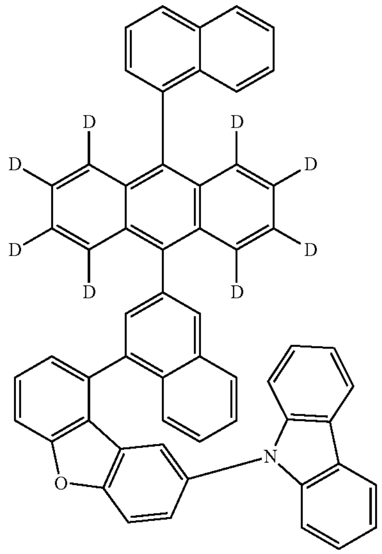

-continued
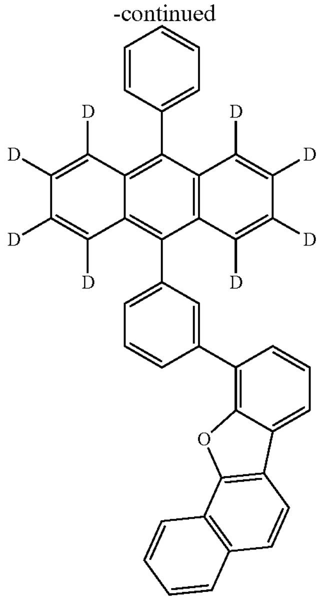
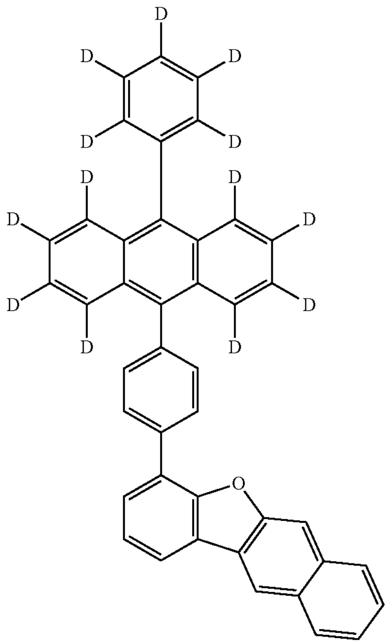
-continued
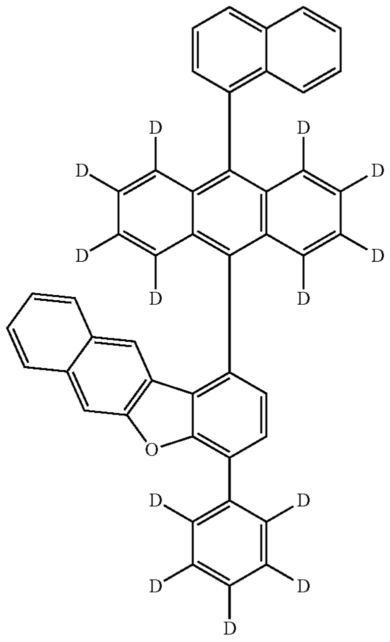
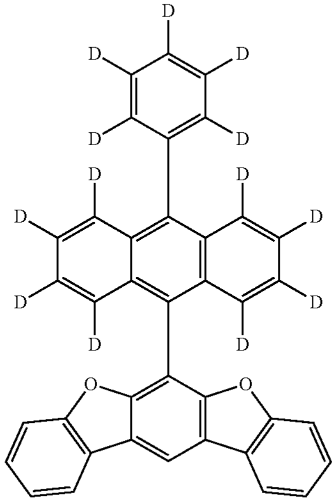
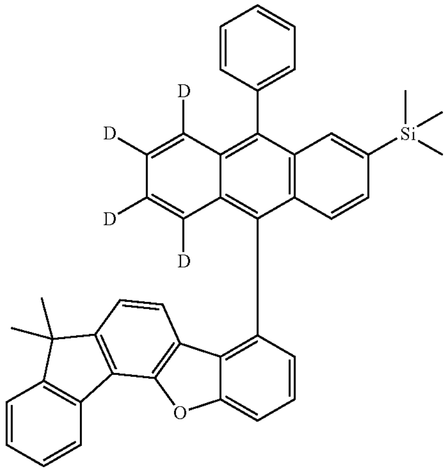

-continued
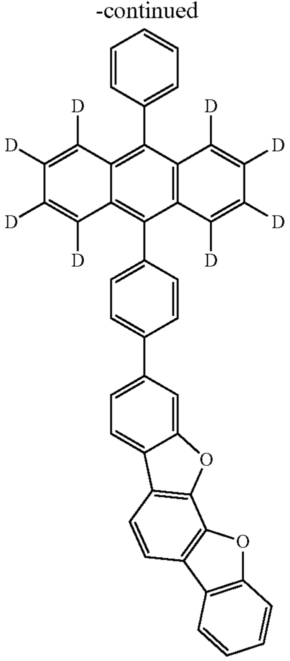
-continued
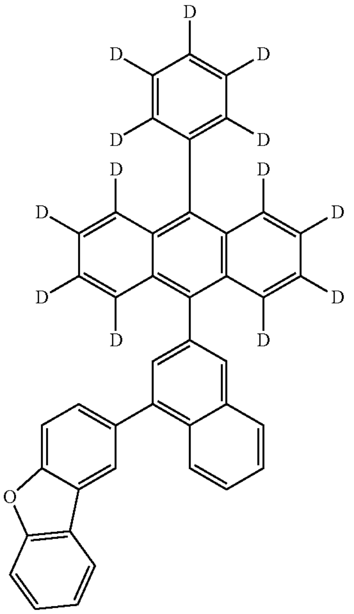
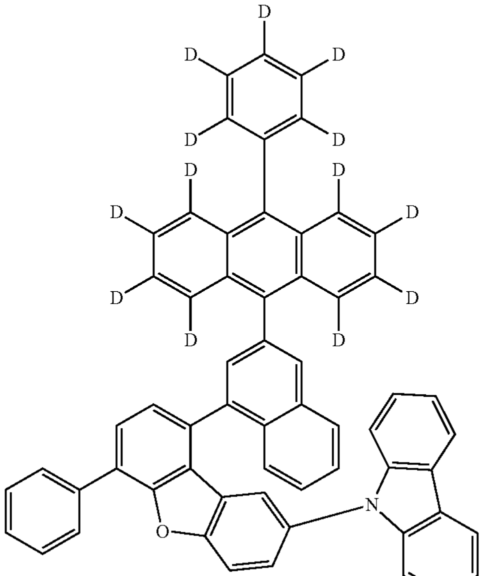
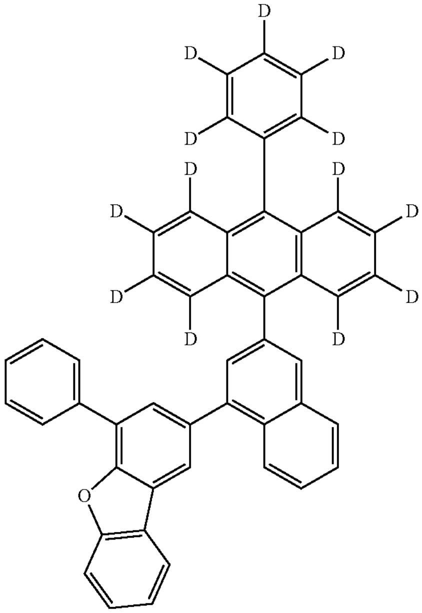

-continued
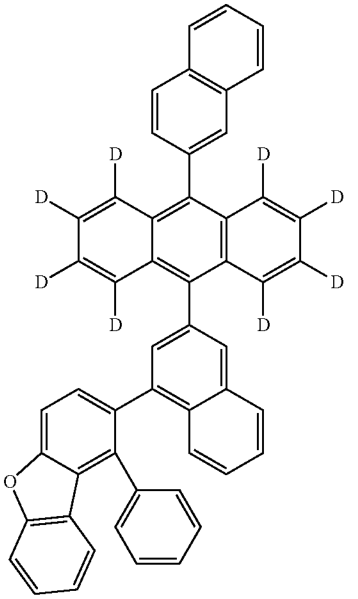
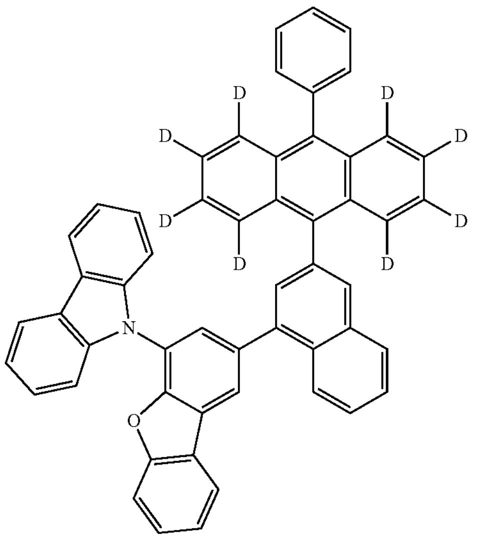
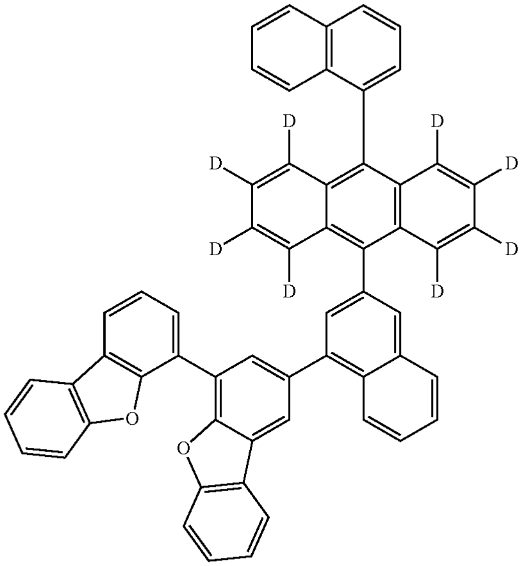
-continued
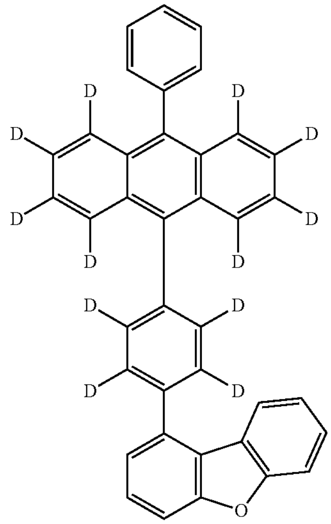
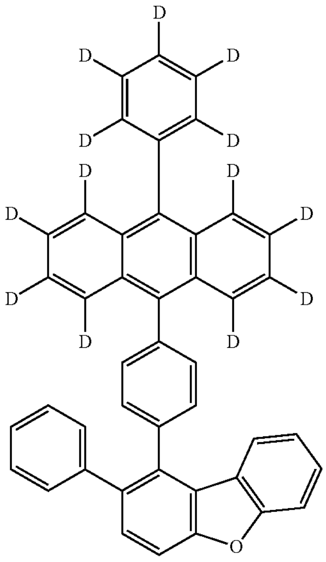
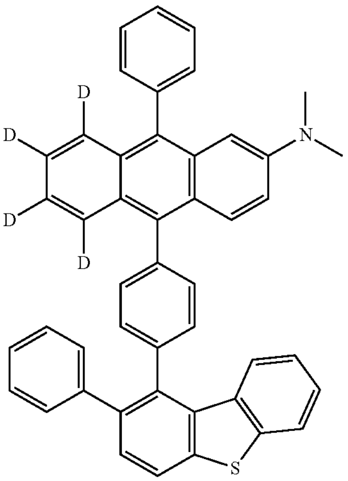

-continued
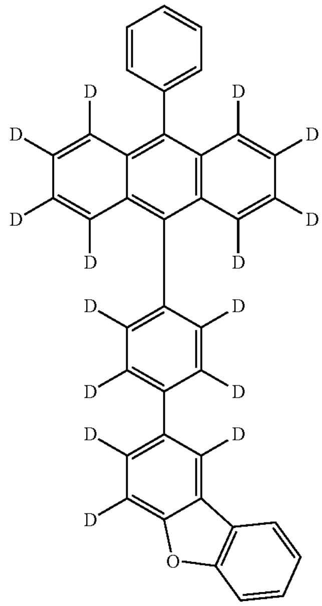
-continued
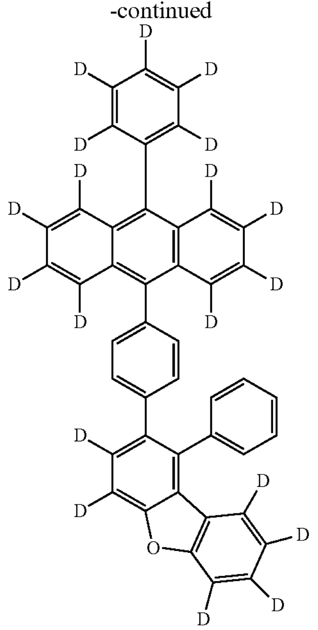
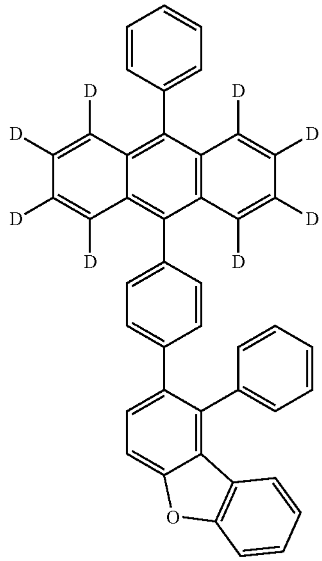
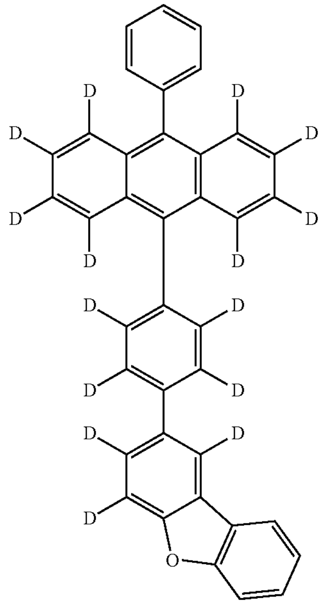

-continued
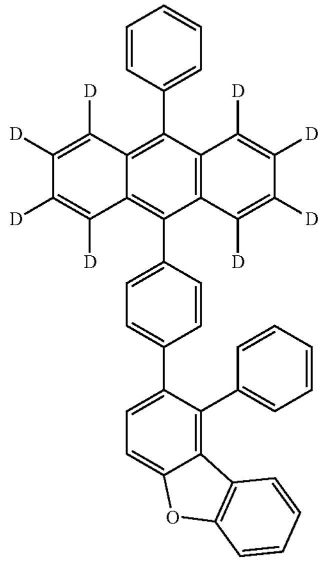
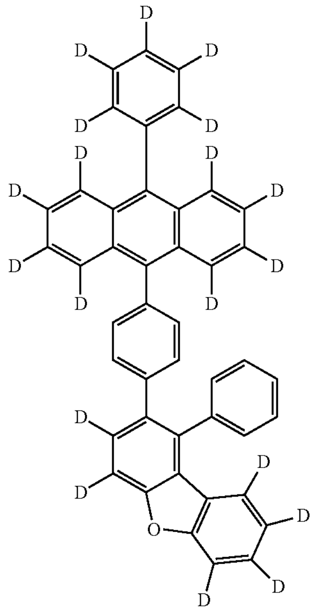
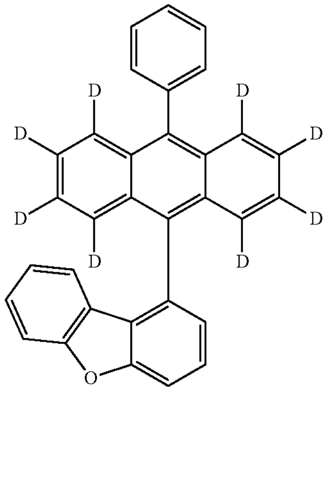
-continued
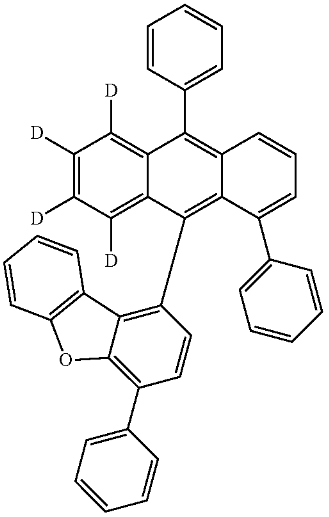
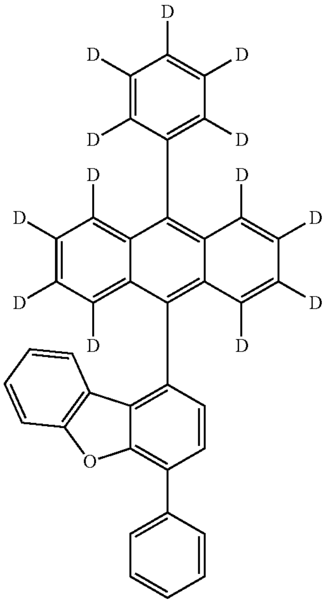
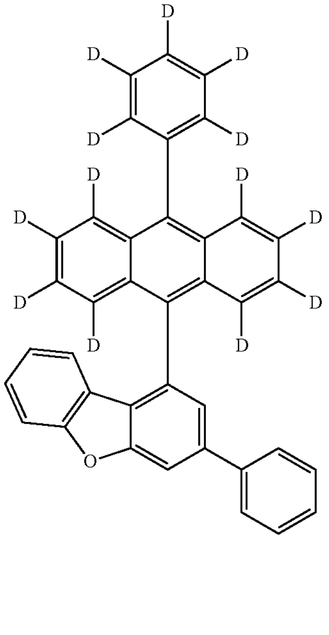

-continued
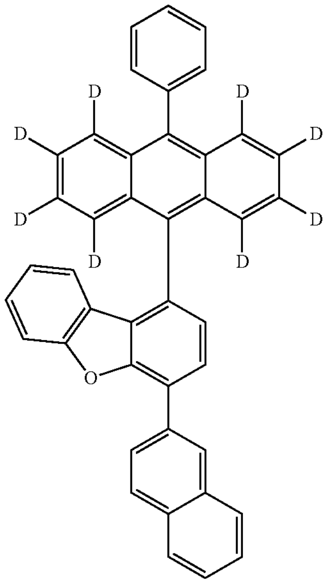
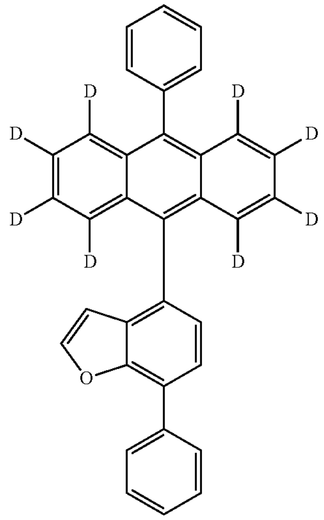
-continued
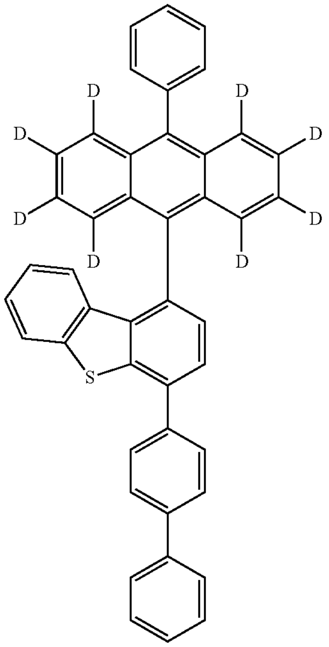
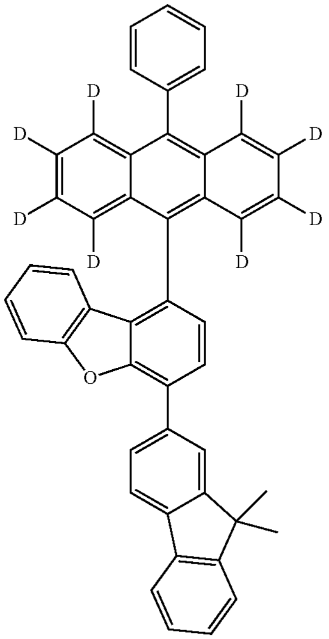

-continued
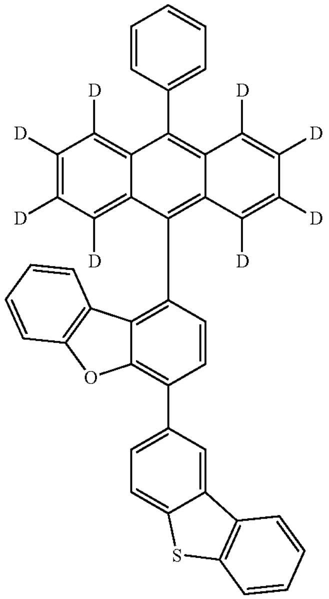
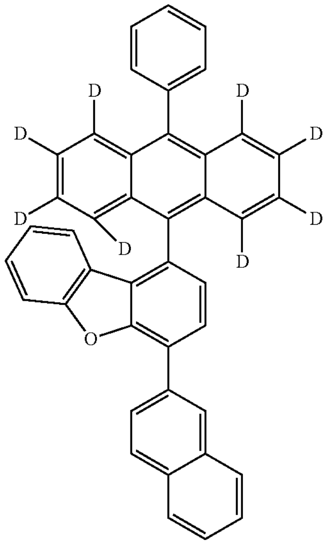
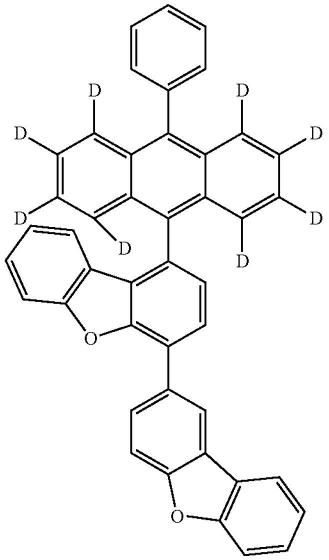
-continued
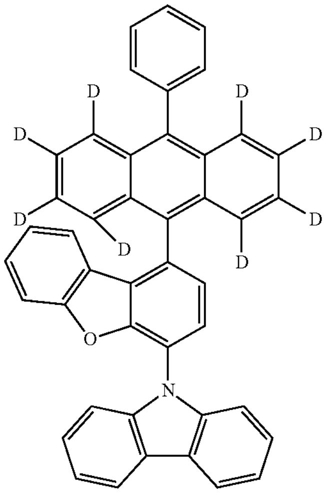
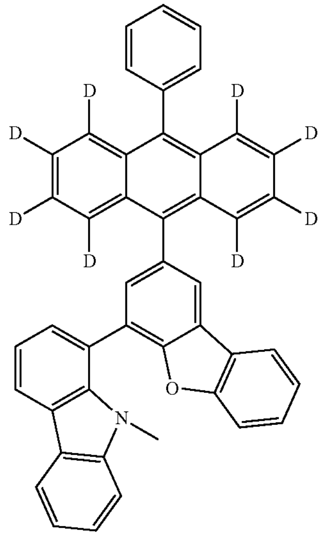
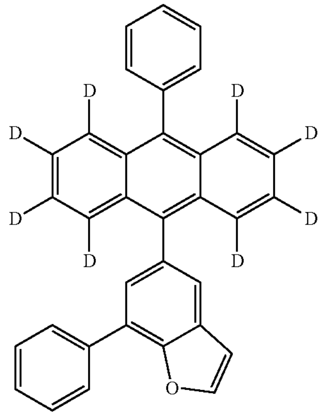

-continued
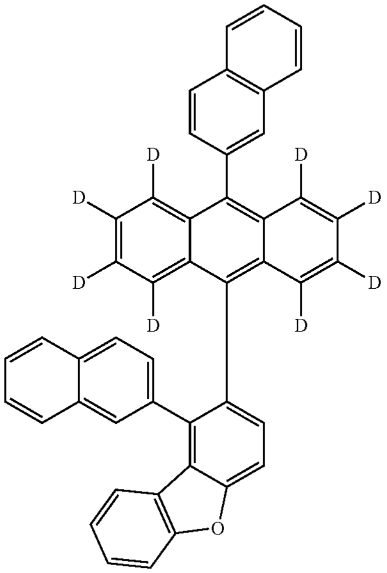
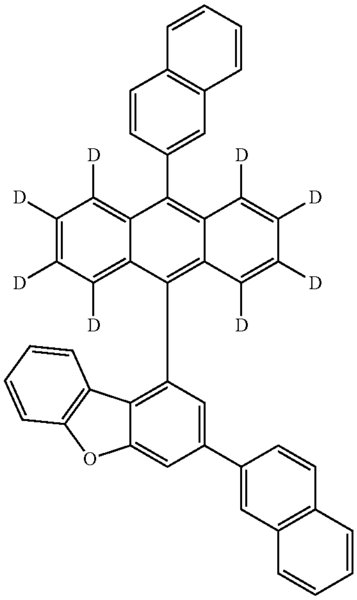
-continued
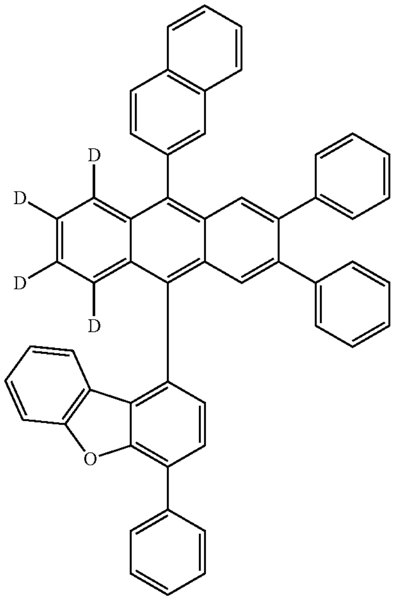
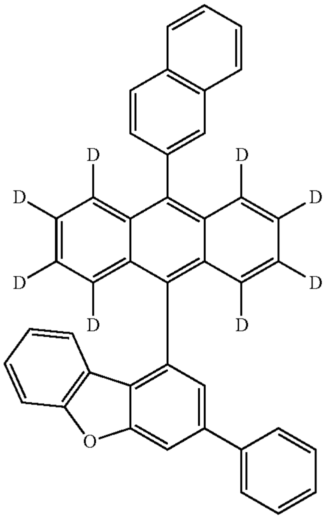
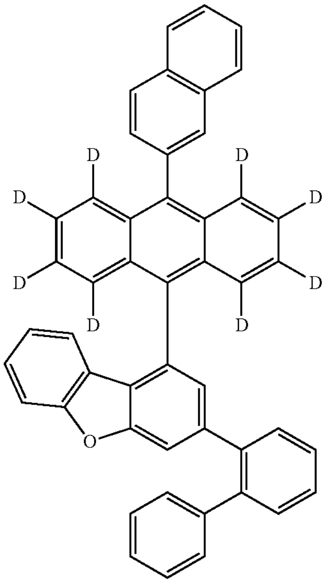

-continued
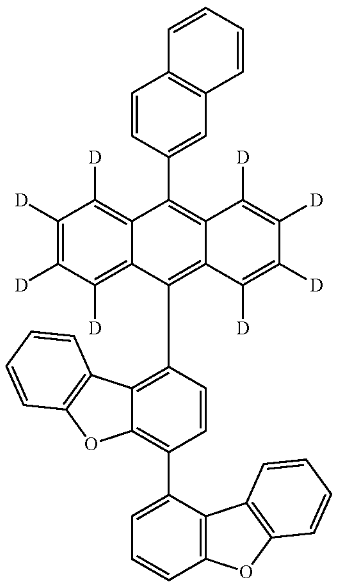
-continued
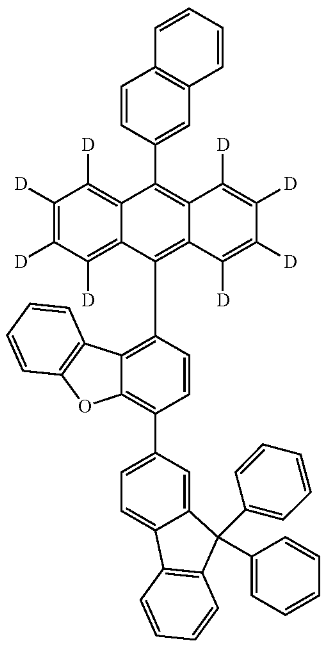
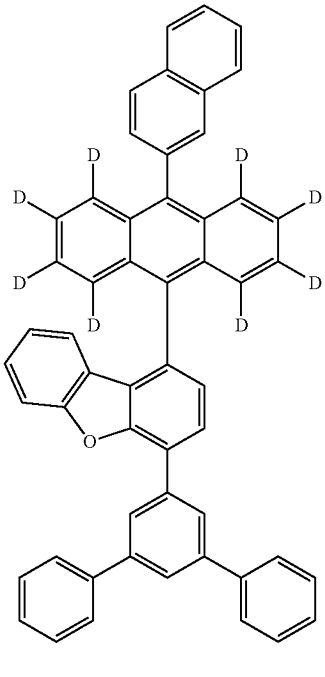
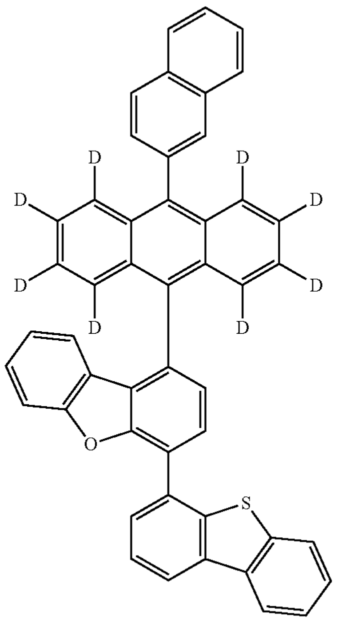

-continued
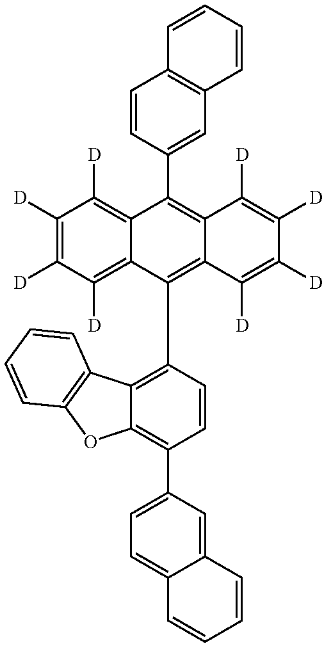
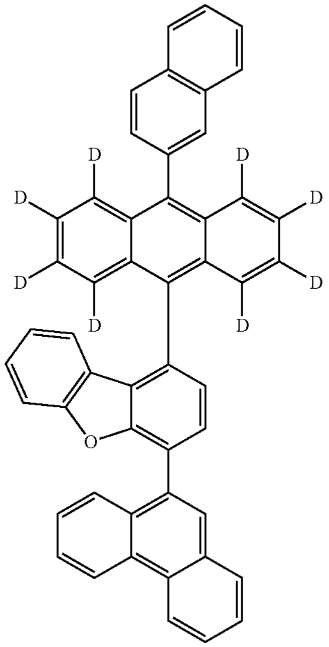
-continued
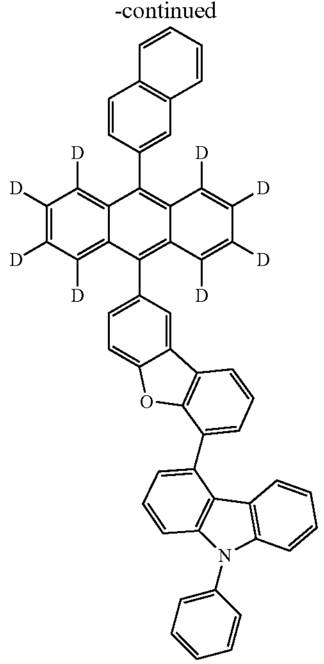
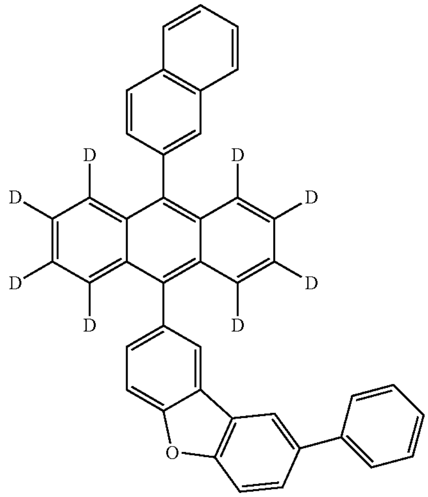
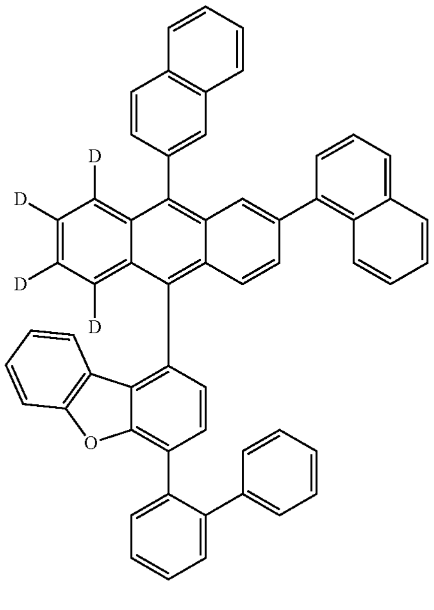

-continued
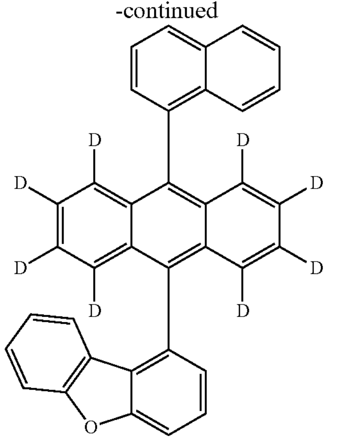
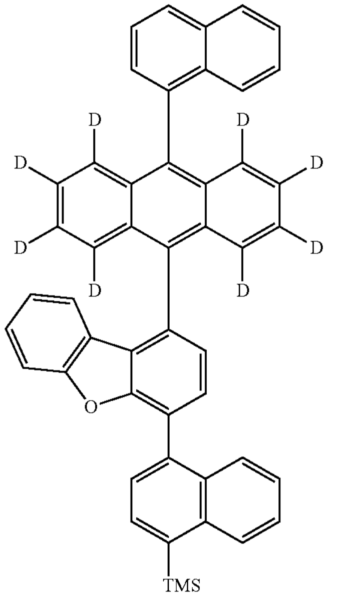
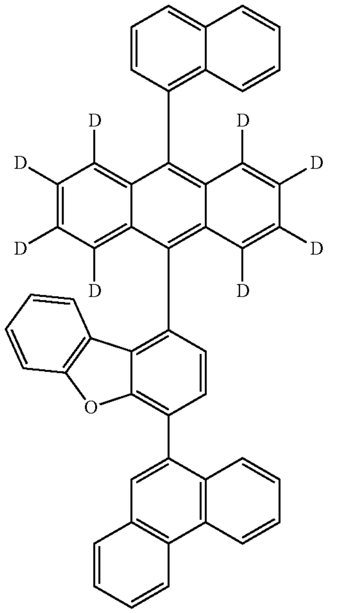
-continued
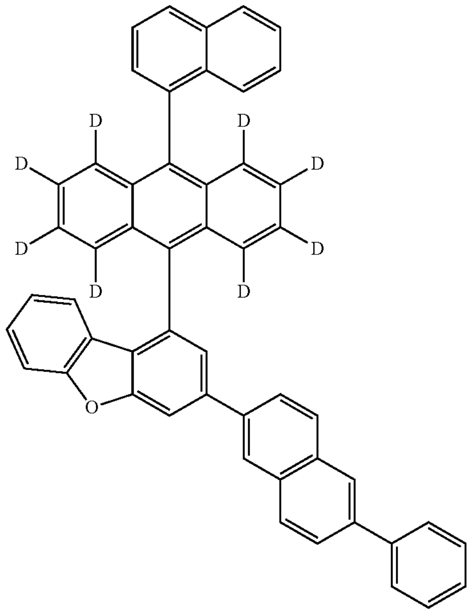
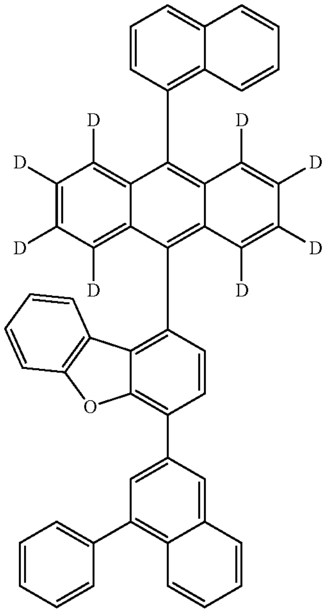

-continued
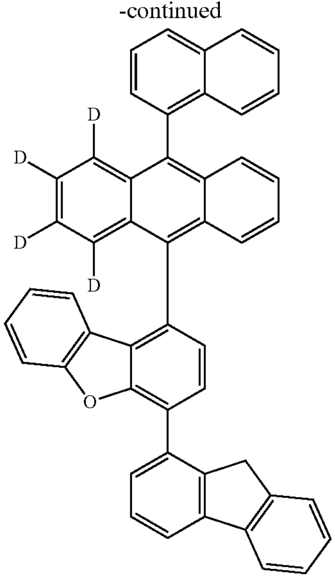
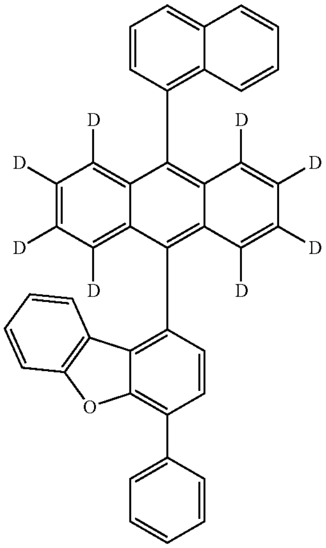
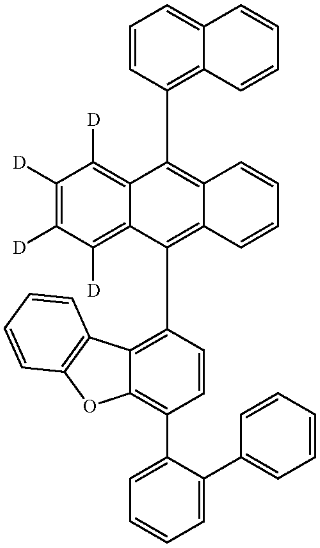
-continued
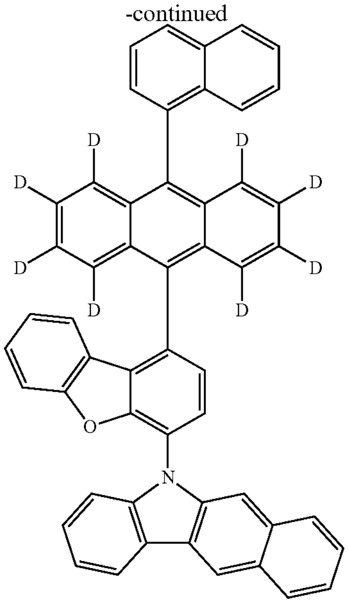
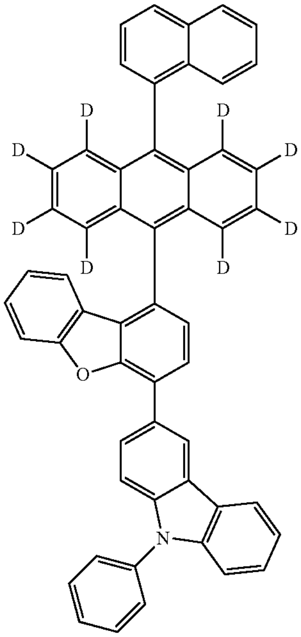

-continued
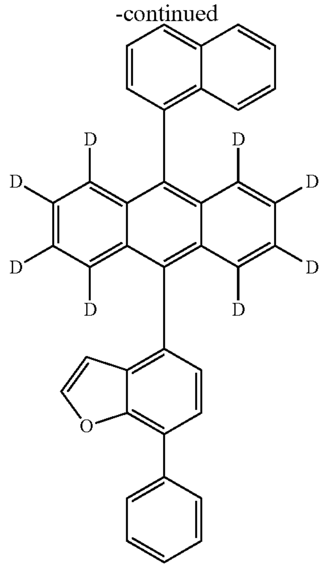
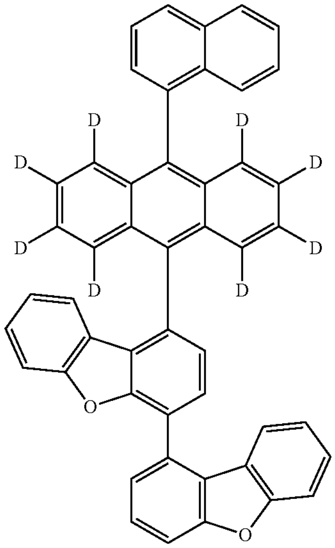
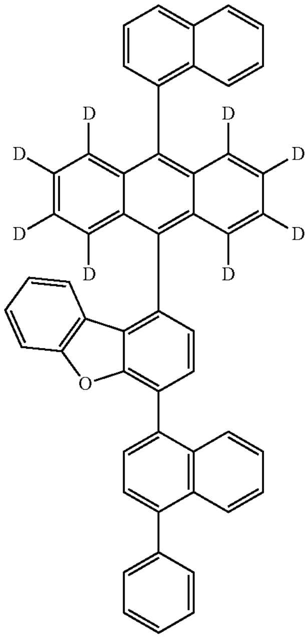
-continued
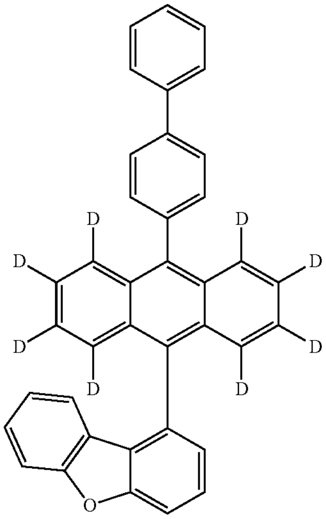
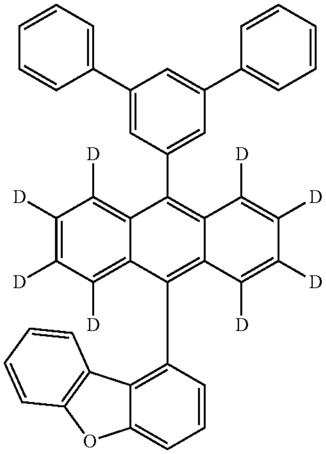
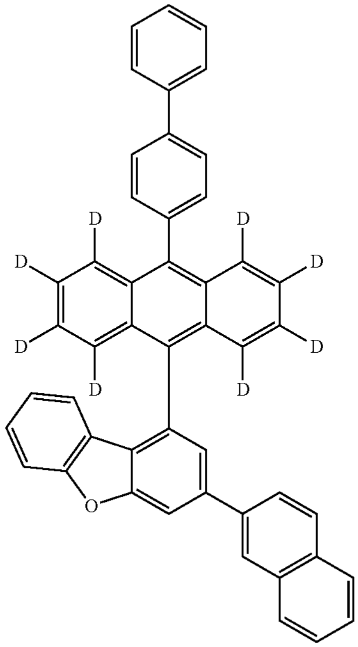

-continued
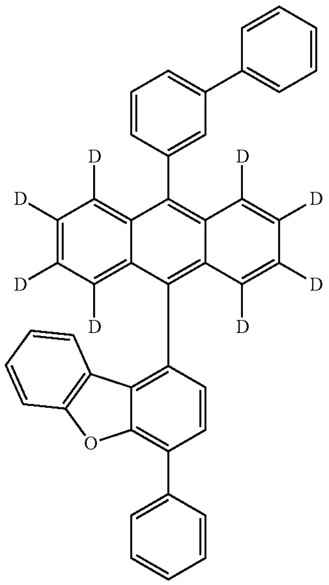
-continued
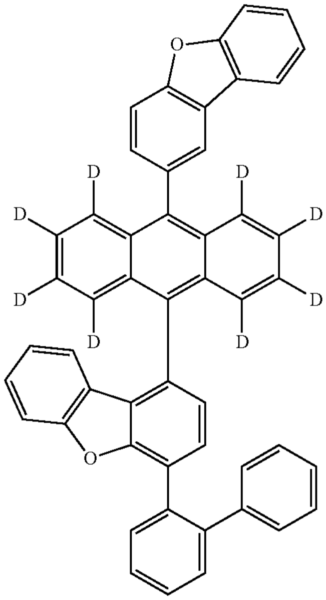
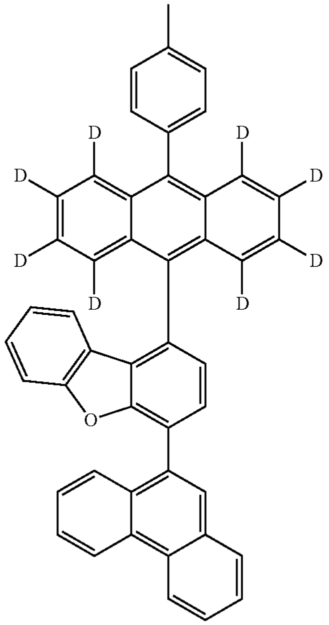
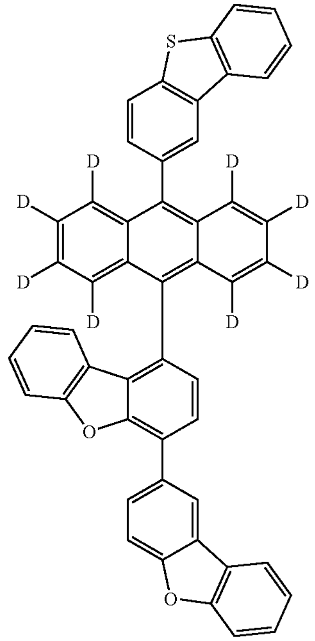

-continued
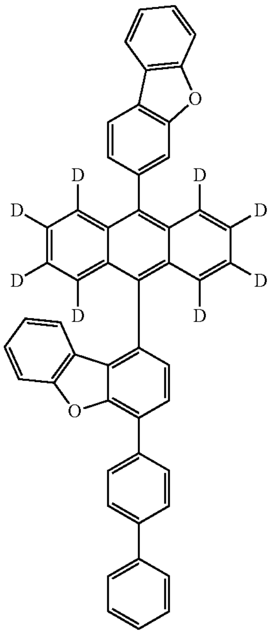
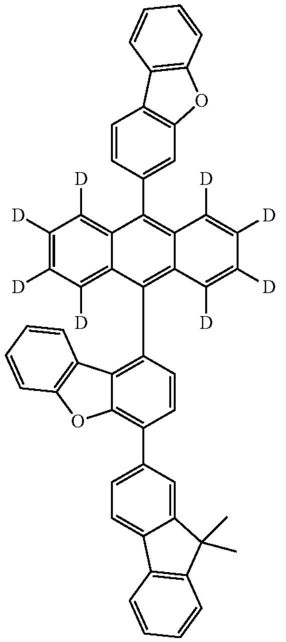
-continued
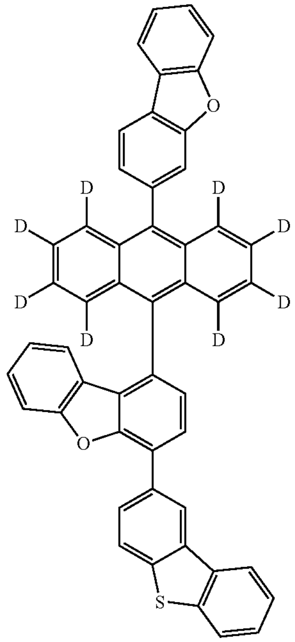
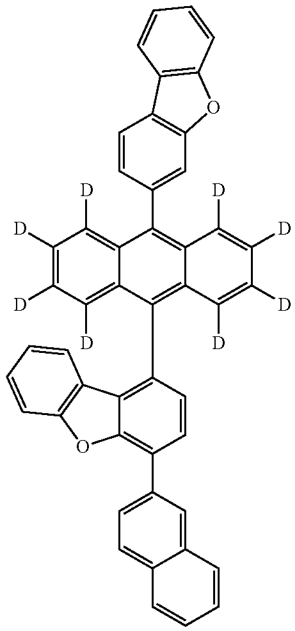

-continued
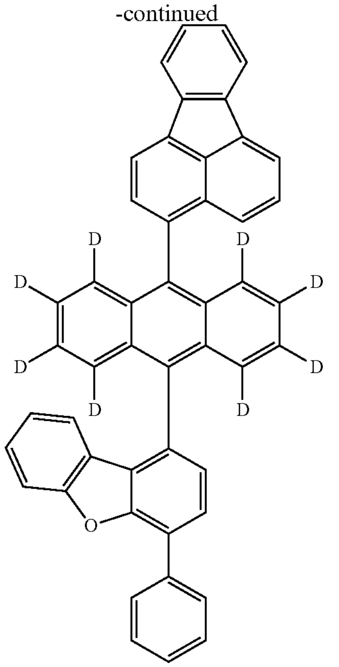
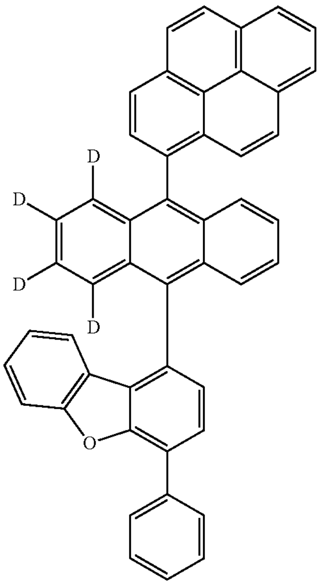
-continued
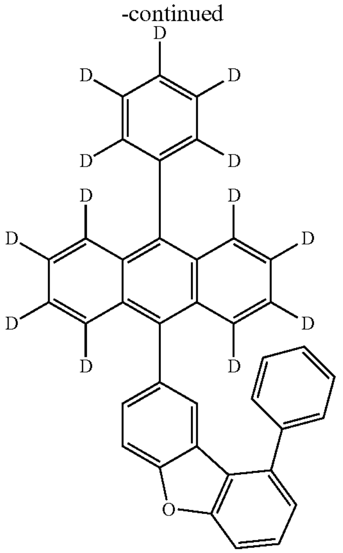
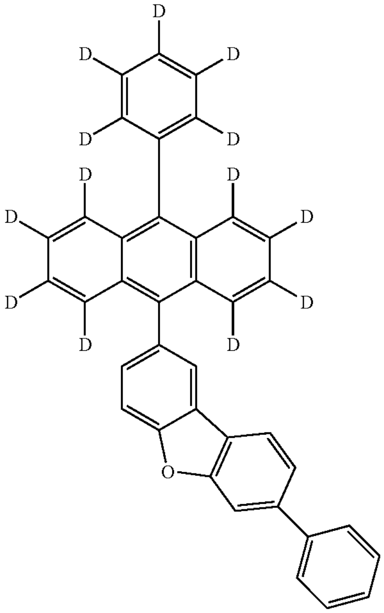
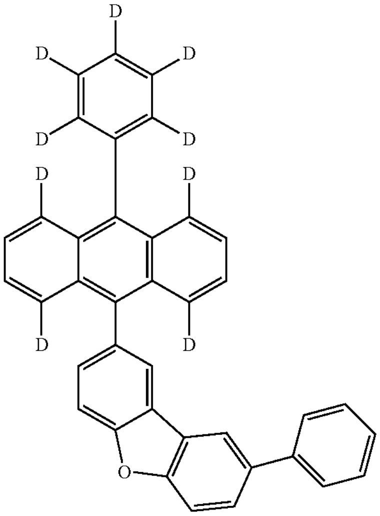

-continued
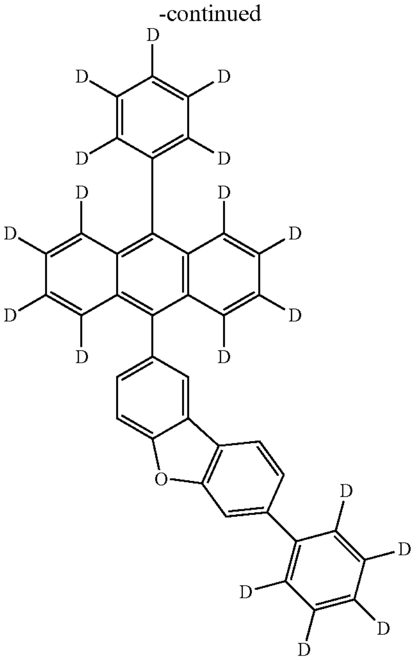
-continued
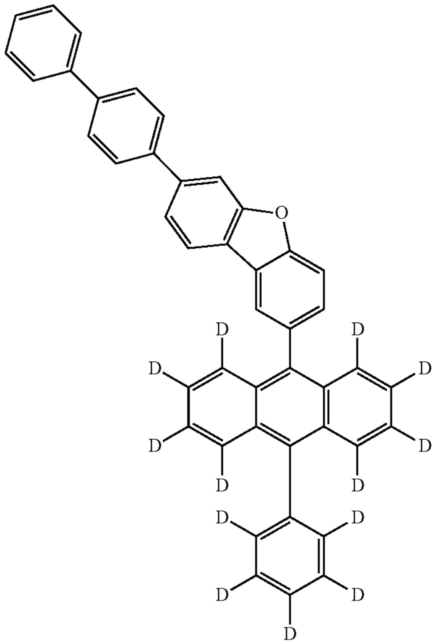
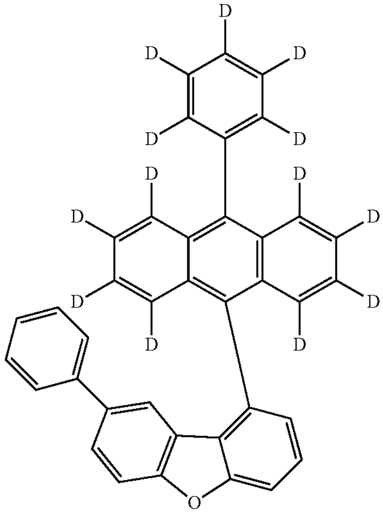
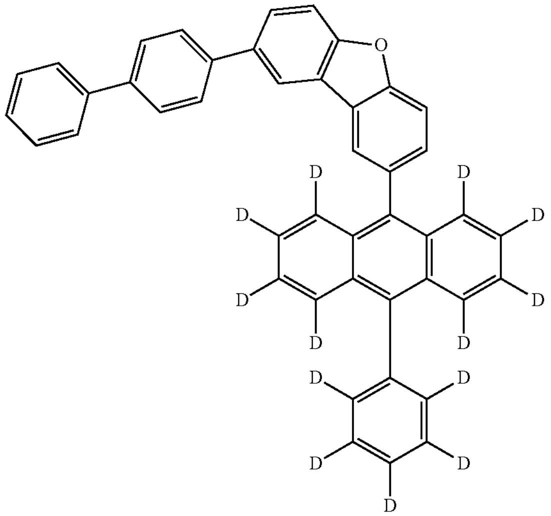
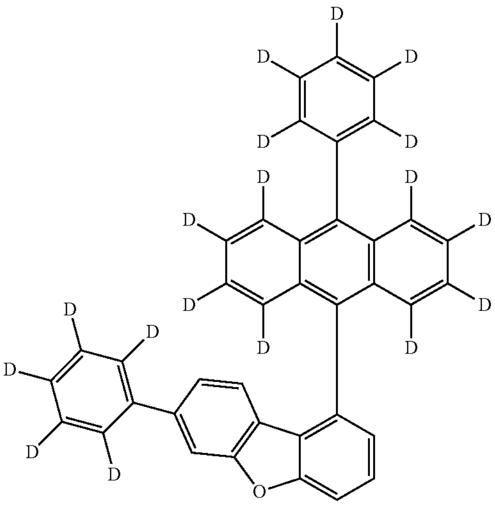

-continued
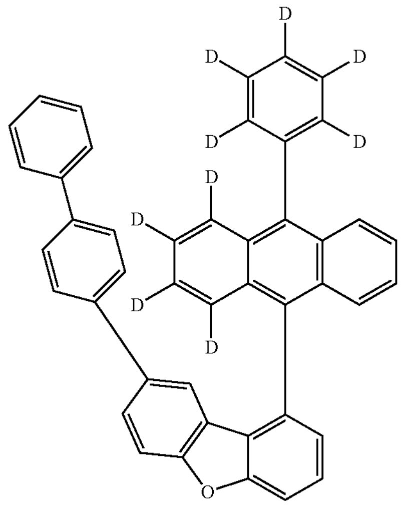
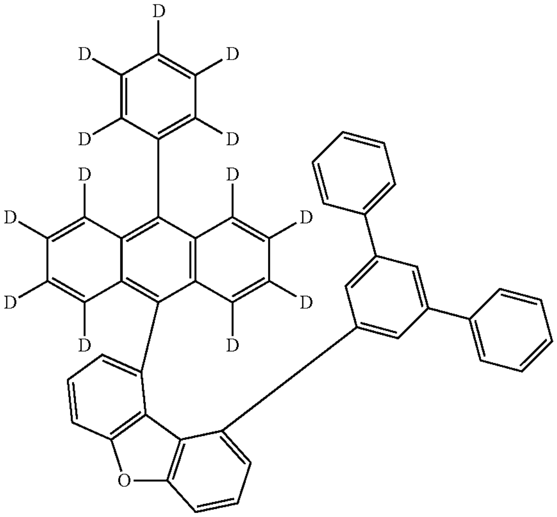
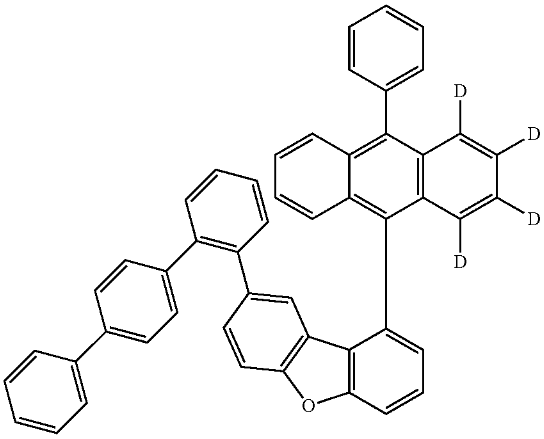
-continued
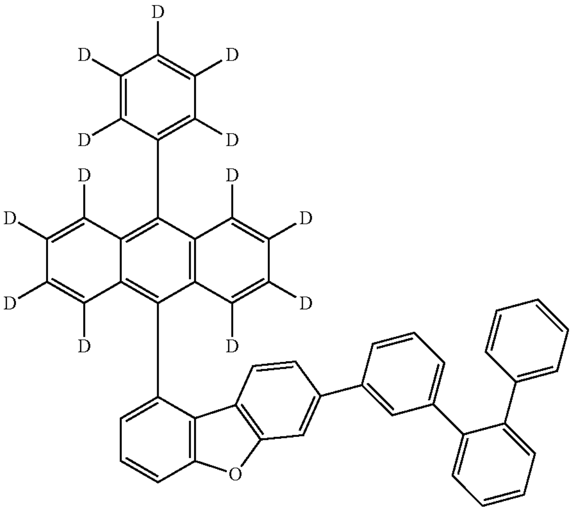
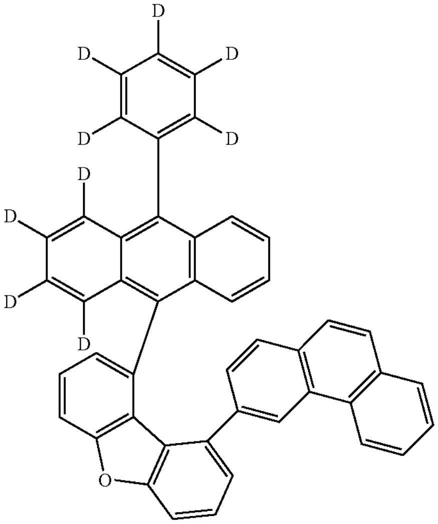
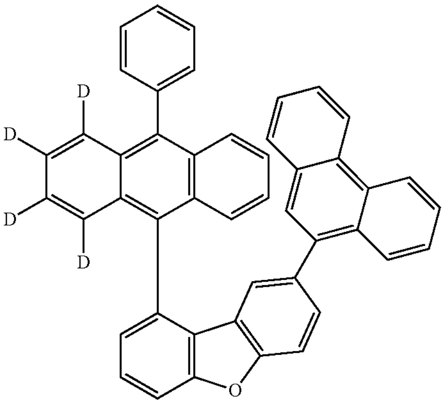

-continued
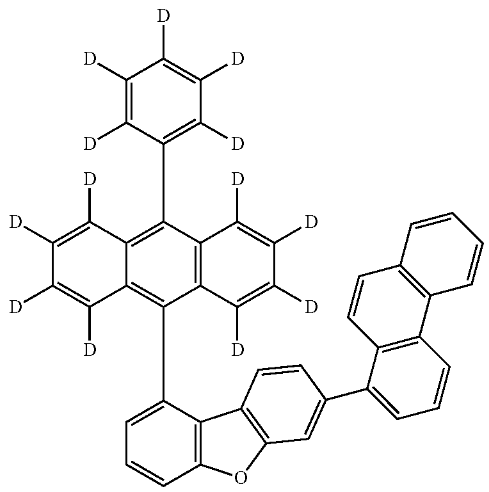
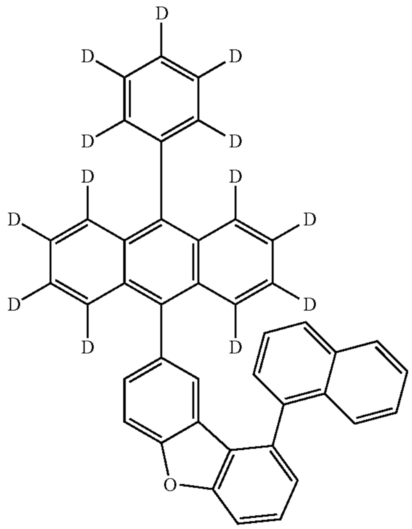
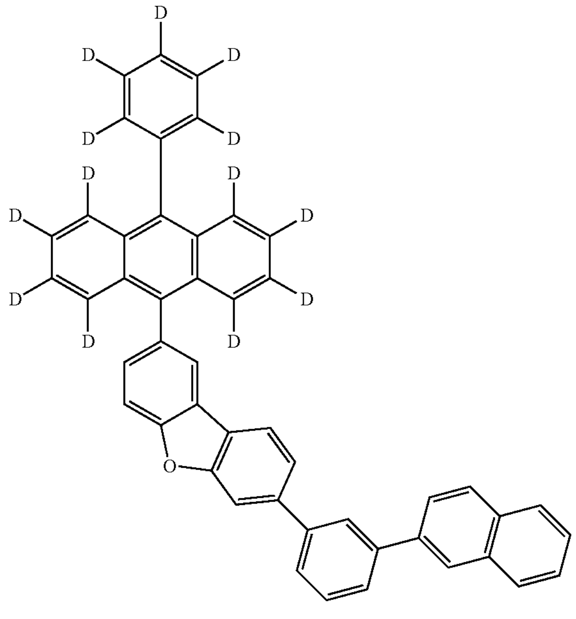
-continued
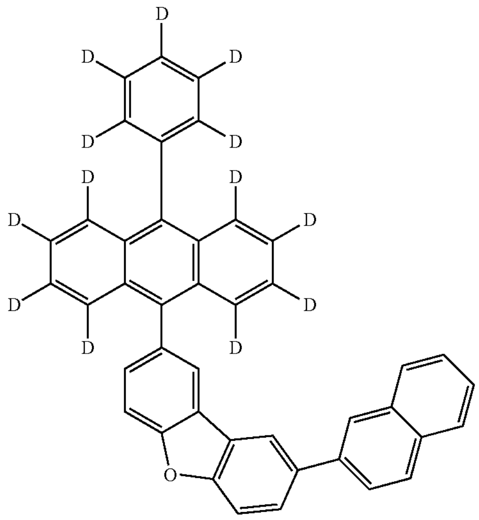
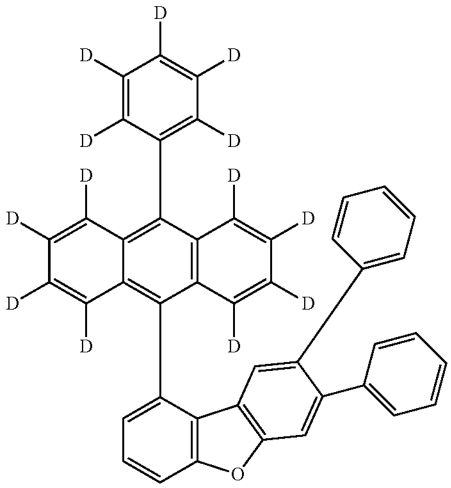
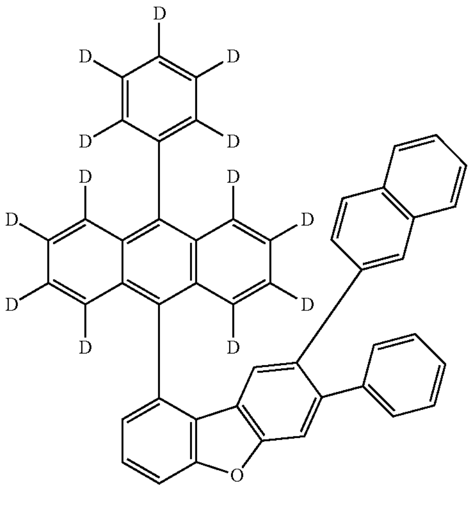

-continued
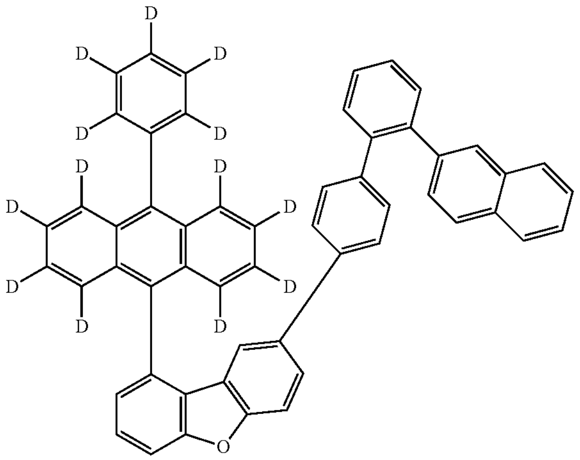
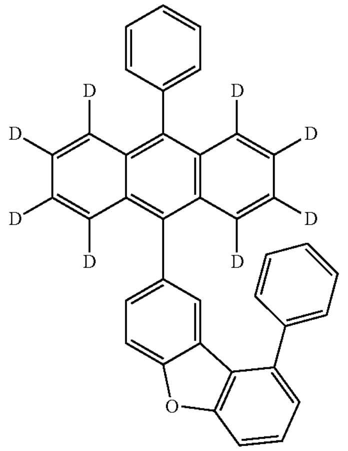
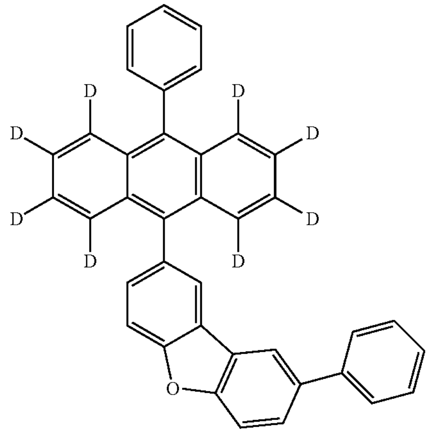
-continued
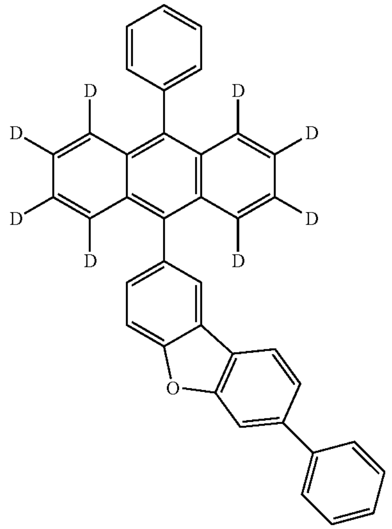
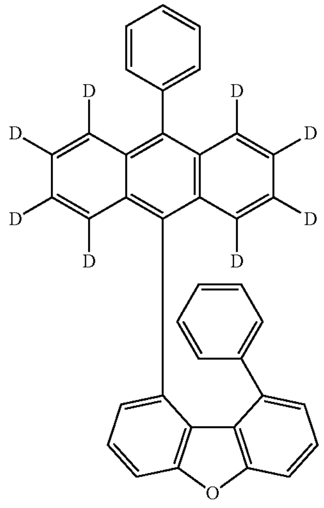
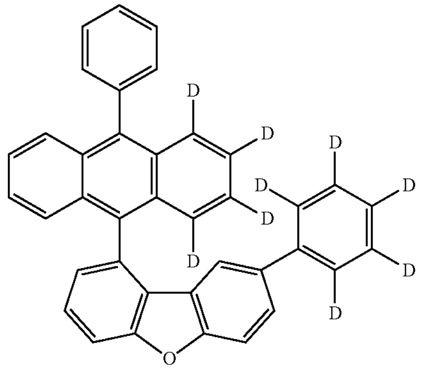

-continued
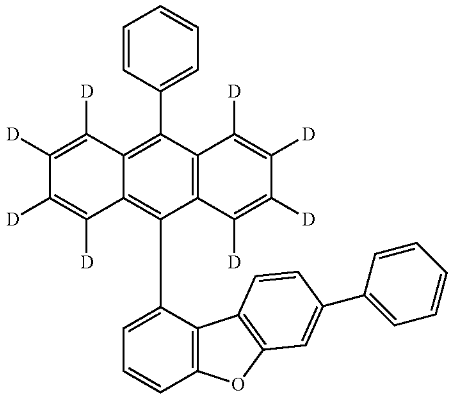
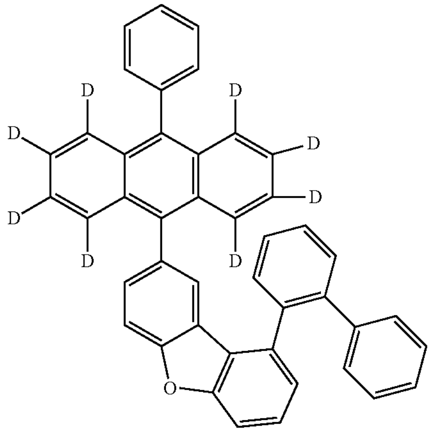
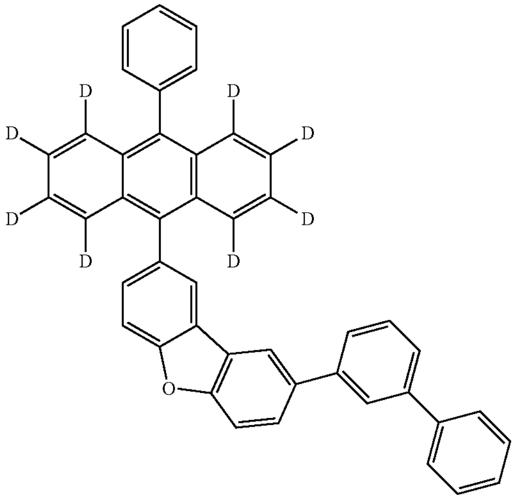
-continued
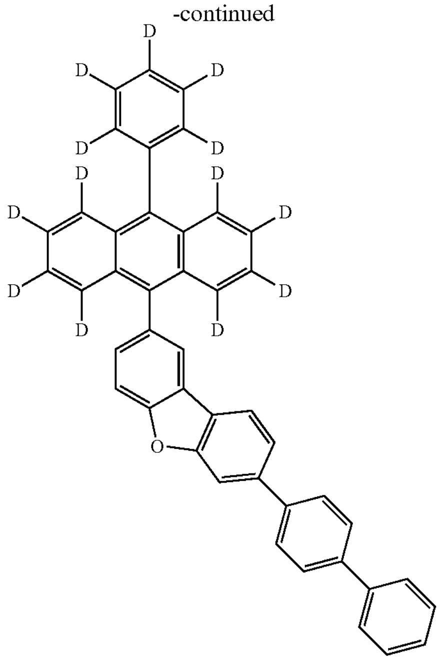
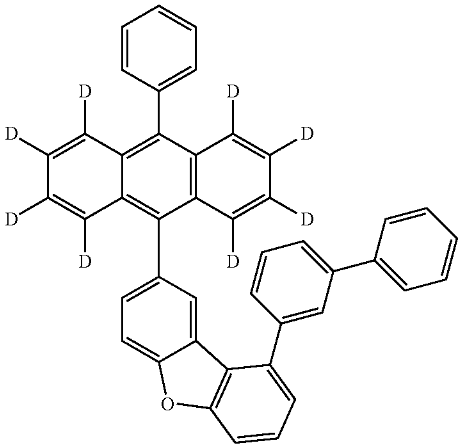
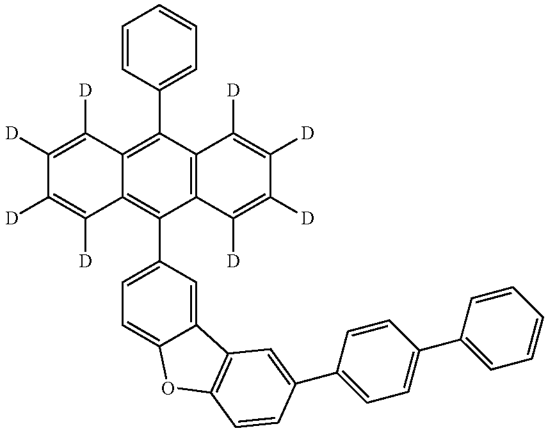

-continued
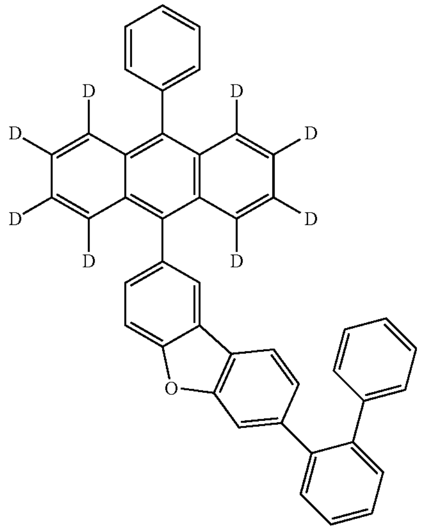
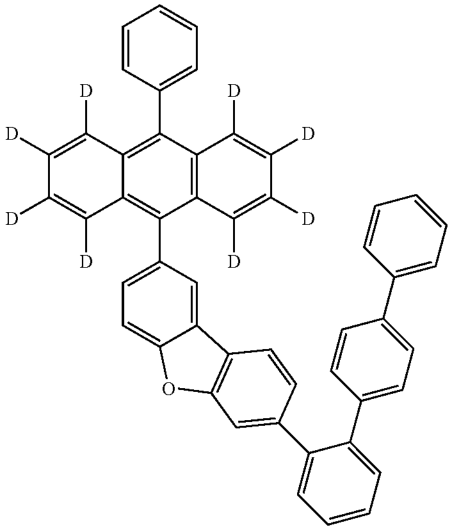
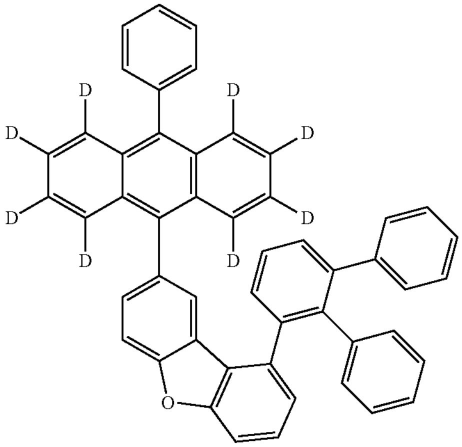
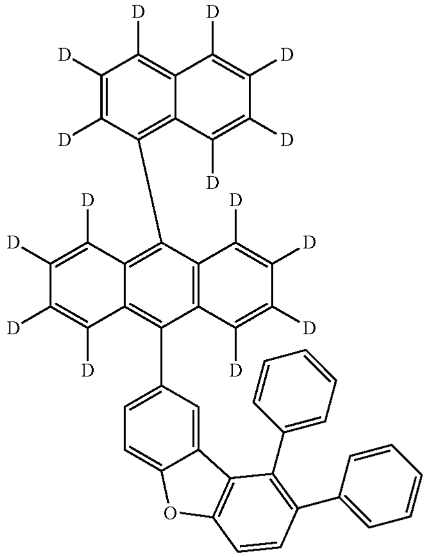
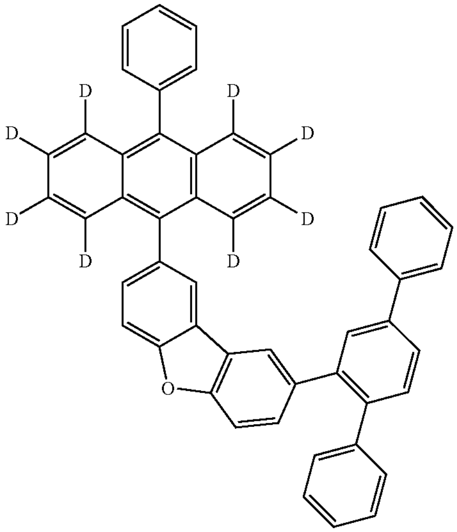
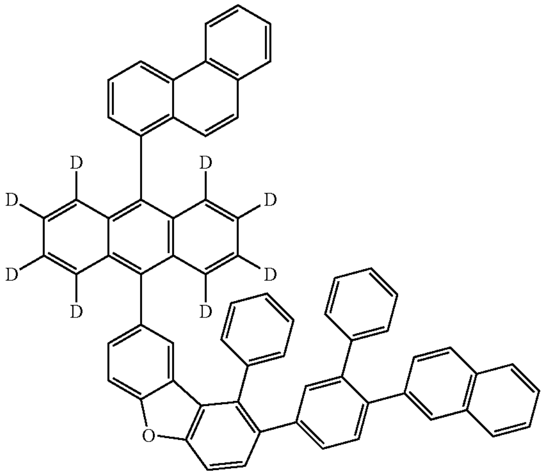
-continued -continued
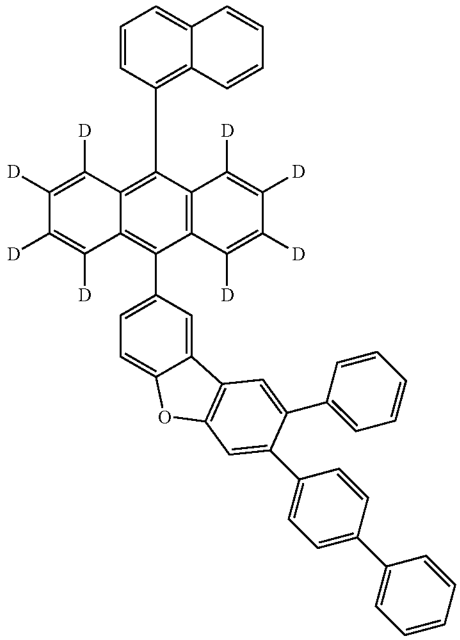
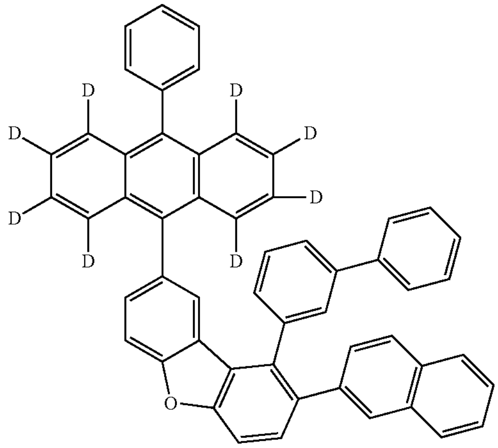
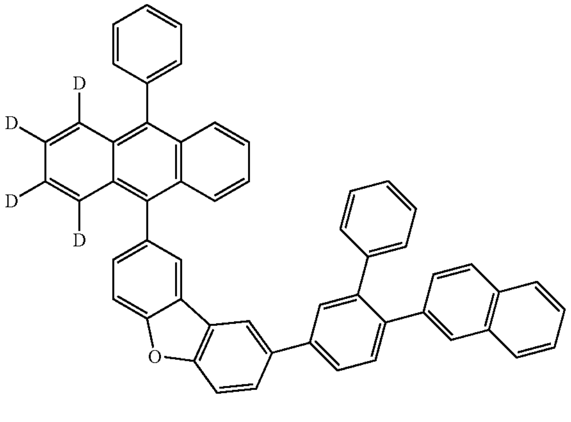
-continued
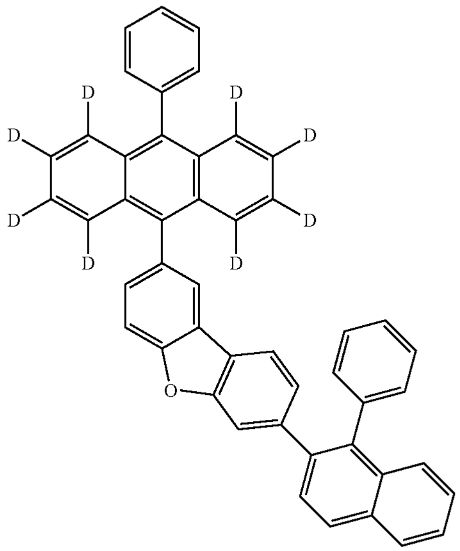
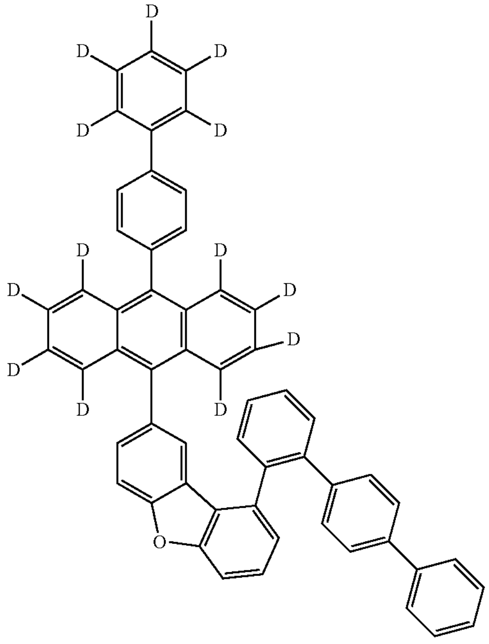
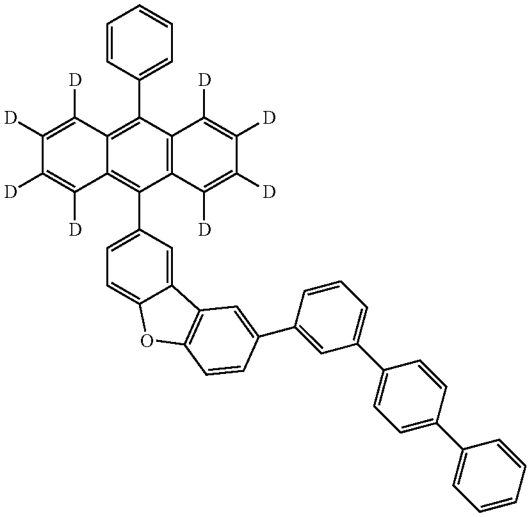

-continued
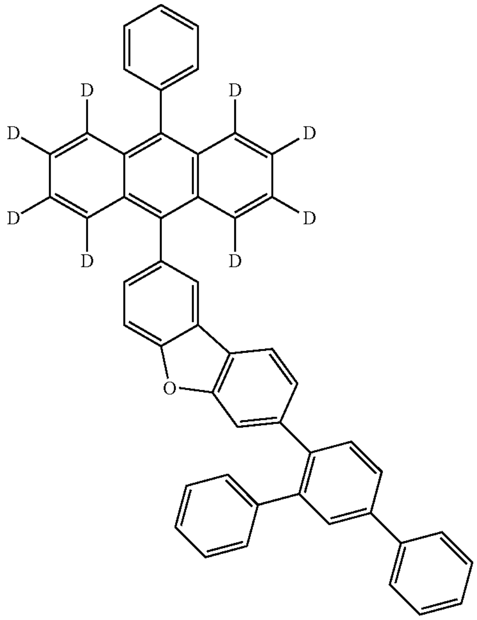
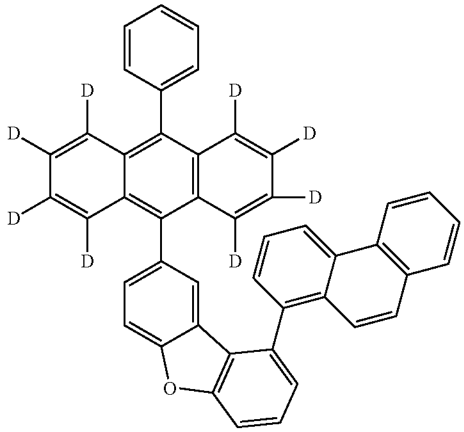
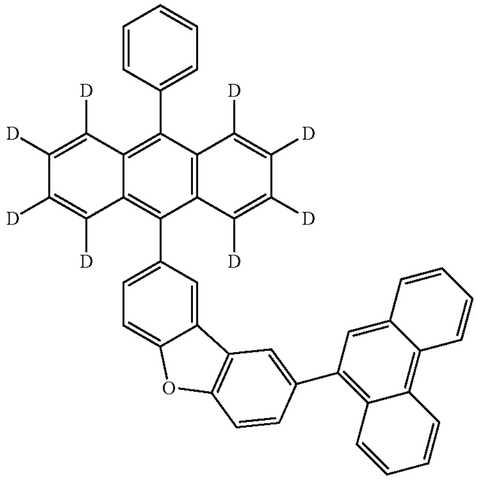
-continued
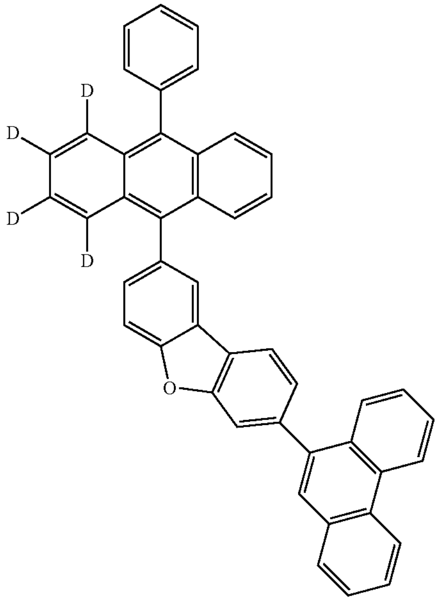
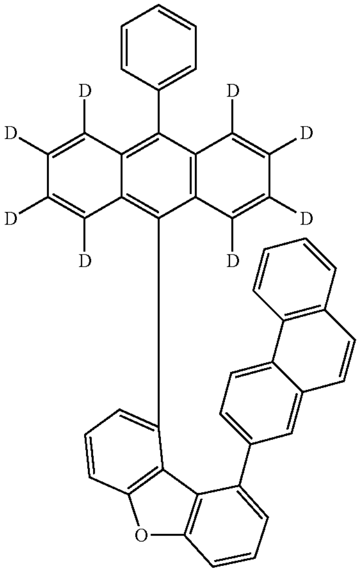
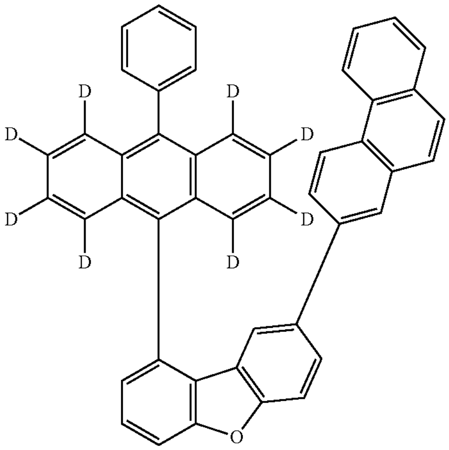

-continued
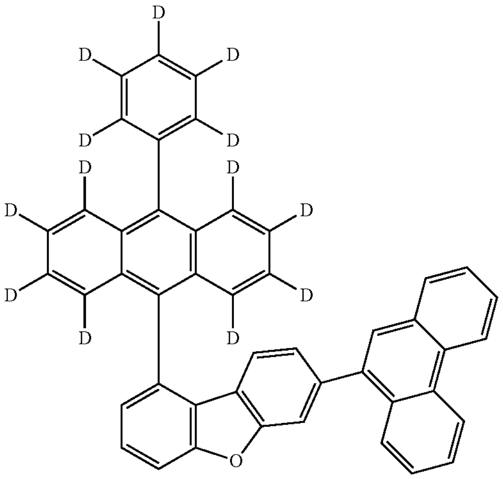
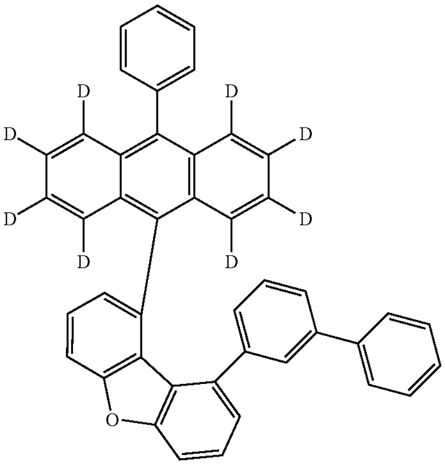
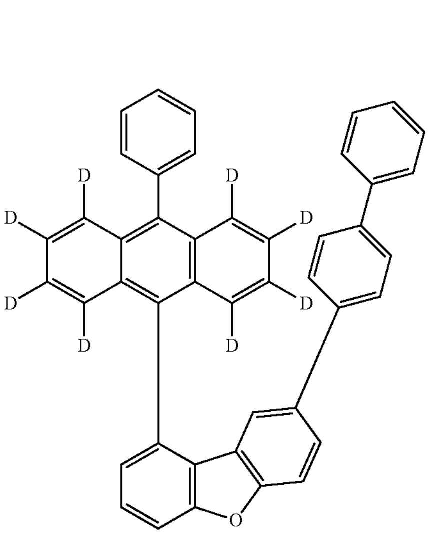
-continued
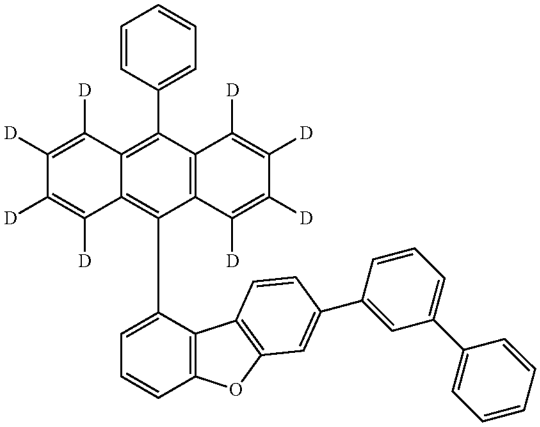
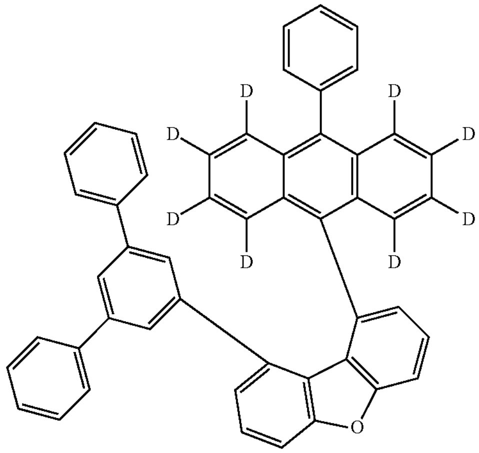
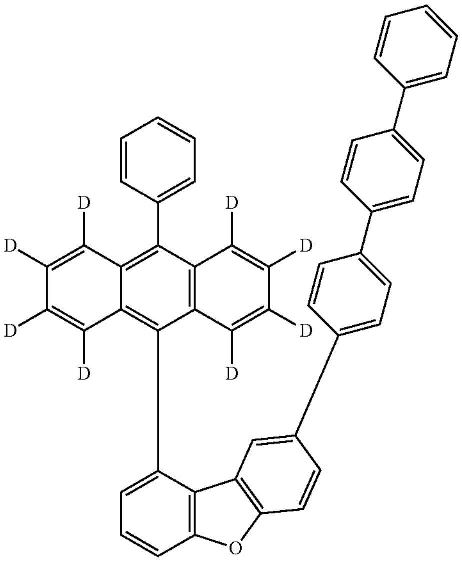

-continued
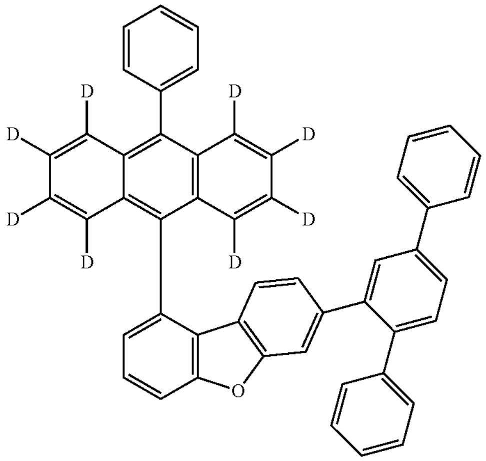
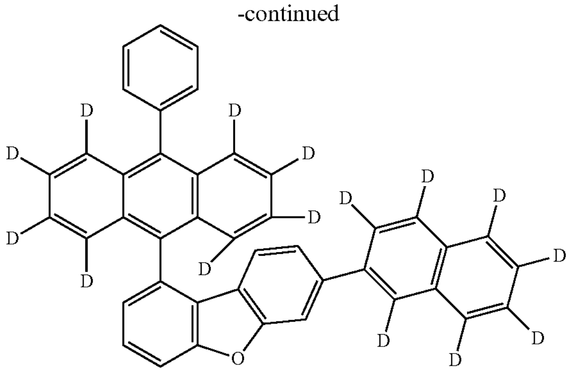
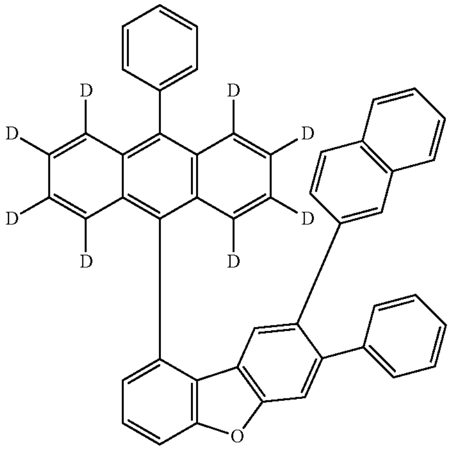
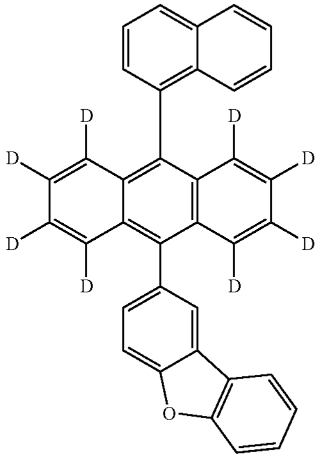
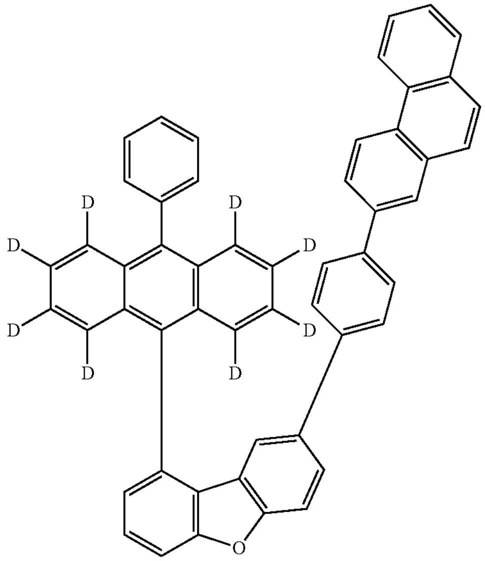
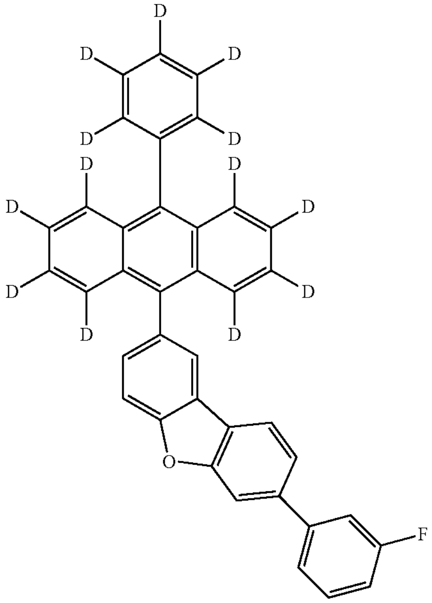
-continued -continued
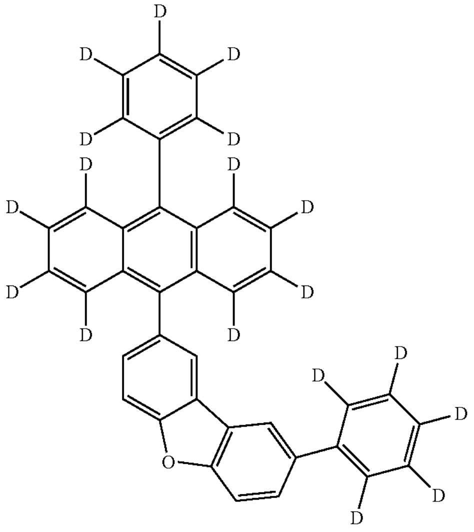
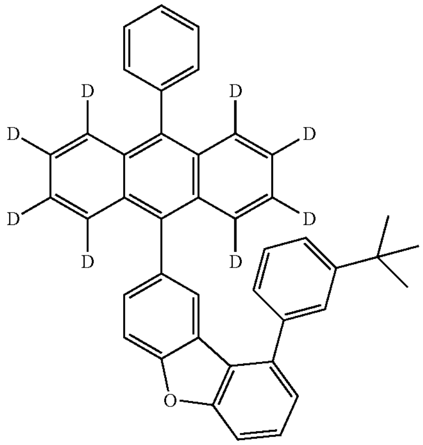
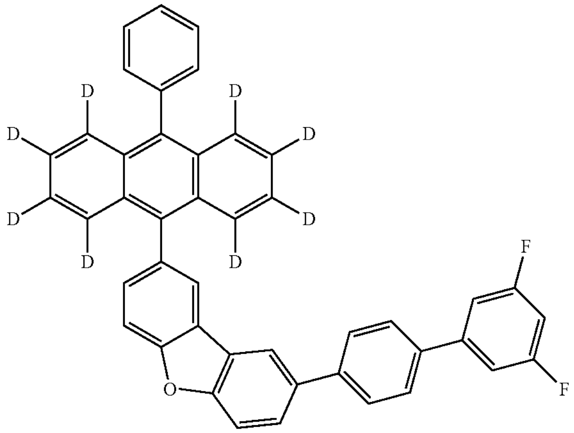
-continued
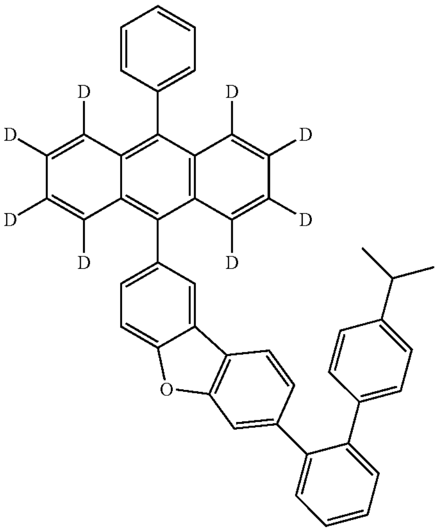
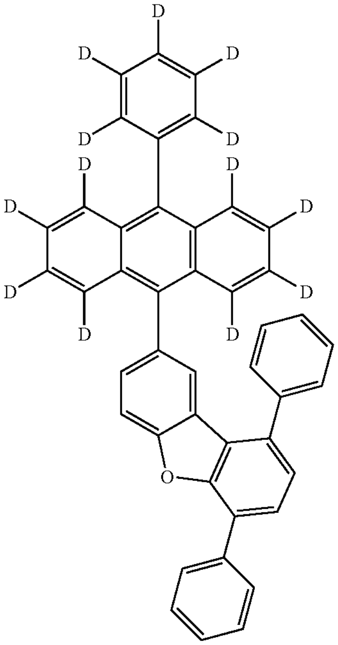

-continued
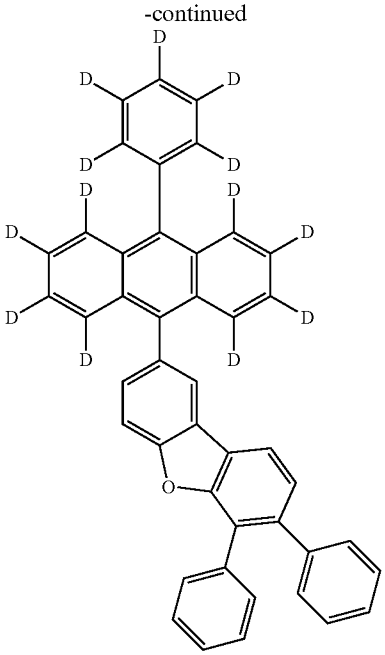
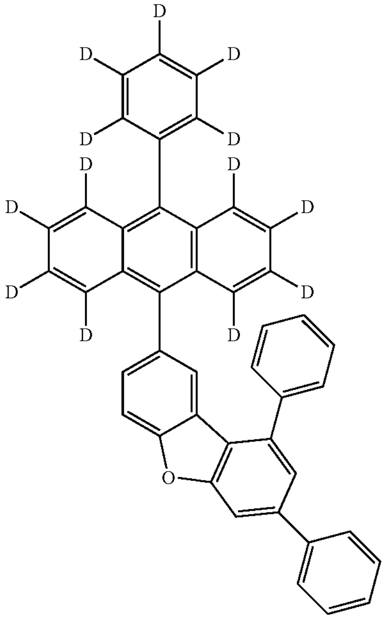
-continued
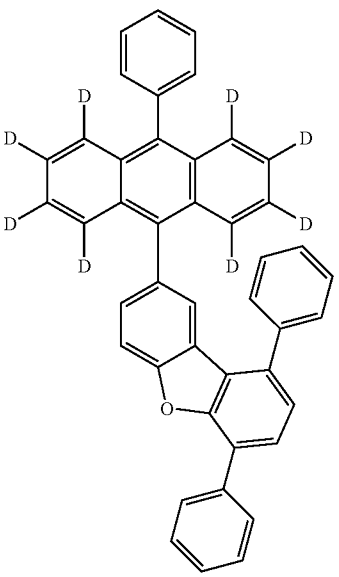
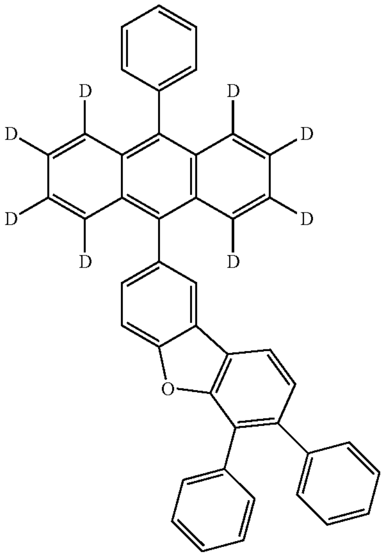
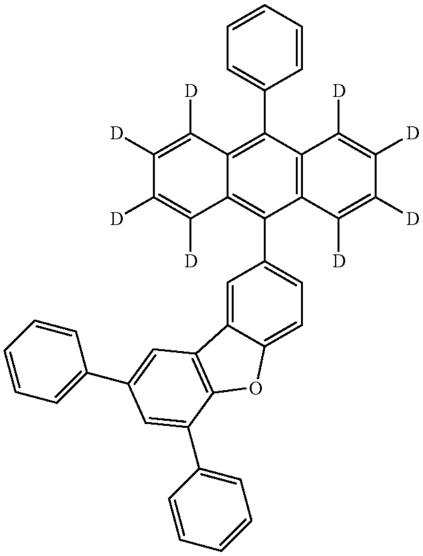

-continued
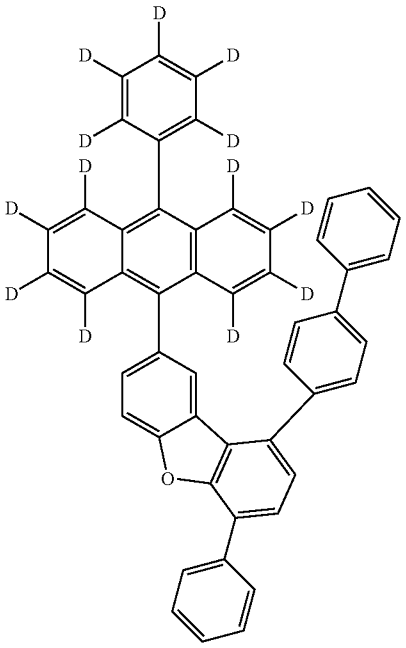
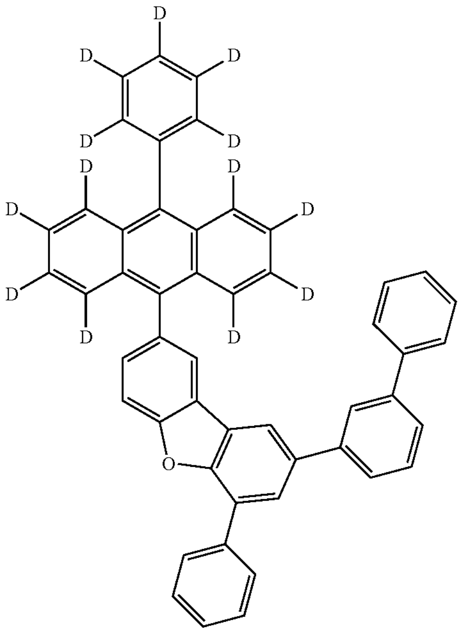
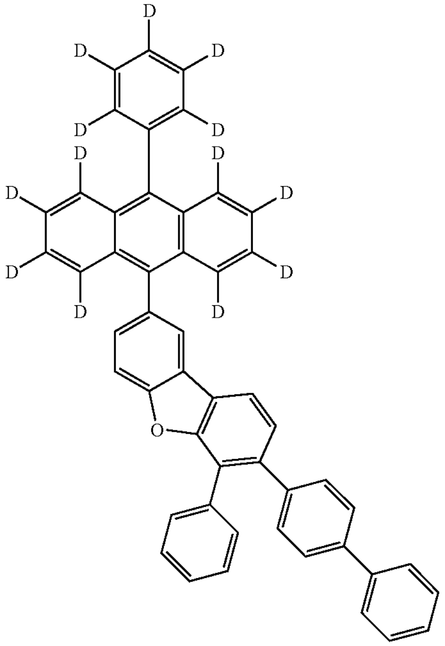
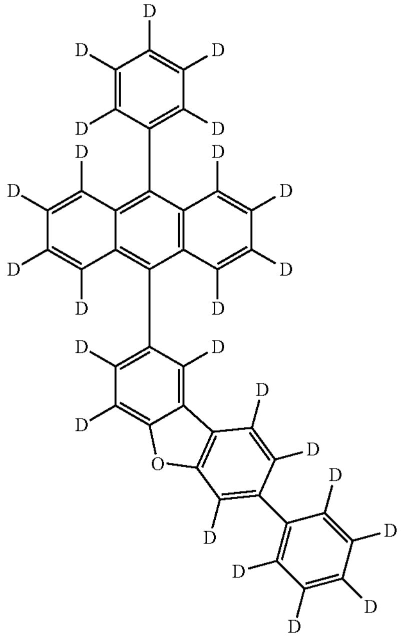
-continued

-continued
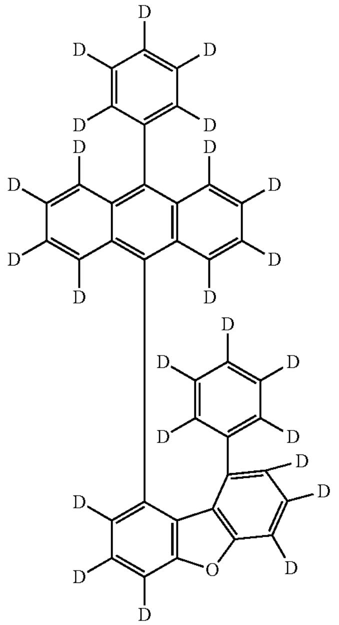
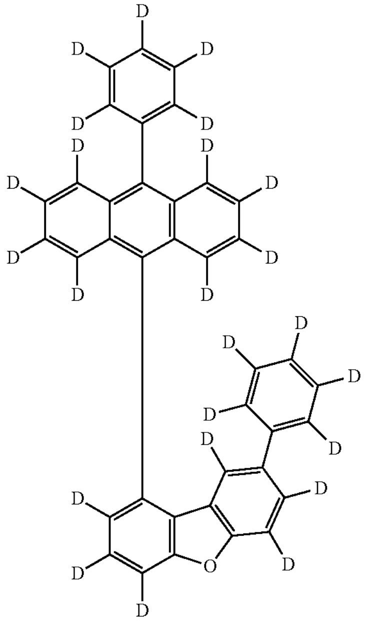
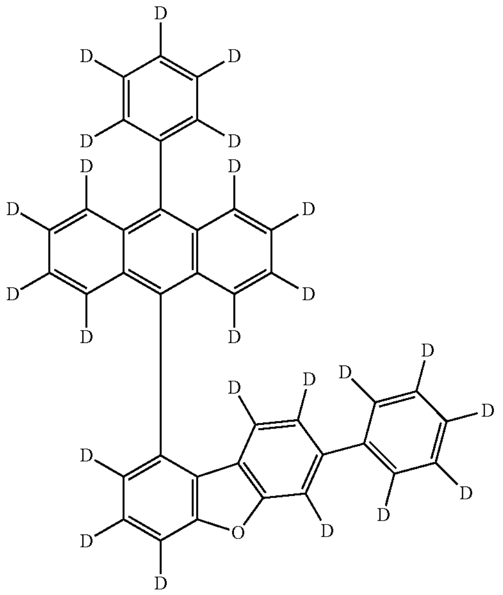
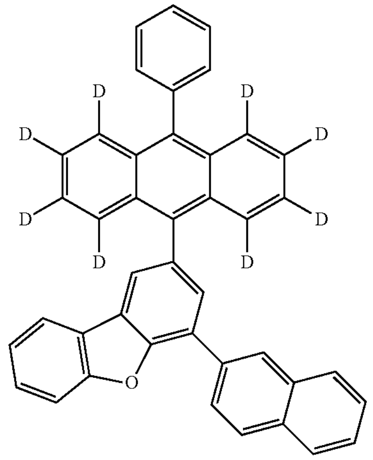
-continued
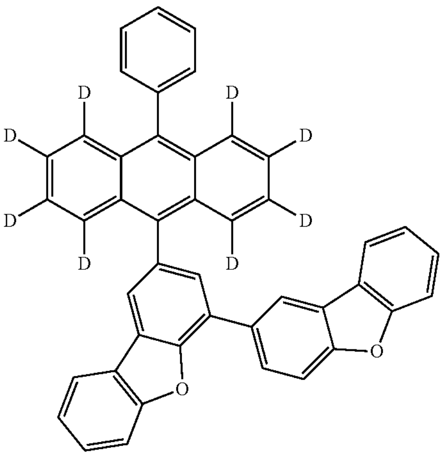

-continued
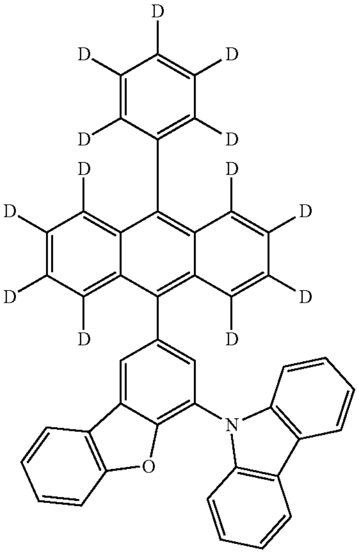
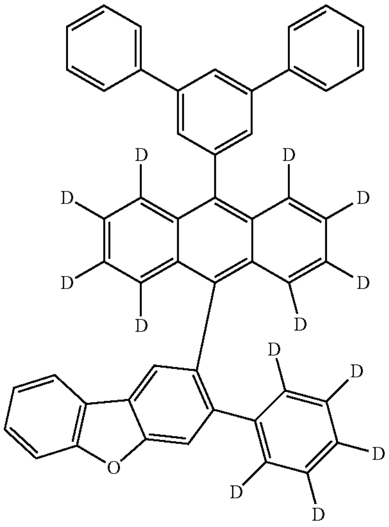
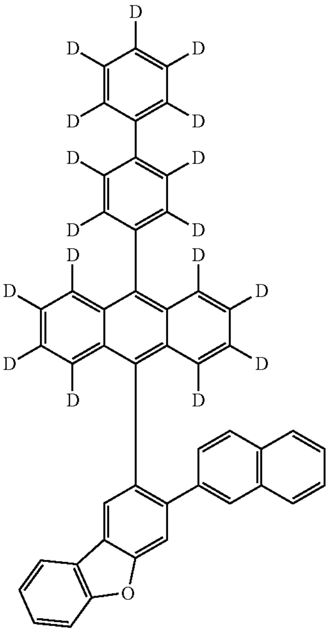
-continued
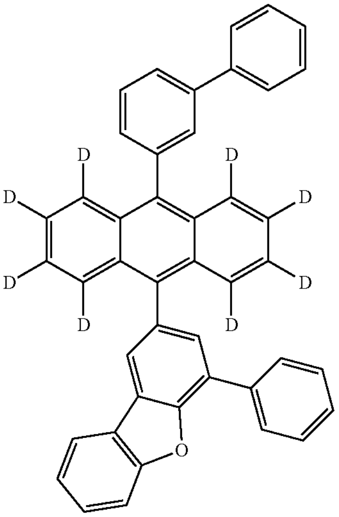
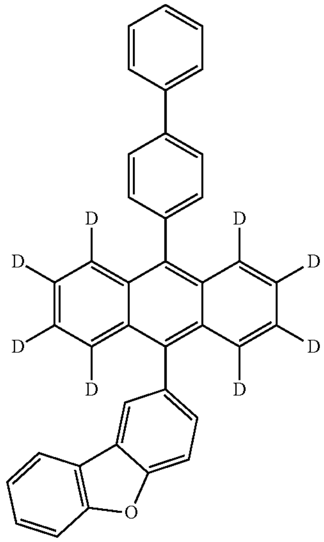
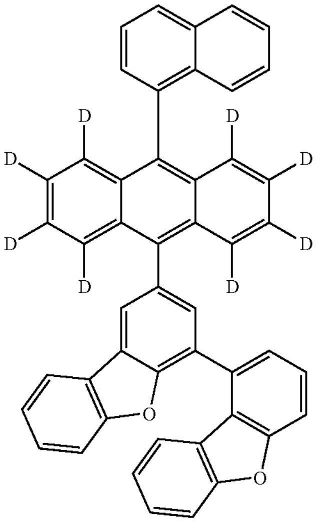 [SMILES: [2H]c1c([2H])c([2H])c2c(-c3cccc4ccccc34)c3c([2H])c([2H])c([2H])c([2H])c3c(-c3cc(-c4cccc5oc6ccccc6c45)c4oc5ccccc5c4c3)c2c1[2H]]

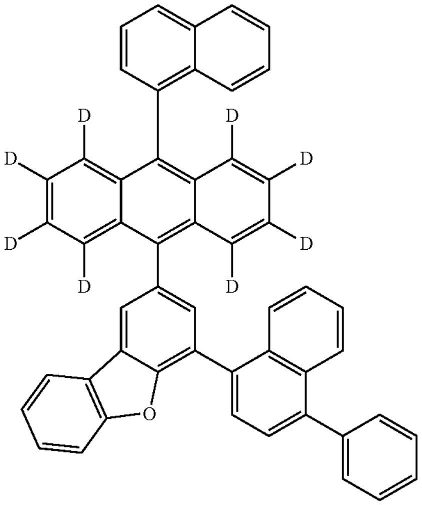
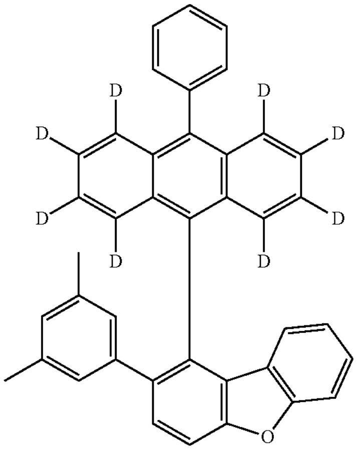
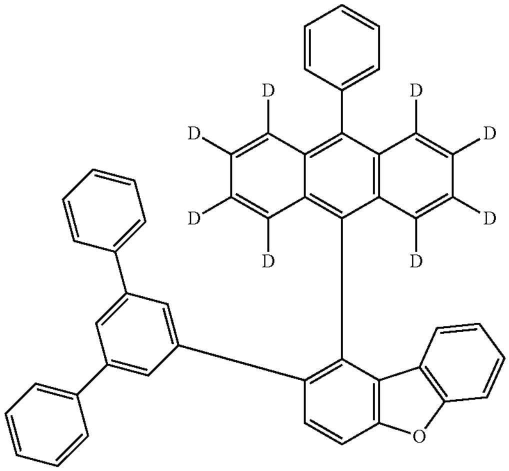
-continued
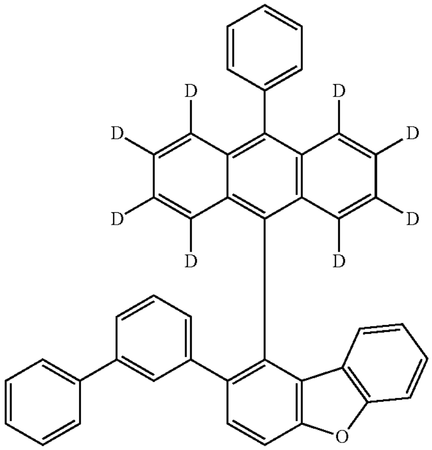
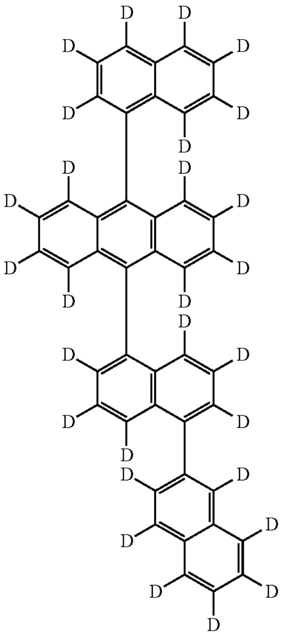
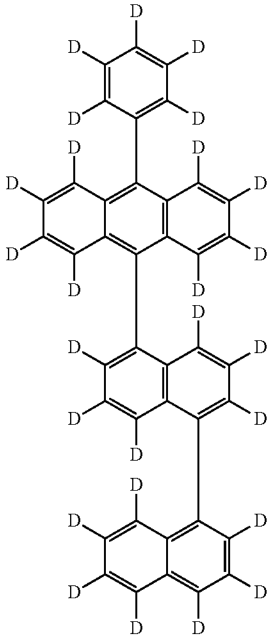

-continued
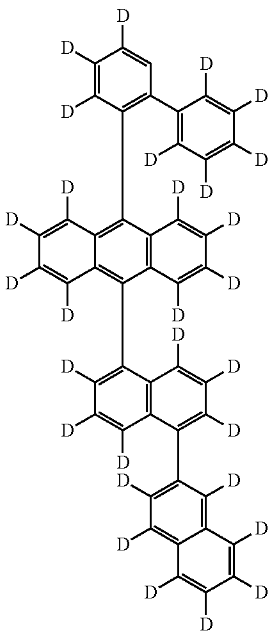
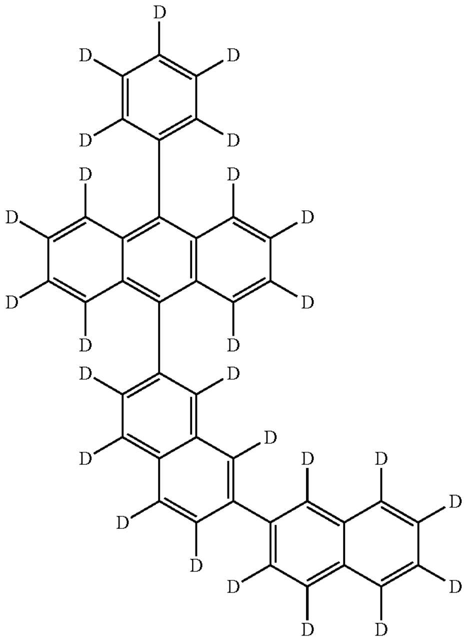
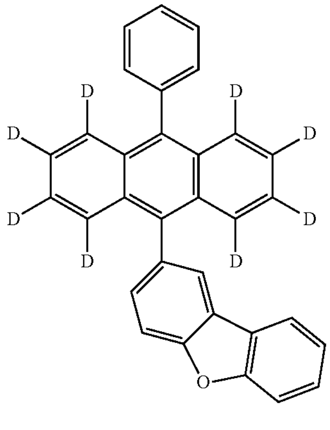
-continued
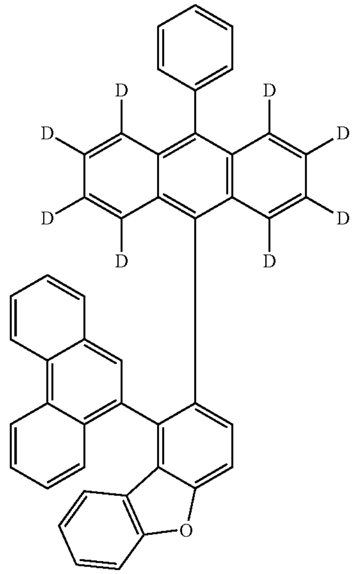
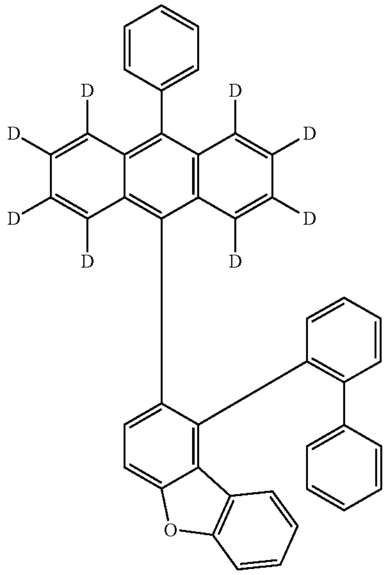
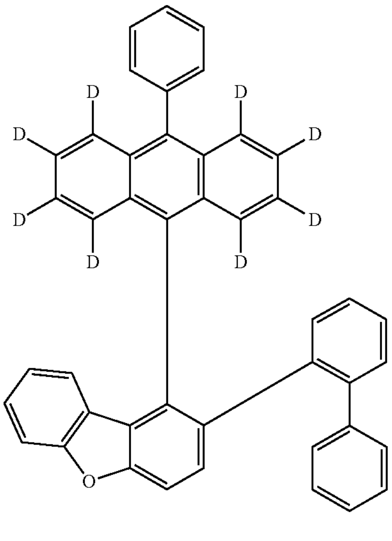

-continued
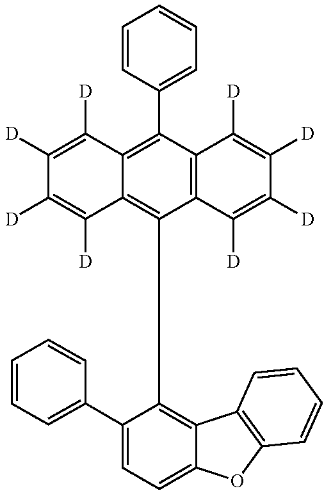
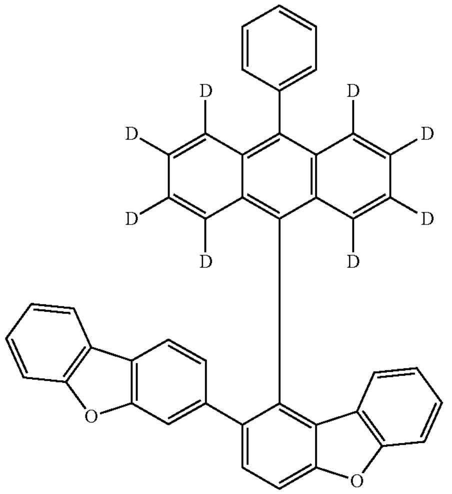
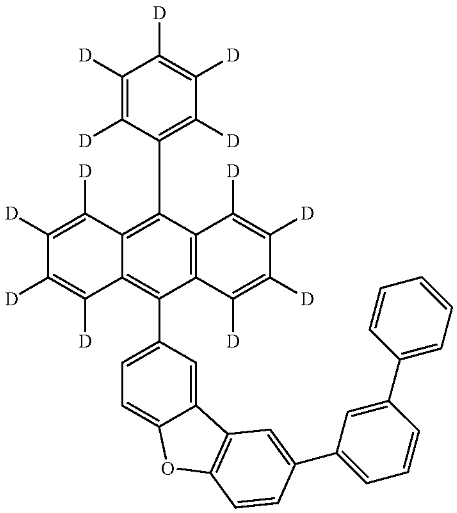
-continued
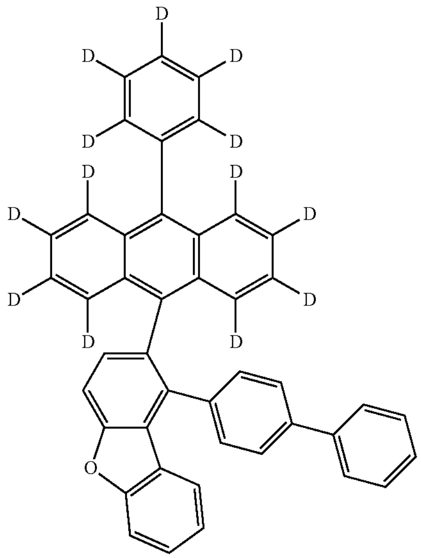
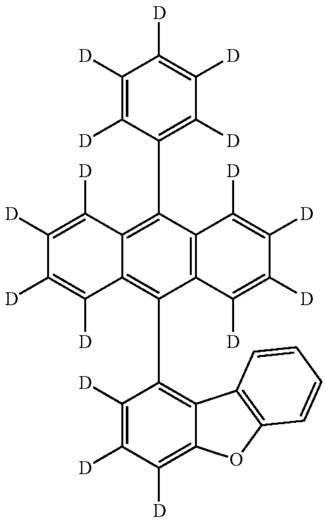
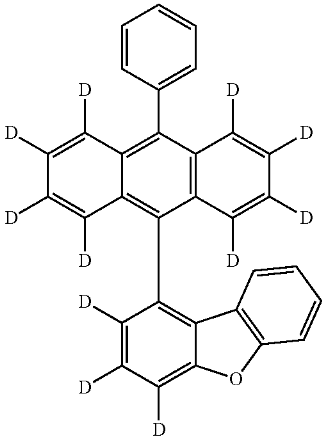

-continued
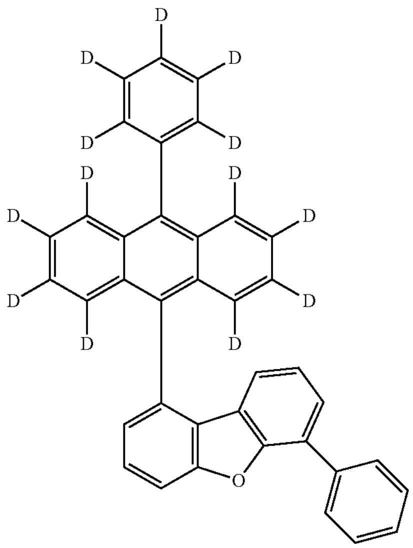
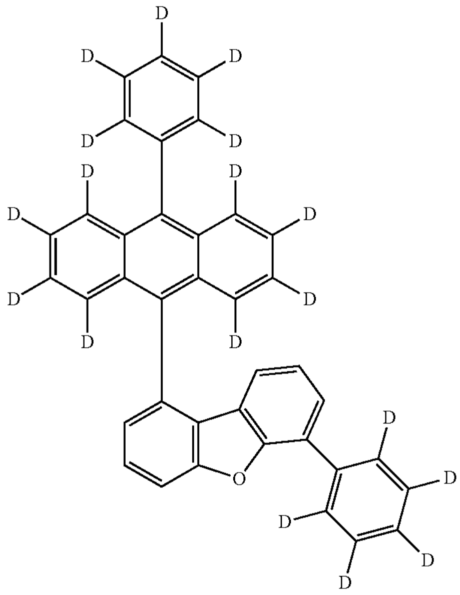
-continued
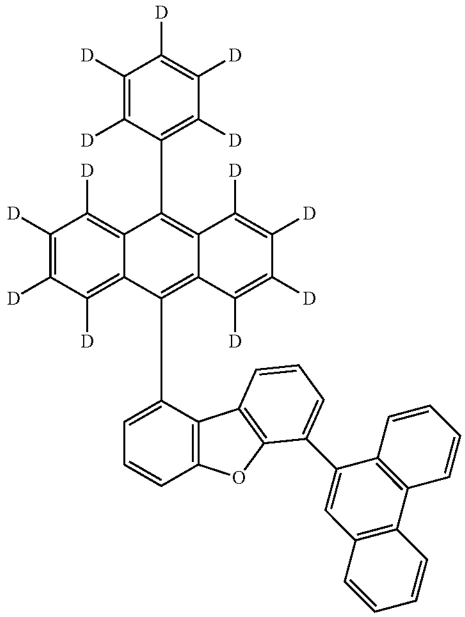 [SMILES: [2H]c1c([2H])c([2H])c(-c2c3c([2H])c([2H])c([2H])c([2H])c3c(-c3cccc4oc5c(-c6cc7ccccc7c7ccccc67)cccc5c34)c3c([2H])c([2H])c([2H])c([2H])c23)c([2H])c1[2H]]
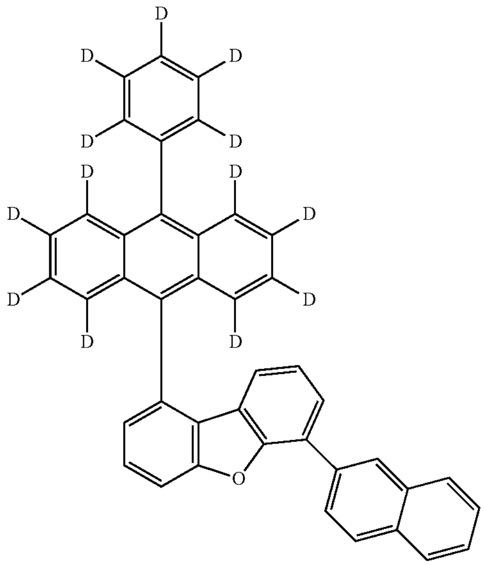
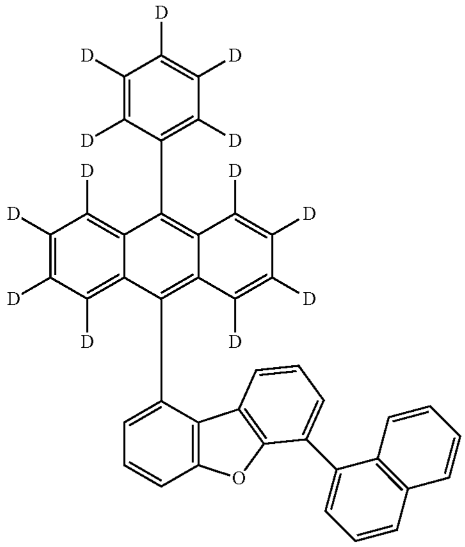

-continued
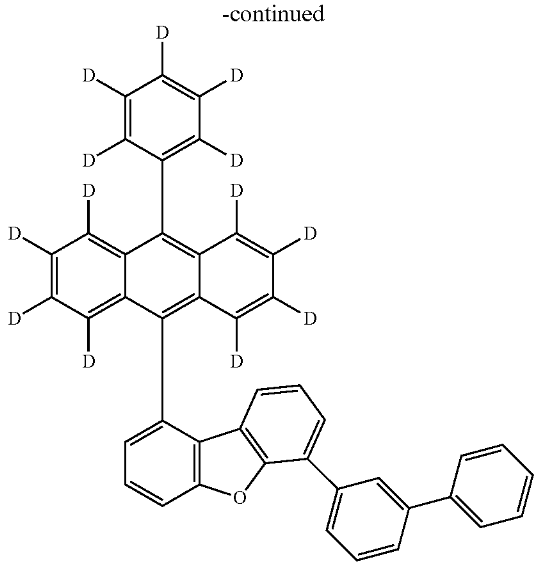
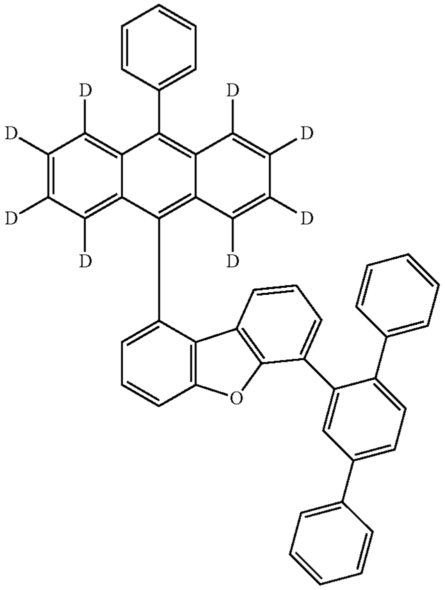
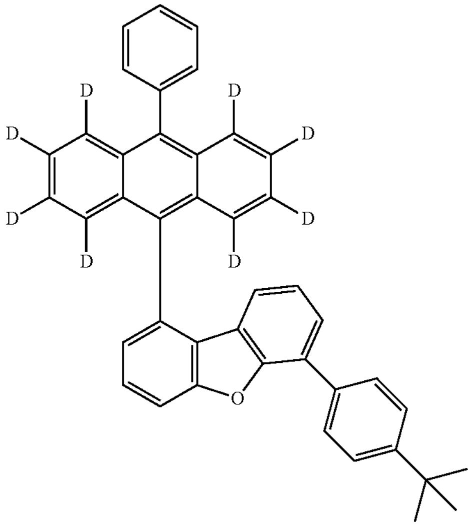
-continued
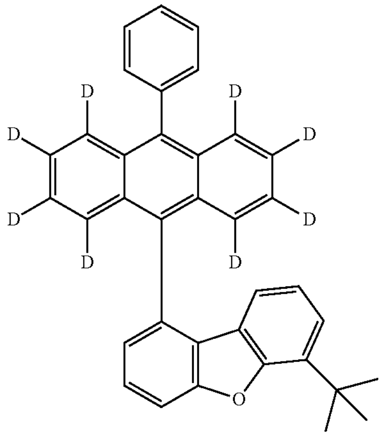
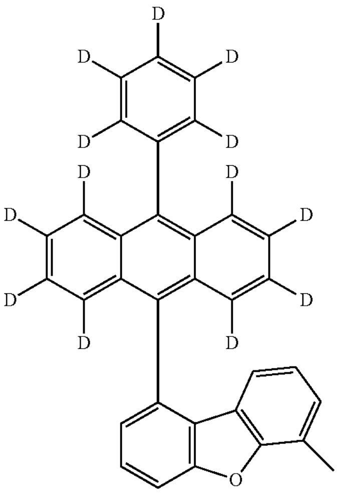
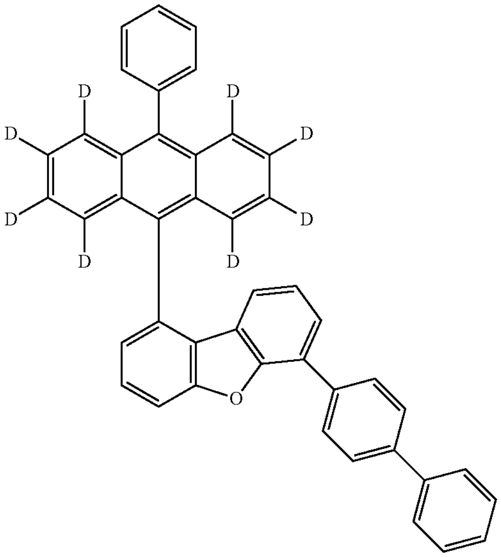

-continued
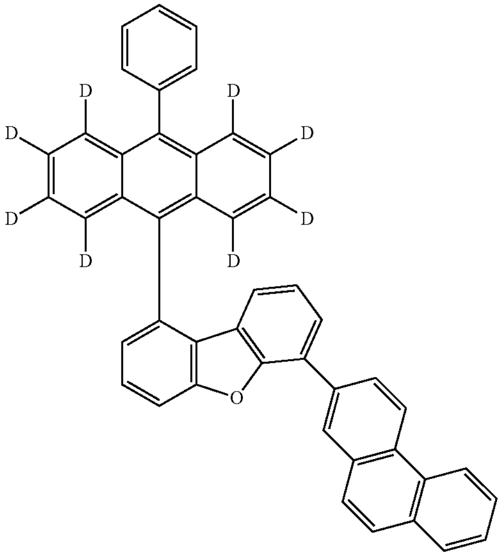
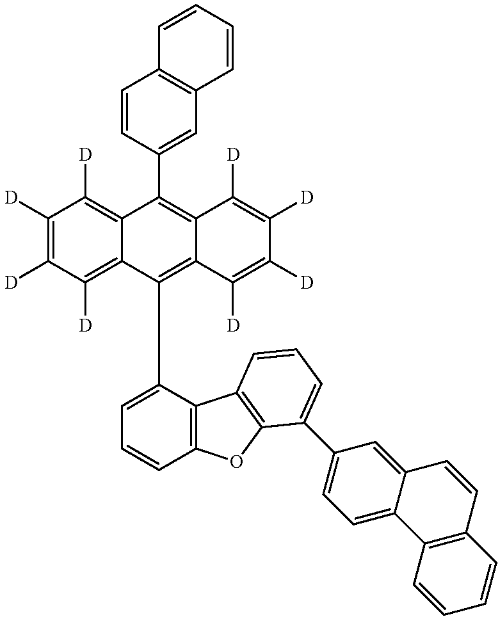
-continued
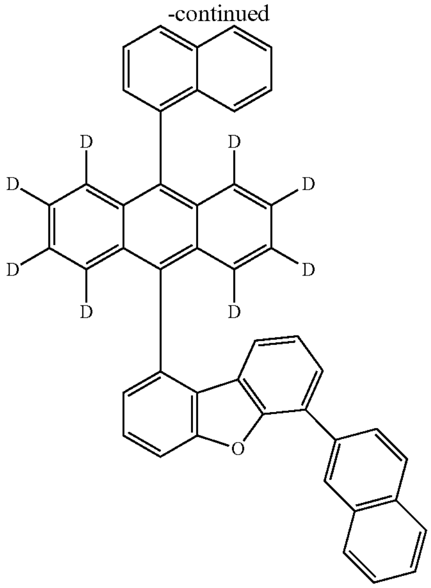
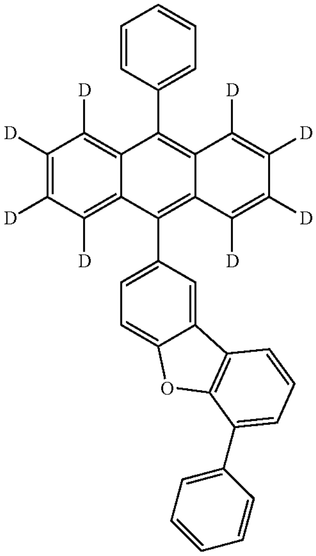

-continued
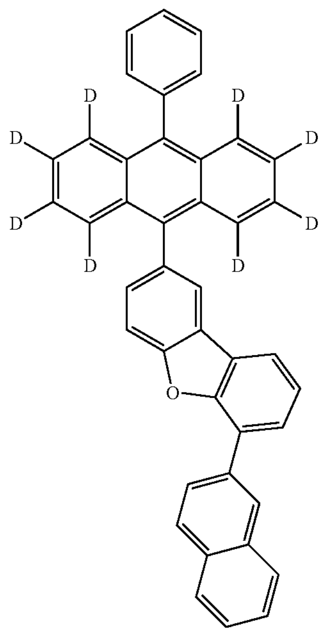
-continued
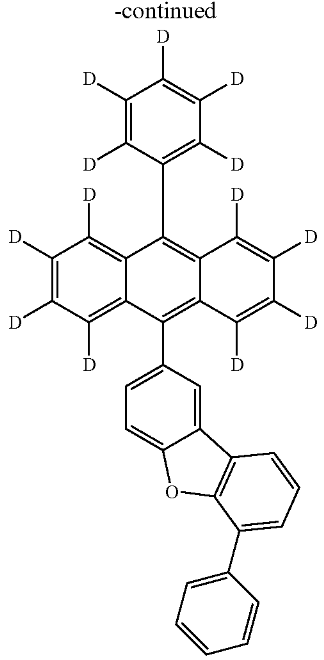
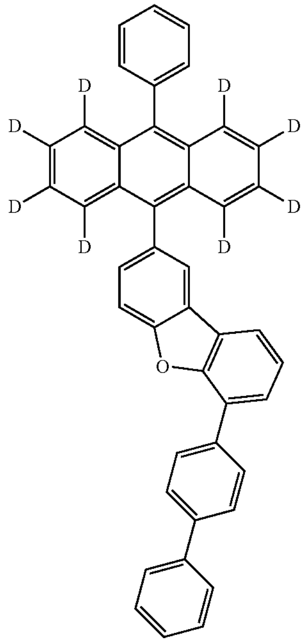
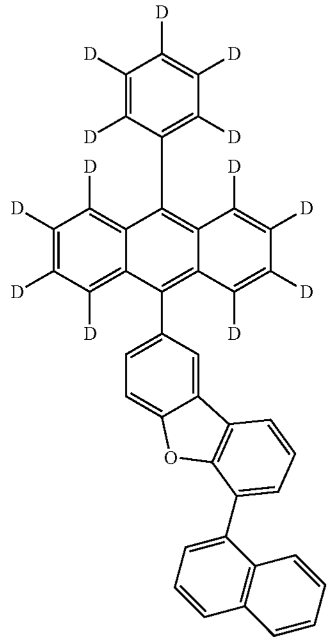

-continued
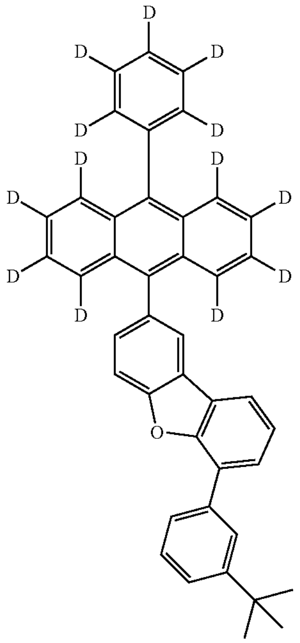
-continued
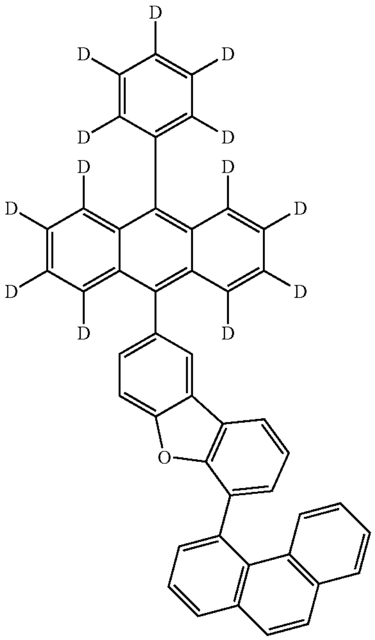
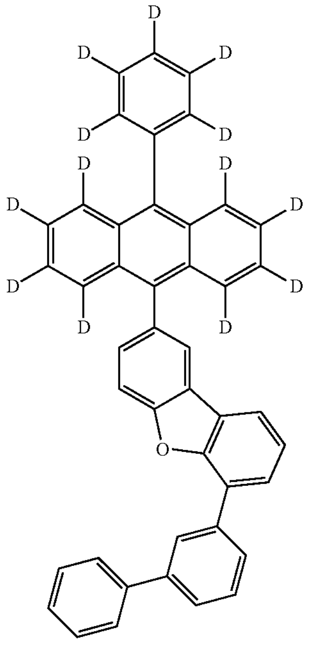
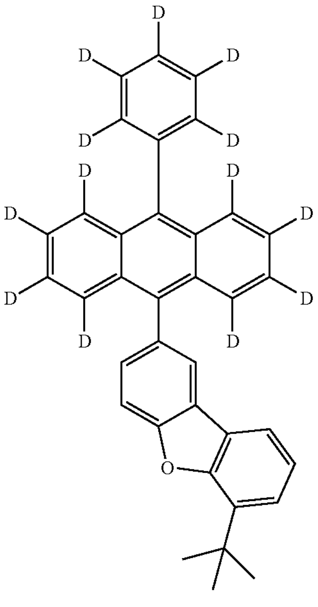

-continued
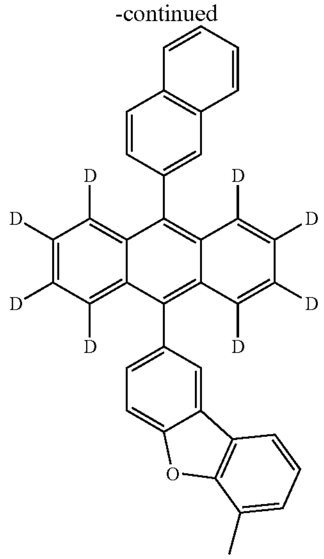
-continued
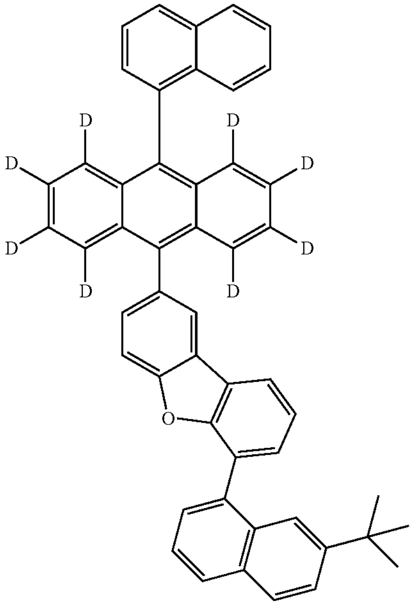
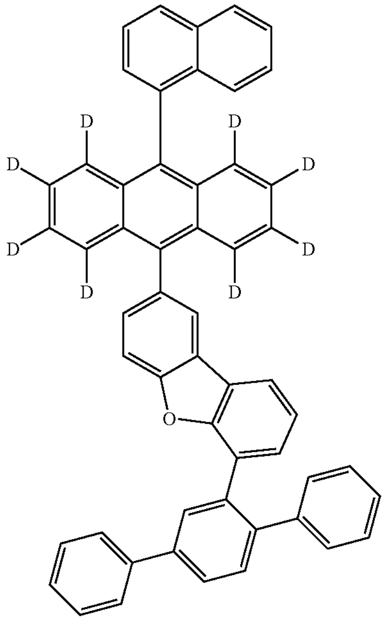
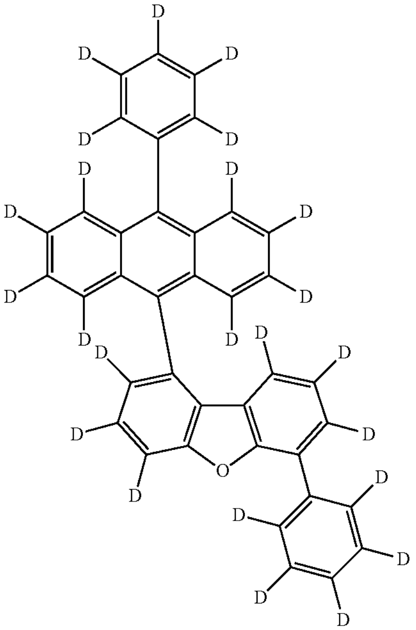

-continued
-continued
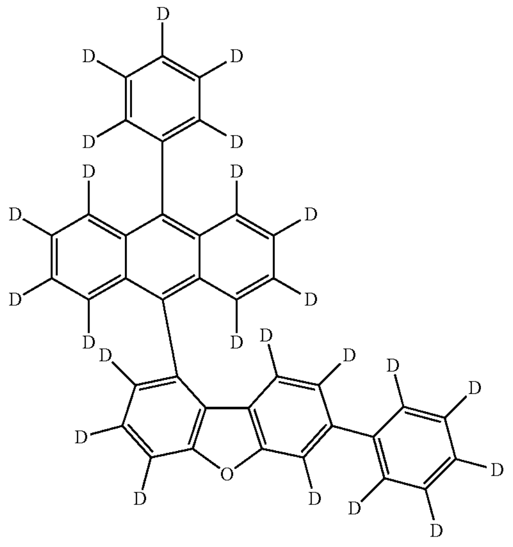
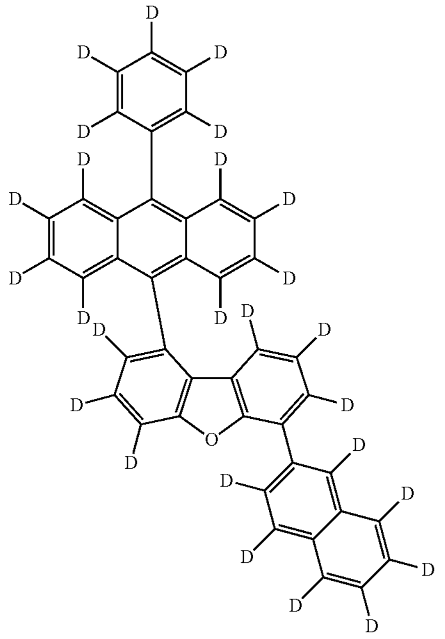
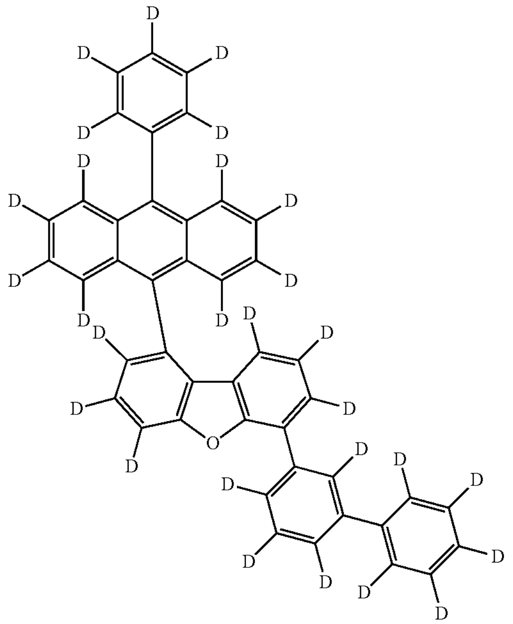
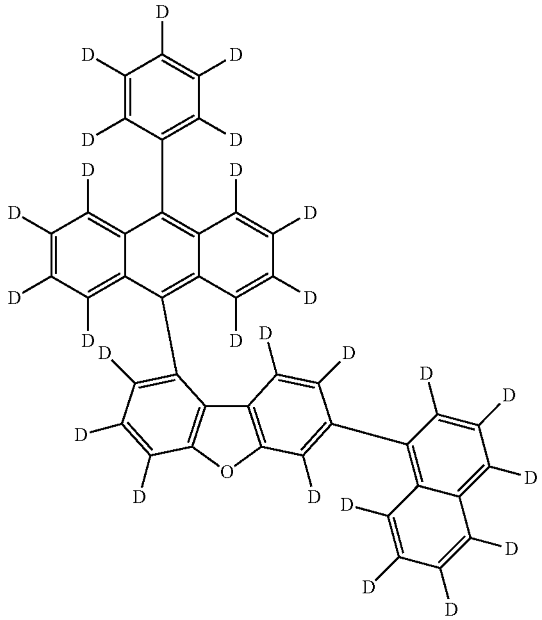

-continued
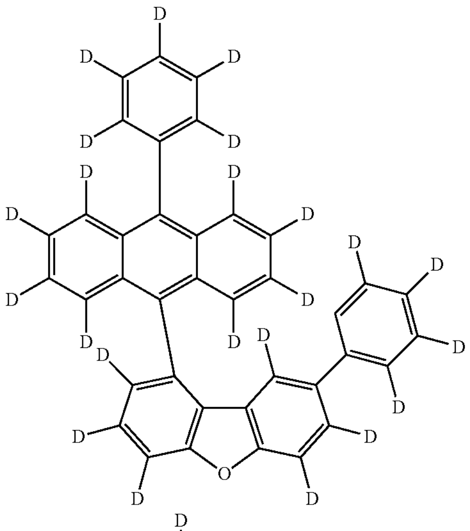
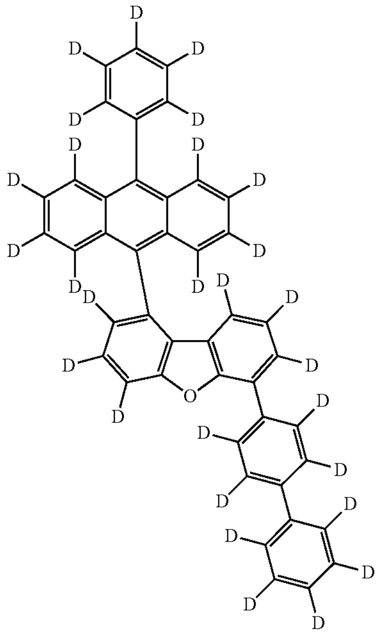
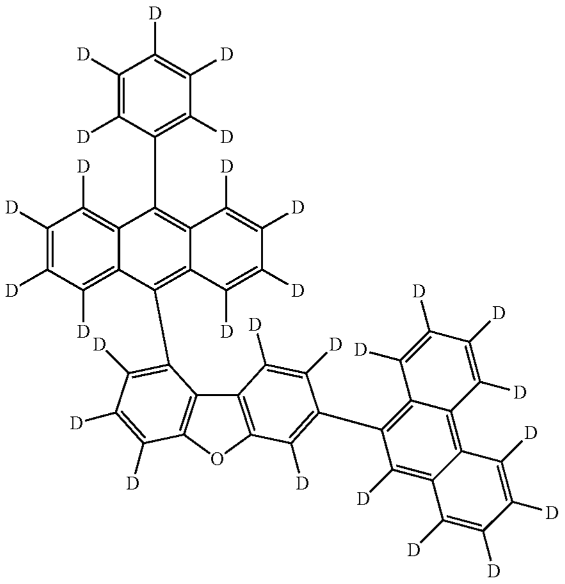
-continued
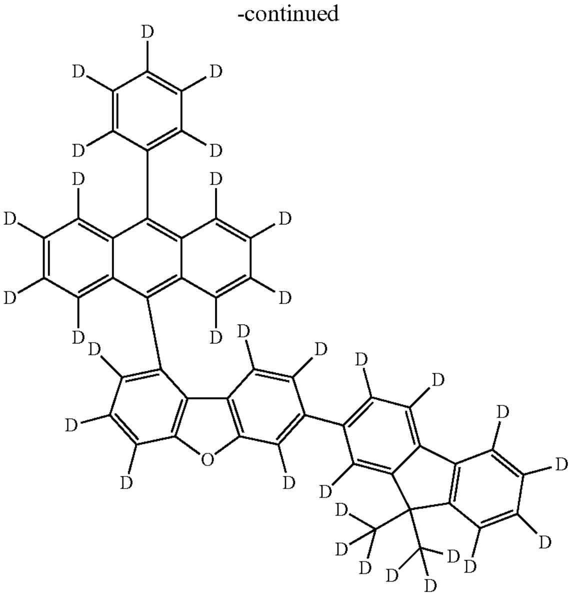
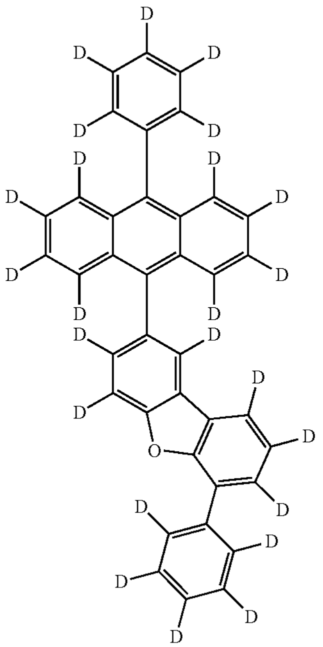

-continued
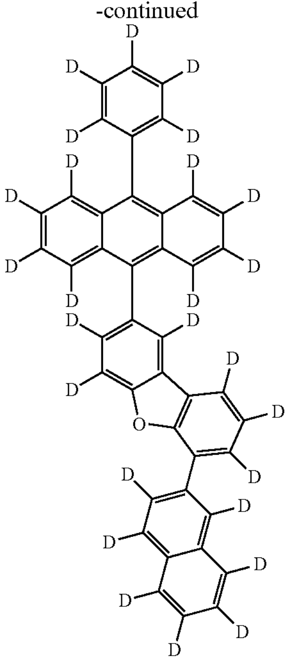
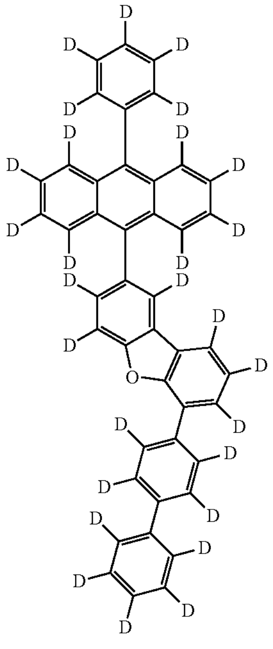
-continued
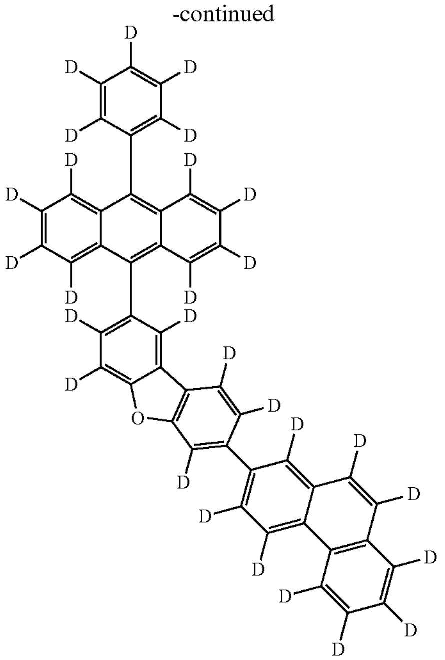
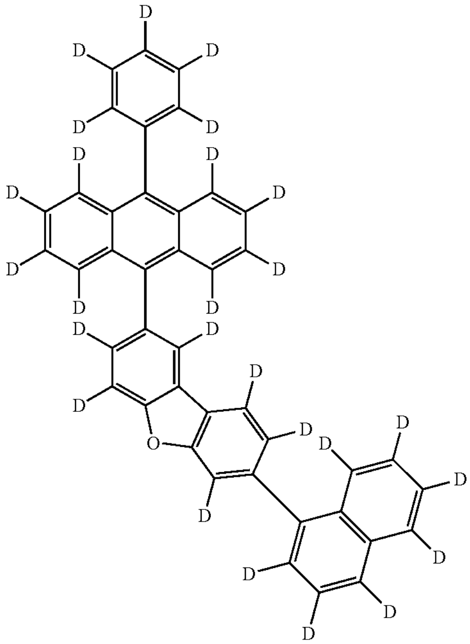

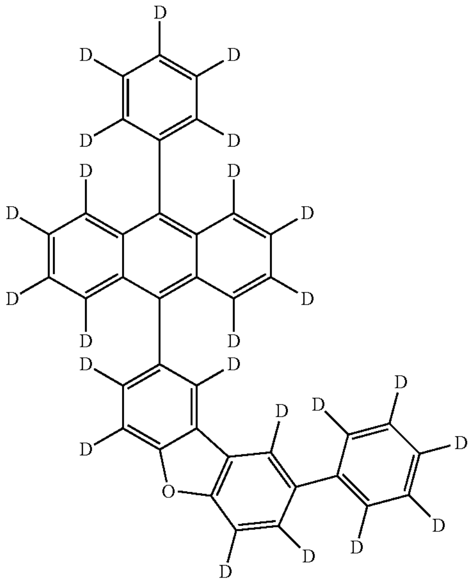
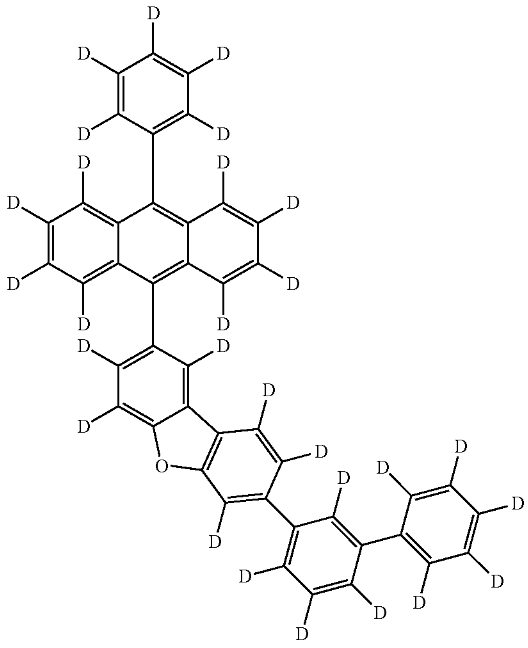
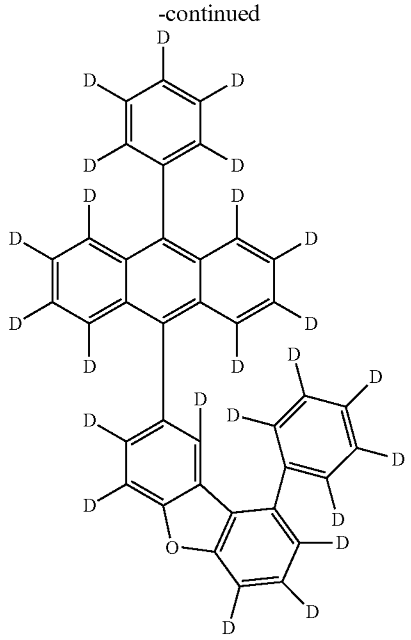
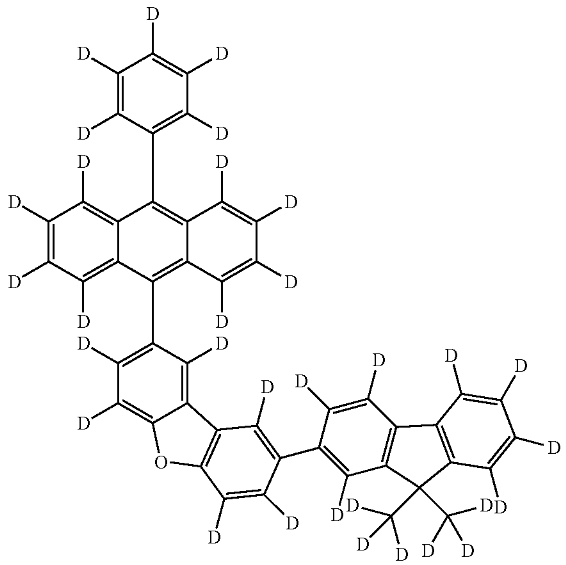

-continued
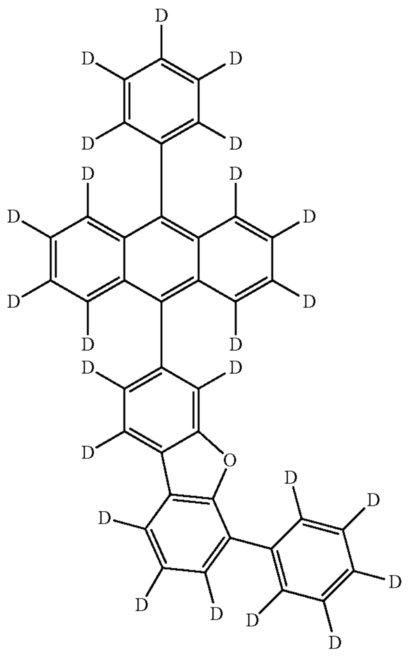
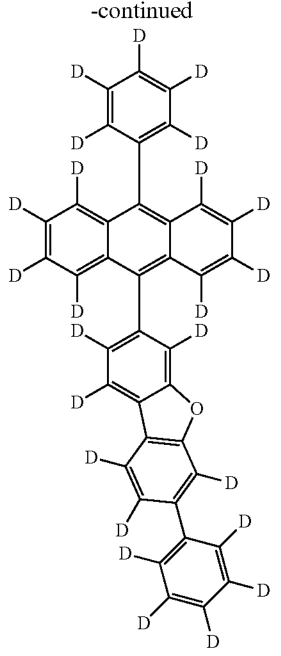
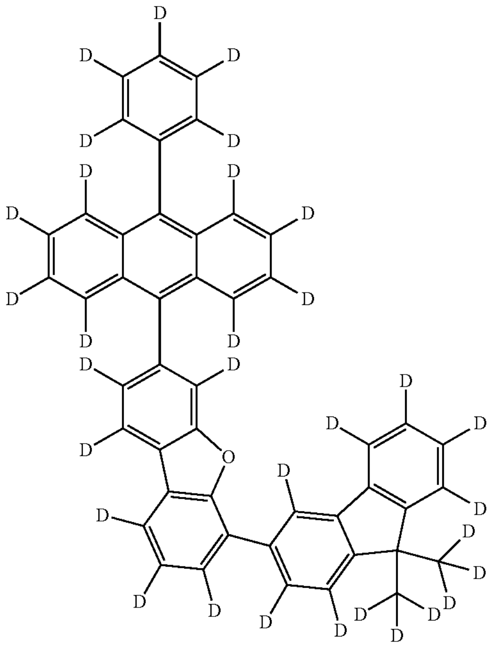
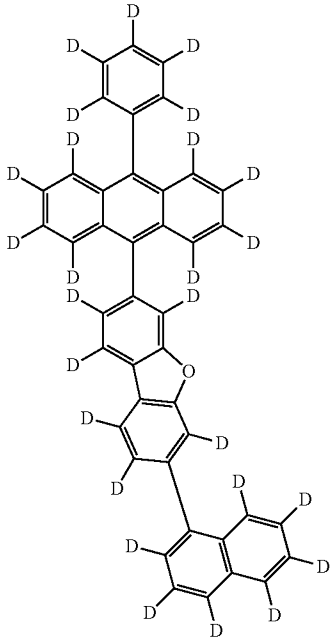
-continued

-continued
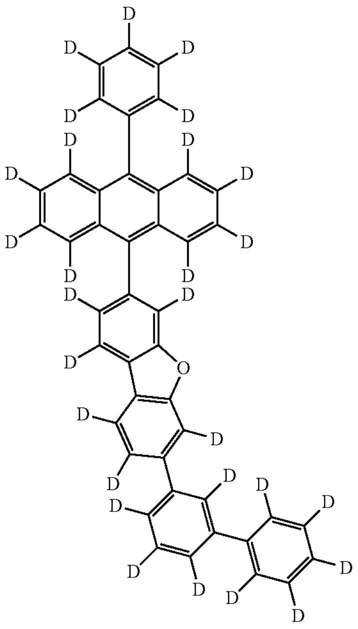
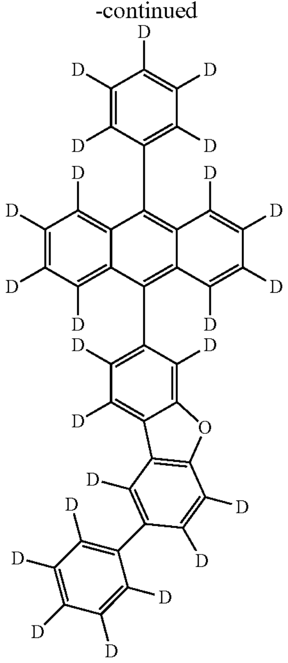
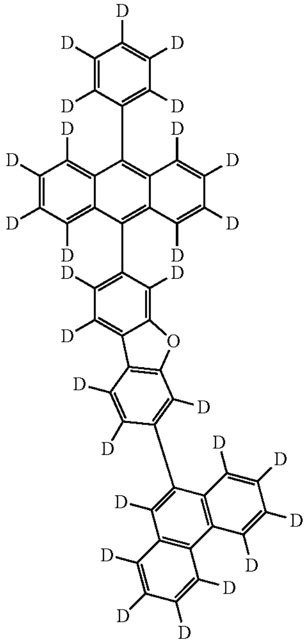
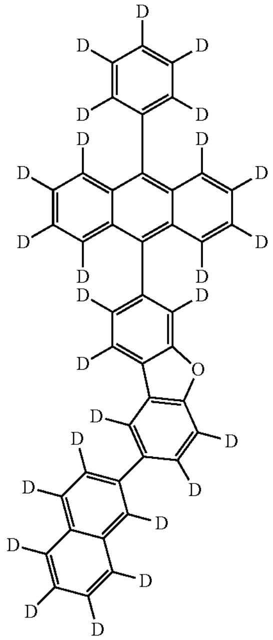

-continued
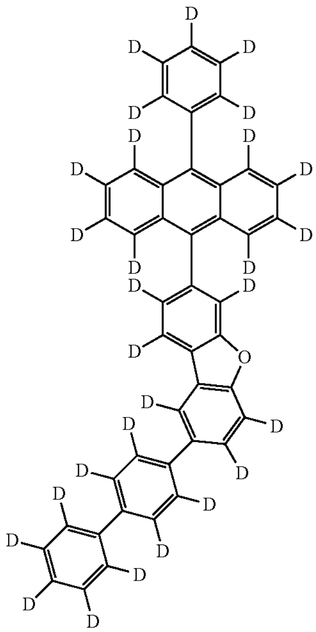
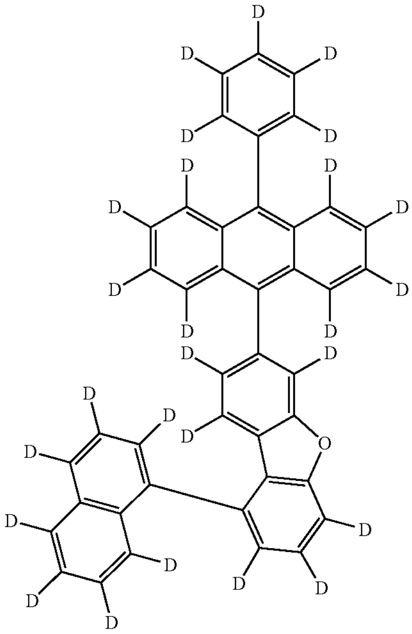
-continued
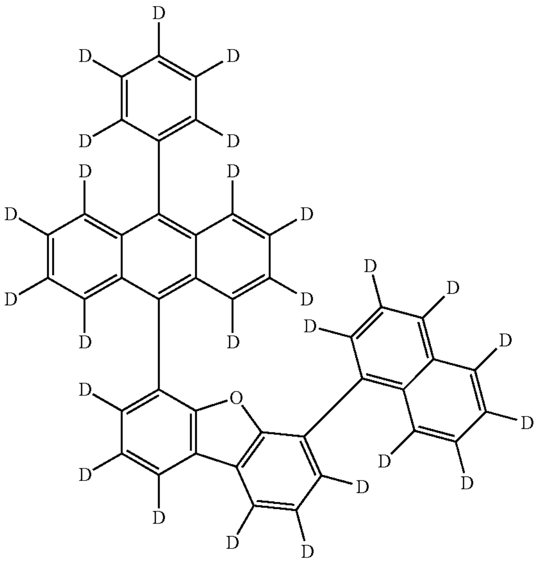
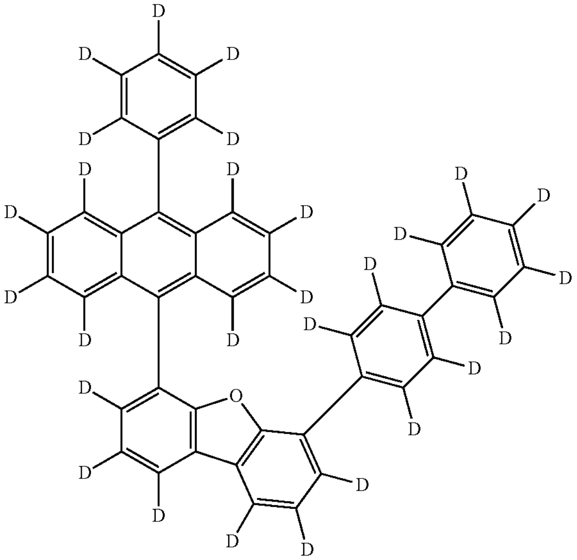
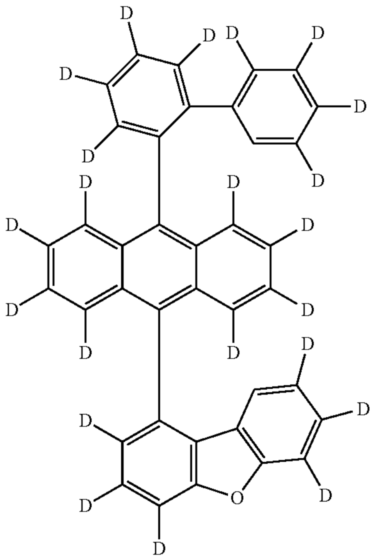

-continued
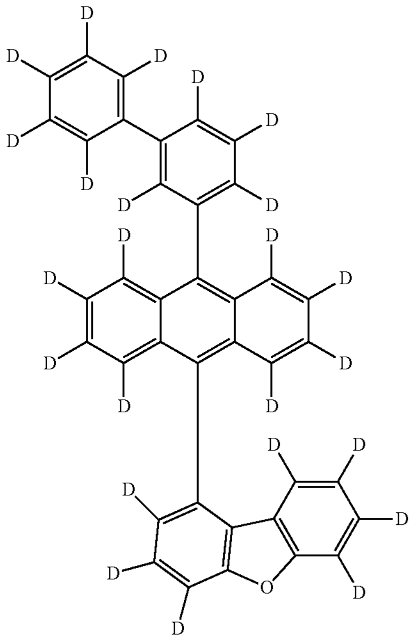
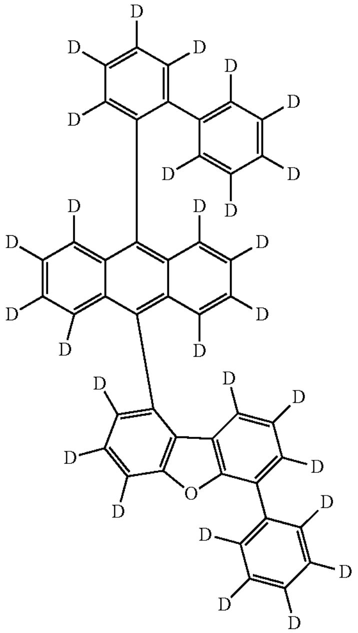
-continued
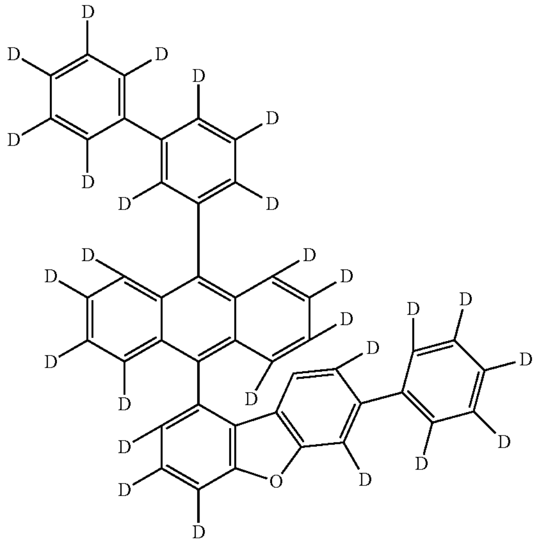
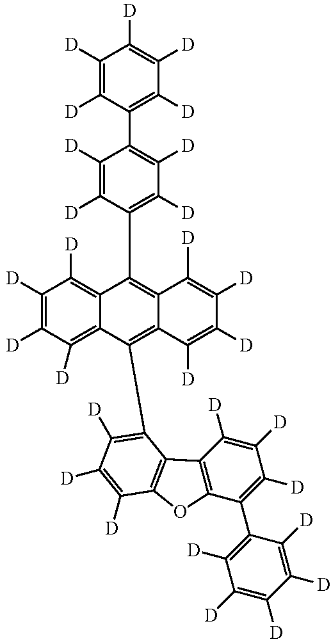

-continued

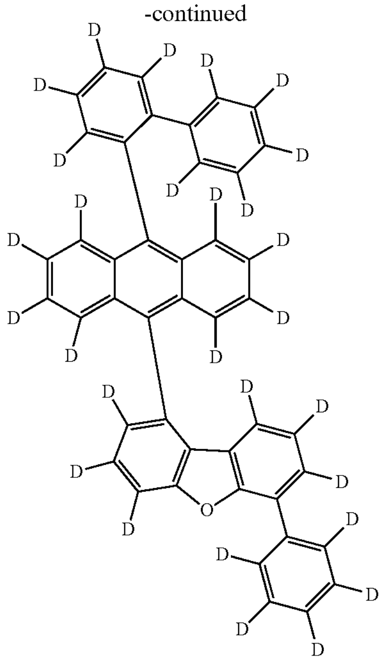

Each of the above-mentioned anthracene derivatives has a structure including one or more deuterium atoms in its anthracene skeleton.

The content of the dopant in the light emitting layer is typically selected in the range of about 0.01 to about 20 parts by weight, based on about 100 parts by weight of the host, but is not limited thereto.

The light emitting layer may further include one or more dopants other than the dopant represented by Formula 1 or 2 and one or more hosts other than the host represented by Formula 3. Thus, two or more different dopants and two or more different hosts may be mixed or stacked in the light emitting layer.

According to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the polycyclic compound represented by Formula 1 or 2 and the anthracene compound represented by Formula 3 are used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer.

According to one preferred embodiment of the present invention, one of the organic layers interposed between the first and second electrodes is a light emitting layer, the light emitting layer is composed of a host and a dopant, and the dopant is the polycyclic compound represented by Formula 1 or 2.

The light emitting layer may further include various host materials and various dopant materials in addition to the dopant represented by Formula 1 or 2 and the host represented by Formula 3.

A specific structure of the organic electroluminescent device according to one embodiment of the present invention, a method for fabricating the device, and materials for the organic layers are as follows.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zinc oxide (IZO), tin oxide ($SnO_2$) or zinc oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited as long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), N,N'-diphenyl-N,N'-bis(4-(phenyl-m-tolylamino)phenyl) biphenyl-4,4'-diamine (DNTPD), and 1,4,5,8,9,11-hexaazatriphenylenehexac arbonitrile (HAT-CN).

The hole transport material is not specially limited as long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine ($\alpha$-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited as long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum ($A_l$), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate (Bebq2), and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

The present invention will be explained more specifically with reference to the following examples. However, it will be obvious to those skilled in the art that these examples are in no way intended to limit the scope of the invention.

Synthesis Example 1: Synthesis of 2

Synthesis Example 1-1: Synthesis of A-1

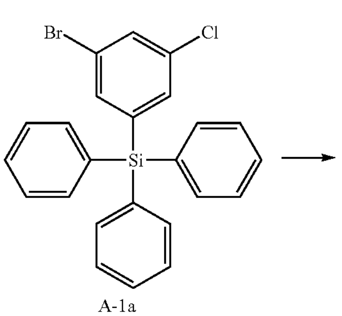

A-1a

-continued

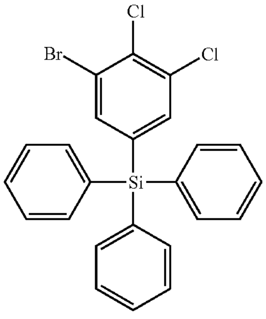

A-1

50 g of A-1a and 50 mL of tetrahydrofuran were placed in a reactor and 140 mL of a 2.0 M lithium diisopropylamide solution was added dropwise thereto at −78° C. After stirring at −78° C. for 3 h, hexachloroethane was slowly added. The mixture was allowed to warm to room temperature, followed by stirring for 16 h. To the reaction mixture were added ethyl acetate and water. The organic layer was separated and purified by silica gel chromatography to afford A-1 (42.5 g, 78.9%).

Synthesis Example 1-2: Synthesis of A-2

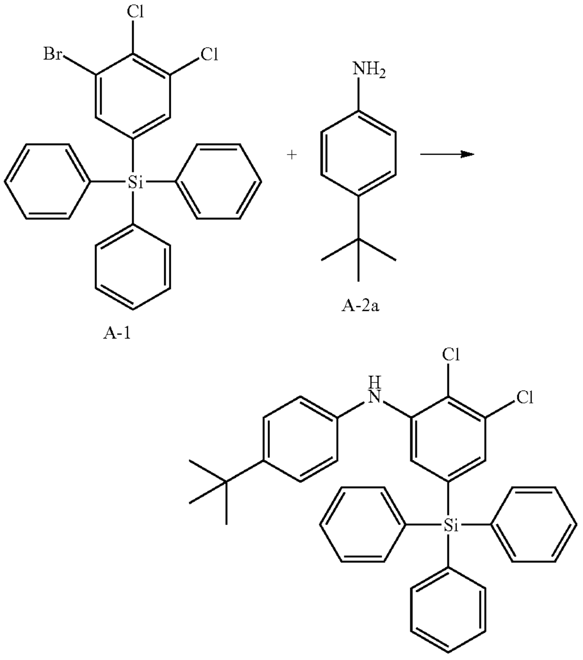

A-1 A-2a A-2

37.5 g of A-1, 12.7 g of A-2a, 1.42 g of tris(dibenzylideneacetone)dipalladium(0), 0.96 g of bis(diphenylphosphino)-1,1'-binaphthyl, 14.9 g of sodium tert-butoxide, and 375 mL of toluene were placed in a reactor. The mixture was stirred under reflux for 3 h. The reaction mixture was cooled to room temperature and ethyl acetate and water were added thereto. The organic layer was separated and purified by silica gel chromatography to afford A-2 (24 g, 56%).

Synthesis Example 1-3: Synthesis of A-3

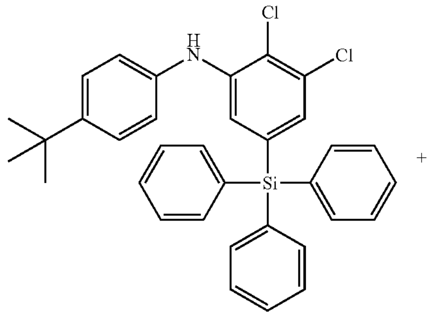

A-2

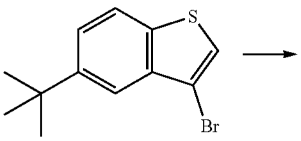

A-3a

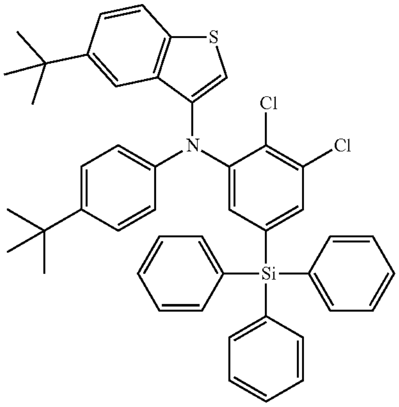

A-3

24 g of A-2, 16.3 g of A-3a, 0.4 g of bis(tri-tert-butylphosphine)palladium(0), 8.3 g of sodium tert-butoxide, and 240 mL of toluene were placed in a reactor. The mixture was stirred under reflux for 6 h. The reaction mixture was cooled to room temperature and ethyl acetate and water were added thereto. The organic layer was separated and purified by silica gel chromatography to afford A-3 (31.4 g, 97.5%).

Synthesis Example 1-4: Synthesis of A-4

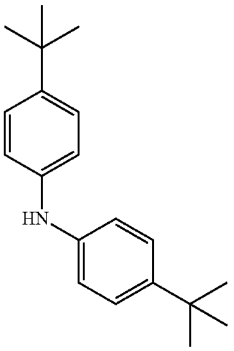

A-4a

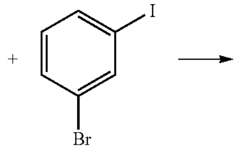

A-4b

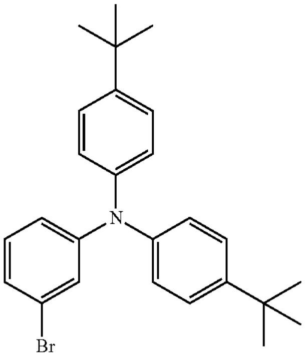

A-4

50 g of A-4a, 75.4 g of A-4b, 0.8 g of palladium acetate, 2.05 g of Xantphos, 25.6 g of sodium tert-butoxide, and 500 mL of toluene were placed in a reactor. The mixture was stirred under reflux for 6 h. The reaction mixture was cooled to room temperature and ethyl acetate and water were added thereto. The organic layer was separated and purified by silica gel chromatography to afford A-4 (55 g, 71.0%).

Synthesis Example 1-5: Synthesis of A-5

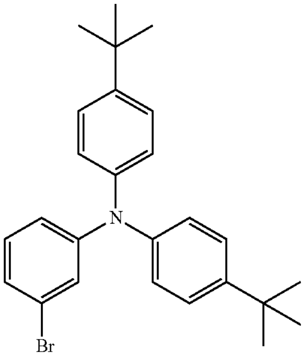

A-4

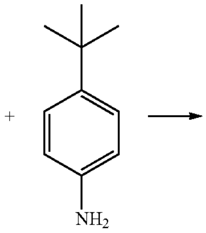

A-2a

-continued

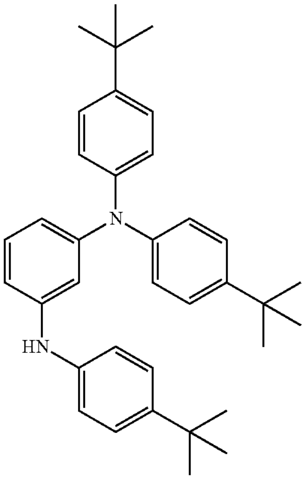

A-5

55 g of A-4, 20.6 g of A-2a, 2.3 g of tris(dibenzylideneacetone)dipalladium(0), 24.2 g of sodium tert-butoxide, 1.5 g of bis(diphenylphosphino)-1,1'-binaphthyl, and 550 mL of toluene were placed in a reactor. The mixture was stirred under reflux for 6 h. The reaction mixture was cooled to room temperature and ethyl acetate and water were added thereto. The organic layer was separated and purified by silica gel chromatography to afford A-5 (46.8 g, 84.7%).

Synthesis Example 1-6: Synthesis of A-6

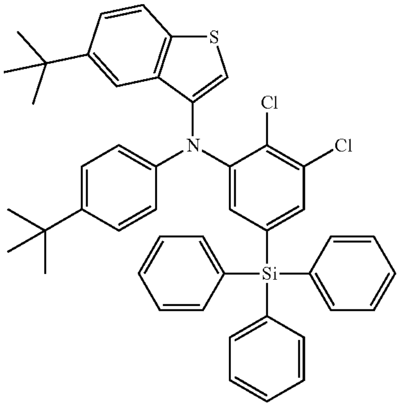

A-3

+

-continued

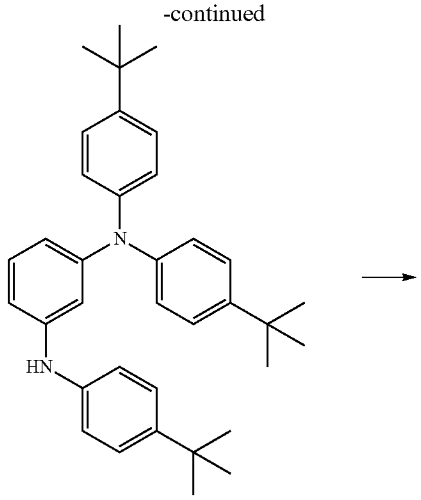

A-5

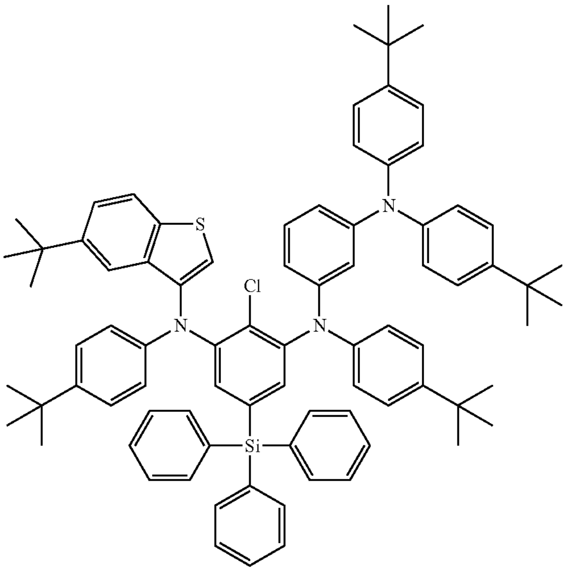

A-6

30 g of A-3, 19.4 g of A-5, 0.6 g of bis(tri-tert-butylphosphine)palladium(0), 5.8 g of sodium tert-butoxide, and 350 mL of toluene were placed in a reactor. The mixture was stirred under reflux for 6 h. The reaction mixture was cooled to room temperature and ethyl acetate and water were added thereto. The organic layer was separated and purified by silica gel chromatography to afford A-6 (48 g, 98%).

Synthesis Example 1-7: Synthesis of 2

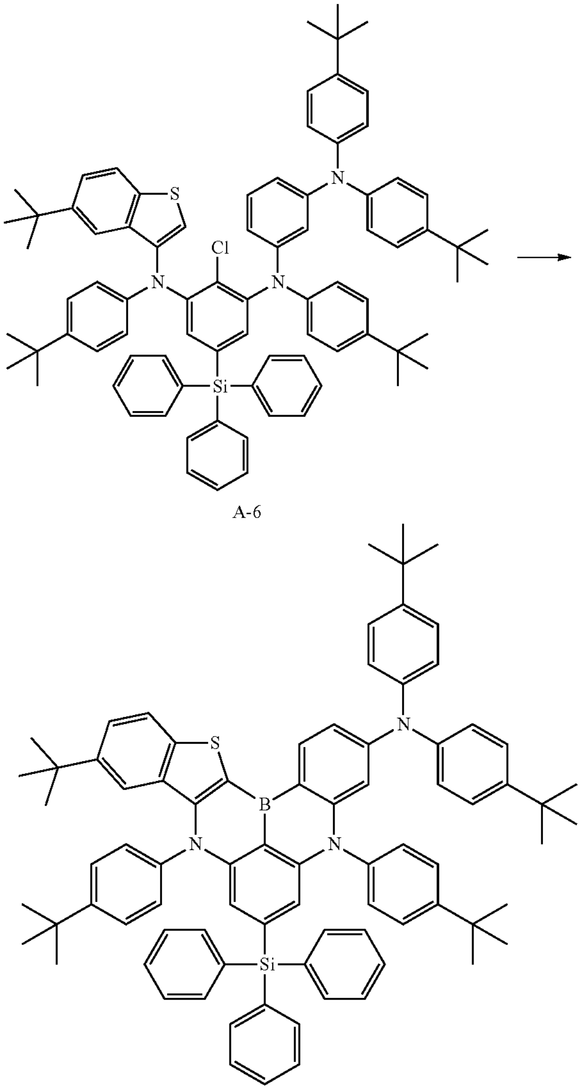

A-6

2

35 g of A-6 and 420 mL of tert-butylbenzene were placed in a reactor, and then 51 mL of a 1.7 M tert-butyllithium pentane solution was added dropwise thereto at −78° C. The mixture was heated to 60° C., followed by stirring for 2 h. Then, nitrogen at 60° C. was blown into the mixture to completely remove pentane. After cooling to −78° C., 14.5 mL of boron tribromide was added dropwise. The resulting mixture was allowed to warm to room temperature, followed by stirring for 2 h. After cooling to 0° C., 7.5 mL of N,N-diisopropylethylamine was added dropwise. The mixture was heated to 120° C., followed by stirring for 16 h. The reaction mixture was cooled to room temperature and a 10% aqueous sodium acetate solution and ethyl acetate were added thereto. The organic layer was separated and concentrated under reduced pressure. The concentrate was purified by silica gel chromatography to give 2 (4.5 g, 13.1%).

MS (MALDI-TOF): m/z 1181.62 [$M^+$]

Synthesis Example 2: Synthesis of 6

Synthesis Example 2-1: Synthesis of B-1

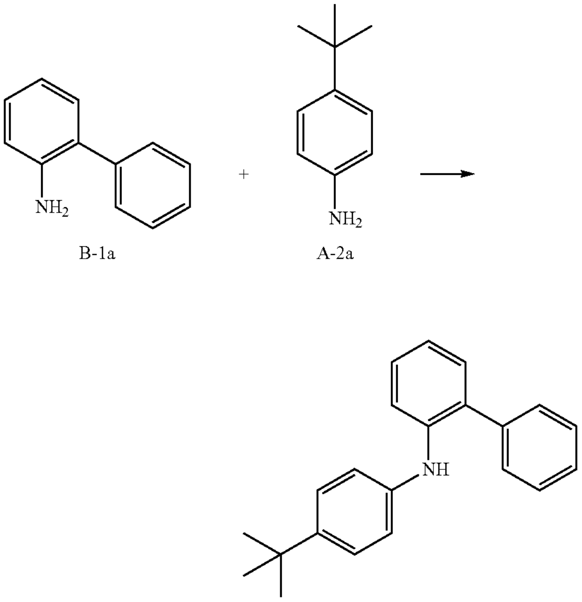

B-1a

A-2a

B-1

B-1 (yield 85.1%) was synthesized in the same manner as in Synthesis Example 1-5, except that B-1a was used instead of A-4.

Synthesis Example 2-2: Synthesis of B-2

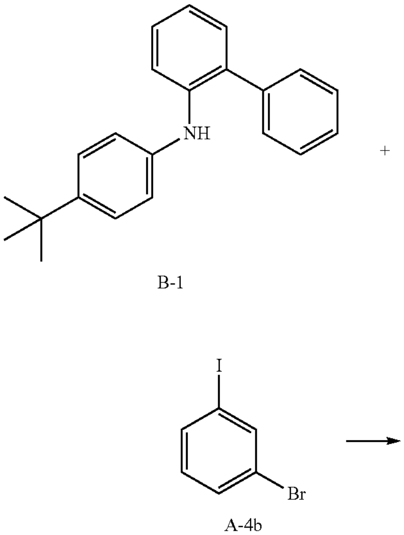

B-1

A-4b

-continued

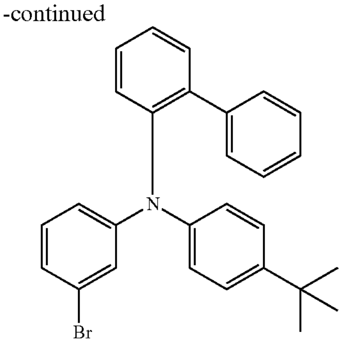

B-2

B-2 (yield 46.2%) was synthesized in the same manner as in Synthesis Example 1-4, except that B-1 was used instead of A-4a.

Synthesis Example 2-3: Synthesis of B-3

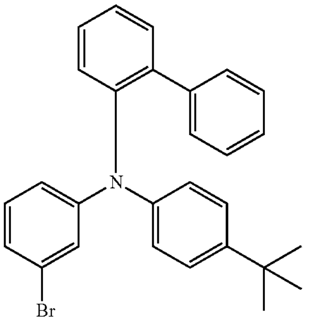

B-2

+

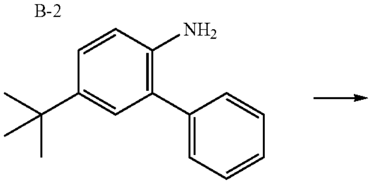

B-3a

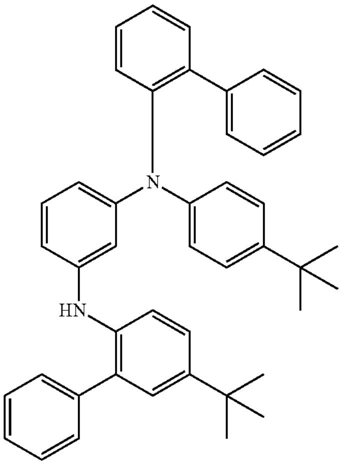

B-3

B-3 (yield 89.4%) was synthesized in the same manner as in Synthesis Example 1-5, except that B-2 and B-3a were used instead of A-4 and A-2a, respectively.

Synthesis Example 2-4: Synthesis of B-4

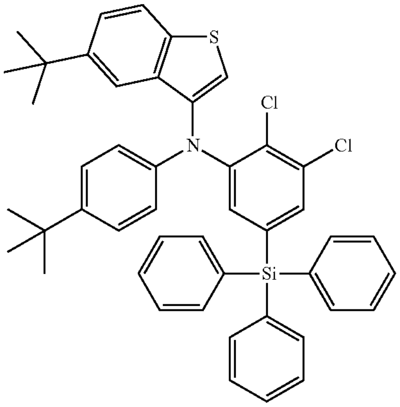

A-3

+

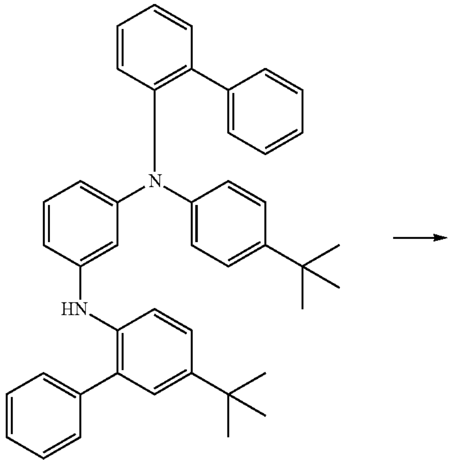

B-3

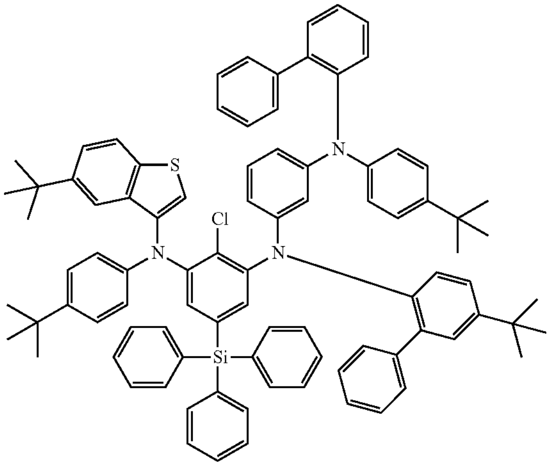

B-4

B-4 (yield 98.9%) was synthesized in the same manner as in Synthesis Example 1-6, except that B-3 was used instead of A-5.

Synthesis Example 2-5: Synthesis of 6

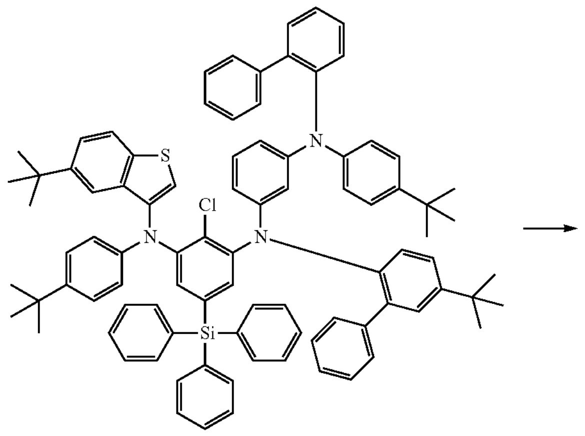

B-4

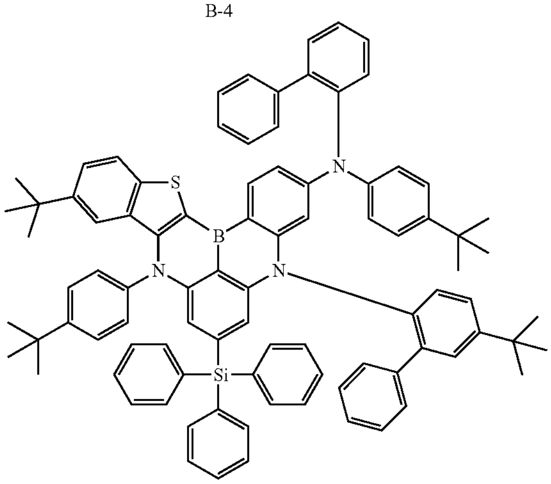

6

6 (yield 13.8%) was synthesized in the same manner as in Synthesis Example 1-7, except that B-4 was used instead of A-6.

MS (MALDI-TOF): m/z 1277.62 [M+]

Synthesis Example 3: Synthesis of 18

Synthesis Example 3-1: Synthesis of C-1

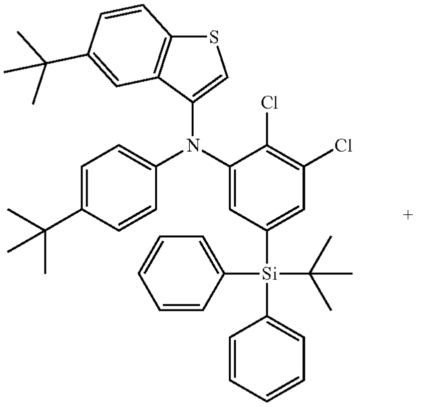

C-1a

-continued

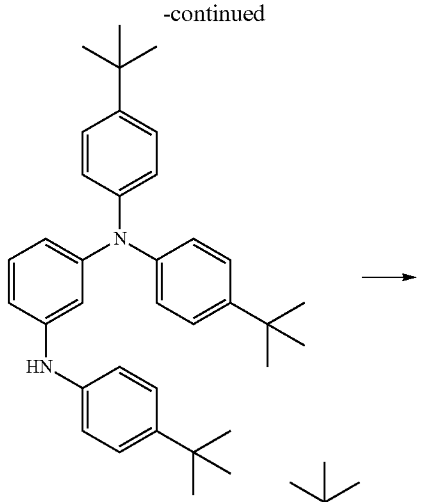

A-5

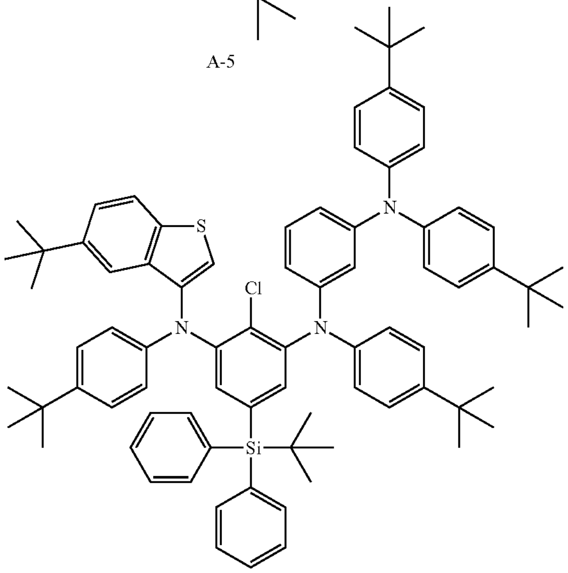

C-1

C-1 (yield 95.3%) was synthesized in the same manner as in Synthesis Example 1-6, except that C-1a was used instead of A-3.

Synthesis Example 3-2: Synthesis of 18

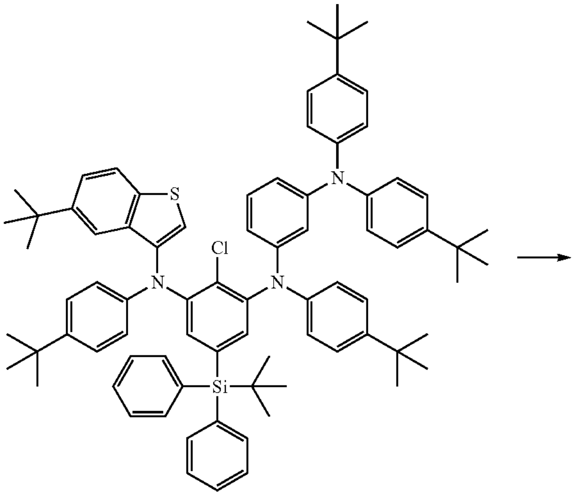

C-1

-continued

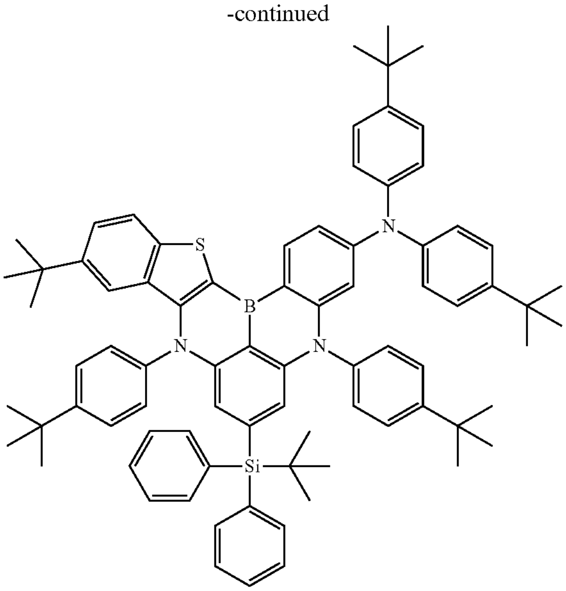

18

18 (yield 12.4%) was synthesized in the same manner as in Synthesis Example 1-7, except that C-1 was used instead of A-6.

MS (MALDI-TOF): m/z 1161.66 [$M^+$]

Synthesis Example 4: Synthesis of 21

Synthesis Example 4-1: Synthesis of D-1

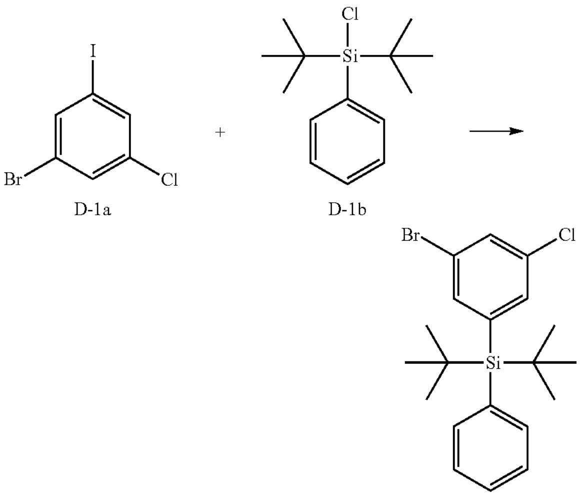

D-1a D-1b D-1

50 g of D-lb and 250 mL of tetrahydrofuran were placed in a reactor and then 98.5 mL of a 1.6 M n-butyllithium solution was added dropwise thereto at −78° C. The mixture was stirred at −78° C. for 2 h. To the mixture was slowly added a solution of D-1a in 250 mL of tetrahydrofuran. The resulting mixture was allowed to warm to room temperature, followed by stirring for 16 h. To the reaction mixture were added ethyl acetate and water. The organic layer was separated and purified by silica gel chromatography to afford D-1 (46.8 g, 72.6%).

Synthesis Example 4-2: Synthesis of D-2

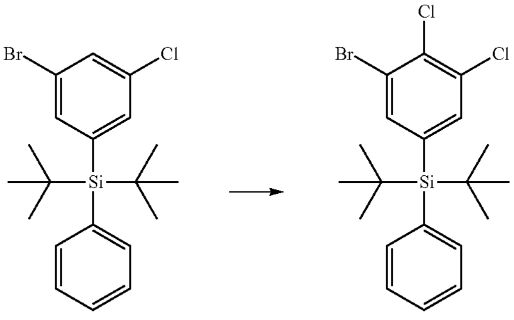

D-1 D-2

D-2 (yield 68.4%) was synthesized in the same manner as in Synthesis Example 1-1, except that D-1 was used instead of A-1a.

Synthesis Example 4-3: Synthesis of D-3

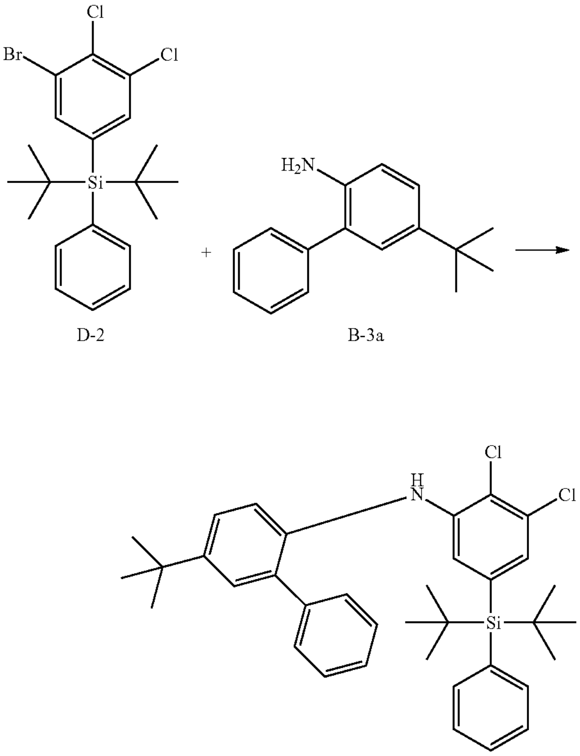

D-2 B-3a

D-3

D-3 (yield 52.3%) was synthesized in the same manner as in Synthesis Example 1-2, except that D-2 and B-3a were used instead of A-1 and A-2a, respectively.

Synthesis Example 4-4: Synthesis of D-4
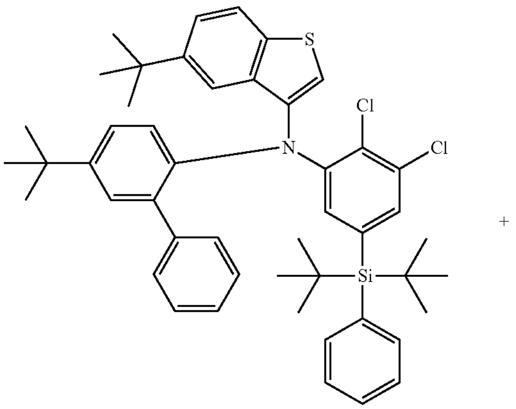
D-3
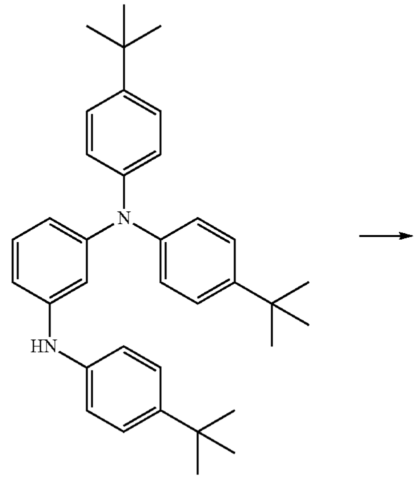
A-5
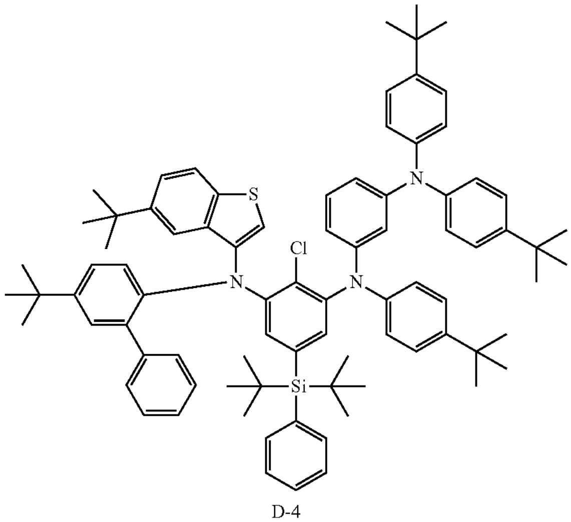
D-4
D-4 (yield 97.7%) was synthesized in the same manner as in Synthesis Example 1-6, except that D-3 was used instead of A-3.
Synthesis Example 4-5: Synthesis of 21
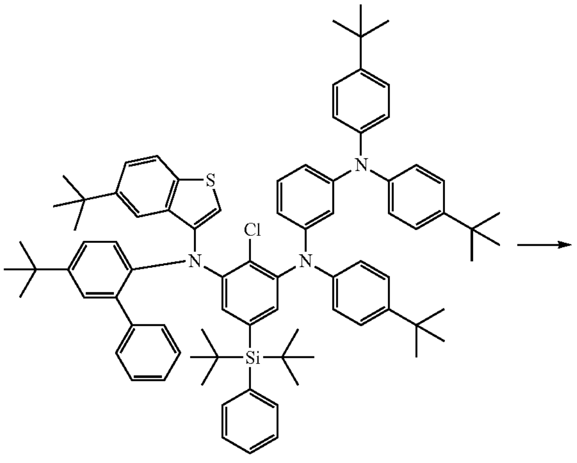
D-4
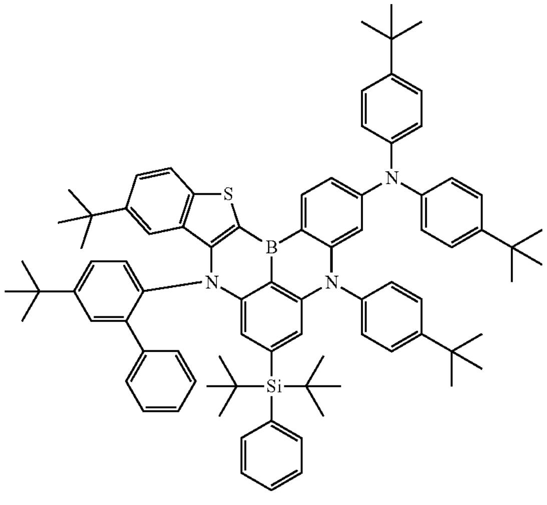
21
21 (yield 10.5%) was synthesized in the same manner as in Synthesis Example 1-7, except that D-4 was used instead of A-6.
MS (MALDI-TOF): m/z 1217.72 [$M^+$]

Synthesis Example 5: Synthesis of 27
Synthesis Example 5-1: Synthesis of E-1
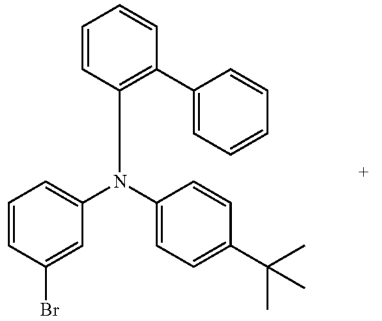
B-2
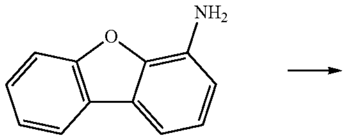
E-1a
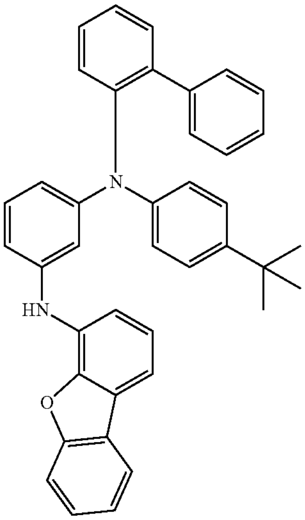
E-1
E-1 (yield 90.4%) was synthesized in the same manner as in Synthesis Example 2-3, except that E-1a was used instead of B-3a.
Synthesis Example 5-2: Synthesis of E-2
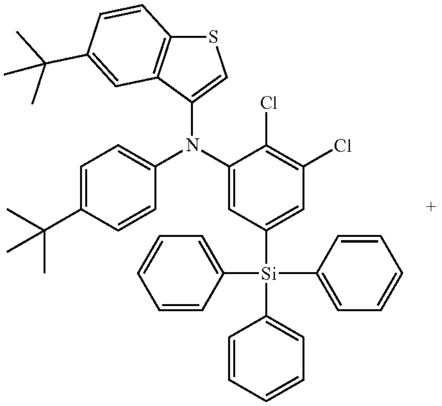
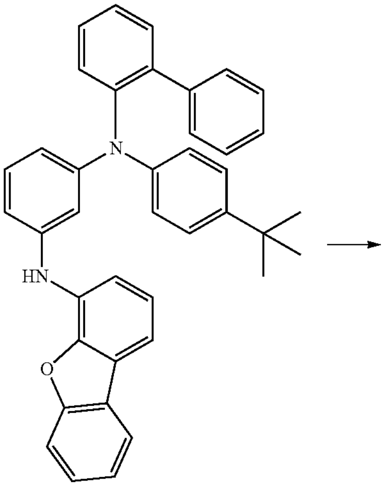
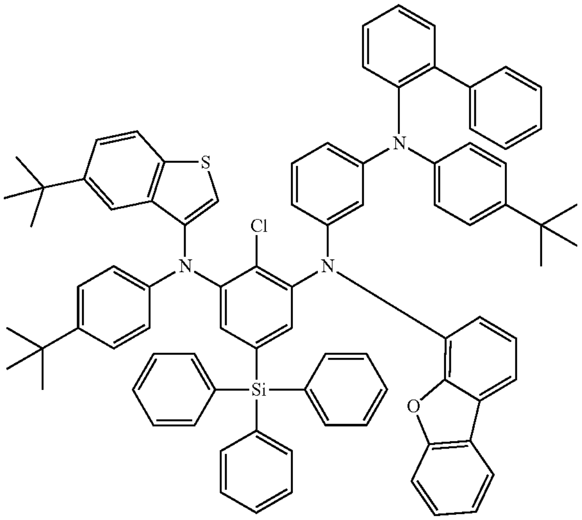
E-2 (yield 95.2%) was synthesized in the same manner as in Synthesis Example 1-6, except that E-1 was used instead of A-5.

Synthesis Example 5-3: Synthesis of 27

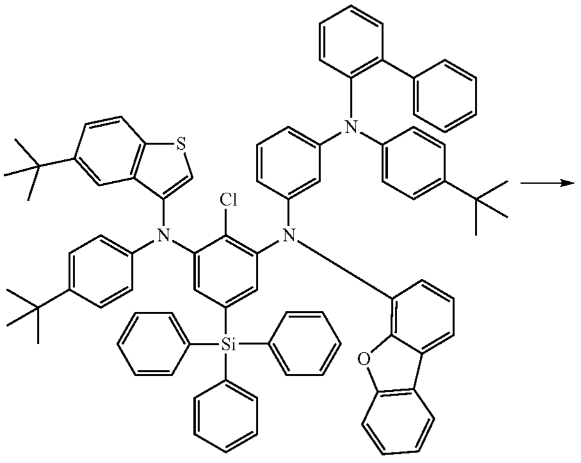

E-2

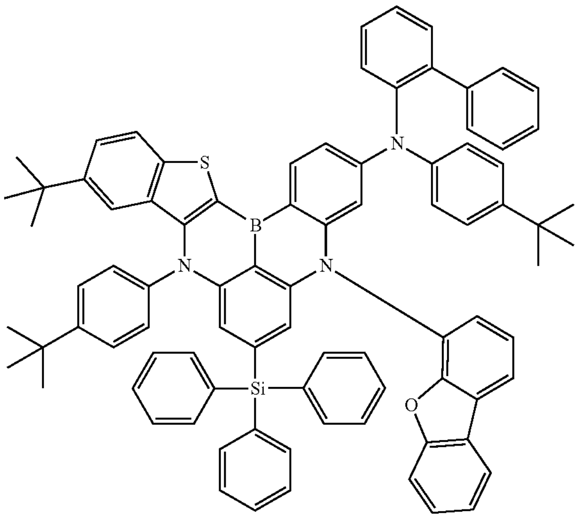

27

27 (yield 10.5%) was synthesized in the same manner as in Synthesis Example 1-7, except that E-2 was used instead of A-6.

MS (MALDI-TOF): m/z 1235.54 [$M^+$]

Synthesis Example 6: Synthesis of 31

Synthesis Example 6-1: Synthesis of F-1

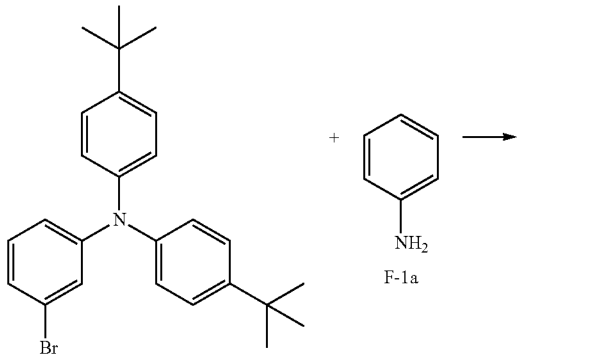

A-4

F-1a

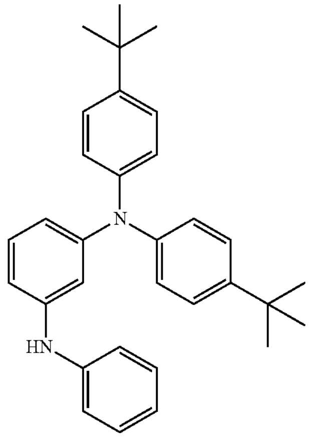

F-1

F-1 (yield 82.7%) was synthesized in the same manner as in Synthesis Example 1-5, except that F-1a was used instead of A-2a.

Synthesis Example 6-2: Synthesis of F-2

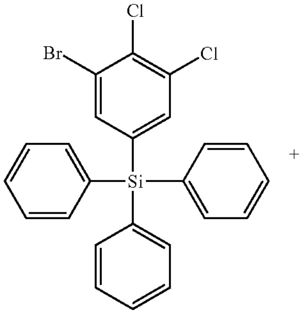

A-1

-continued
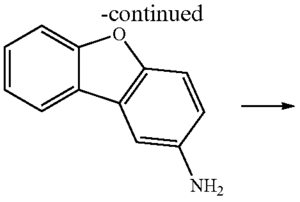
F-2a
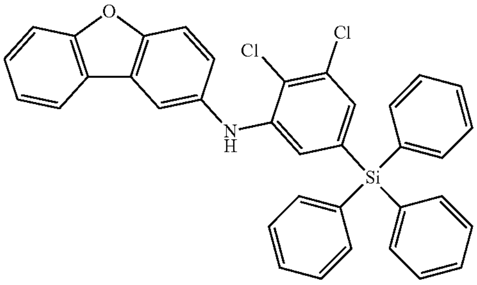
F-2
F-2 (yield 86.2%) was synthesized in the same manner as in Synthesis Example 1-2, except that F-2a was used instead of A-2a.
Synthesis Example 6-3: Synthesis of F-3
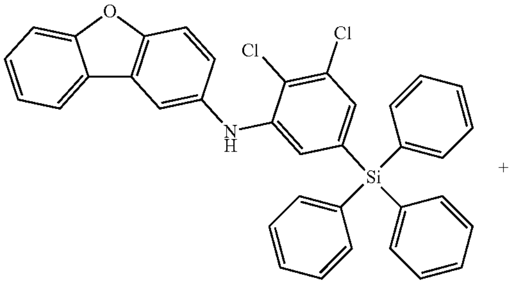
F-2
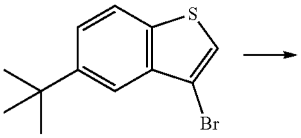
A-3a
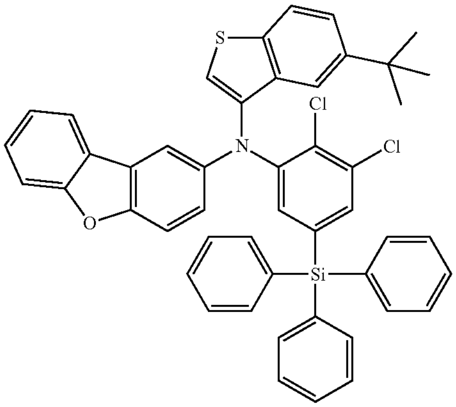
F-3
F-3 (yield 94.7%) was synthesized in the same manner as in Synthesis Example 1-3, except that F-2 was used instead of A-2.
Synthesis Example 6-4: Synthesis of F-4
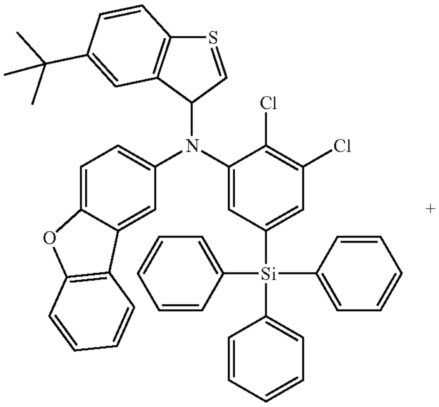
F-3
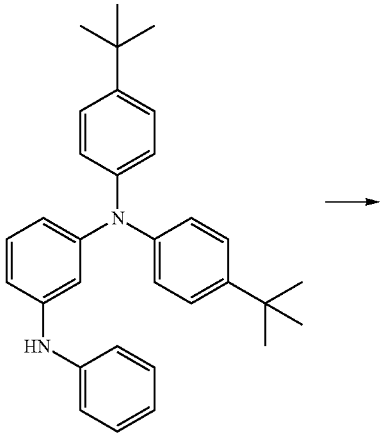
F-1
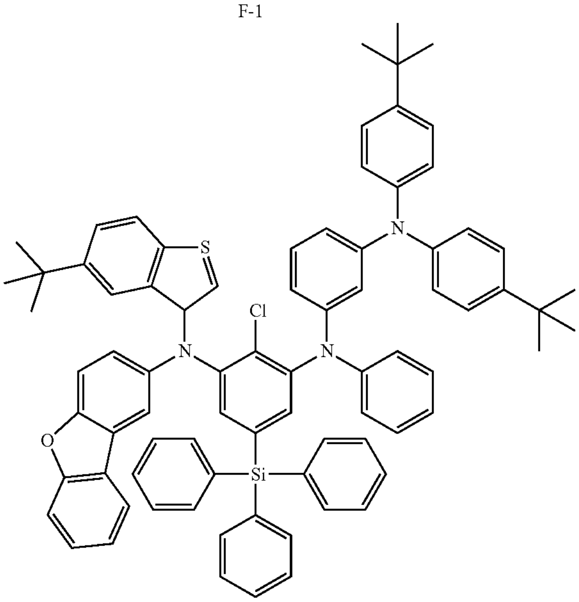
F-4

F-4 (yield 87.6%) was synthesized in the same manner as in Synthesis Example 1-6, except that F-3 and F-1 were used instead of A-3 and A-5, respectively.

Synthesis Example 6-5: Synthesis of 31

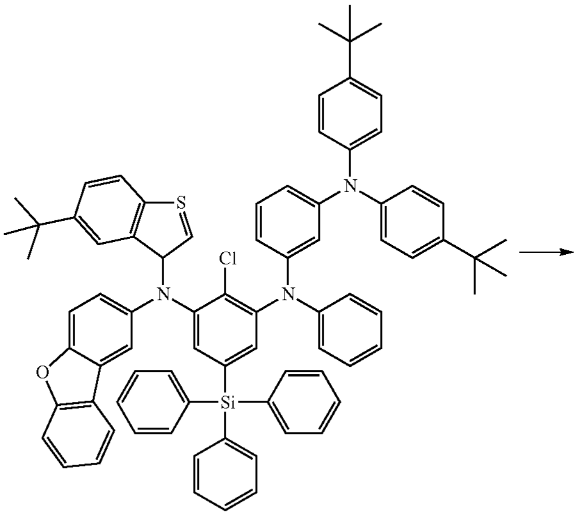

F-4

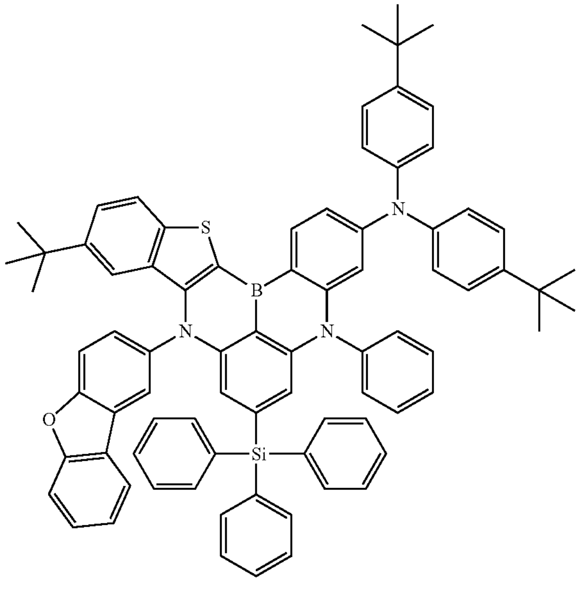

31

31 (yield 11.6%) was synthesized in the same manner as in Synthesis Example 1-7, except that F-4 was used instead of A-6.

MS (MALDI-TOF): m/z 1159.51 [$M^+$]

Synthesis Example 7: Synthesis of 32

Synthesis Example 7-1: Synthesis of G-1

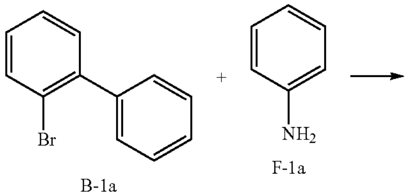

B-1a

F-1a

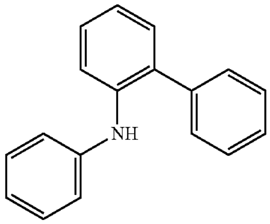

G-1

G-1 (yield 86.2%) was synthesized in the same manner as in Synthesis Example 2-1, except that F-1a was used instead of A-2a.

Synthesis Example 7-2: Synthesis of G-2

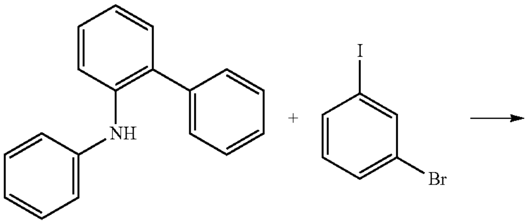

G-1

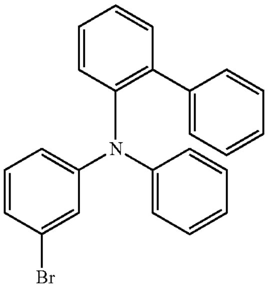

G-2

G-2 (yield 49.3%) was synthesized in the same manner as in Synthesis Example 1-4, except that G-1 was used instead of A-4a.

Synthesis Example 7-3: Synthesis of G-3
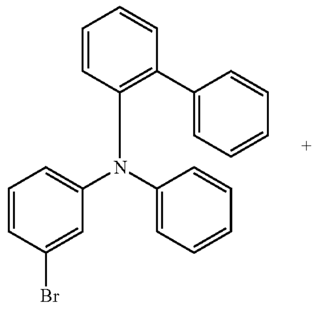
G-2
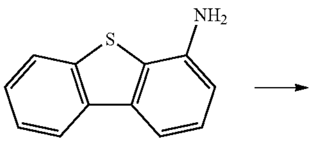
G-3a
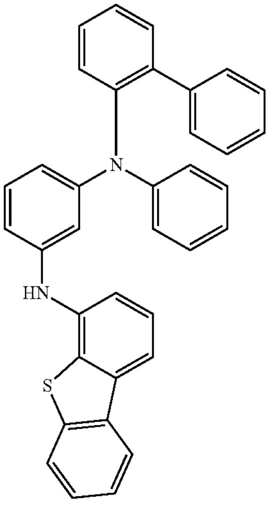
G-3
G-3 (yield 87.8%) was synthesized in the same manner as in Synthesis Example 2-3, except that G-2 and G-3a were used instead of B-2 and B-3a, respectively.
Synthesis Example 7-4: Synthesis of G-4
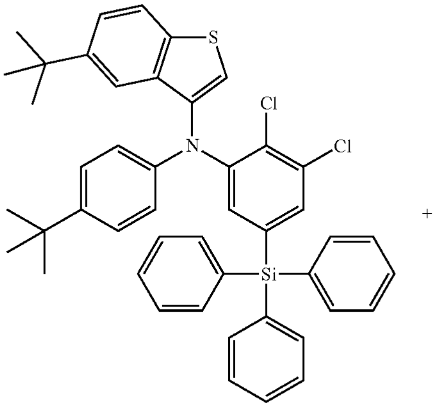
A-3
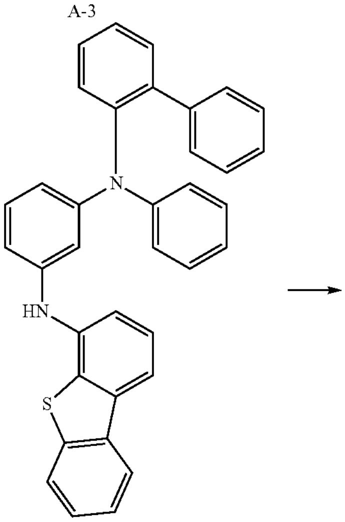
G-3
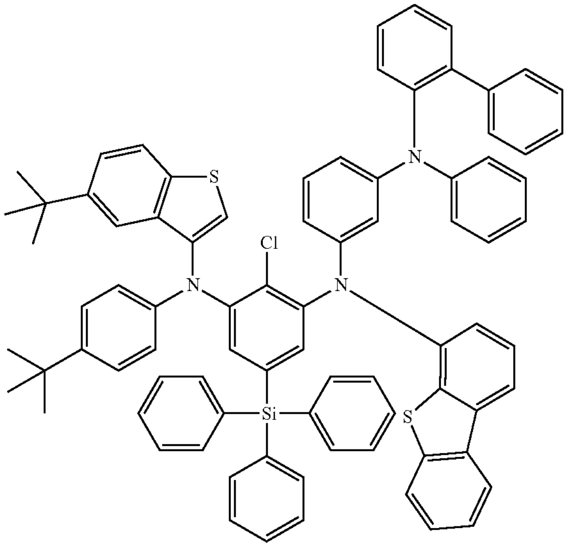
G-4
G-4 (yield 91.1%) was synthesized in the same manner as in Synthesis Example 1-6, except that G-3 was used instead of A-5.

Synthesis Example 7-5: Synthesis of 32

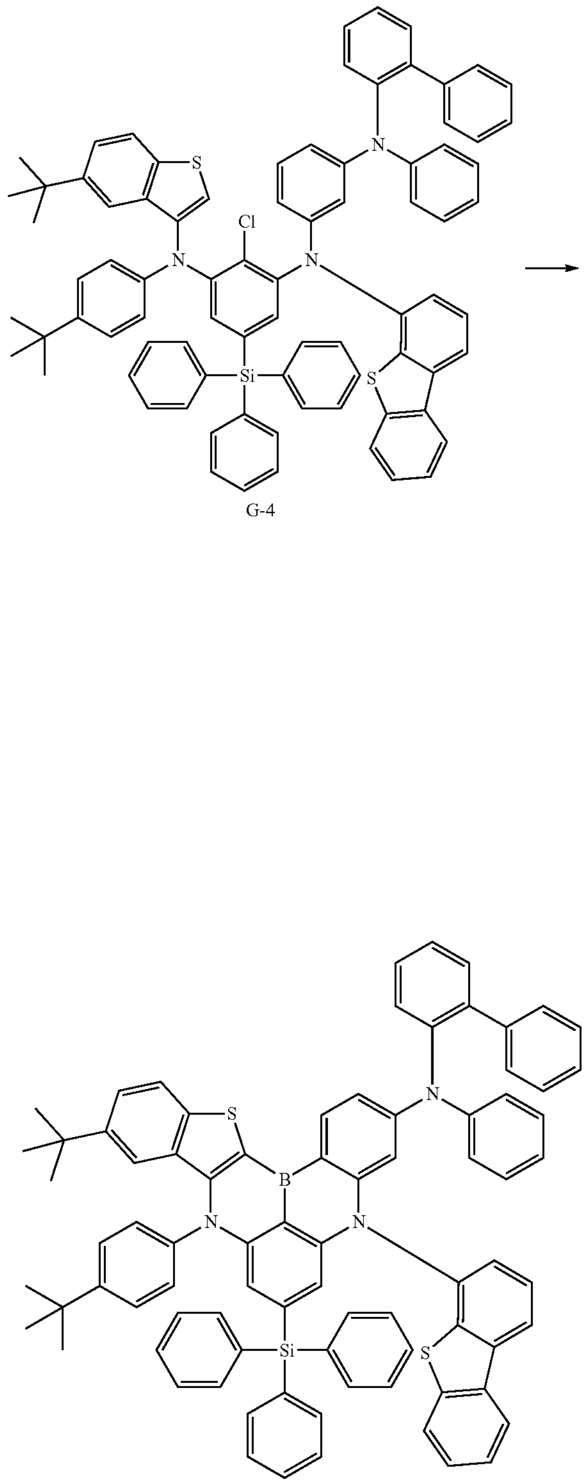

G-4

32

32 (yield 12.1%) was synthesized in the same manner as in Synthesis Example 1-7, except that G-4 was used instead of A-6.

MS (MALDI-TOF): m/z 1195.46 [$M^+$]

Synthesis Example 8: Synthesis of 33

Synthesis Example 8-1: Synthesis of H-1

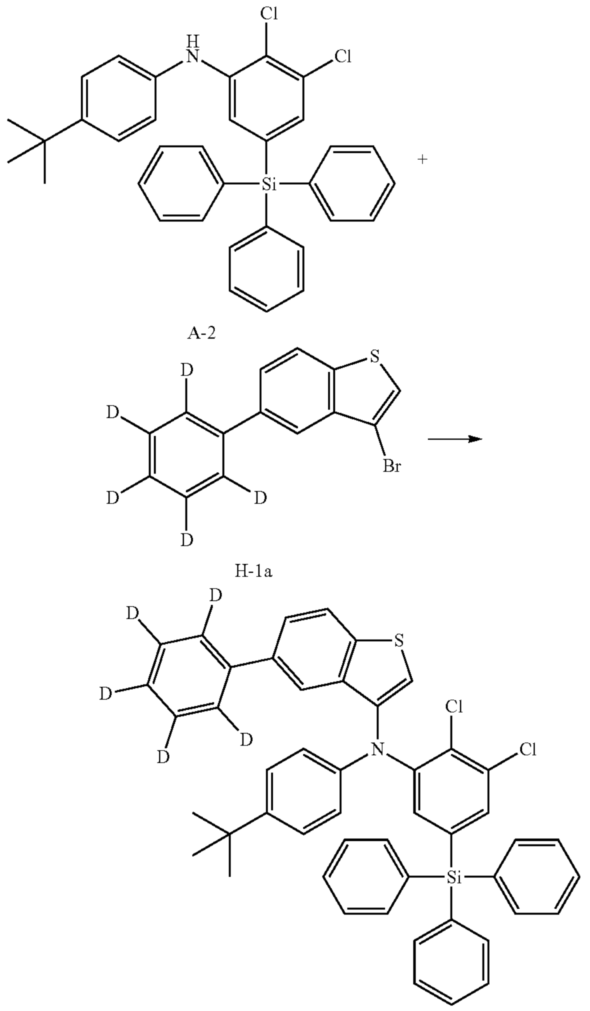

A-2

H-1a

H-1

H-1 (yield 96.8%) was synthesized in the same manner as in Synthesis Example 1-3, except that H-1a was used instead of A-3a.

Synthesis Example 8-2: Synthesis of H-2

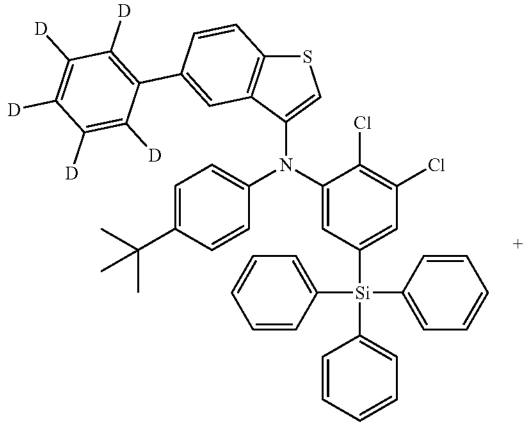

H-1

-continued
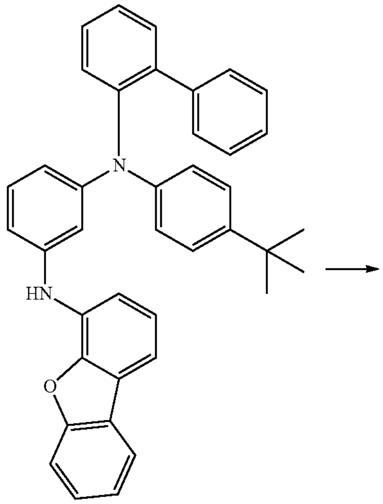
E-1
-continued
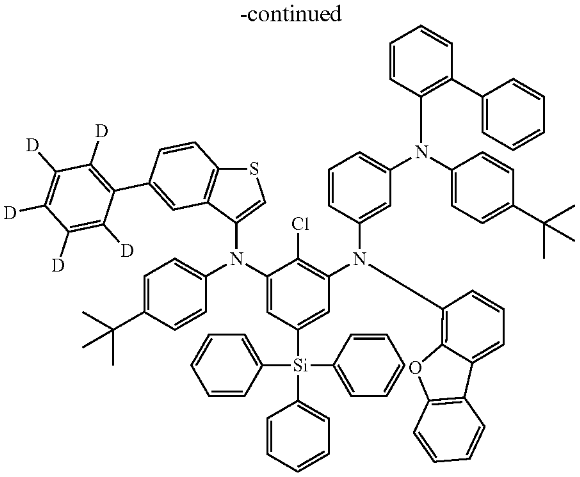
H-2
H-2 (yield 94.1%) was synthesized in the same manner as in Synthesis Example 5-2, except that H-1 was used instead of A-3.
Synthesis Example 8-3: Synthesis of 33
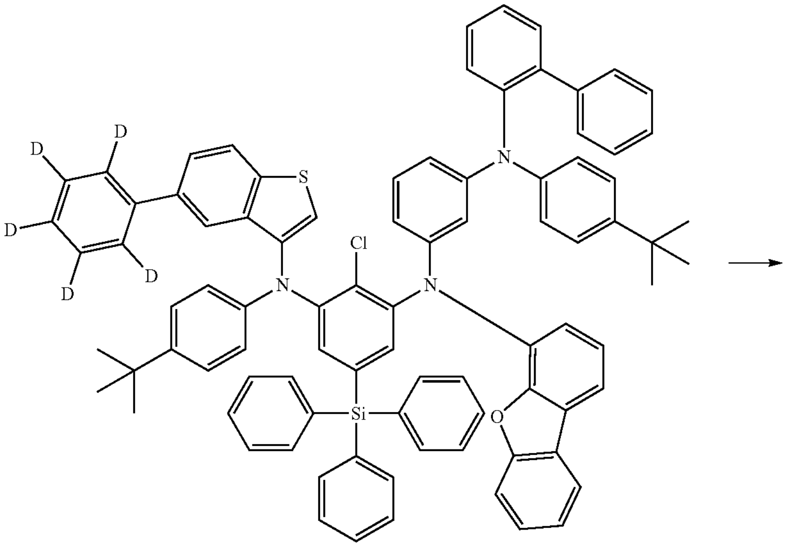
H-2

-continued

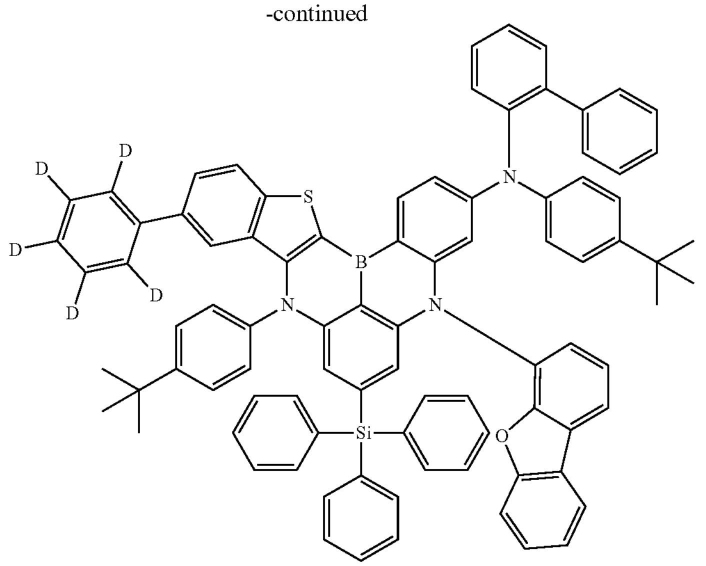

33

33 (yield 12.1%) was synthesized in the same manner as in Synthesis Example 1-7, except that H-2 was used instead of A-6.

MS (MALDI-TOF): m/z 1260.54 [$M^+$]

Examples 1-8: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. The compound represented by Acceptor-1 as an electron acceptor and the compound represented by Formula F were deposited in a ratio of 2:98 on the ITO to form a 100 Å thick hole injecting layer. The compound represented by Formula F was used to form a 550 Å thick hole transport layer. Subsequently, the compound represented by Formula G was used to form a 50 Å thick electron blocking layer. A mixture of the host represented by BH-1 and the inventive compound (2 wt %) shown in Table 1 was used to form a 200 Å thick light emitting layer. Thereafter, the compound represented by Formula H was used to form a 50 Å hole blocking layer on the light emitting layer. A mixture of the compound represented by Formula E-1 and the compound represented by Formula E-2 in a ratio of 1:1 was used to form a 250 Å thick electron transport layer on the hole blocking layer. The compound represented by Formula E-2 was used to form a 10 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

[Formula F]

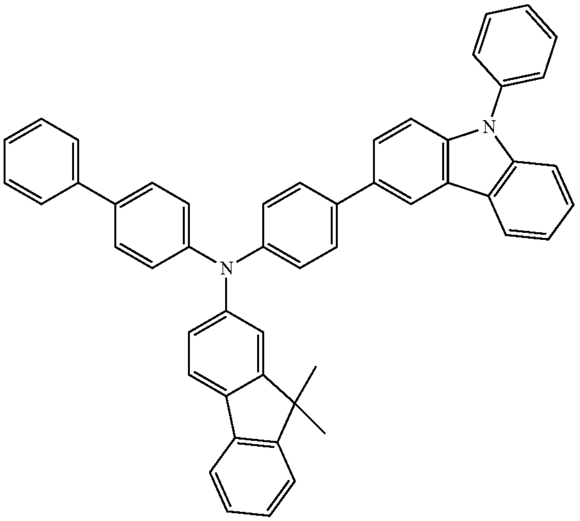

[Formula G]

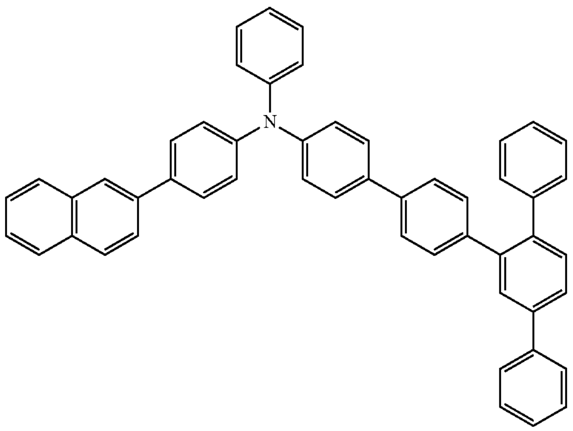

-continued

[Formula H]

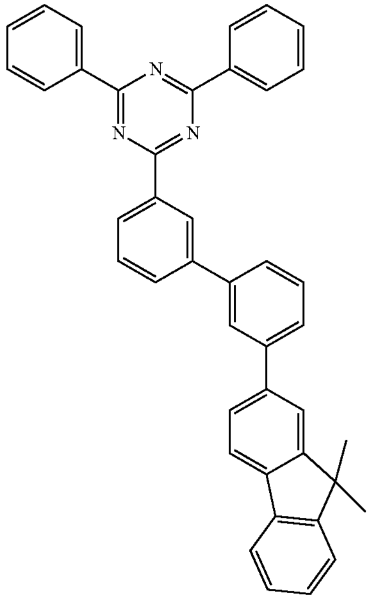

[Formula E-1]

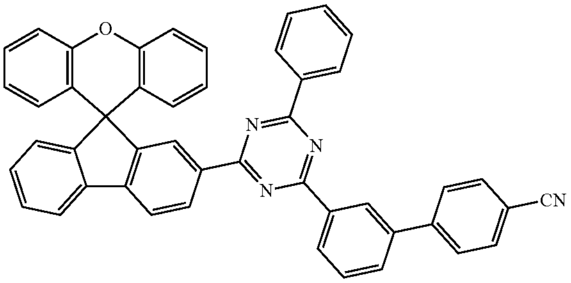

[Formula E-2]

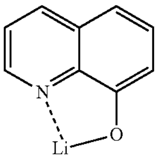

-continued

[Acceptor-1]

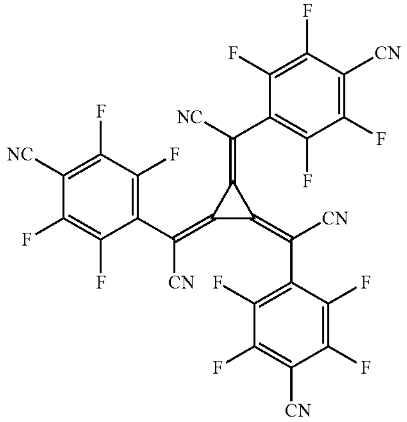

[BH1]

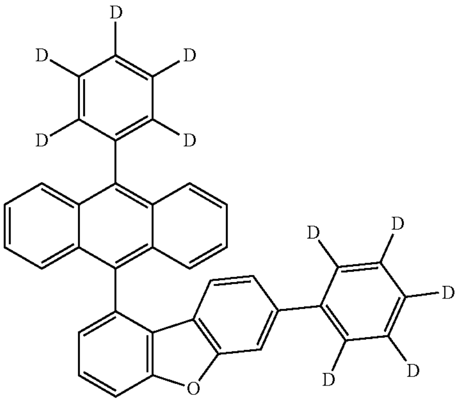

Comparative Examples 1-5

Organic electroluminescent devices were fabricated in the same manner as in Examples 1-8, except that BD1, BD2, BD3, BD4 or BD5 was used instead of the inventive dopant compound. The luminescent properties of the organic electroluminescent devices were measured at 0.4 mA. The structures of BD1 to BD5 are as follow:

[BD-1]

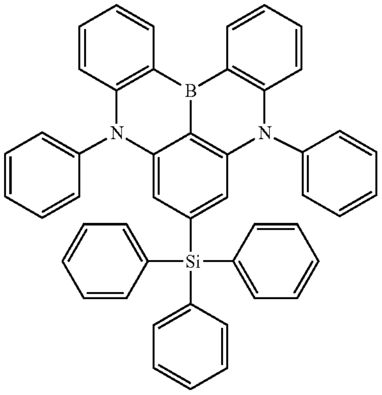

-continued

[BD-2]

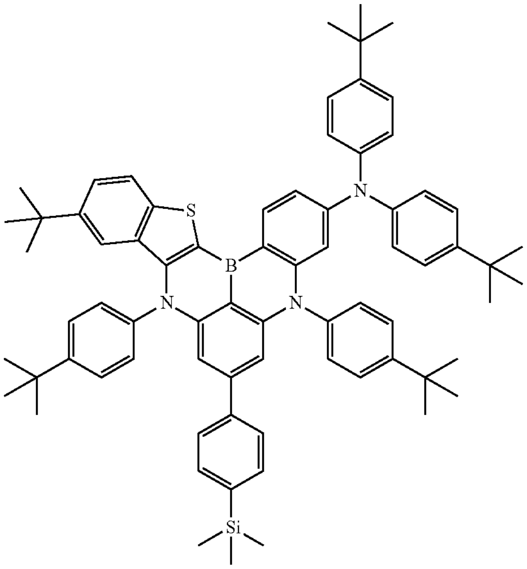

[BD-3]

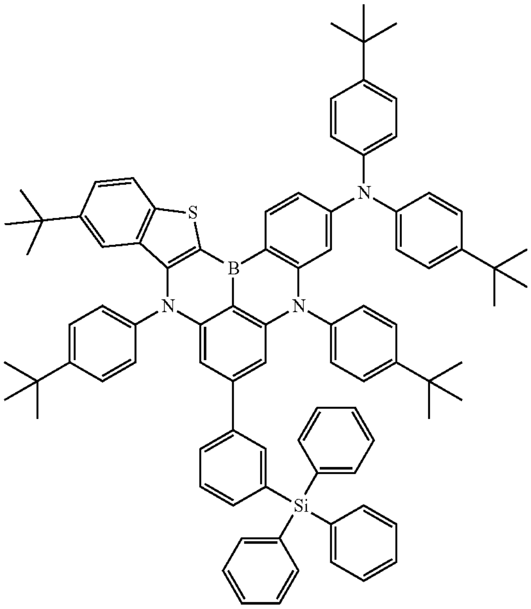

[BD-4]

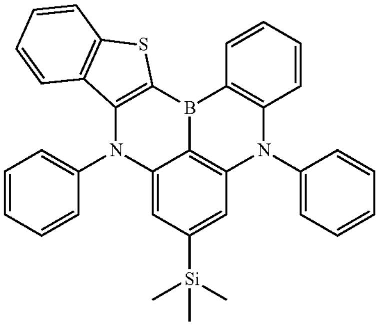

-continued

[BD-5]

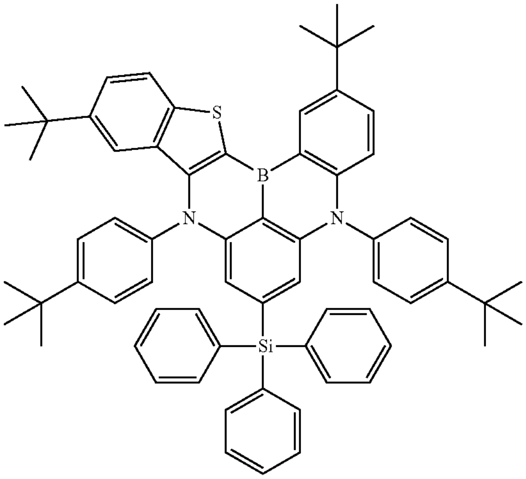

TABLE 1

| Example No. | Dopant | Current density (mA/cm$^2$) | Voltage (V) | Efficiency (EQE, %) | Lifetime (T97, hr) |
|---|---|---|---|---|---|
| Example 1 | 2 | 10 | 3.4 | 10.1 | 167 |
| Example 2 | 6 | 10 | 3.5 | 10.3 | 227 |
| Example 3 | 18 | 10 | 3.4 | 10.0 | 175 |
| Example 4 | 21 | 10 | 3.4 | 10.1 | 147 |
| Example 5 | 27 | 10 | 3.5 | 10.4 | 243 |
| Example 6 | 31 | 10 | 3.5 | 10.2 | 180 |
| Example 7 | 32 | 10 | 3.5 | 10.3 | 236 |
| Example 8 | 33 | 10 | 3.5 | 10.6 | 249 |
| Comparative Example 1 | BD-1 | 10 | 3.5 | 8.5 | 97 |
| Comparative Example 2 | BD-2 | 10 | 3.4 | 8.9 | 76 |
| Comparative Example 3 | BD-3 | 10 | 3.5 | 9.1 | 94 |
| Comparative Example 4 | BD-4 | 10 | 3.5 | 8.6 | 24 |
| Comparative Example 5 | BD-5 | 10 | 3.4 | 8.8 | 125 |

As can be seen from the results in Table 1, the organic electroluminescent devices of Examples 1-8, each of which employed the inventive compound as a dopant compound to form the light emitting layer, had significantly improved life characteristics and high external quantum efficiencies compared to the devices of Comparative Examples 1-5, each of which employed a compound whose structural features were contrasted with those of the inventive compound. These results concluded that the use of the inventive compounds makes the organic electroluminescent devices highly efficient and long lasting.

Experimental Example 1: Measurement of Full Widths at Half Maximum

The full widths at half maximum of the emission spectra of Inventive compounds 2 and 27 and Comparative compounds 1 and 2 were measured under the same conditions.

[Compound 2]

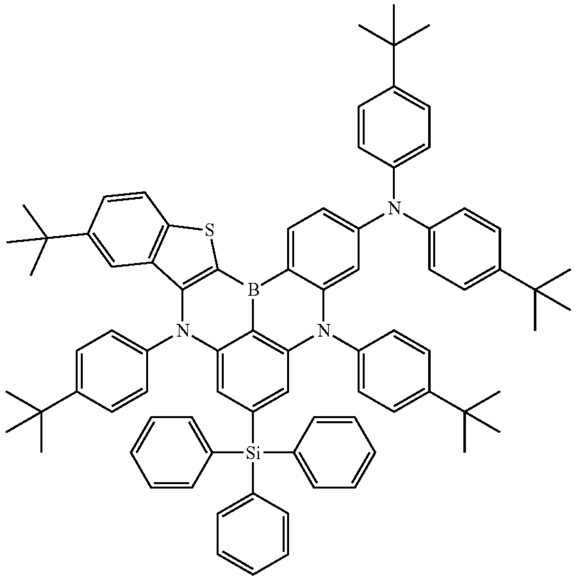

[Compound 27]

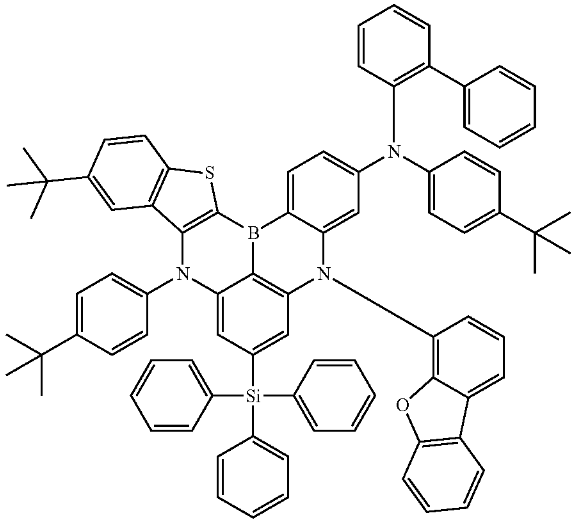

[Comparative compound 1]

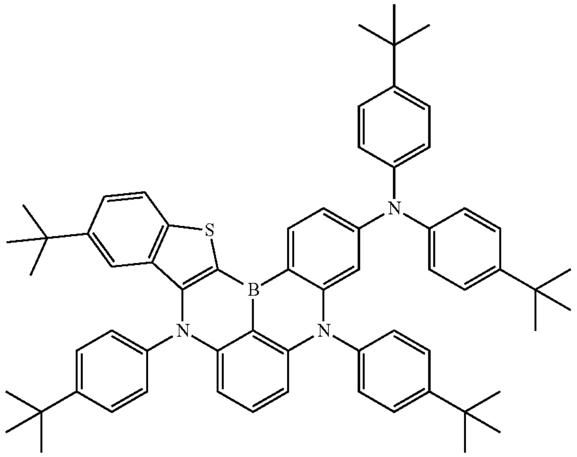

-continued

[Comparative compound 2]

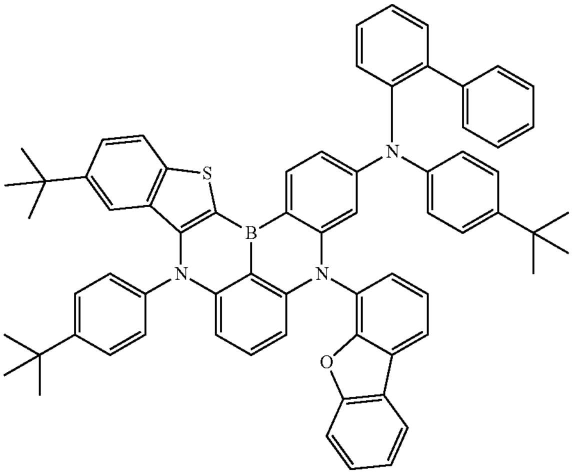

TABLE 2

| Compound | Compound 2 | Compound 27 | Comparative Compound 1 | Comparative Compound 2 |
|---|---|---|---|---|
| Full width at half maximum (nm) | 18.9 | 18.4 | 21.8 | 21.6 |

As can be seen from the results in Table 2, the full widths at half maximum of the emission spectra of the inventive silane-substituted polycyclic compounds were below 20 nm, unlike those of the comparative compounds. Therefore, the use of the inventive compounds as dopants in light emitting layers of organic electroluminescent devices is expected to increase the efficiency of the devices. In addition, the reduced full widths at half maximum are expected to improve in the color purity of the devices.

Examples 11-14: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. The compound represented by Acceptor-1 as an electron acceptor and the compound represented by Formula F were deposited in a ratio of 2:98 on the ITO to form a 100 Å thick hole injecting layer. The compound represented by Formula F was used to form a 550 Å thick hole transport layer. Subsequently, the compound represented by Formula G was used to form a 50 Å thick electron blocking layer. A mixture of the host represented by BH-1 and the inventive compound represented by Formula 1 or 2 (2 wt %) was used to form a 200 Å thick light emitting layer. Thereafter, the compound represented by Formula H was used to form a 50 Å hole blocking layer on the light emitting layer. A mixture of the compound represented by Formula E-1 and the compound represented by Formula E-2 in a ratio of 1:1 was used to form a 250 Å thick electron transport layer on the hole blocking layer. The compound represented by Formula E-2 was used to form a 10 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

[BH-1]

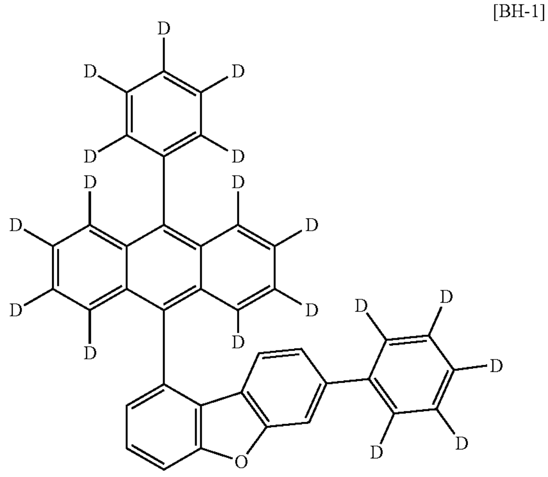 [SMILES: [2H]c1c([2H])c([2H])c(-c2ccc3c(c2)oc2cccc(-c4c5c([2H])c([2H])c([2H])c([2H])c5c(-c5c([2H])c([2H])c([2H])c([2H])c5[2H])c5c([2H])c([2H])c([2H])c([2H])c45)c23)c([2H])c1[2H]]

Comparative Examples 11-14

Organic electroluminescent devices were fabricated in the same manner as in Examples 11-14, except that BH1 was used as a host compound to form a light emitting layer instead of BH-1. The luminescent properties of the organic electroluminescent devices were measured at 0.4 mA. BH1 was used in Examples 1-8.

TABLE 3

| Example No. | Host | Dopant | Voltage (V) | Efficiency (EQE, %) | Lifetime (T97, hr) |
|---|---|---|---|---|---|
| Example 11 | BH-1 | 6 | 3.5 | 10.7 | 384 |
| Example 12 | BH-1 | 27 | 3.5 | 11.1 | 422 |
| Example 13 | BH-1 | 32 | 3.5 | 10.9 | 401 |
| Example 14 | BH-1 | 33 | 3.5 | 11.2 | 425 |
| Comparative Example 11 | BH1 | 6 | 3.5 | 10.3 | 227 |
| Comparative Example 12 | BH1 | 27 | 3.5 | 10.4 | 243 |
| Comparative Example 13 | BH1 | 32 | 3.5 | 10.3 | 236 |
| Comparative Example 14 | BH1 | 33 | 3.5 | 10.6 | 249 |

As can be seen from the results in Table 3, the organic electroluminescent devices of Examples 11-14, each of which employed the inventive boron-containing polycyclic compound as a dopant and the anthracene derivative having an anthracene skeleton as a host to form the light emitting layer, had improved luminous efficiencies and long lifetimes.

In addition, the use of the deuterated anthracene derivative led to improved characteristics of the devices of Examples 11-14 compared to the devices of Comparative Examples 11 to 14.

Examples 15-18: Fabrication of Organic Electroluminescent Devices

Organic electroluminescent devices were fabricated in the same manner as in Examples 11-14, except that BH-3 was used as a host compound to form a light emitting layer instead of BH-1. The luminescent properties of the organic electroluminescent devices were measured at 0.4 mA. The structure of BH-3 is as follow:

[BH-3]

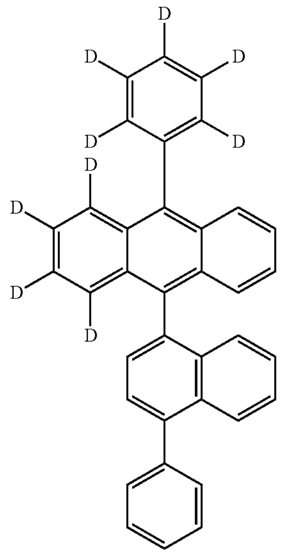

Comparative Examples 15-18

Organic electroluminescent devices were fabricated in the same manner as in Examples 15-18, except that BH-4 was used as a host compound to form a light emitting layer instead of BH-3. The luminescent properties of the organic electroluminescent devices were measured at 0.4 mA. The structure of BH-4 is as follow:

[BH-4]

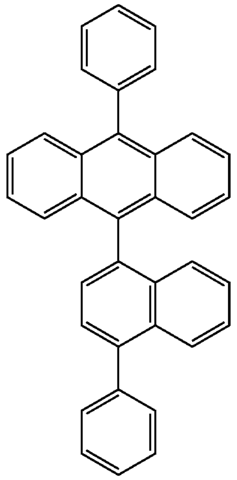

TABLE 4

| Example No. | Host | Dopant | Voltage (V) | Efficiency (EQE, %) | Lifetime (T97, hr) |
|---|---|---|---|---|---|
| Example 15 | BH-3 | 6 | 4.0 | 10.6 | 241 |
| Example 16 | BH-3 | 27 | 4.1 | 10.8 | 257 |
| Example 17 | BH-3 | 32 | 4.0 | 10.9 | 267 |
| Example 18 | BH-3 | 33 | 4.1 | 11.1 | 272 |
| Comparative Example 15 | BH-4 | 6 | 4.0 | 10.5 | 220 |
| Comparative Example 16 | BH-4 | 27 | 4.0 | 10.8 | 234 |
| Comparative Example 17 | BH-4 | 32 | 4.0 | 10.8 | 232 |
| Comparative Example 18 | BH-4 | 33 | 4.0 | 11.0 | 245 |

As can be seen from the results in Table 4, the organic electroluminescent devices of Examples 15-18, each of which employed the inventive boron-containing polycyclic compound as a dopant and the deuterated anthracene derivative as a host to form the light emitting layer, had improved luminous efficiencies and long lifetimes.

In addition, the devices of Examples 15-18 employing the deuterated anthracene derivative showed improved life characteristics compared to the devices of Comparative Examples 15-18 employing the undeuterated anthracene derivative.

As can be seen from the results in Tables 3 and 4, the organic electroluminescent devices of Examples 11-18, each of which employed the inventive dopant compound and the host compound to form the light emitting layer, showed improved luminous efficiencies and excellent life characteristics compared to the devices of Comparative Examples 11-18, each of which employed a compound whose structural features were contrasted with those of the inventive compound. These results concluded that the use of the inventive compounds makes the organic electroluminescent devices long lasting and highly efficient.

What is claimed is:

1. A polycyclic compound represented by Formula 1 or 2:

(1)

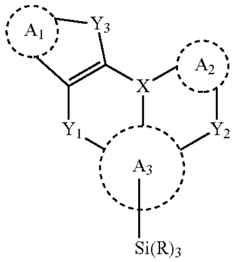

(2)

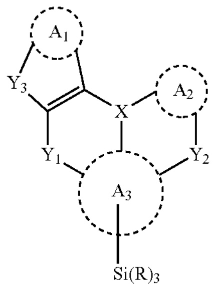

wherein X is B, P═O, P═S or $A_1$, $Y_1$ and $Y_2$ are each independently $NR_1$, O, S, $CR_2R_3$ or $SiR_4R_5$, $Y_3$ is O or S, $A_1$ to $A_3$ are each independently selected from substituted or unsubstituted $C_5$-$C_{50}$ aromatic hydrocarbon rings, substituted or unsubstituted $C_2$-$C_{50}$ aromatic heterocyclic rings, substituted or unsubstituted $C_3$-$C_{30}$ aliphatic rings, and substituted or unsubstituted $C_3$-$C_{30}$ mixed aliphatic-aromatic rings, with the proviso that $A_2$ essentially has a substituted or unsubstituted amine group as a substituent, and R and $R_1$ to $R_5$ are identical to or different from each other and are each independently selected from hydrogen, deuterium, substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted $C_3$-$C_{30}$ mixed aliphatic-aromatic cyclic groups, nitro, cyano, and halogen, with the proviso that the groups R are other than substituted or unsubstituted $C_1$-$C_{30}$ alkyl, each of $R_1$ to $R_5$ optionally forms an alicyclic or aromatic monocyclic or polycyclic ring with one or more of the rings $A_1$ to $A_3$, the groups R are optionally linked to each other to form an alicyclic or aromatic monocyclic or polycyclic ring, $R_2$ and $R_3$ together optionally form an alicyclic or aromatic monocyclic or polycyclic ring, and $R_4$ and $R_5$ together optionally form an alicyclic or aromatic monocyclic or polycyclic ring.

2. The polycyclic compound according to claim 1, wherein the polycyclic compound of Formula 1 is represented by Formula 1-1:

(1-1)

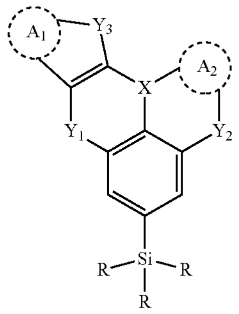

wherein $A_1$, $A_2$, X, $Y_1$ to $Y_3$, and R are as defined in Formula 1, and the polycyclic compound of Formula 2 is represented by Formula 2-1:

(2-1)

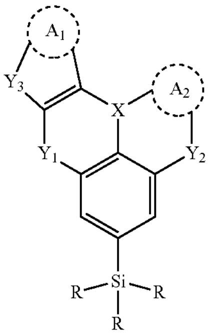

wherein $A_1$, $A_2$, X, $Y_1$ to $Y_3$, and R are as defined in Formula 2.

3. The polycyclic compound according to claim 2, wherein X is boron (B) and at least one of the groups R is a substituted or unsubstituted $C_6$-$C_{30}$ aryl group.

4. The polycyclic compound according to claim 1, wherein at least one of $Y_1$ and $Y_2$ is $NR_1$ and $R_1$ is a substituted or unsubstituted $C_2$-$C_{30}$ heteroaryl group.

5. The polycyclic compound according to claim 1, wherein the substituted or unsubstituted amine group as a substituent of $A_2$ is a substituted or unsubstituted diarylamine group.

6. The polycyclic compound according to claim 5, wherein at least one of the aryl groups of the diarylamine group is a substituted or unsubstituted phenyl group.

7. The polycyclic compound according to claim 6, wherein the substituent of the phenyl group is a $C_6$-$C_{20}$ aryl group in the ortho position.

8. The polycyclic compound according to claim 1, wherein at least one of the hydrogen atoms in the compound represented by Formula 1 or 2 is replaced with a deuterium atom.

9. The polycyclic compound according to claim 1, wherein the compound represented by Formula 1 or 2 is selected from the following compounds 1 to 102:

1

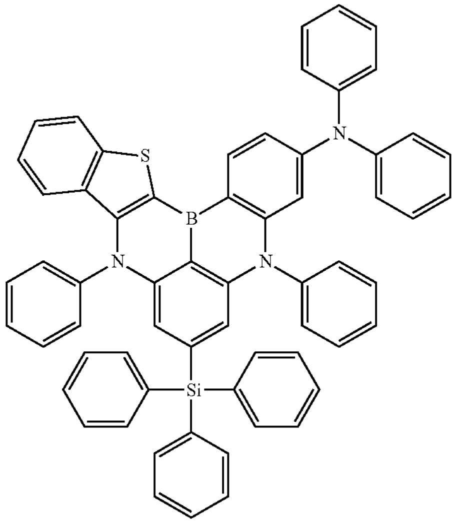

-continued

2

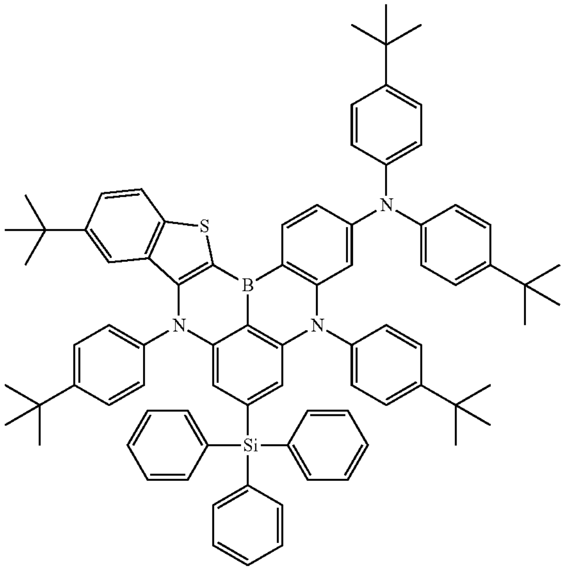

3

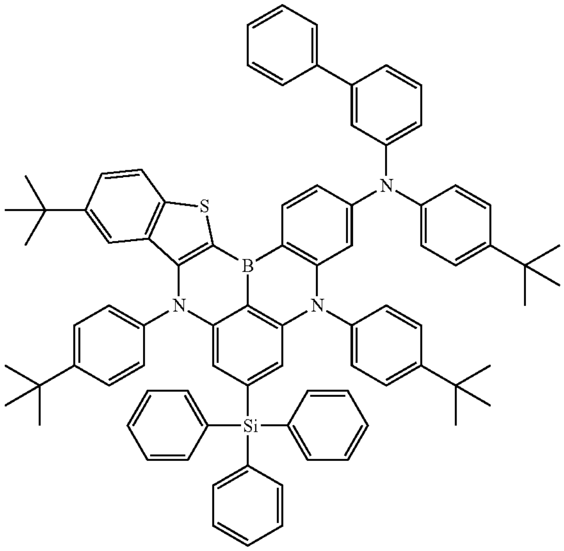

-continued
4
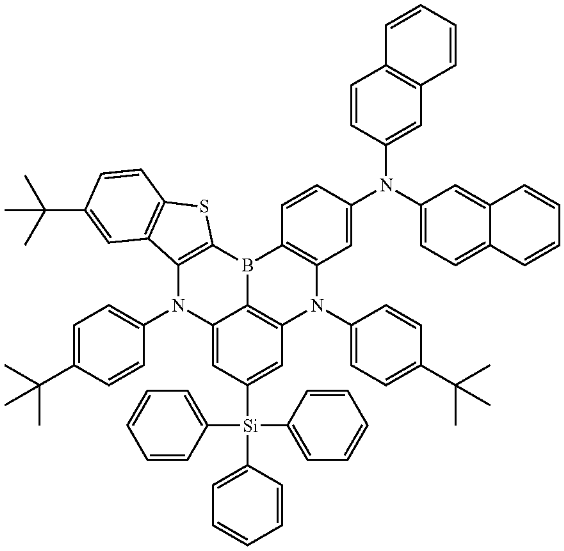
5
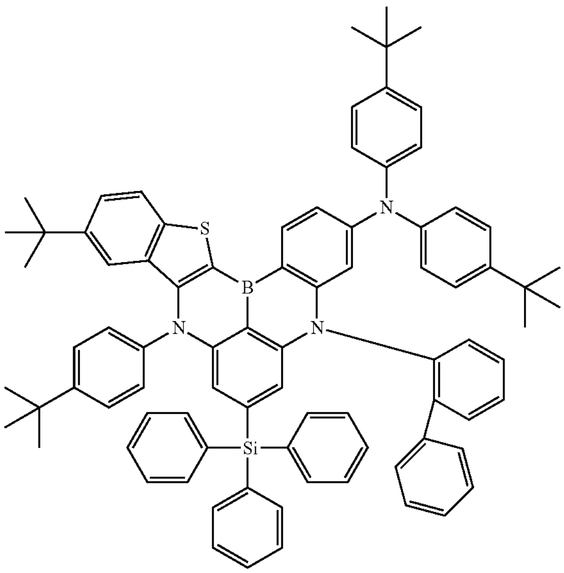
-continued
6
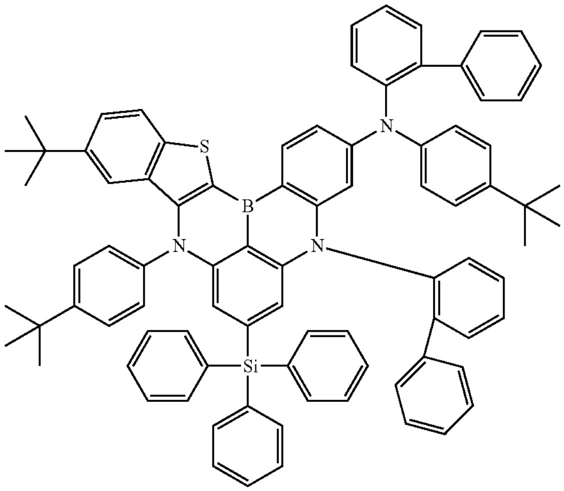
7
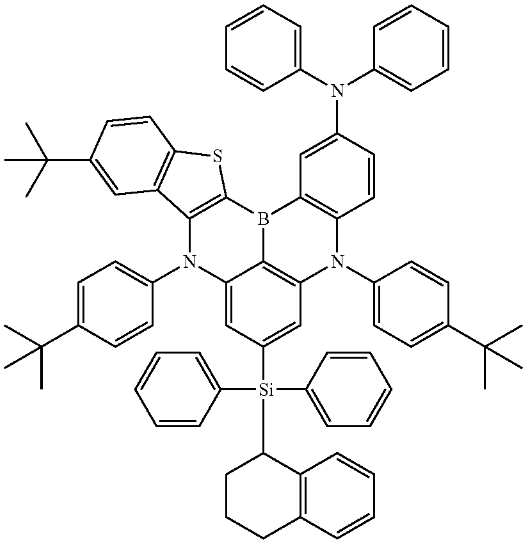
8
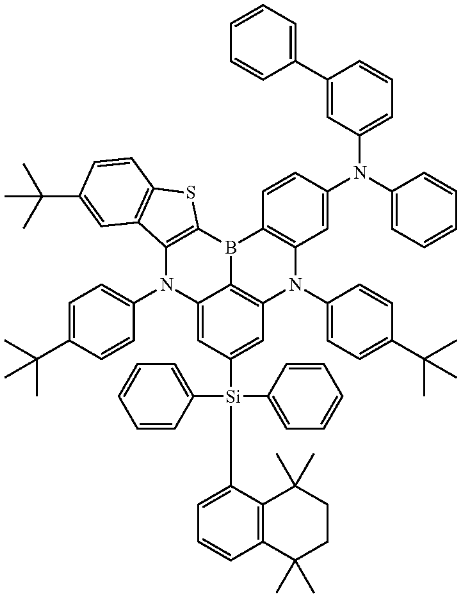

-continued
9
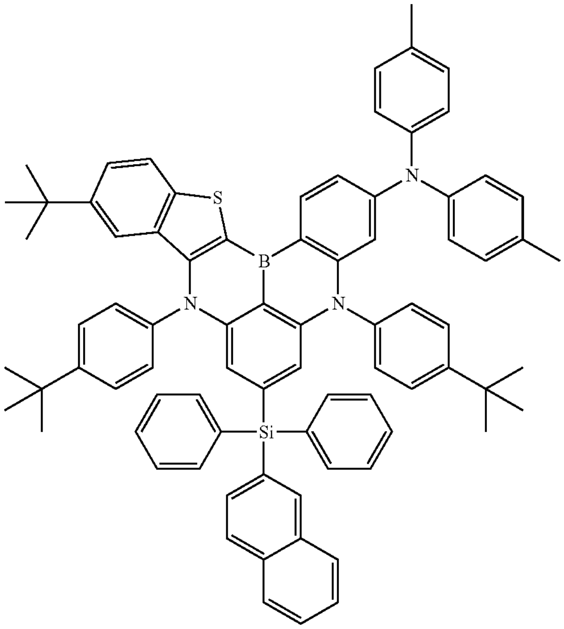
10
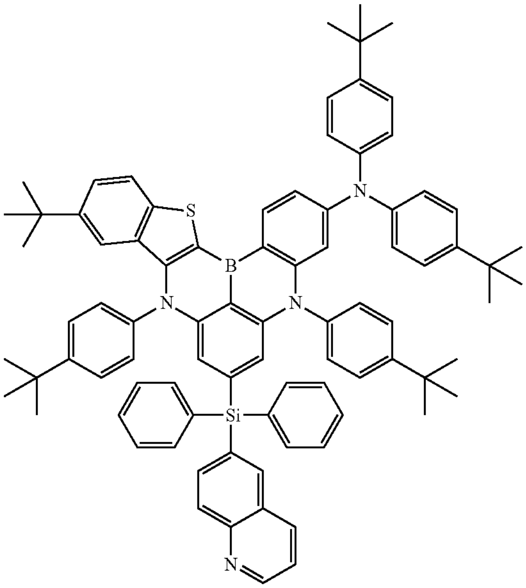
-continued
11
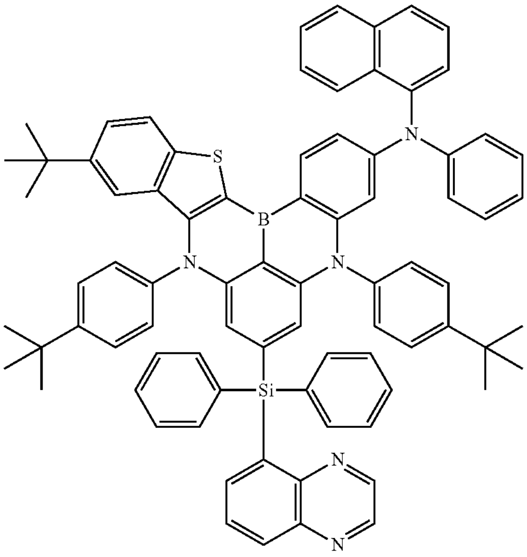
12
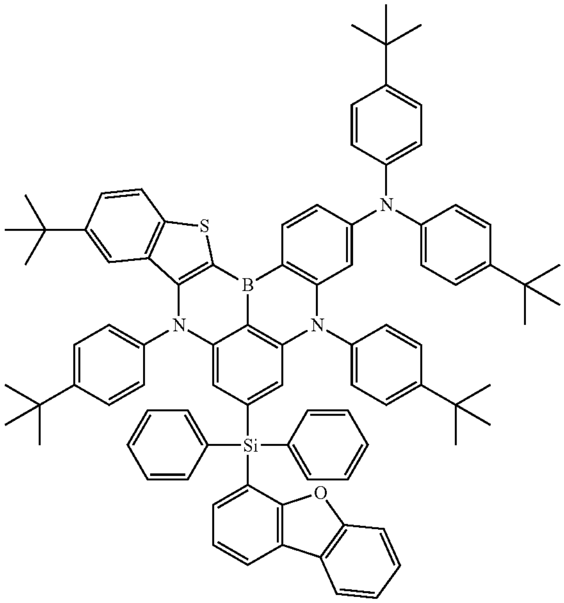

-continued
13
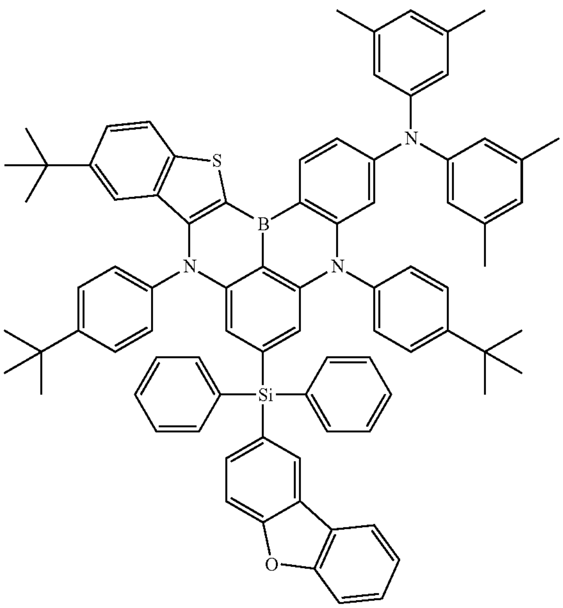
14
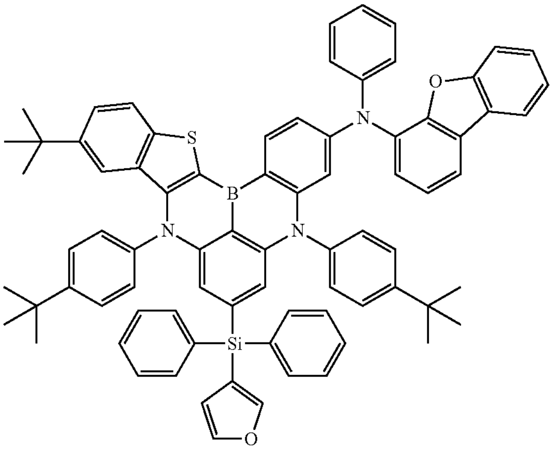
15
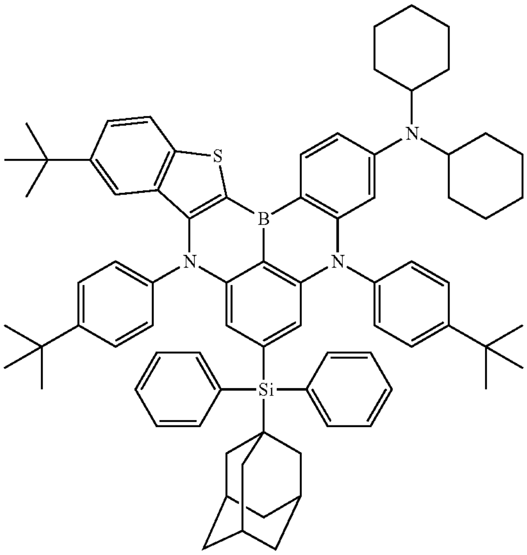
-continued
16
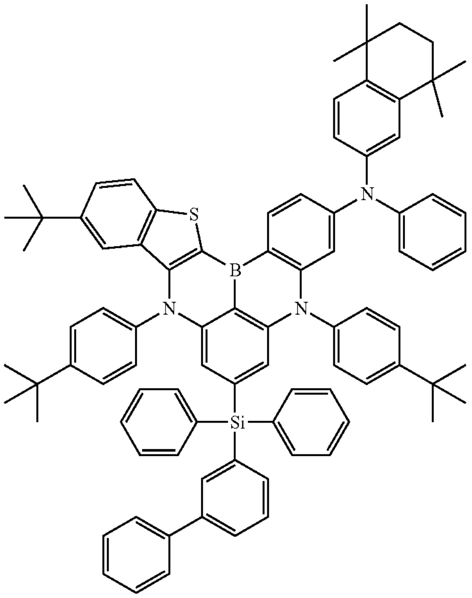
17
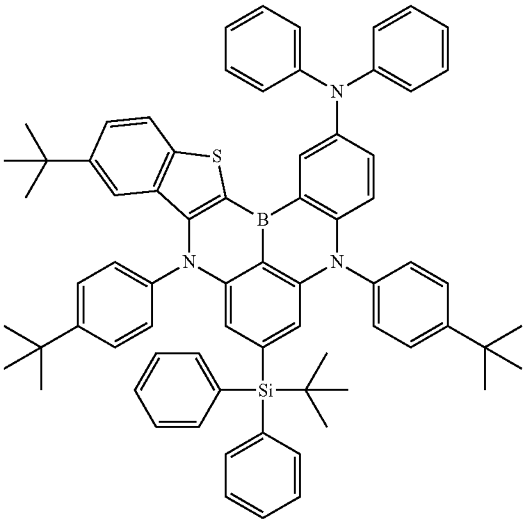

-continued
18
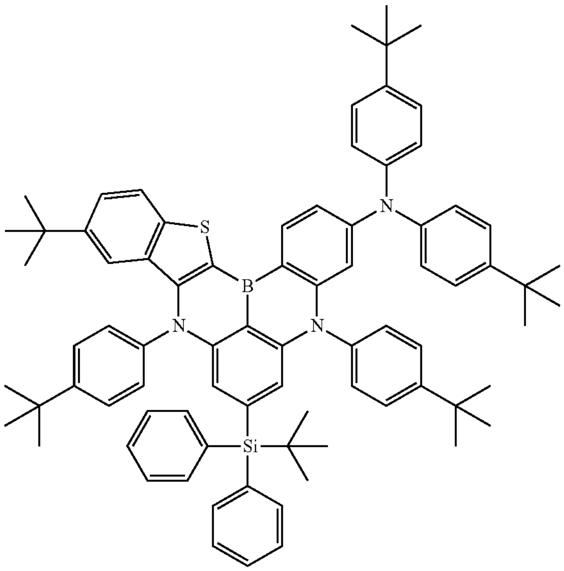
19
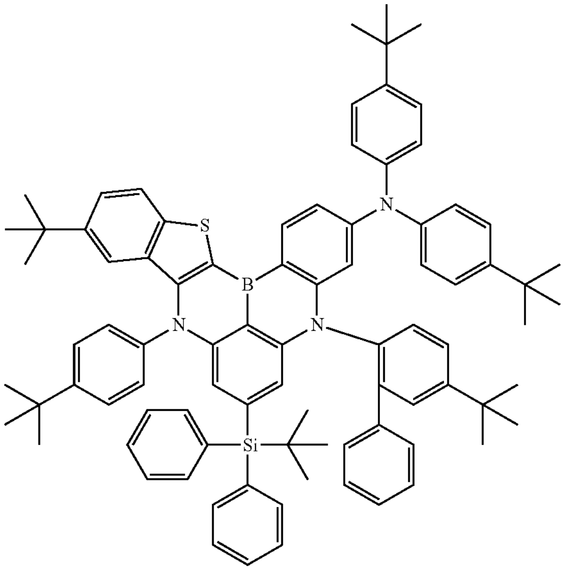
-continued
20
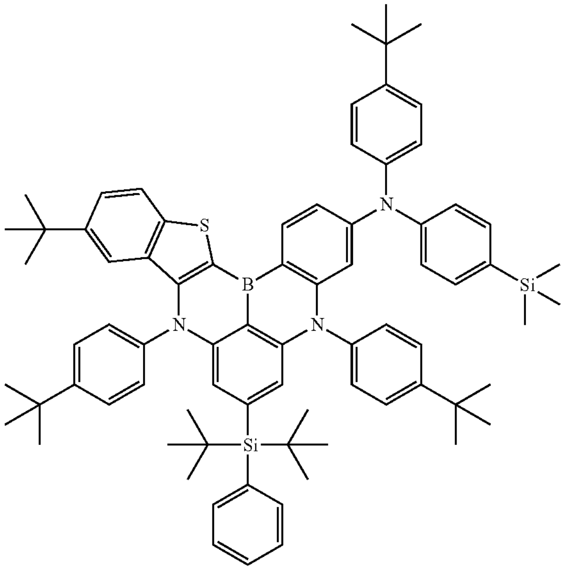
21
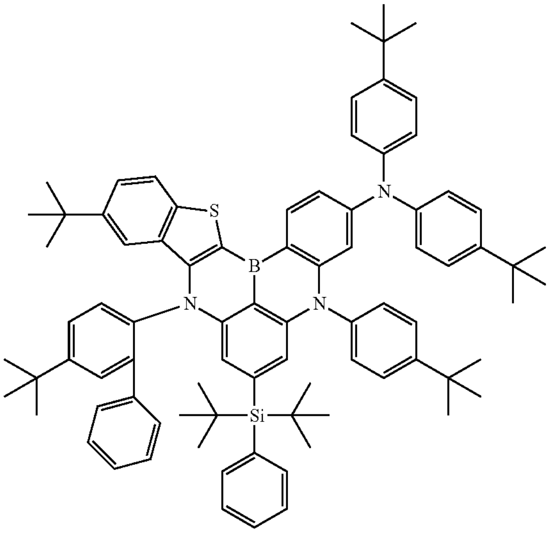
22
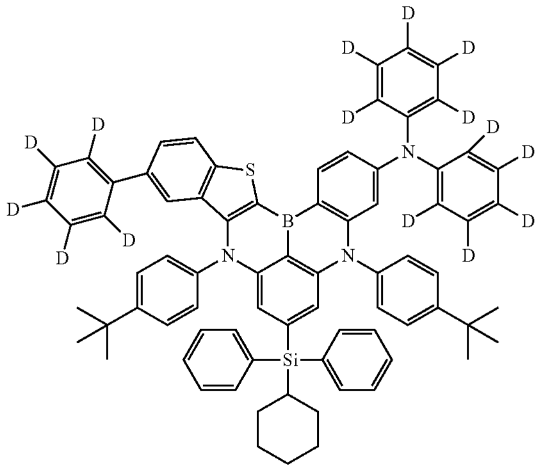

23
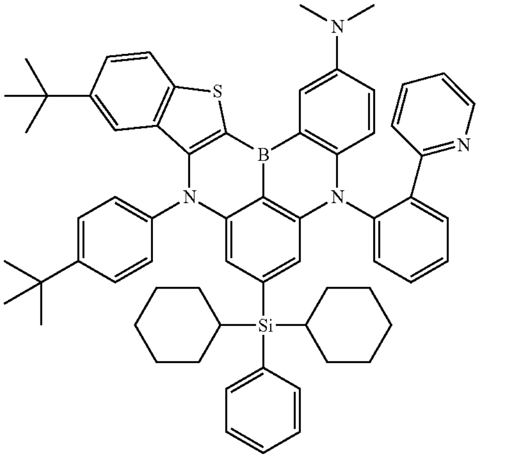
24
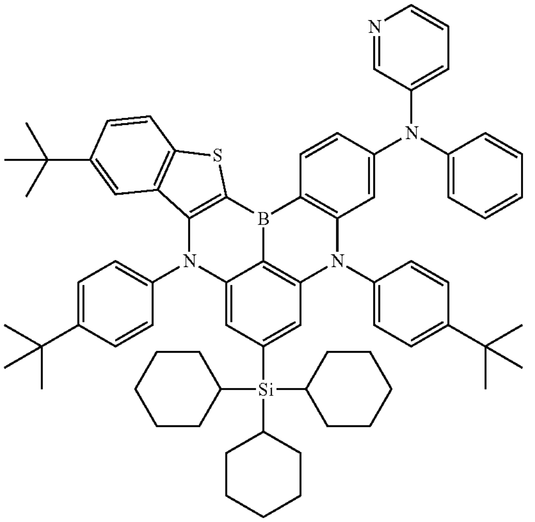
25
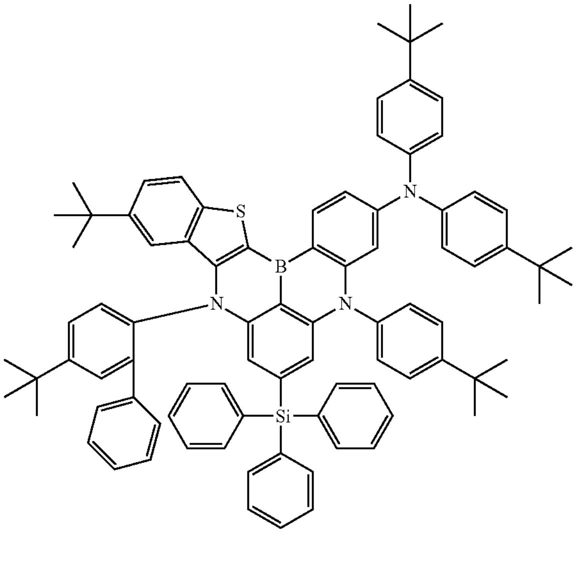
26
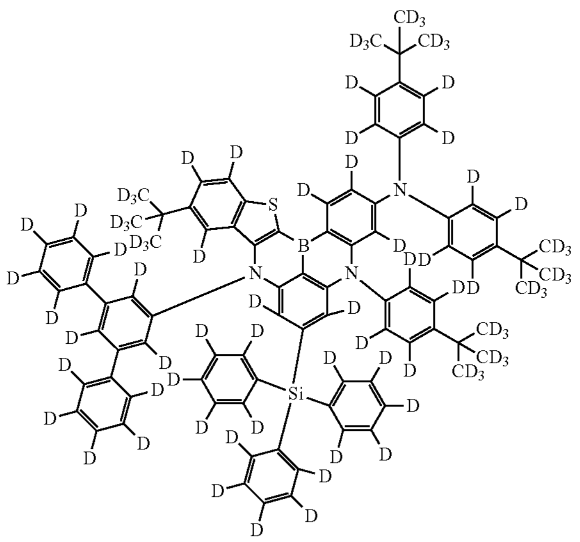
27
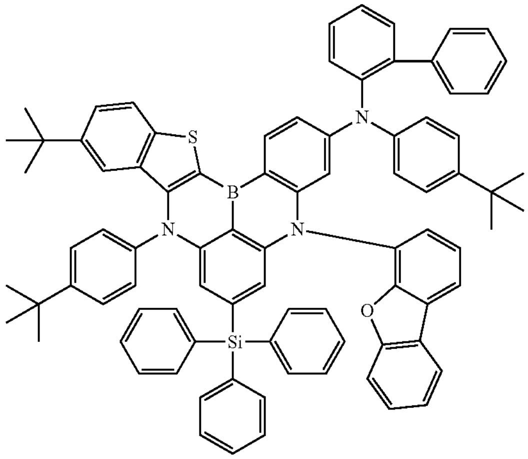
28
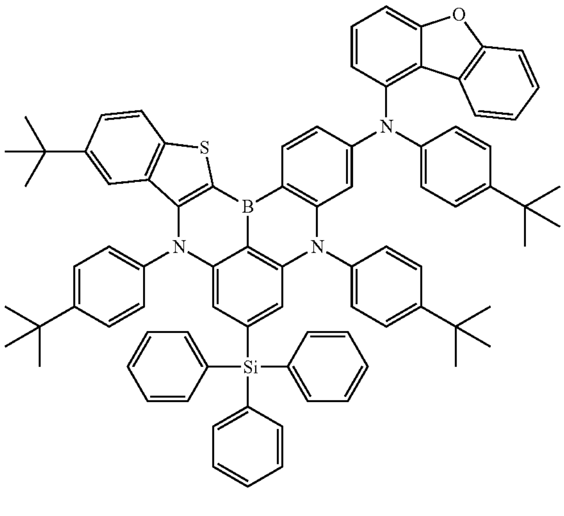

-continued
29
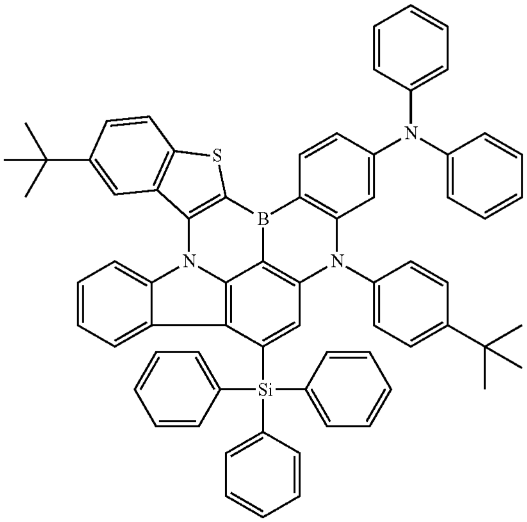
30
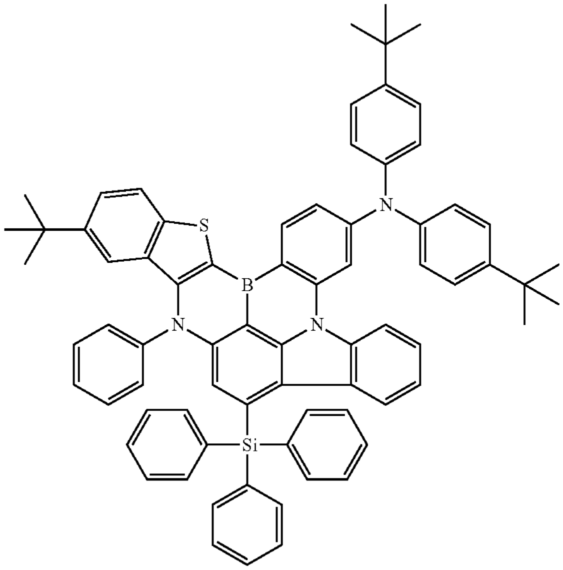
-continued
31
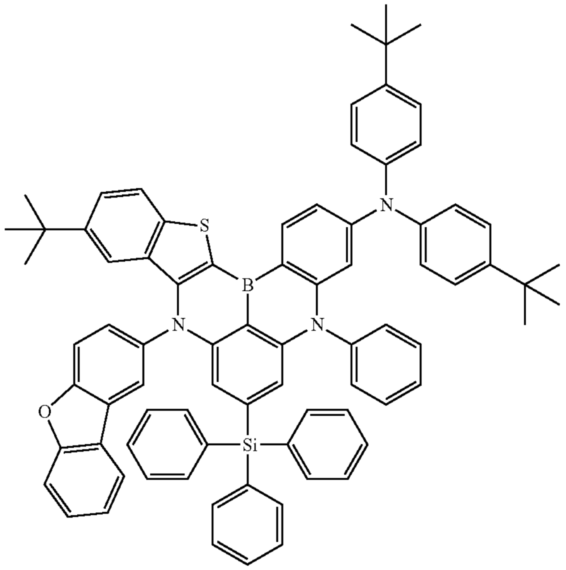
32
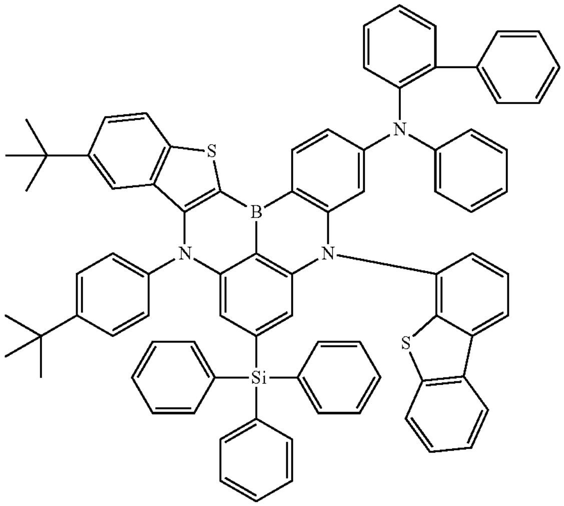
33
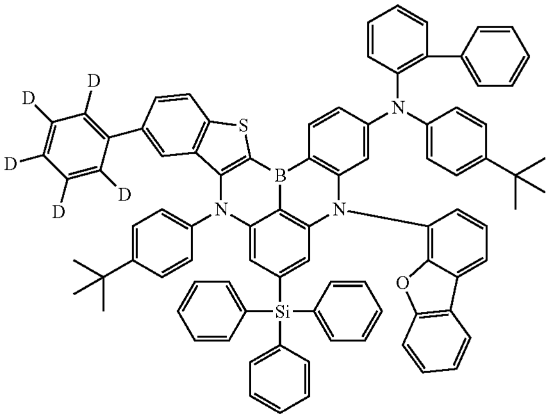

-continued
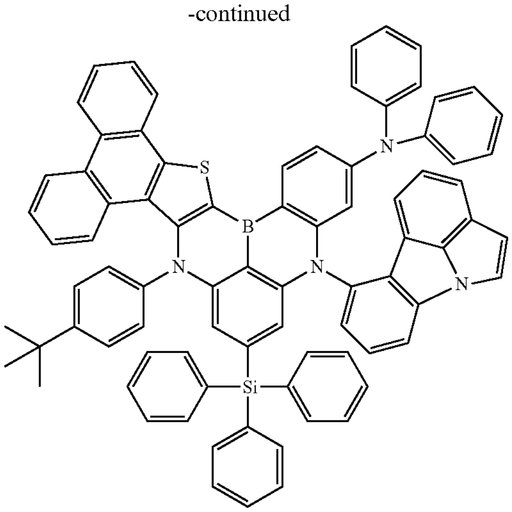
35
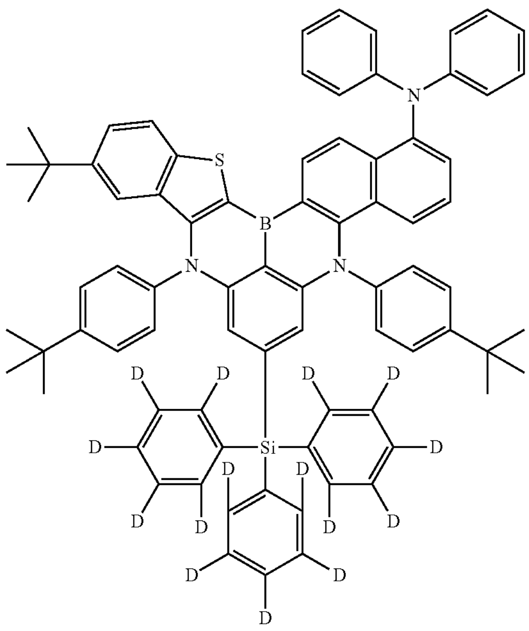
36
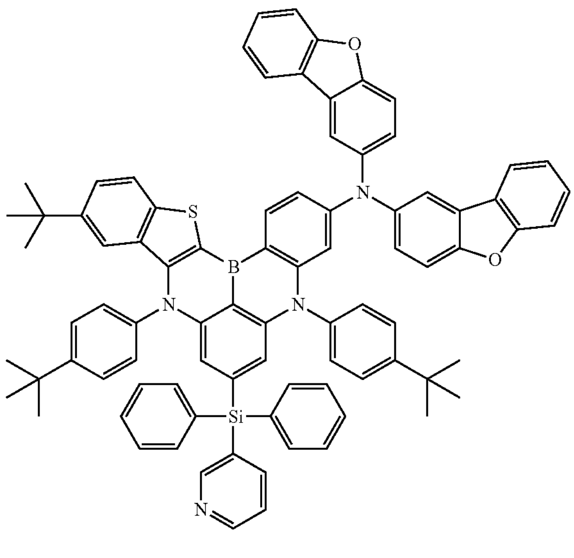
-continued
37
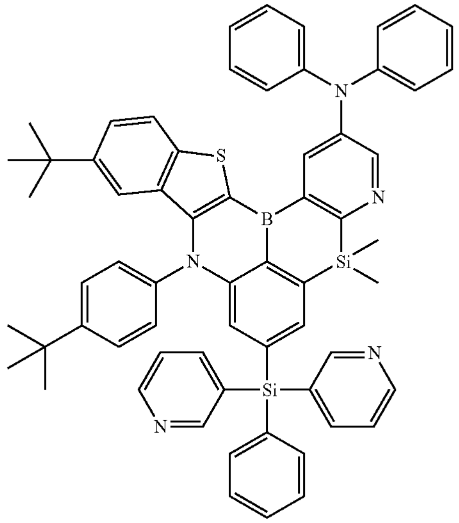
38
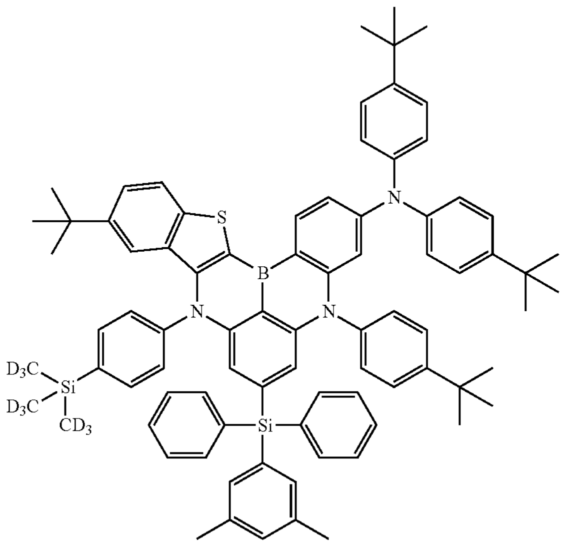
39
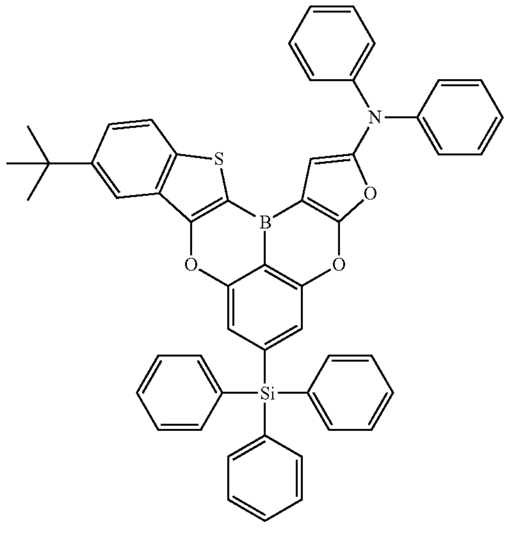

40
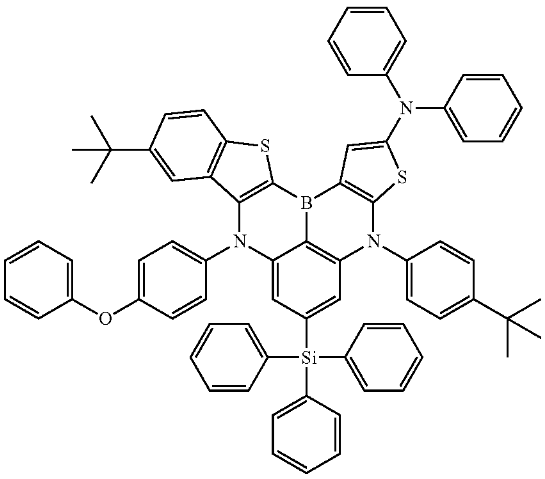
41
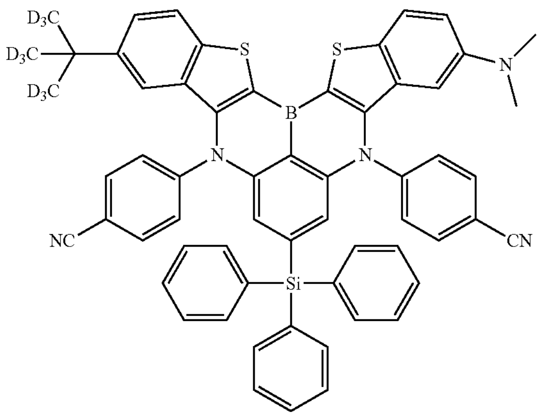
42
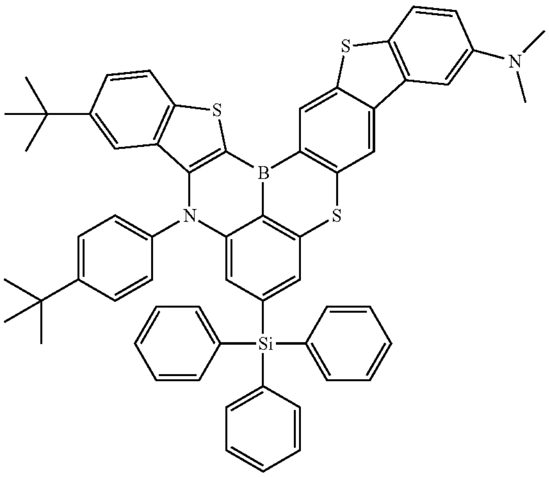
43
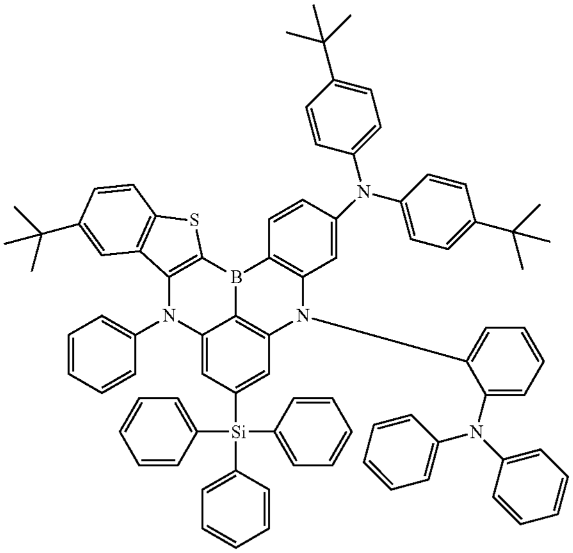
44
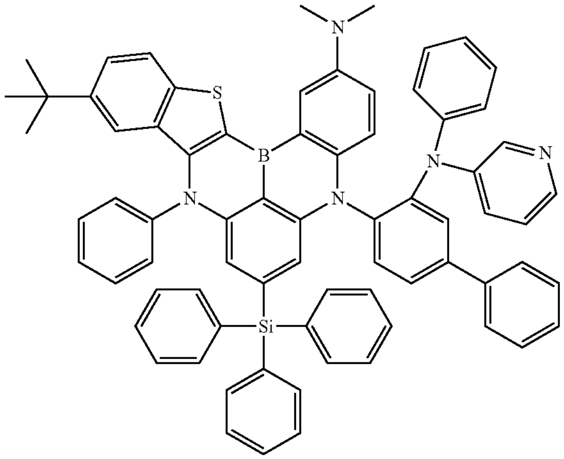
45
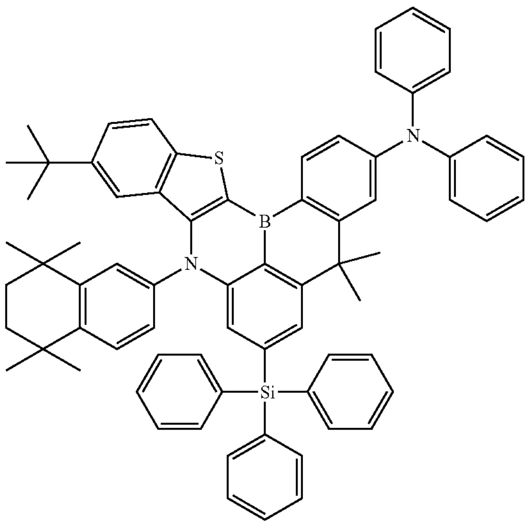

-continued
46
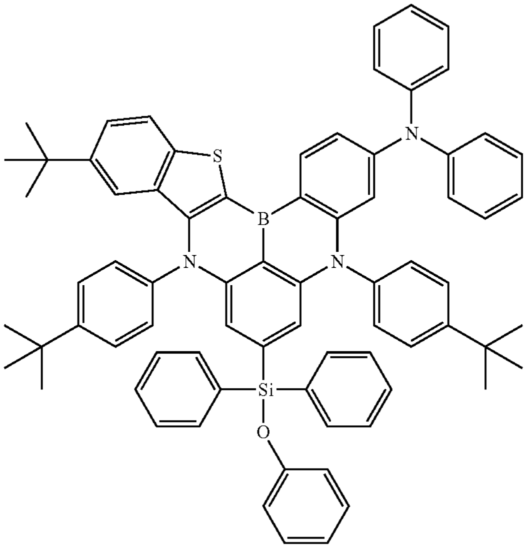
47
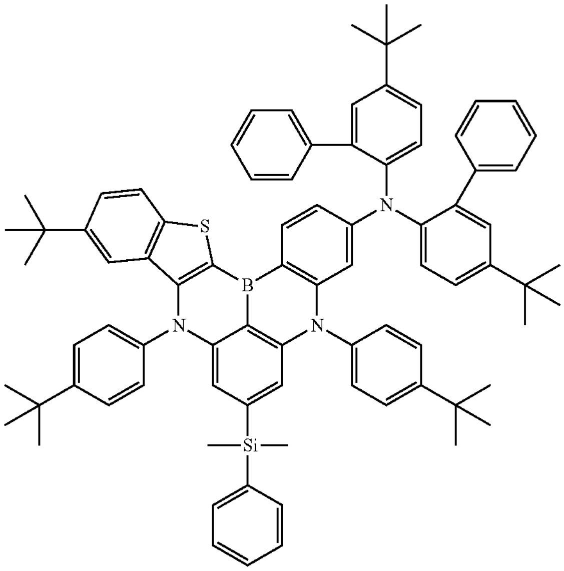
-continued
48
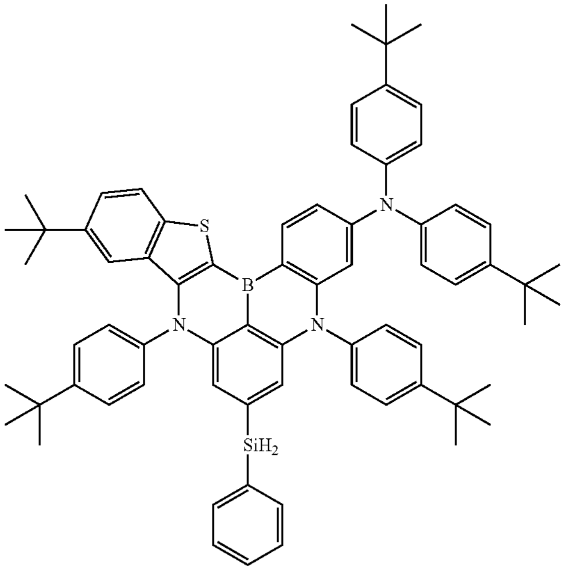
49
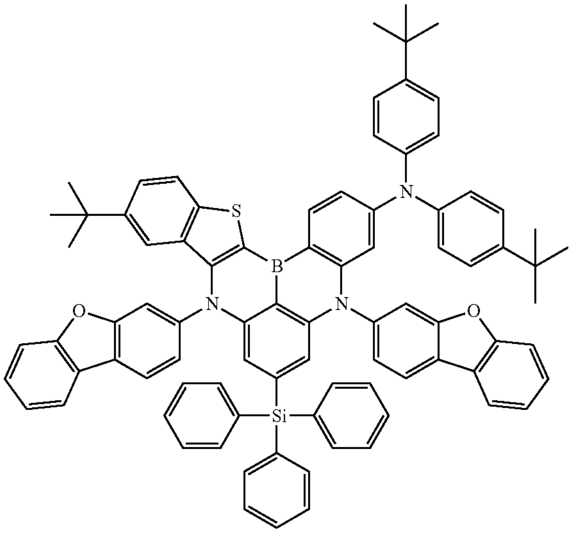

-continued
50
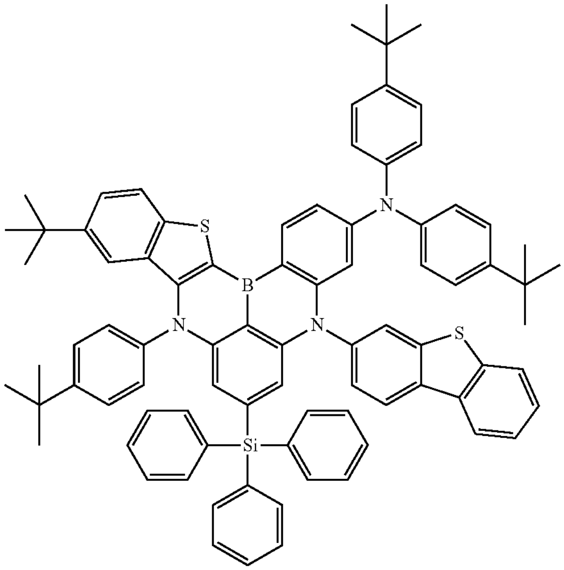
52
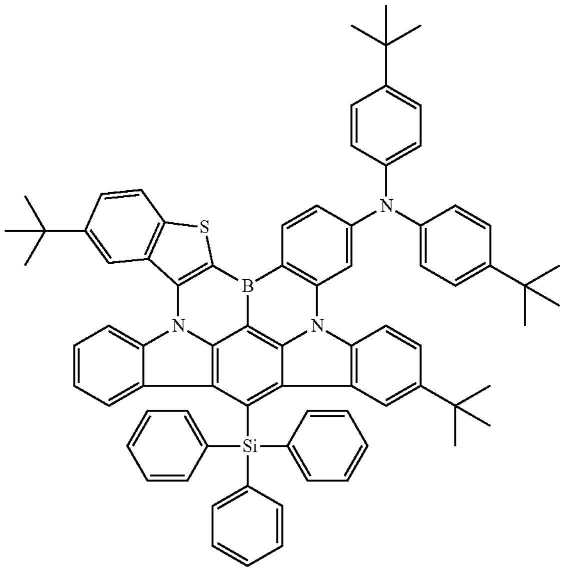
51
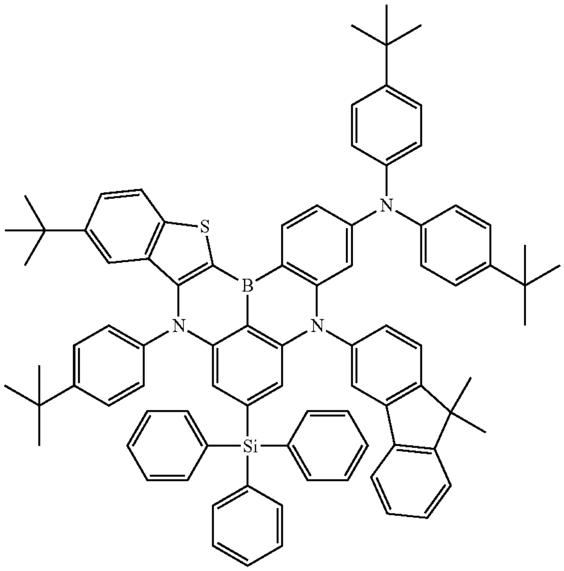
53
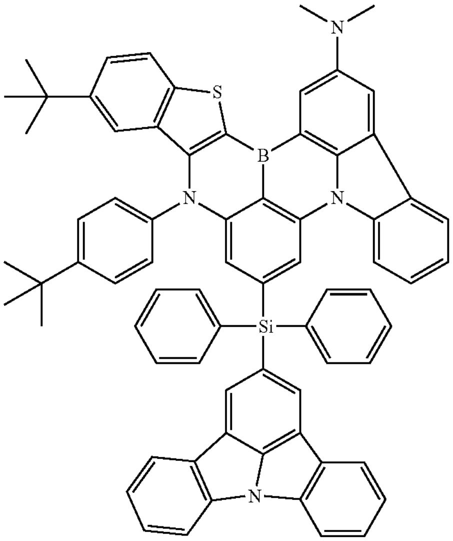

-continued
54
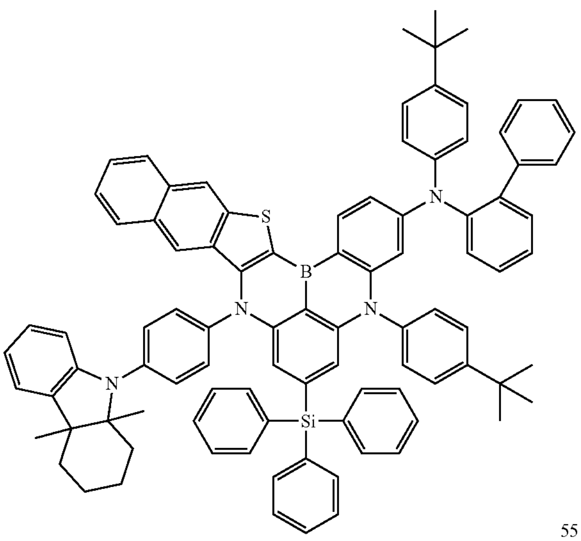
55
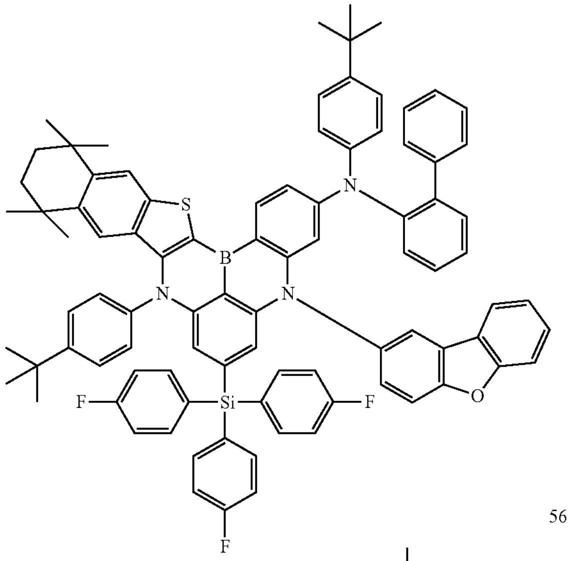
56
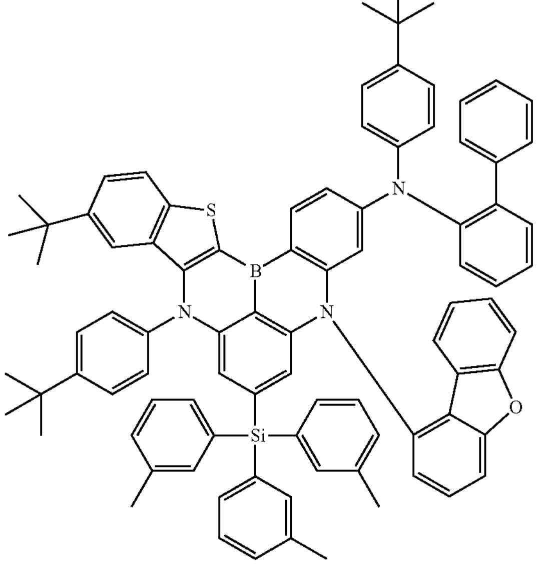
-continued
57
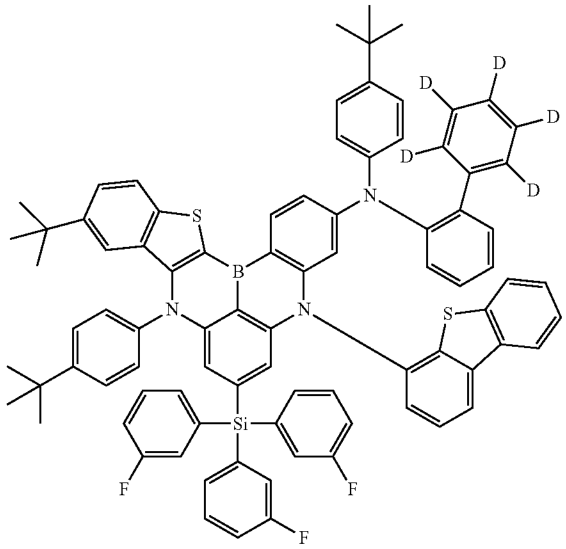
58
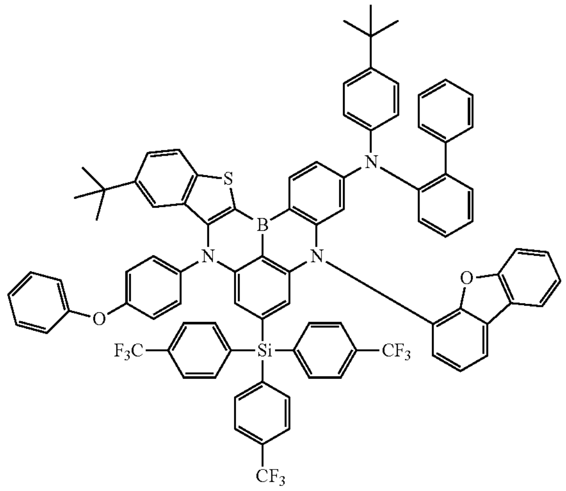
59
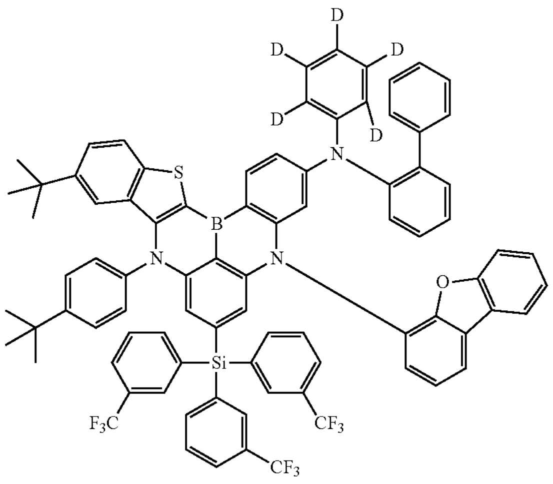

60
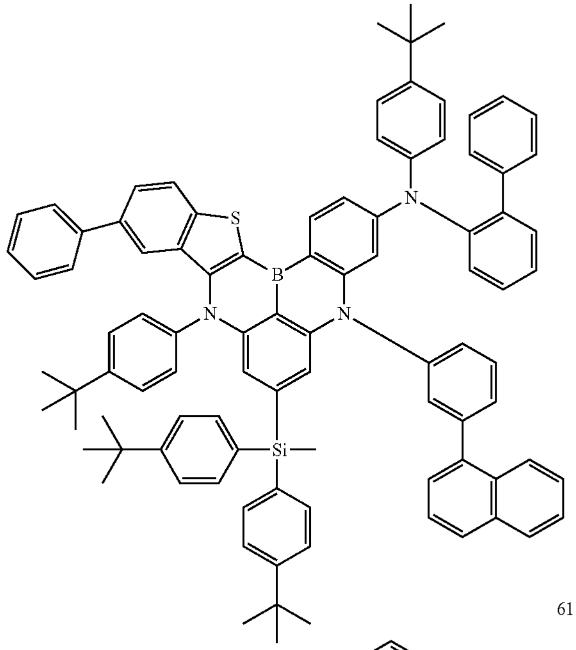
61
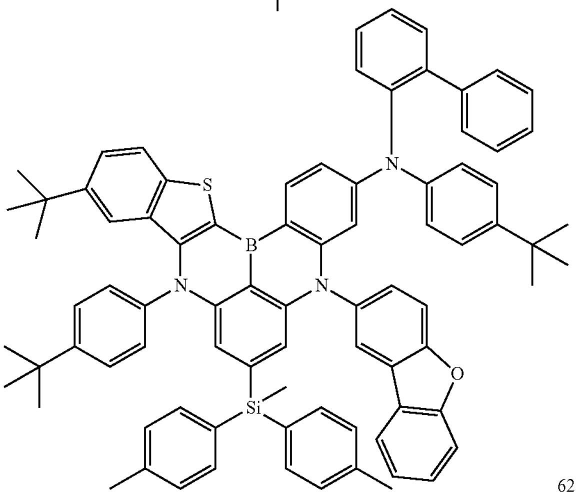
62
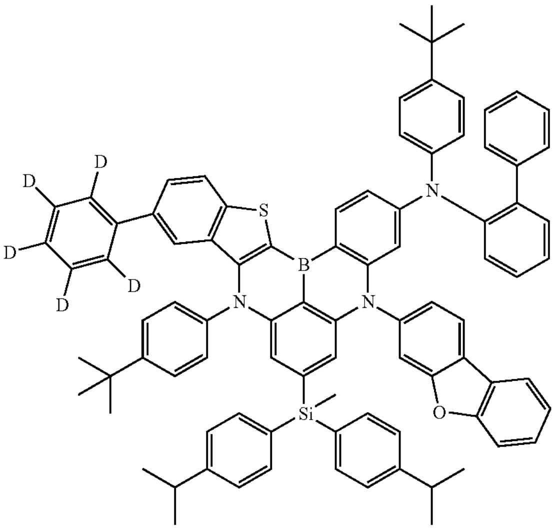
63
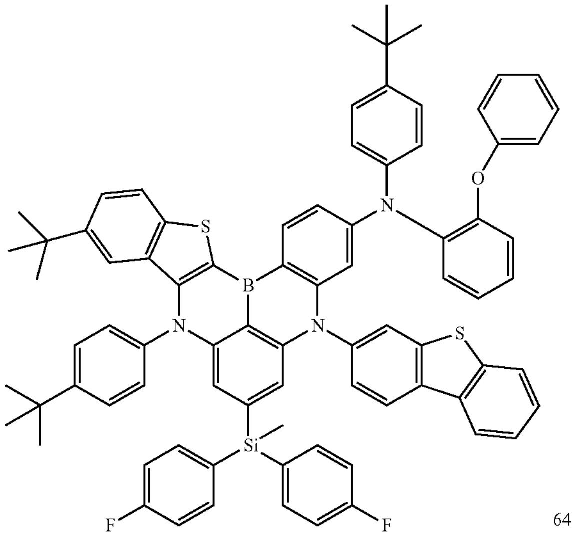
64
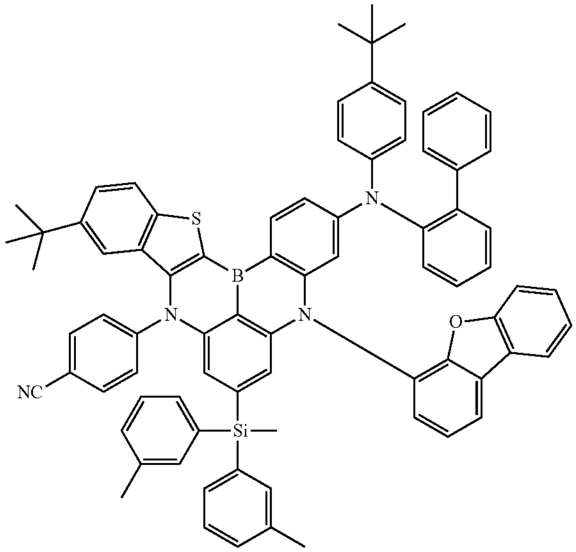
65
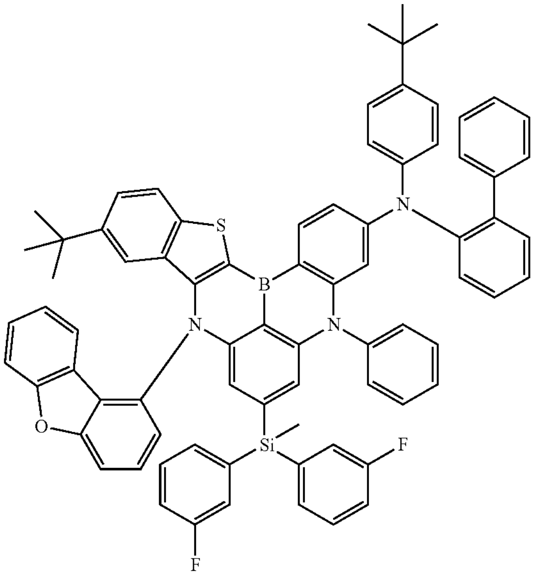

66
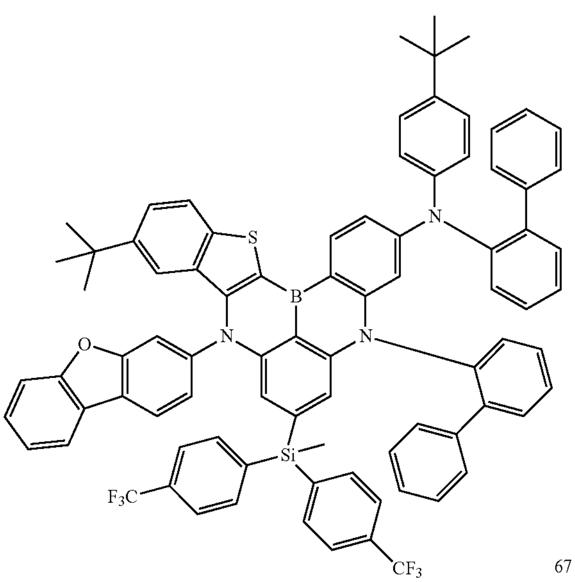
67
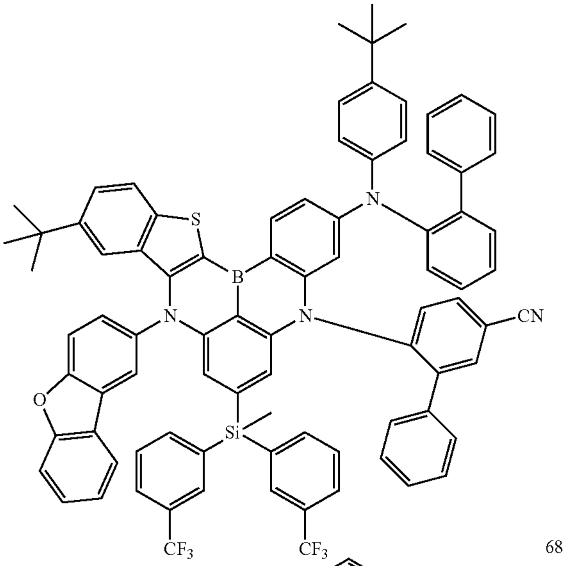
68
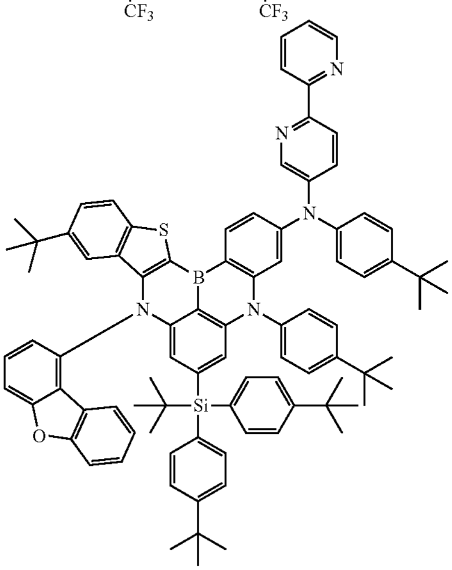
69
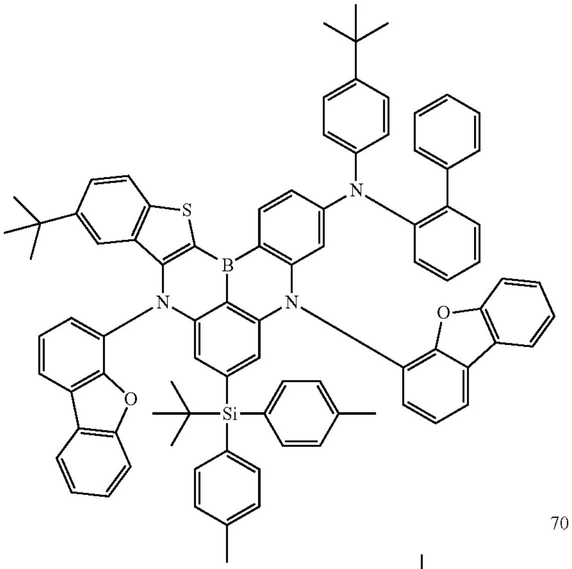
70
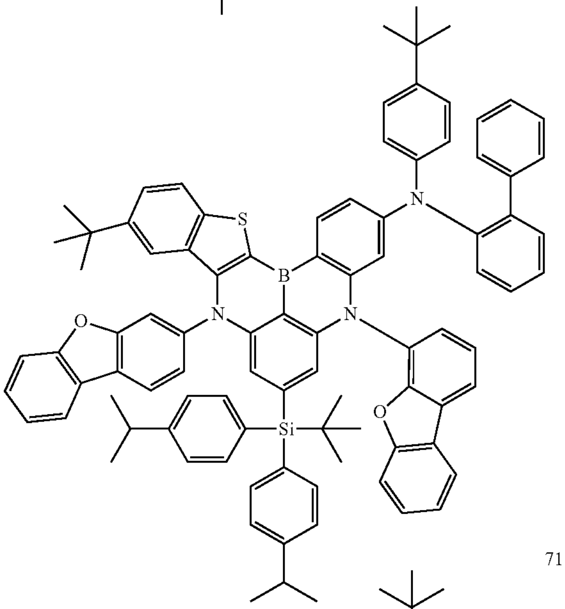
71
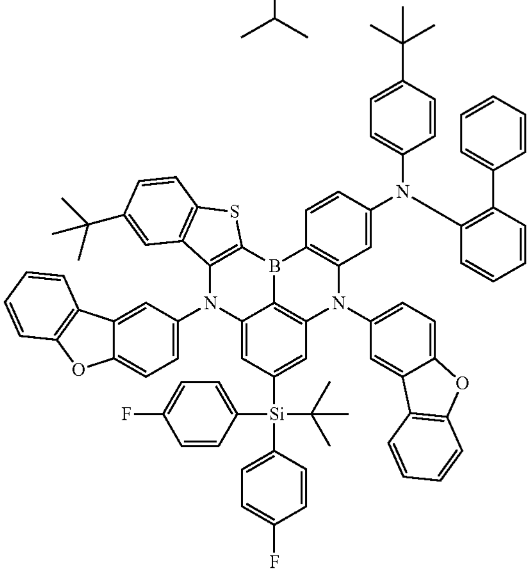

-continued
72
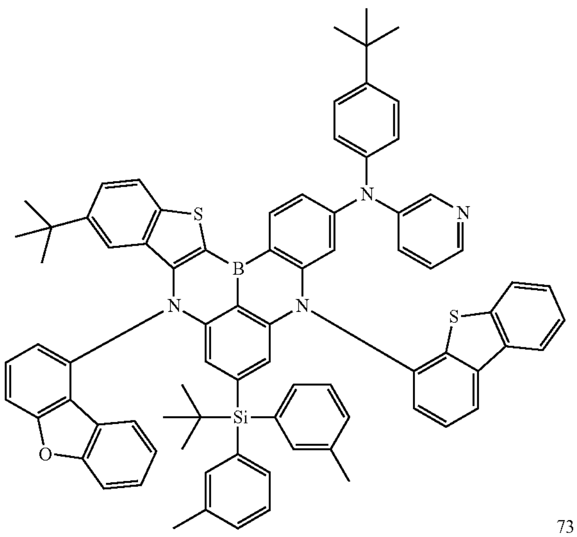
73
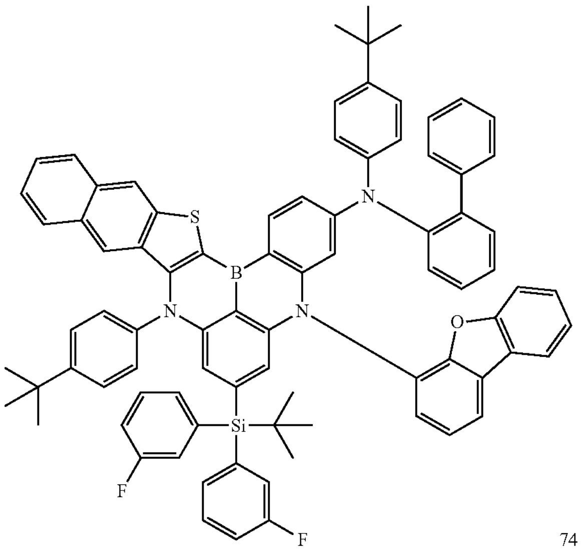
74
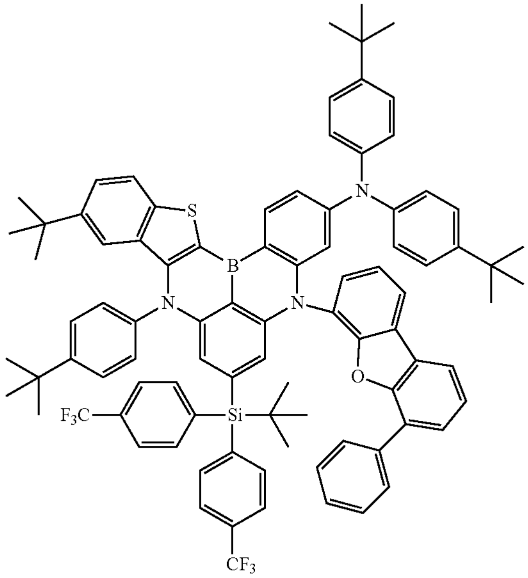
-continued
75
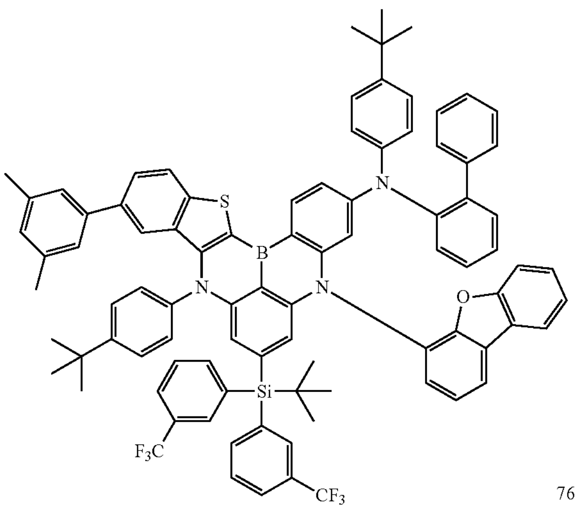
76
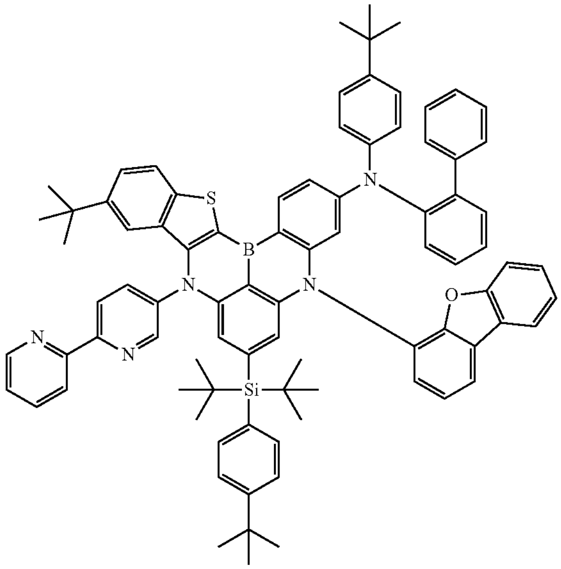
77
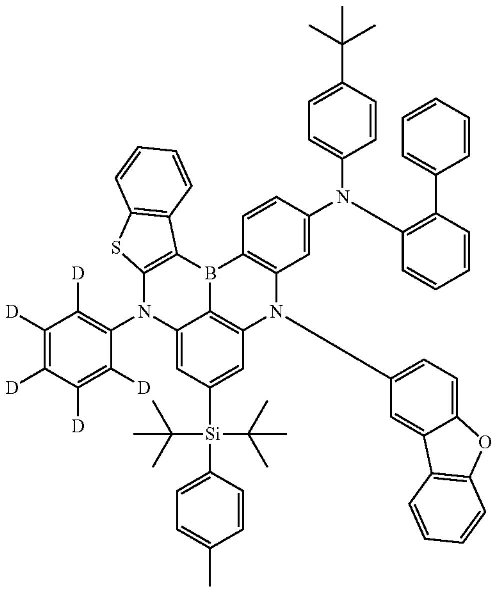

-continued
78
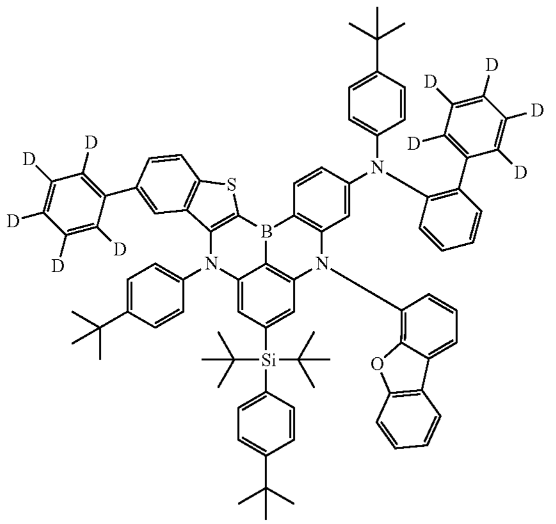
79
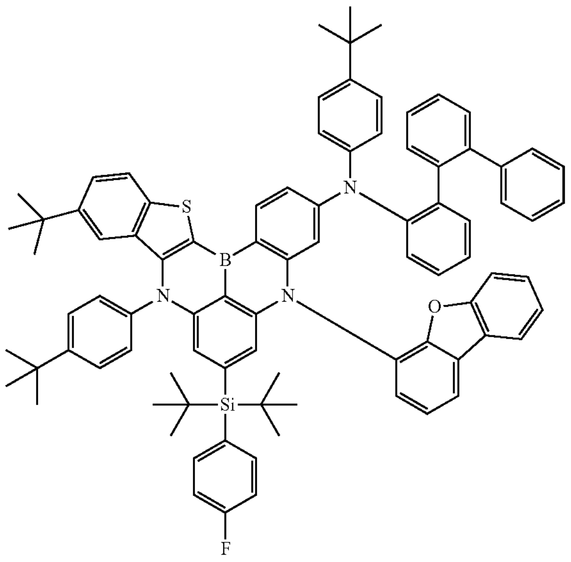
80
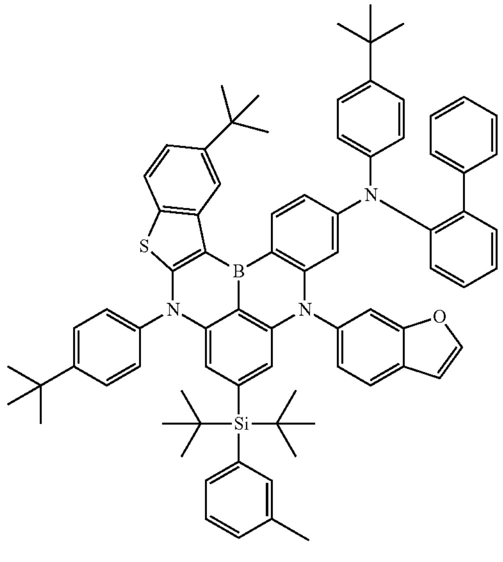
-continued
81
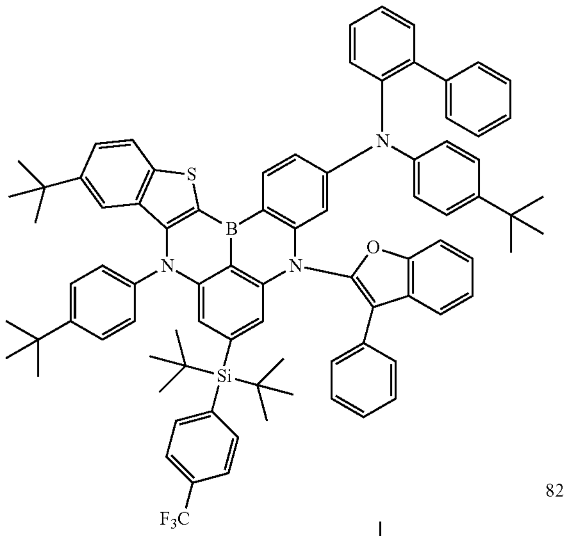
82
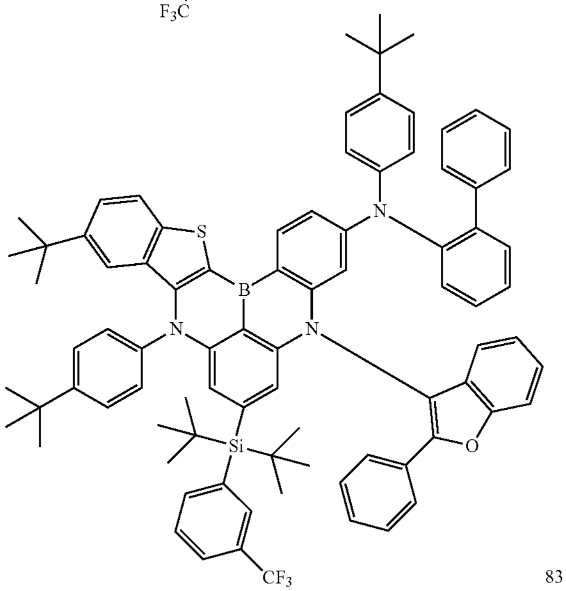
83
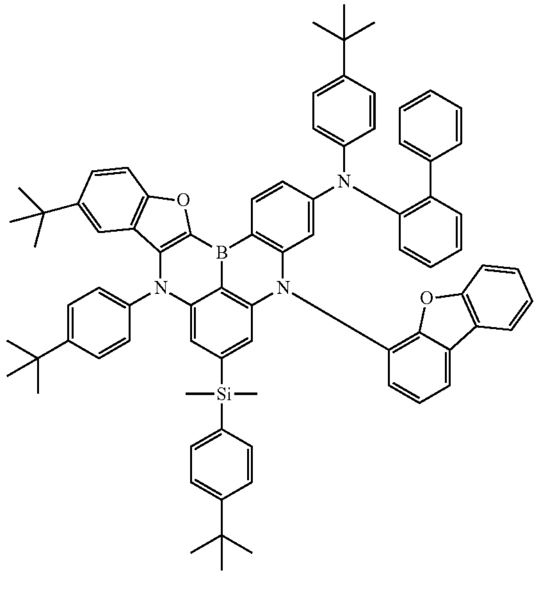

-continued
84
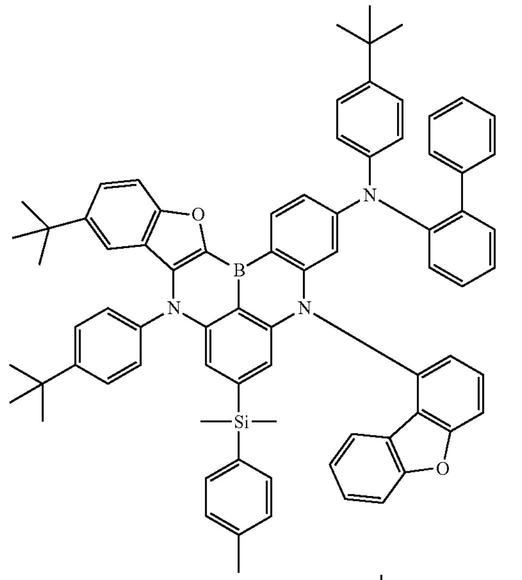
85
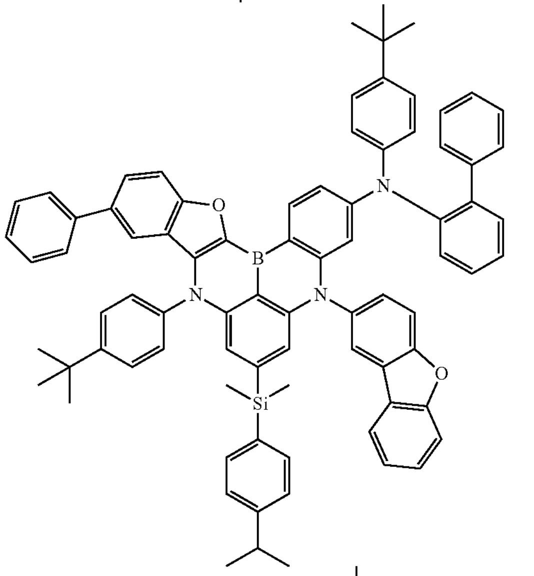
86
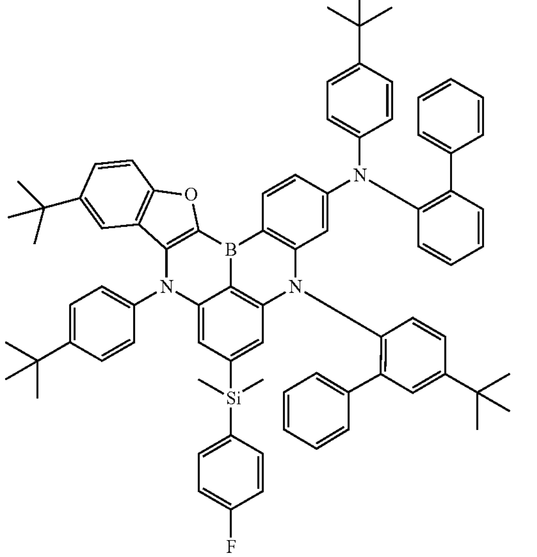
-continued
87
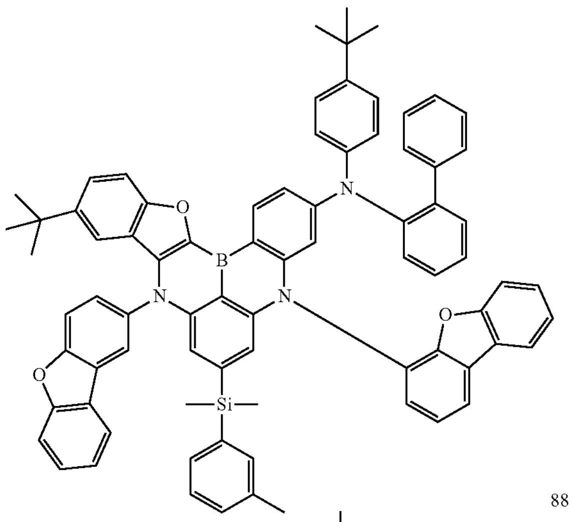
88
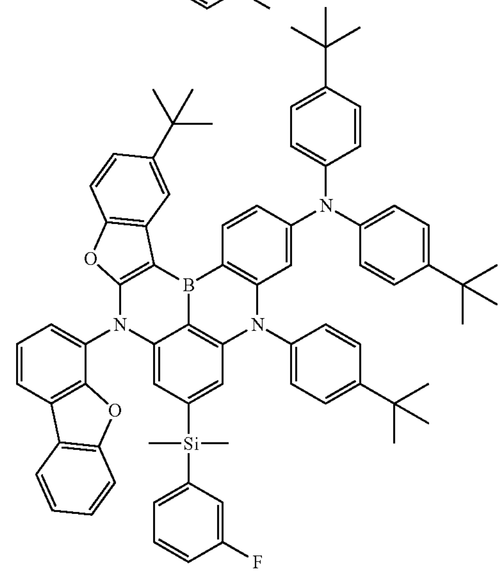
89
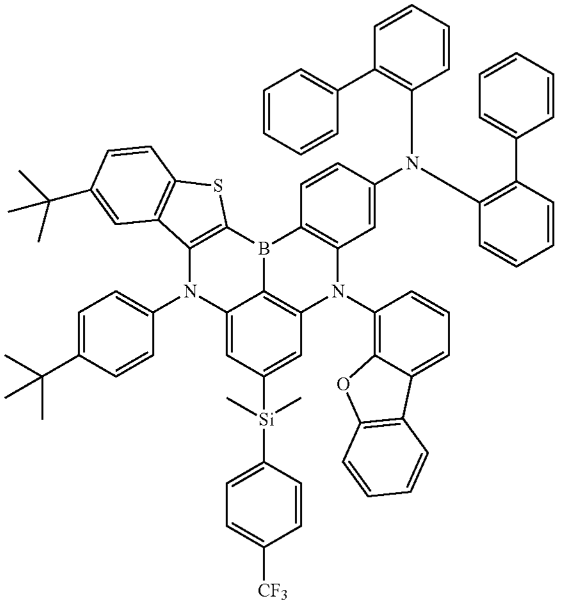

-continued
90
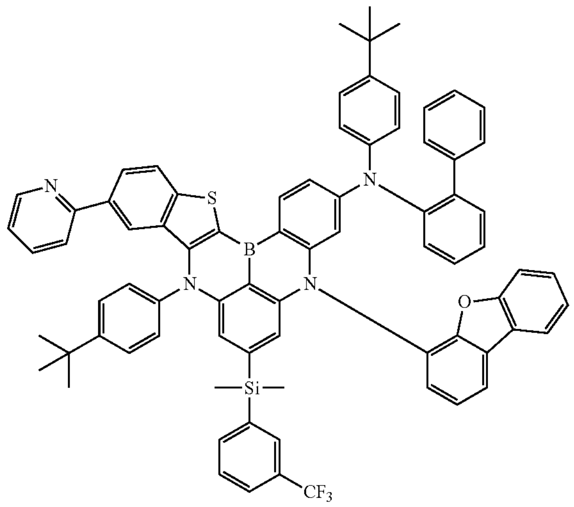
91
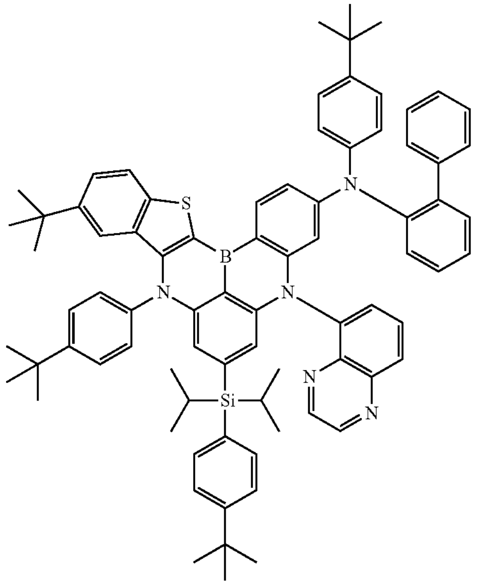
-continued
92
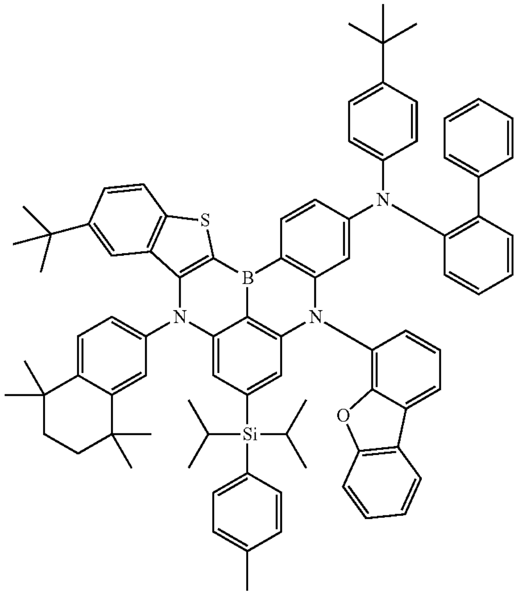
93
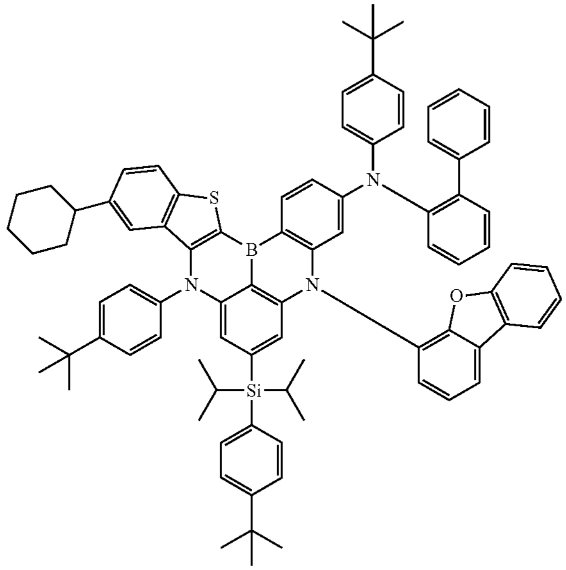

-continued
94
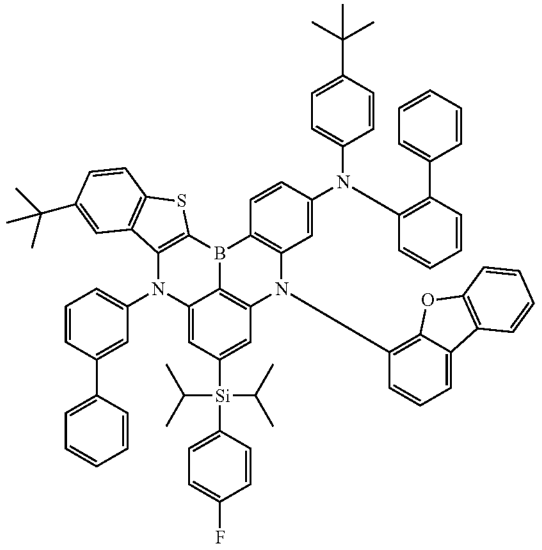
95
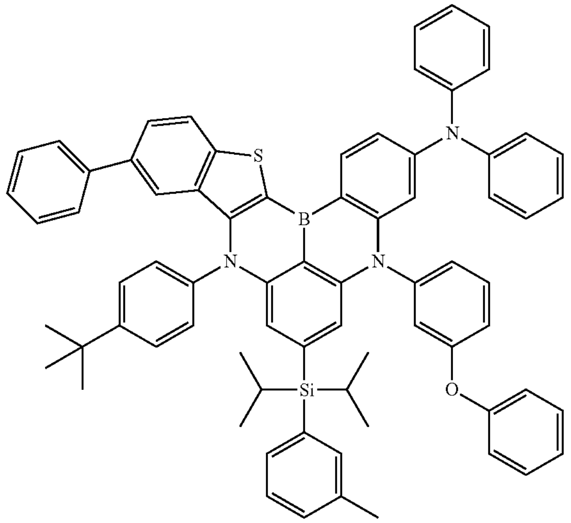
96
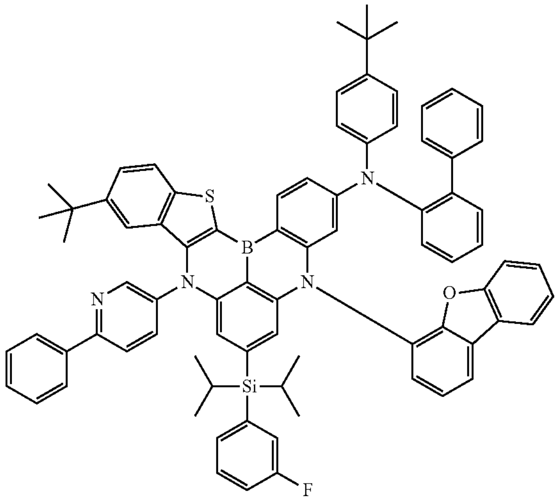
-continued
97
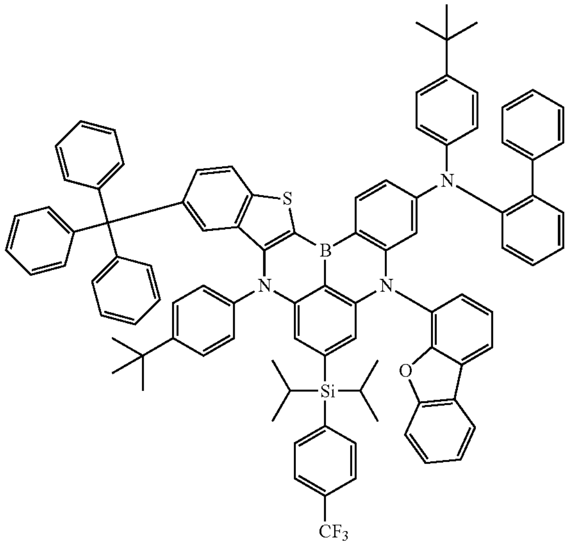
98
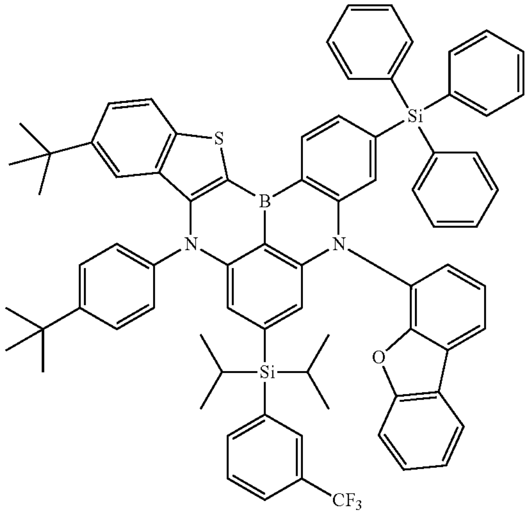
99
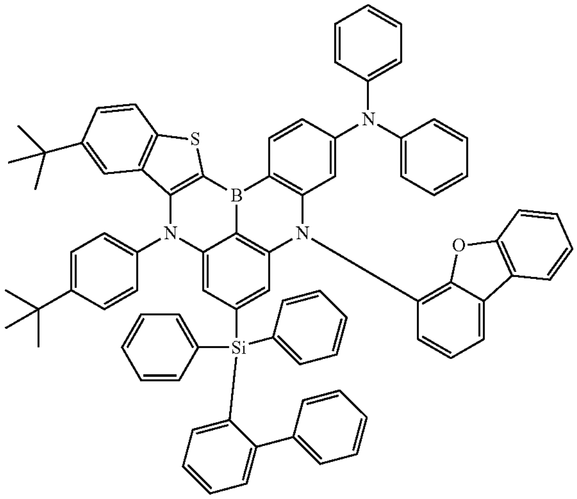

-continued

100

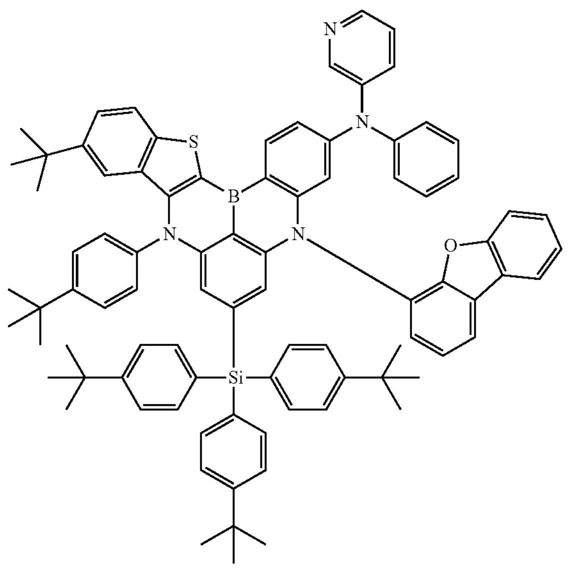

101

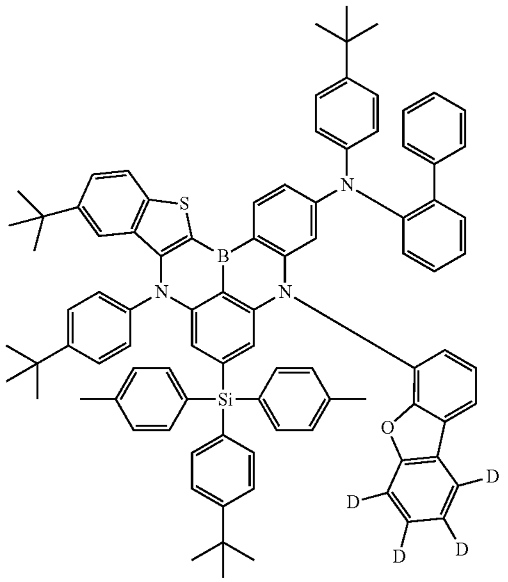

-continued

102

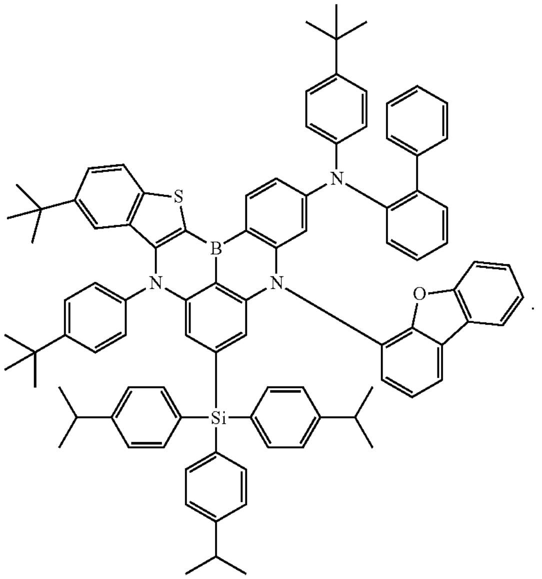

10. An organic electroluminescent device comprising a first electrode, a second electrode opposite to the first electrode, and one or more organic layers interposed between the first and second electrodes wherein one of the organic layers is a light emitting layer comprising a host and a dopant and wherein the dopant is the compound represented by Formulae 1 or 2 according to claim 1.

11. The organic electroluminescent device according to claim 10, wherein the EL emission spectrum of the organic electroluminescent device has a full width at half maximum (FWHM) of 20 nm or less.

12. The organic electroluminescent device according to claim 10, wherein the host is an anthracene compound represented by Formula 3:

(3)

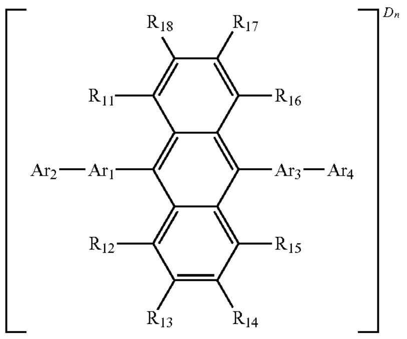

wherein $R_{11}$ to $R_{18}$ are identical to or different from each other and are each independently selected from hydrogen, substituted or unsubstituted $C_1$-$C_{30}$ alkyl, substituted or unsubstituted $C_2$-$C_{30}$ alkenyl, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted amine, substituted or unsubstituted silyl, substituted or unsubstituted $C_3$-$C_{30}$ mixed aliphatic-aromatic cyclic groups, nitro, cyano, and halogen, with the proviso that at least one of $R_{11}$ to $R_{18}$ is a deuterium atom, $Ar_1$ and $Ar_3$ are identical to or different from each other and are each independently substituted or unsubstituted $C_6$-$C_{30}$ arylene or substituted or unsubstituted $C_5$-$C_{30}$ heteroarylene, $Ar_3$ and $Ar_4$ are identical to or different from each other and are each independently selected from hydrogen, substituted or unsubstituted $C_6$-$C_{50}$ aryl, substituted or unsubstituted $C_3$-$C_{30}$ cycloalkyl, substituted or unsubstituted $C_3$-$C_{30}$ heterocycloalkyl, substituted or unsubstituted $C_2$-$C_{50}$ heteroaryl, and substituted or unsubstituted $C_3$-$C_{30}$ mixed aliphatic-aromatic cyclic group, $D_n$ represents the number of deuterium atoms replacing hydrogen atoms in $Ar_1$ to $Ar_4$, and n is an integer from 0 to 50.

13. The organic electroluminescent device according to claim 12, wherein at least four of $R_{11}$ to $R_{18}$ are deuterium atoms.

14. The organic electroluminescent device according to claim 12, wherein the compound represented by Formula 3 is selected from the group consisting of the following anthracene derivatives having a structure including one or more deuterium atoms in the anthracene skeleton:

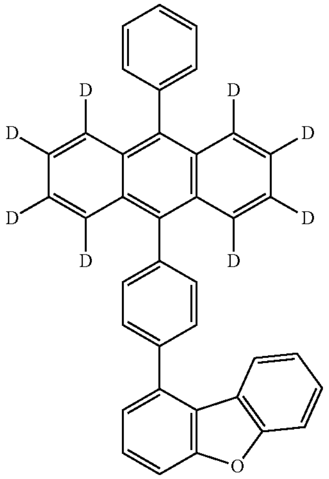

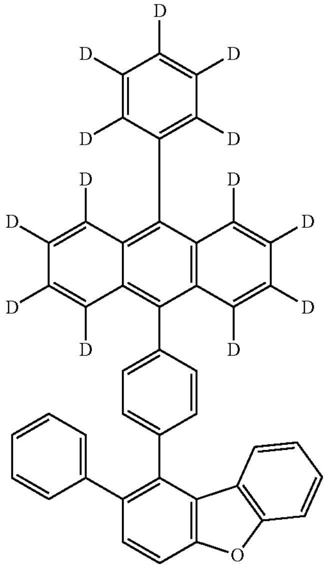

-continued

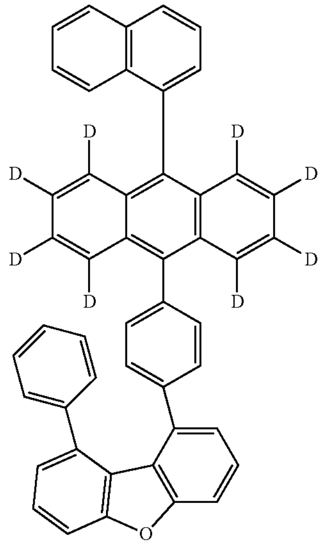

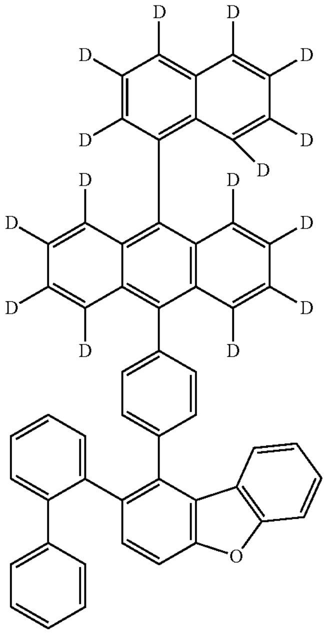

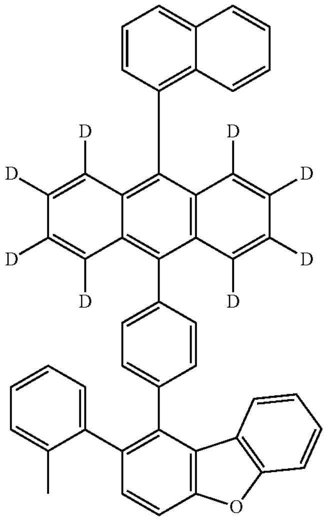

-continued
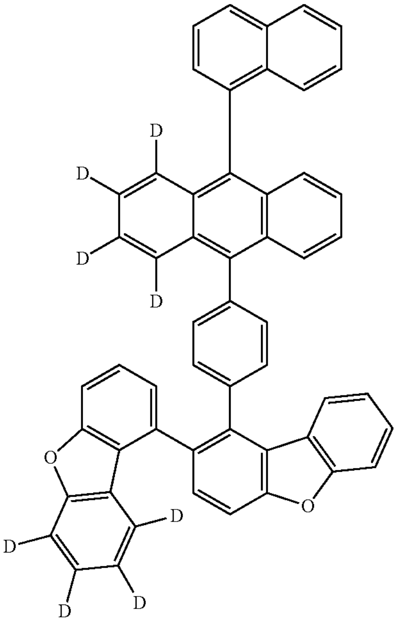
-continued
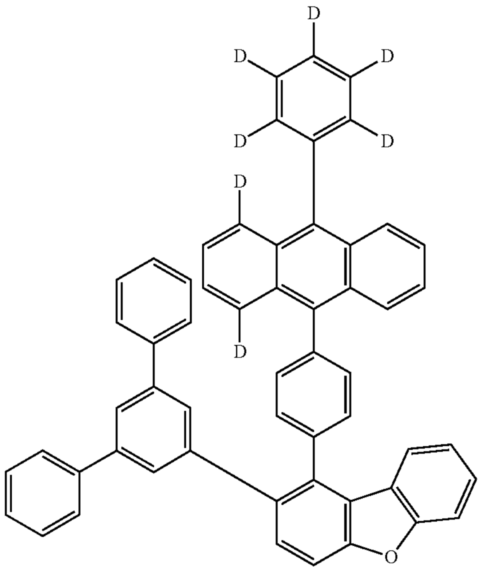
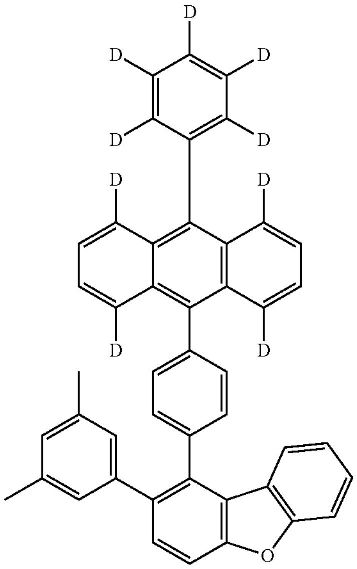
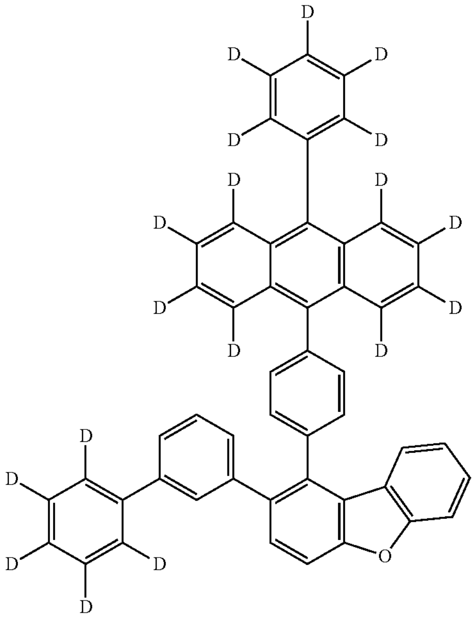

-continued
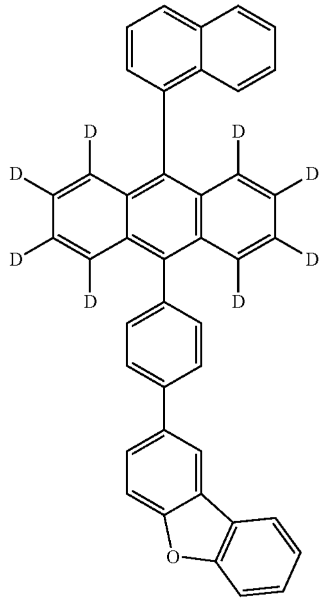
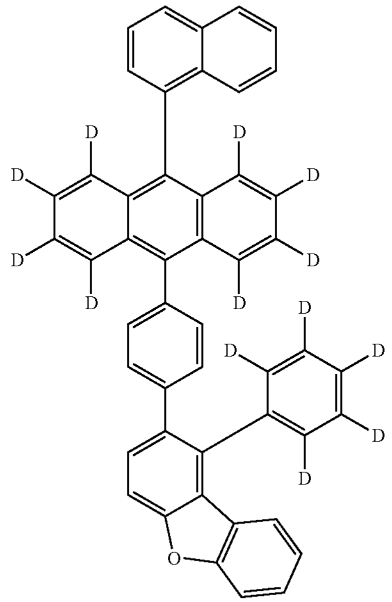
-continued
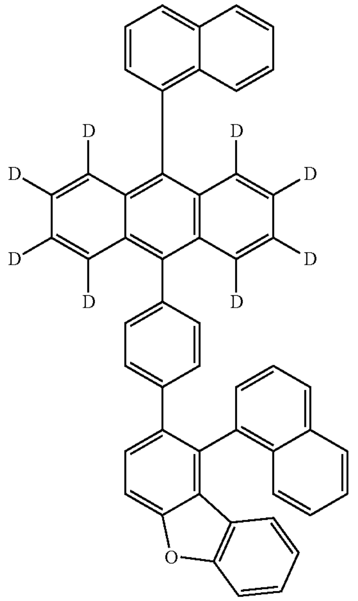
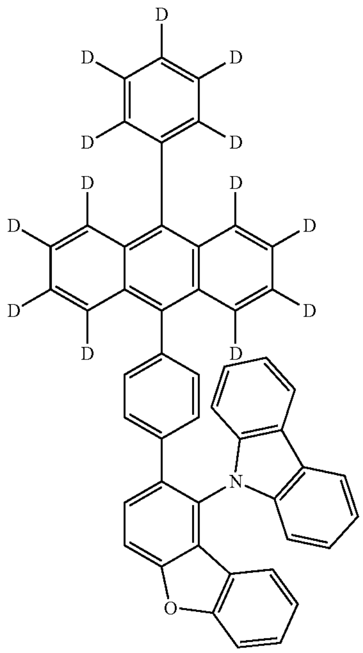

-continued
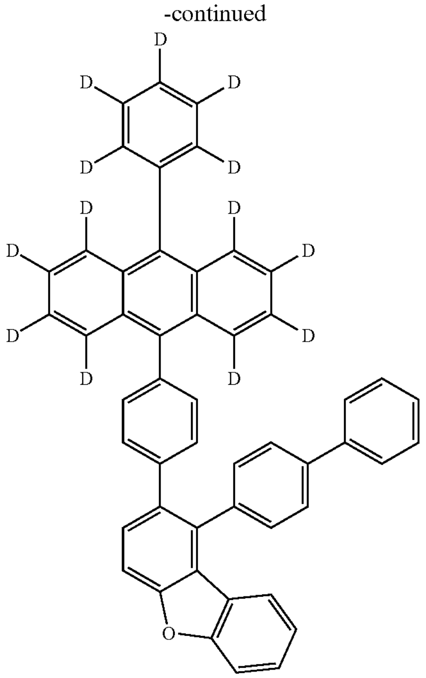
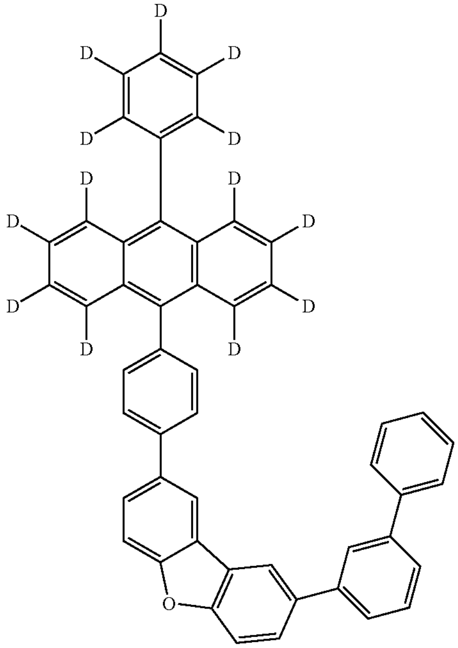
-continued
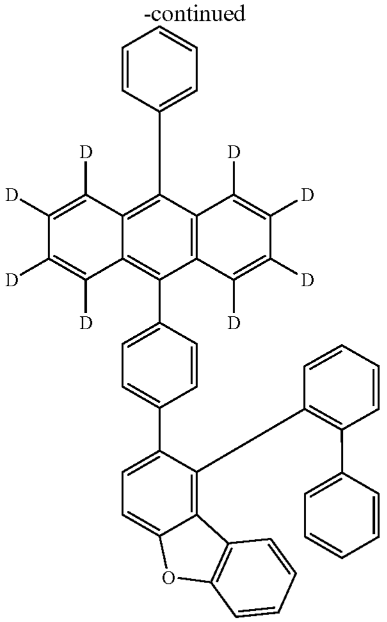
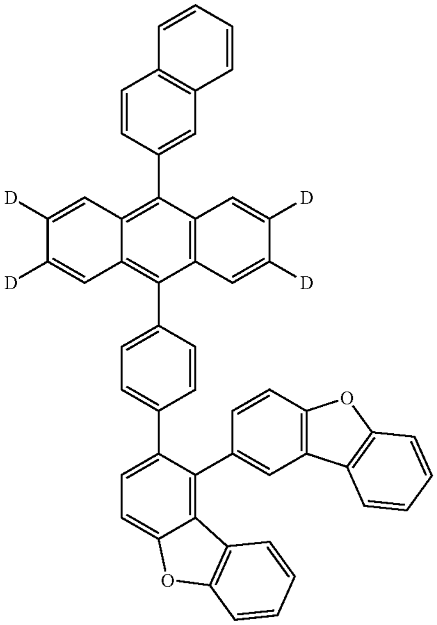

-continued
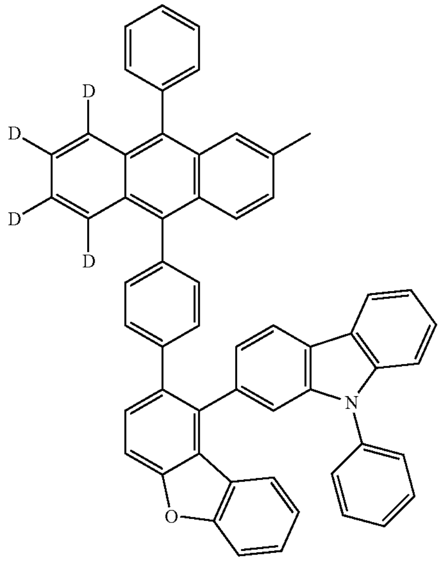
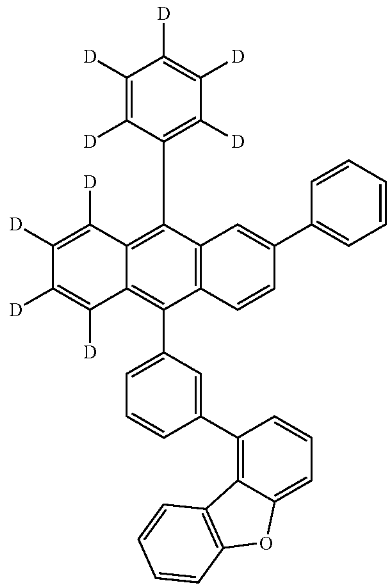
-continued
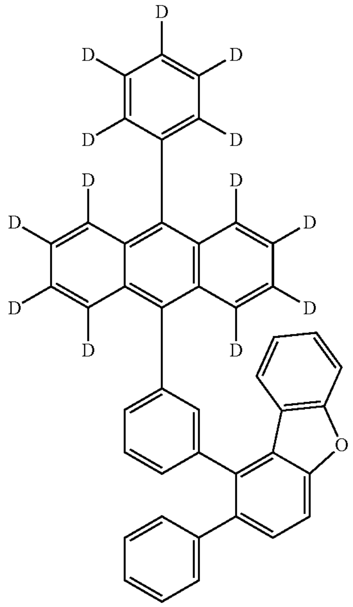
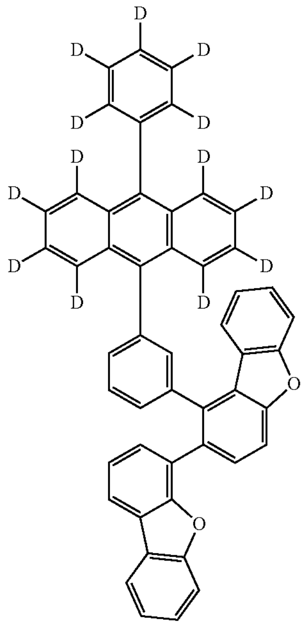

-continued
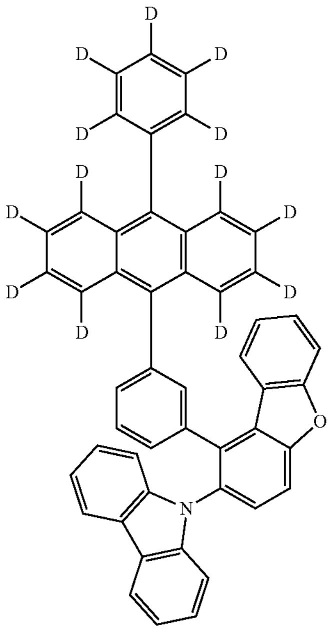
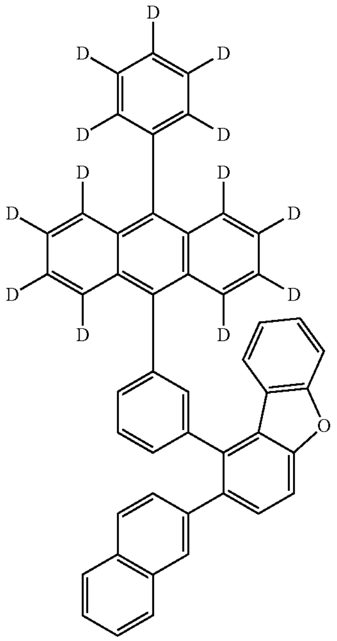
-continued
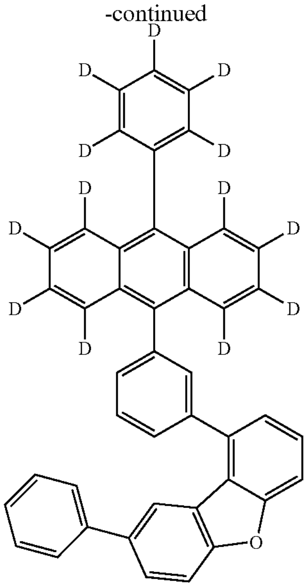
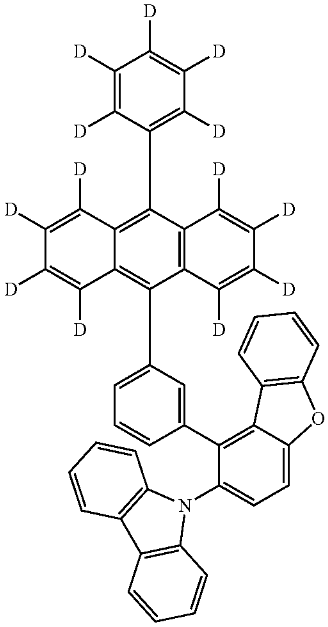

-continued
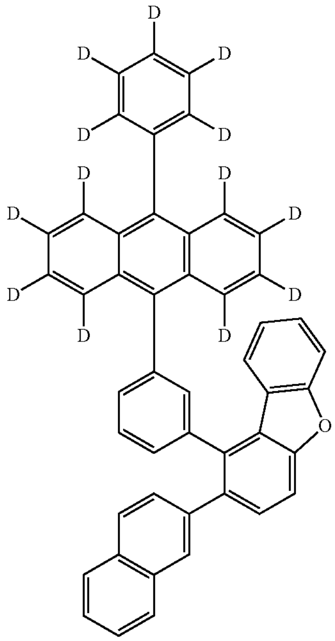
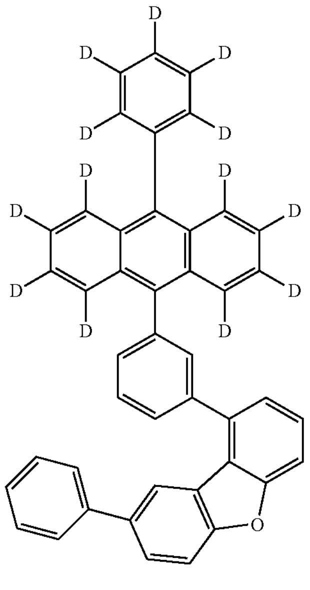
-continued
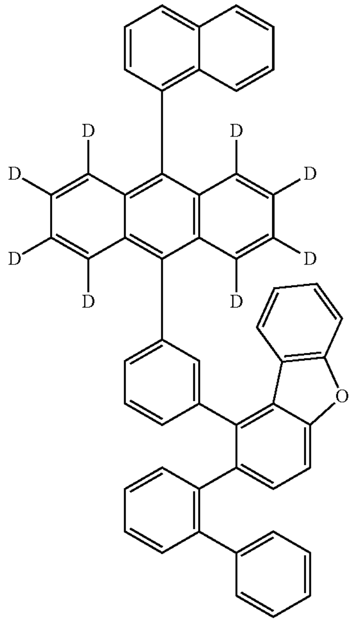
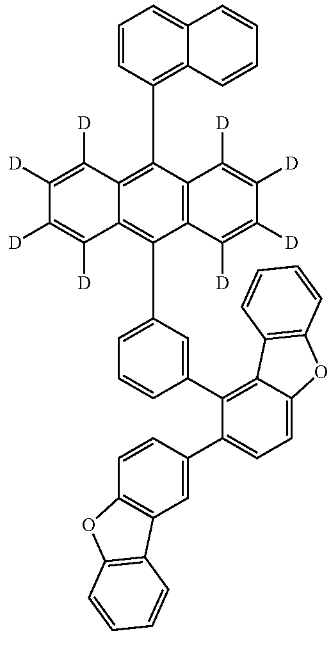

-continued
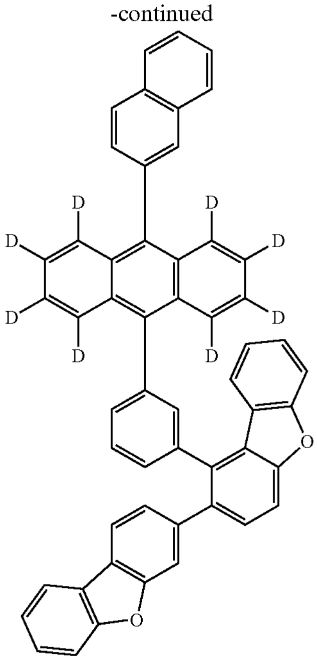
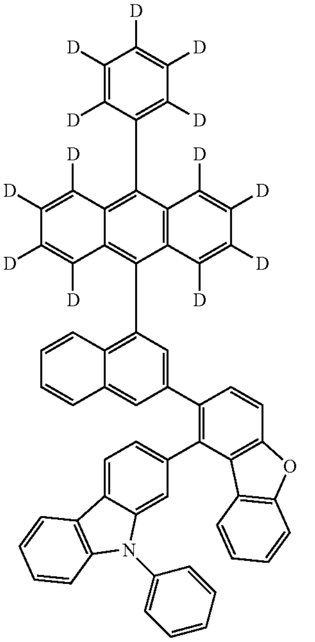
-continued
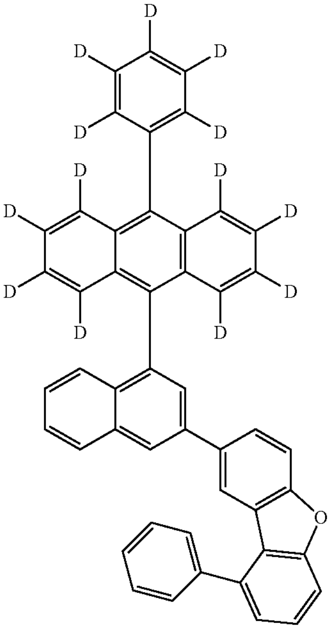
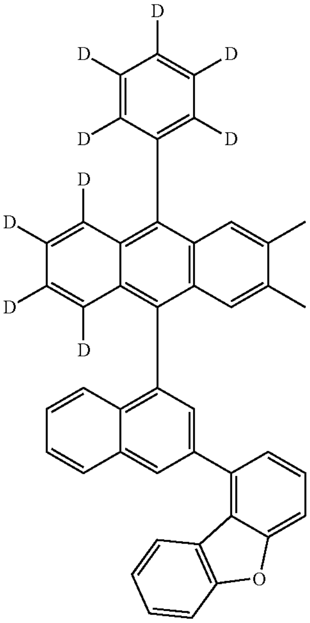

-continued
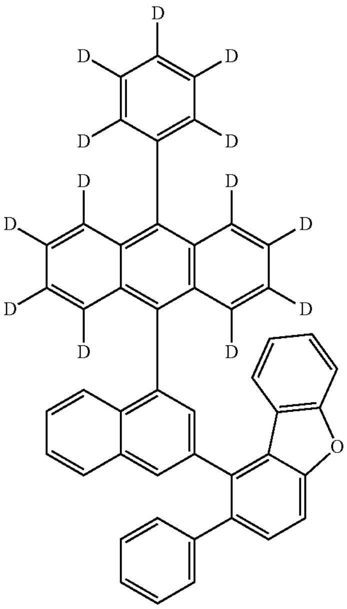
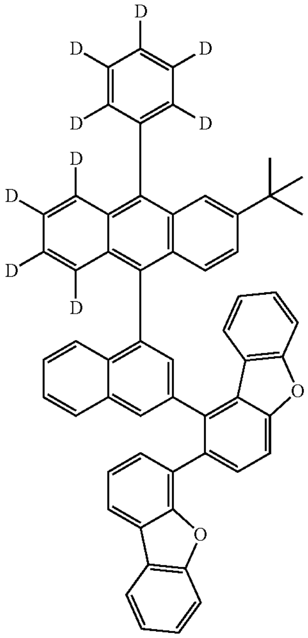
-continued
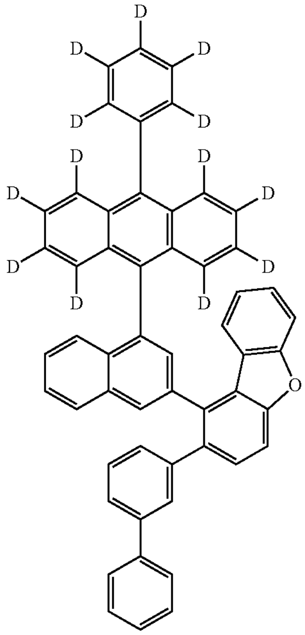
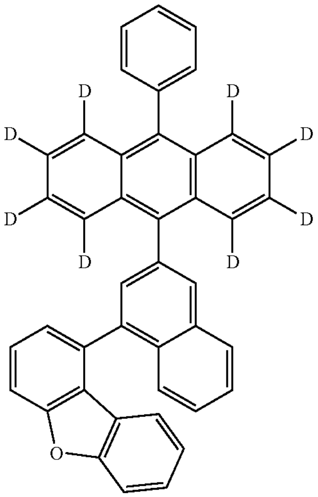
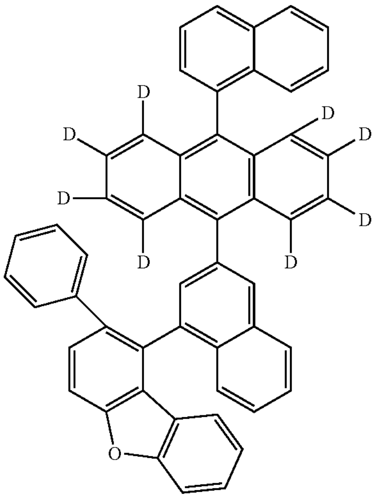

-continued
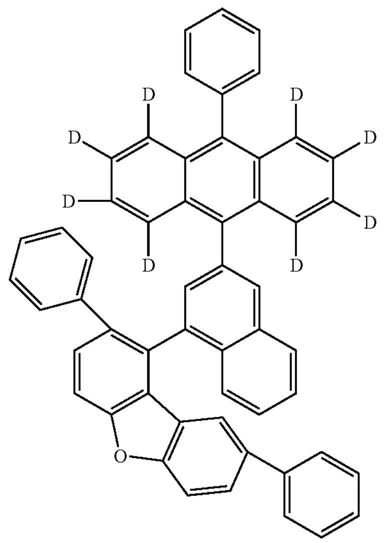
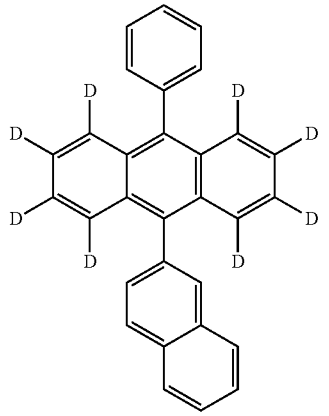
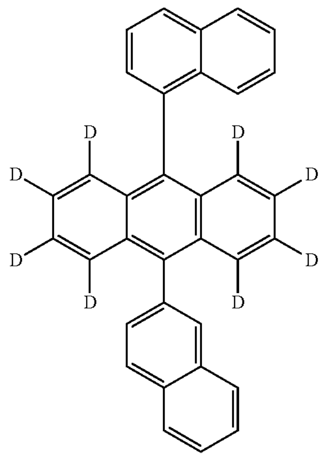
-continued
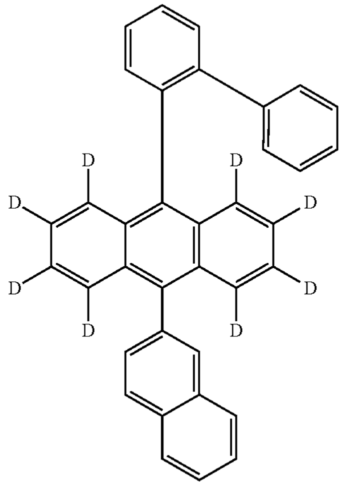
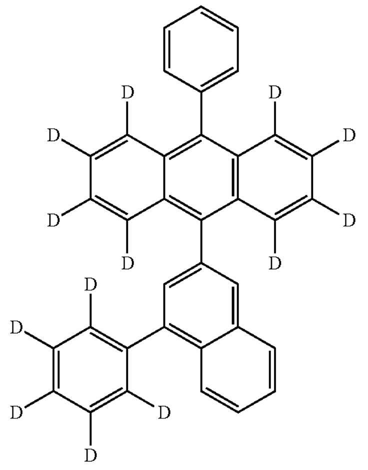
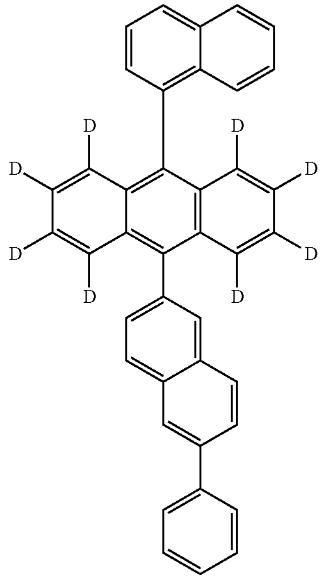

-continued
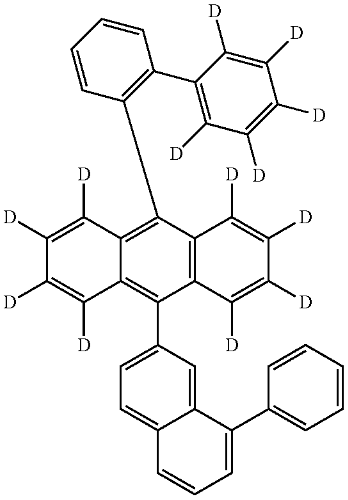
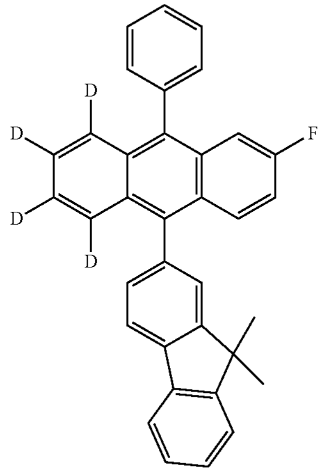
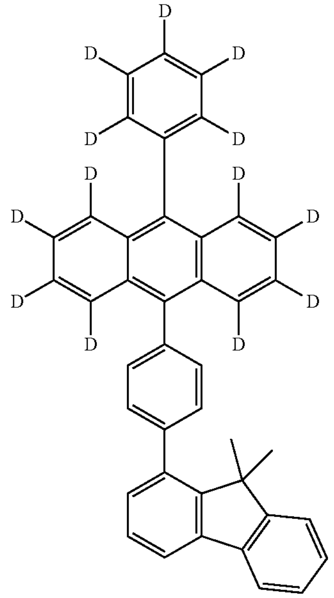
-continued
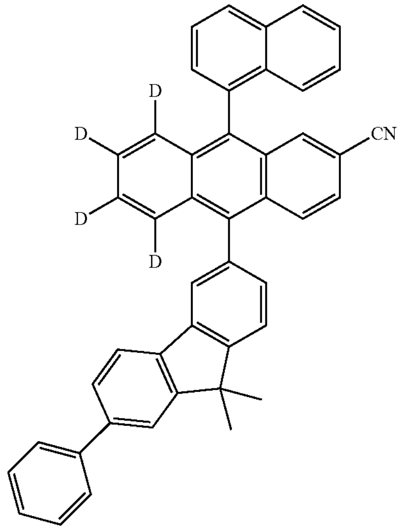
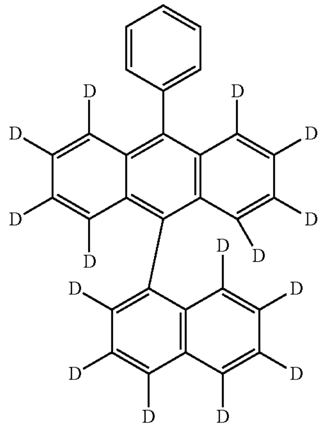
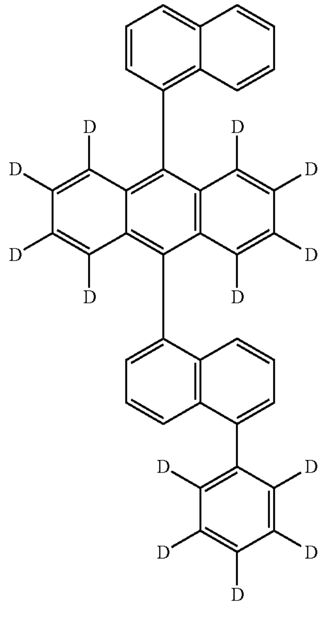

-continued
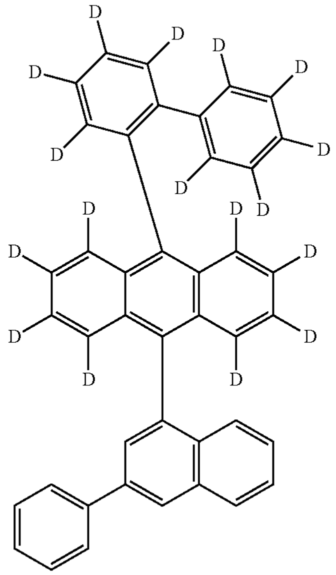
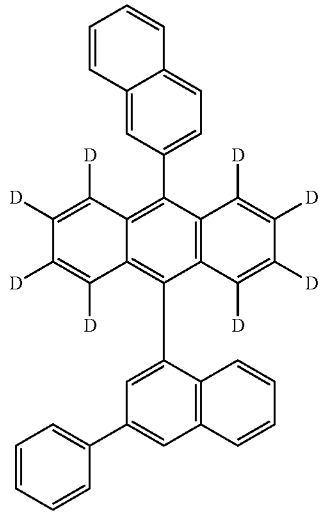
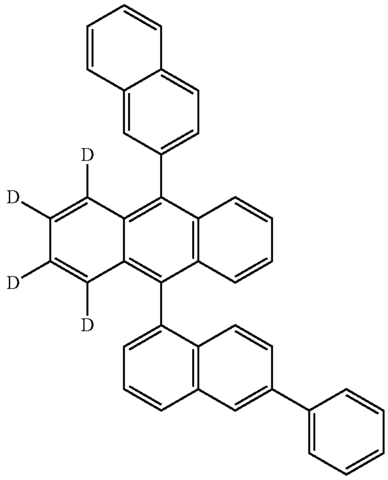
-continued
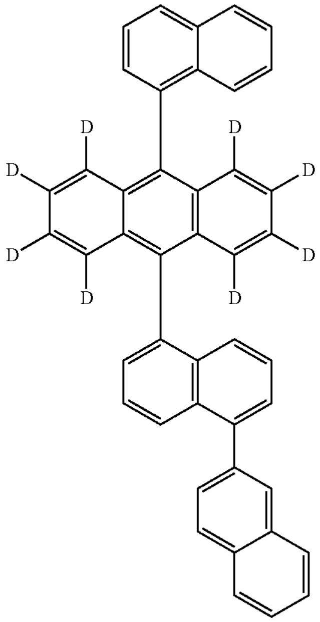
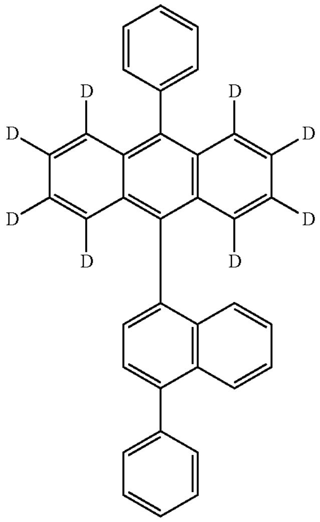

-continued
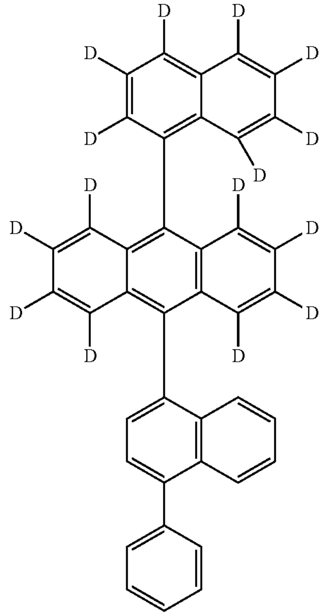
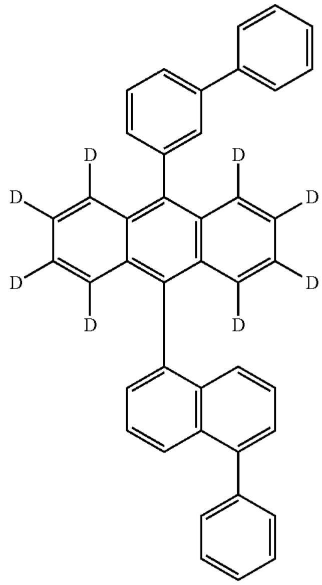
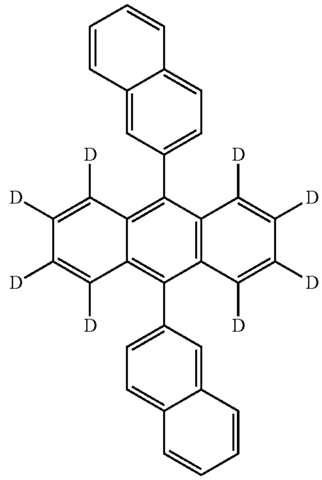
-continued
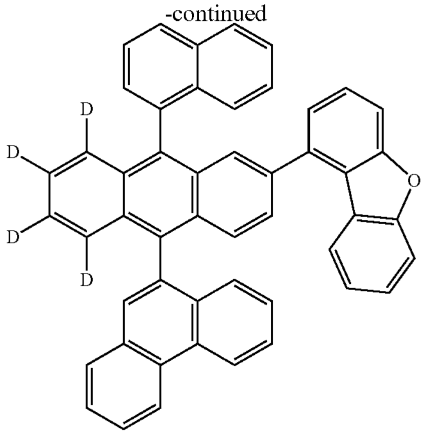
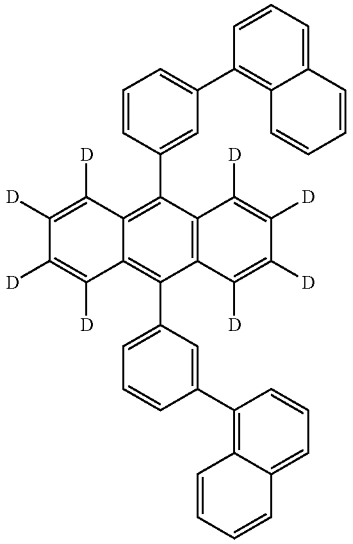
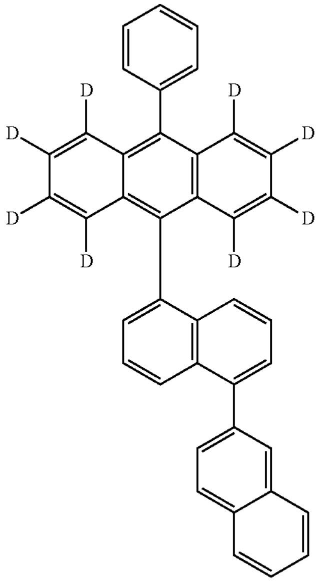

-continued
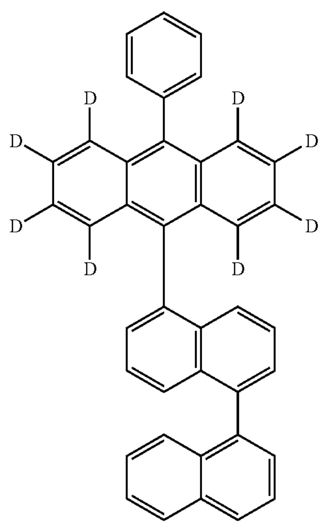
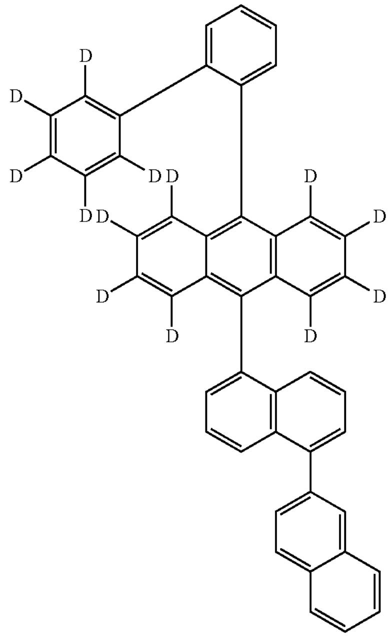
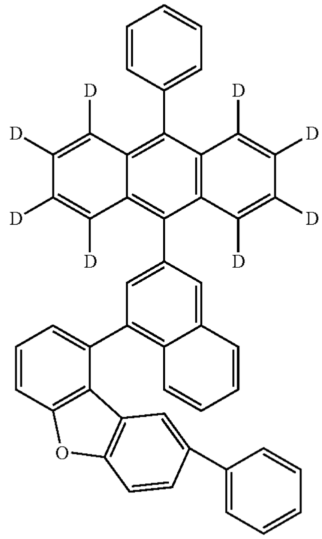
-continued
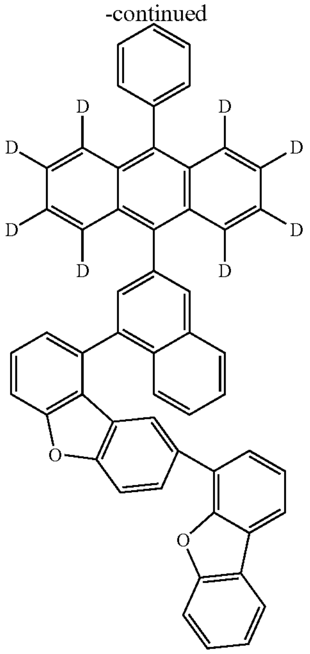
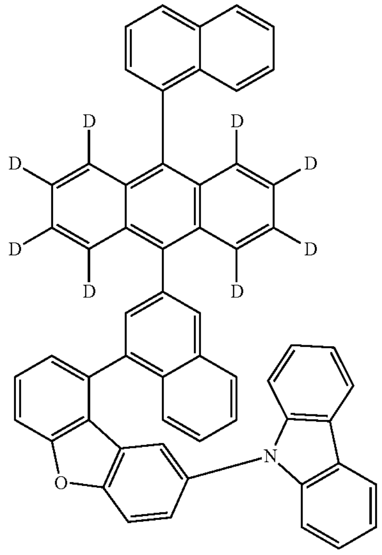

-continued
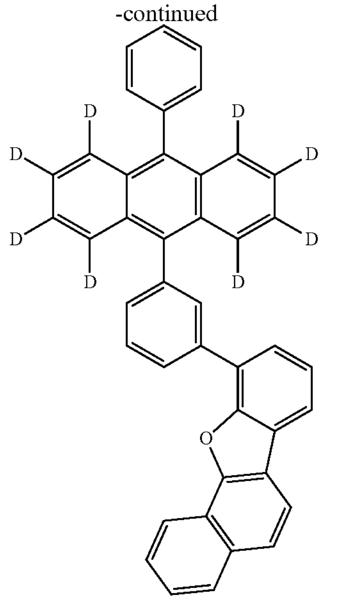
-continued
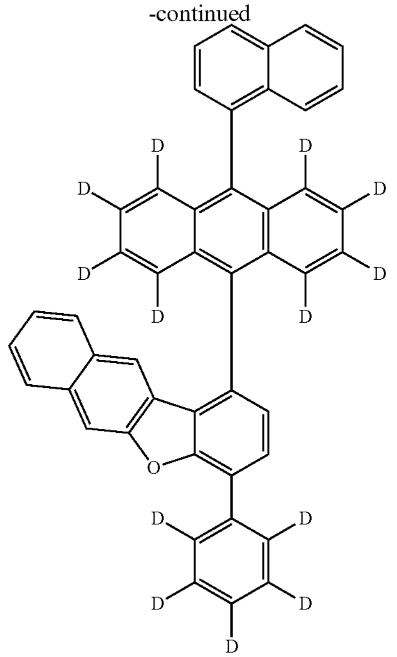
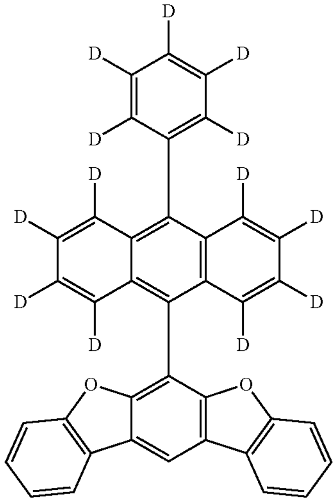
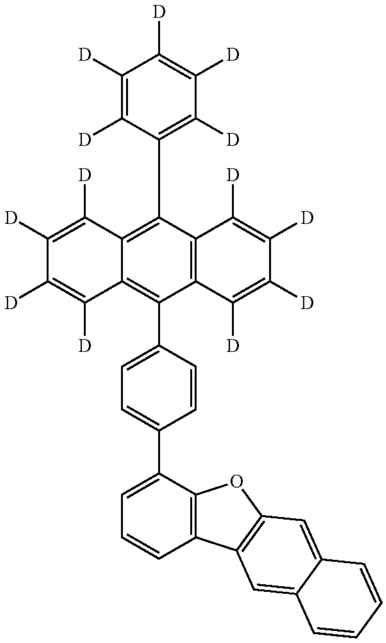
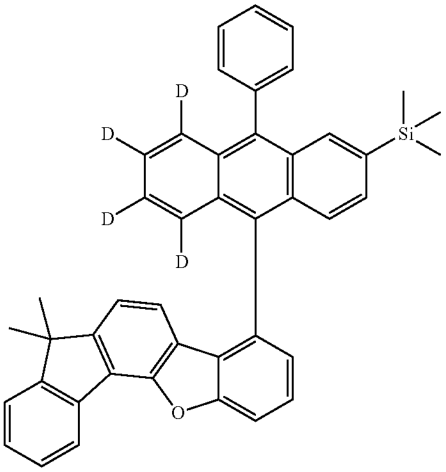

-continued
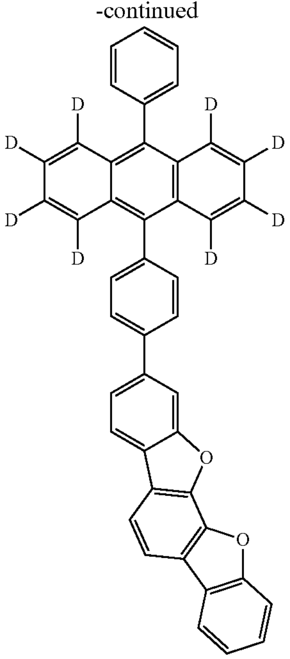
-continued
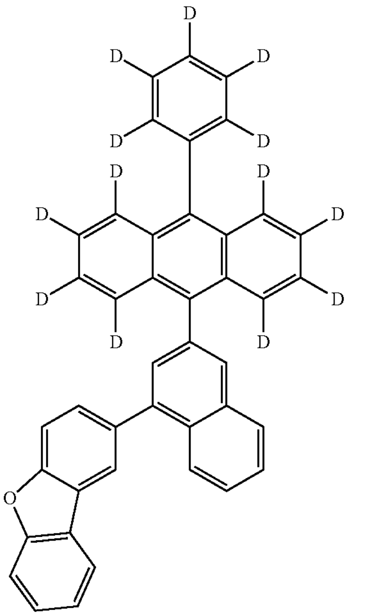
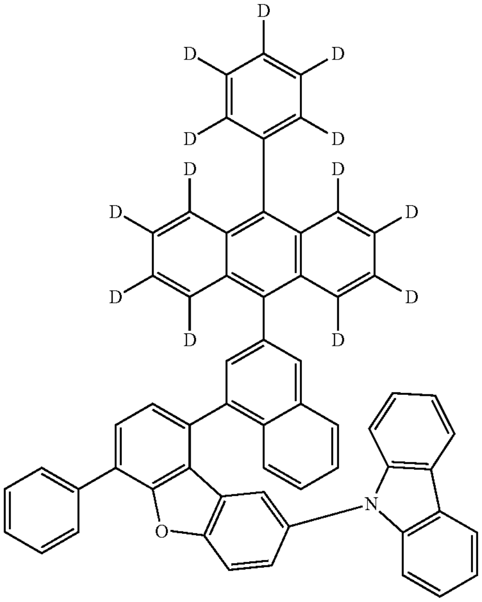
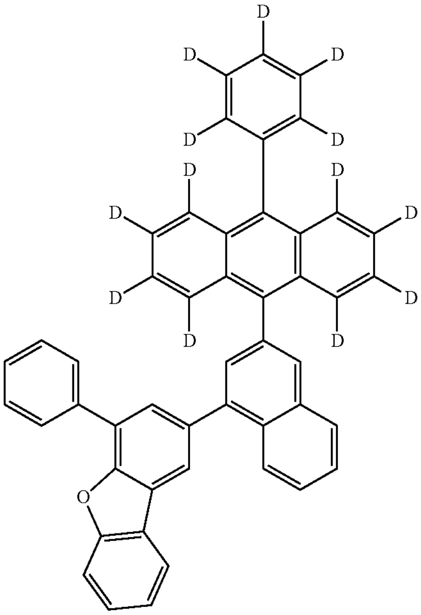

-continued
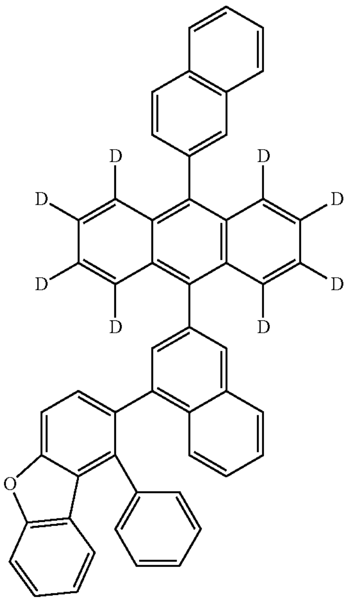
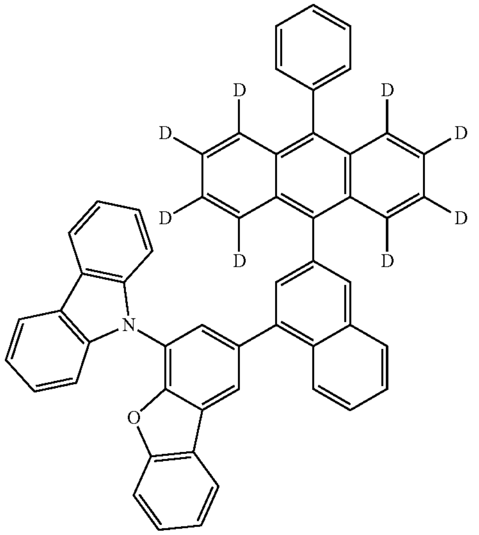
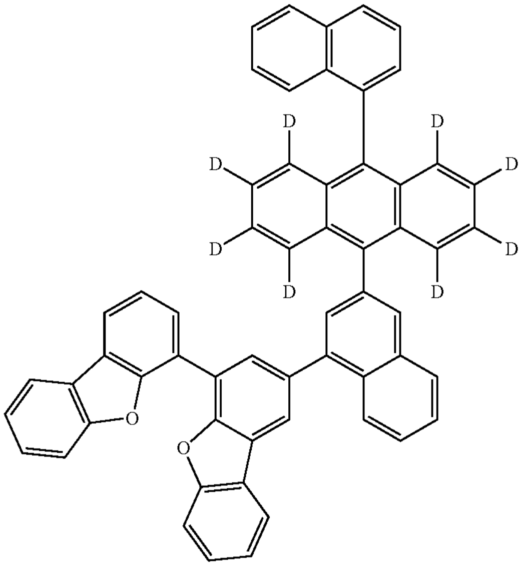
-continued
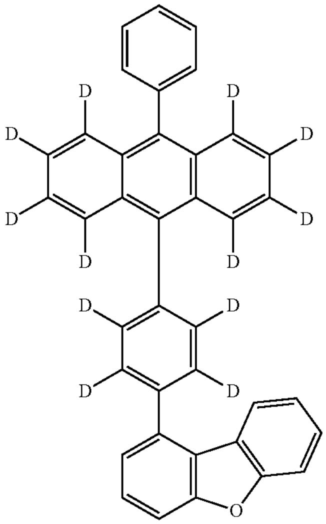
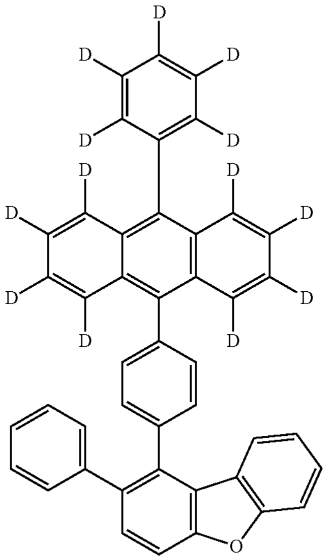
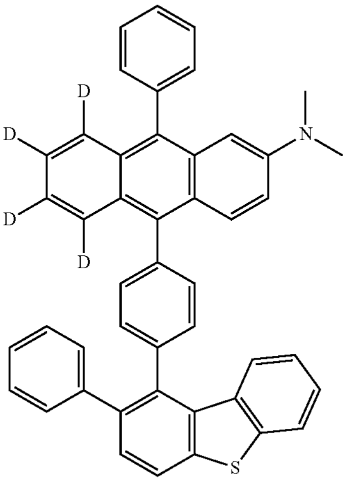

-continued
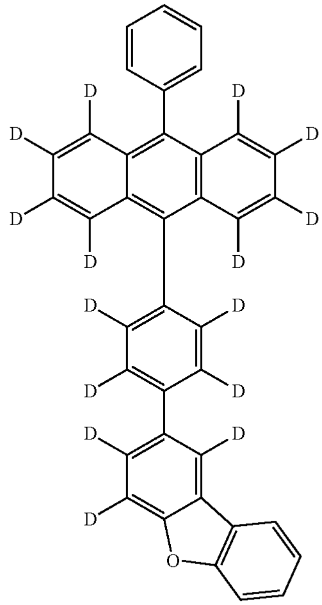
-continued
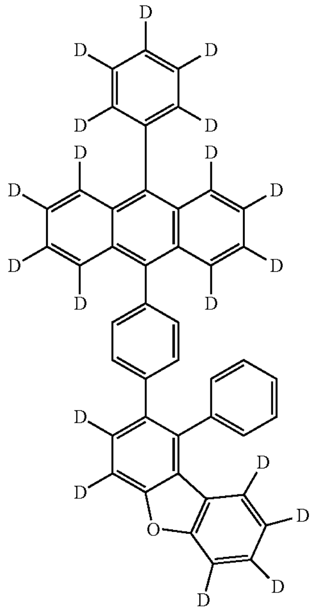
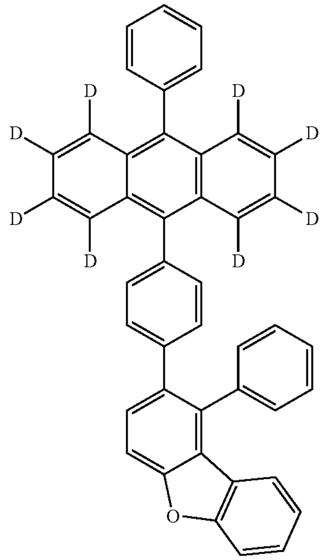
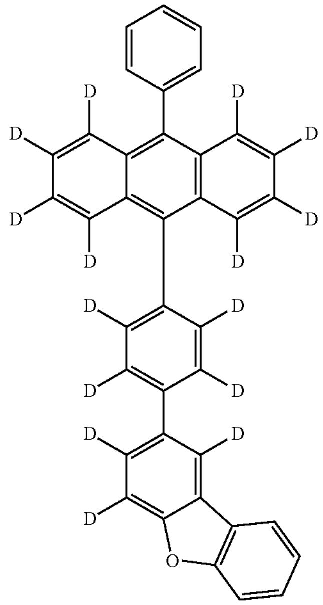

-continued
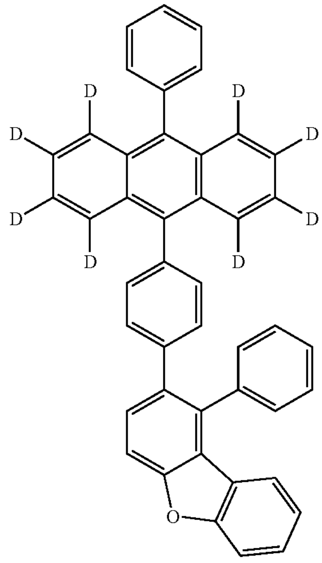
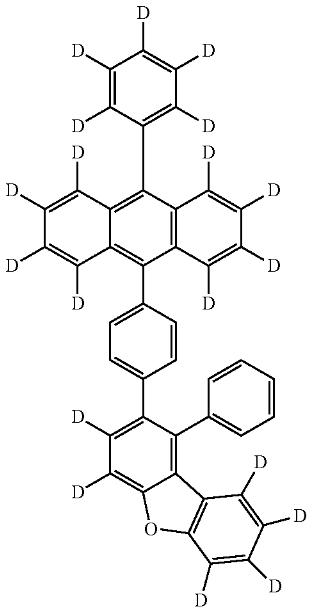
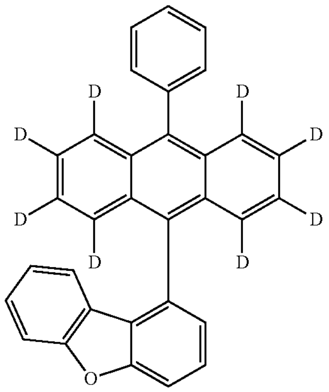
-continued
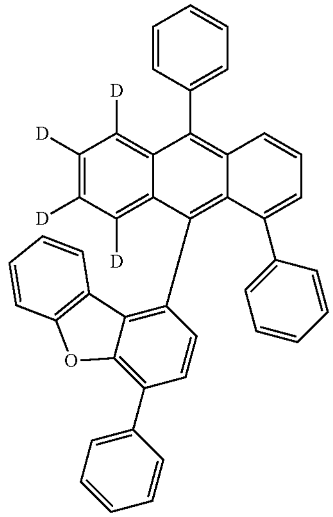
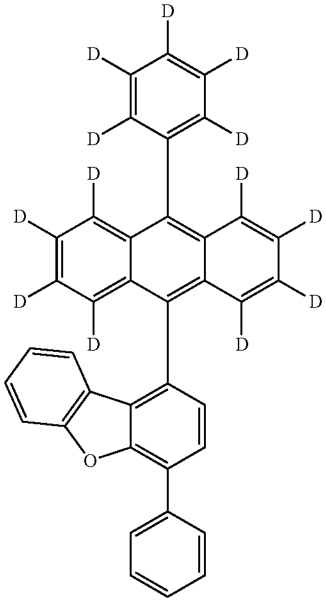
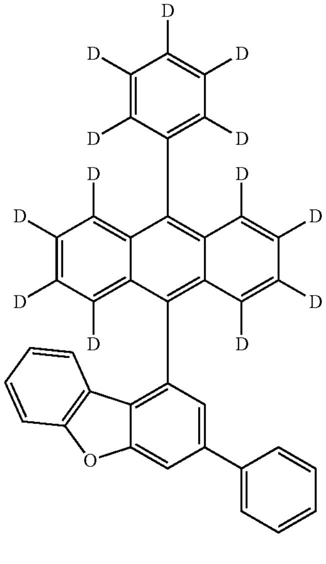

-continued
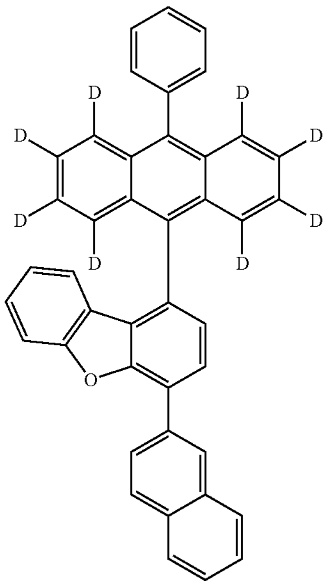
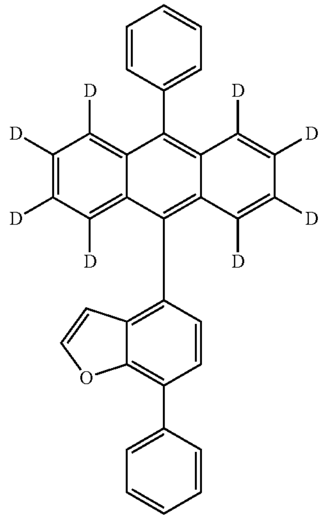
-continued
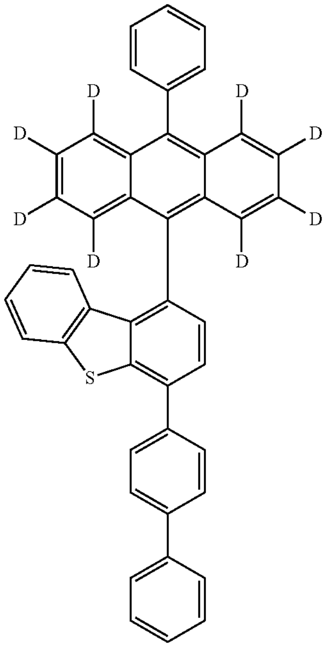
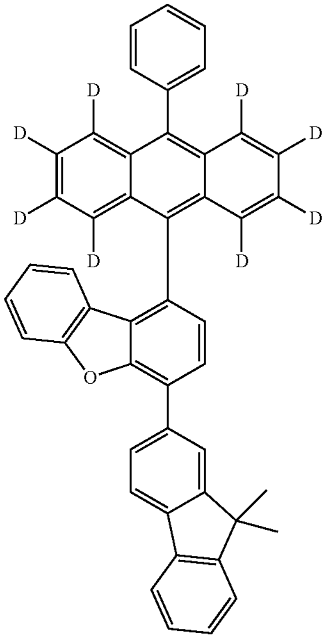

-continued
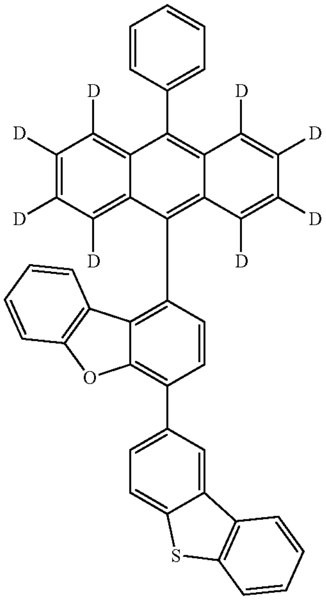
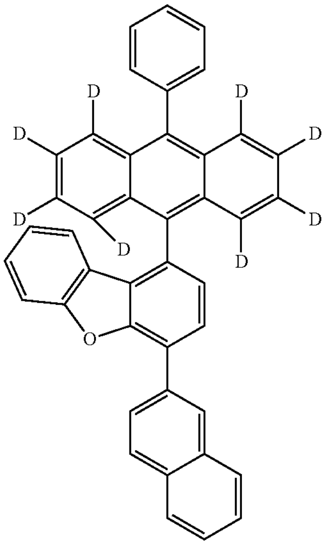
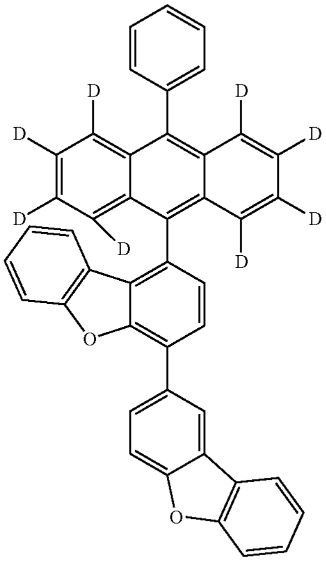
-continued
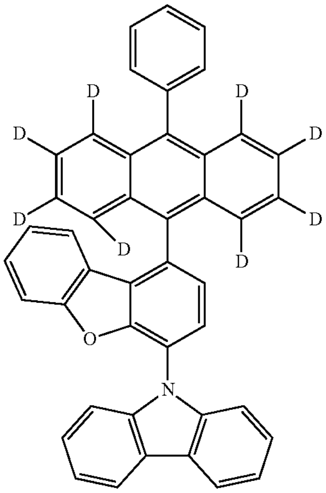
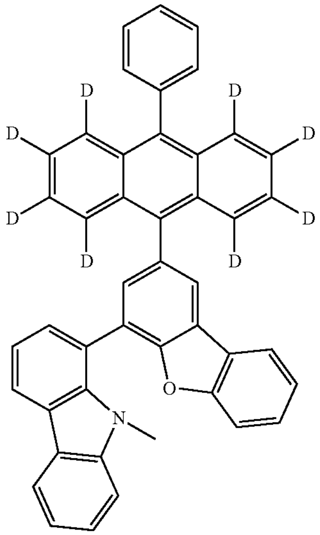
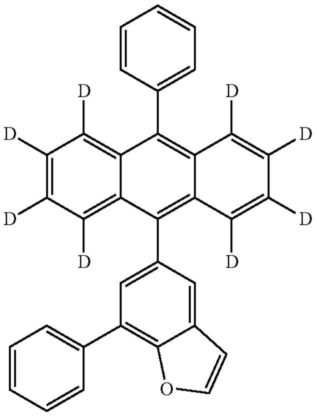

-continued
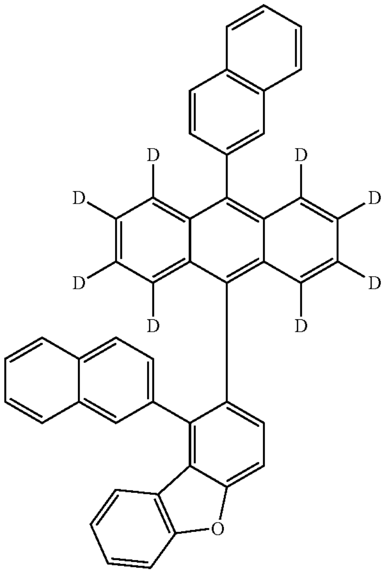
-continued
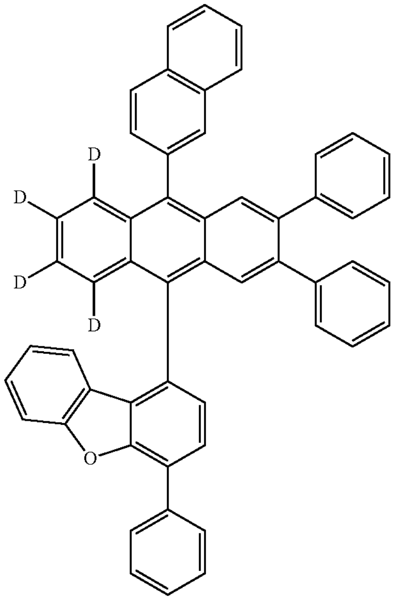
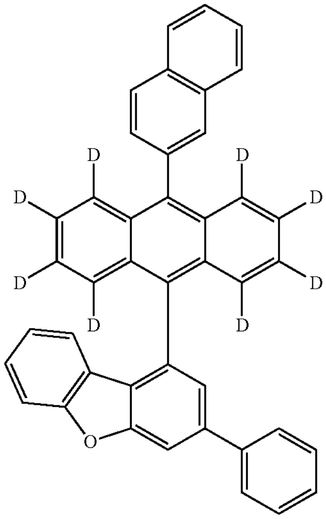
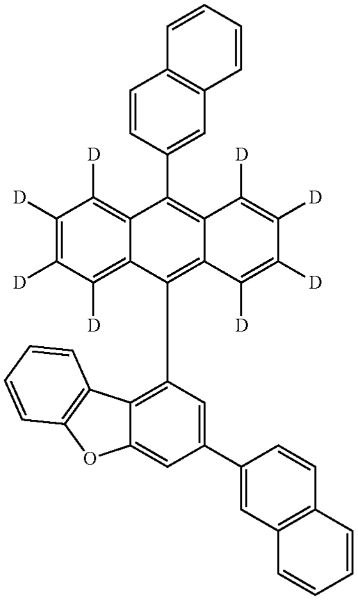
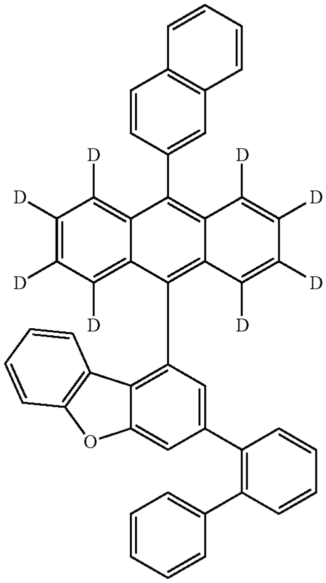

-continued
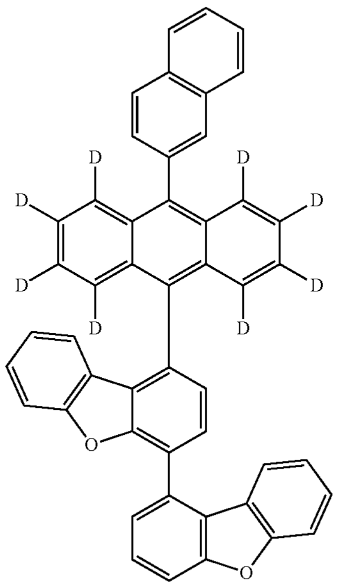
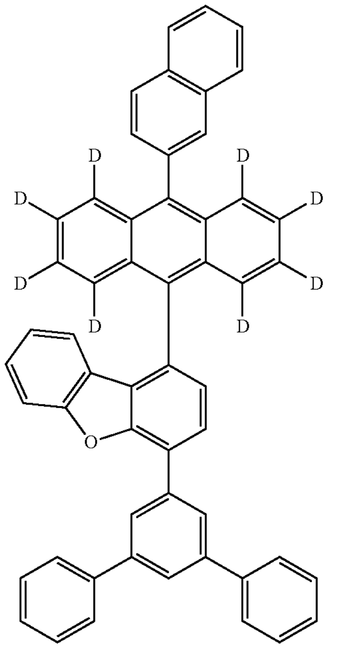
-continued
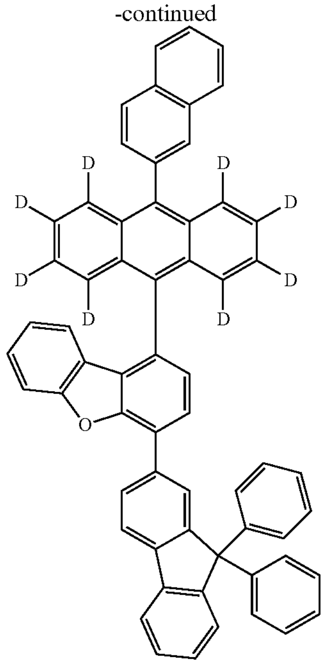
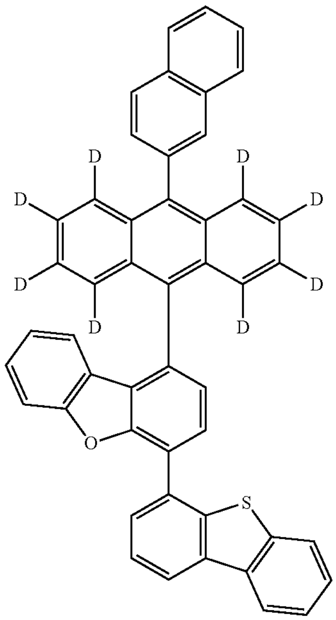

-continued
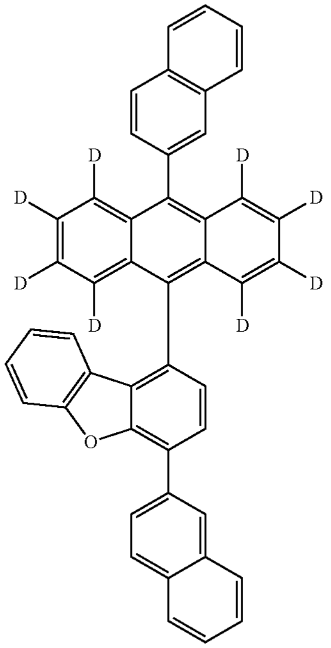
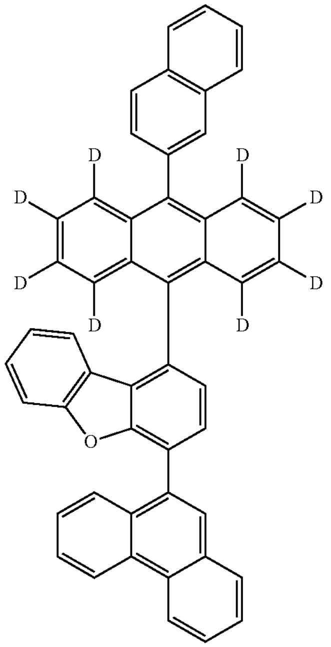
-continued
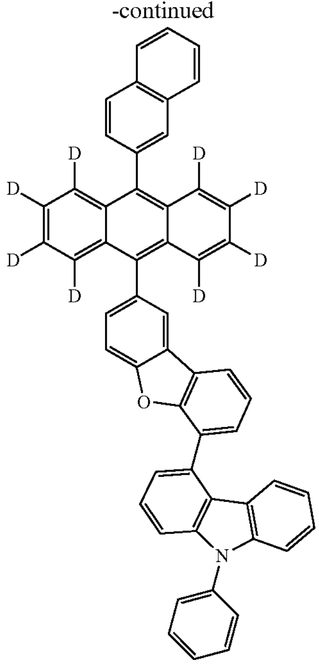
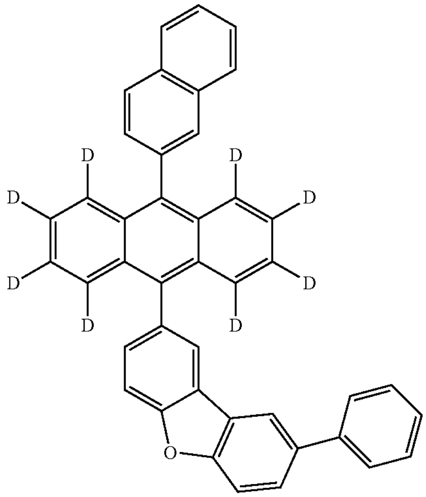
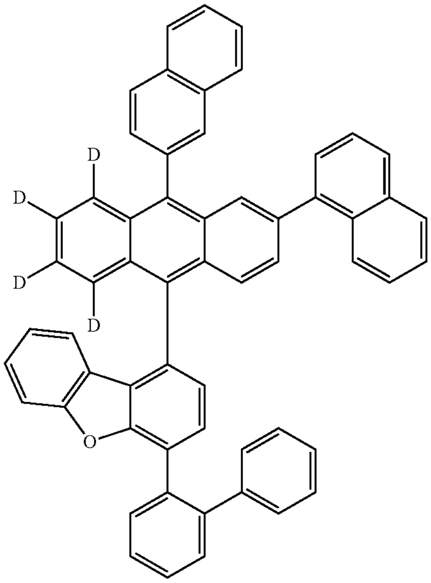

-continued
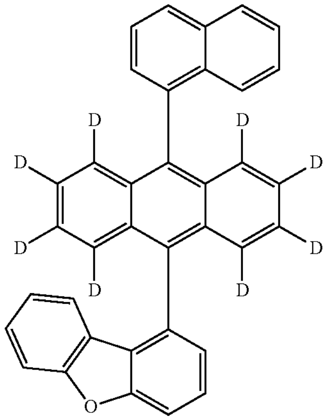
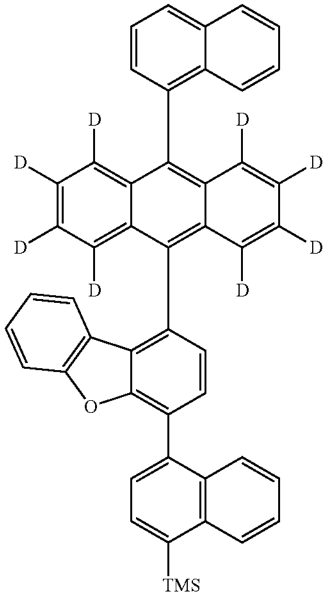
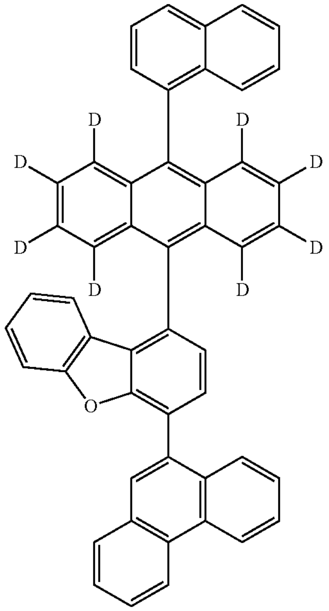
-continued
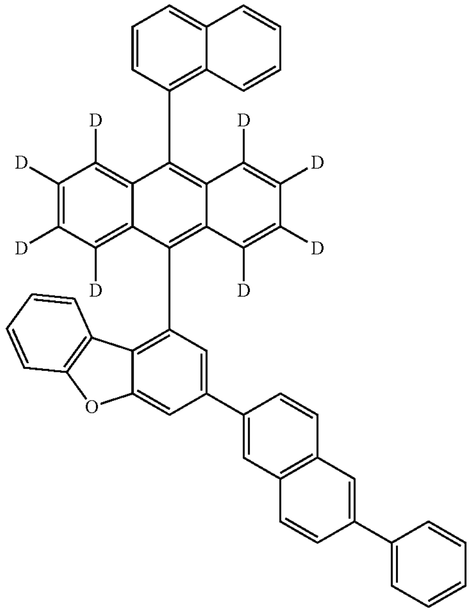
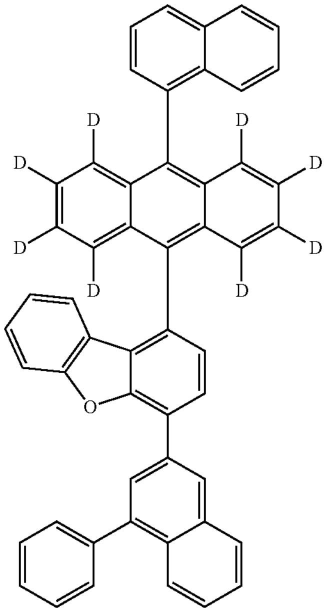

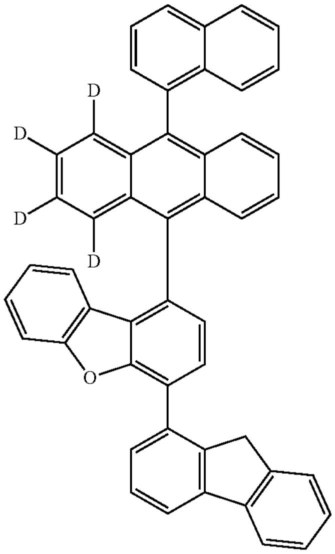
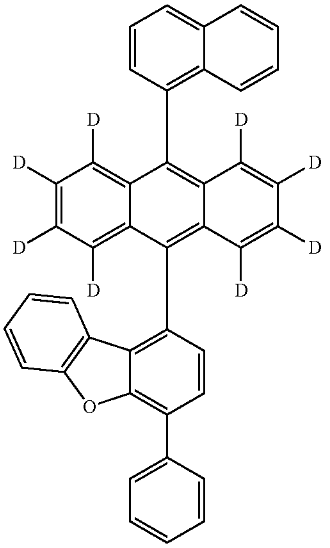
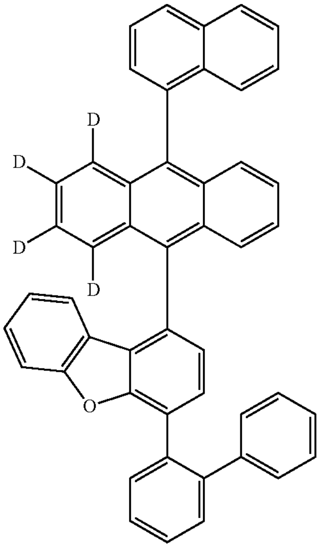
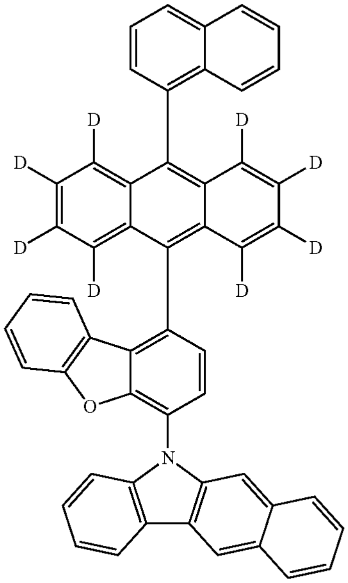
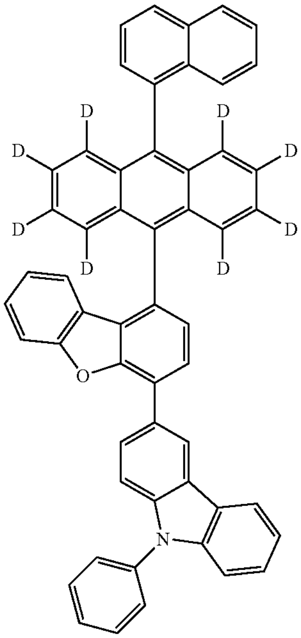

-continued
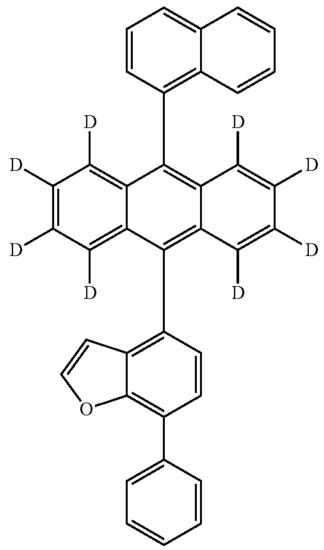
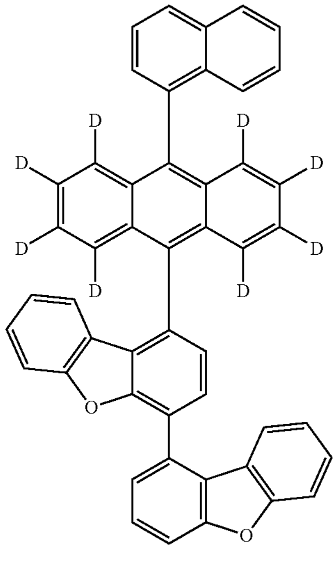
-continued
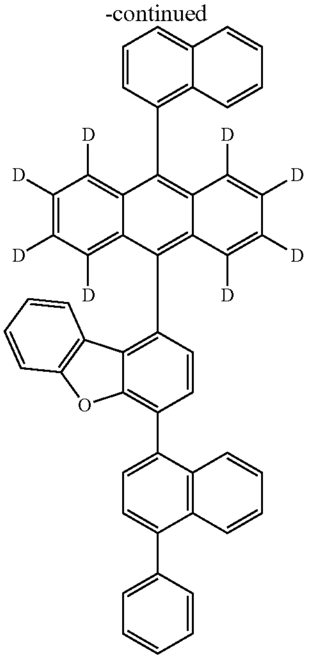
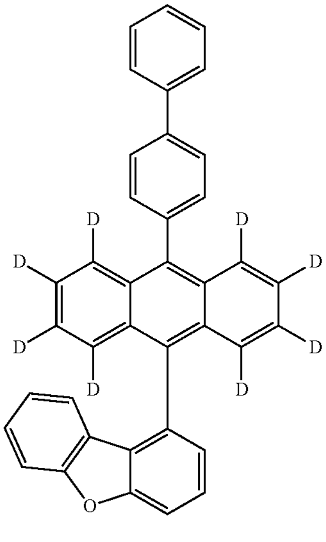
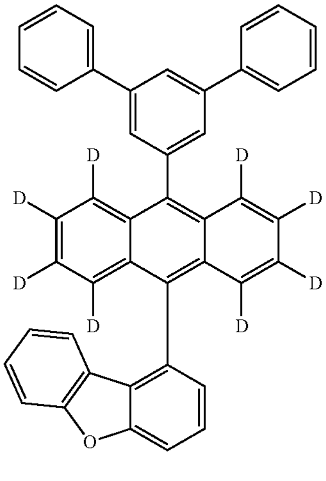

-continued
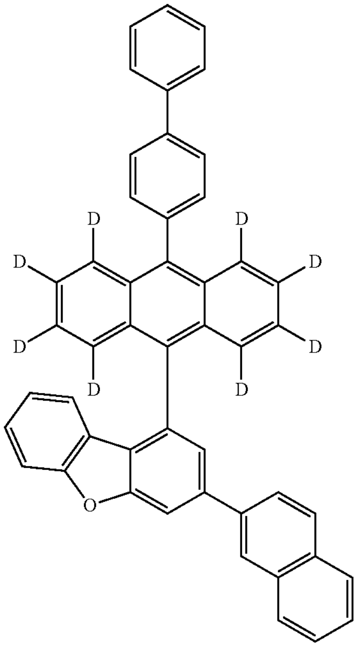
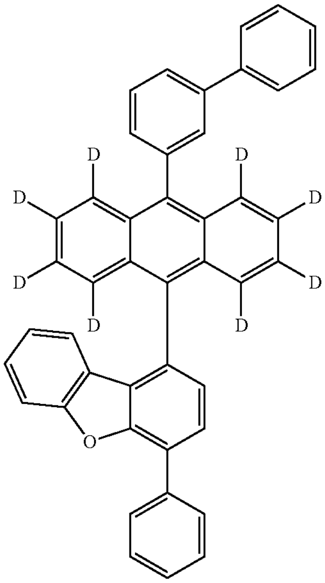
-continued
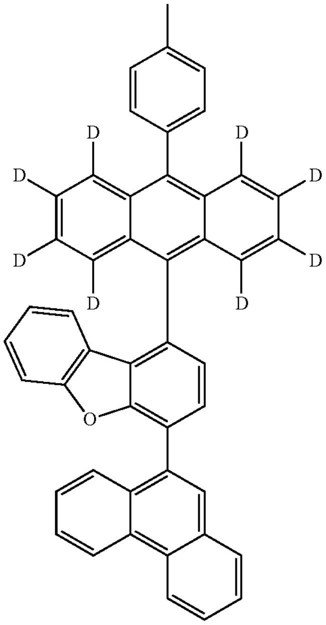
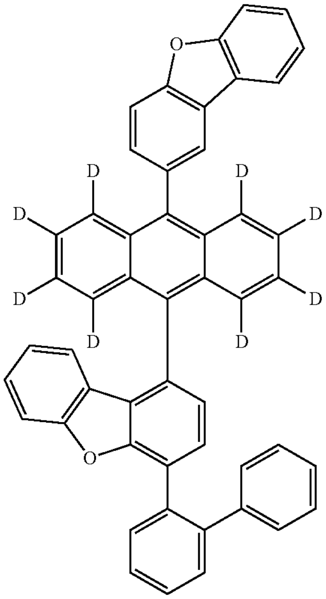

-continued
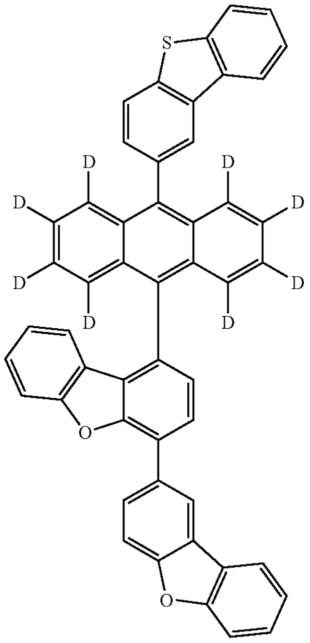
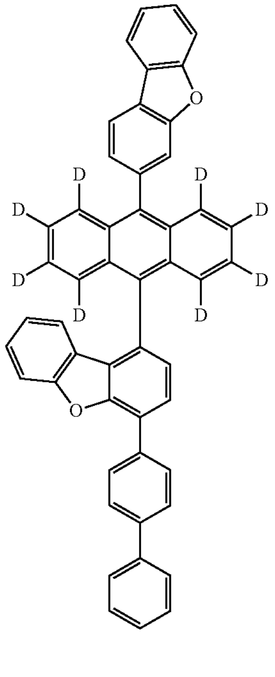
-continued
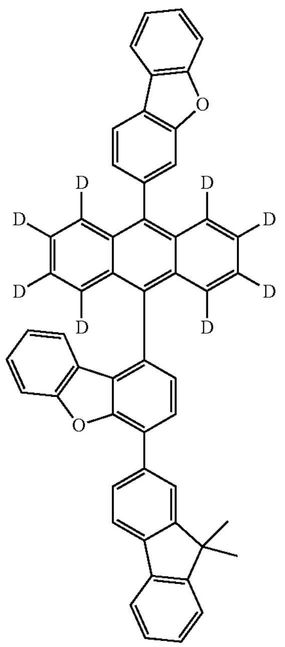
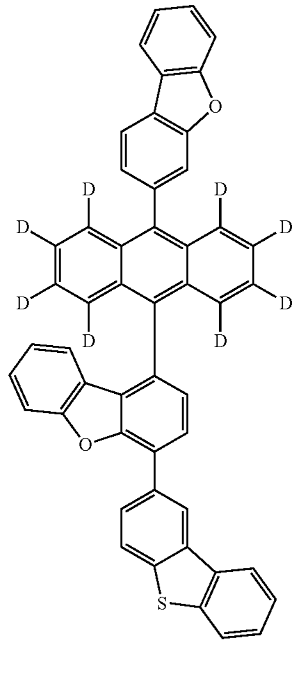

-continued
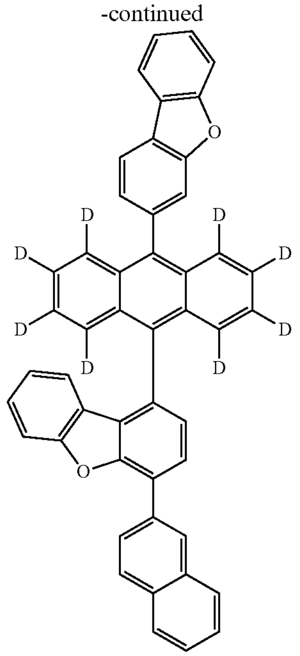
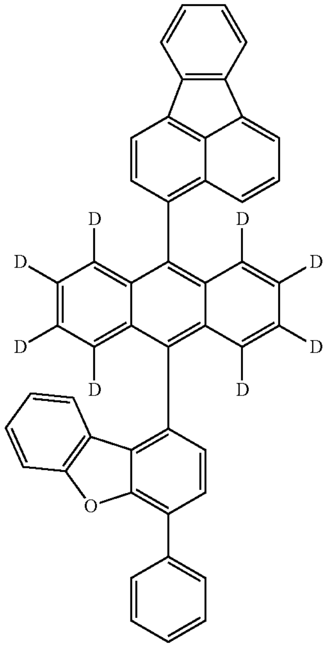
-continued
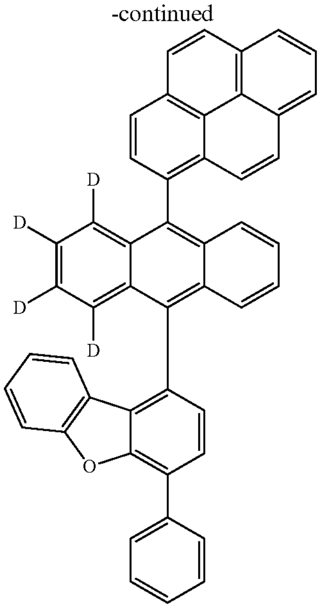
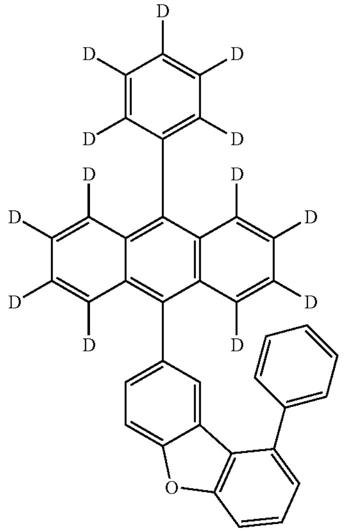
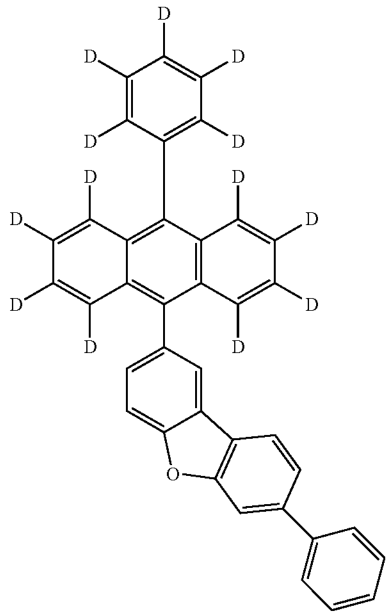

-continued
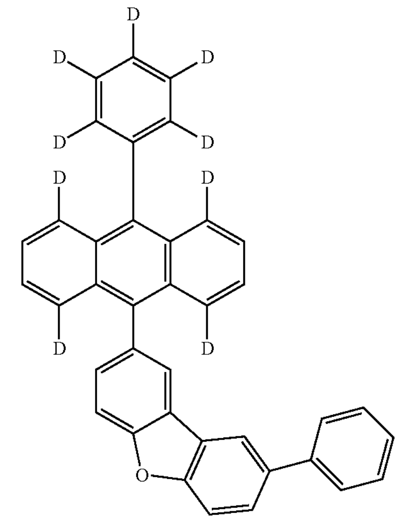
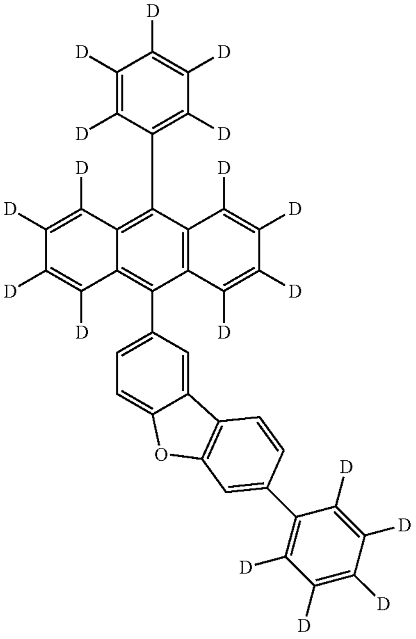
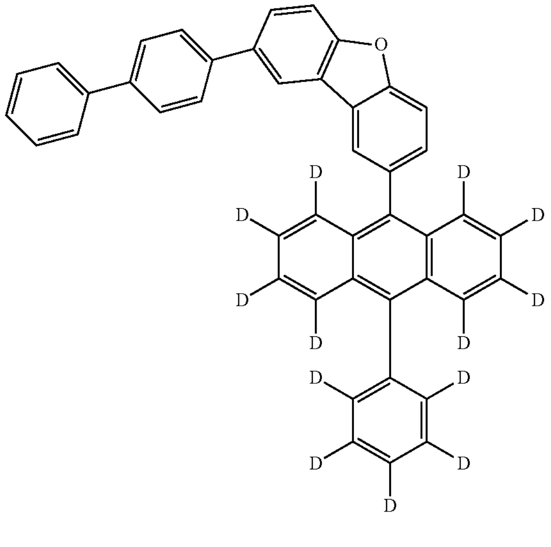
-continued
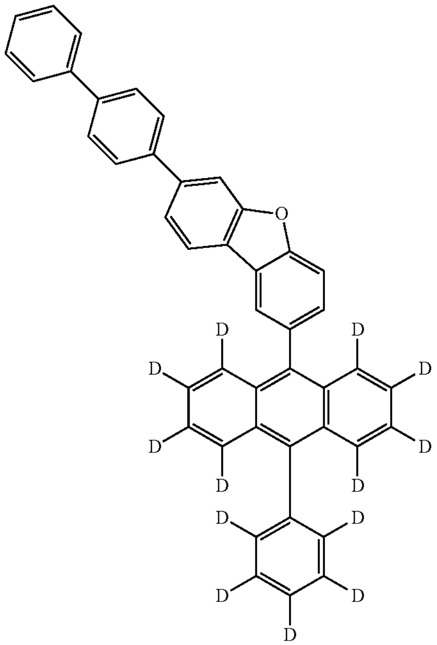
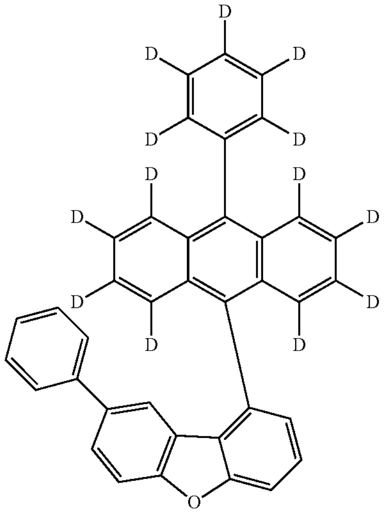
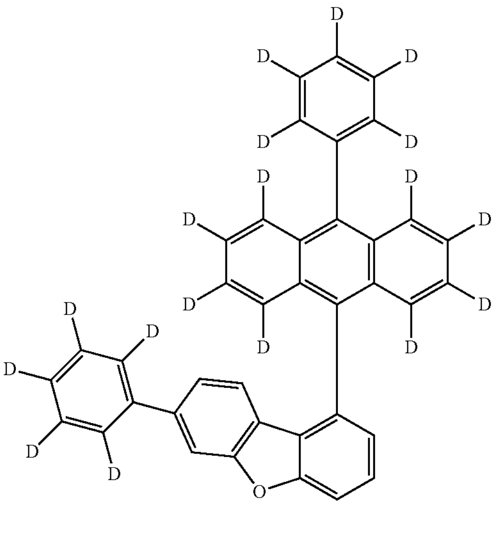

-continued
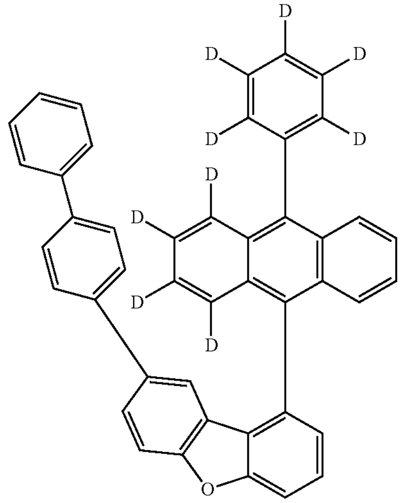
-continued
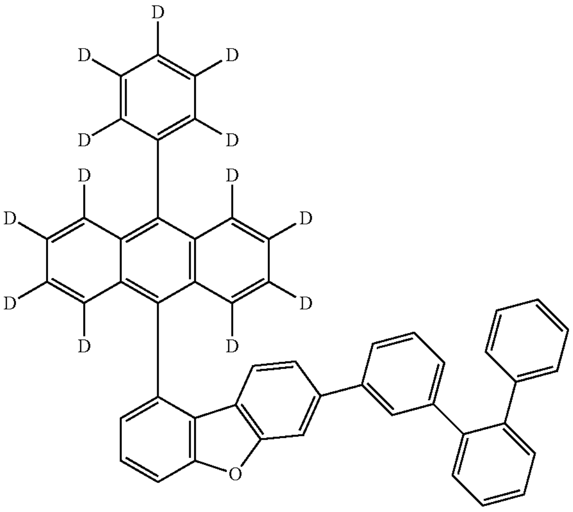
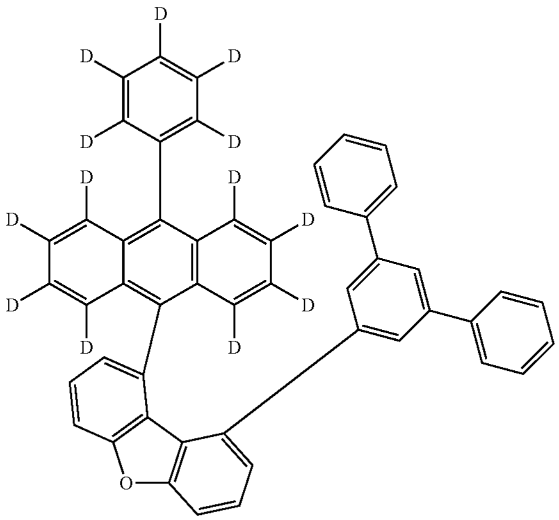
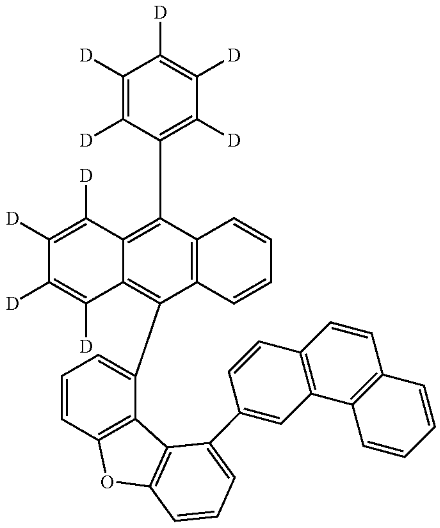
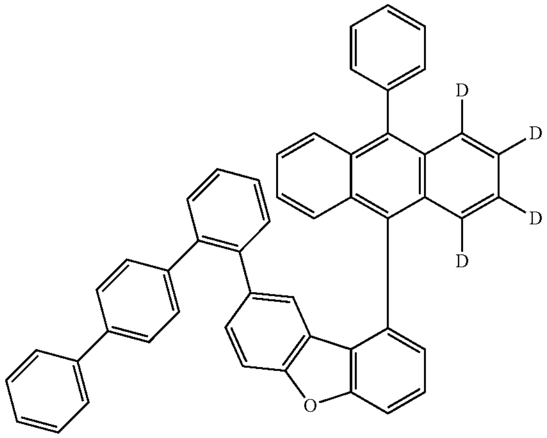
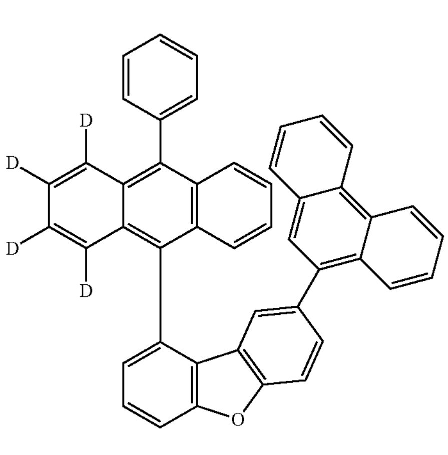

-continued
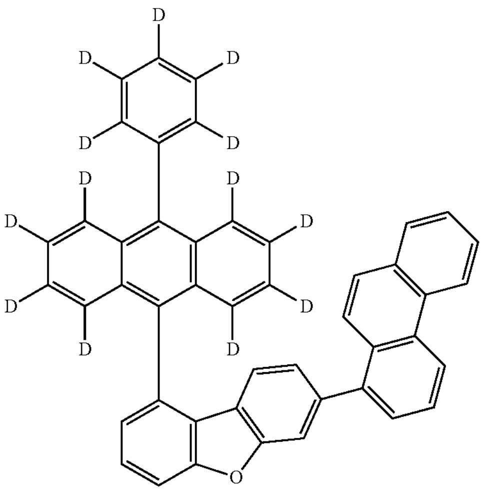
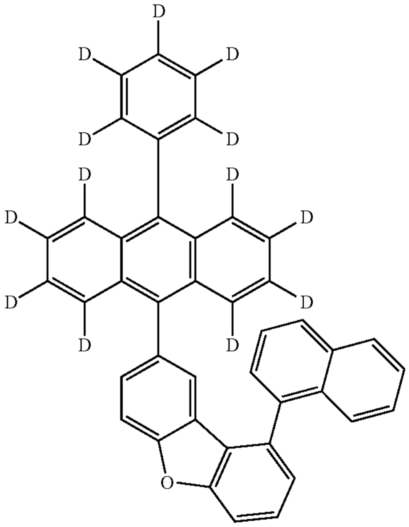
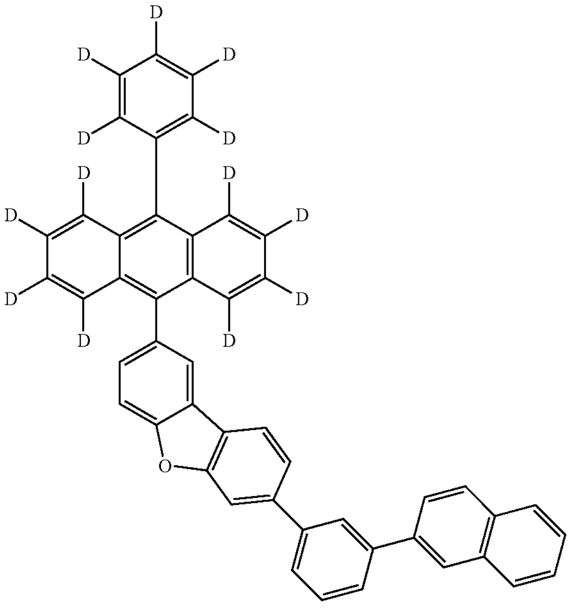
-continued
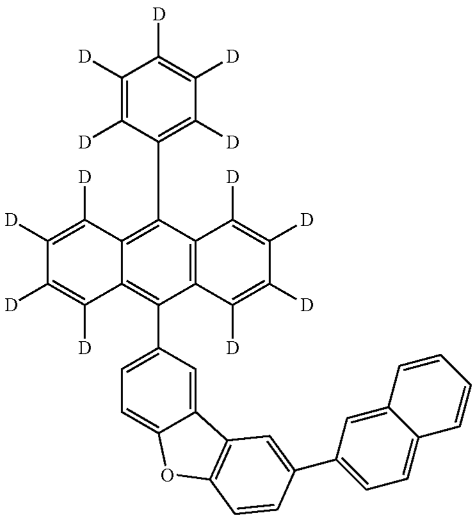
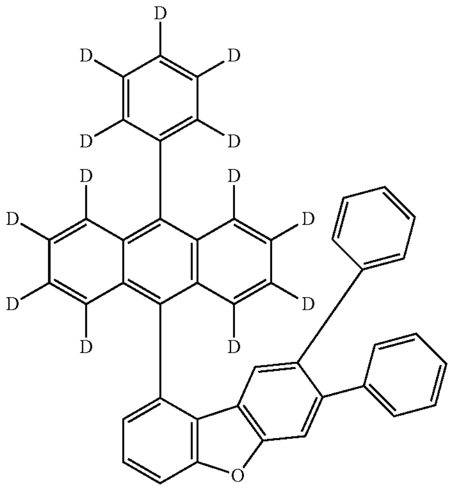
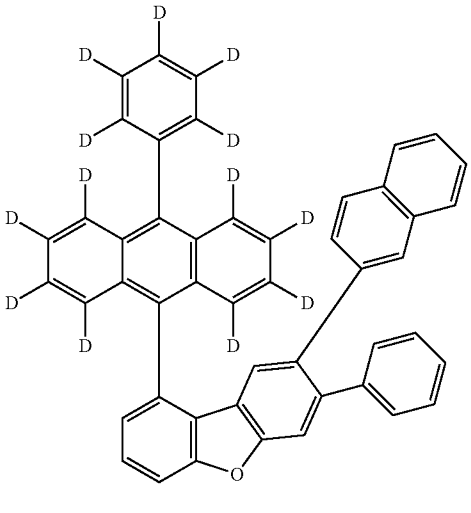

-continued
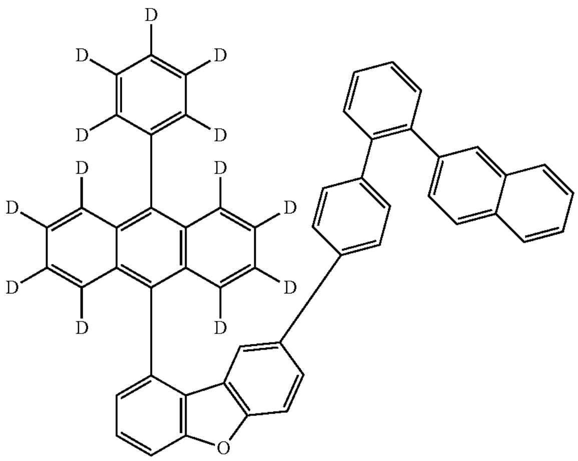
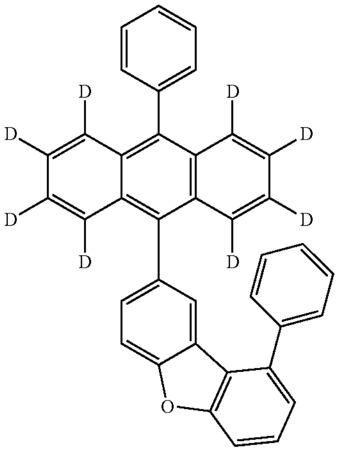
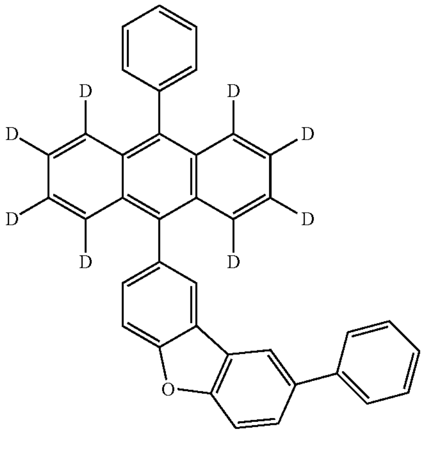
-continued
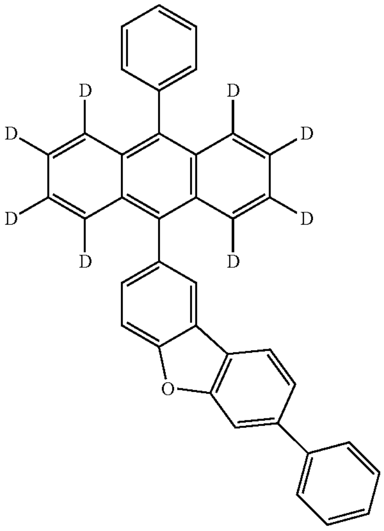
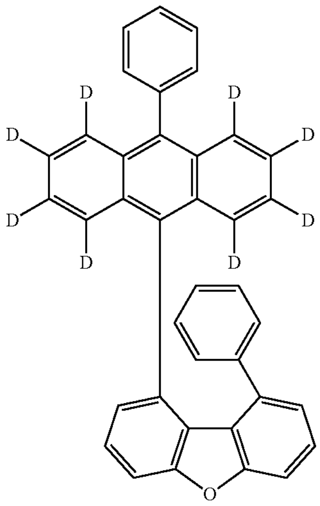
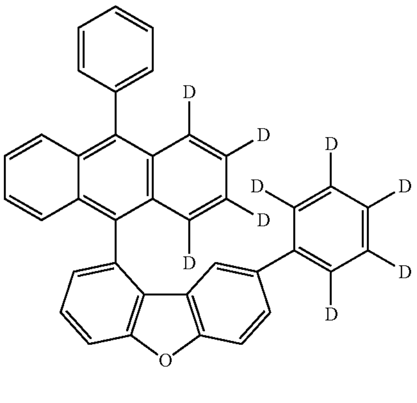

-continued
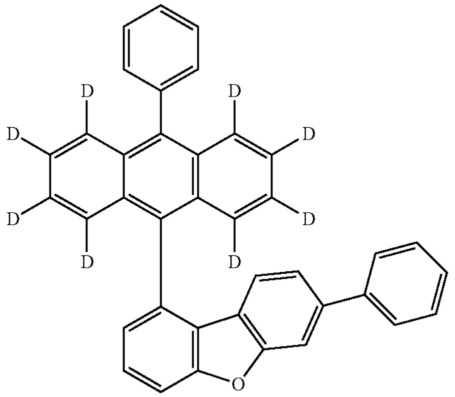
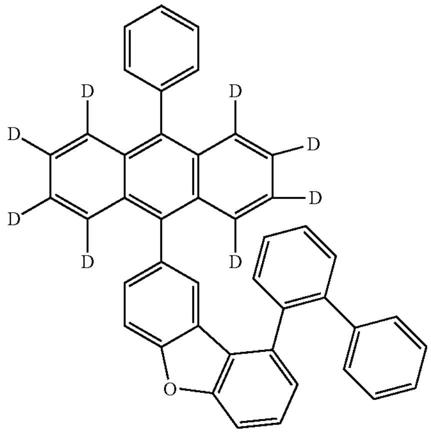
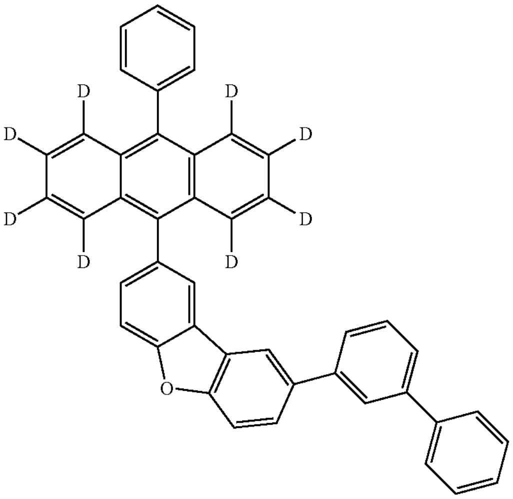
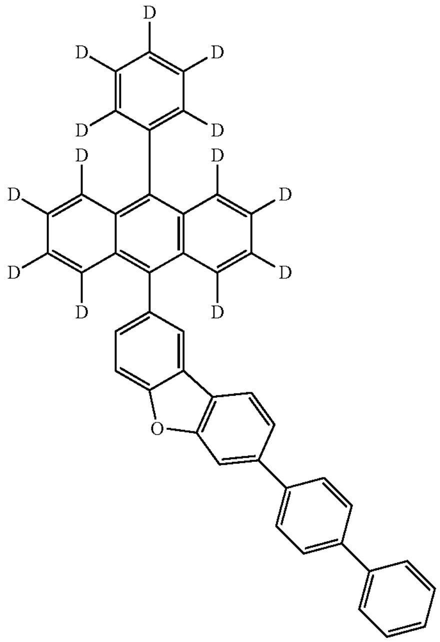
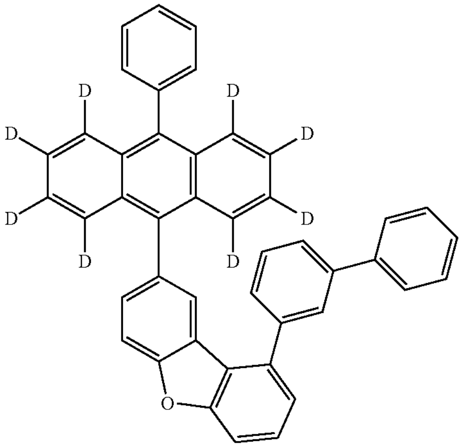
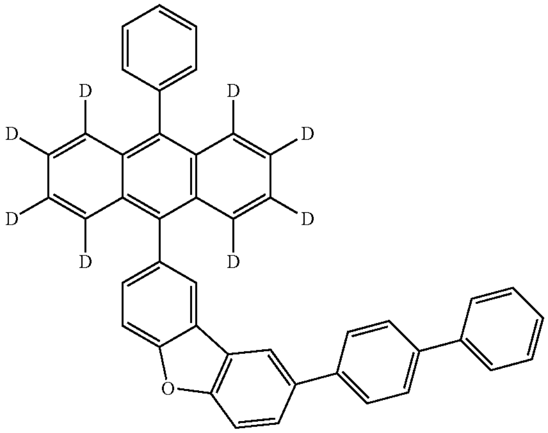
-continued -continued
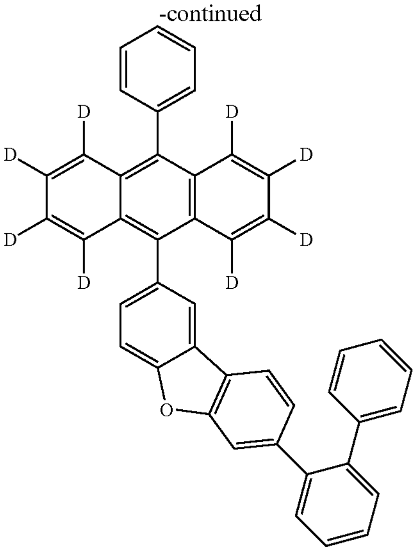
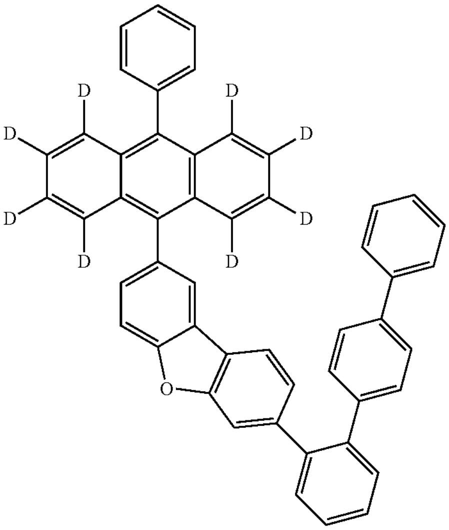
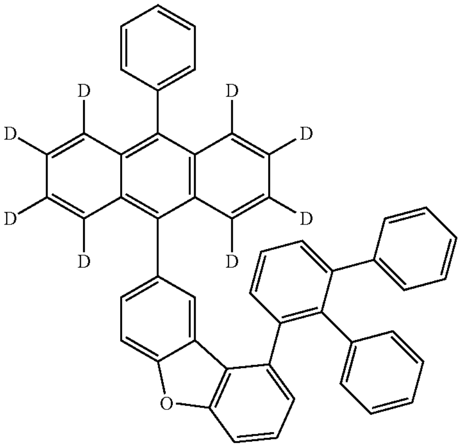
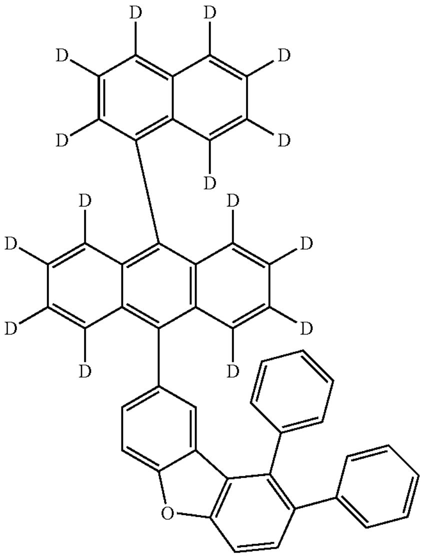
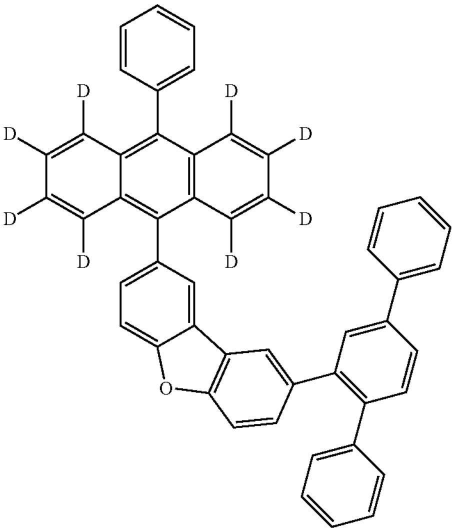
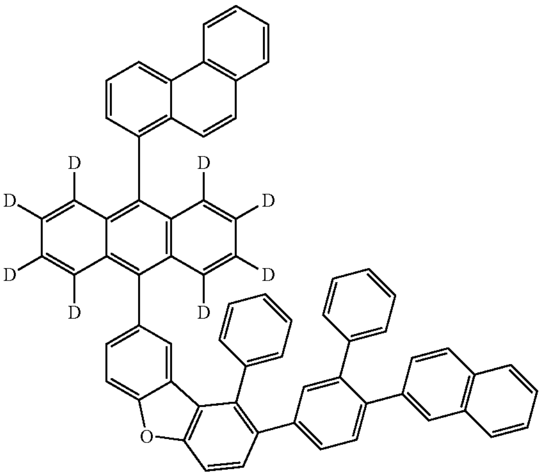

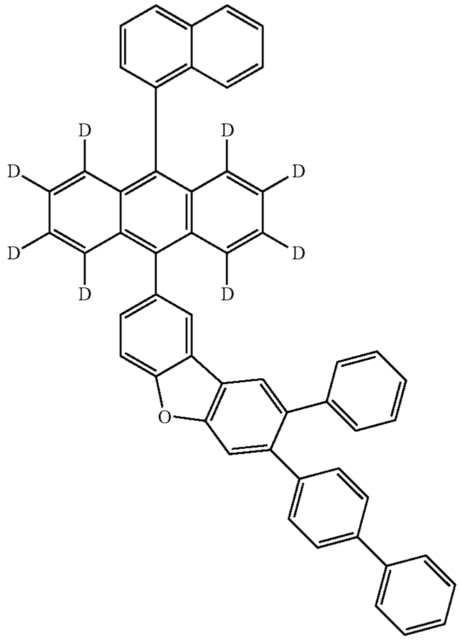
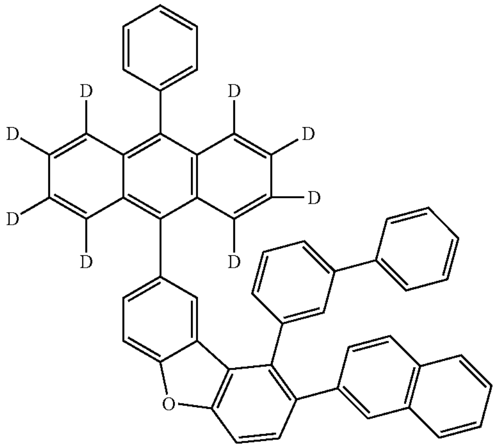
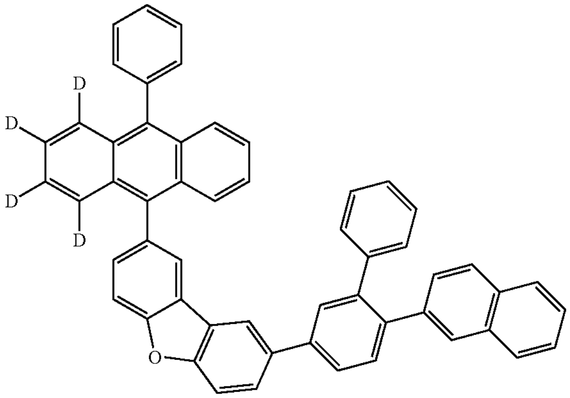
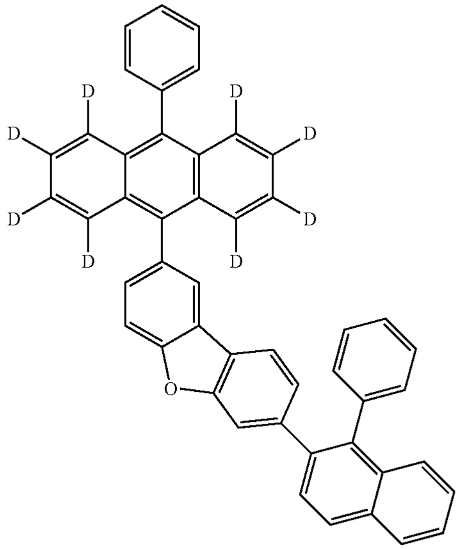
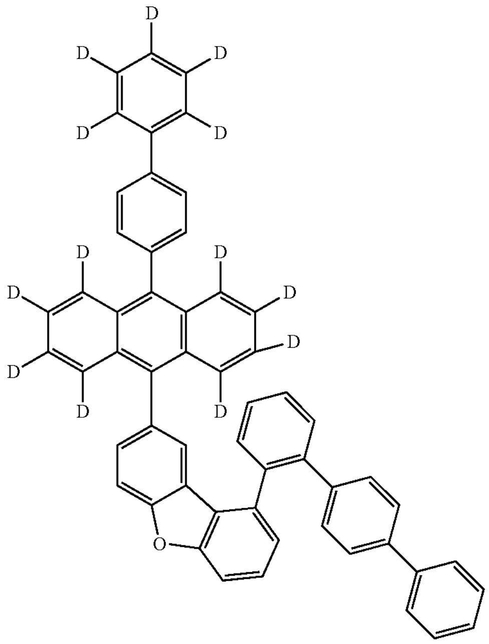
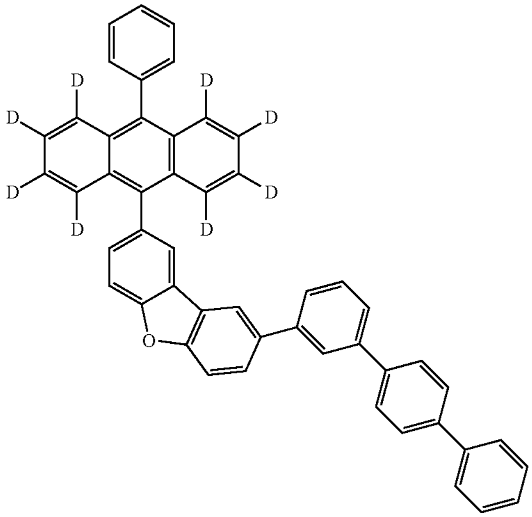

-continued
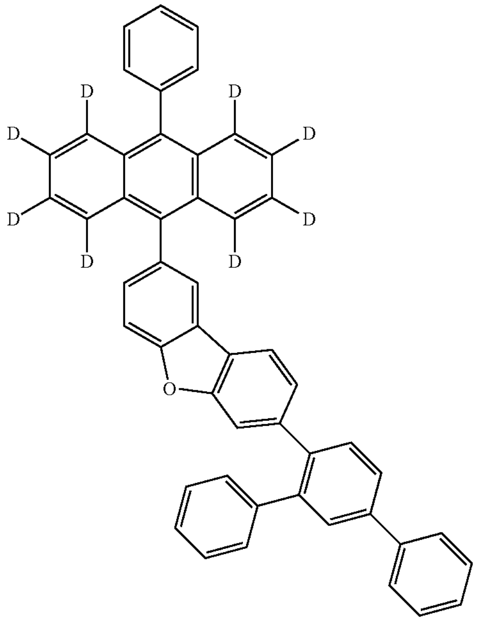
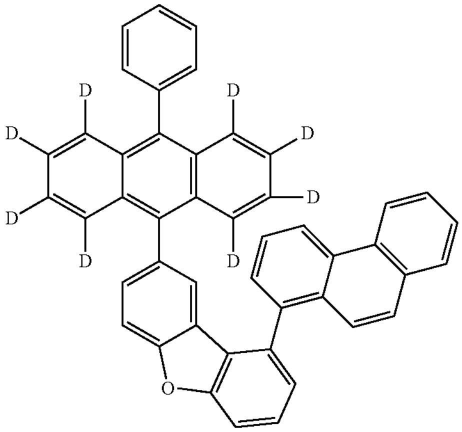
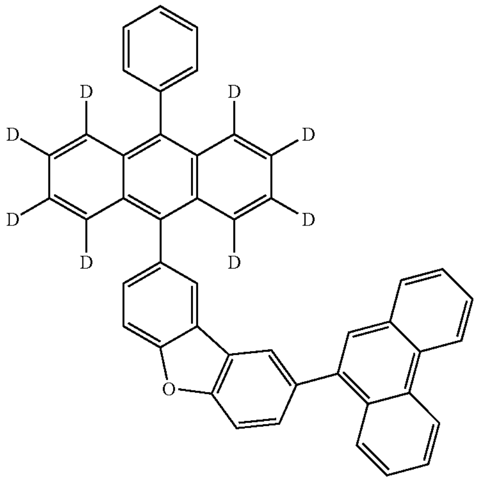
-continued
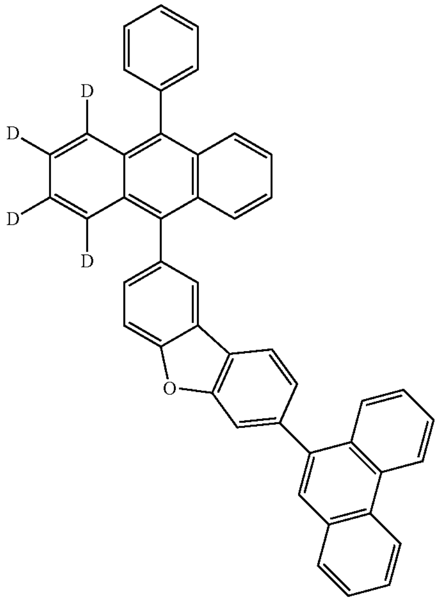
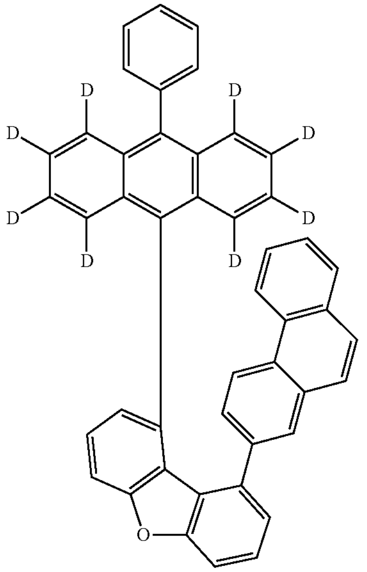
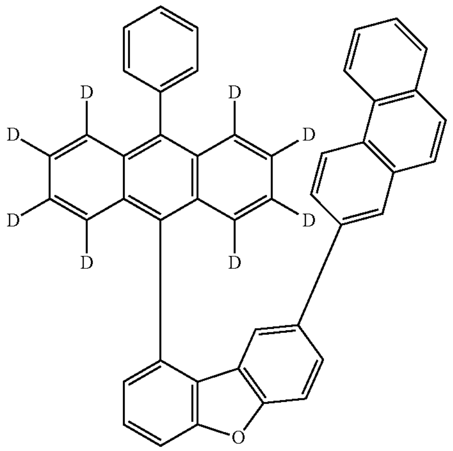

-continued
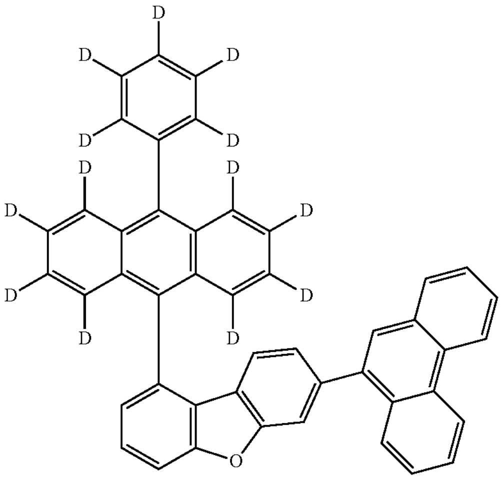
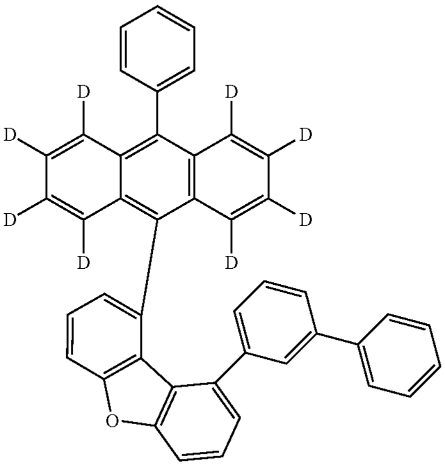
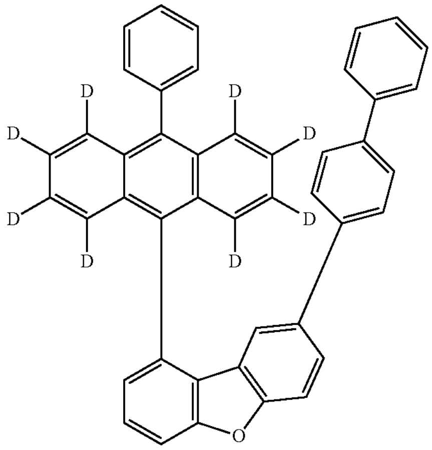
-continued
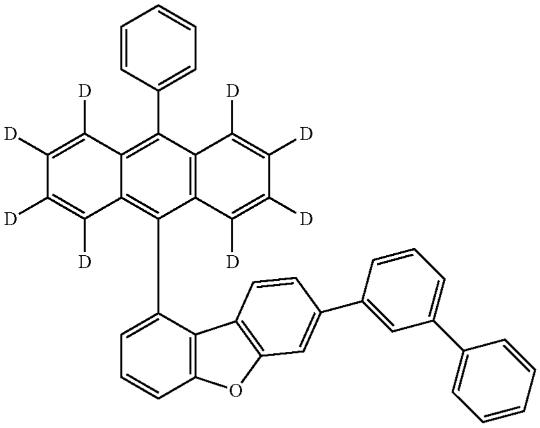
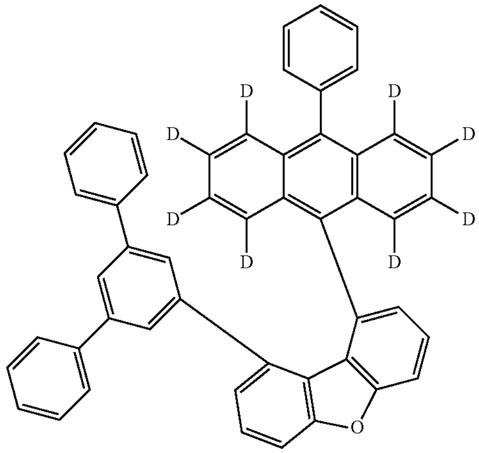
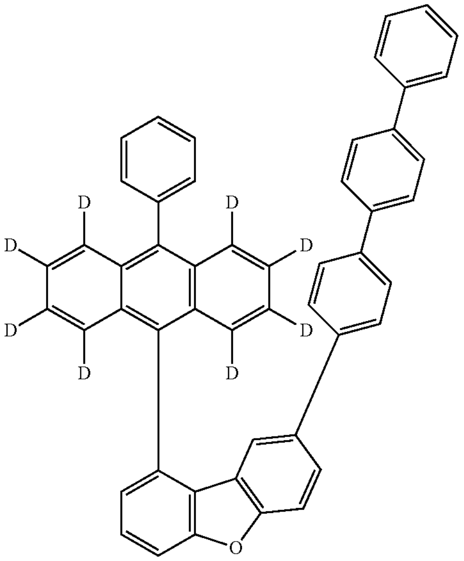

-continued
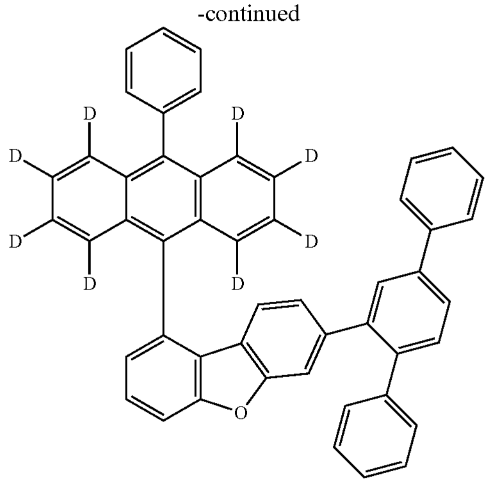
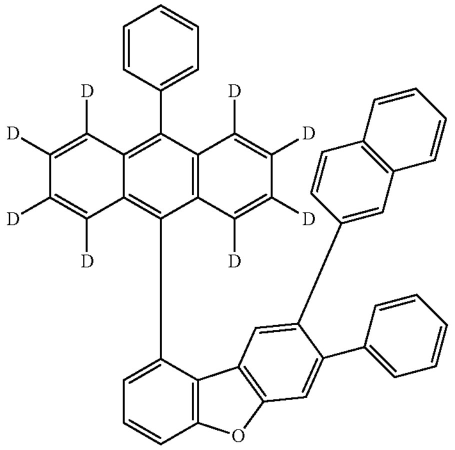
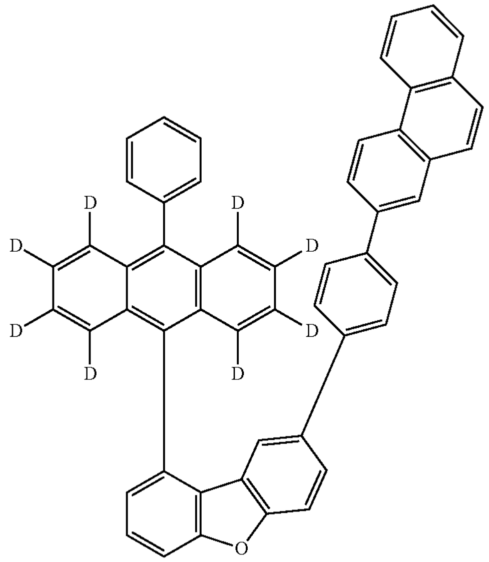
-continued
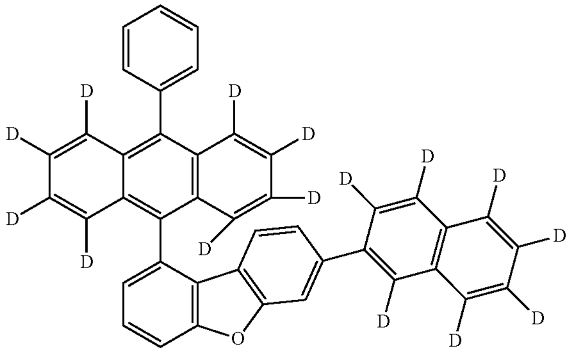
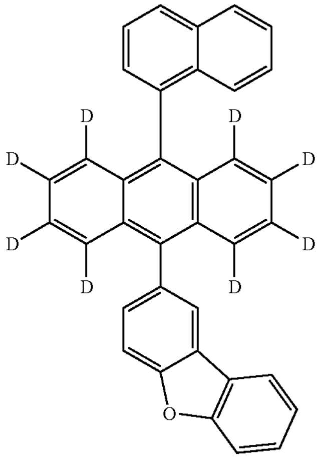
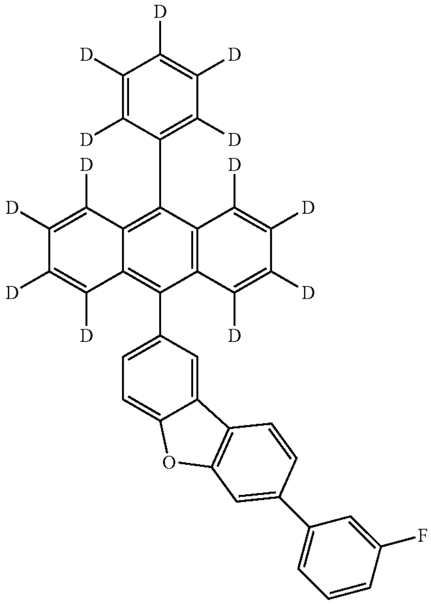

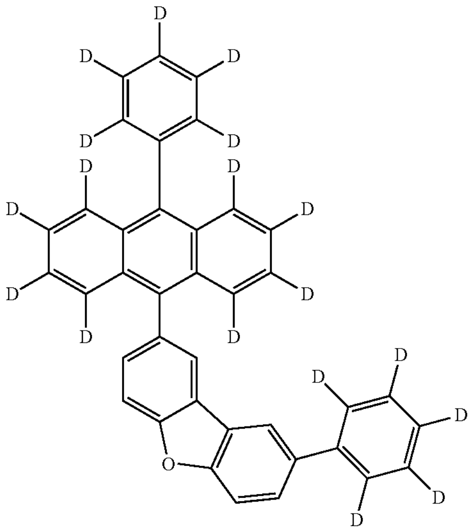
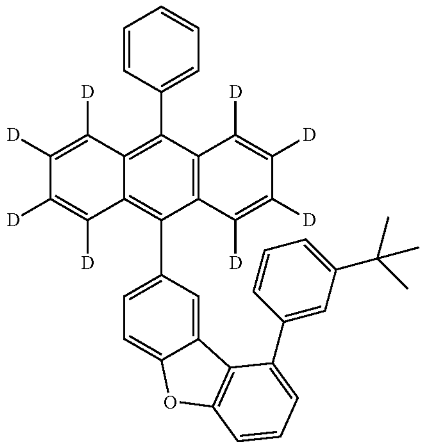
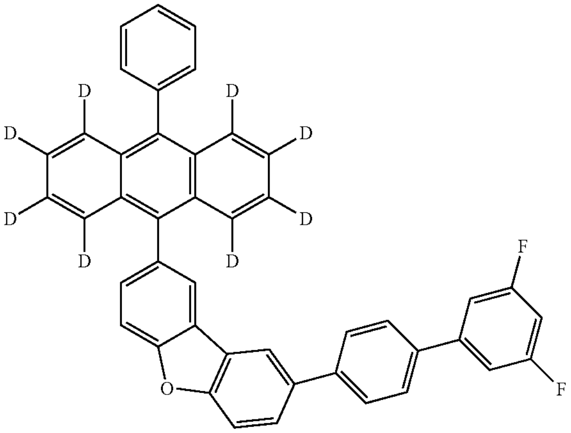
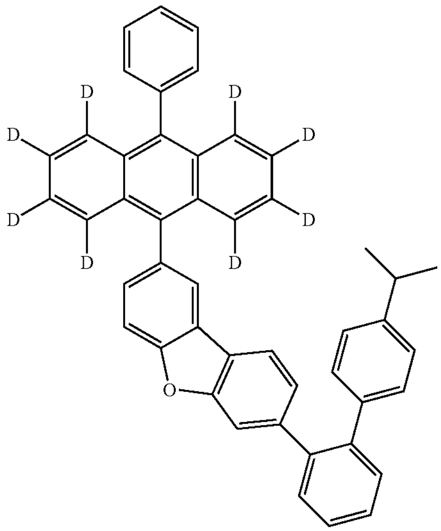
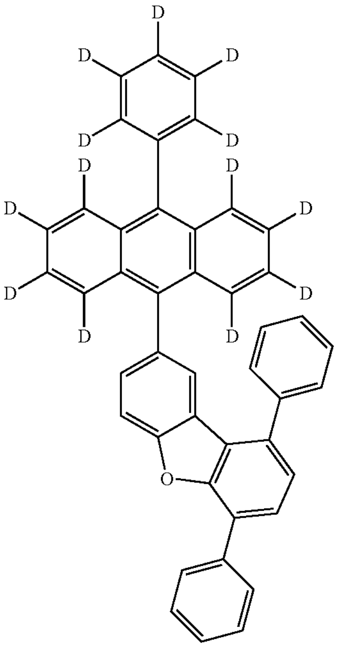

-continued
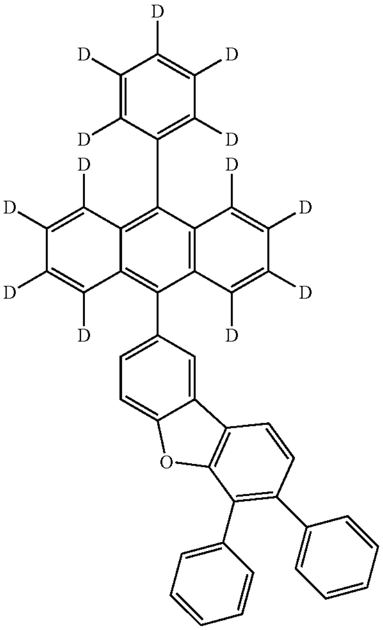
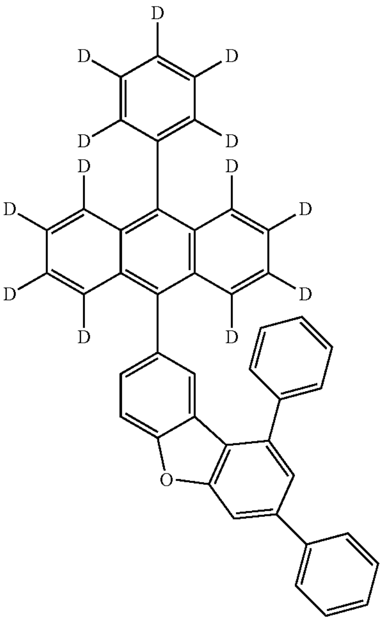
-continued
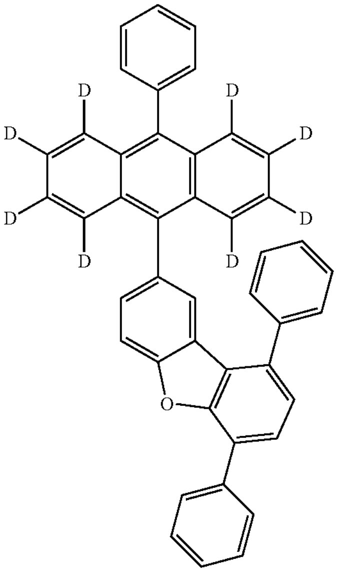
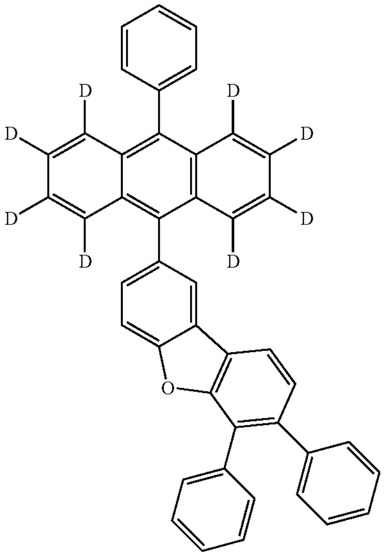
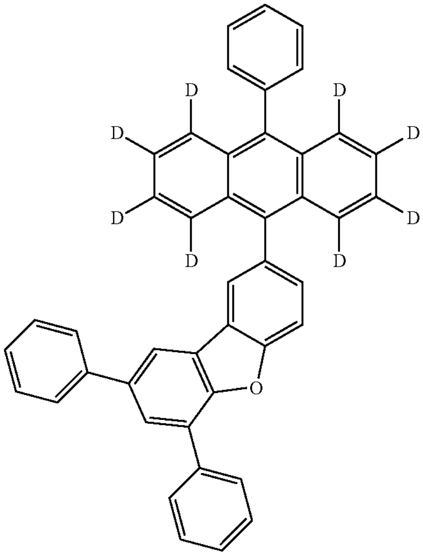

-continued
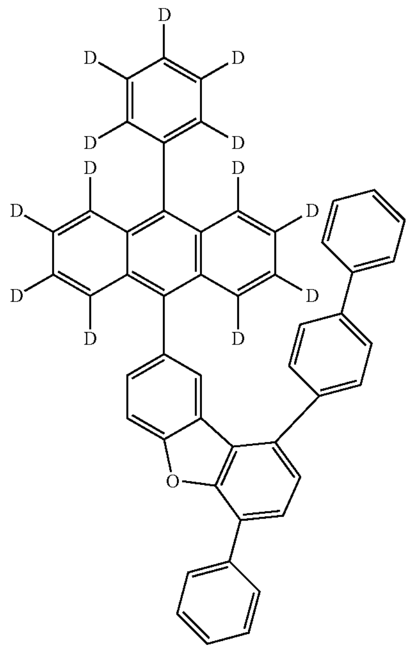
-continued
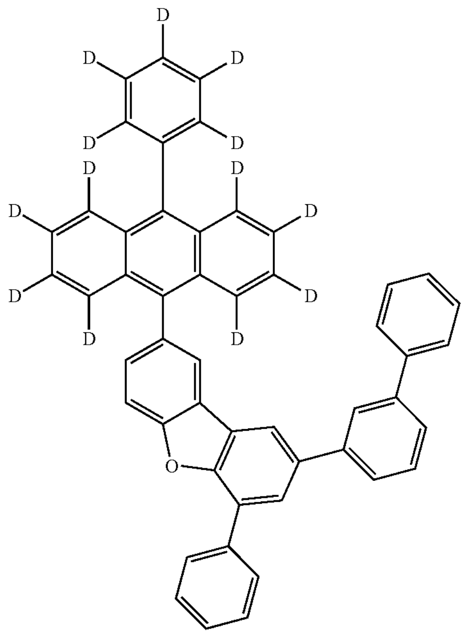
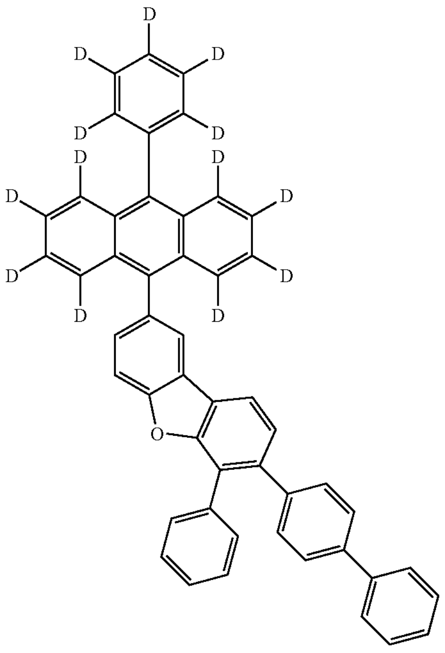
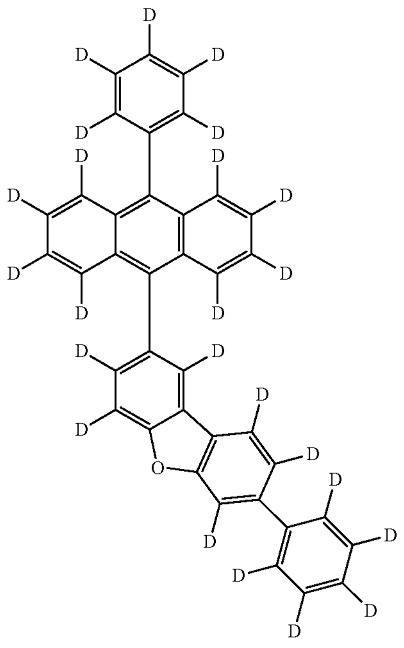

-continued
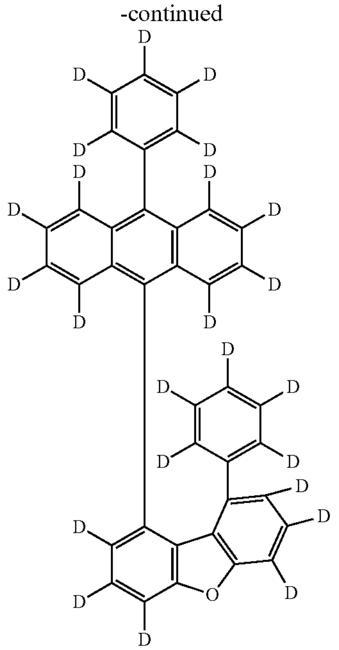
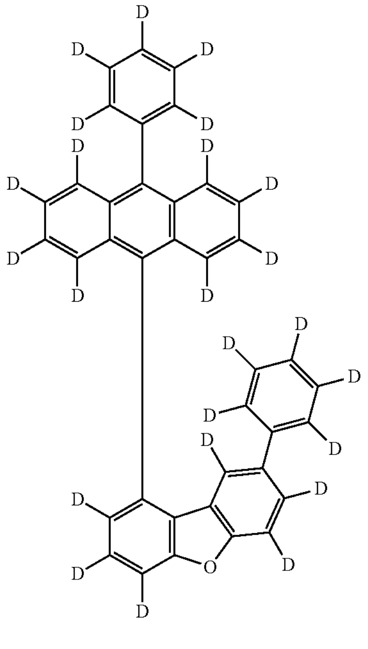
-continued
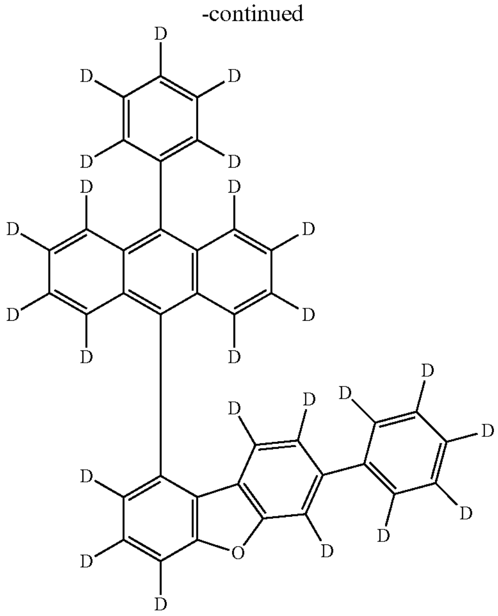
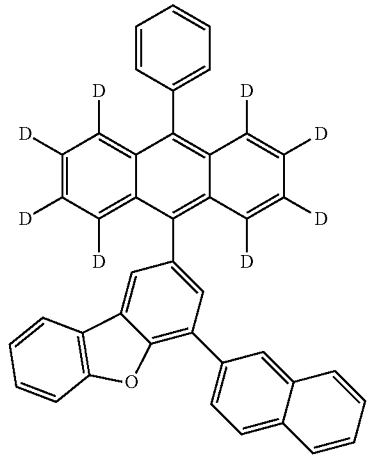
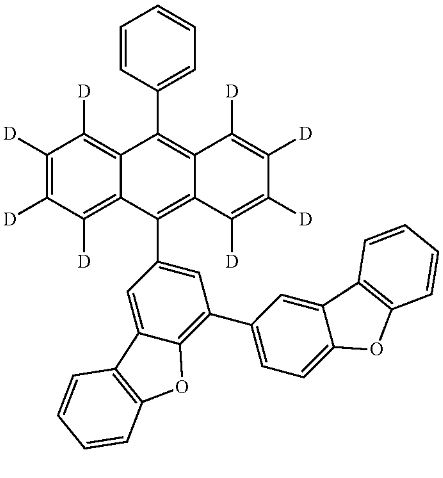

-continued
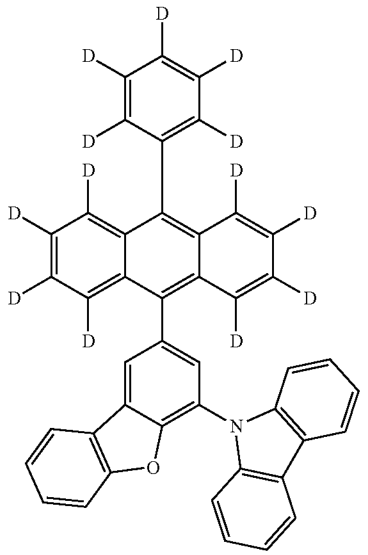
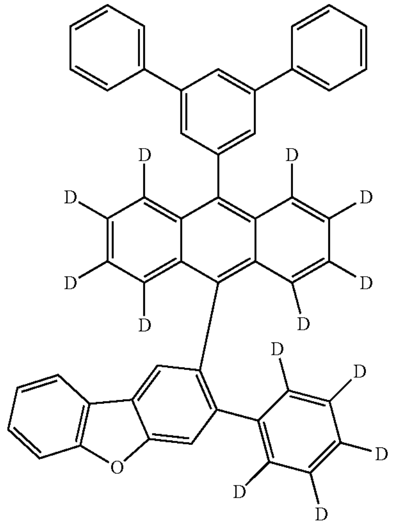
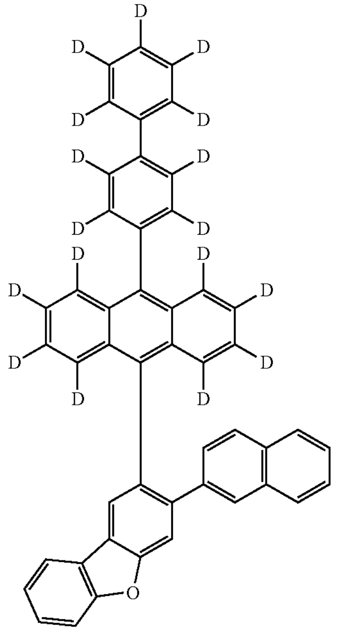
-continued
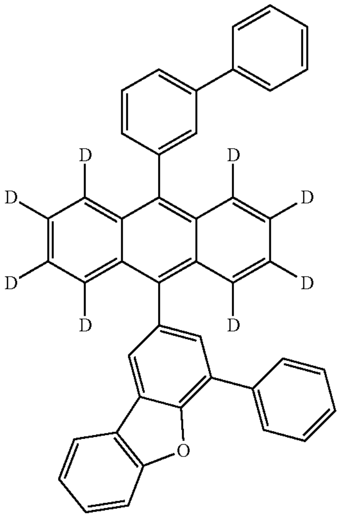
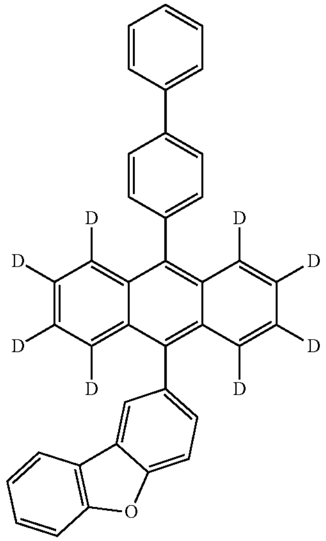
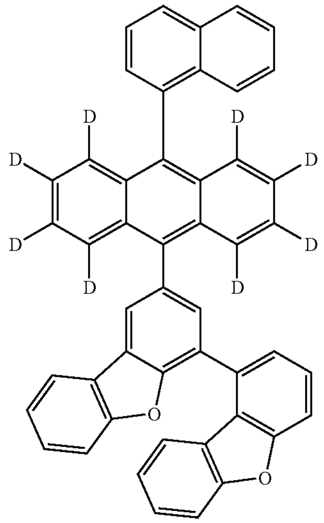

-continued
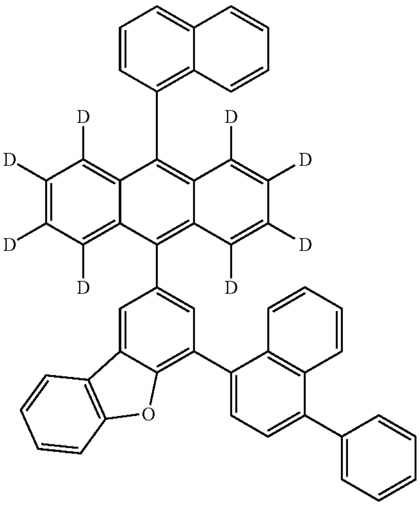
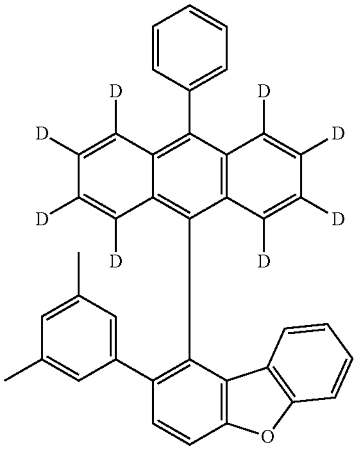
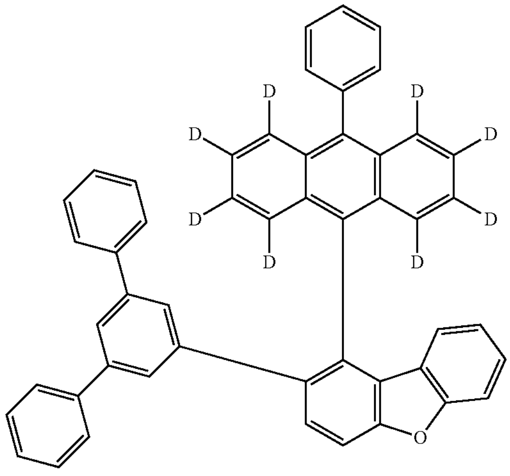
-continued
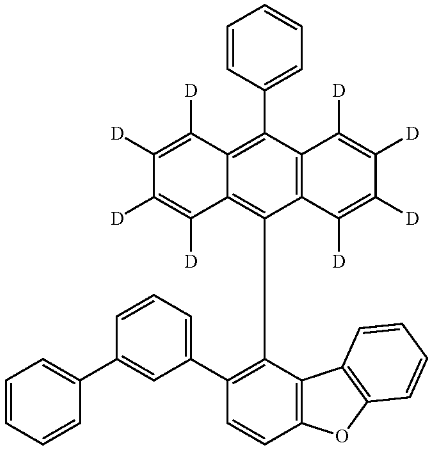
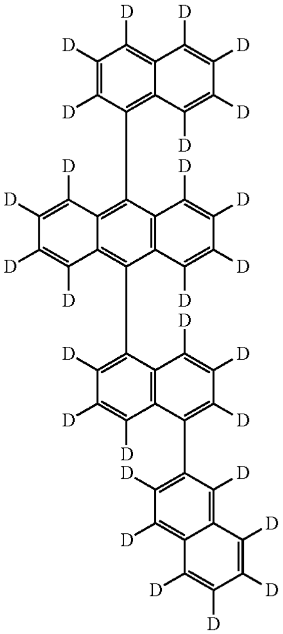
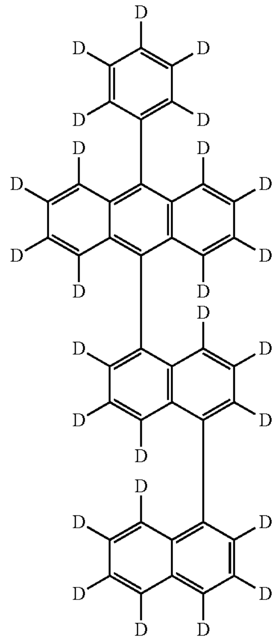

-continued
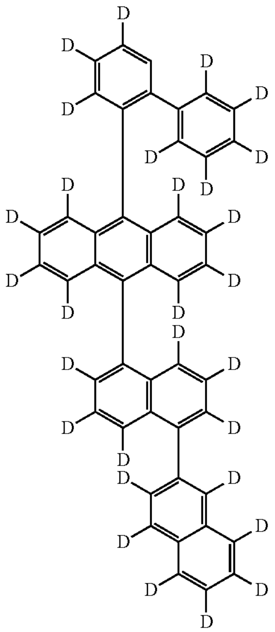
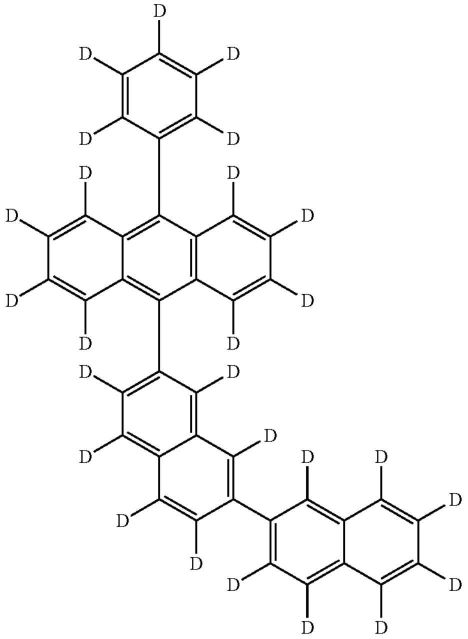
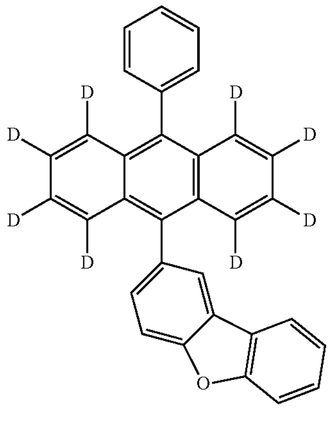
-continued
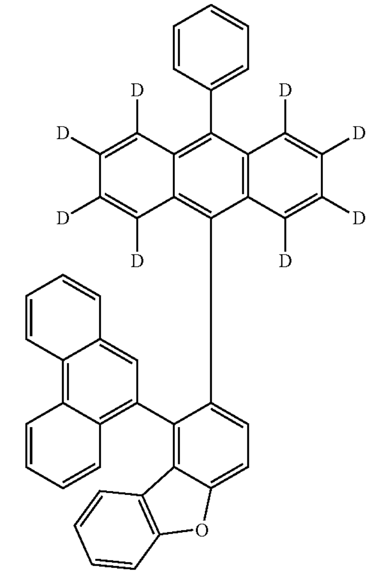
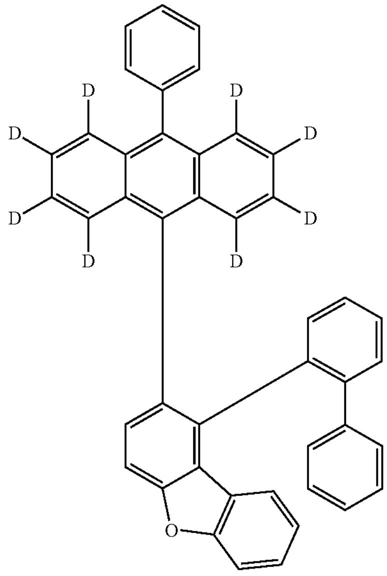
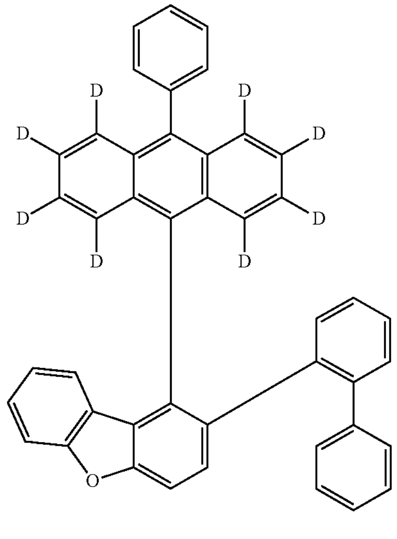

-continued
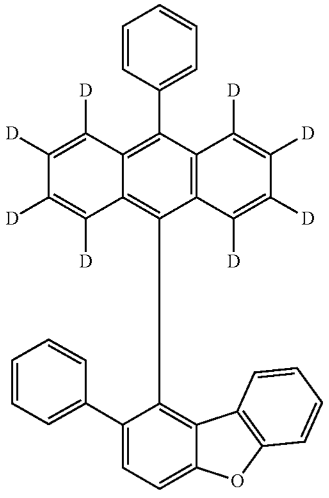
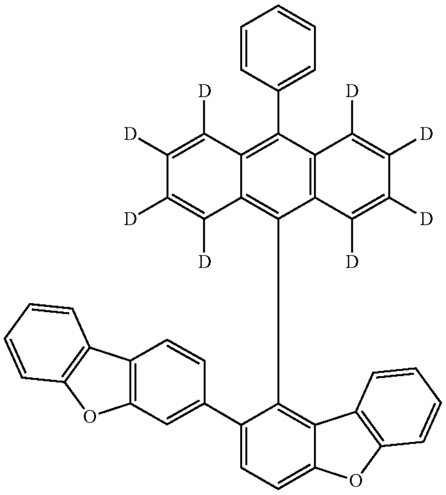
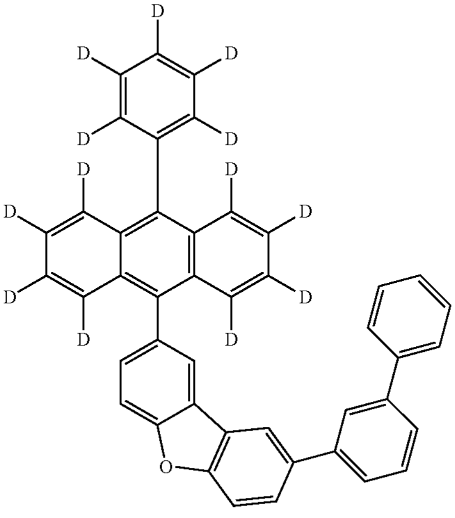
-continued
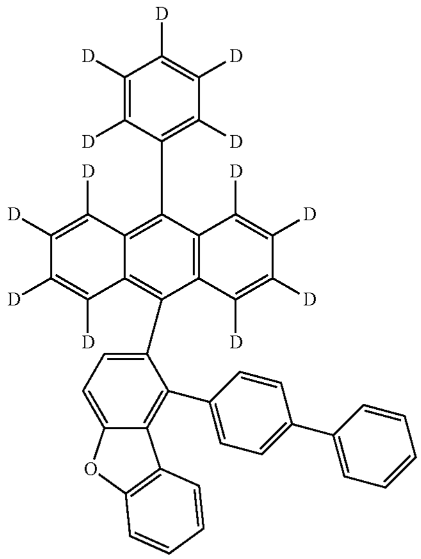
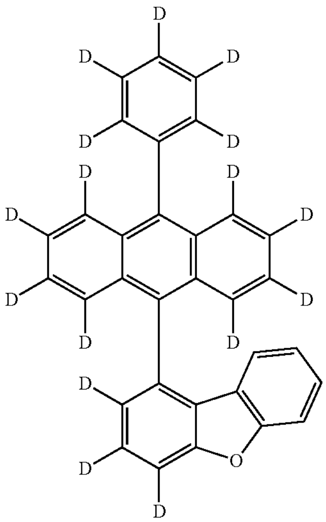
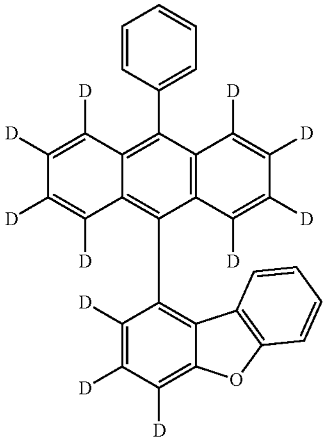

-continued
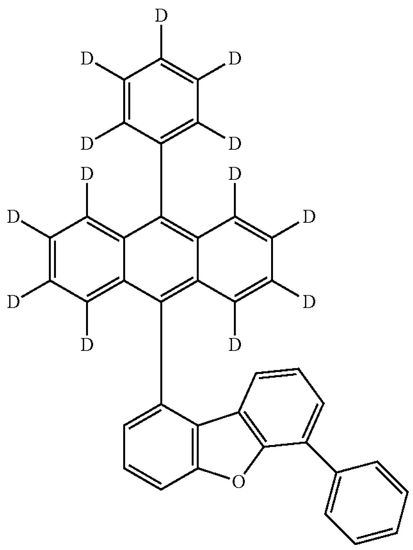
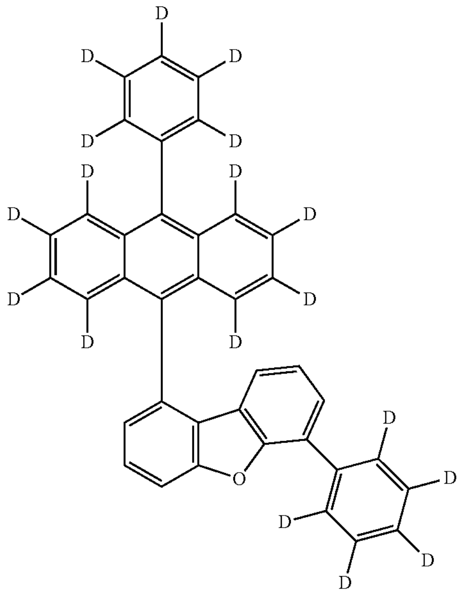
-continued
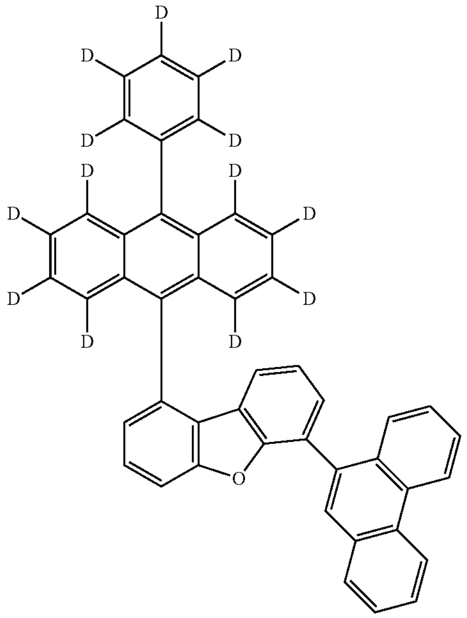 [SMILES: [2H]c1c([2H])c([2H])c(-c2c3c([2H])c([2H])c([2H])c([2H])c3c(-c3cccc4oc5c(-c6cc7ccccc7c7ccccc67)cccc5c34)c3c([2H])c([2H])c([2H])c([2H])c23)c([2H])c1[2H]]
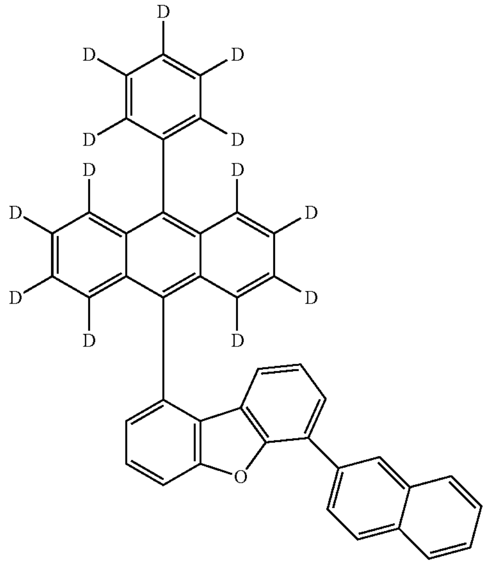
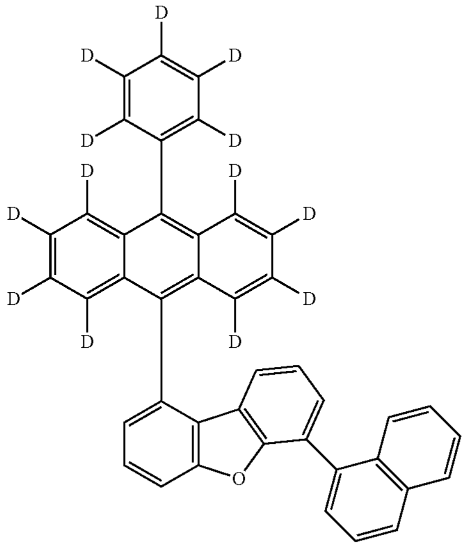

-continued
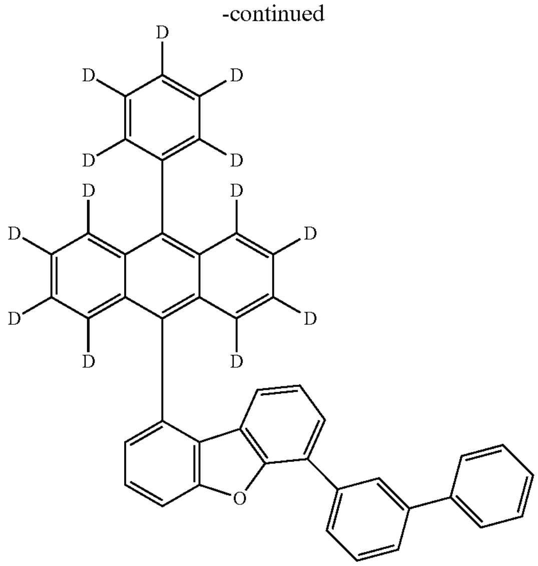
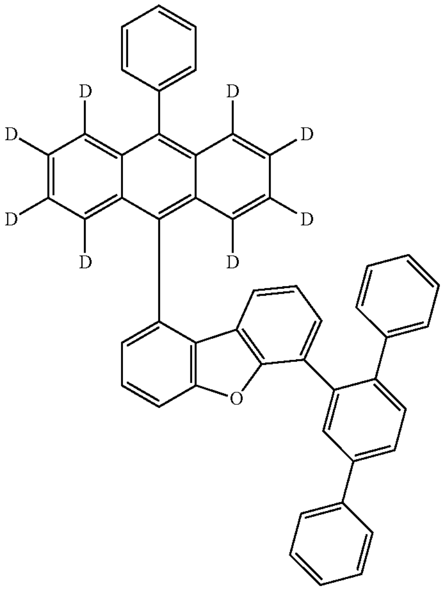
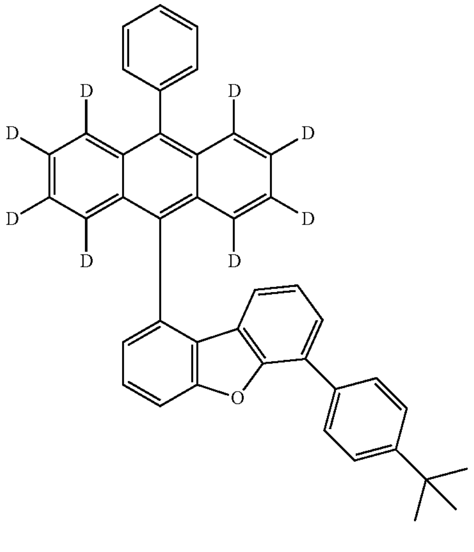
-continued
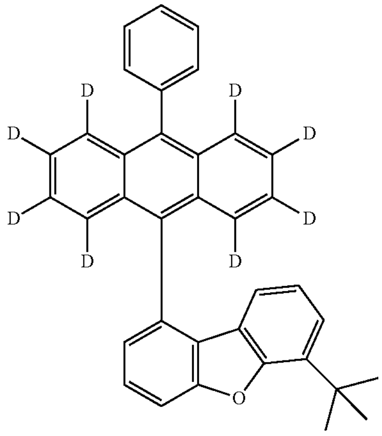
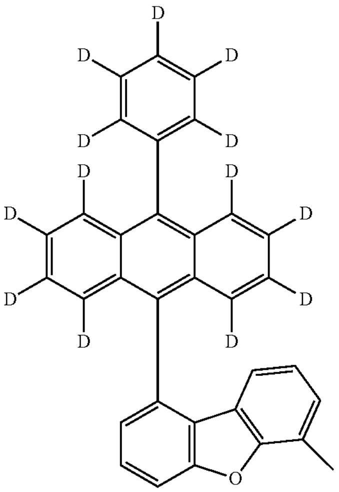
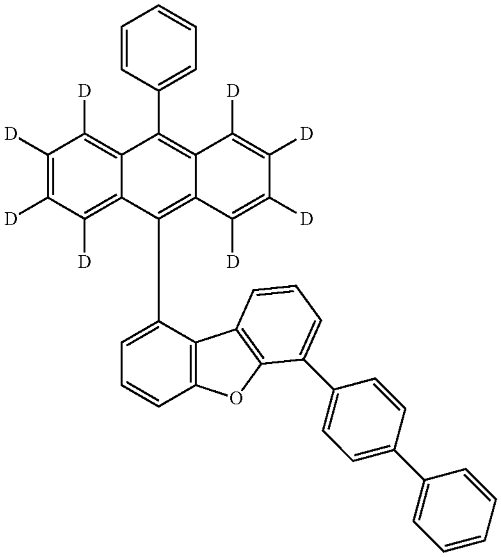

-continued
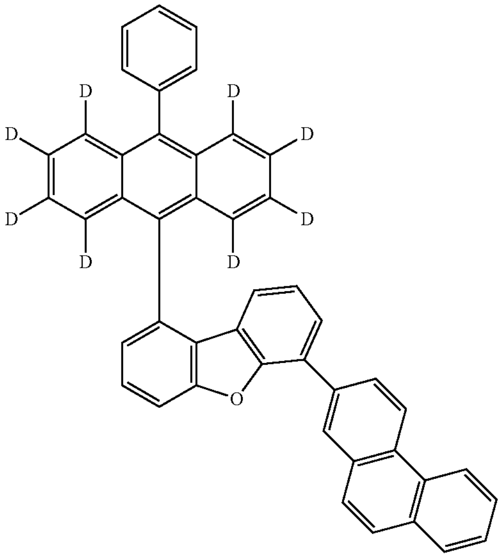
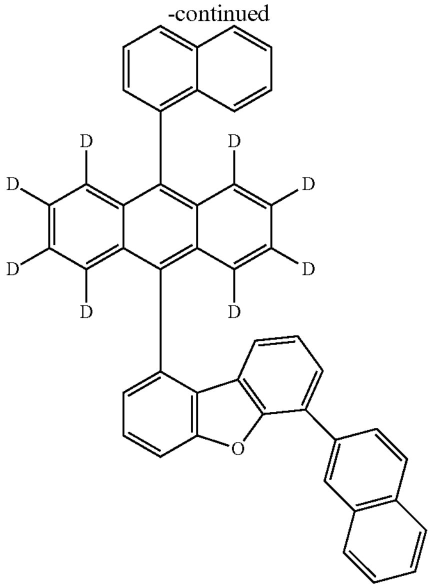
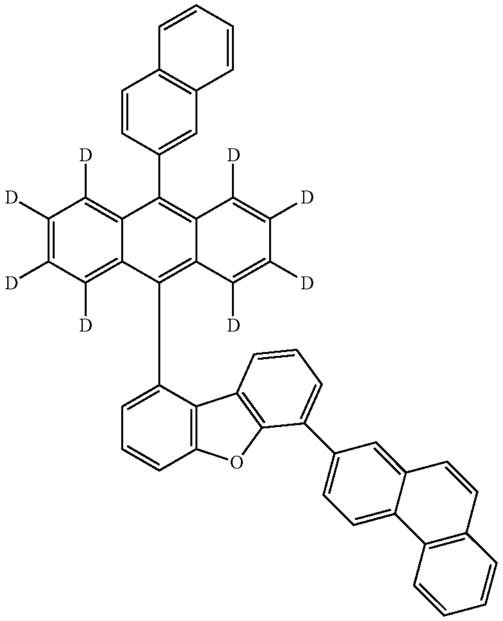
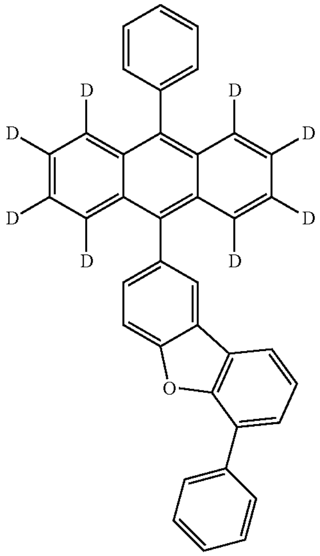

-continued
-continued
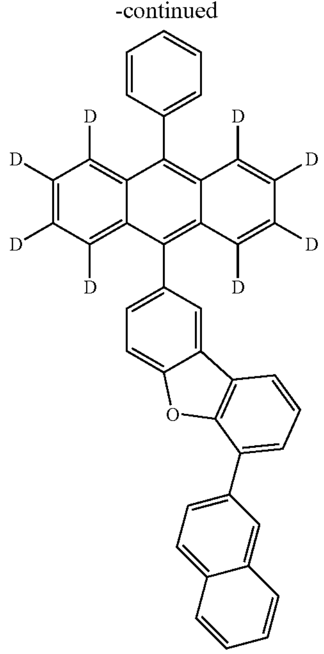
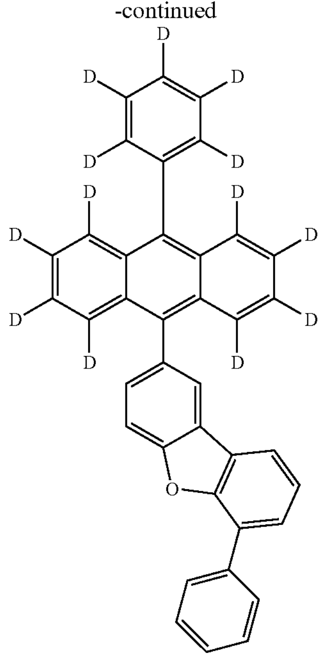
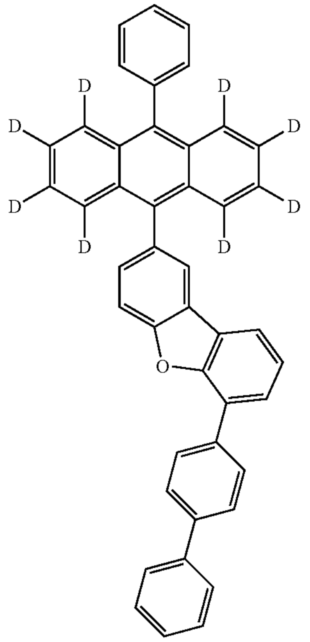
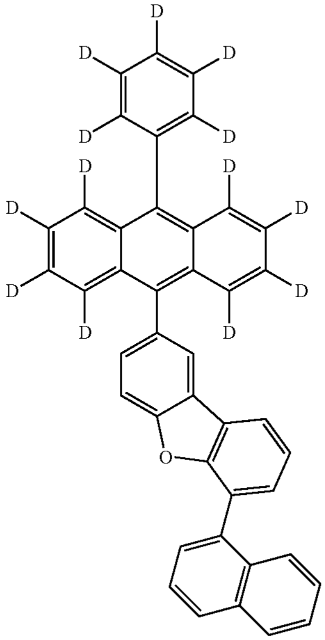

-continued
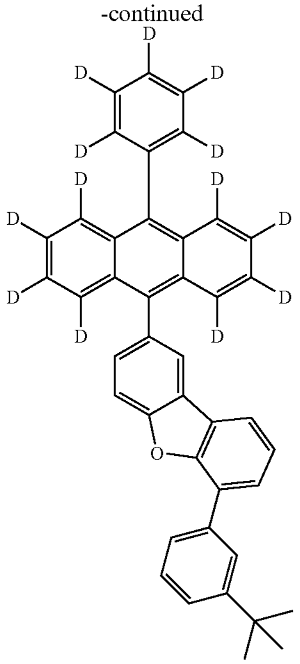
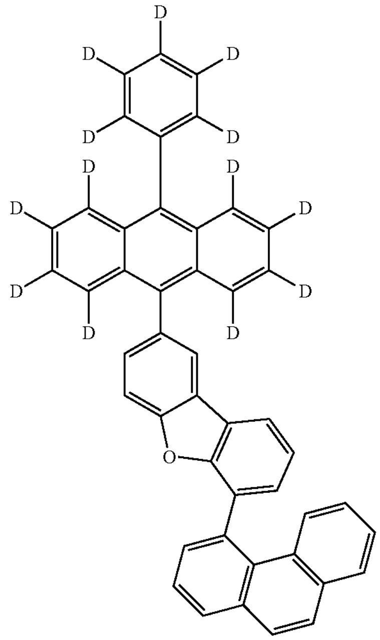
-continued
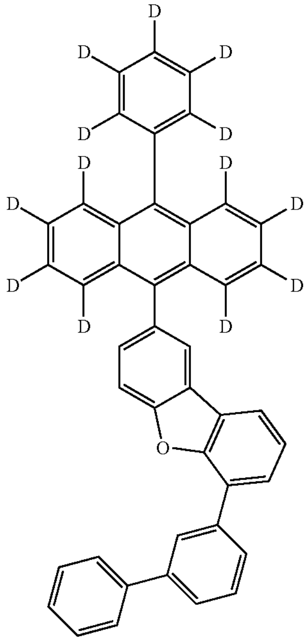
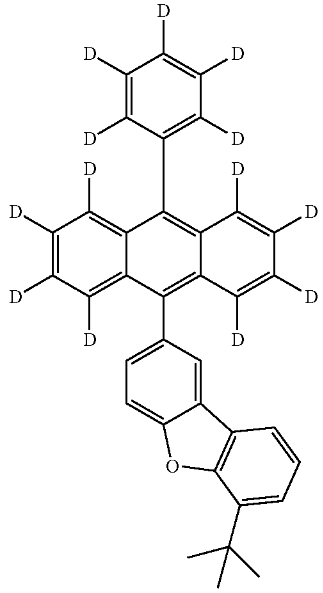

-continued
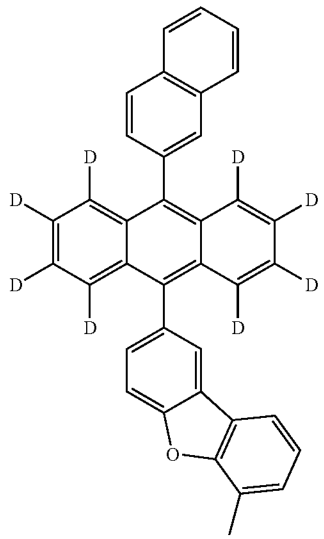
-continued
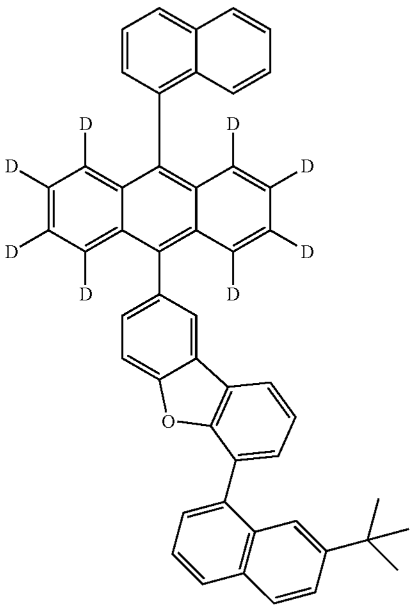
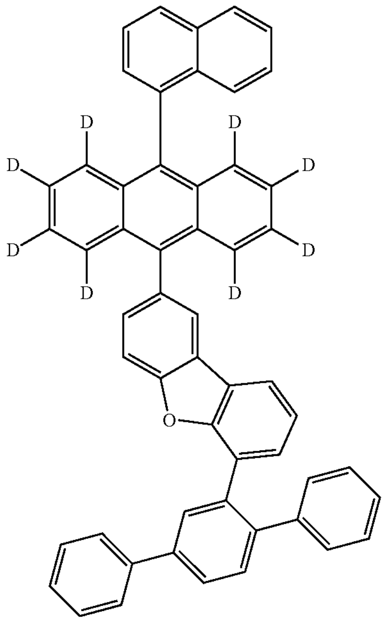
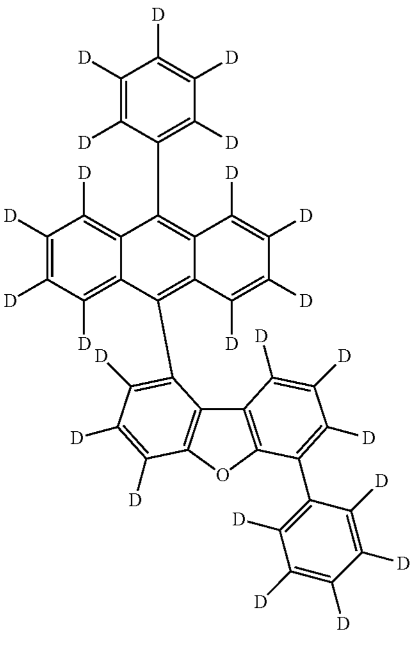

-continued
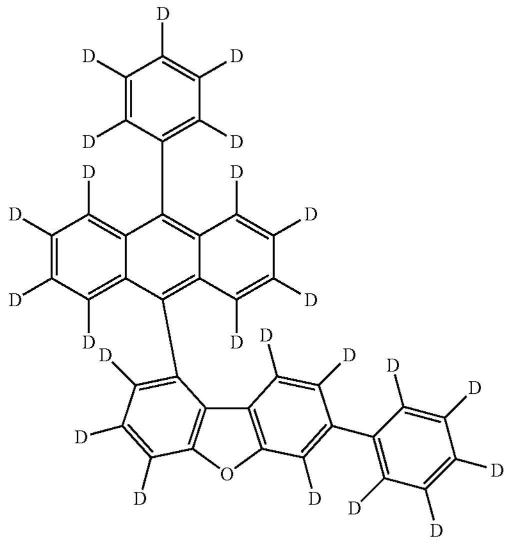
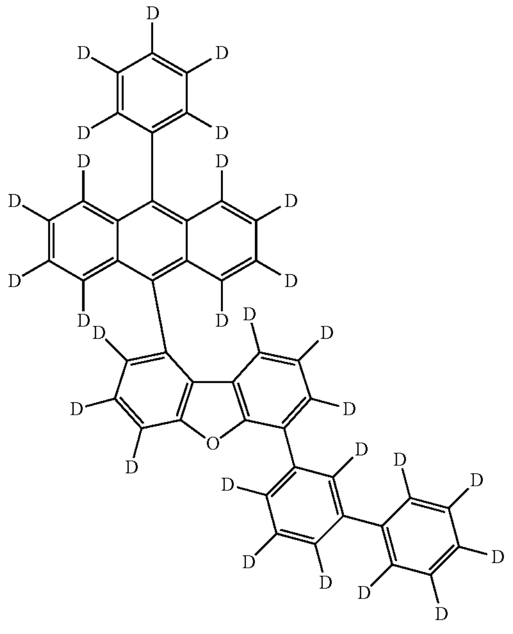
-continued
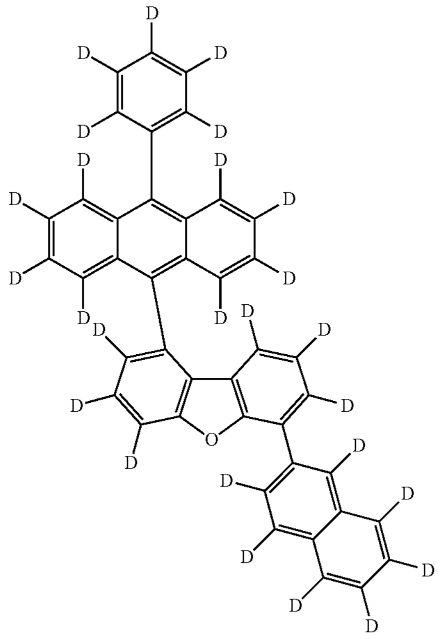
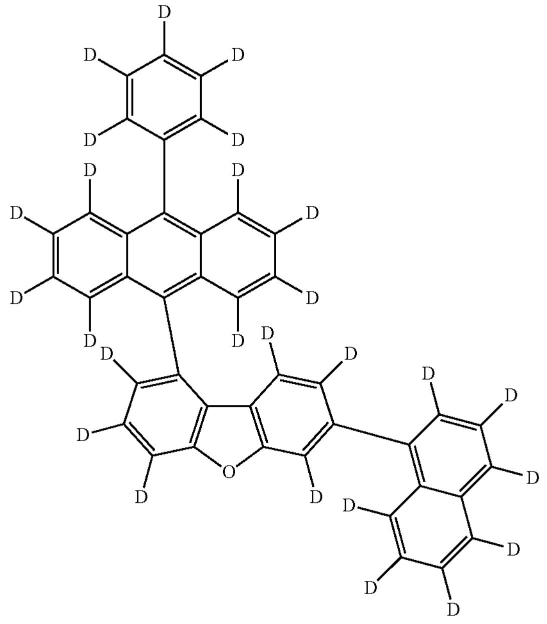

-continued
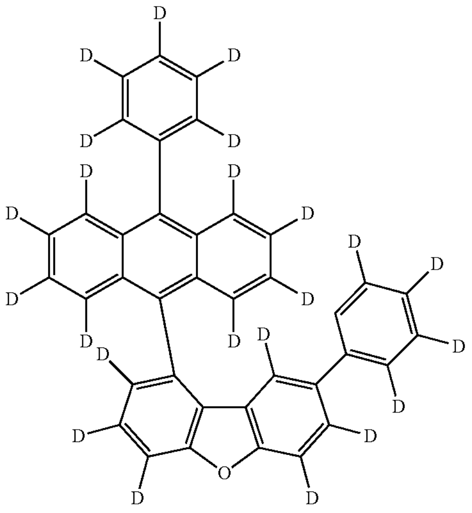
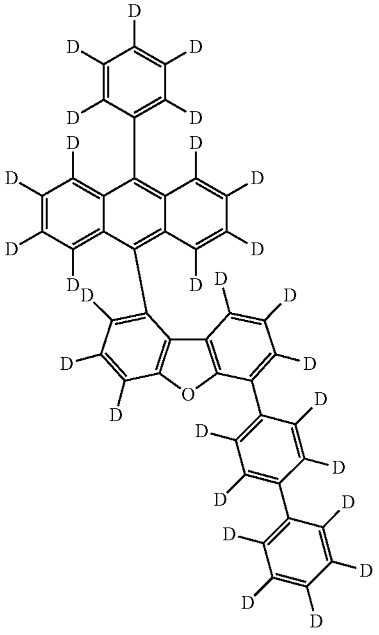
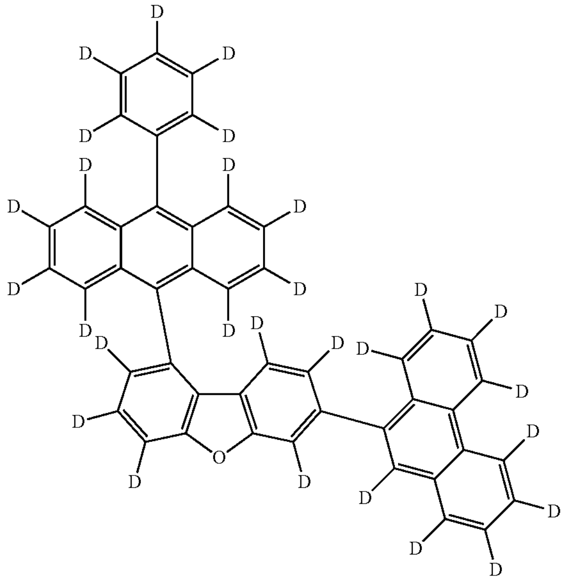
-continued
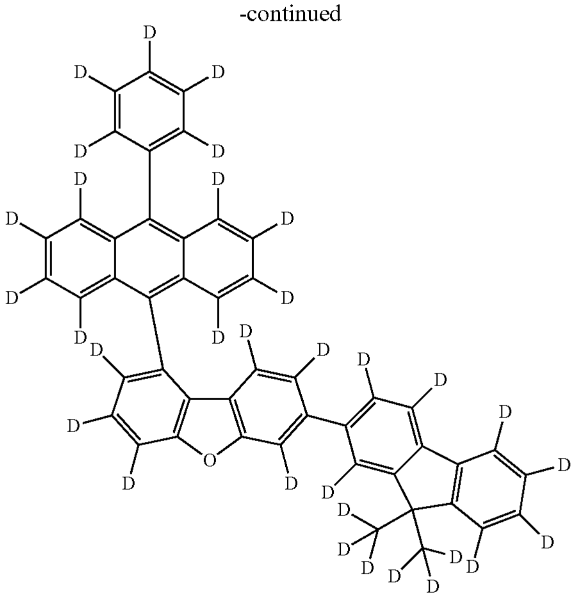
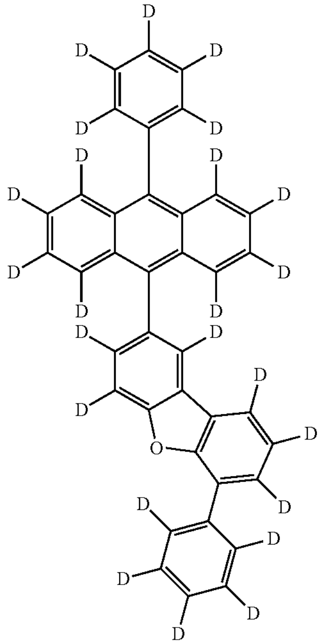

-continued
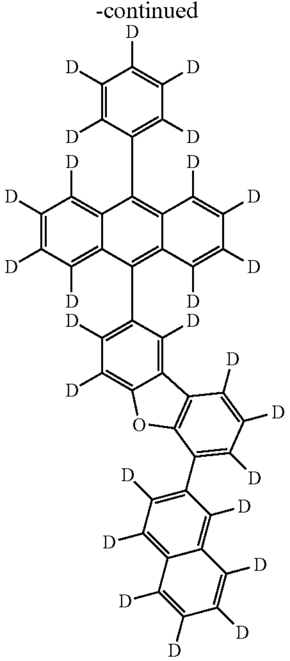
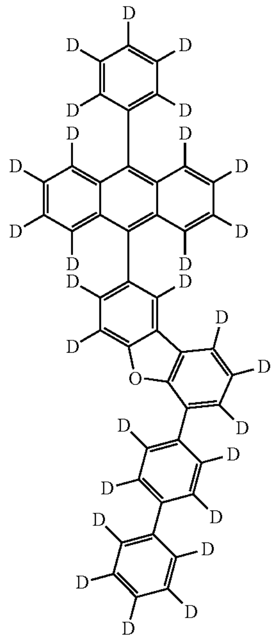
-continued
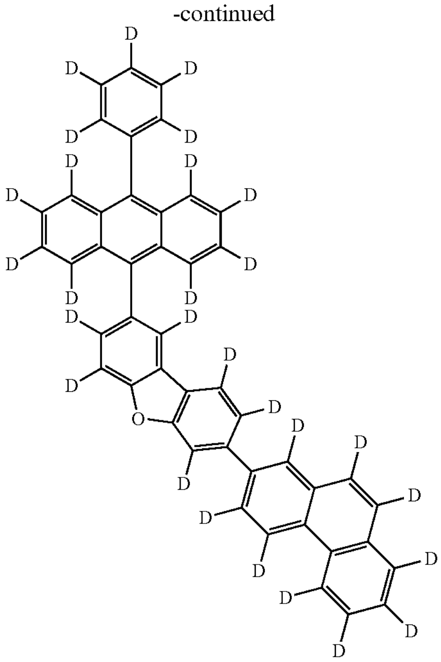
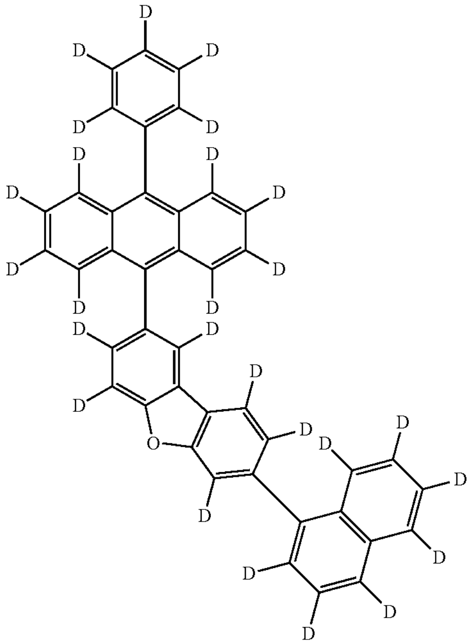

-continued
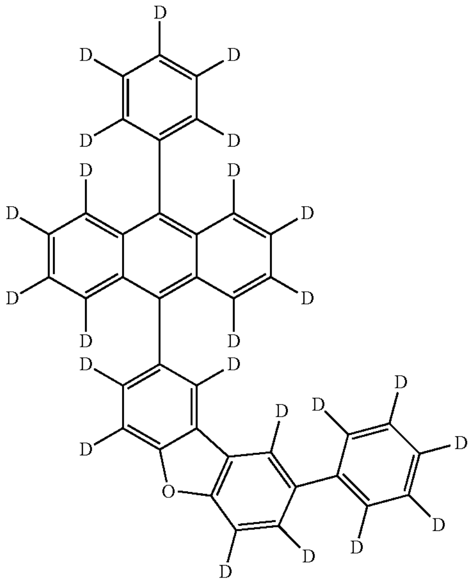
-continued
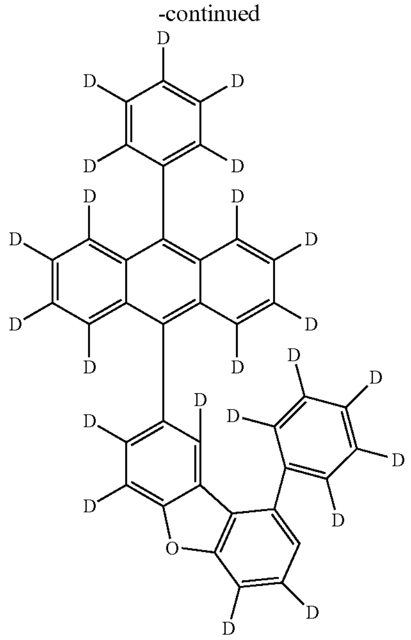
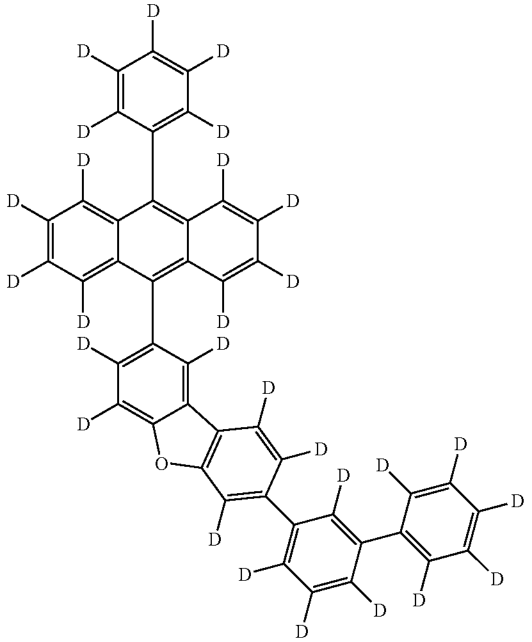
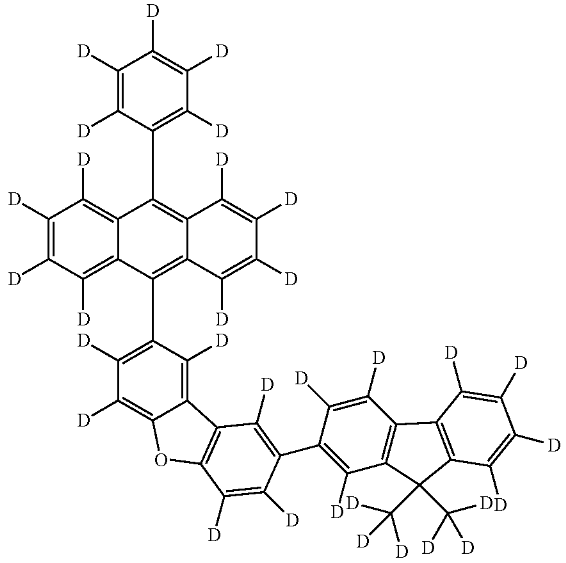

-continued
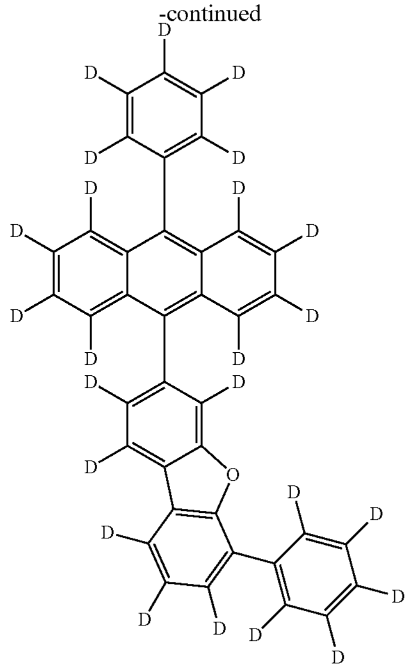
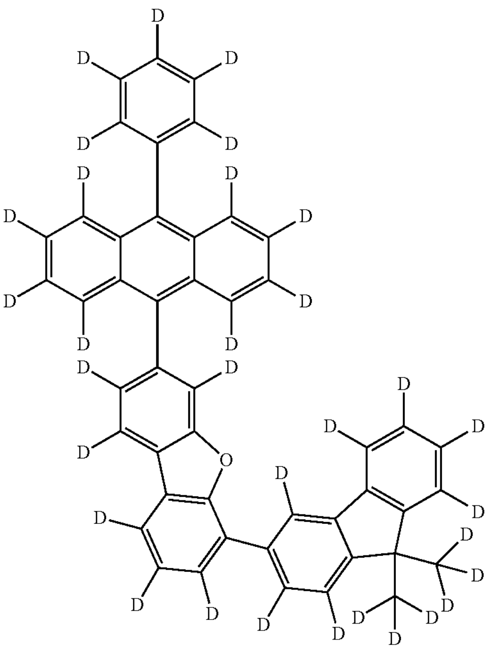
-continued
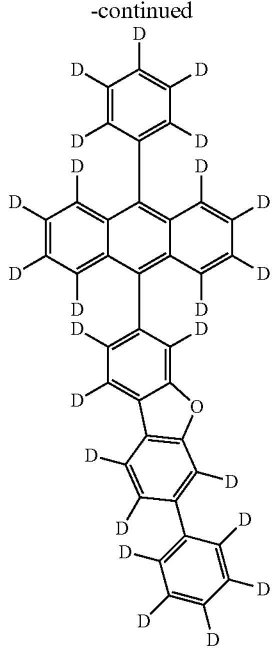
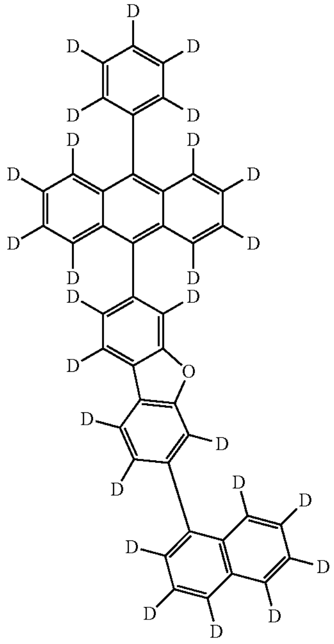

-continued
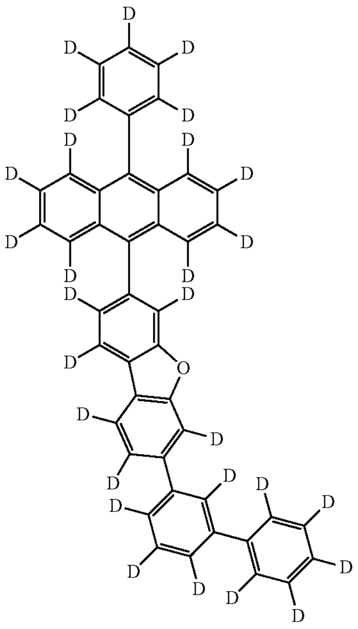
-continued
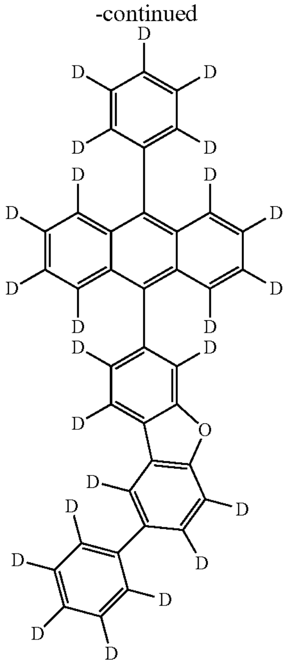
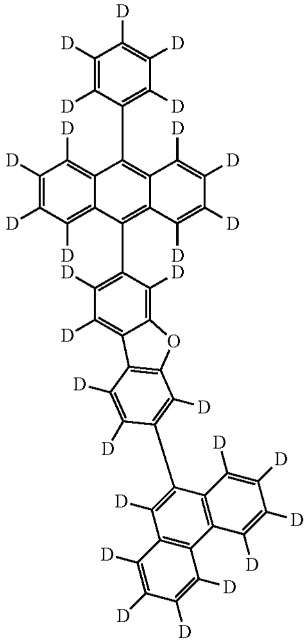
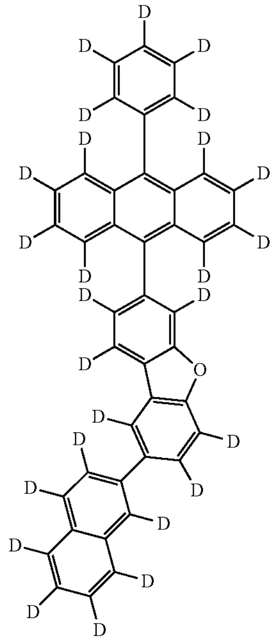

-continued
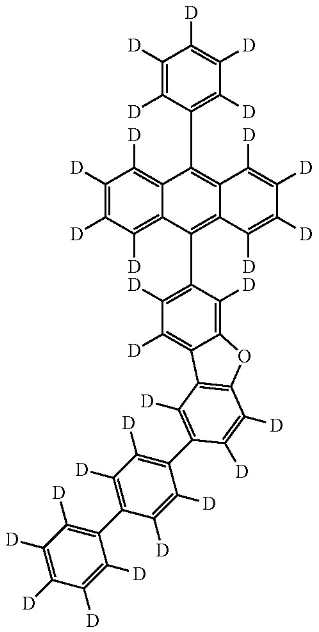
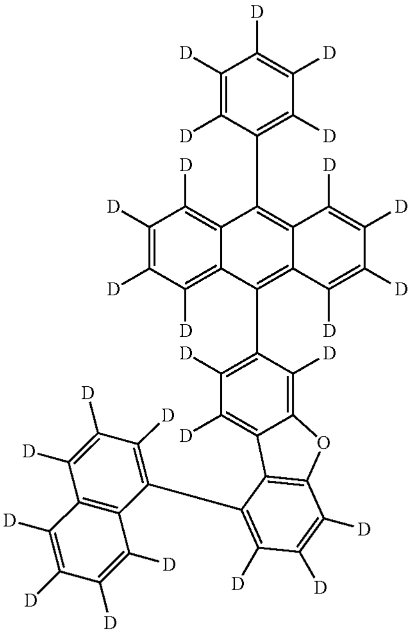
-continued
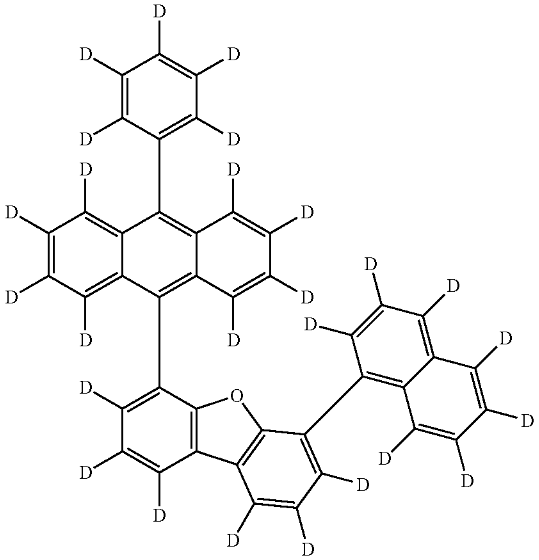
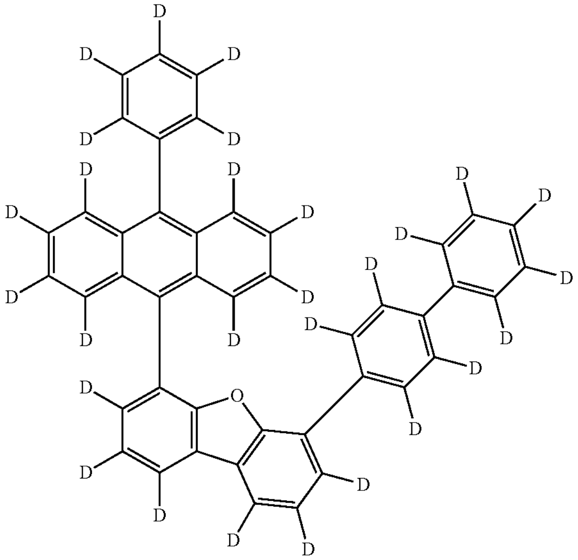
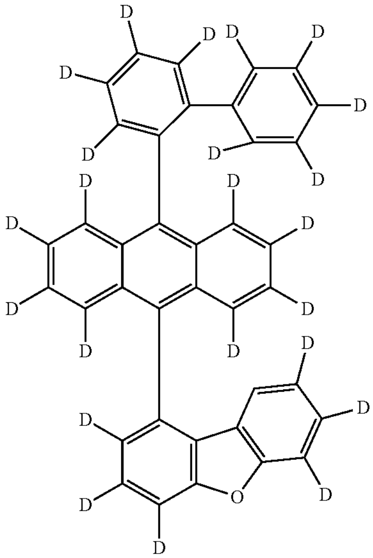

-continued
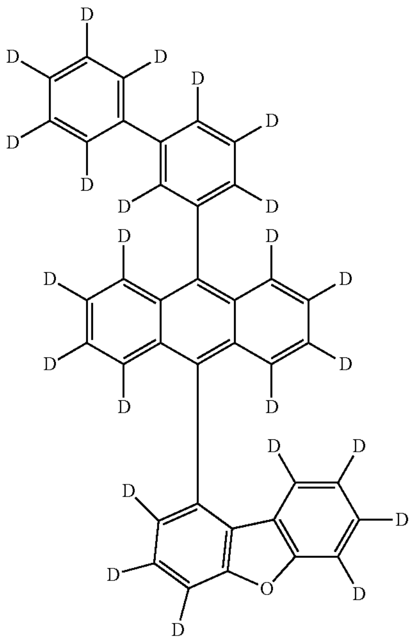
-continued
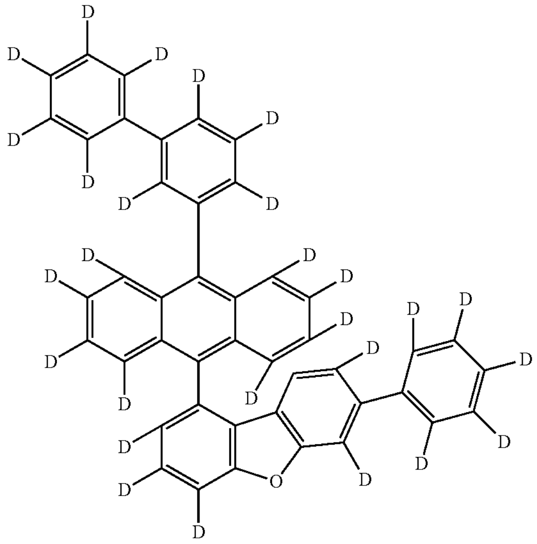
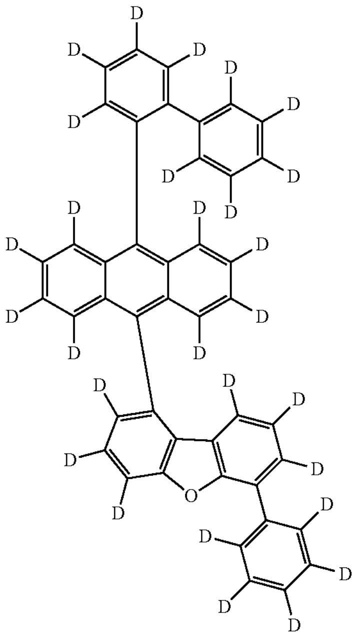
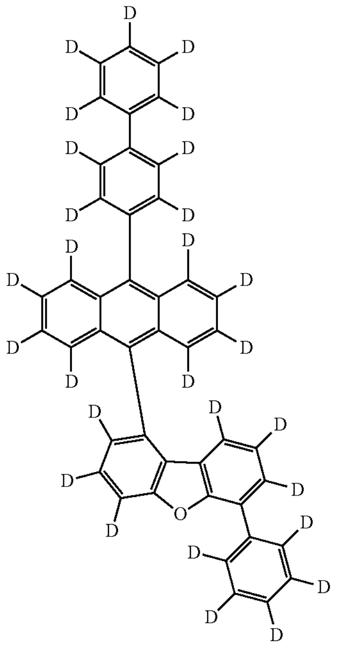

-continued
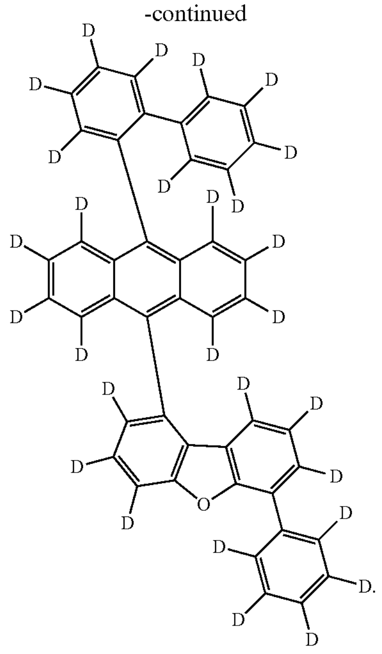
* * * * *